US012720947B2

(12) United States Patent
Kang et al.

(10) Patent No.: US 12,720,947 B2
(45) Date of Patent: Aug. 25, 2026

(54) ORGANIC LIGHT EMITTING DEVICE

(71) Applicant: LG Chem, Ltd., Seoul (KR)

(72) Inventors: Esder Kang, Daejeon (KR); Yeonhui Yi, Daejeon (KR); Sejin Jung, Daejeon (KR); Beomgoo Kang, Daejeon (KR); Min Suk Jung, Daejeon (KR); Jaesoon Bae, Daejeon (KR); Jaechol Lee, Daejeon (KR); Yebyeol Kim, Daejeon (KR); Hyunju Choi, Daejeon (KR)

(73) Assignee: LG Chem, Ltd., Seoul (KR)

( * ) Notice: Subject to any disclaimer, the term of this patent is extended or adjusted under 35 U.S.C. 154(b) by 990 days.

(21) Appl. No.: 17/612,017

(22) PCT Filed: Aug. 21, 2020

(86) PCT No.: PCT/KR2020/011164

§ 371 (c)(1),
(2) Date: Nov. 17, 2021

(87) PCT Pub. No.: WO2021/040328

PCT Pub. Date: Mar. 4, 2021

(65) Prior Publication Data

US 2023/0043088 A1 Feb. 9, 2023

(30) Foreign Application Priority Data

Aug. 23, 2019 (KR) ........................ 10-2019-0103999
Aug. 23, 2019 (KR) ........................ 10-2019-0104015
Aug. 20, 2020 (KR) ........................ 10-2020-0104870

(51) Int. Cl.
*H10K 50/15* (2023.01)
*H10K 50/17* (2023.01)
*H10K 85/60* (2023.01)

(52) U.S. Cl.
CPC ............ *H10K 50/15* (2023.02); *H10K 50/17* (2023.02); *H10K 85/631* (2023.02)

(58) Field of Classification Search
CPC ...... H10K 85/631; H10K 50/15; H10K 50/17; H10K 85/141; H10K 85/60; H10K 85/615;

(Continued)

(56) References Cited

U.S. PATENT DOCUMENTS

2001/0017155 A1* 8/2001 Bellmann ............ H01M 4/624 429/111
2004/0251816 A1 12/2004 Leo et al.

(Continued)

FOREIGN PATENT DOCUMENTS

CN 101503488 A * 8/2009
CN 109516923 A * 3/2019 ............ C09K 11/06

(Continued)

OTHER PUBLICATIONS

English translation of WO 2017026727 obtained from Global Dossier (Year: 2017).*

(Continued)

*Primary Examiner* — Braelyn R Watson
(74) *Attorney, Agent, or Firm* — Lerner David LLP

(57) ABSTRACT

The present disclosure provides an organic light emitting device comprising a hole injection layer including a cured product of a compound represented by the following Chemical Formula 1, and a hole transport layer including a polymer containing a repeating unit represented by the following Chemical Formula 2:

(Continued)

Chemical Formula 1

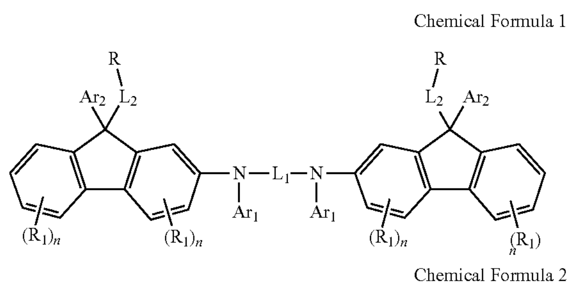

Chemical Formula 2

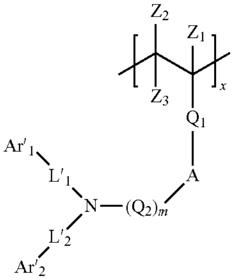

wherein all the variables are described herein.

20 Claims, 1 Drawing Sheet

(58) Field of Classification Search
CPC .. H10K 85/624; H10K 85/626; H10K 85/633; H10K 85/653; H10K 85/111; H10K 85/143; H10K 85/146; H01L 51/006; H01L 51/004; H01L 51/0035; H01L 51/0041; H01L 51/0042
See application file for complete search history.

(56) References Cited

U.S. PATENT DOCUMENTS

| | | | | |
|---|---|---|---|---|
| 2015/0094437 | A1 | 4/2015 | Caille et al. | |
| 2016/0225998 | A1* | 8/2016 | Kato | C08F 12/32 |
| 2017/0200893 | A1* | 7/2017 | Fennimore | H10K 85/111 |
| 2018/0212180 | A1 | 7/2018 | Grigg et al. | |
| 2019/0202975 | A1 | 7/2019 | Liu et al. | |
| 2019/0207115 | A1* | 7/2019 | Grigg | C09D 5/24 |
| 2019/0225581 | A1* | 7/2019 | Scheible | H10K 85/633 |
| 2019/0237669 | A1 | 8/2019 | Kang et al. | |
| 2019/0280206 | A1 | 9/2019 | Lee et al. | |
| 2019/0292309 | A1* | 9/2019 | Pan | C09K 11/06 |
| 2019/0334106 | A1 | 10/2019 | Sokolov et al. | |
| 2019/0338140 | A1 | 11/2019 | Shin et al. | |
| 2020/0020843 | A1 | 1/2020 | Vreman et al. | |
| 2020/0020858 | A1 | 1/2020 | Lee et al. | |
| 2020/0028083 | A1 | 1/2020 | Kang et al. | |
| 2020/0227645 | A1 | 7/2020 | Lee et al. | |
| 2020/0235301 | A1 | 7/2020 | Seo et al. | |
| 2020/0259095 | A1 | 8/2020 | Shin et al. | |
| 2021/0175427 | A1 | 6/2021 | Jung et al. | |

FOREIGN PATENT DOCUMENTS

| | | | | |
|---|---|---|---|---|
| JP | 2004303490 | A * | 10/2004 | |
| JP | 2015511215 | A | 4/2015 | |
| KR | 20000051826 | A | 8/2000 | |
| KR | 20150093995 | A | 8/2015 | |
| KR | 20160093531 | A | 8/2016 | |
| KR | 20170077775 | A | 7/2017 | |
| KR | 20180059379 | A | 6/2018 | |
| KR | 20180092270 | A | 8/2018 | |
| KR | 20180099446 | A | 9/2018 | |
| KR | 20190020072 | A | 2/2019 | |
| KR | 20190035513 | A | 4/2019 | |
| KR | 20190035514 | A | 4/2019 | |
| KR | 20190090213 | A | 8/2019 | |
| KR | 20200020633 | A | 2/2020 | |
| WO | 2003012890 | A2 | 2/2003 | |
| WO | WO-2017026727 | A1 * | 2/2017 | C07C 13/72 |
| WO | 2017031622 | A1 | 3/2017 | |
| WO | 2018005318 | A1 | 1/2018 | |
| WO | WO-2018097665 | A2 * | 5/2018 | C07C 25/02 |

OTHER PUBLICATIONS

English translation of JP 2004303490 A obtained from Global Dossier (Year: 2004).*

English translation of WO 2018097665 obtained from Global Dossier (Year: 2018).*

English translation of CN 101503488 obtained from Global Dossier (Year: 2009).*

English translation of CN 109516923 obtained from Global Dossier (Year: 2019).*

International Search Report for Application No. PCT/KR2020/011164 mailed Nov. 30, 2020, 5 Pages.

* cited by examiner

【FIG. 1】
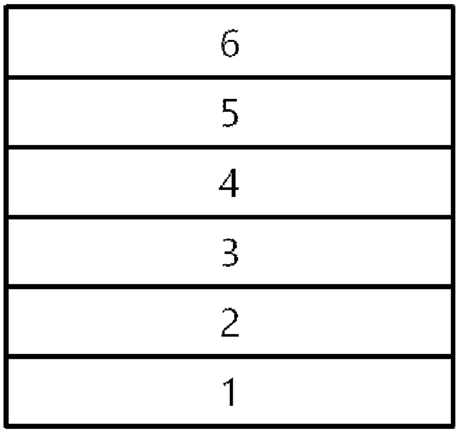
【FIG. 2】
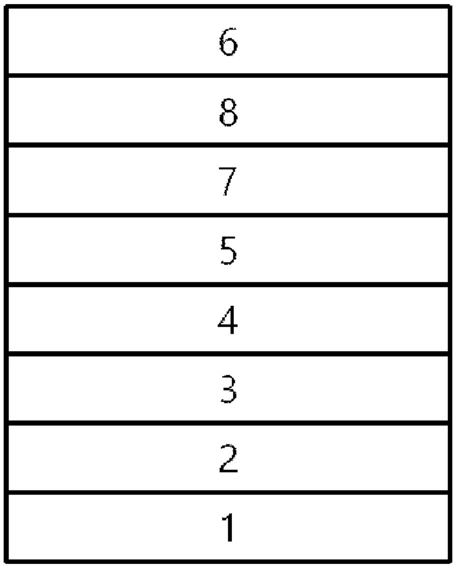

ORGANIC LIGHT EMITTING DEVICE

CROSS-REFERENCE TO RELATED APPLICATION(S)

The present application is a national stage entry under 35 U.S.C. § 371 of International Application No. PCT/KR2020/011164 filed on Aug. 21, 2020, which claims priority from Korean Patent Application No. 10-2019-0103999 filed on Aug. 23, 2019, Korean Patent Application No. 10-2019-0104015 filed on Aug. 23, 2019, and Korean Patent Application No. 10-2020-0104870 filed on Aug. 20, 2020, all the disclosures of which are incorporated herein by reference.

TECHNICAL FIELD

The present disclosure relates to relates to an organic light emitting device.

BACKGROUND ART

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for the organic materials used in the organic light emitting devices as described above.

Meanwhile, recently, in order to reduce process costs, an organic light emitting device using a solution process, particularly an inkjet process, has been developed instead of a conventional deposition process. In the initial stage of development, attempts have been made to develop organic light emitting devices by coating all organic light emitting device layers by a solution process, but current technology has limitations. Therefore, only HIL, HTL, and EML are processed in a layer device structure by a solution process, and a hybrid process utilizing traditional deposition processes is being studied as a subsequent process.

In this regard, the present disclosure provides novel materials for organic light emitting devices that can be used for an organic light emitting device and simultaneously, can be deposited by a solution process.

PRIOR ART LITERATURE

Patent Literature (Patent Literature 0001) Korean Unexamined Patent Publication No. 10-2000-0051826

DETAILED DESCRIPTION OF THE INVENTION

Technical Problem

Provided herein is an organic light emitting device including: an anode, a hole injection layer, a hole transport layer, a light emitting layer, and a cathode, wherein the hole injection layer includes a cured product of a compound represented by the following Chemical Formula 1, and the hole transport layer includes a polymer including a repeating unit represented by the following Chemical Formula 2.

[Chemical Formula 1]

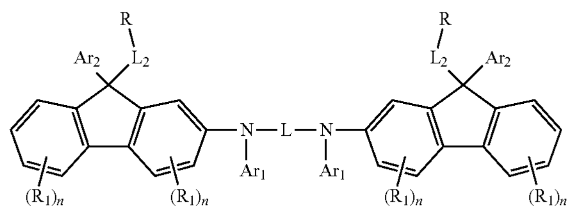

in the Chemical Formula 1, $L_1$ is a substituted or unsubstituted $C_{6-60}$ arylene; or a substituted or unsubstituted $C_{2-60}$ heteroarylene containing any one or more heteroatoms selected from the group consisting of N, O and S, each $Ar_1$ is independently a substituted or unsubstituted $C_{6-60}$ aryl, each $Ar_2$ is independently a substituted or unsubstituted $C_{6-60}$ aryl, each $L_2$ is independently a single bond, a substituted or unsubstituted $C_{1-10}$ alkylene, or a substituted or unsubstituted $C_{6-60}$ arylene, each $R_1$ is independently hydrogen; deuterium; halogen; a substituted or unsubstituted $C_{1-60}$ alkyl; a substituted or unsubstituted $C_{1-60}$ alkoxy; a substituted or unsubstituted $C_{6-60}$ aryl; or a $C_{2-60}$ heteroaryl containing any one or more heteroatoms selected from the group consisting of N, O and S, each n is independently an integer of 0 to 3, each R is independently a photo-curable group; or a thermo-curable group,

[Chemical Formula 2]

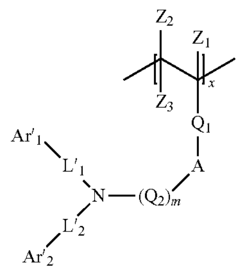

in the Chemical Formula 2, $Z_1$ to $Z_3$ are each independently hydrogen or $C_{1-10}$ alkyl, $Q_1$ and $Q_2$ are each independently a single bond; a substituted or unsubstituted $C_{6-60}$ arylene; or a substituted or unsubstituted $C_{2-60}$ heteroarylene containing any one or more heteroatoms selected from the group consisting of N, O and S, m is an integer of 1 to 10, $L'_1$ and $L'_2$ are each independently a single bond; a substituted or unsubstituted $C_{6-60}$ arylene; or a substituted or unsubstituted $C_{2-60}$ heteroarylene containing any one or more heteroatoms selected from the group consisting of N, O and S, $Ar'_1$ and $Ar'_2$ are each independently a substituted or unsubstituted $C_{6-60}$ aryl; or a substituted or unsubstituted $C_{2-60}$ heteroaryl containing any one or more heteroatoms selected from the group consisting of N, O and S, A is $-L'_3-A'-$, $L'_3$ is a single bond, —O—, $—(CH_2)_y—$, $—O(CH_2)_y—$, or $—(CH_2)_yO—$, where y is an integer of 1 to 10, A' is any one selected from the group consisting of the following:

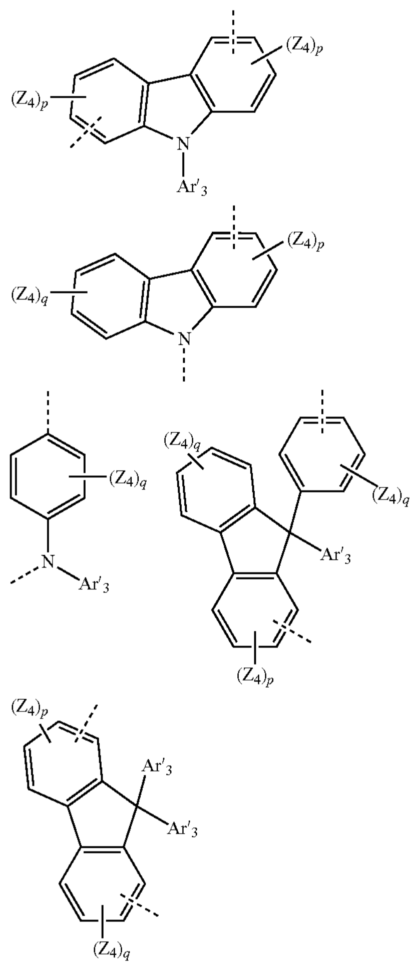

-continued

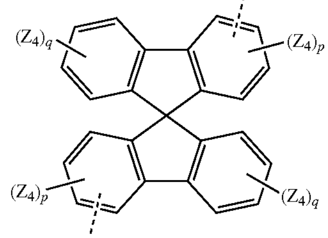

wherein each $Ar'_3$ is independently a substituted or unsubstituted $C_{6-60}$ aryl; or a $C_{2-60}$ heteroaryl containing any one or more heteroatoms selected from the group consisting of N, O and S, each $Z_4$ is independently hydrogen; deuterium; halogen; hydroxy; cyano; a substituted or unsubstituted $C_{1-60}$ alkyl; a substituted or unsubstituted $C_{3-60}$ cycloalkyl; a substituted or unsubstituted $C_{1-60}$ alkoxy; a substituted or unsubstituted $C_{6-60}$ aryl; or a substituted or unsubstituted $C_{2-60}$ heteroaryl containing any one or more heteroatoms selected from the group consisting of N, O and S, each p is independently an integer of 0 to 3, each q is independently an integer of 0 to 4, each r is independently an integer of 0 to 4, x is an integer of 1 to 10,000, and when n, m, p, q, and r are 2 or more, each of $R_1$, $Q_2$, and $Z_4$ is identical or different, respectively.

Advantageous Effects

The above-mentioned organic light emitting device can produce a hole injection layer and a hole transport layer by a solution process, and can improve the efficiency, driving voltage, and/or lifetime characteristics of the organic light-emitting device.

BRIEF DESCRIPTION OF THE DRAWINGS

FIG. 1 shows an example of an organic light emitting device comprising a substrate 1, an anode 2, a hole injection layer 3, a hole transport layer 4, a light emitting layer 5 and a cathode 6.

FIG. 2 shows an example of an organic light emitting device comprising a substrate 1, an anode 2, a hole injection layer 3, a hole transport layer 4, a light emitting layer 5, an electron transport layer 7, an electron injection layer 8 and a cathode 6.

DETAILED DESCRIPTION OF THE EMBODIMENTS

Hereinafter, embodiments of the present disclosure will be described in more detail to facilitate understanding of the invention.

Definition of Terms

As used herein, the notation or means a bond linked to another substituent group, and Me means a methyl.

As used herein, the term “substituted or unsubstituted” means being substituted with one or more substituents selected from the group consisting of deuterium; a halogen group; a cyano group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; and a heteroaryl containing at least one of N, O and S atoms, or being substituted with a substituent to which two or more substituents of the above-exemplified substituents are connected, or being unsubstituted. For example, "a substituent in which two or more substituents are connected" may be a biphenyl group. Namely, a biphenyl group may be an aryl group, or it may also be interpreted as a substituent in which two phenyl groups are connected.

In the present disclosure, the carbon number of a carbonyl group is not particularly limited, but is preferably 1 to 40. Specifically, the carbonyl group may be a compound having the following structural formulas, but is not limited thereto.

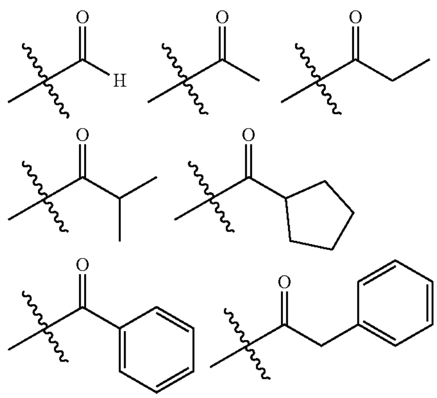

In the present disclosure, an ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be a group having the following structural formulas, but is not limited thereto.

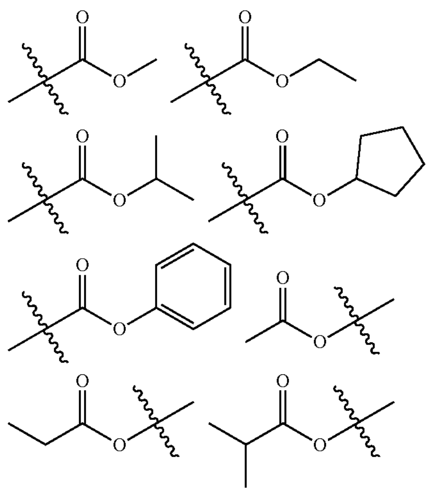

-continued

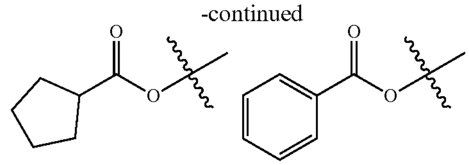

In the present disclosure, the carbon number of an imide group is not particularly limited, but is preferably 1 to 25. Specifically, the imide group may be a group having the following structural formulas, but is not limited thereto.

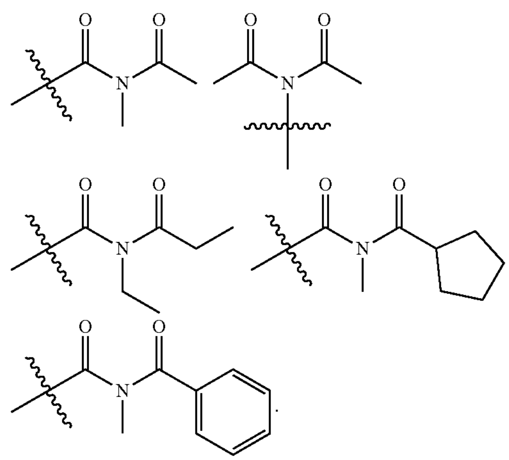

In the present disclosure, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present disclosure, a boron group specifically includes a trimethylboron group, a triethylboron group, a t-butyldimethylboron group, a triphenylboron group, and a phenylboron group, but is not limited thereto.

In the present disclosure, examples of a halogen group include fluorine, chlorine, bromine, or iodine.

In the present disclosure, the alkyl group may be straight-chain or branched-chain, and the carbon number thereof is not particularly limited, but is preferably 1 to 40. According to one embodiment, the carbon number of the alkyl group is 1 to 20. According to another embodiment, the carbon number of the alkyl group is 1 to 10. According to another embodiment, the carbon number of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methyl-hexyl, and the like, but are not limited thereto.

In the present disclosure, the alkenyl group may be straight-chain or branched-chain, and the carbon number thereof is not particularly limited, but is preferably 2 to 40. According to one embodiment, the carbon number of the alkenyl group is 2 to 20. According to another embodiment, the carbon number of the alkenyl group is 2 to 10. According to still another embodiment, the carbon number of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present disclosure, a cycloalkyl group is not particularly limited, but the carbon number thereof is preferably 3 to 60. According to one embodiment, the carbon number of the cycloalkyl group is 3 to 30. According to another embodiment, the carbon number of the cycloalkyl group is 3 to 20. According to still another embodiment, the carbon number of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present disclosure, an aryl group is not particularly limited, but the carbon number thereof is preferably 6 to 60, and it may be a monocyclic aryl group or a polycyclic aryl group. According to one embodiment, the carbon number of the aryl group is 6 to 30. According to one embodiment, the carbon number of the aryl group is 6 to 20. The aryl group may be a phenyl group, a biphenyl group, a terphenyl group or the like as the monocyclic aryl group, but is not limited thereto. The polycyclic aryl group includes a naphthyl group, an anthracenyl group, a phenanthrenyl group, a pyrenyl group, a perylenyl group, a chrysenyl group, a fluorenyl group or the like, but is not limited thereto.

In the present disclosure, the fluorenyl group may be substituted, and two substituents may be linked with each other to form a spiro structure. In the case where the fluorenyl group is substituted,

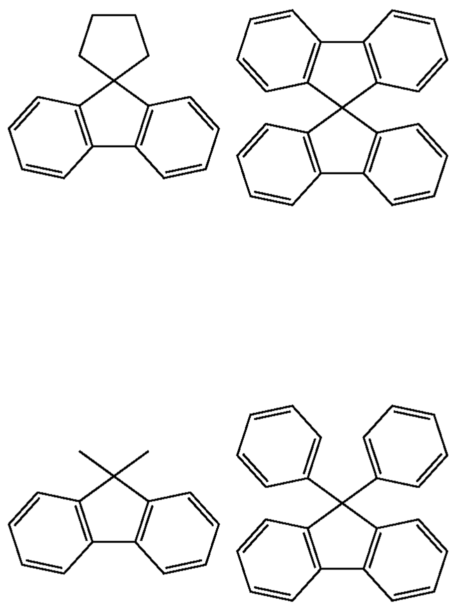

-continued

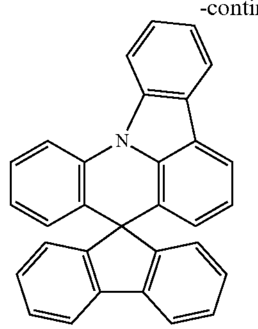

and the like can be formed. However, the structure is not limited thereto.

In the present disclosure, a heteroaryl is a heteroaryl containing one or more of O, N, Si and S as a heteroatom, and the carbon number thereof is not particularly limited, but is preferably 2 to 60. Examples of the heteroaryl include a xanthene, a thioxanthene, a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzoimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present disclosure, an aromatic ring means a condensed monocyclic or condensed polycyclic ring in which the entire molecule has aromaticity while containing only carbon as a ring-forming atom. The carbon number of the aromatic ring is 6 to 60, or 6 to 30, or 6 to 20, but is not limited thereto. In addition, the aromatic ring may include a benzene ring, a naphthalene ring, an anthracene ring, a phenanthrene ring, a pyrene ring, and the like, but is not limited thereto.

In the present disclosure, the aryl group in the aralkyl group, the aralkenyl group, the alkylaryl group, the arylamine group and the arylsilyl group is the same as the aforementioned examples of the aryl group. In the present disclosure, the alkyl group in the aralkyl group, the alkylaryl group and the alkylamine group is the same as the aforementioned examples of the alkyl group. In the present disclosure, the heteroaryl in the heteroarylamine can be applied to the aforementioned description of the heteroaryl. In the present disclosure, the alkenyl group in the aralkenyl group is the same as the aforementioned examples of the alkenyl group. In the present disclosure, the aforementioned description of the aryl group may be applied except that the arylene is a divalent group. In the present disclosure, the aforementioned description of the heteroaryl can be applied except that the heteroarylene is a divalent group. In the present disclosure, the aforementioned description of the aryl group or cycloalkyl group can be applied except that the hydrocarbon ring is not a monovalent group but formed by combining two substituent groups. In the present disclosure, the aforementioned description of the heteroaryl can be applied, except that the heterocycle is not a monovalent group but formed by combining two substituent groups.

As used herein, the term "photo-curable group" or "thermo-curable group" means a reactive substituent that allows crosslinking between compounds during exposure to heat and/or light. The reactive substituent generally includes carbon-carbon multiple bonds or cyclic structures, but is not limited thereto. At this time, the crosslinking between compounds may be made while radicals produced by decomposing carbon-carbon multiple bonds and cyclic structures of the photo-curable group and/or the thermo-curable group by means of a heat treatment and/or light irradiation are linked to each other.

As used herein, the term "cured product" means a material in a cured form which is formed by crosslinking photo-curable groups and/or thermo-curable groups in the molecule by means of heat treatment and/or light treatment (light irradiation).

As used herein, the term "deuterated, or substituted with deuterium" means that at least one usable hydrogen in each chemical formula is replaced by deuterium. Specifically, in each chemical formula or definition of a substituent, being substituted with deuterium means that at least one or more of the positions at which hydrogen can be bonded in the molecule are substituted with deuterium. As an example, deuterated or deuterium-substituted compounds mean that each chemical formula is at least 20%, at least 30%, at least 40%, at least 50%, at least 60%, at least 70%, at least 80%, at least 90%, or at least 100% deuterated.

Further, in the present disclosure, the degree of deuterium substitution may be measured as a ratio of the number of substituted deuterium to the total number of hydrogens that may exist in each chemical formula. More specifically, the degree of deuterium substitution is calculated as the number of substituted deuterium relative to the total number of hydrogens that may exist in the chemical formula, wherein the number of substituted deuterium may be obtained through MALDI-TOF MS (Matrix-Assisted Laser Desorption/Ionization Time-of-Flight Mass Spectrometer) analysis.

(Anode and Cathode)

The organic light emitting device according to the present disclosure includes an anode and a cathode.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

Hole Injection Layer

The organic light emitting device according to the present disclosure includes a hole injection layer on the anode, and uses the compound represented by Chemical Formula 1 as a material of the hole injection layer, and specifically, uses a cured product of the compound represented by Chemical Formula 1 as a hole injection layer.

In Chemical Formula 1, preferably, $L_1$ is phenylene, biphenyldiyl, terphenyldiyl, phenylnaphthalenediyl, binaphthyldiyl, phenanthrendiyl, spirobifluorenediyl, dimethylfluorenediyl, diphenylfluorenediyl, or tetraphenylfluorenediyl, and the $L_1$ is unsubstituted, or substituted with one or two $C_{1-10}$ alkyls.

Preferably, $L_1$ is any one selected from the group consisting of the following:

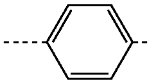
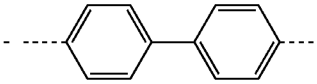
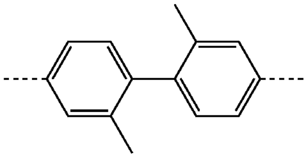
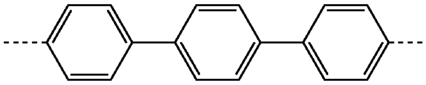
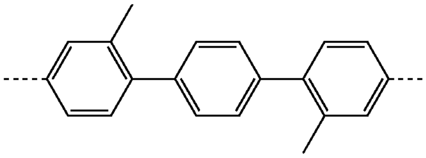
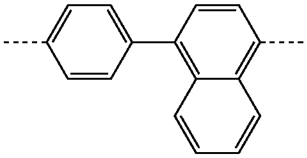
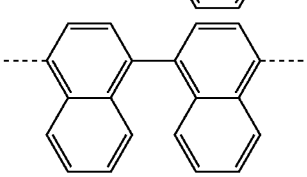
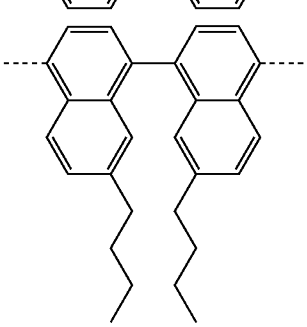

-continued
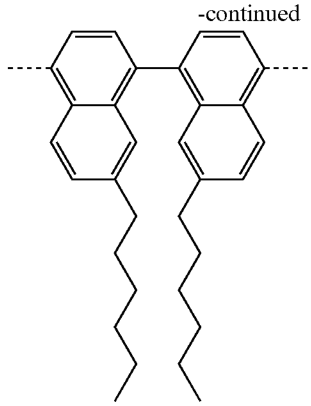
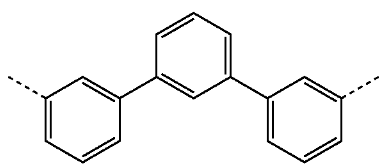
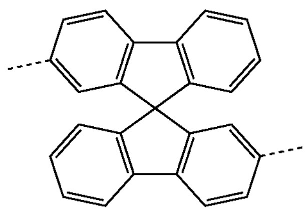
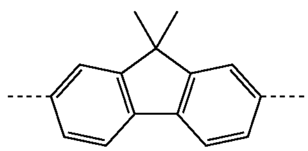
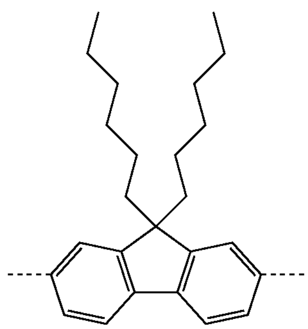
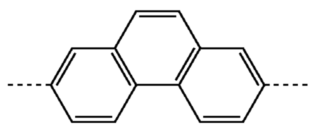
-continued
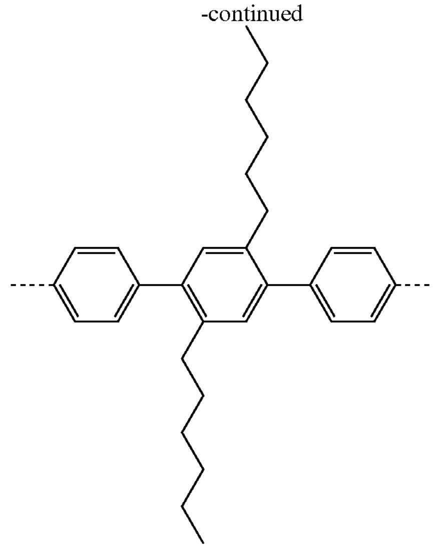
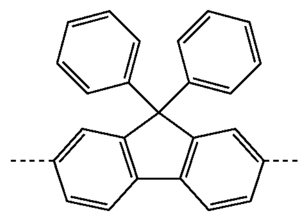
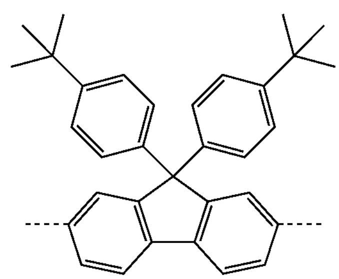
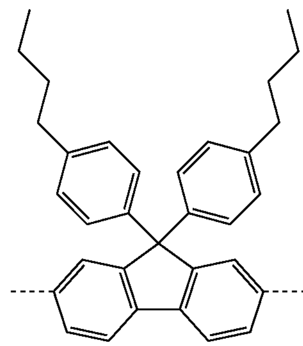

-continued

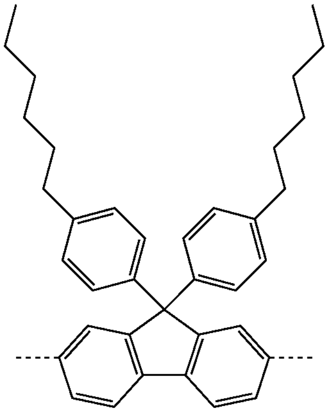

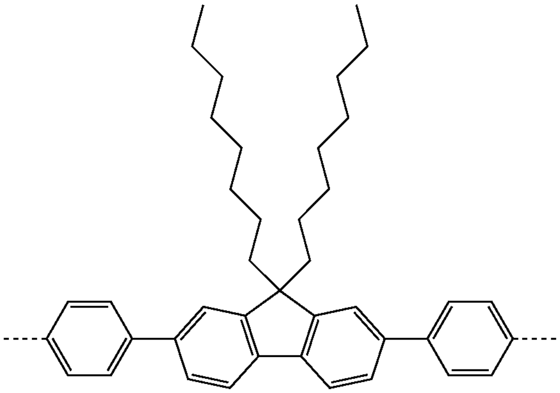

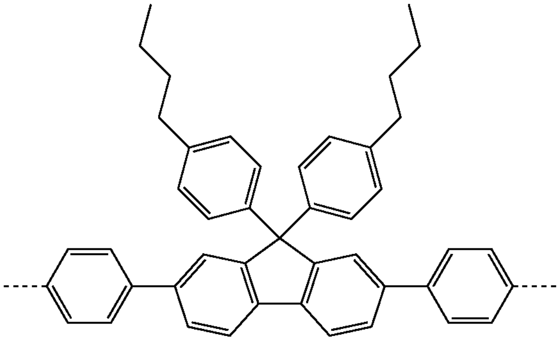

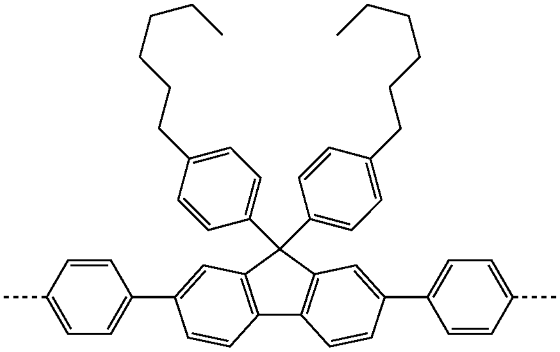

Preferably, each $Ar_1$ is independently phenyl, biphenylyl, naphthyl, phenanthrenyl, or dimethylfluorenyl, and the $Ar_1$ is unsubstituted, or substituted with 1 to 5 deuteriums, or halogen.

Preferably, each $Ar_2$ is independently phenyl, biphenylyl, or naphthyl, the $Ar_2$ is unsubstituted, or substituted with —R; 1 to 5 deuteriums; one or two $C_{1-10}$ alkyls; 1 to 5 halogens; $C_{1-10}$ alkoxy; $C_{1-10}$ alkoxy substituted with $C_{1-10}$ alkoxy; a $C_{1-10}$ haloalkyl; or phenoxy, and the R is as defined above.

Preferably, each $L_2$ is independently a single bond, butylene, pentylene, hexylene, heptylene, or phenylene.

Preferably, n is 1, and each $R_1$ is independently hydrogen or phenyl.

Preferably, R is $-L_3-R_2$, and $L_3$ is a single bond, —O—, —S—, $—CH_2—$, $—CH_2O—$, $—OCH_2—$, $—CH_2OCH_2—$, $—CH_2S—$, $—SCH_2—$, or $—CH_2SCH_2—$, and the $R_2$ is any one selected from the group consisting of the following:

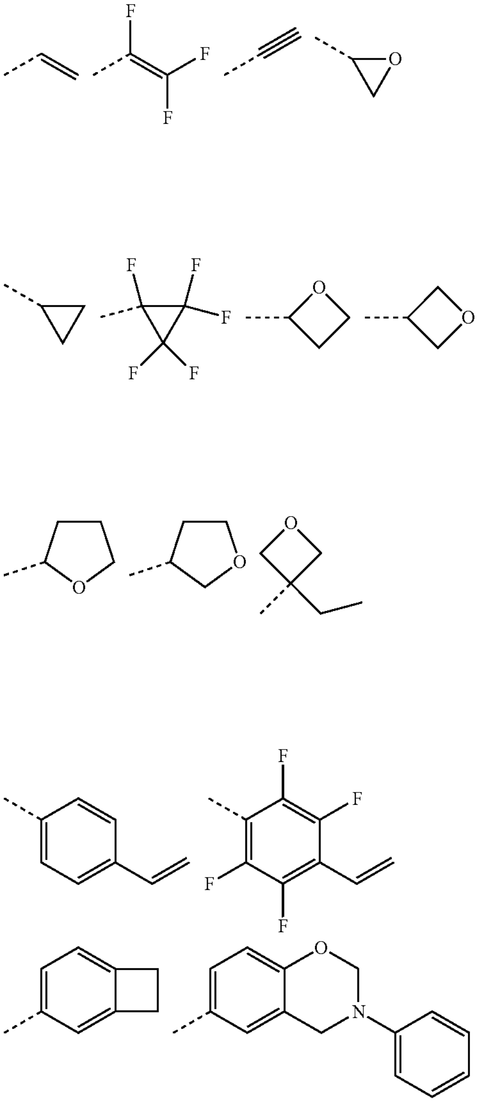

Representative examples of the compound represented by Chemical Formula 1 are as follows:

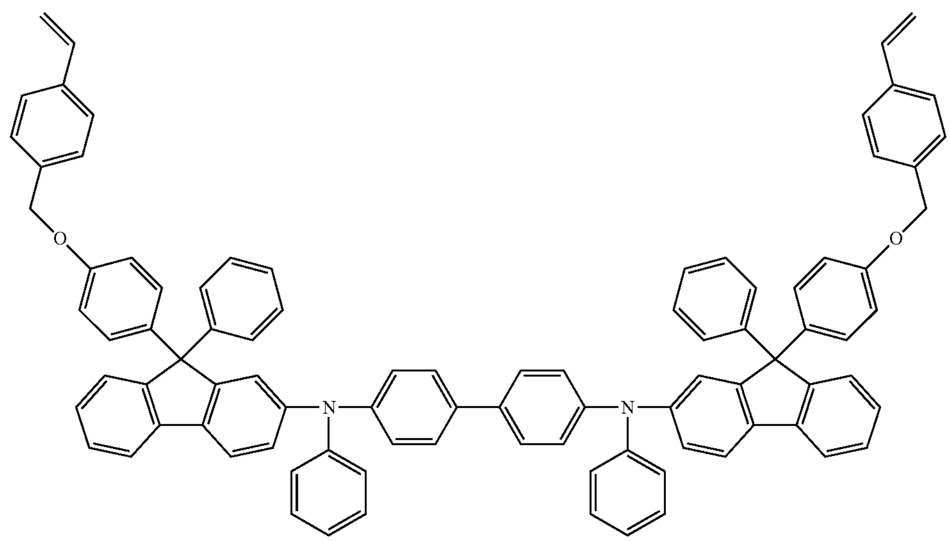
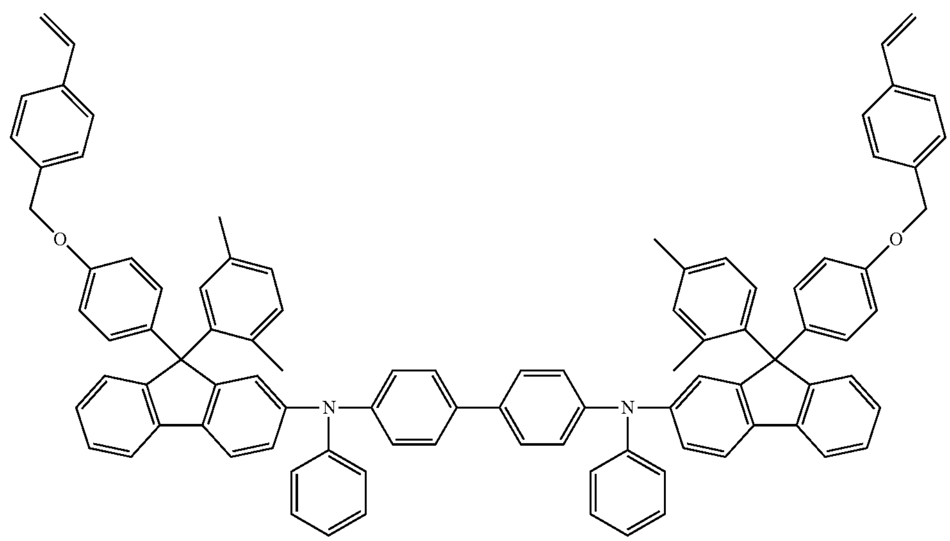
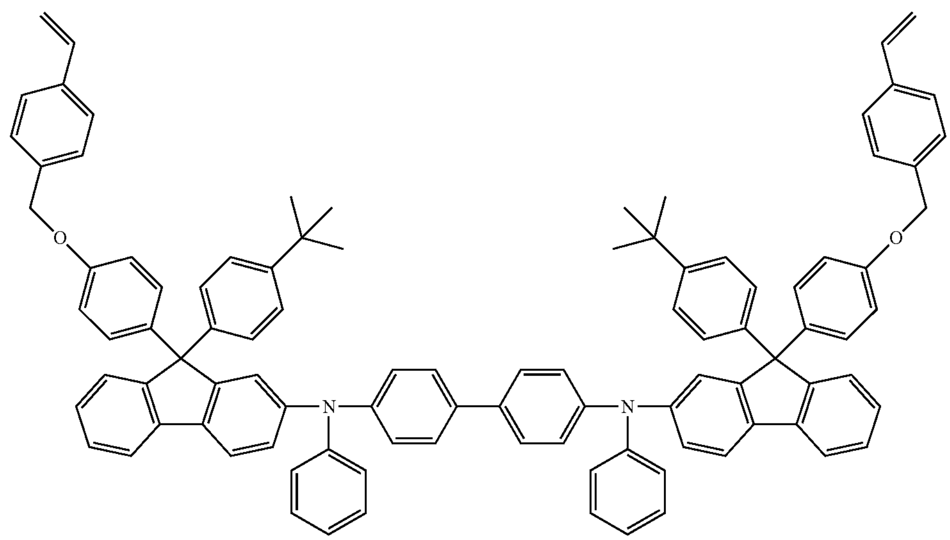

-continued
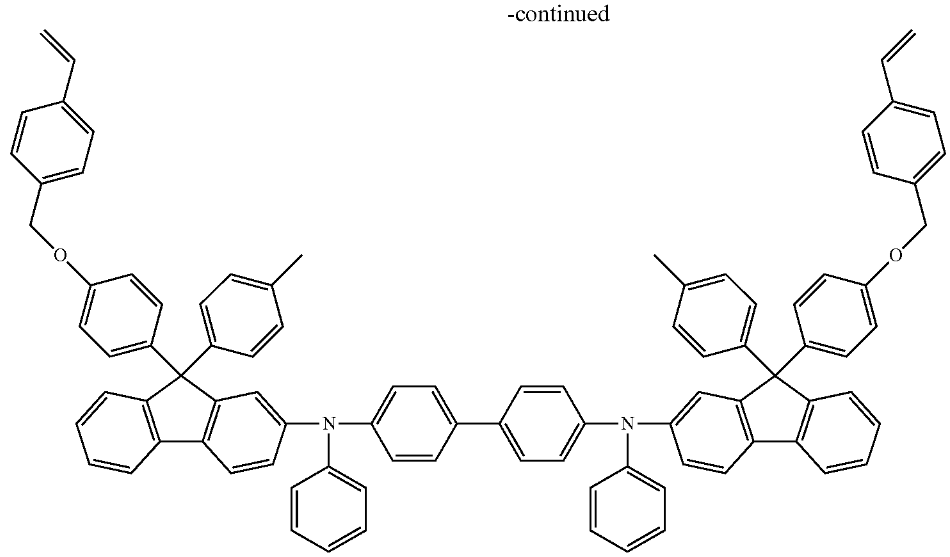
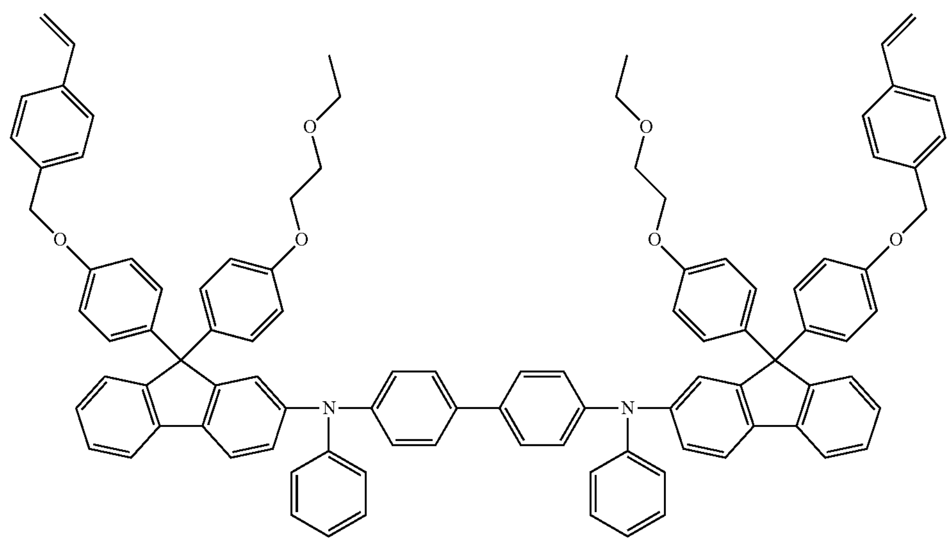
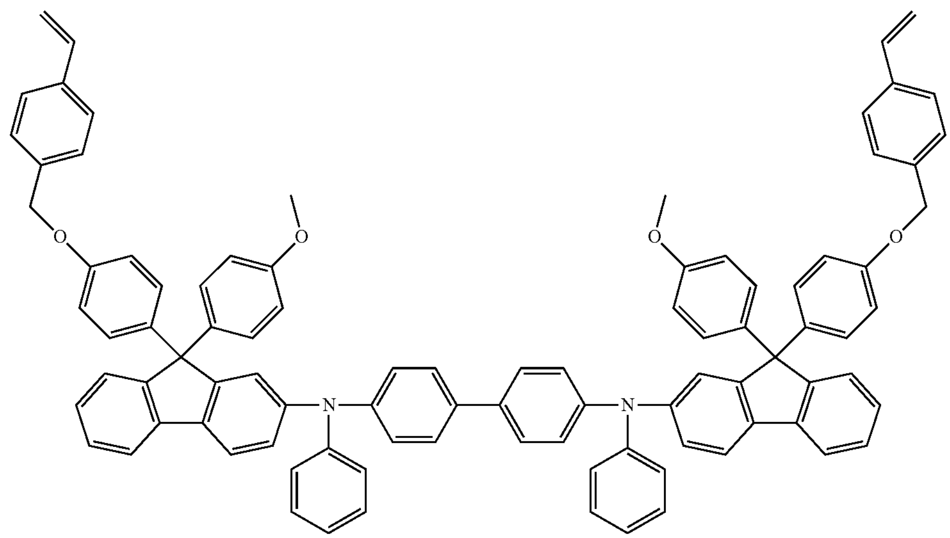

-continued
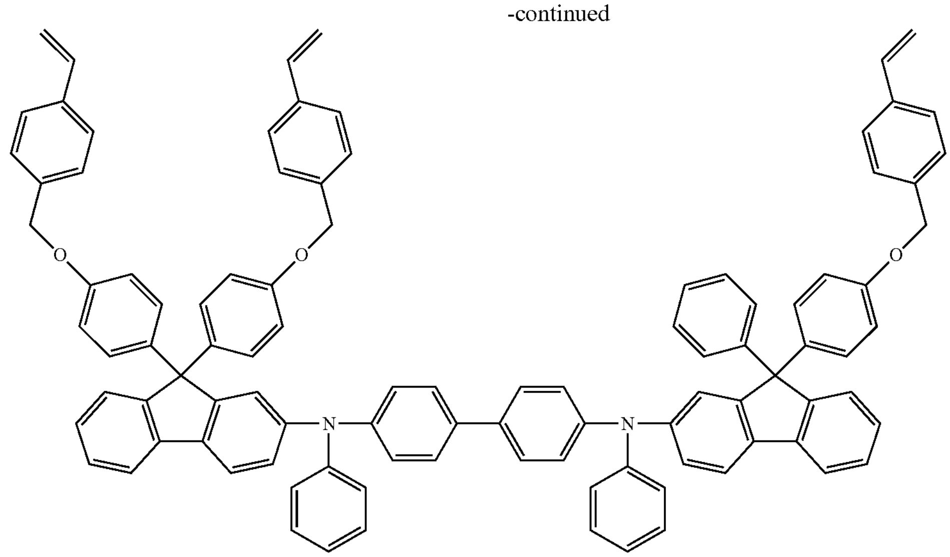
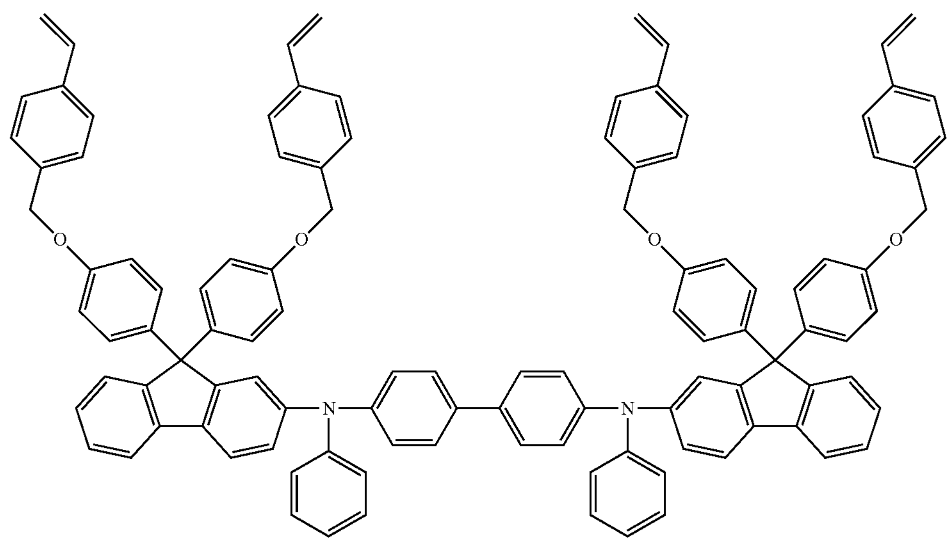
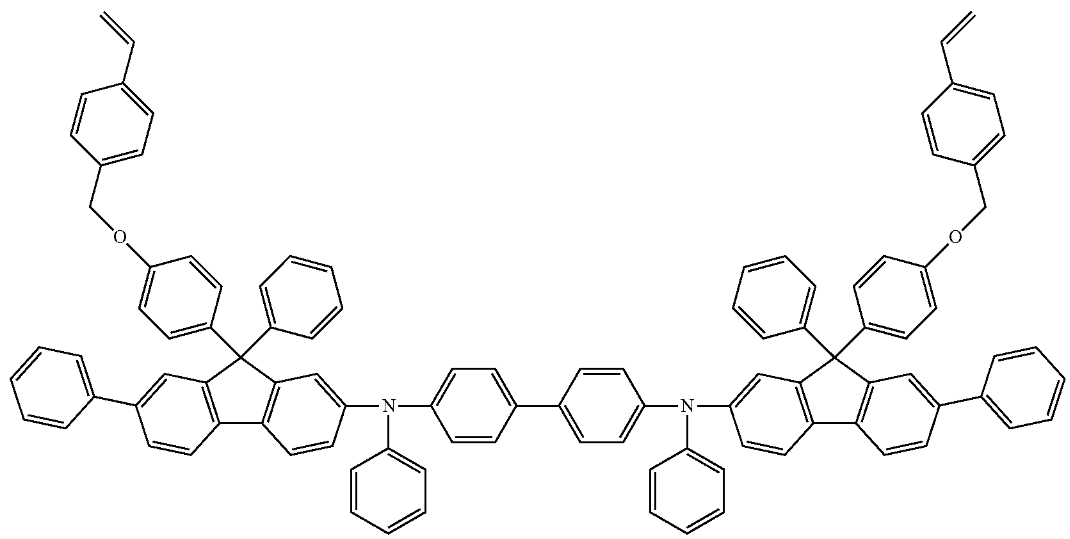

-continued
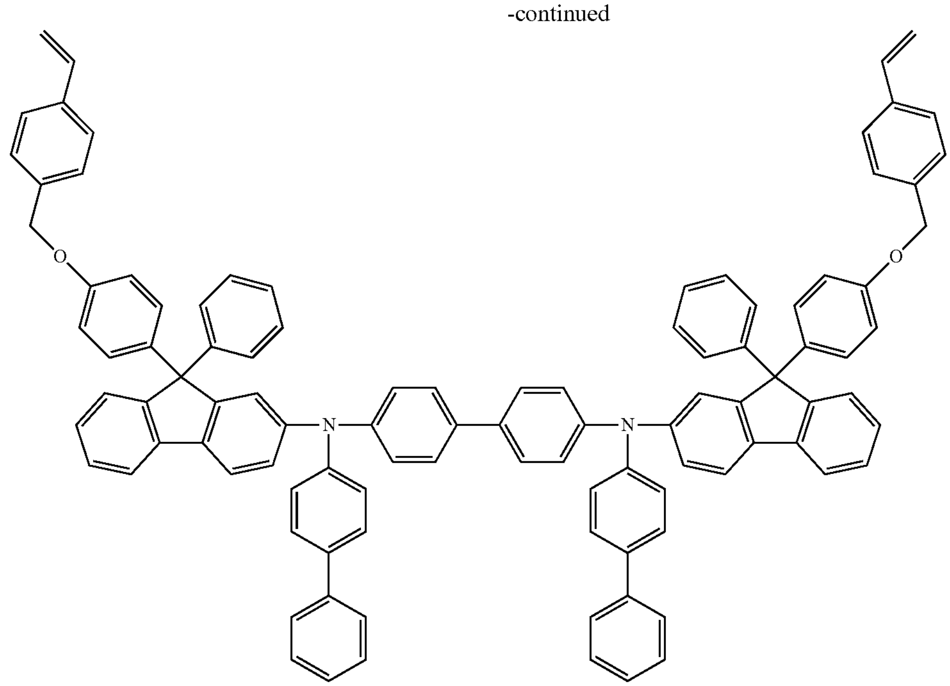
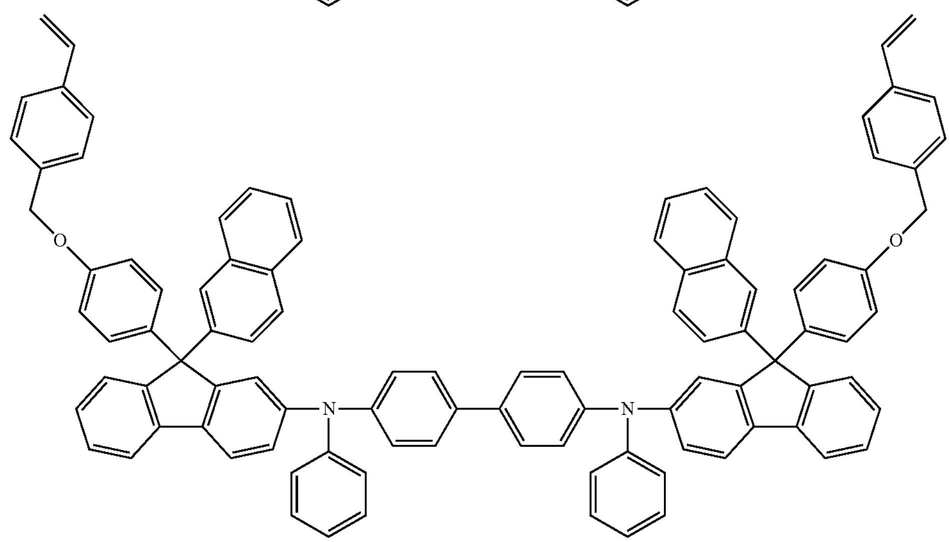
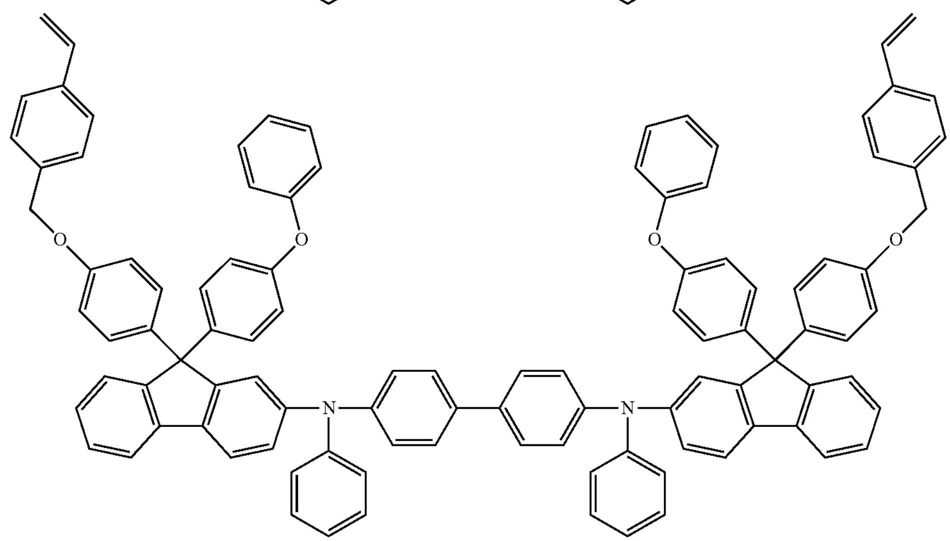

-continued
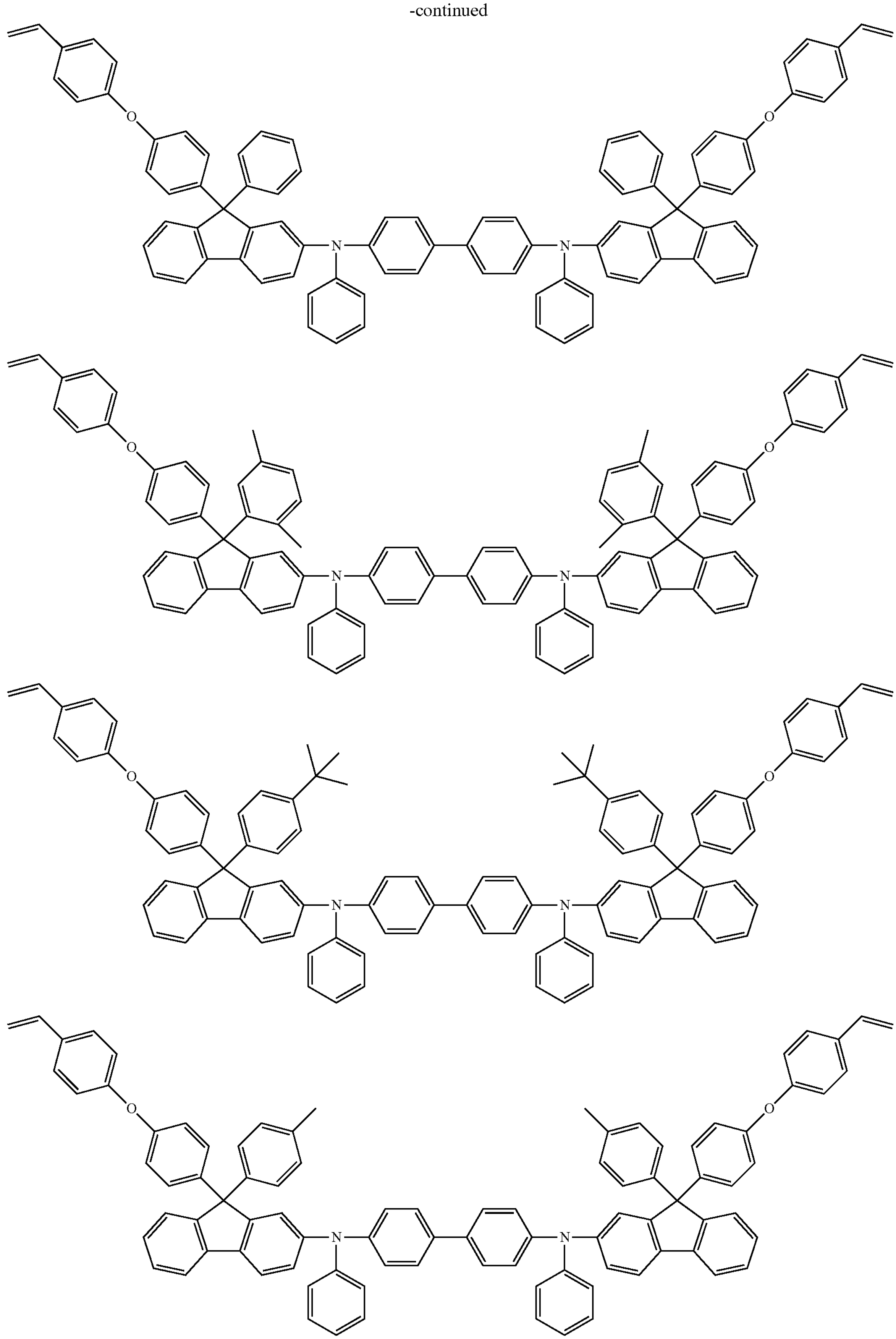

-continued
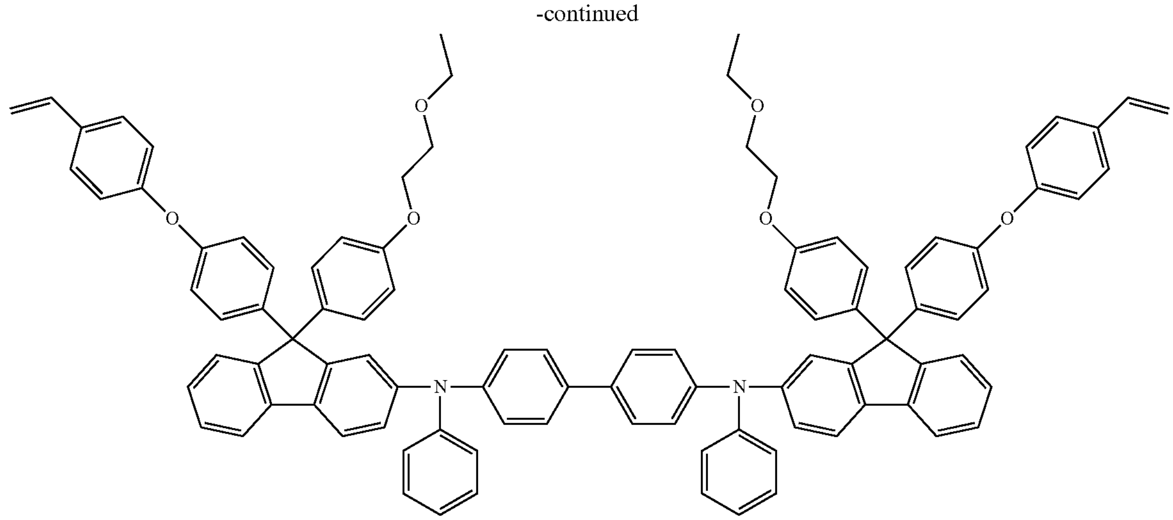
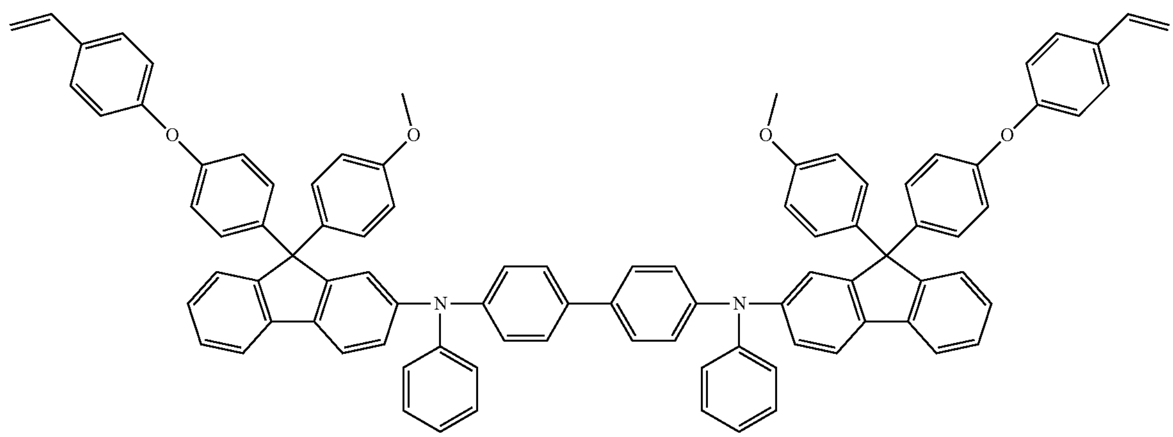
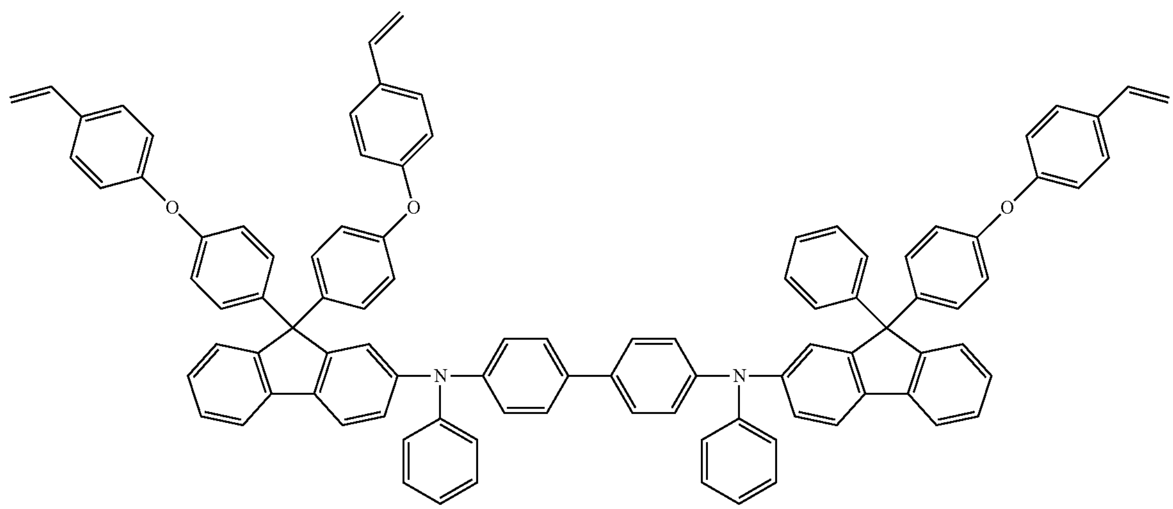

-continued
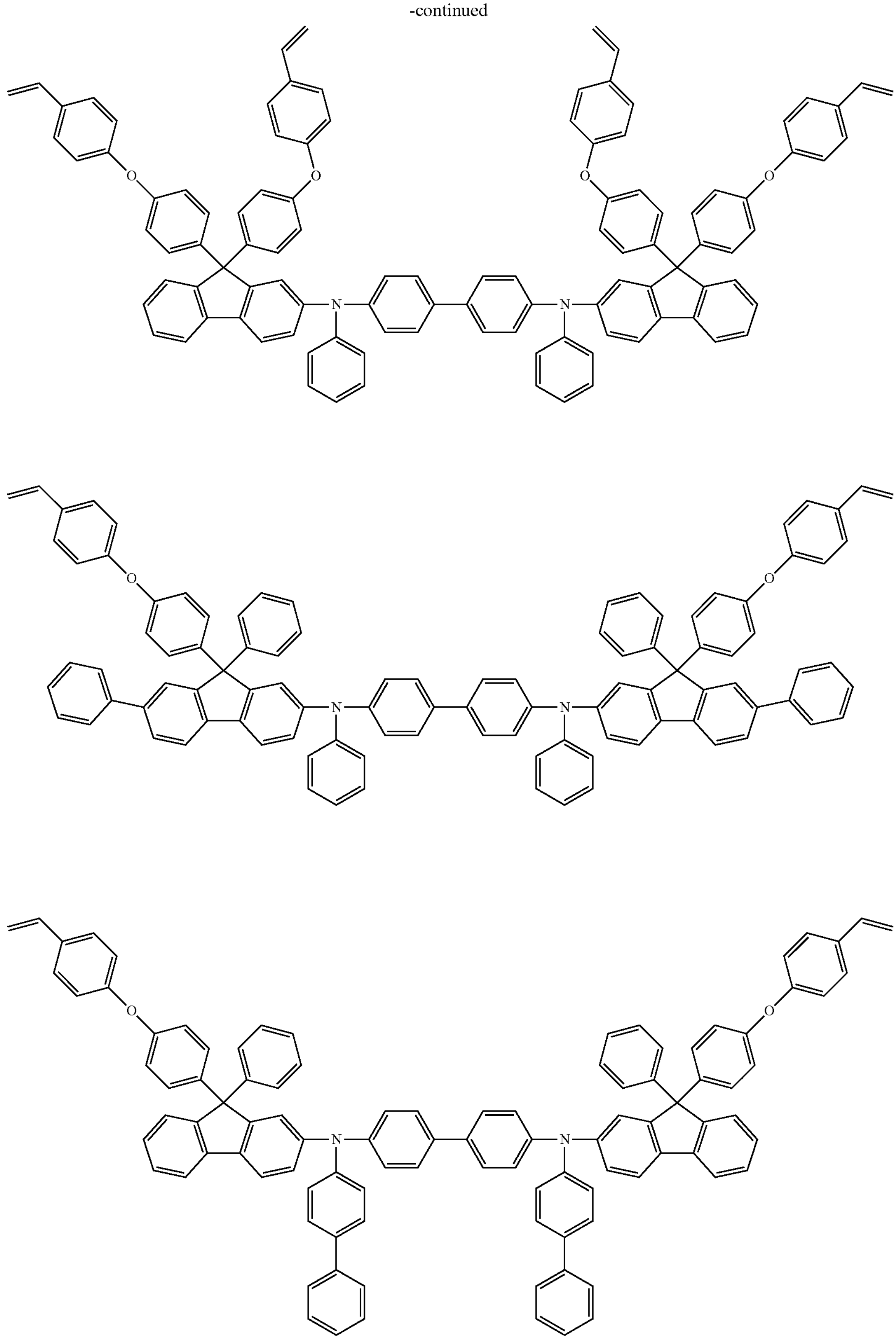

-continued
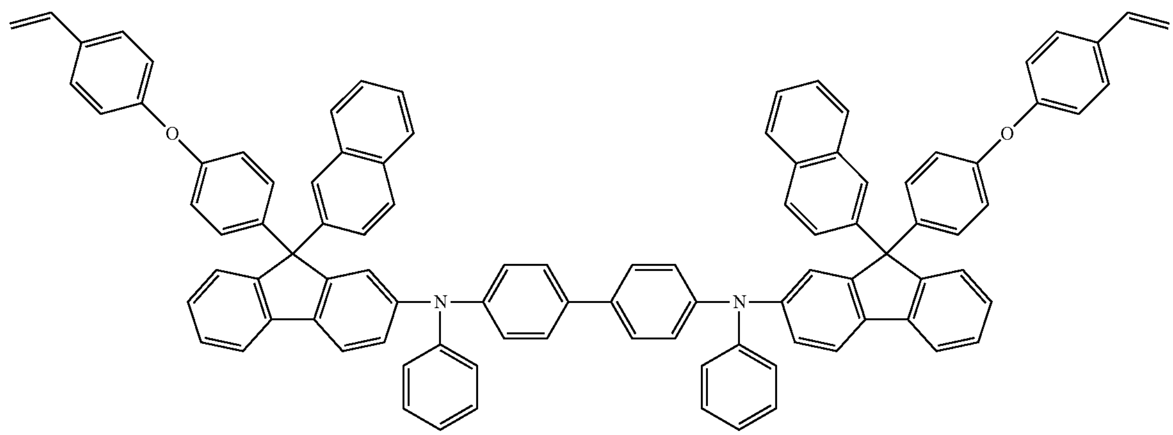
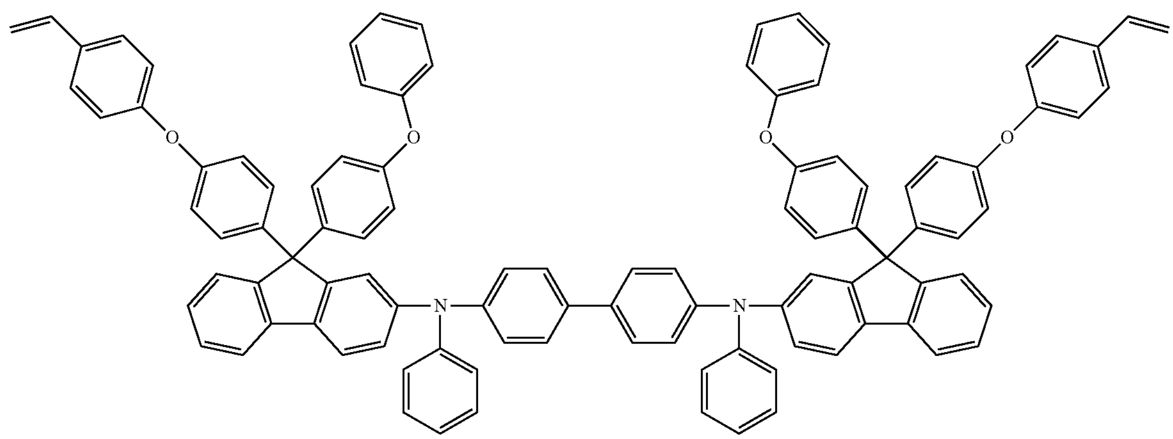
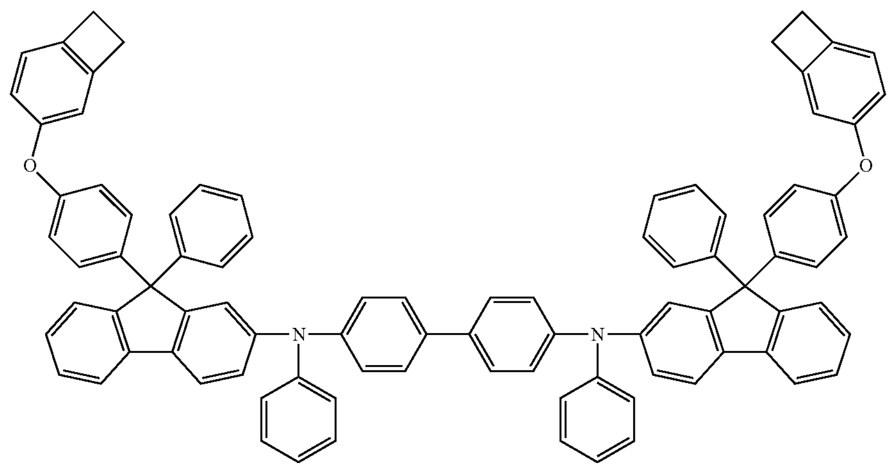

-continued
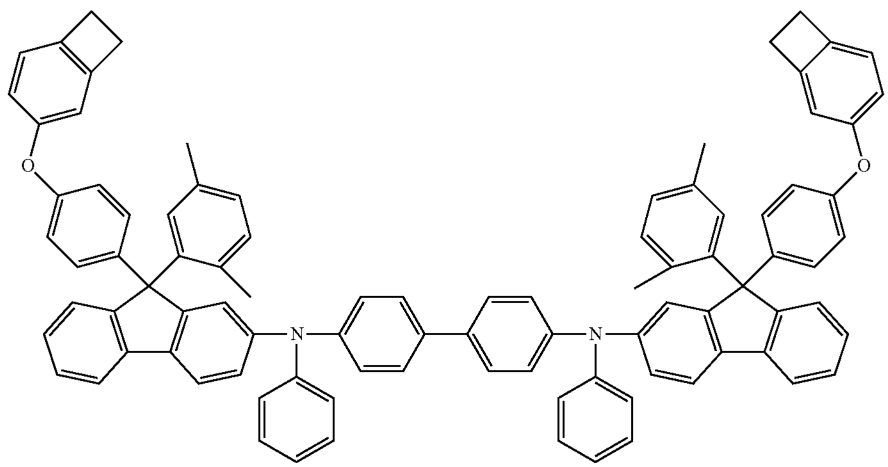
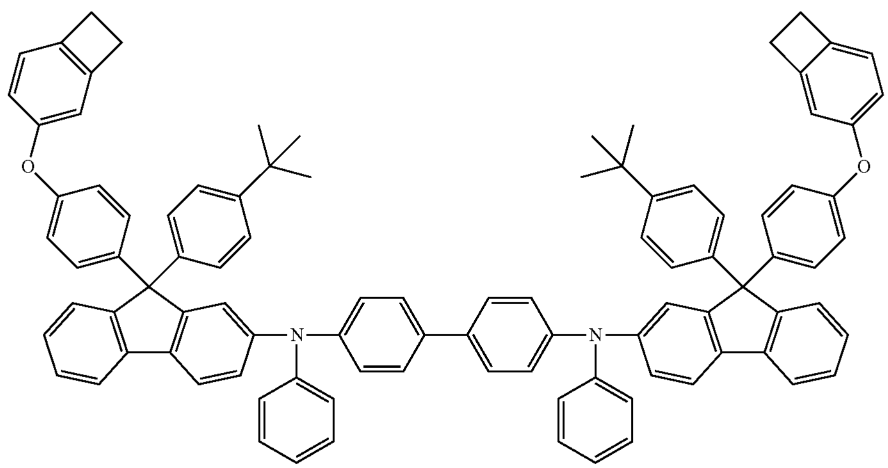
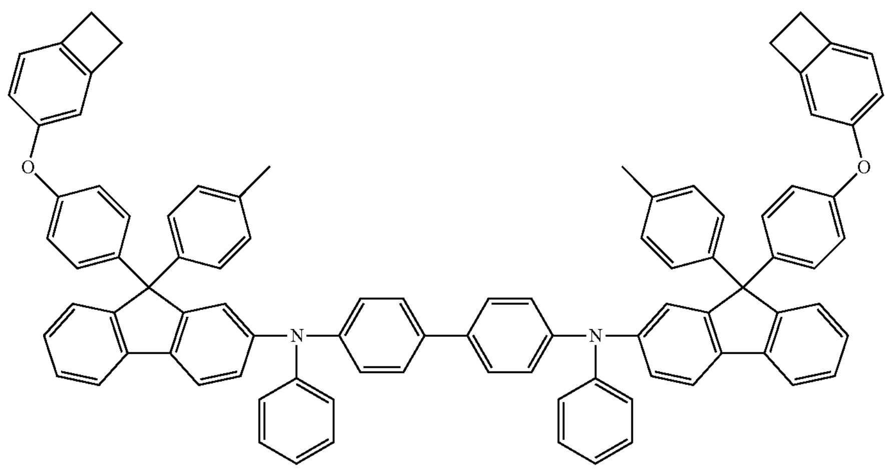

-continued
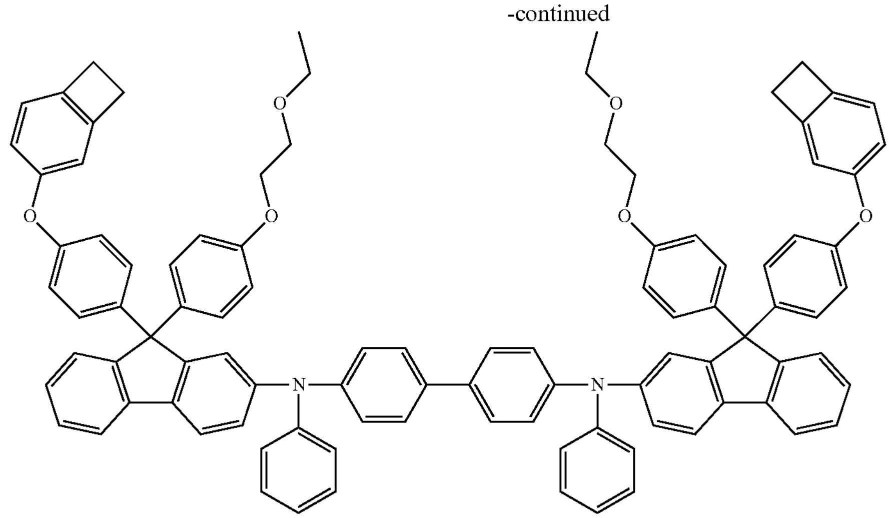
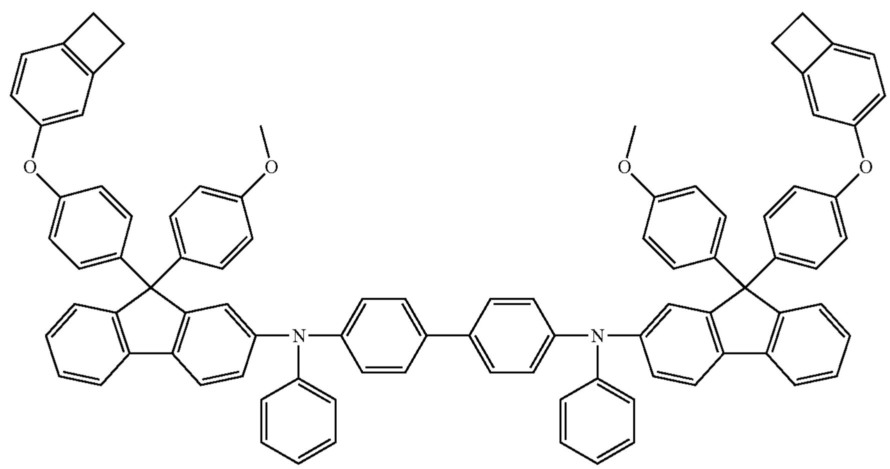
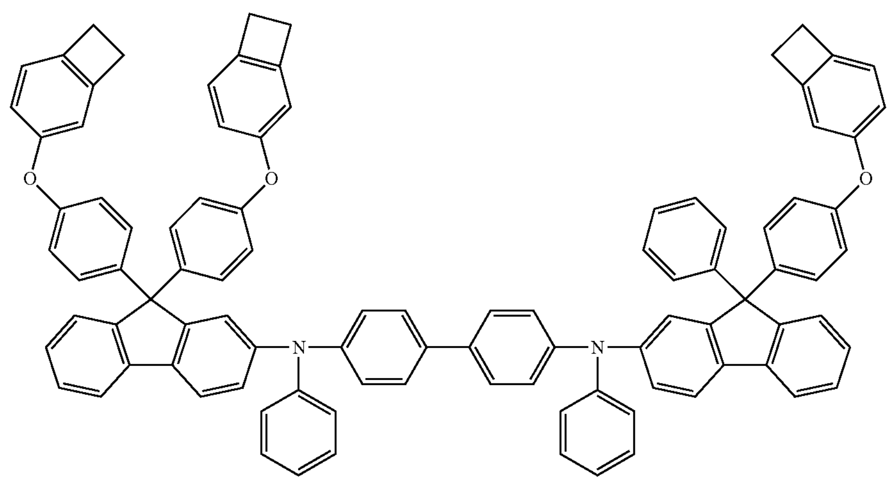

-continued
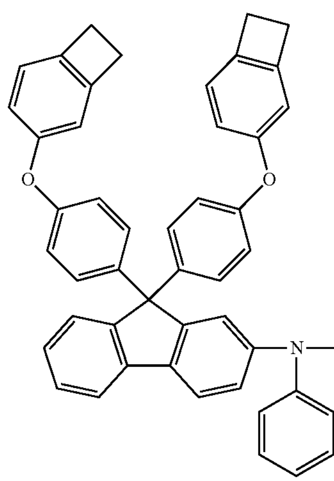
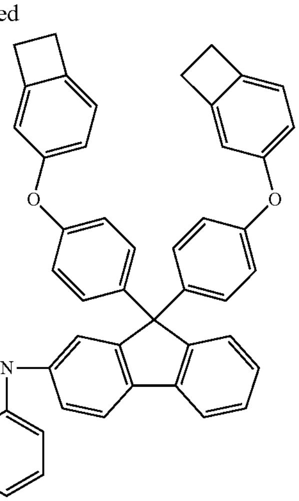
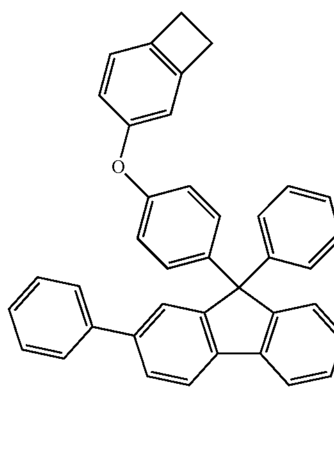
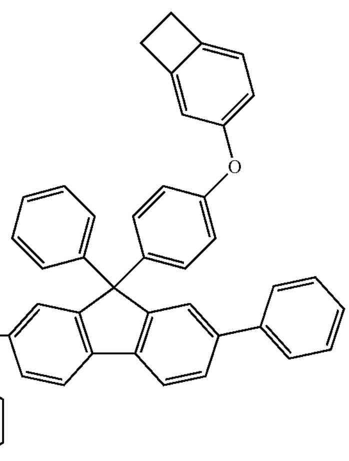
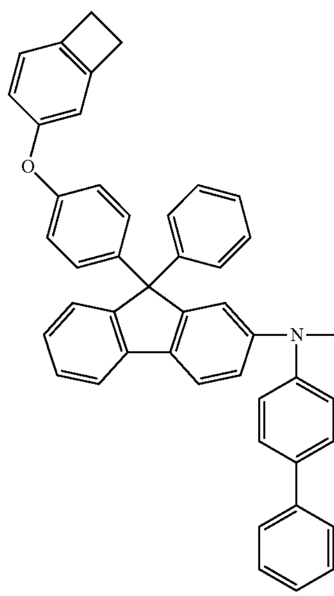
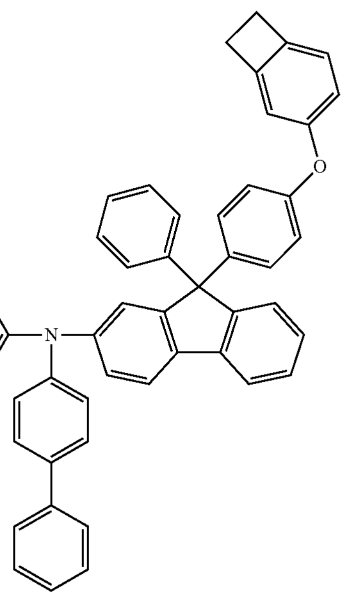

-continued
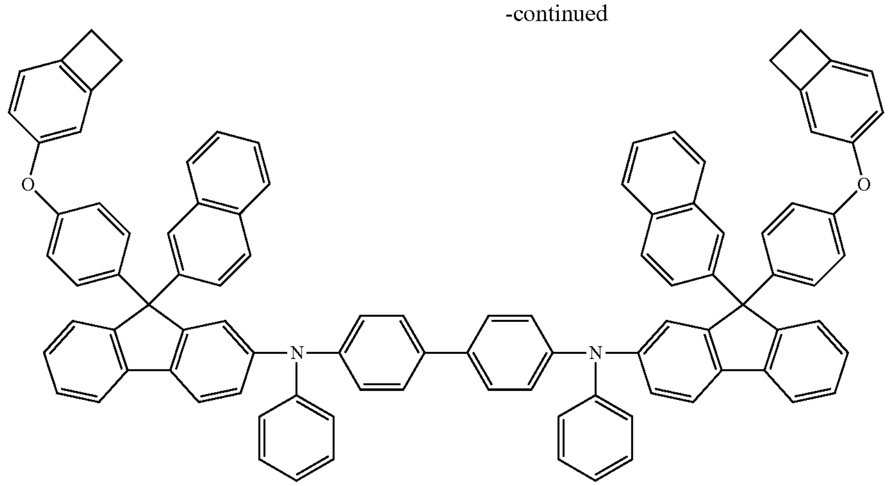
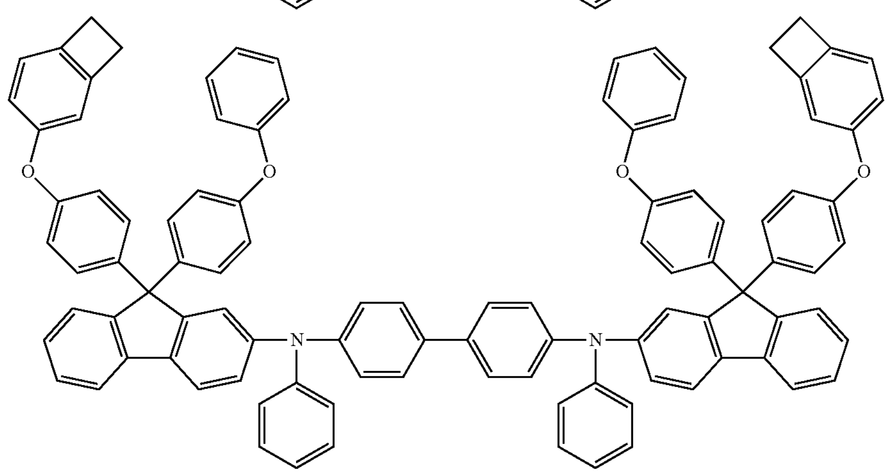
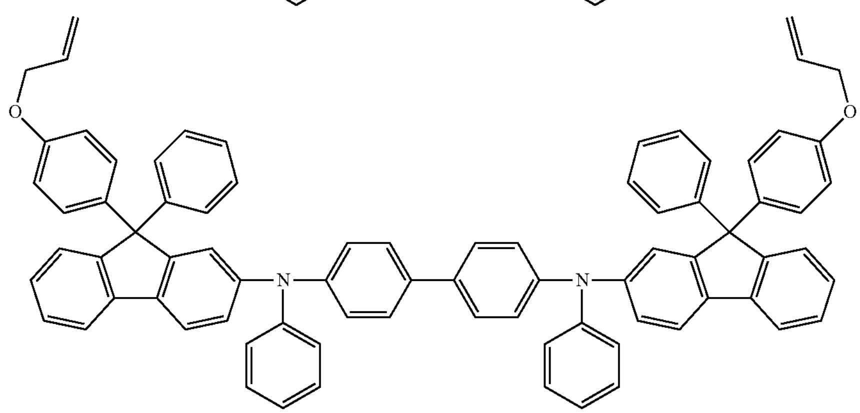
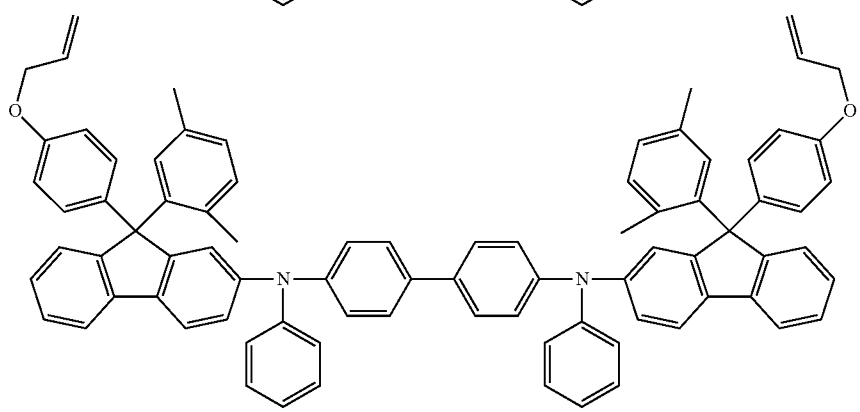

-continued
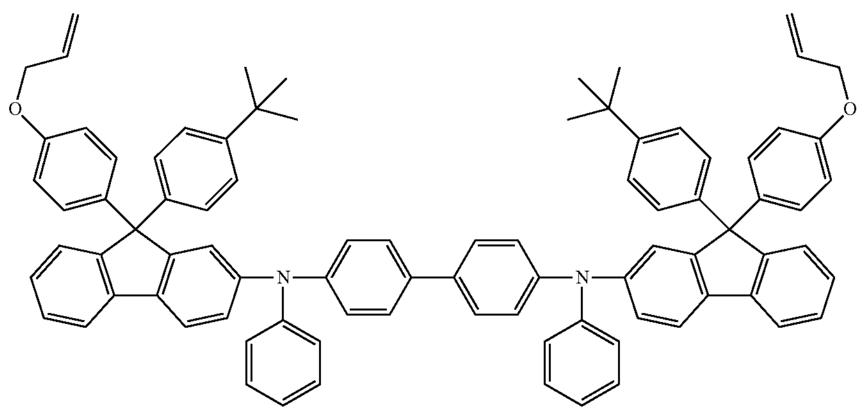
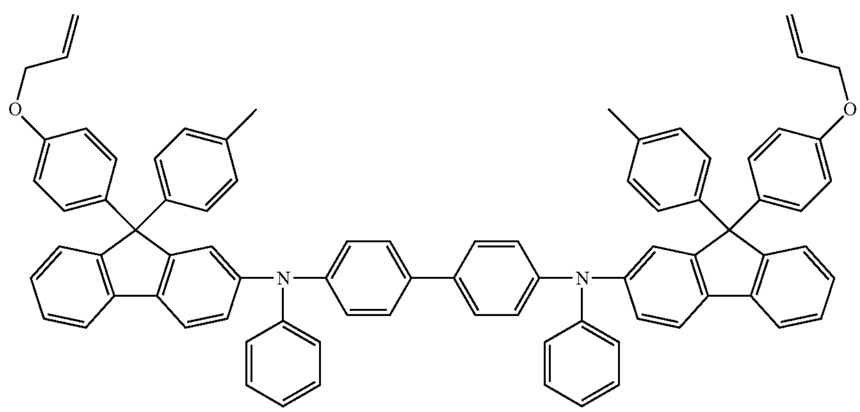
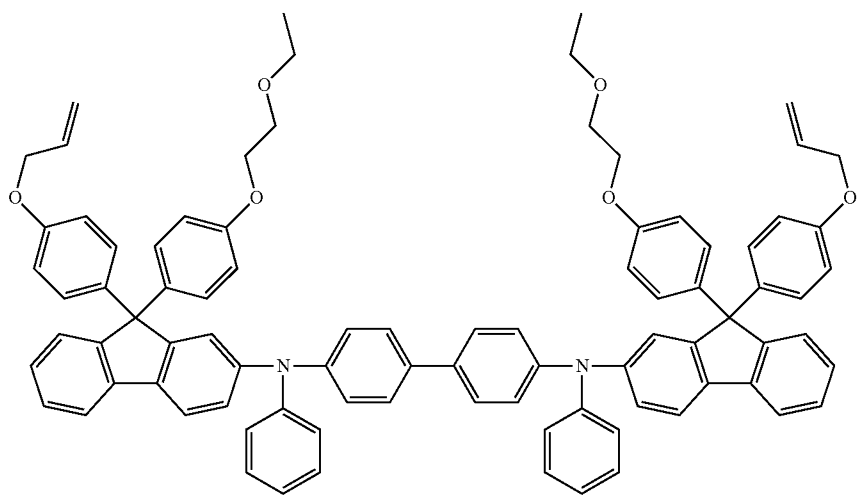
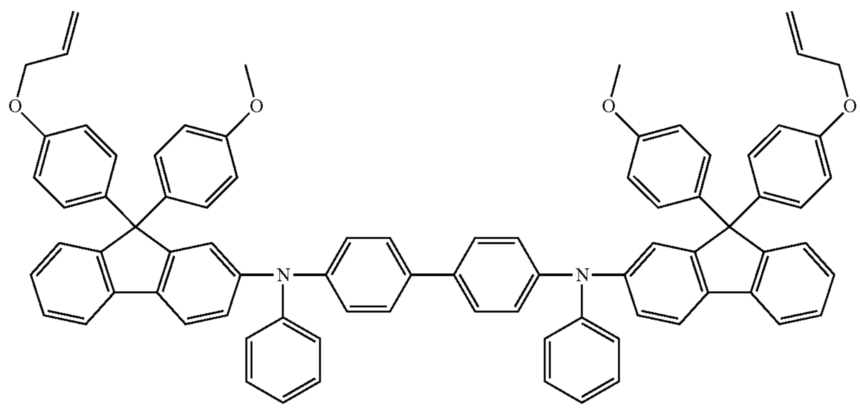

-continued
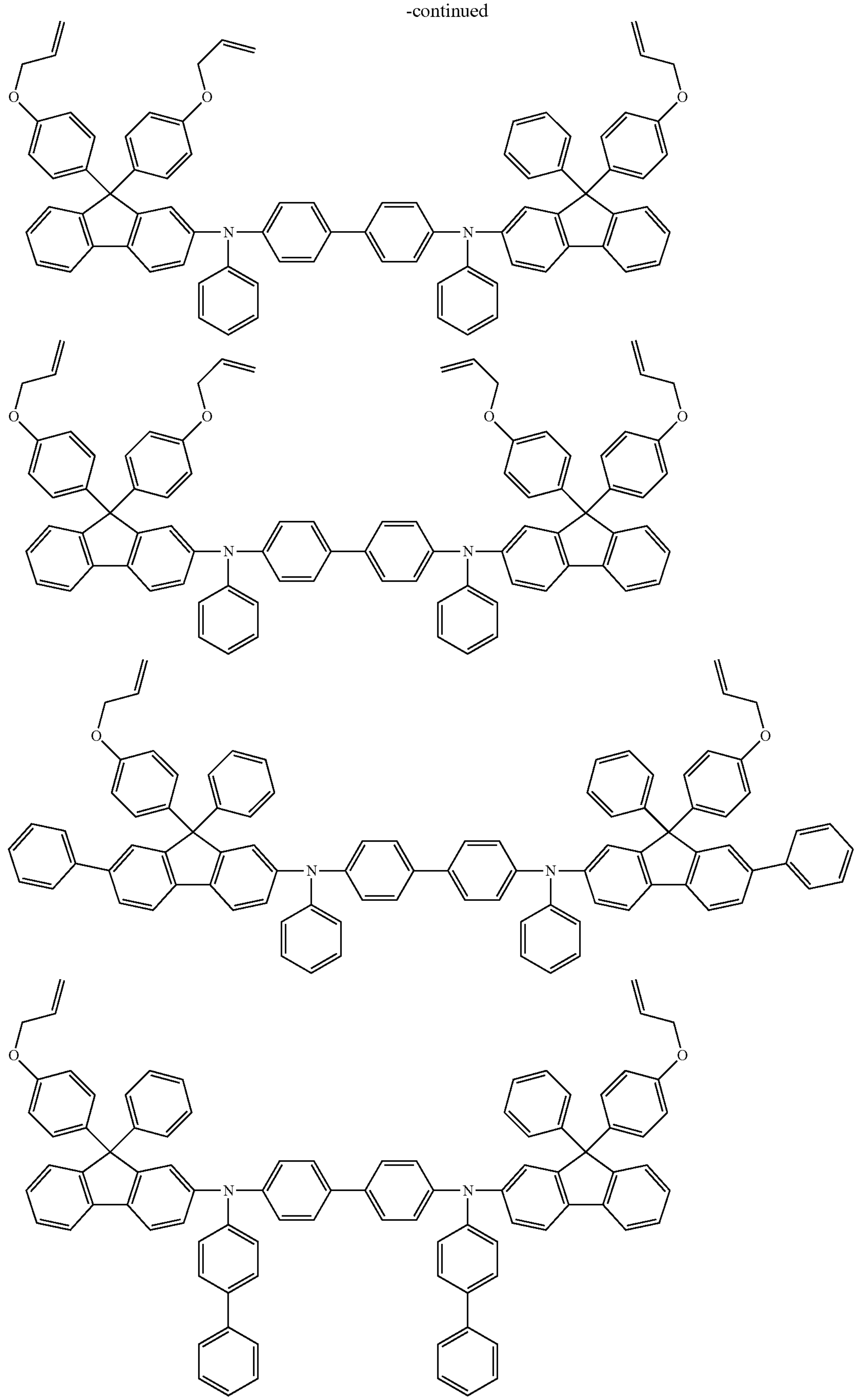

-continued
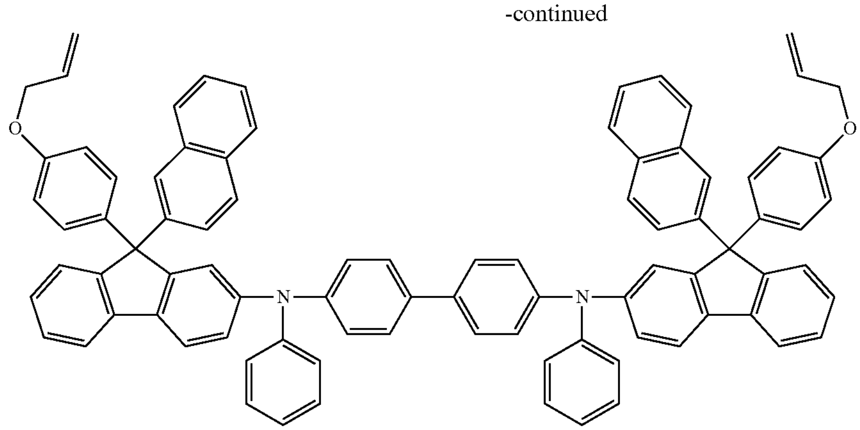
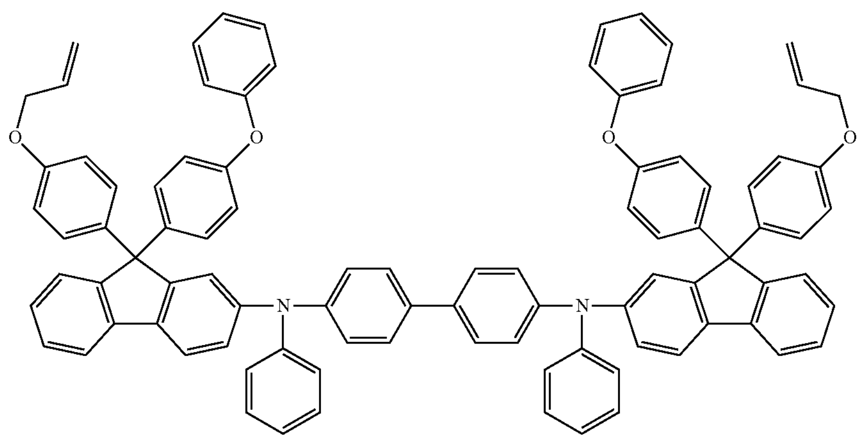
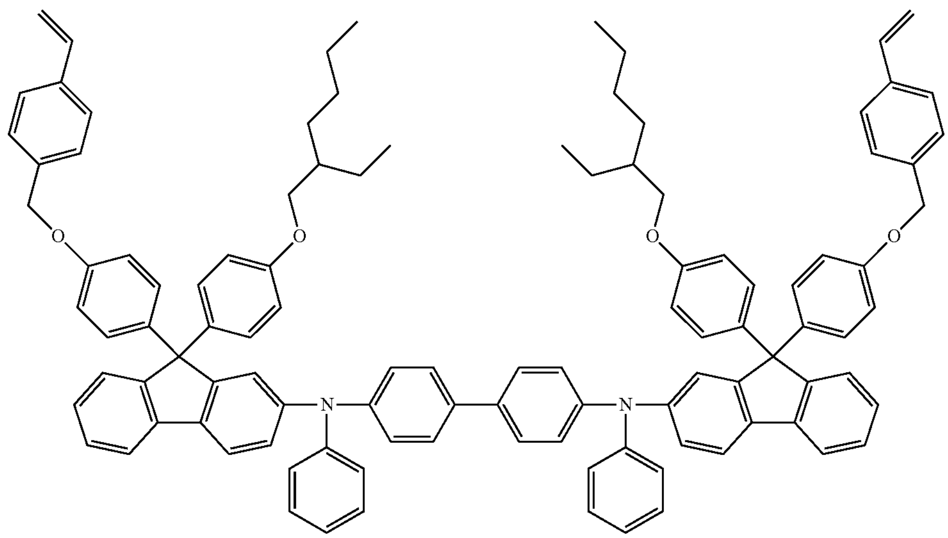

-continued
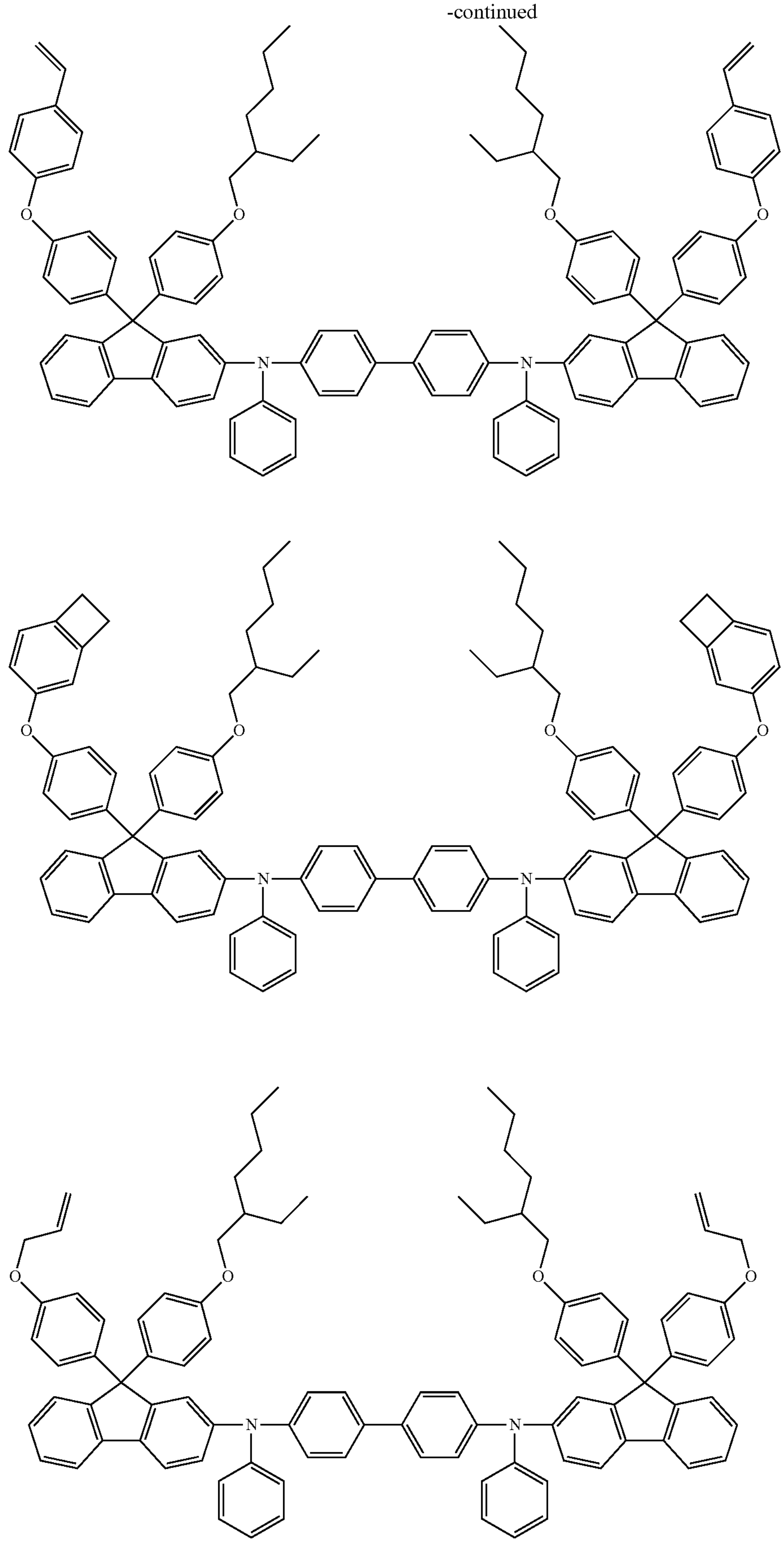

-continued
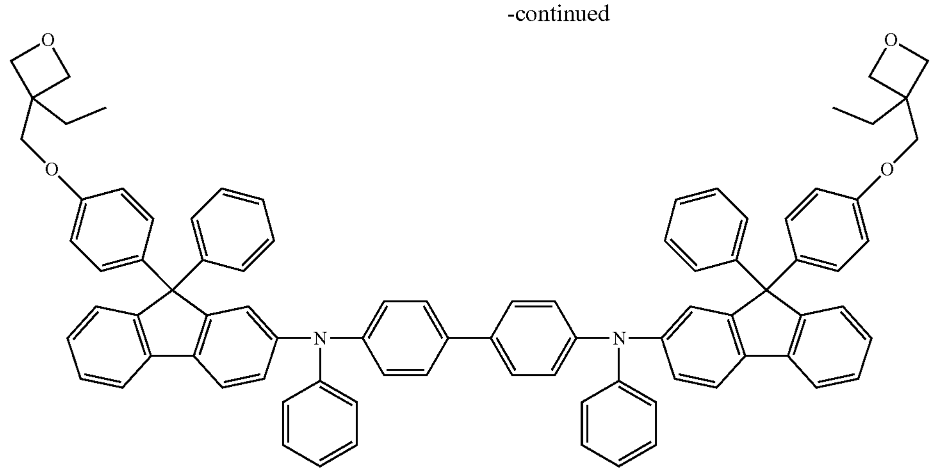
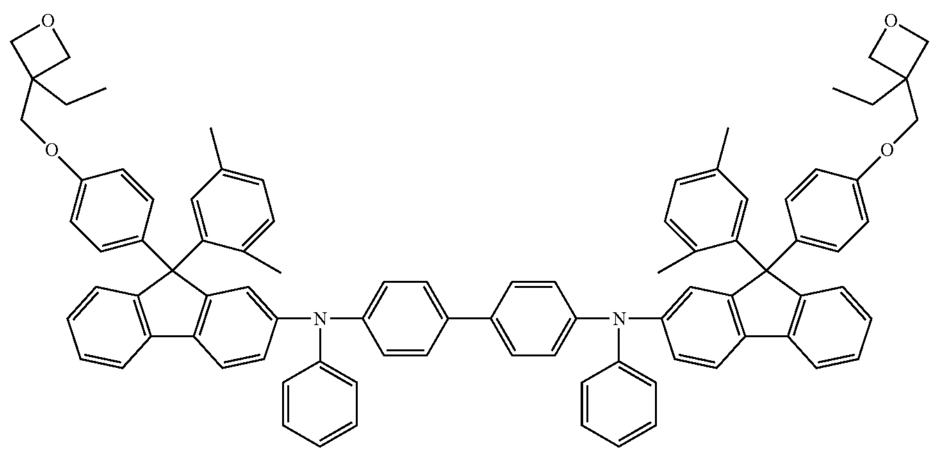
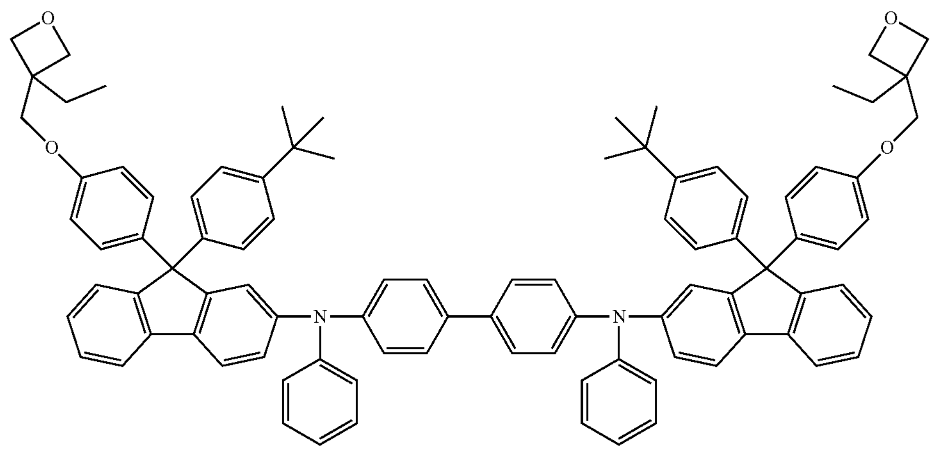

-continued
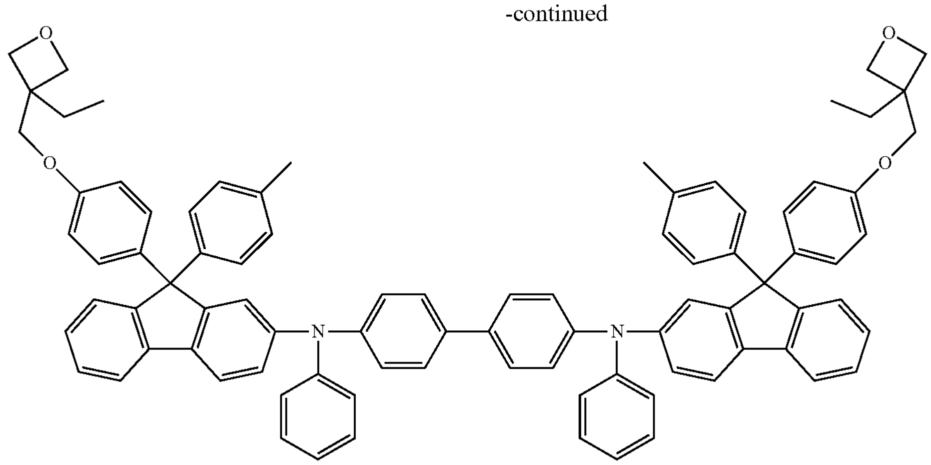
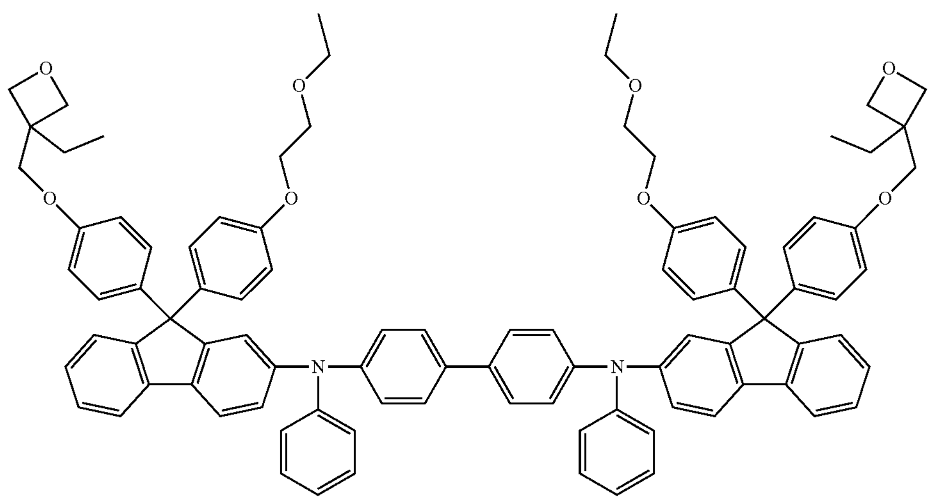
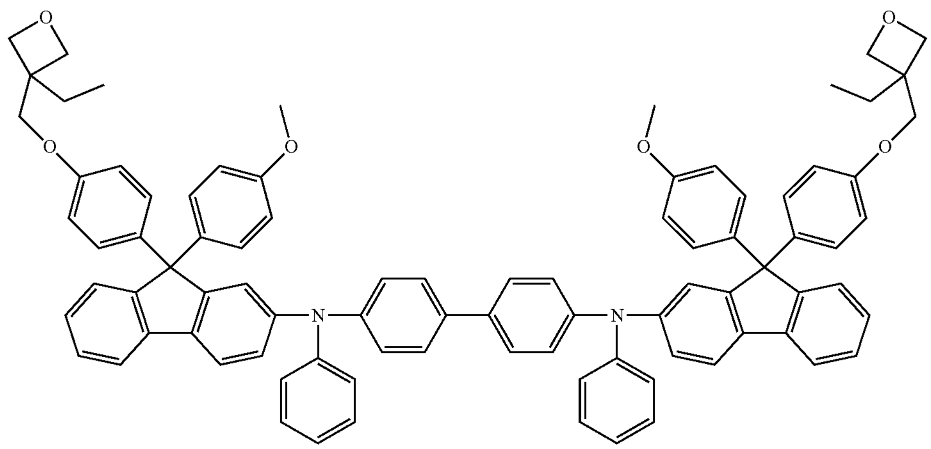

-continued
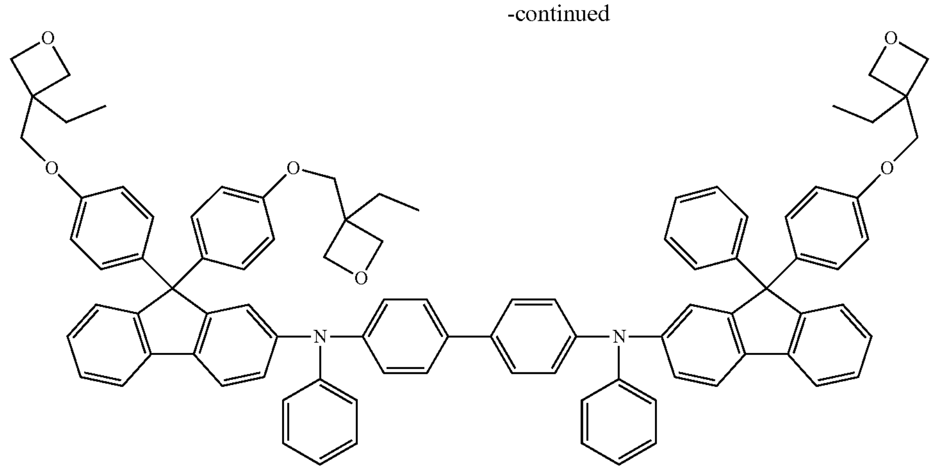
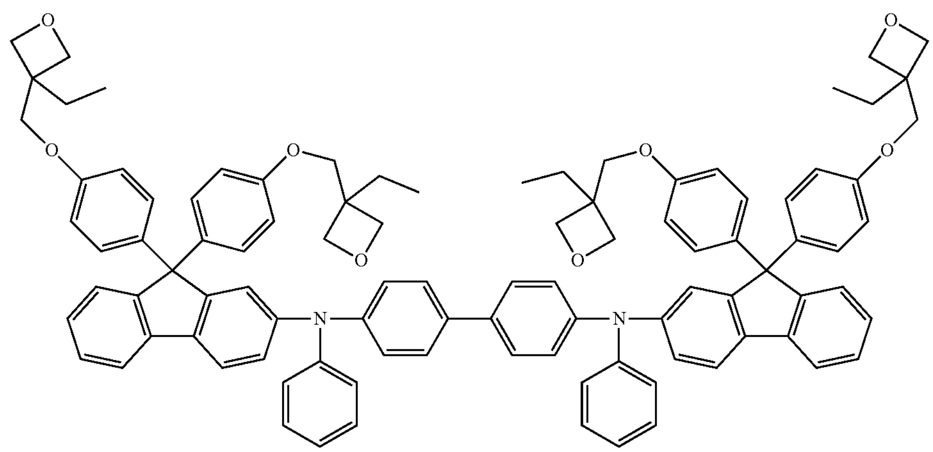
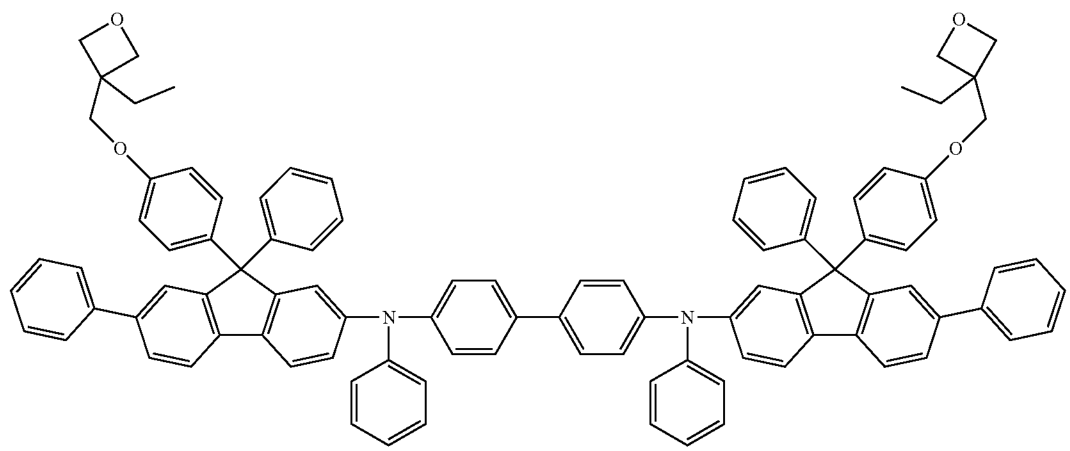

-continued
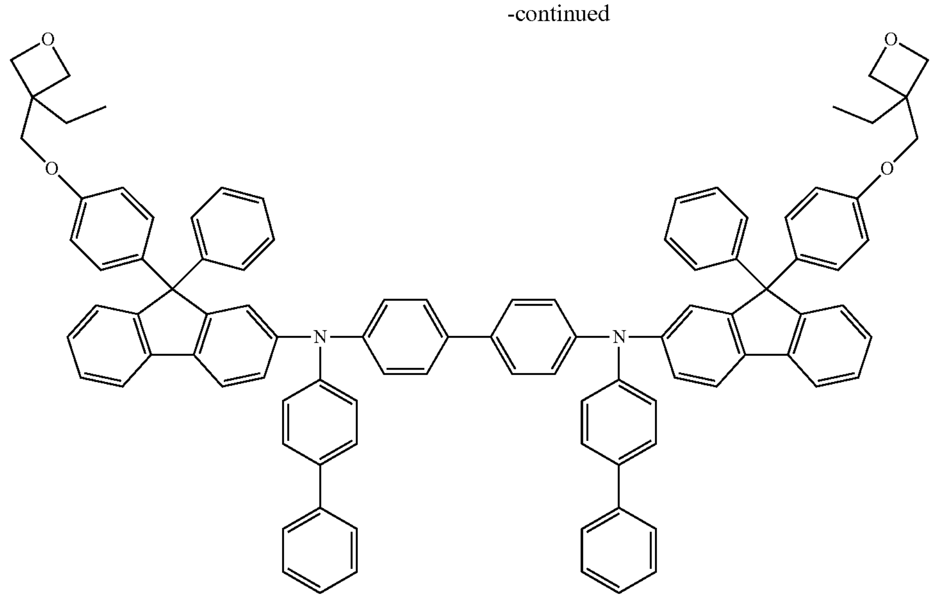
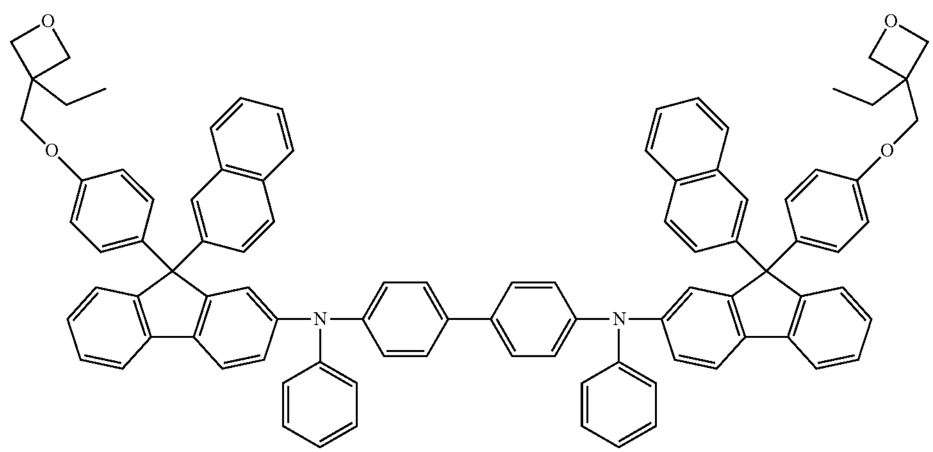
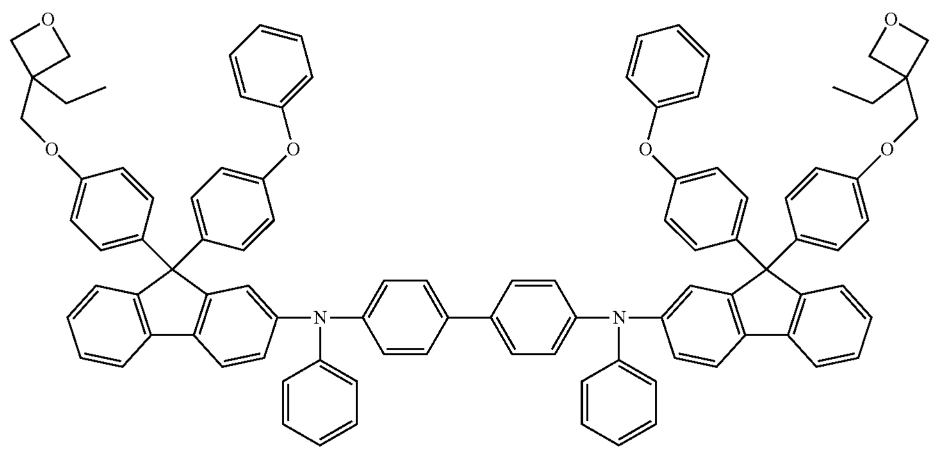

-continued
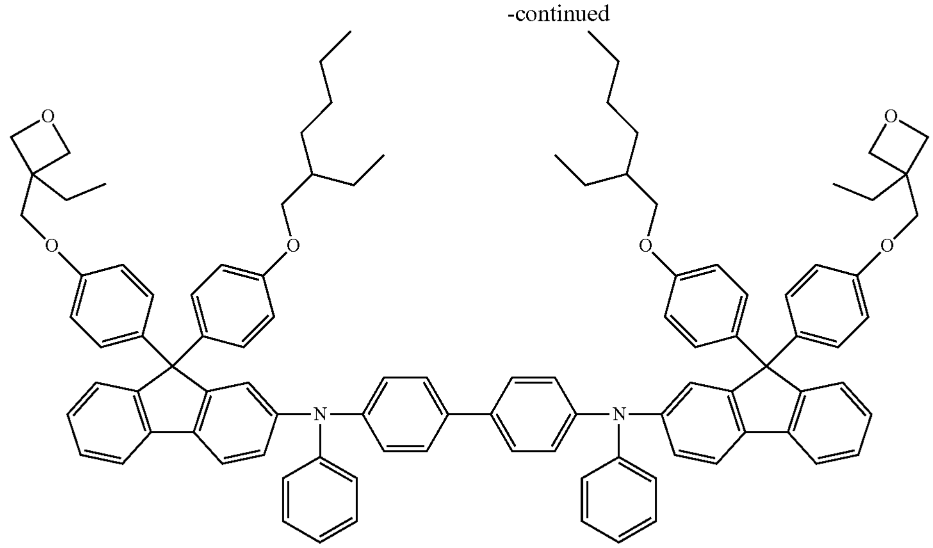
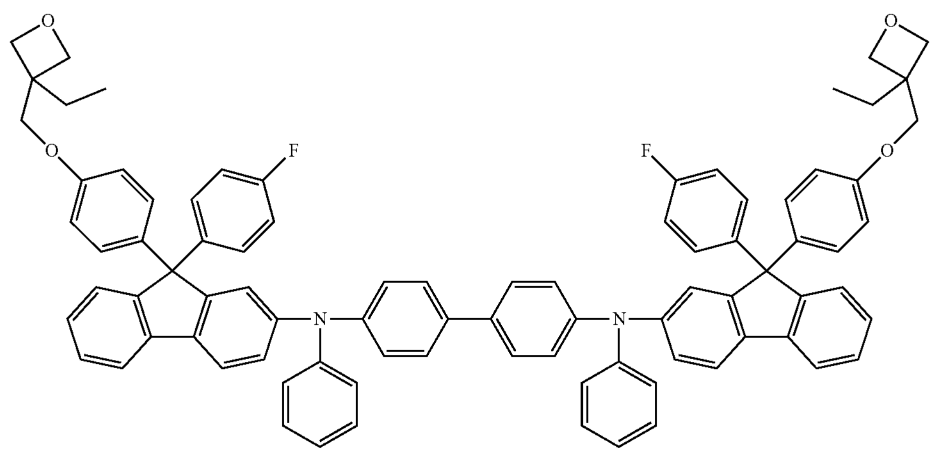
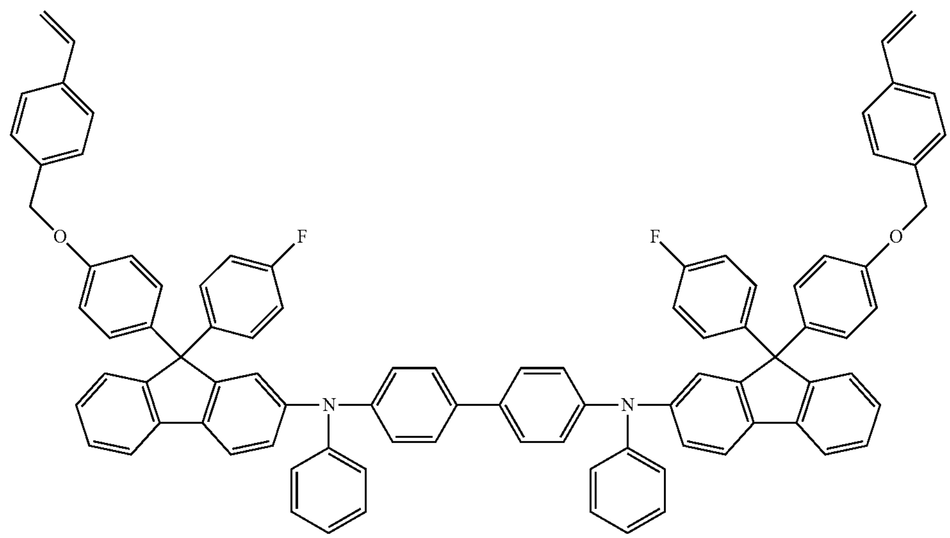

-continued
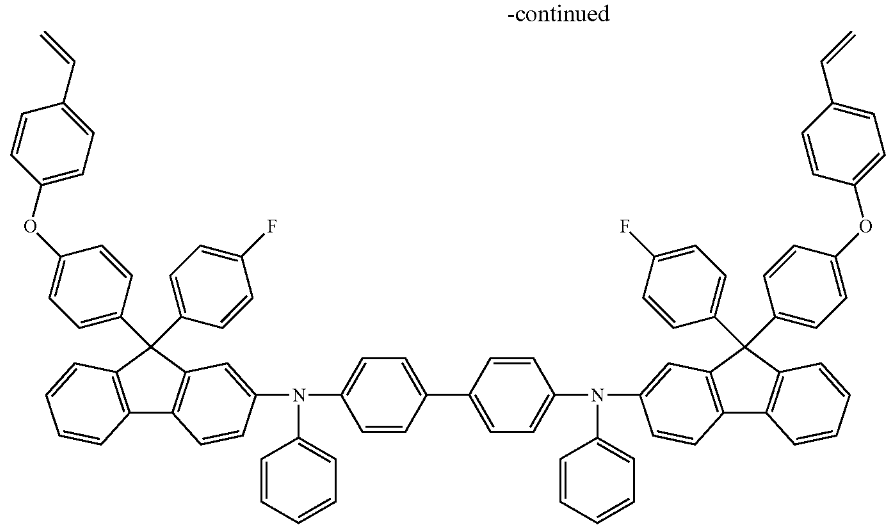
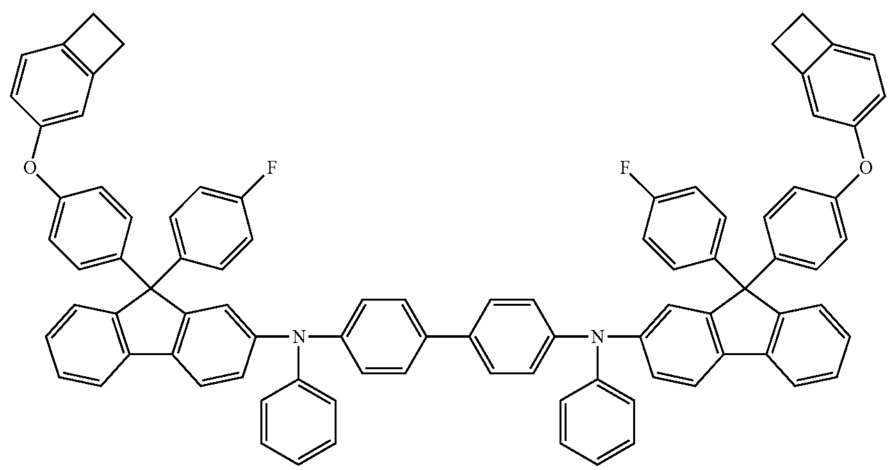
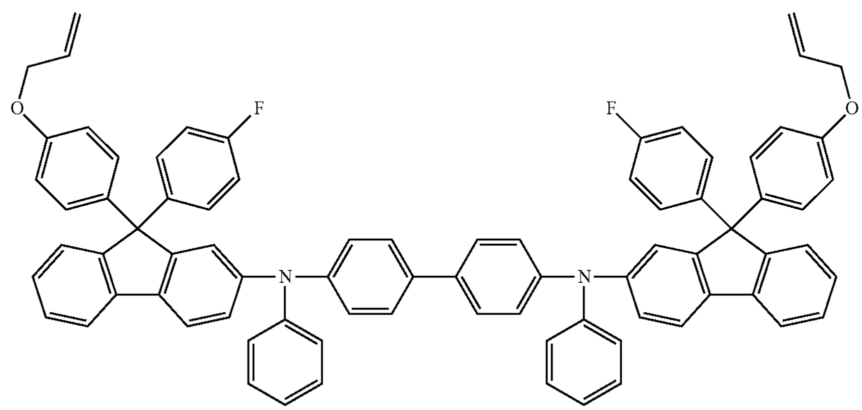

-continued
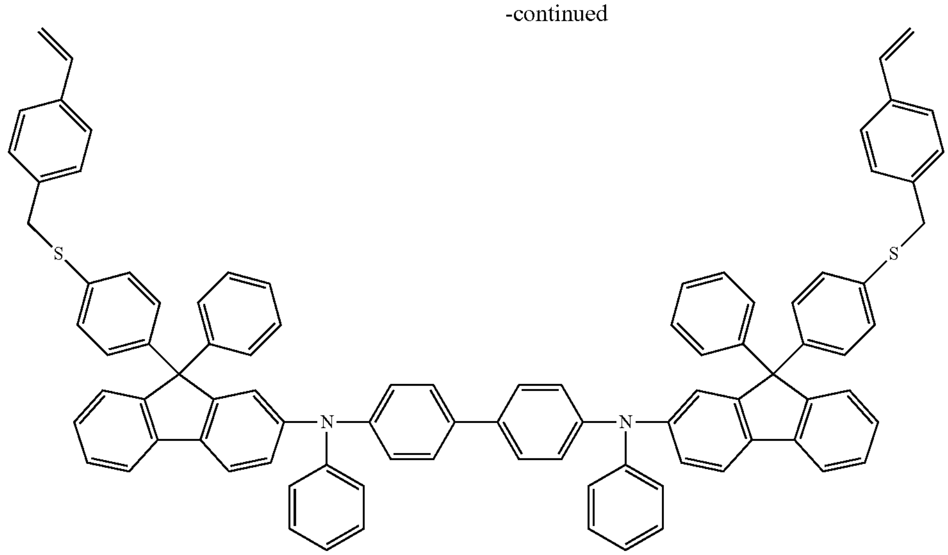
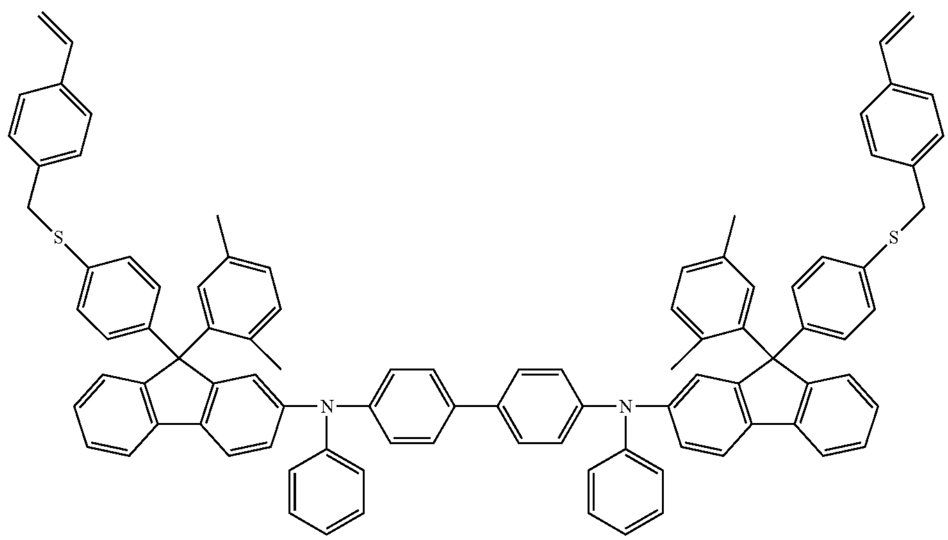
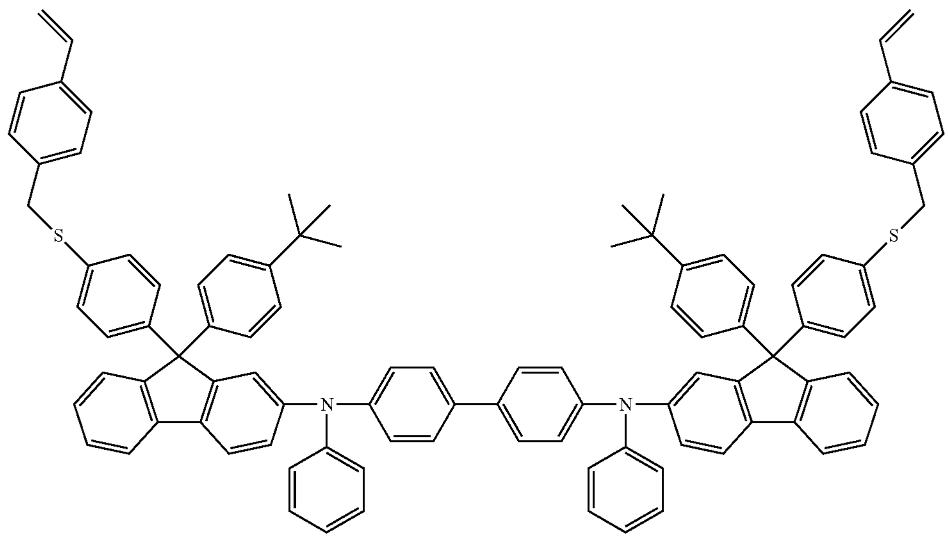

-continued
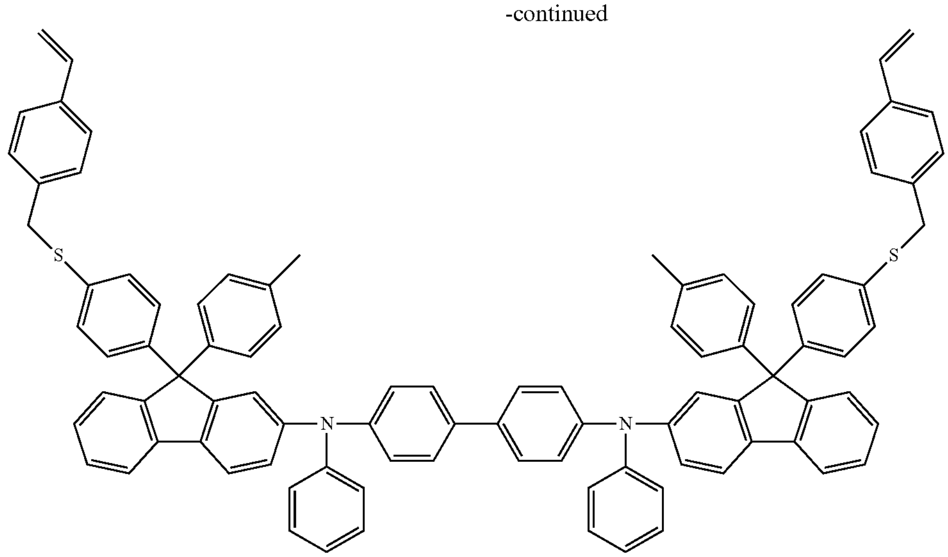
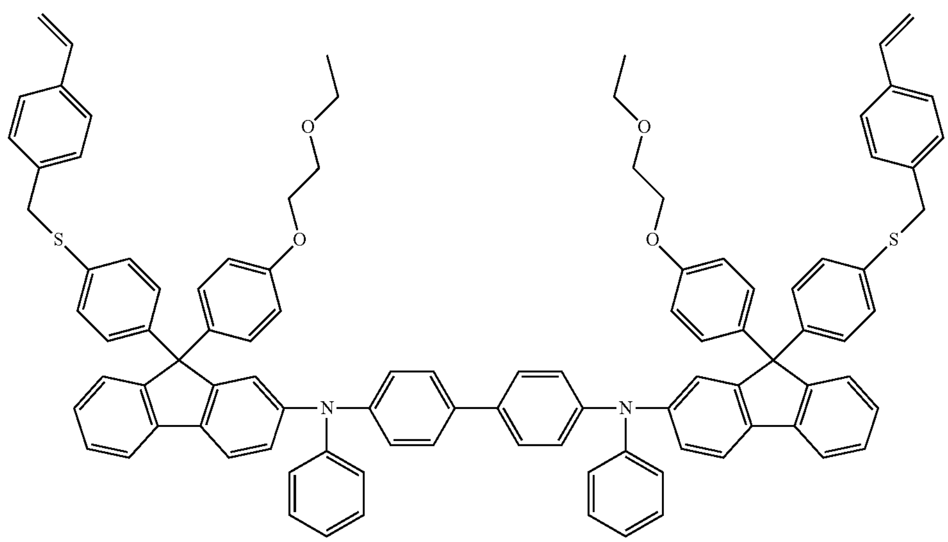
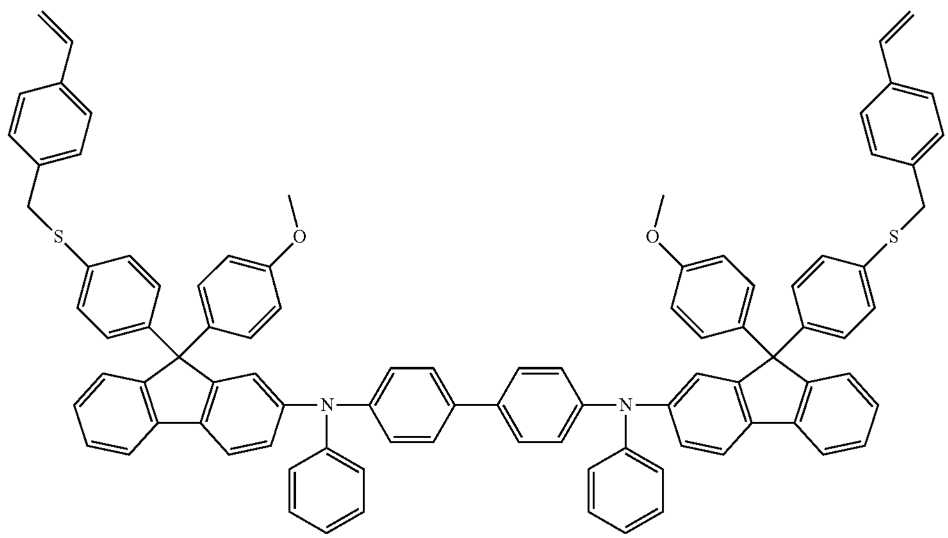

-continued
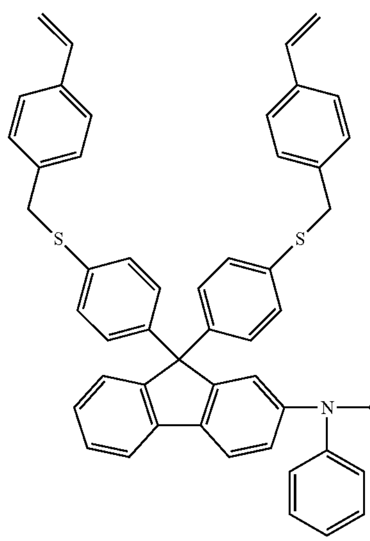
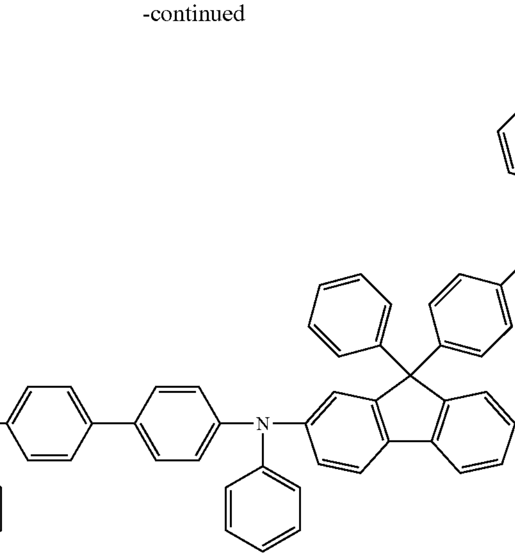
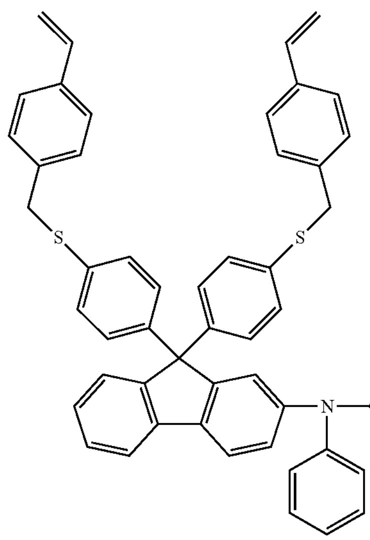
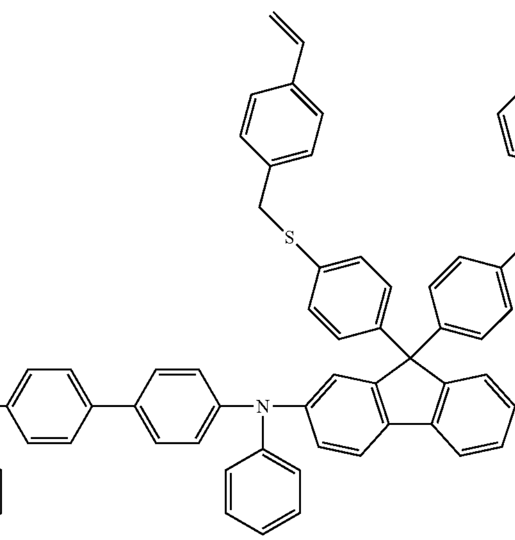
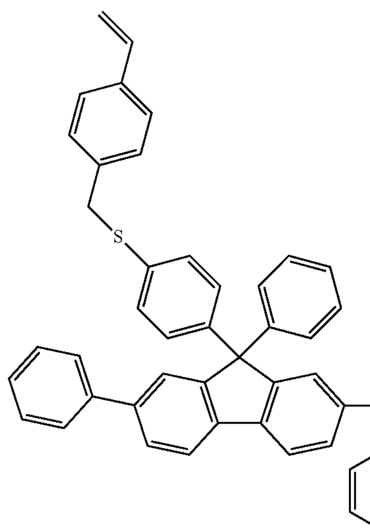
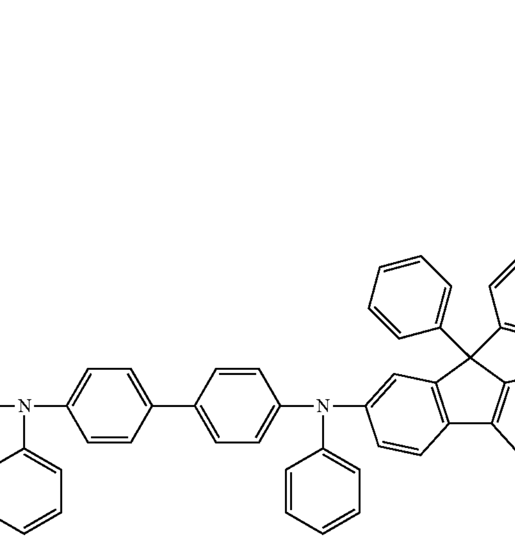
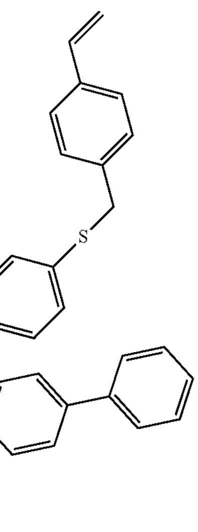

-continued
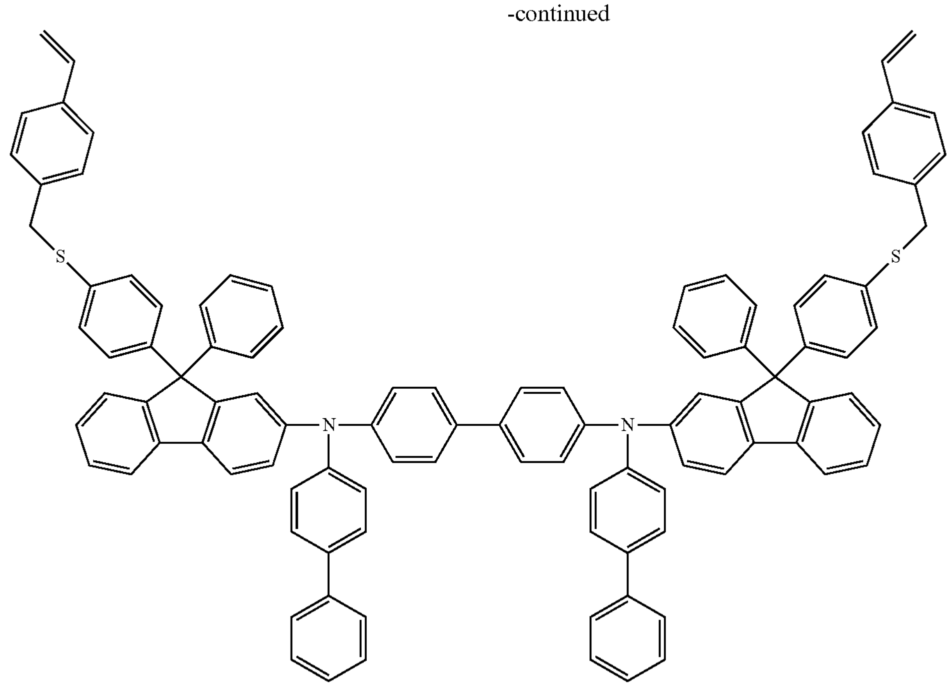
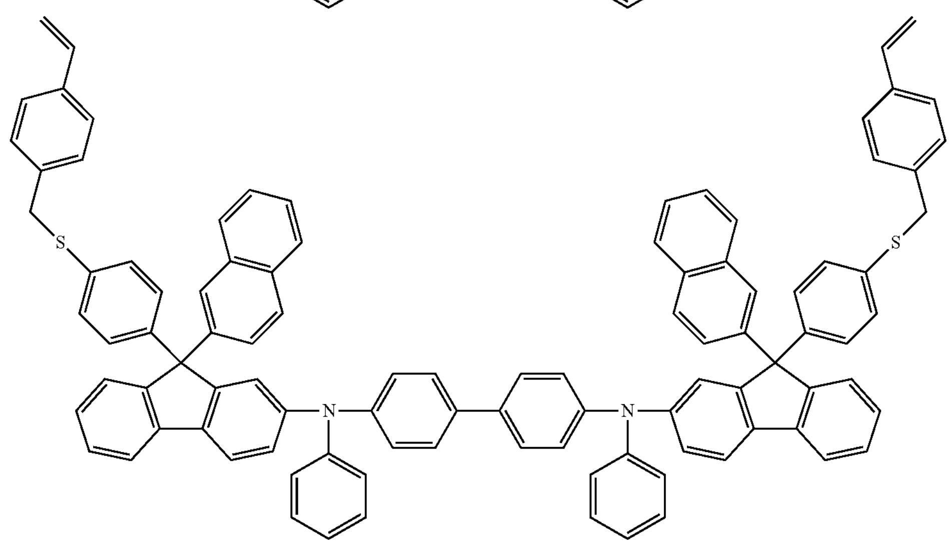
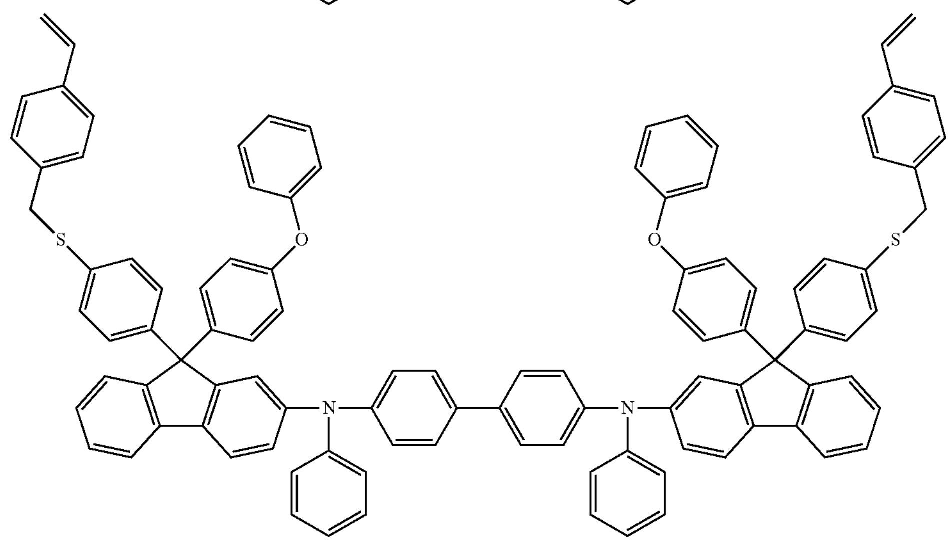

-continued
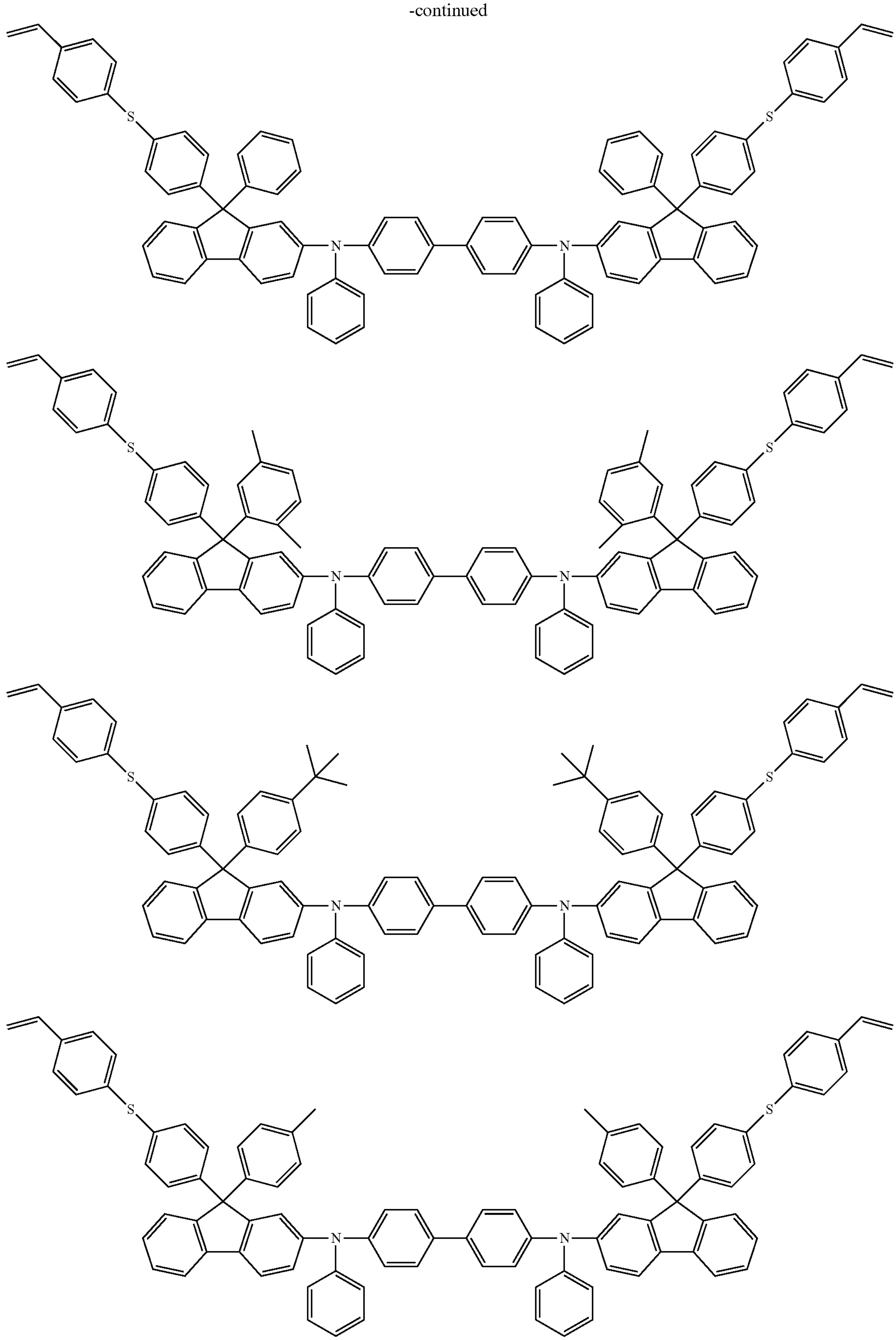

-continued
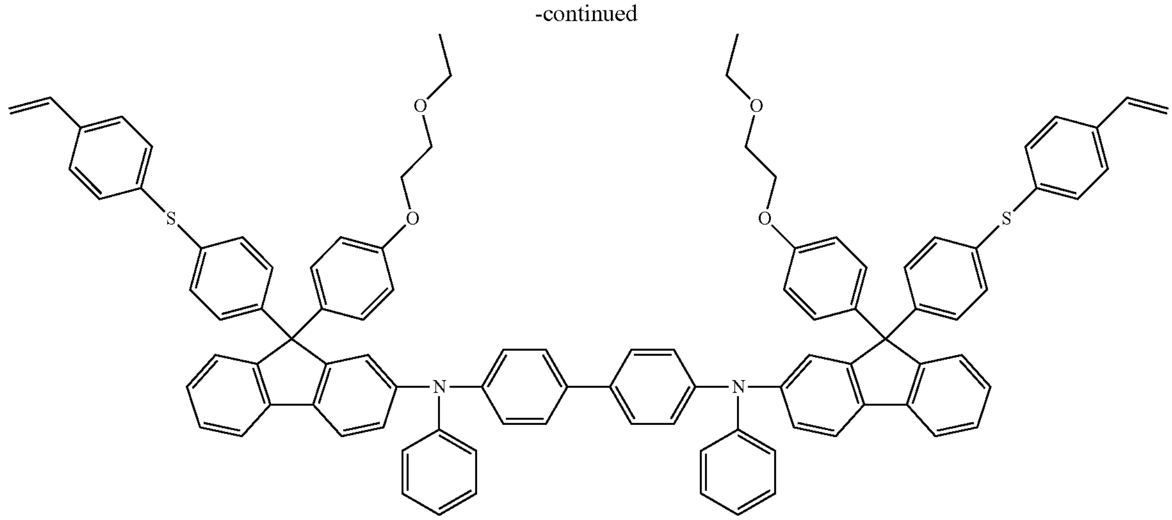
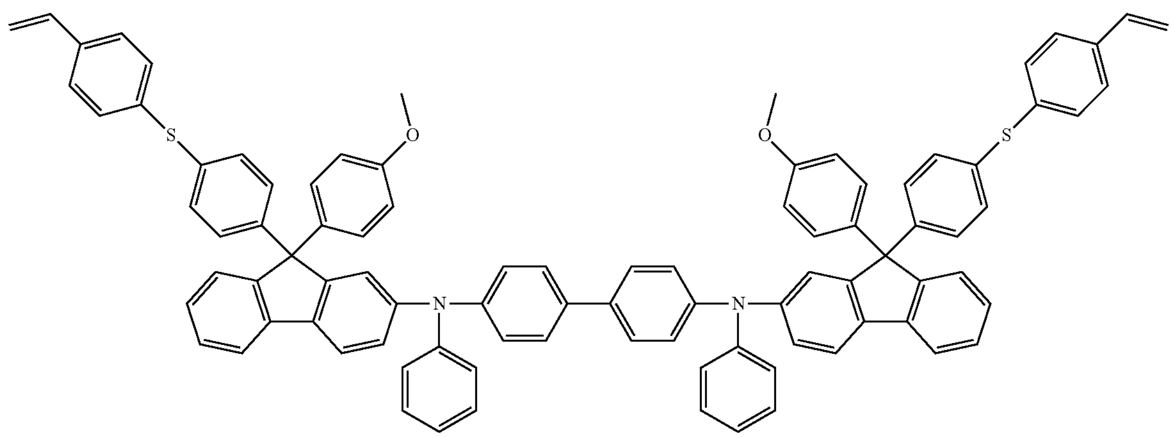
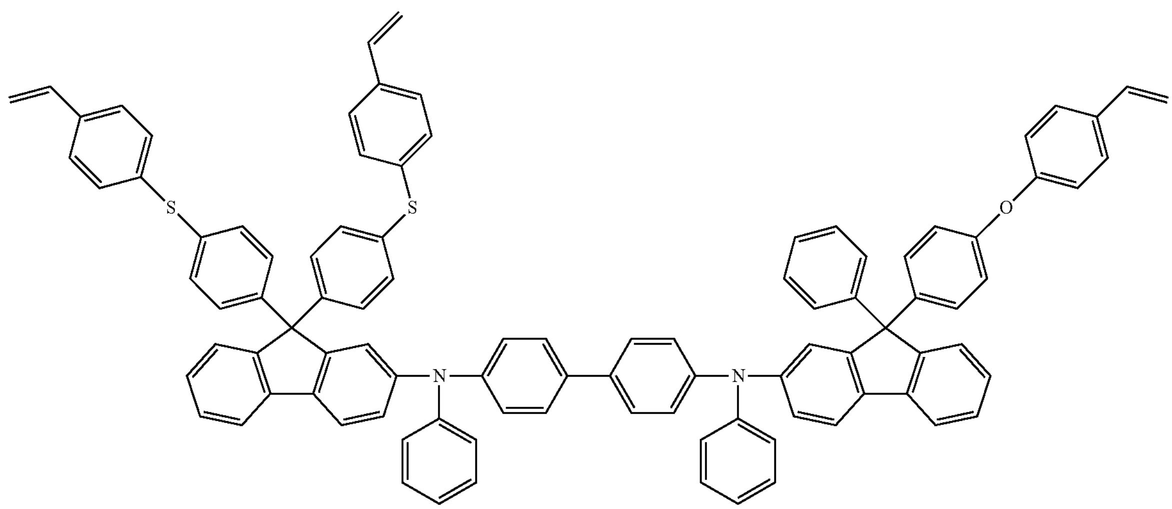

-continued
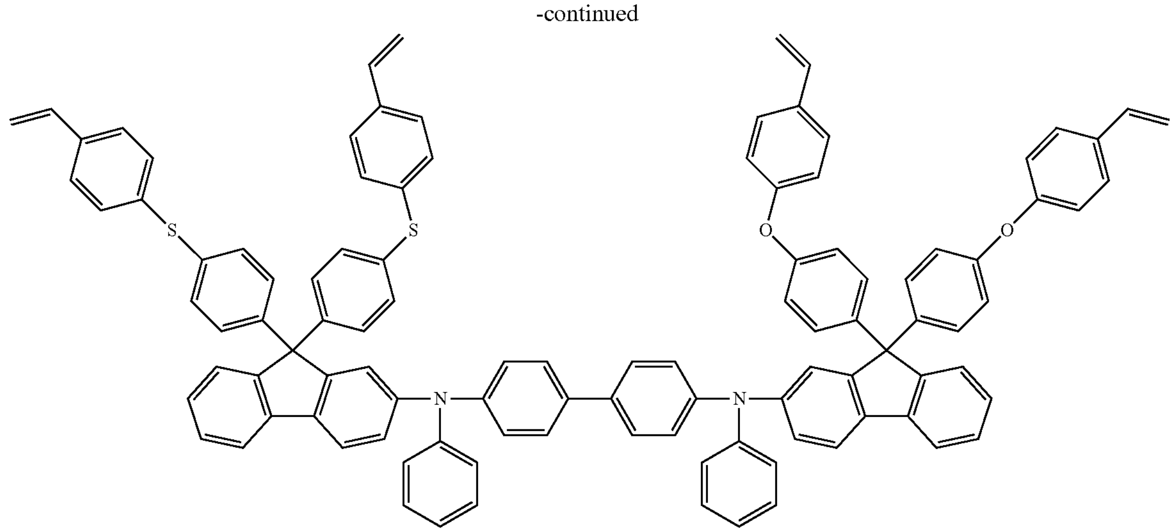
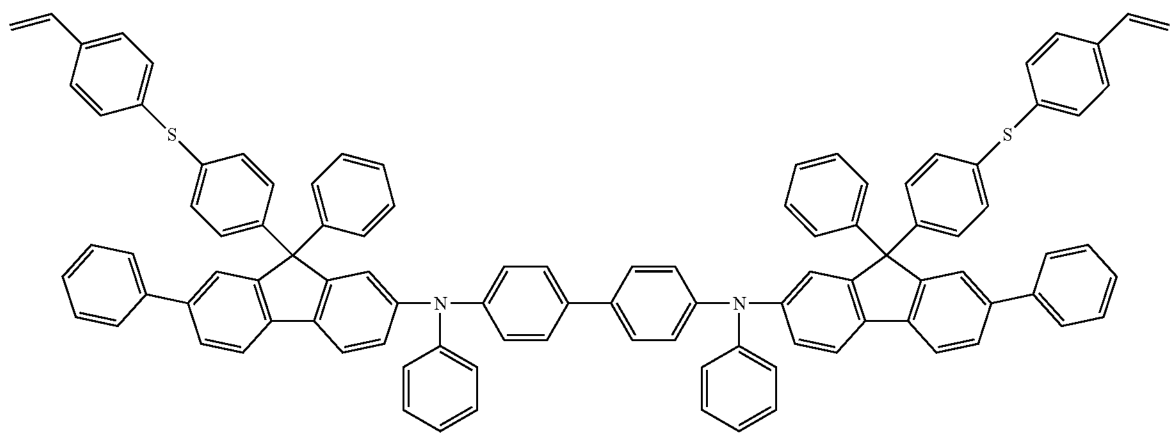
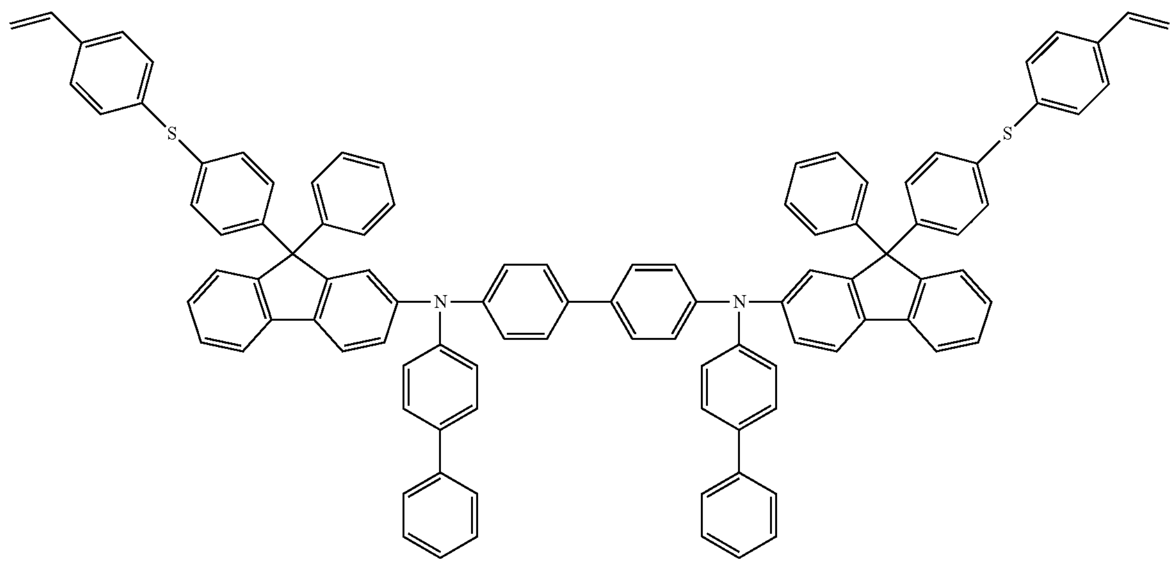

-continued
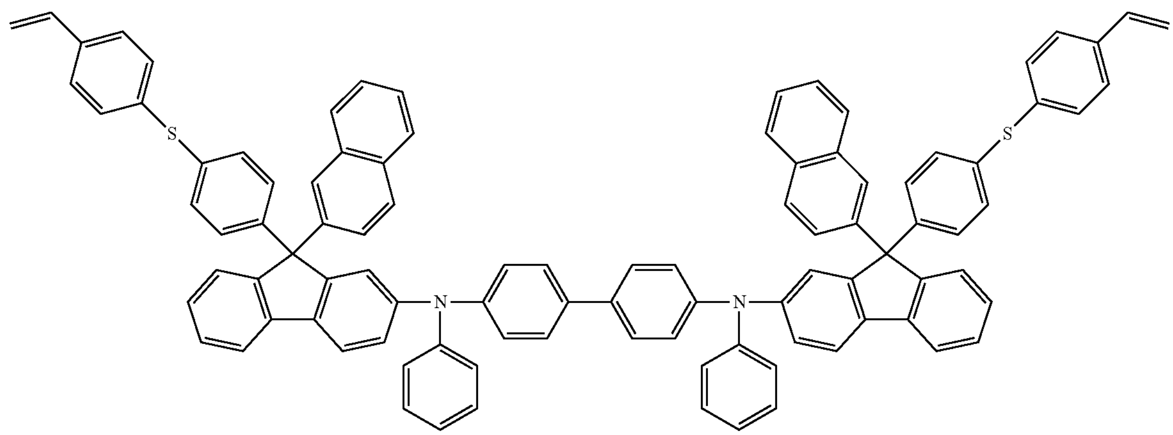
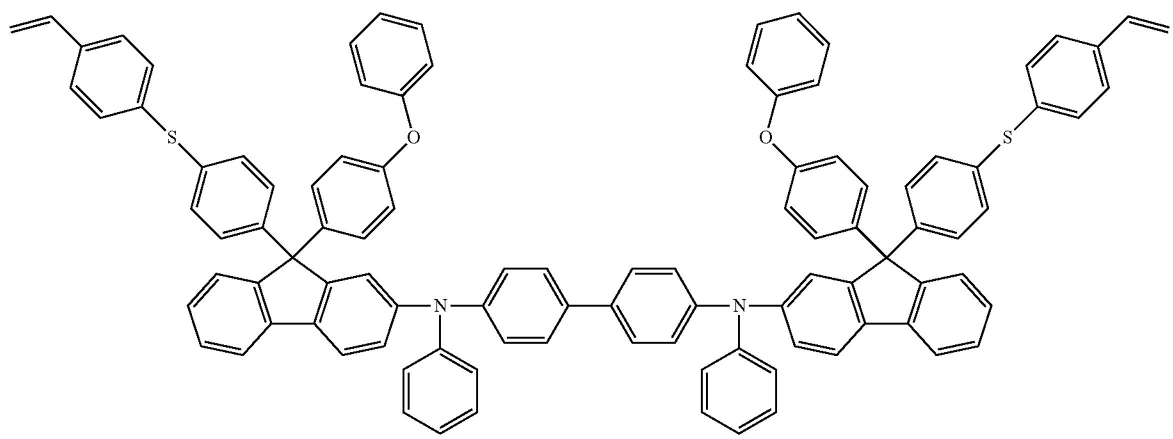
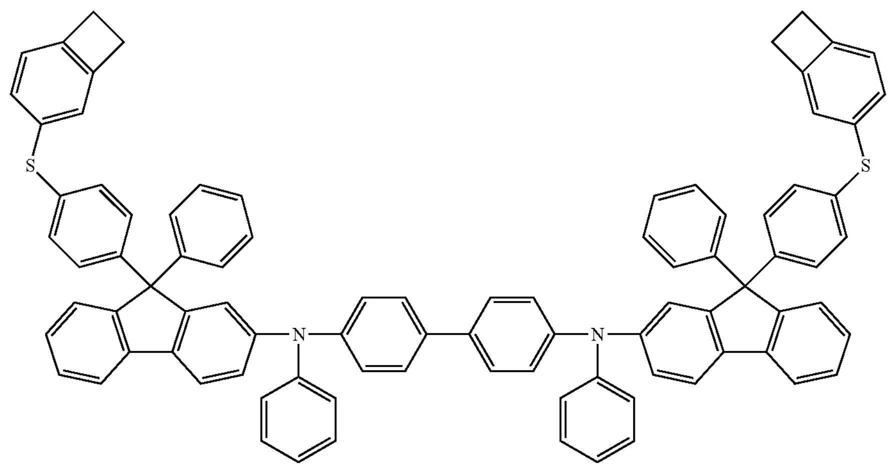

-continued
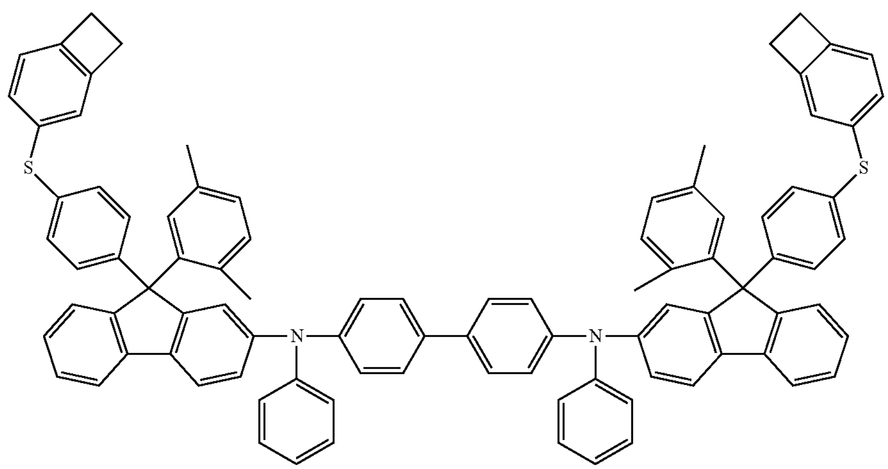
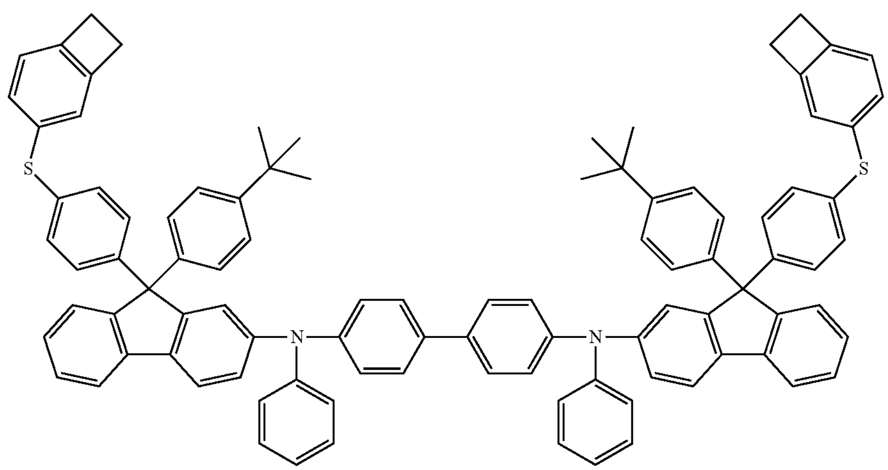
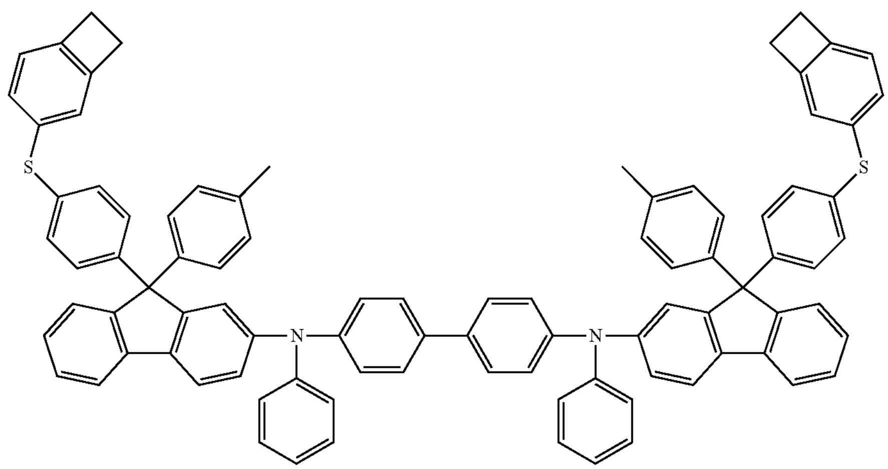

-continued
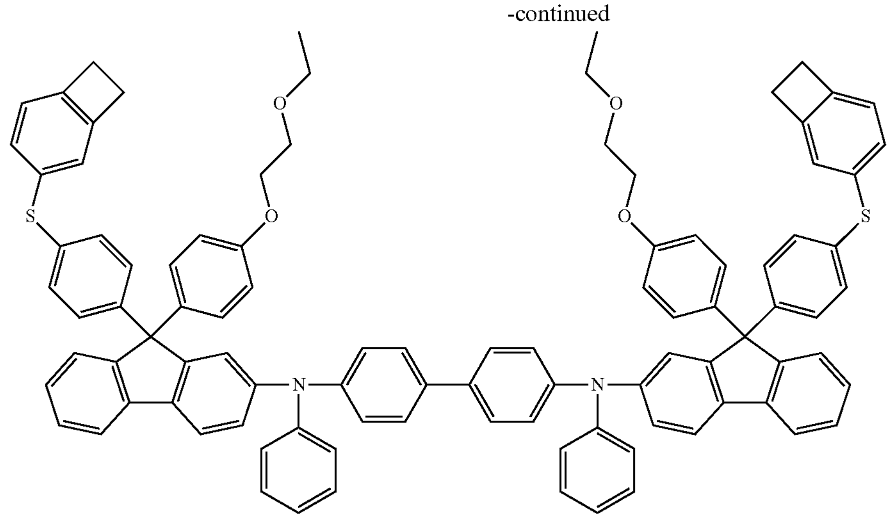
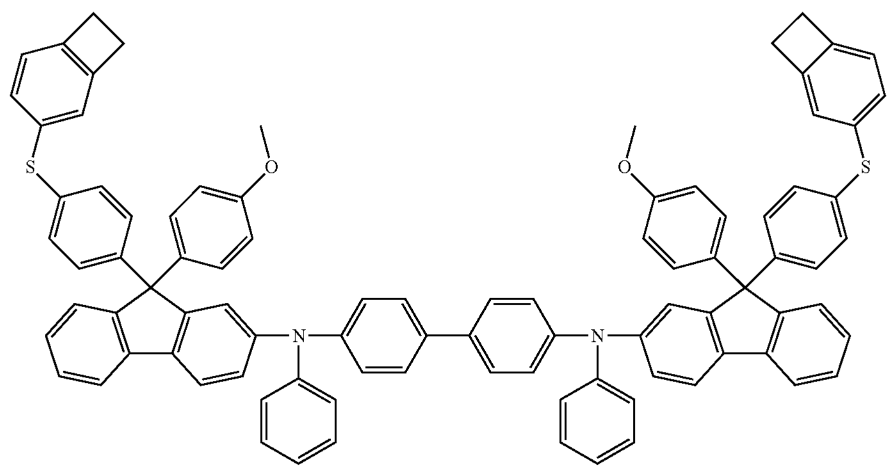
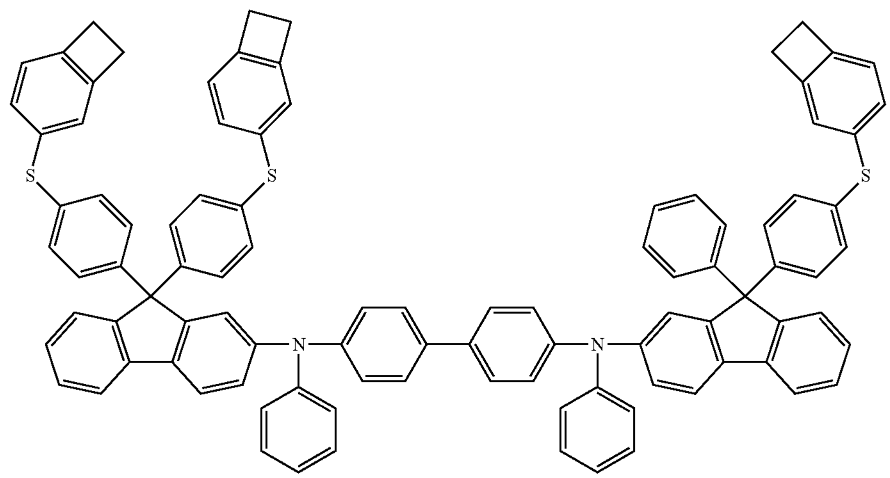

-continued
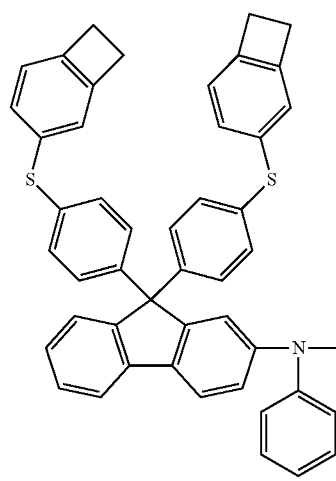
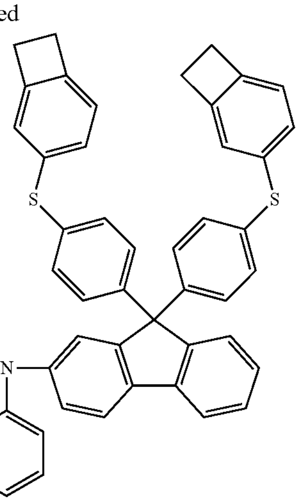
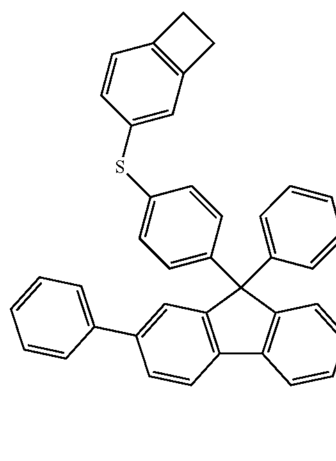
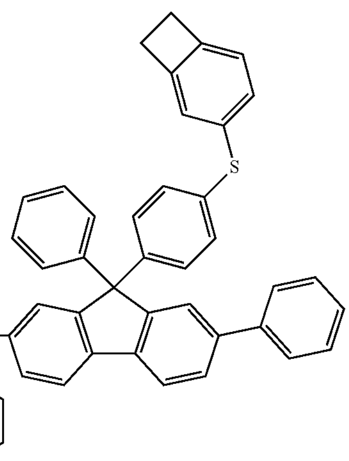
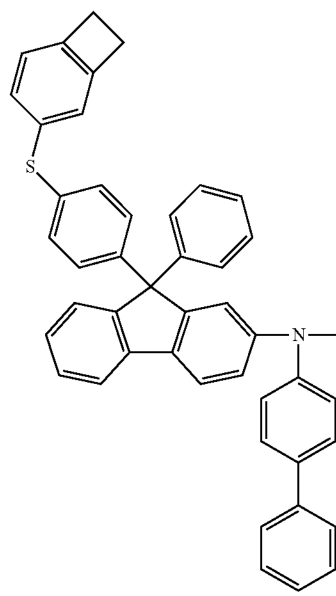
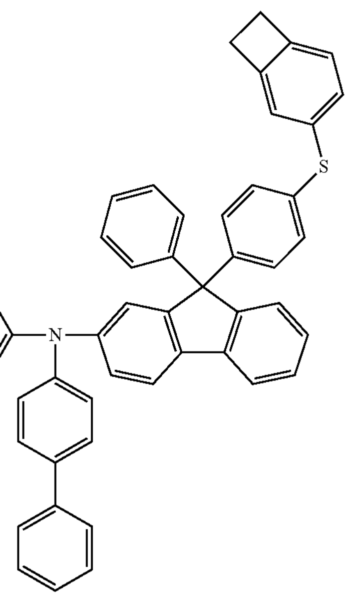

-continued
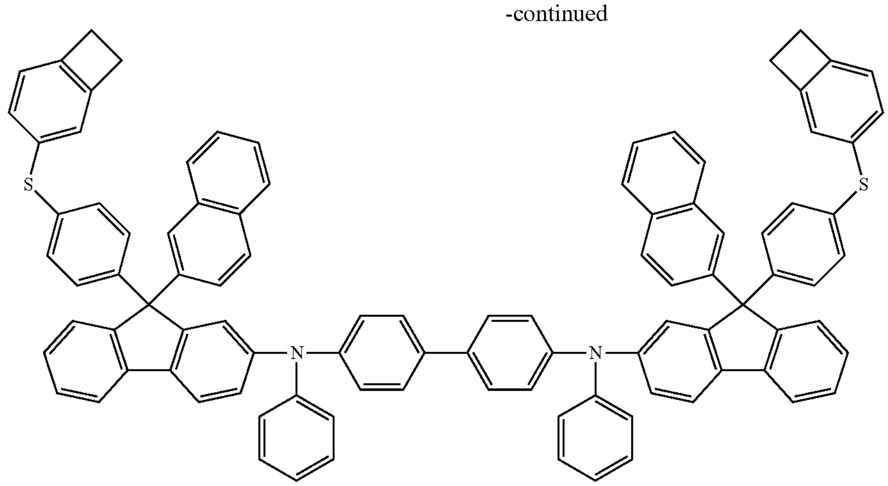
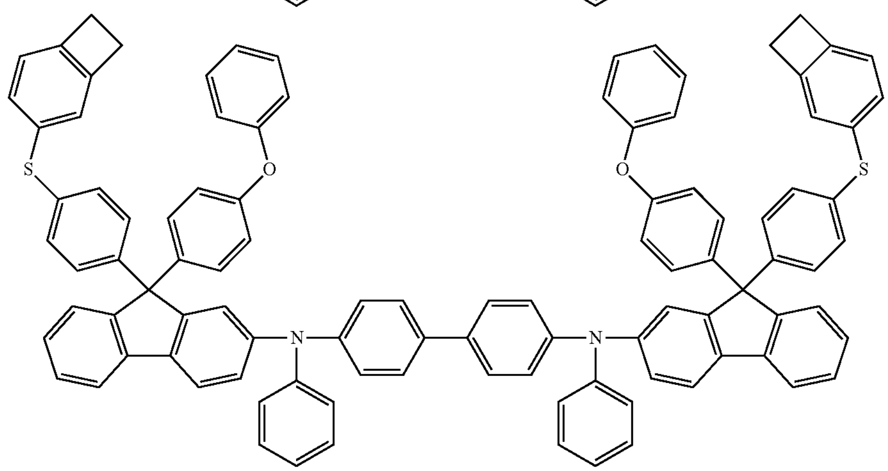
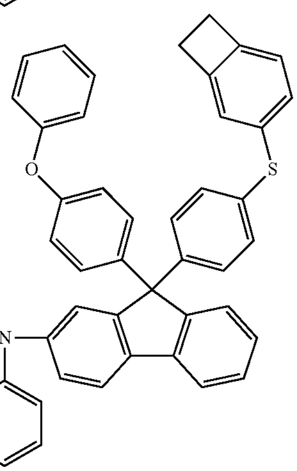
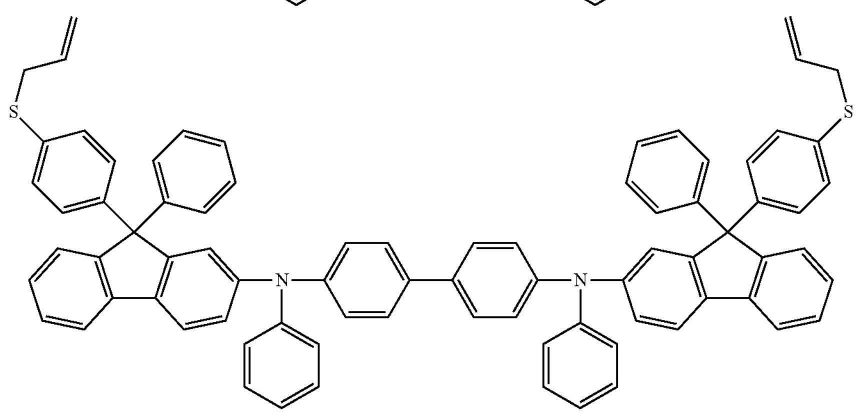
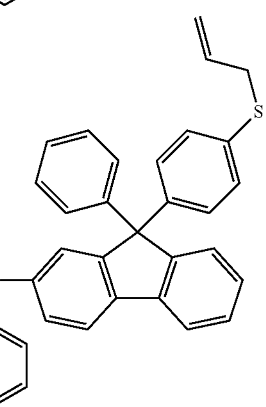
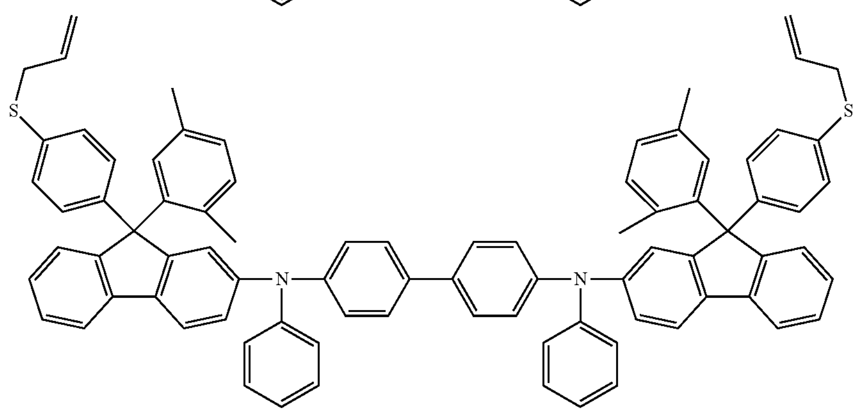
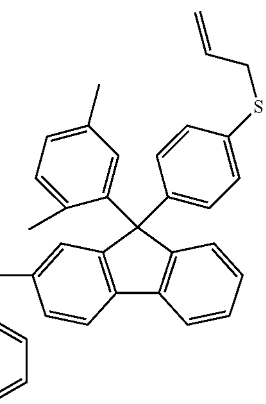

-continued
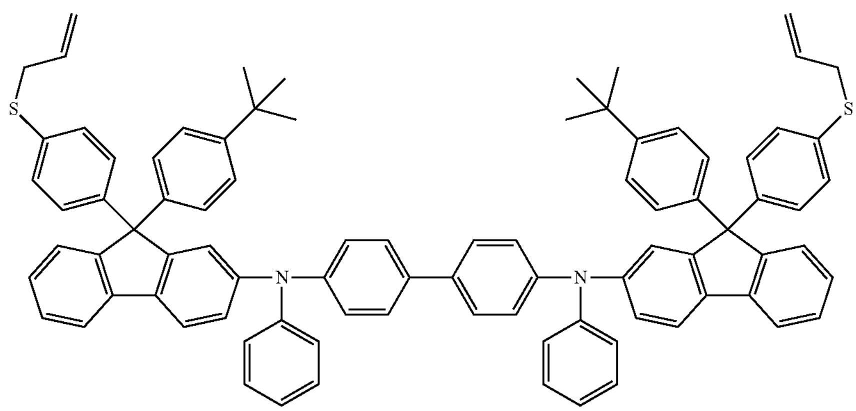
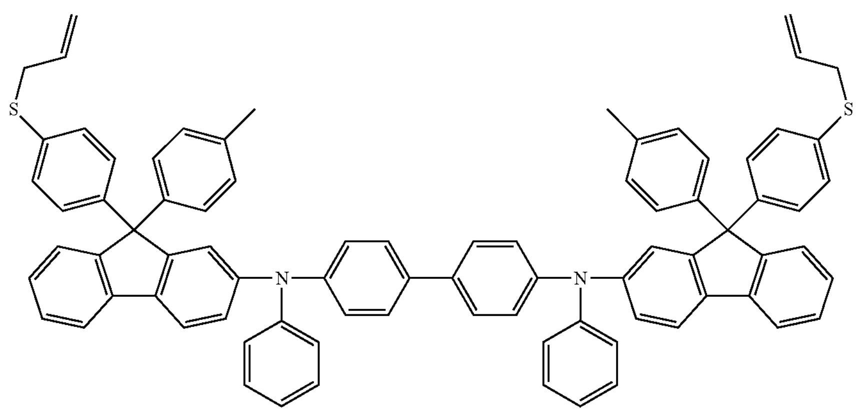
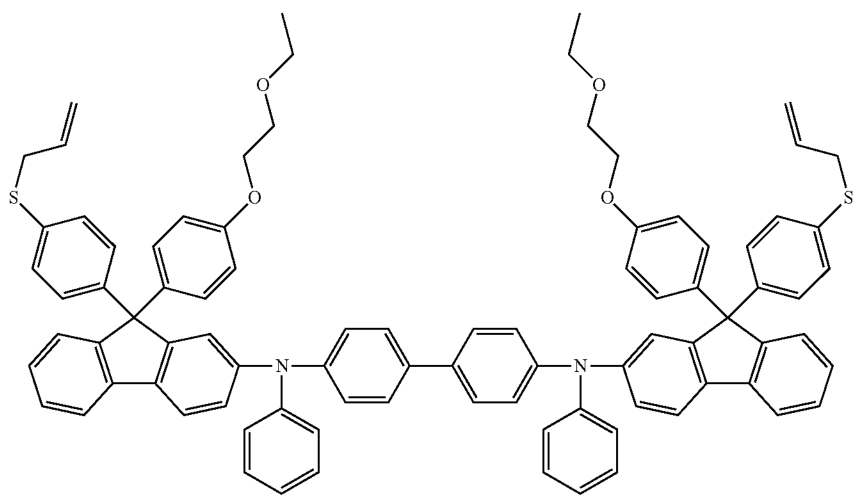
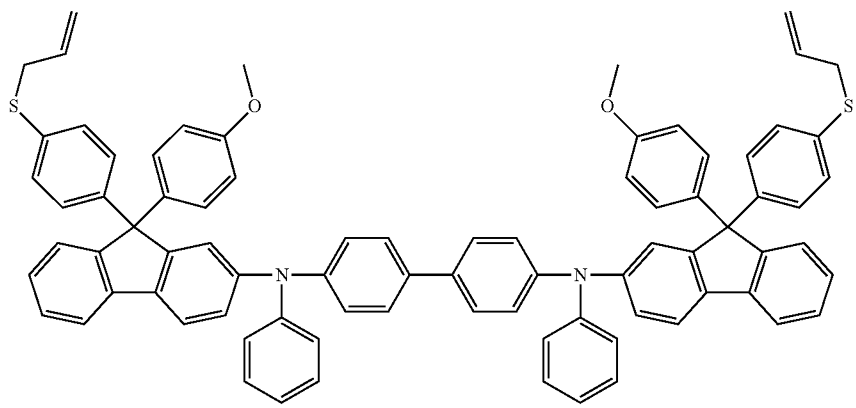

-continued
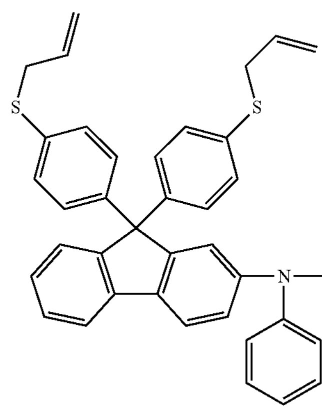
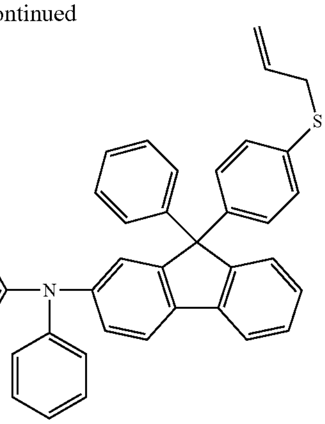
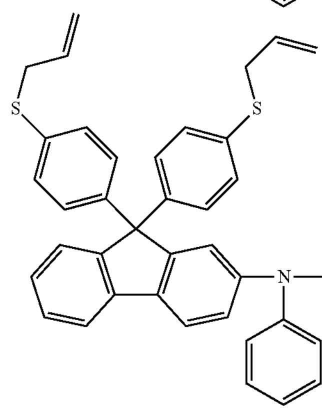
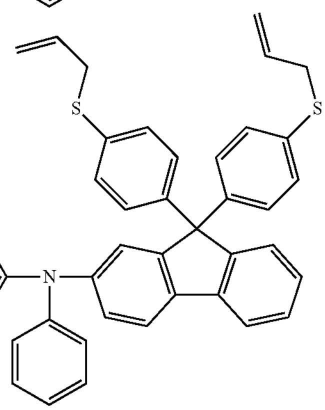
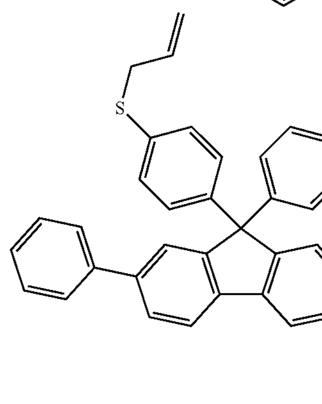
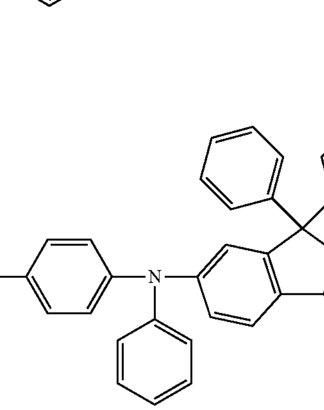
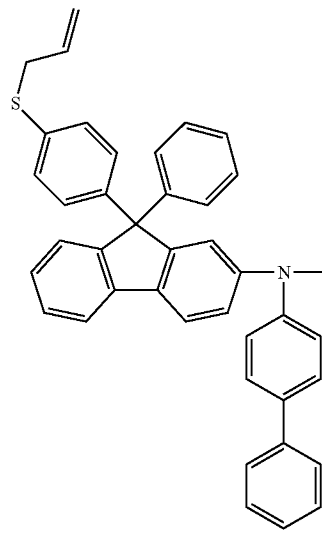
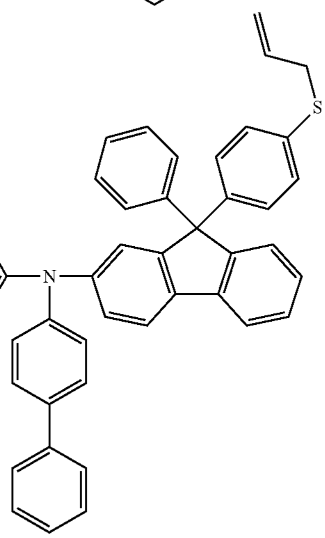

-continued
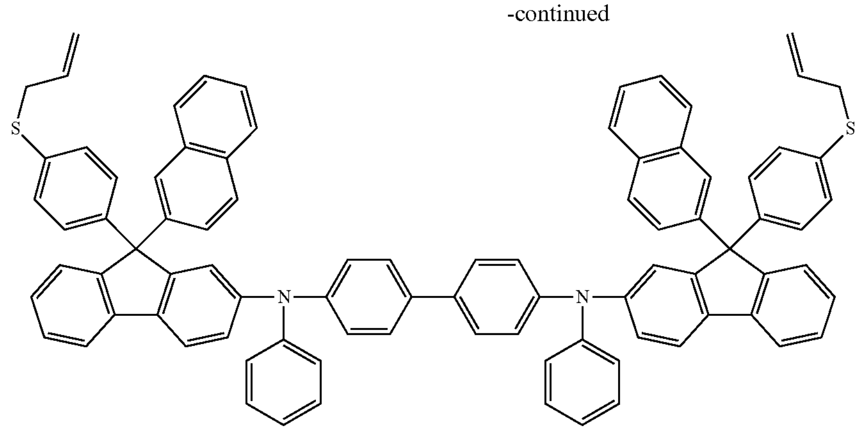
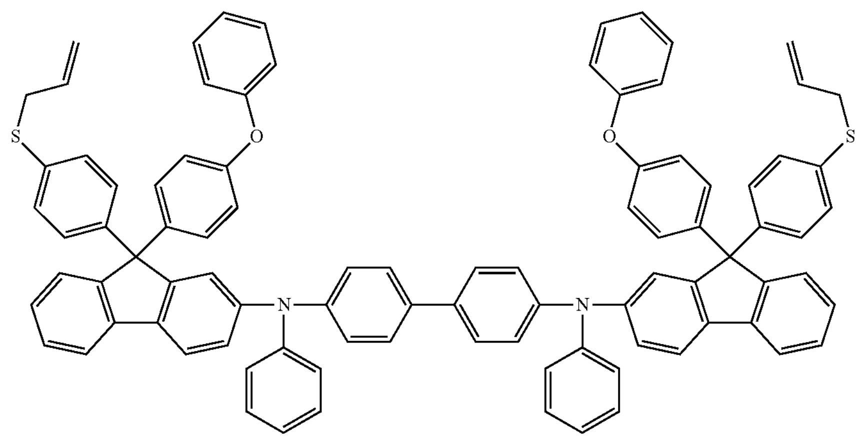
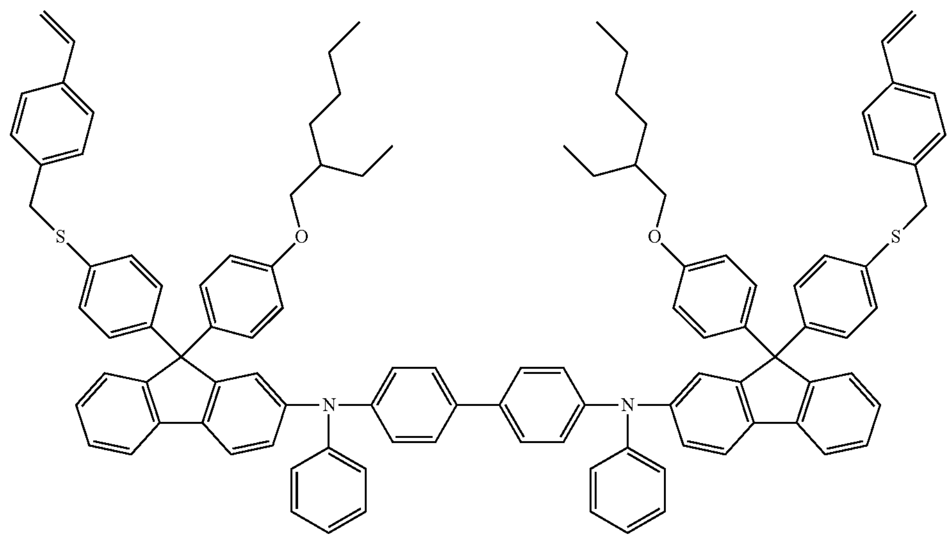

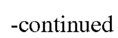
-continued
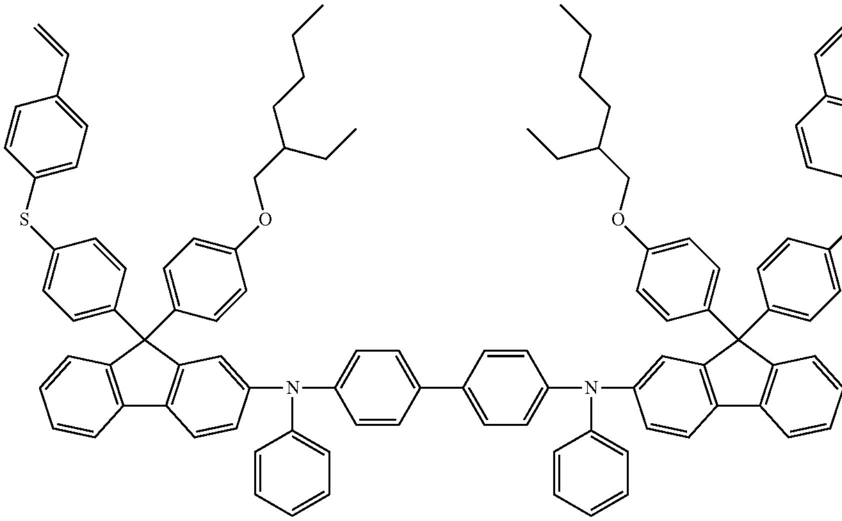
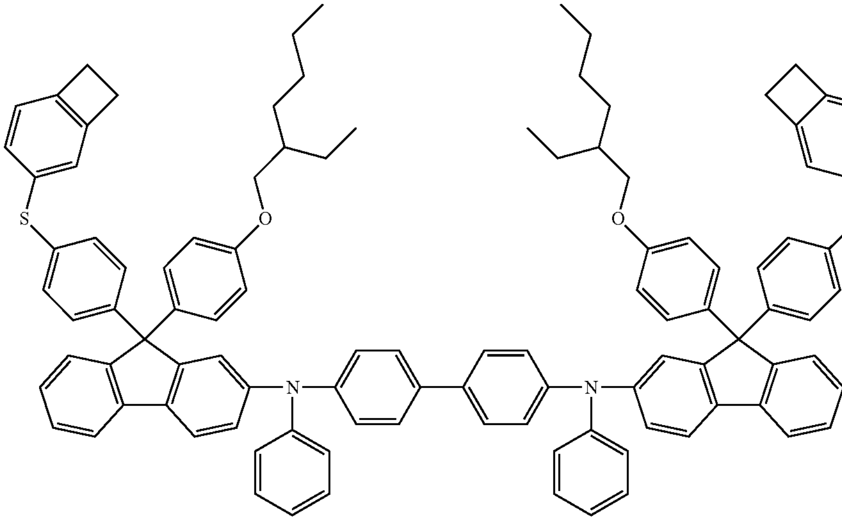
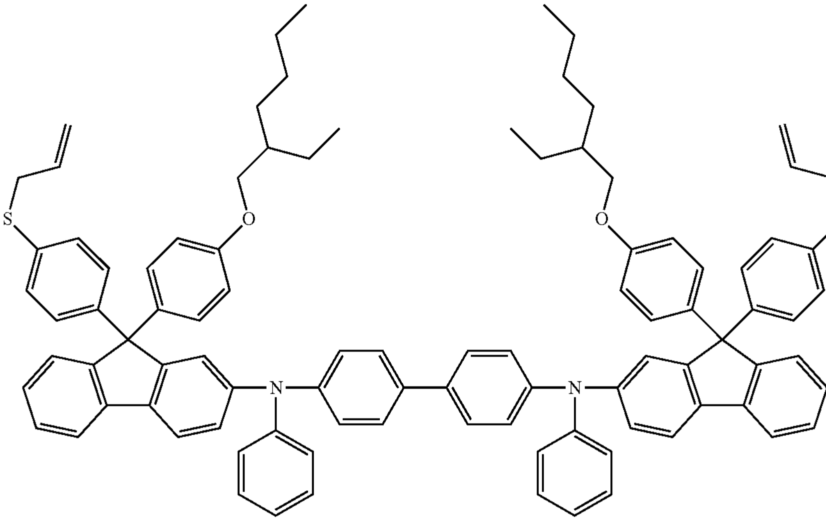

-continued
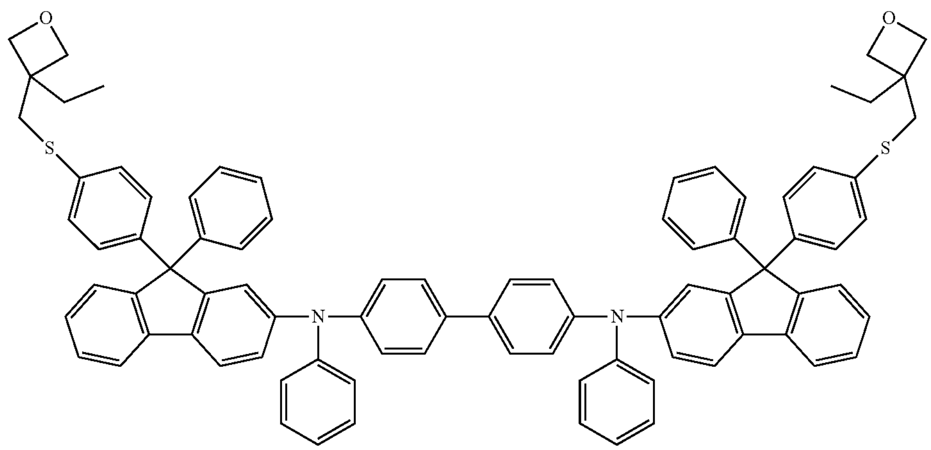
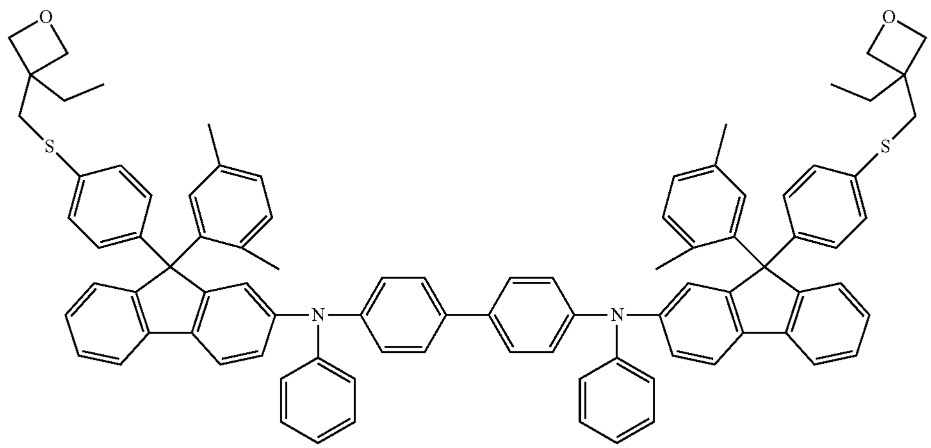
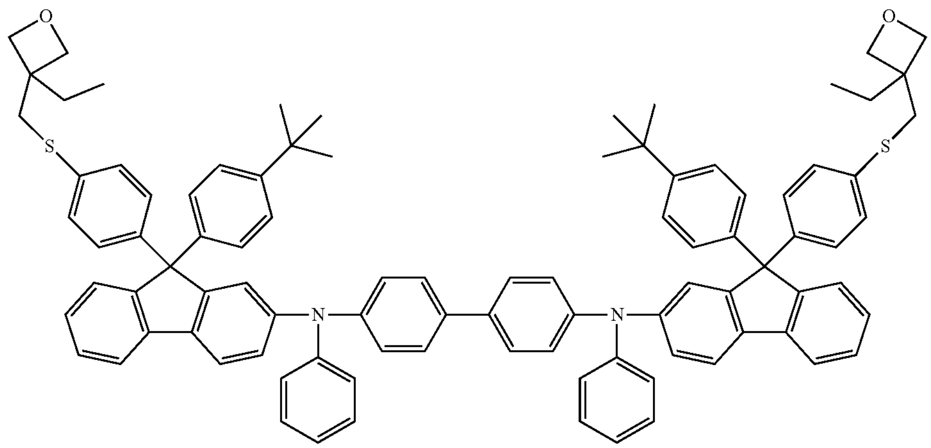

-continued
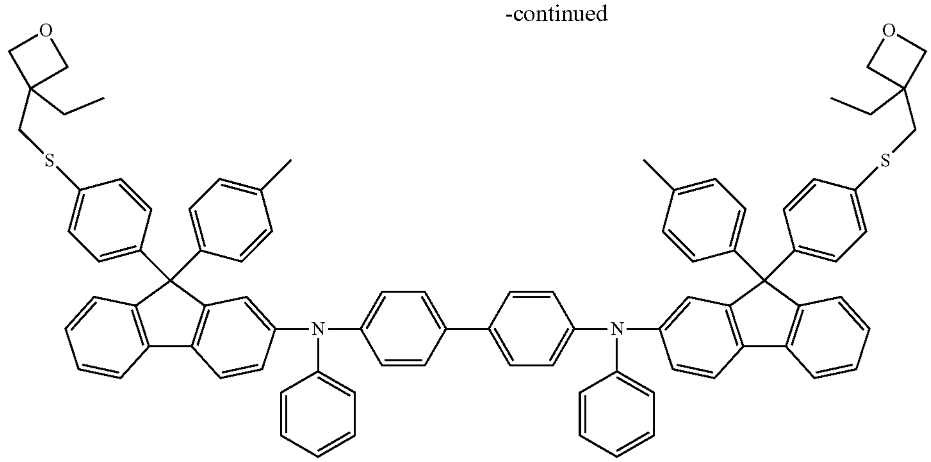
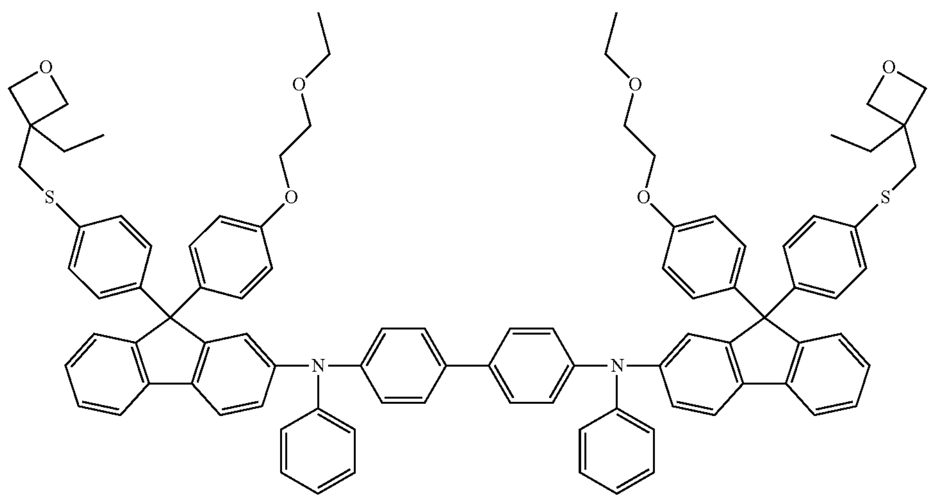
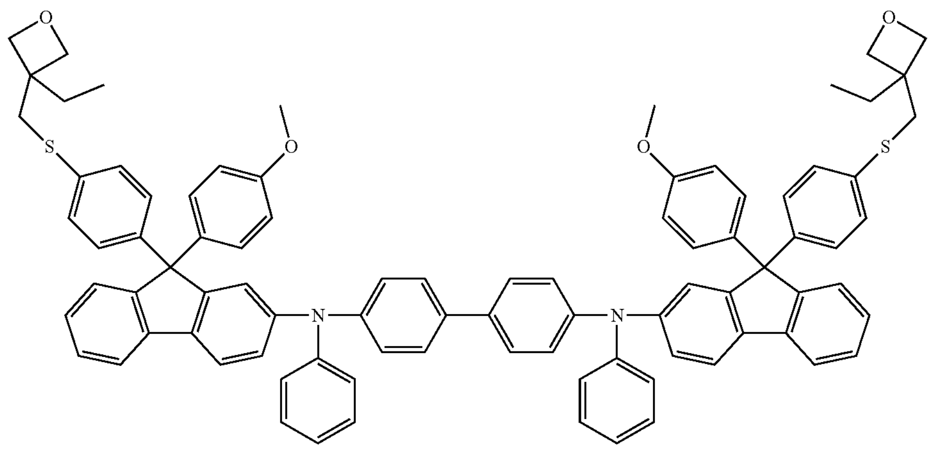

-continued
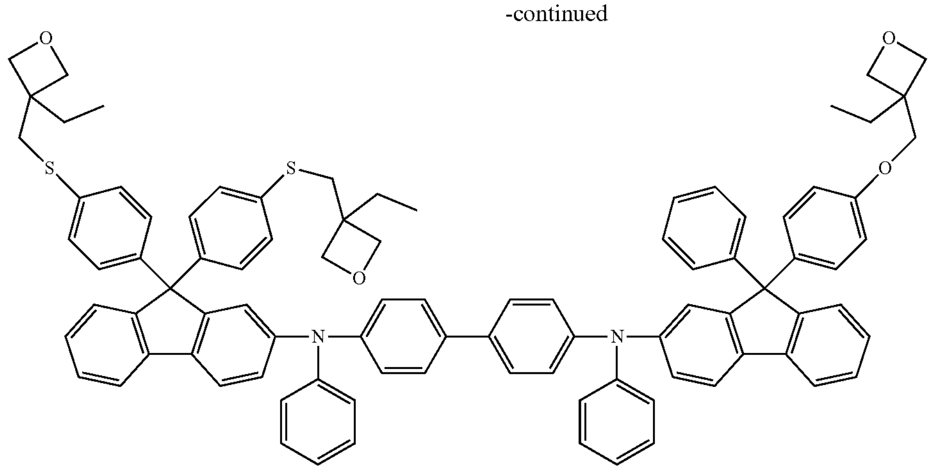
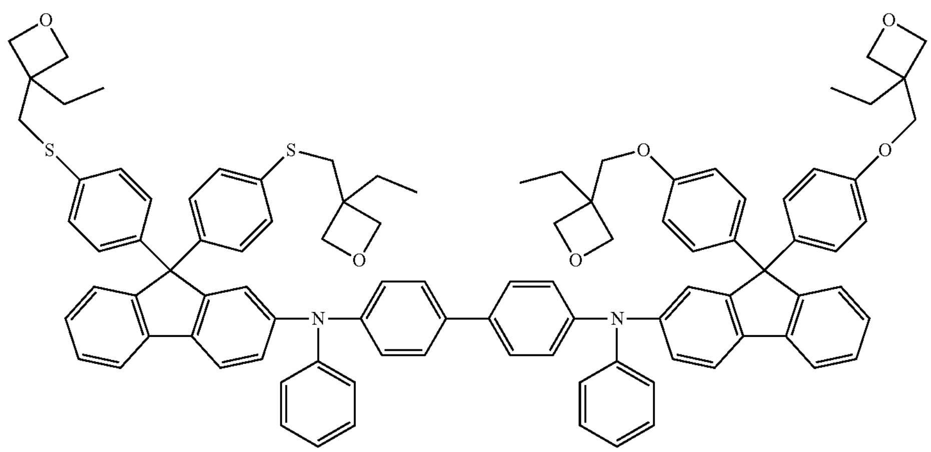
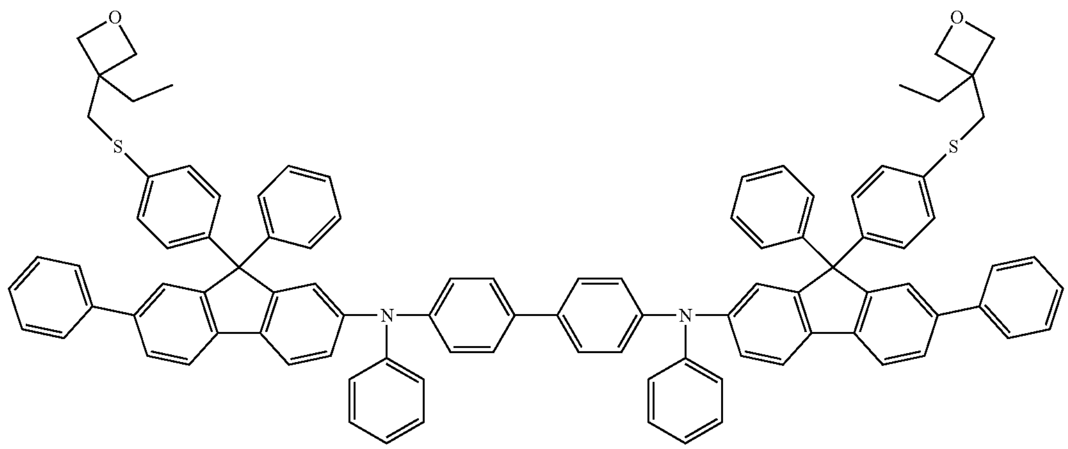

-continued
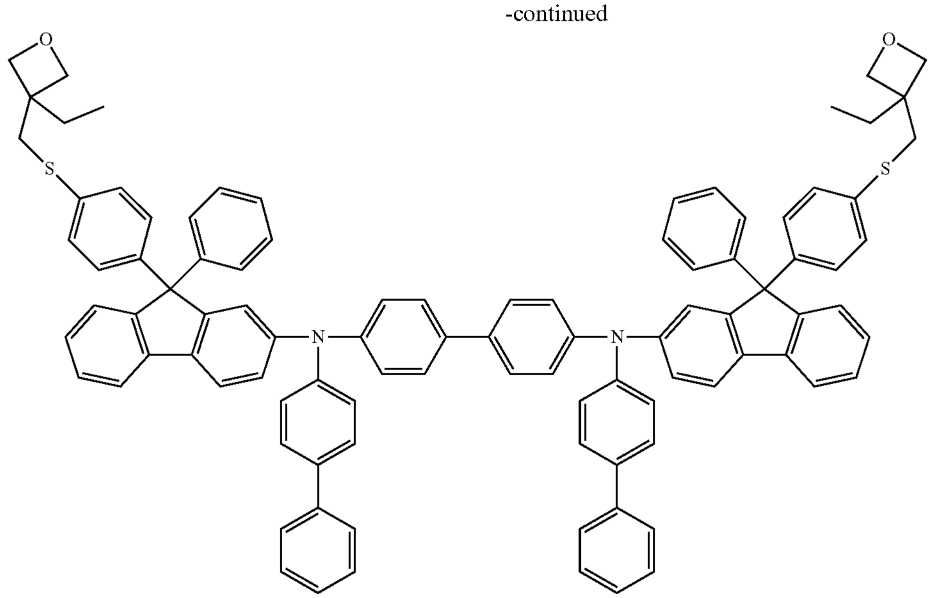
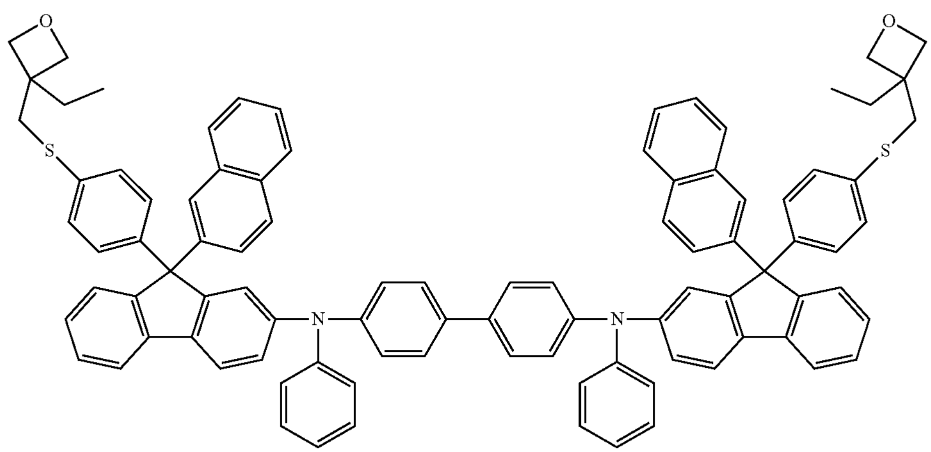
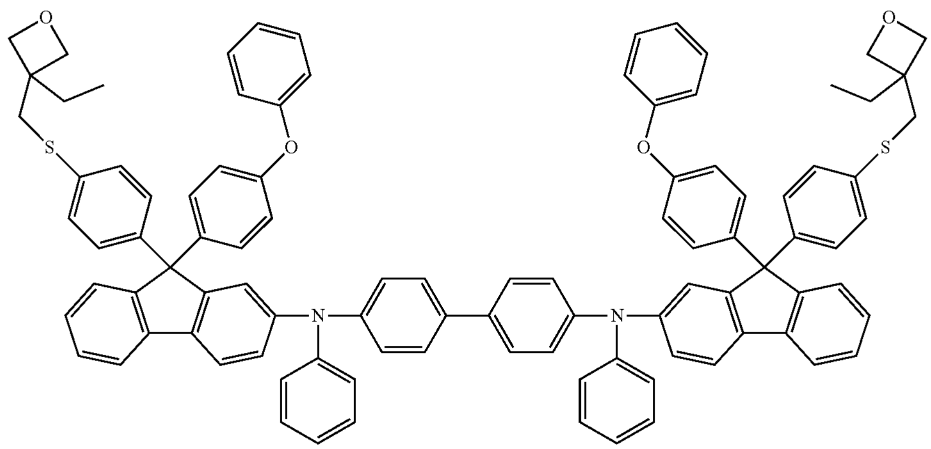

-continued
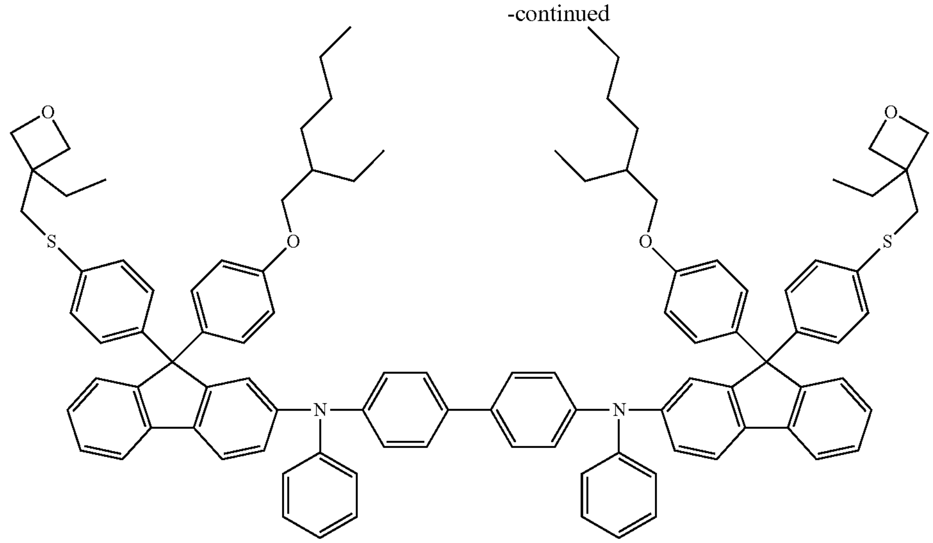
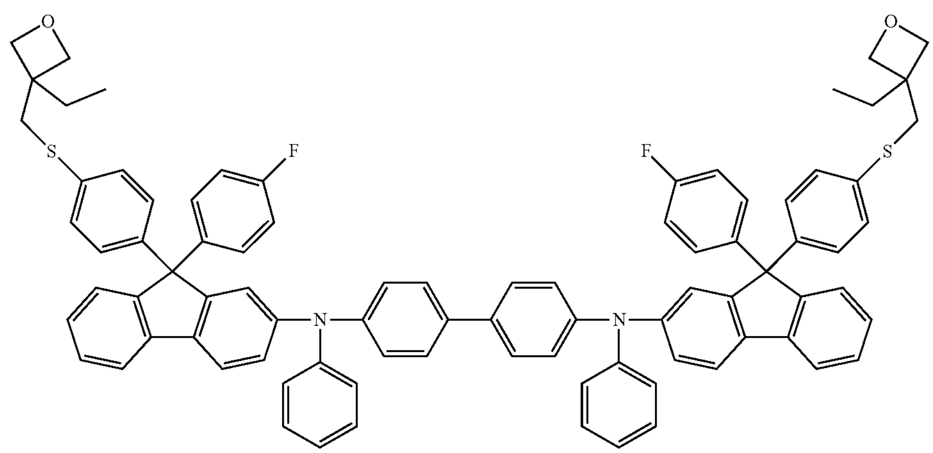
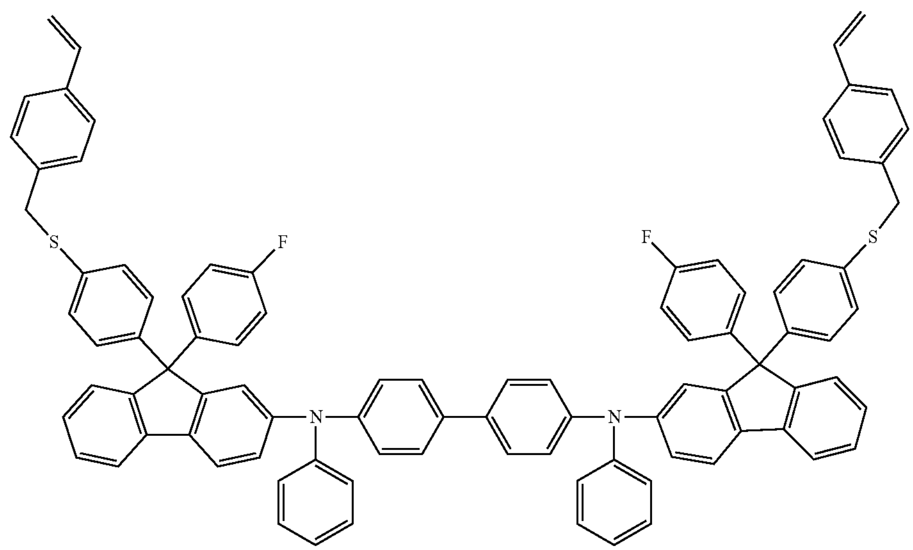

-continued
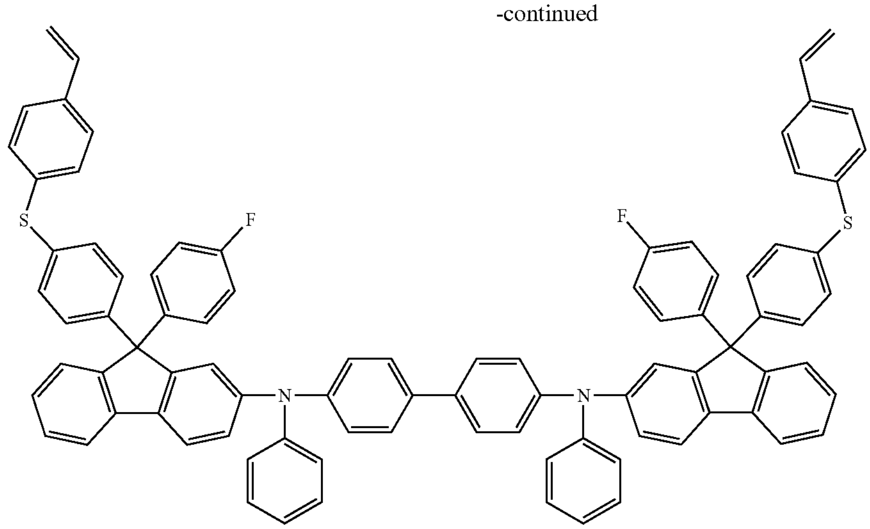
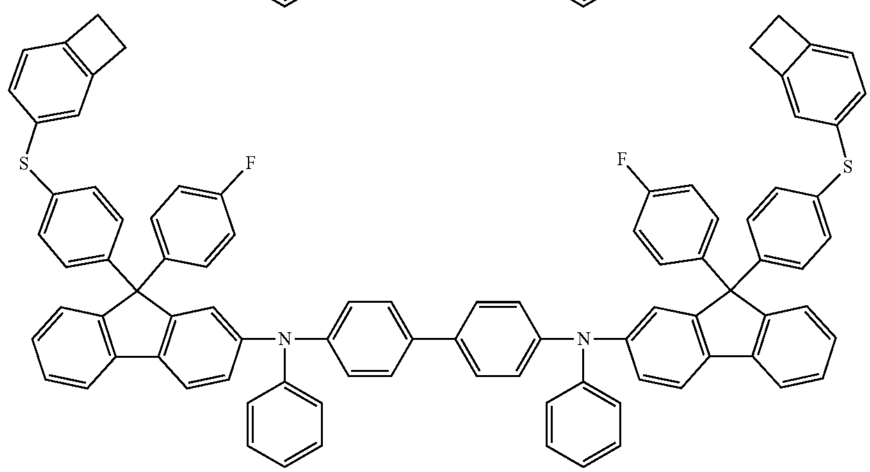
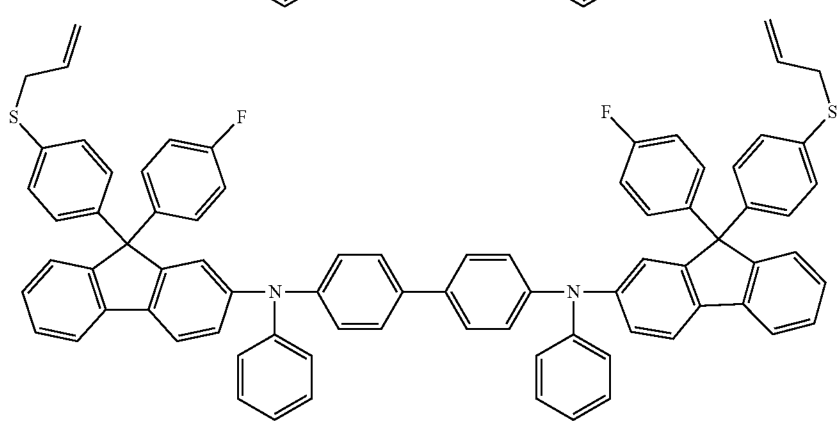
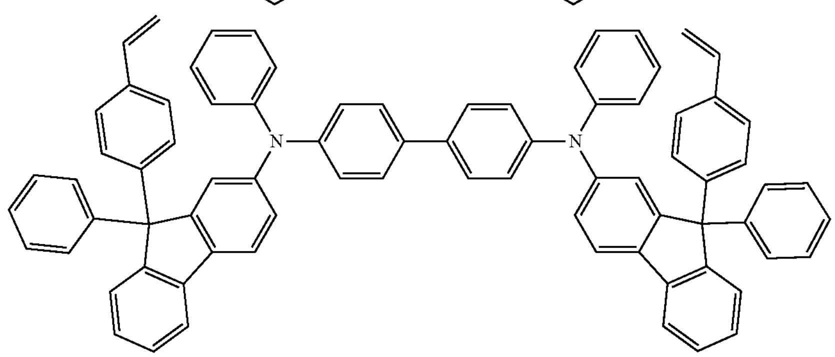

-continued
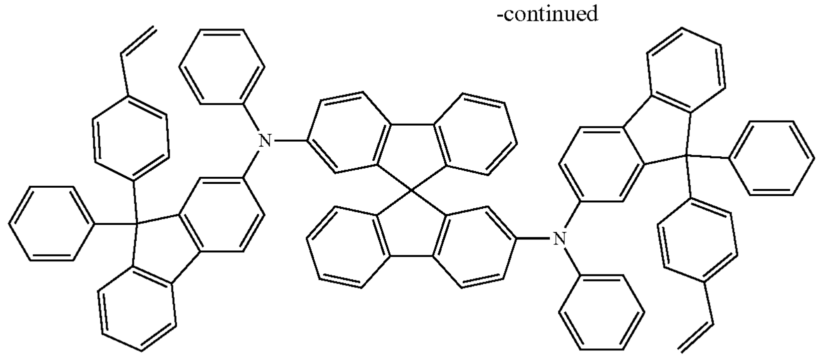
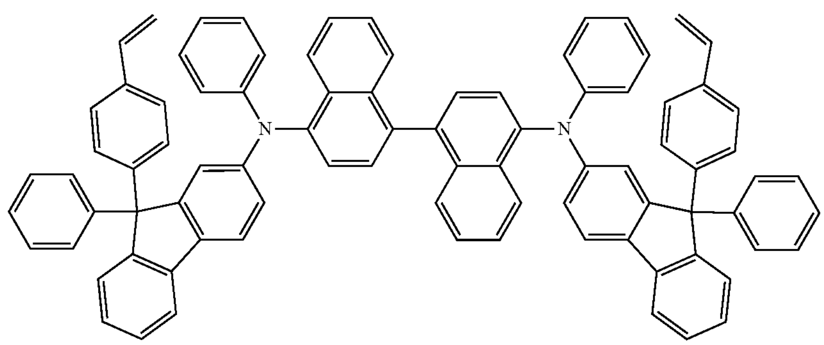
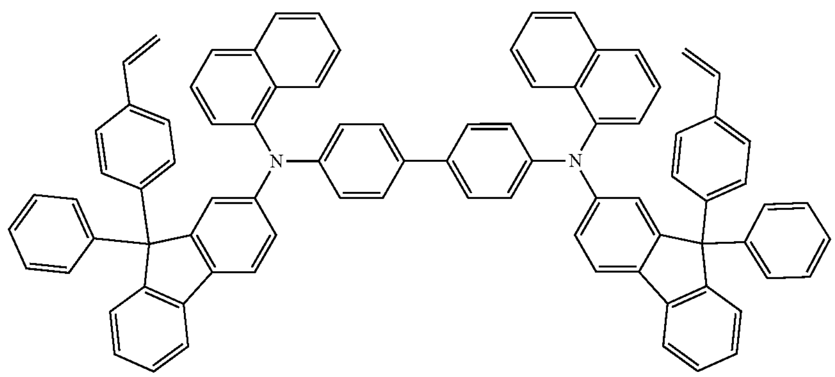
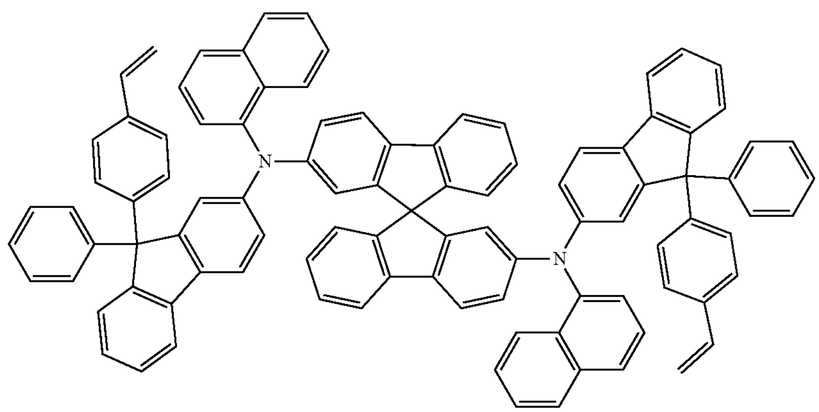

-continued
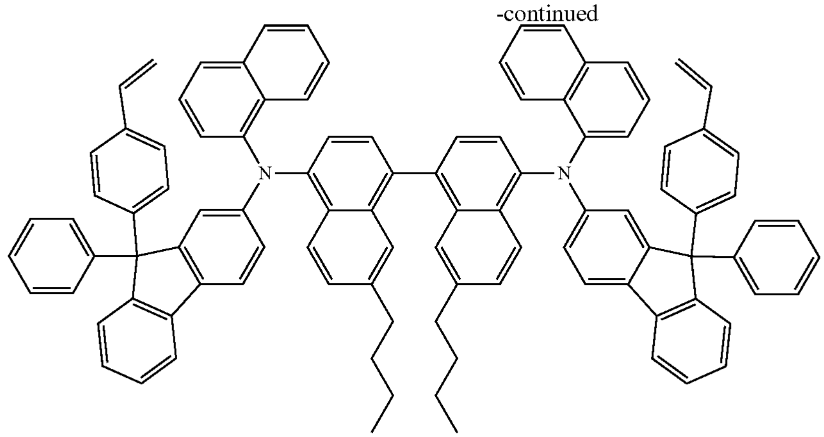
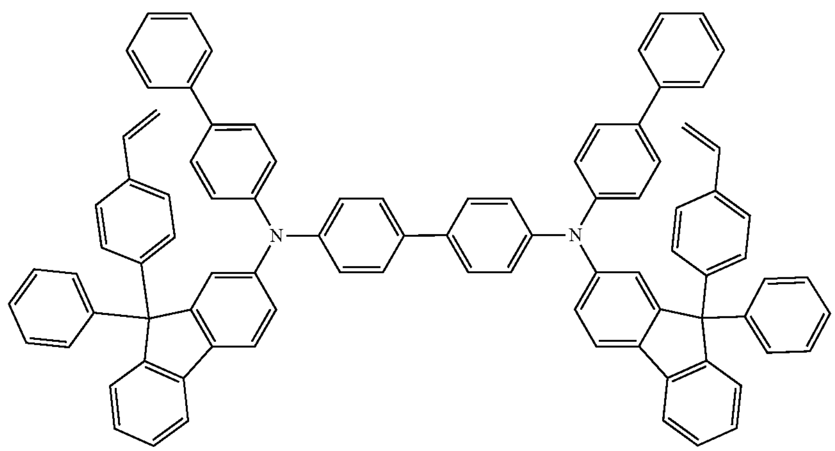
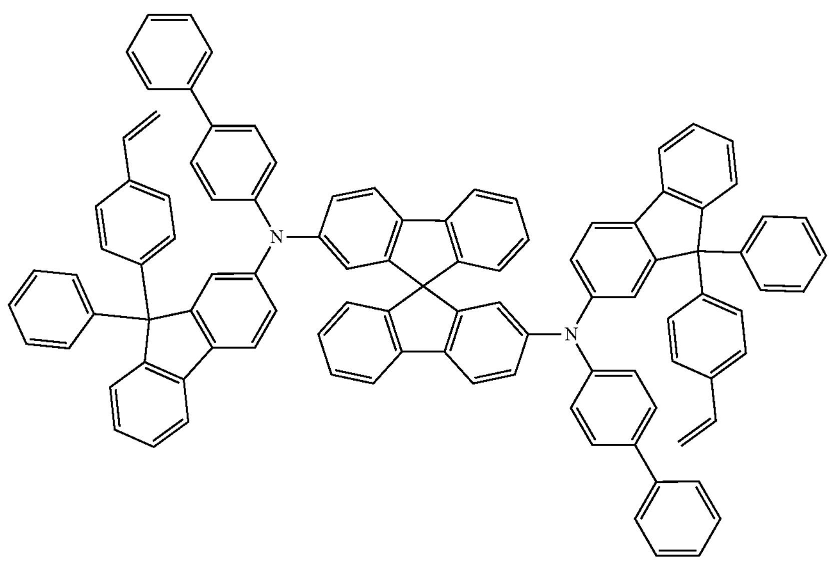

-continued
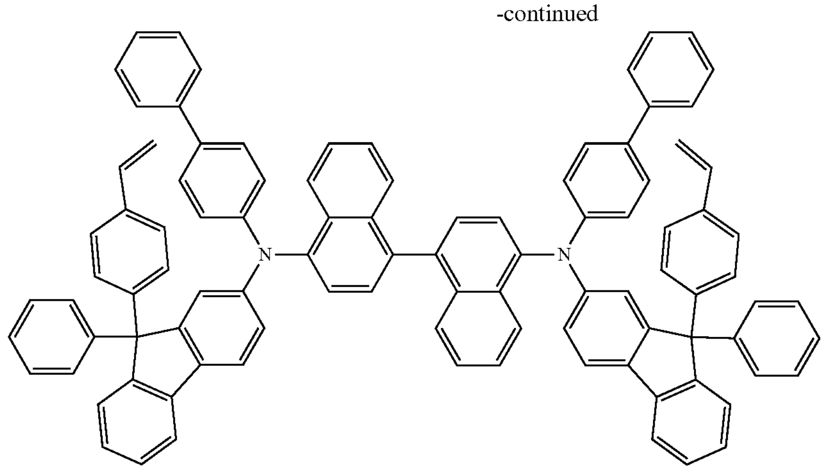
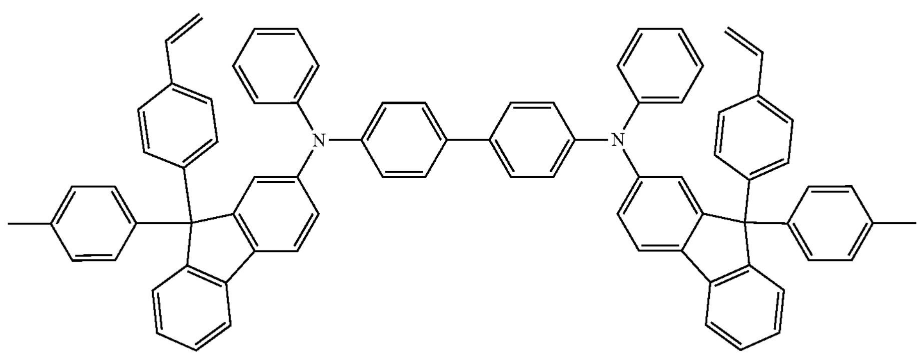
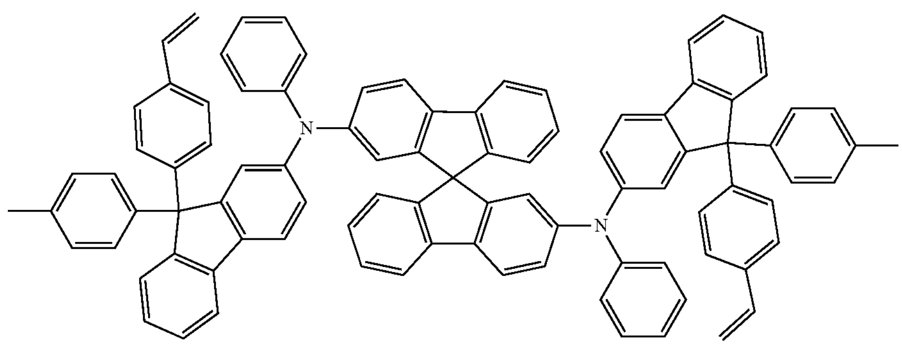
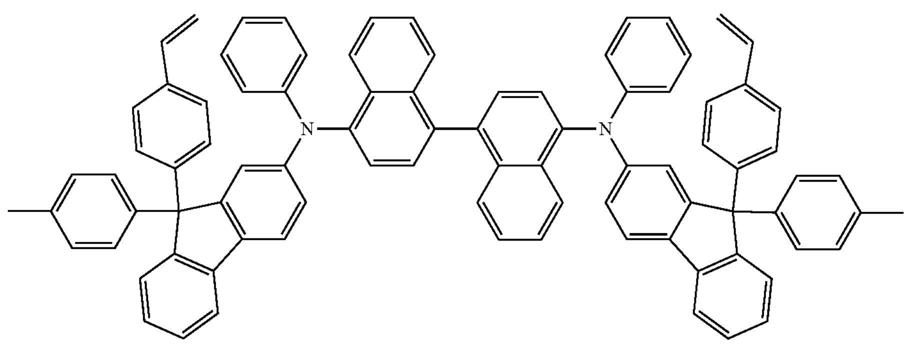

-continued
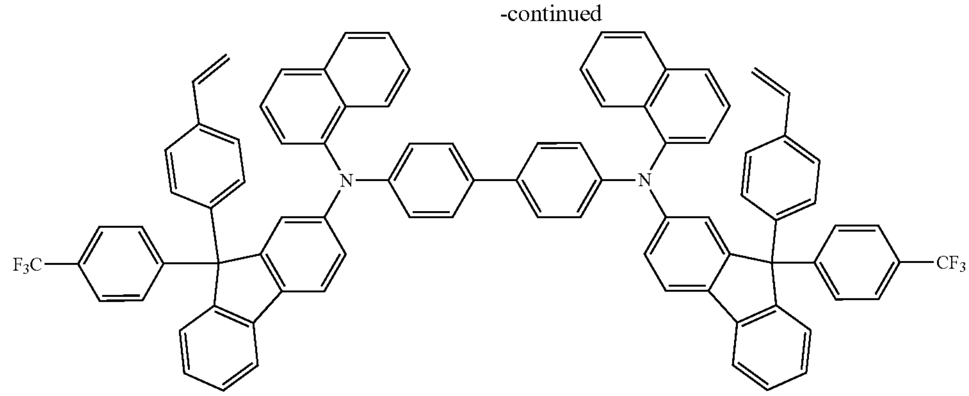
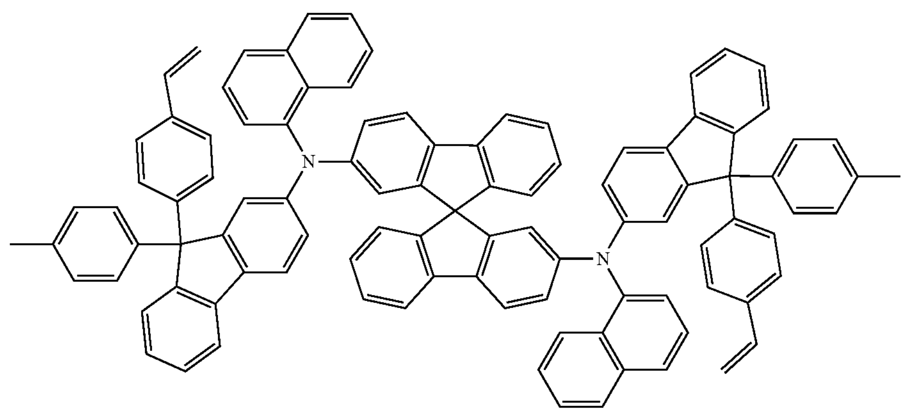
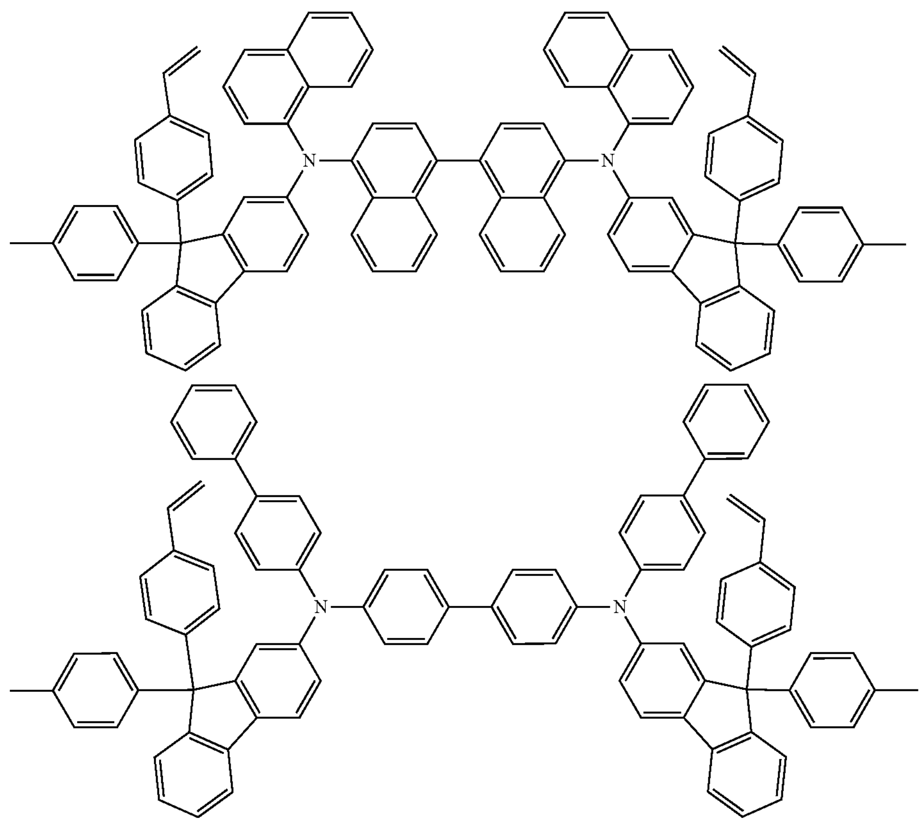

-continued
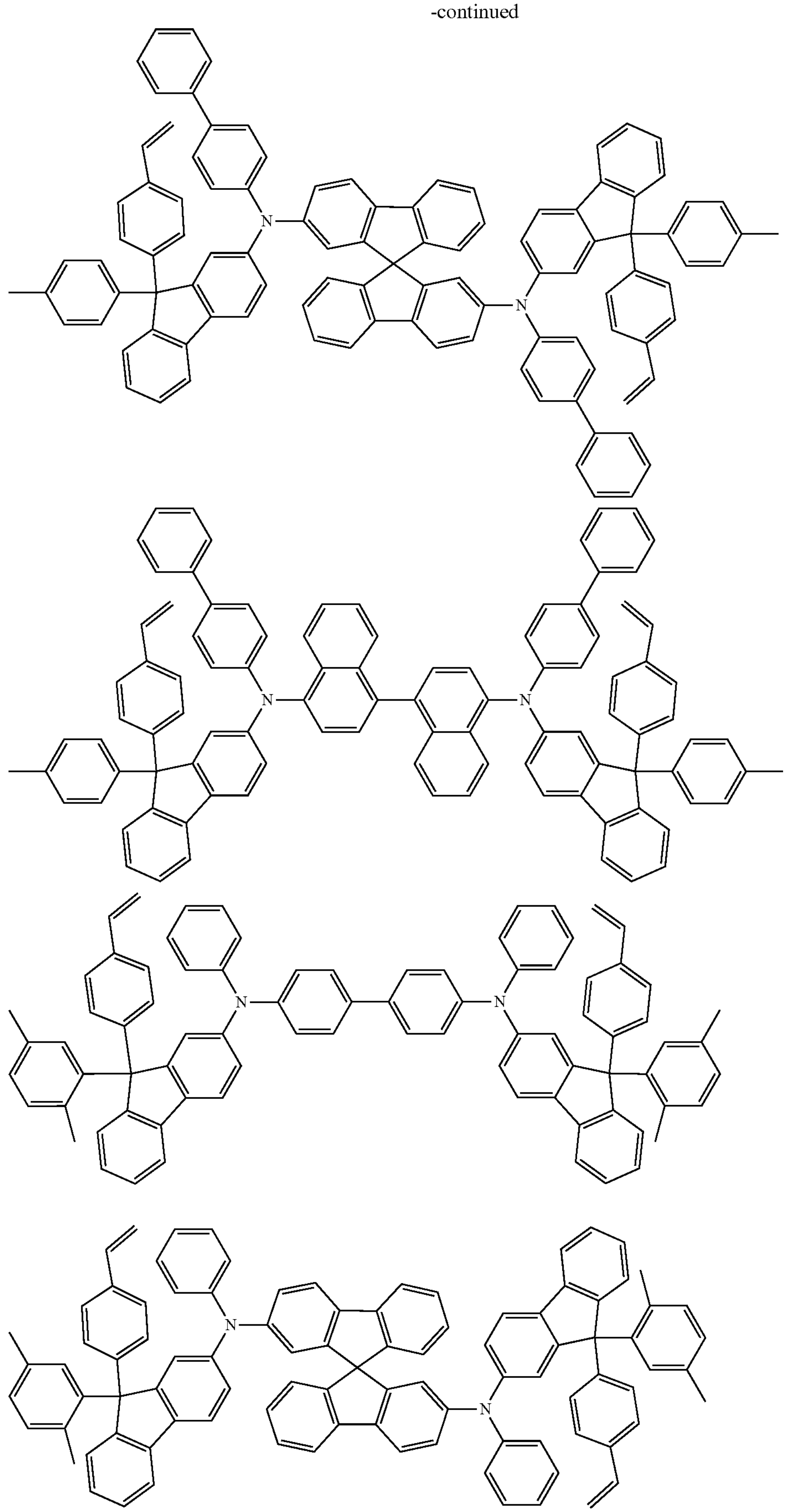

-continued
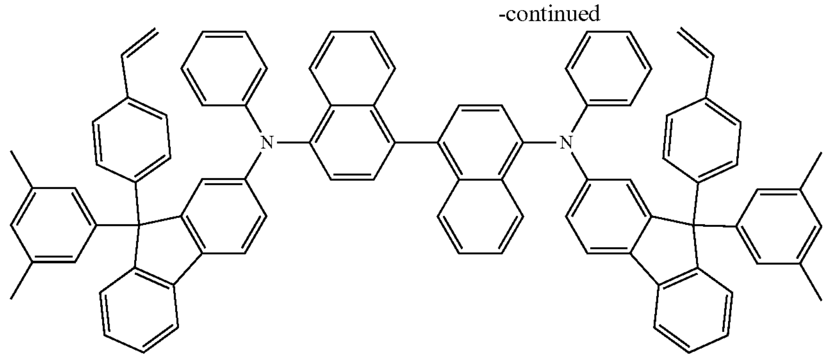
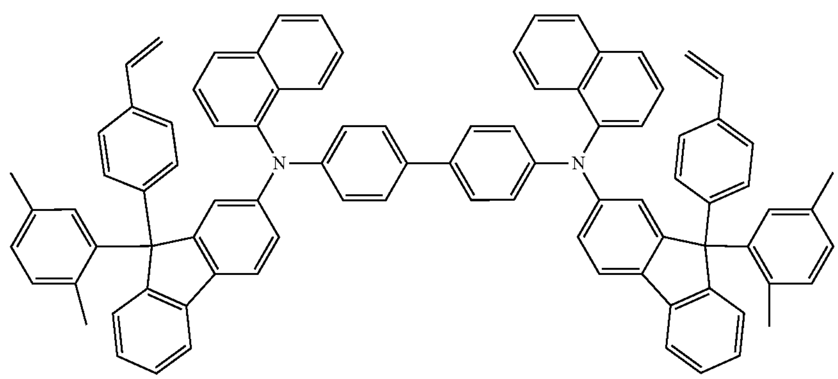
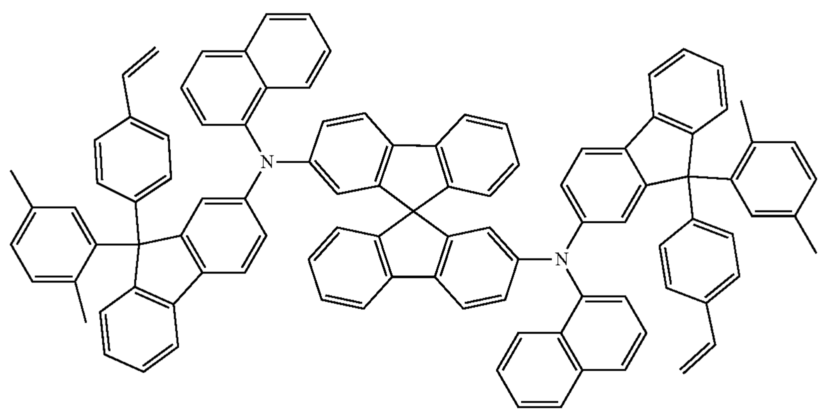
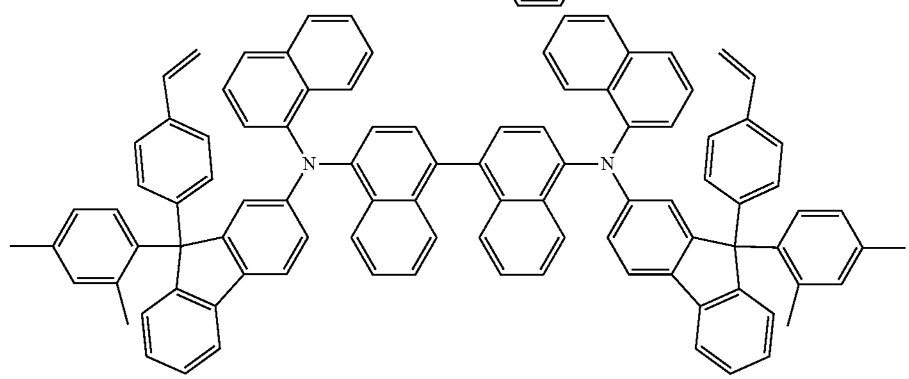

-continued
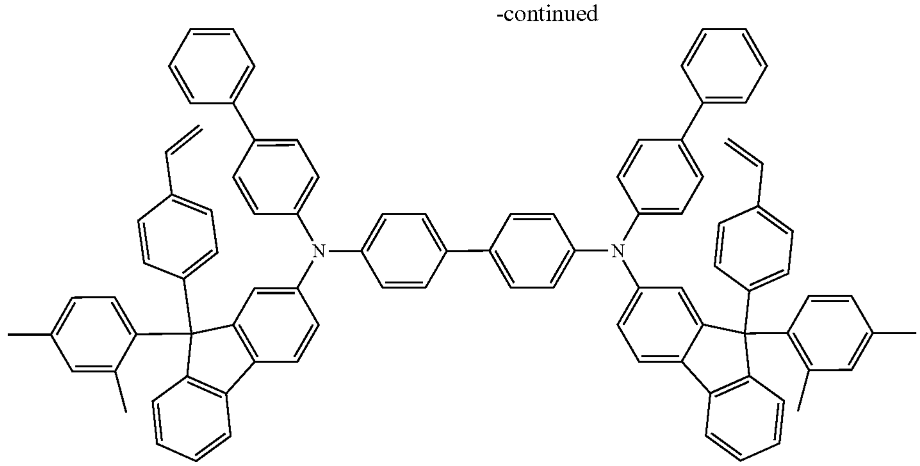
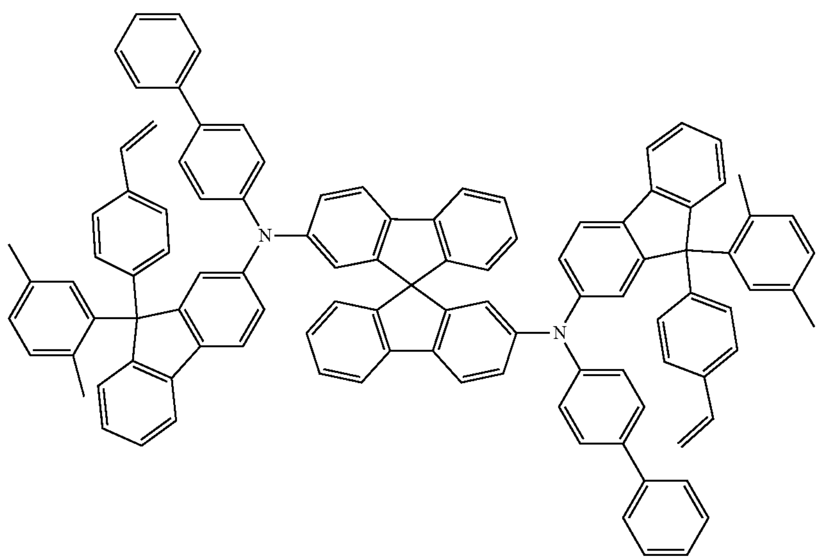
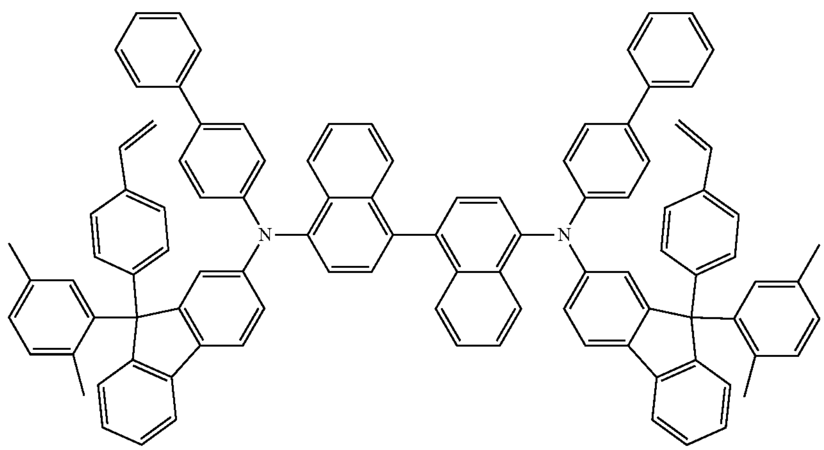

-continued
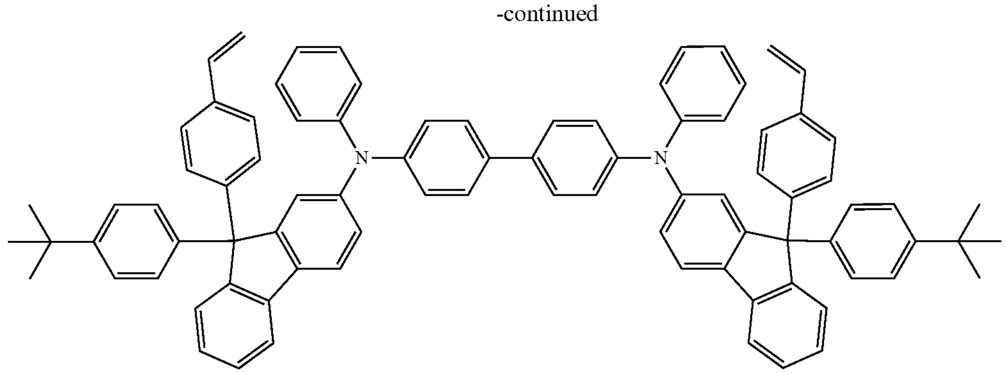
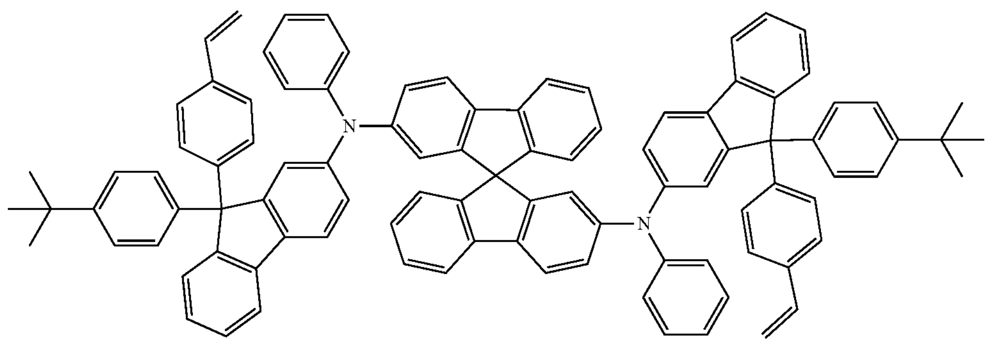
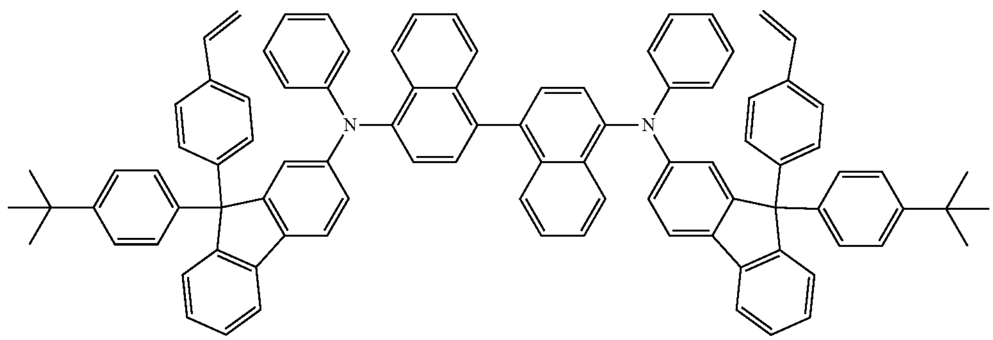
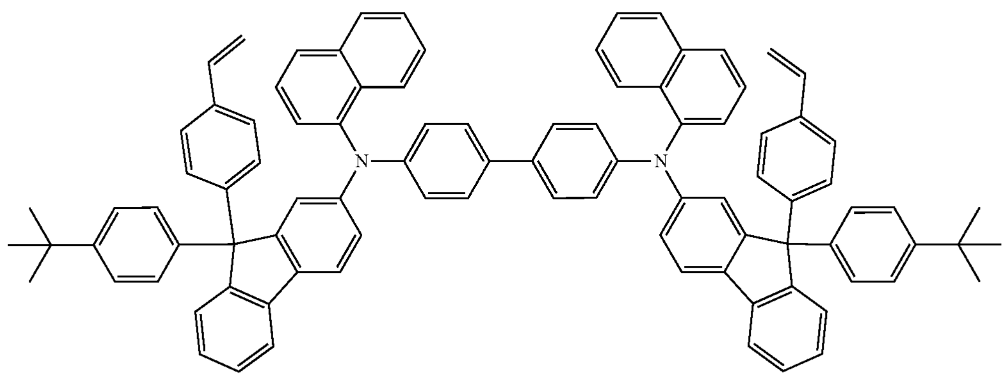

-continued
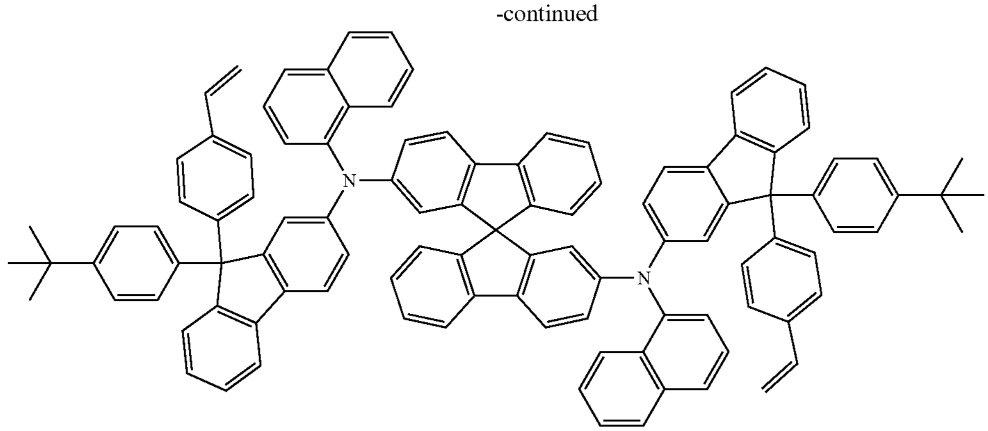
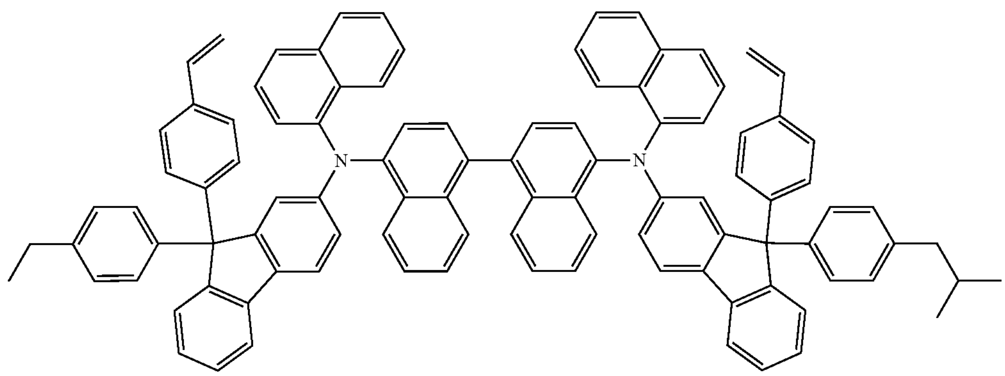
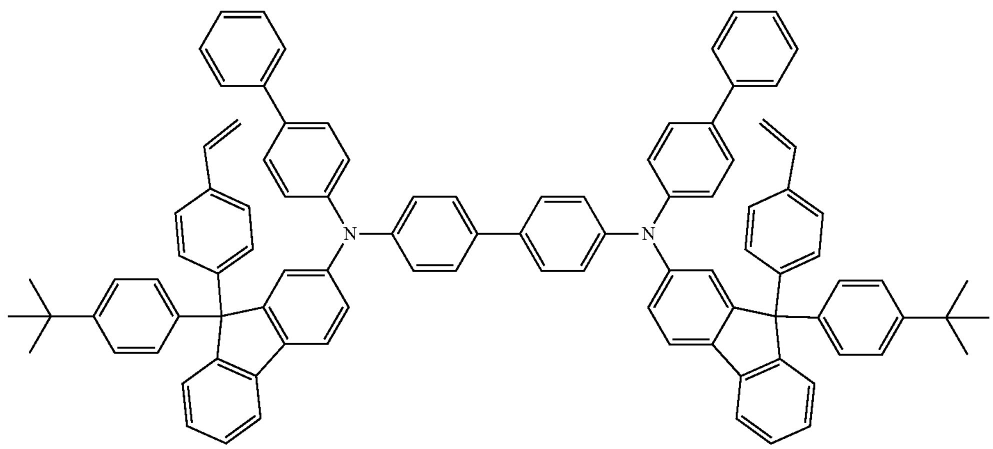

-continued
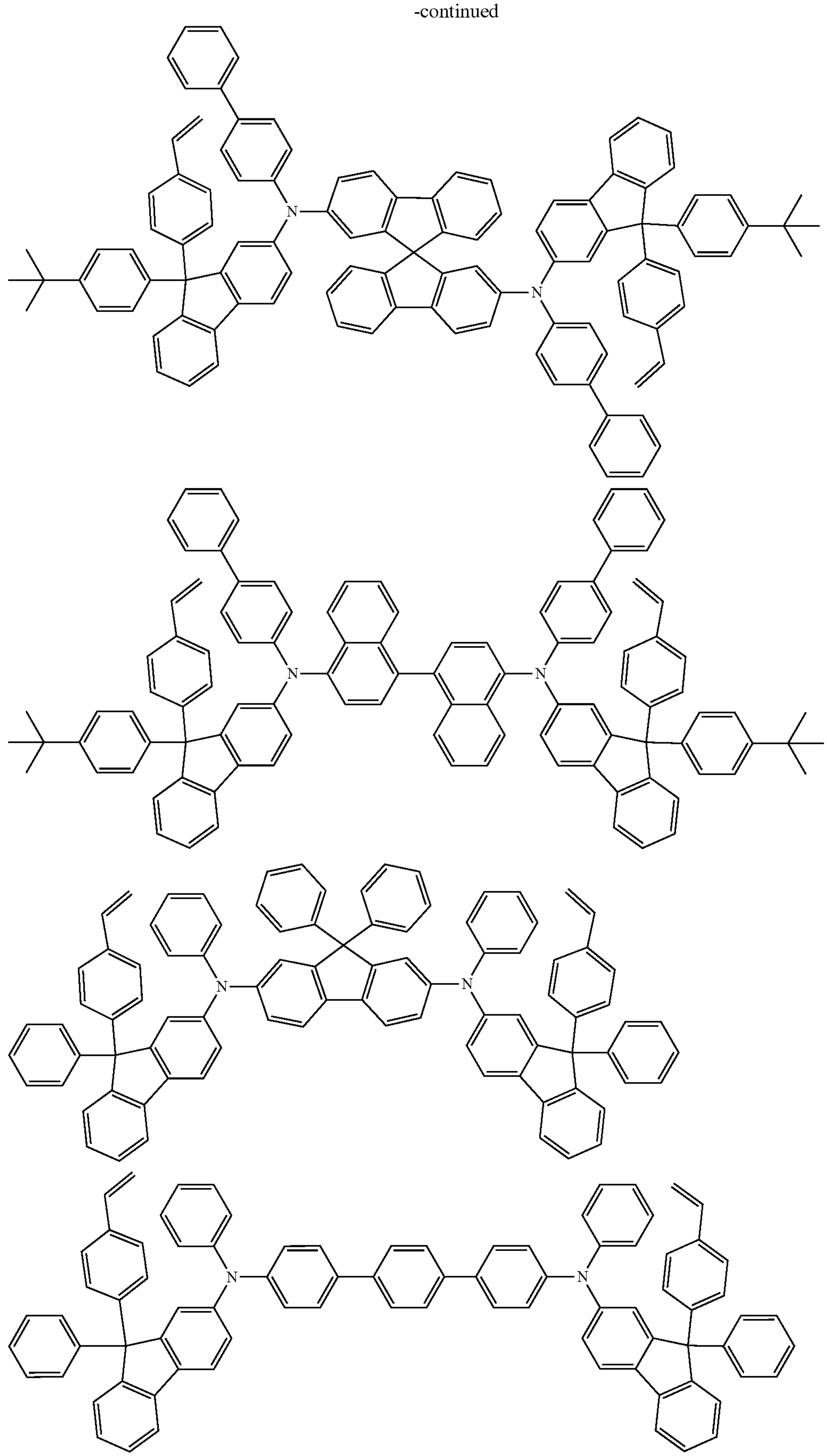

-continued
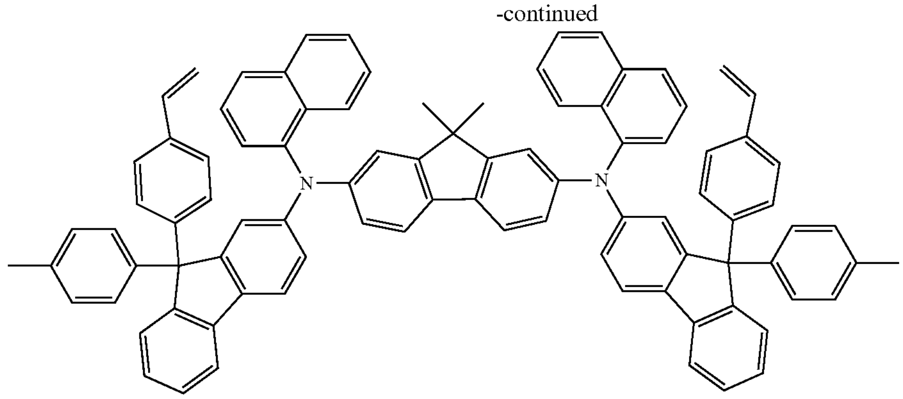
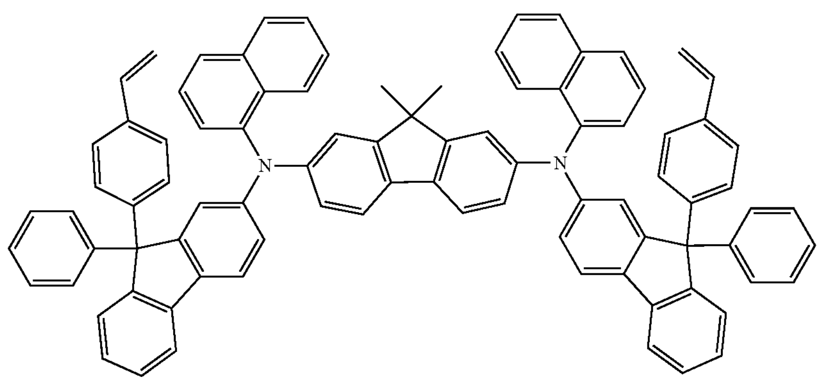
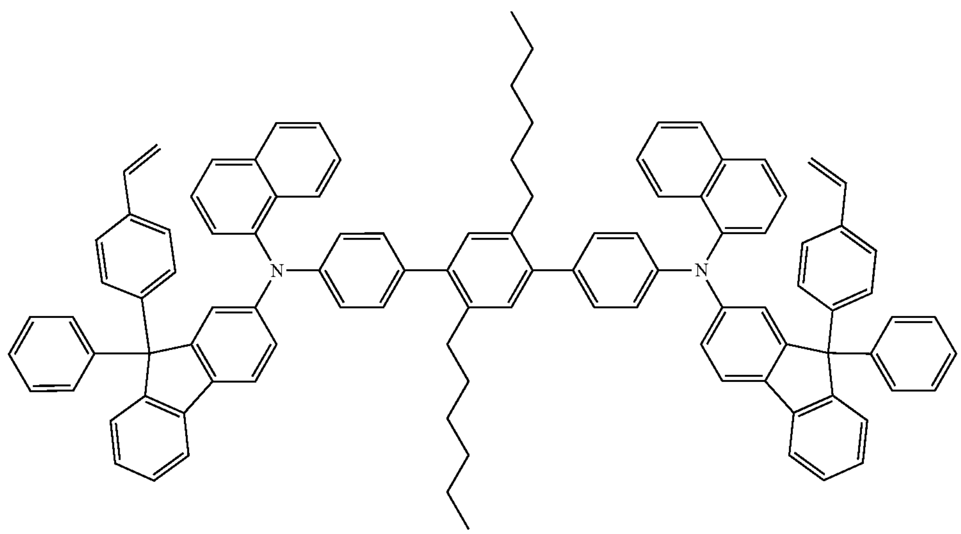

-continued
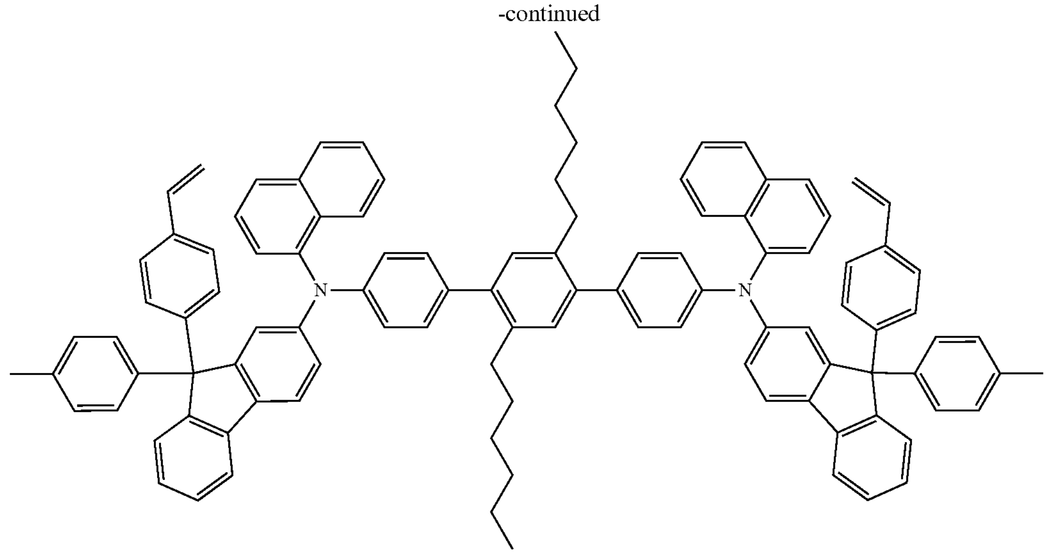
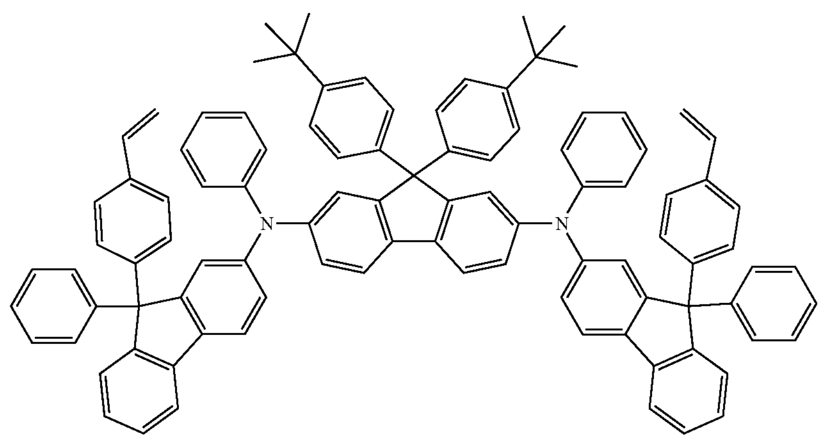
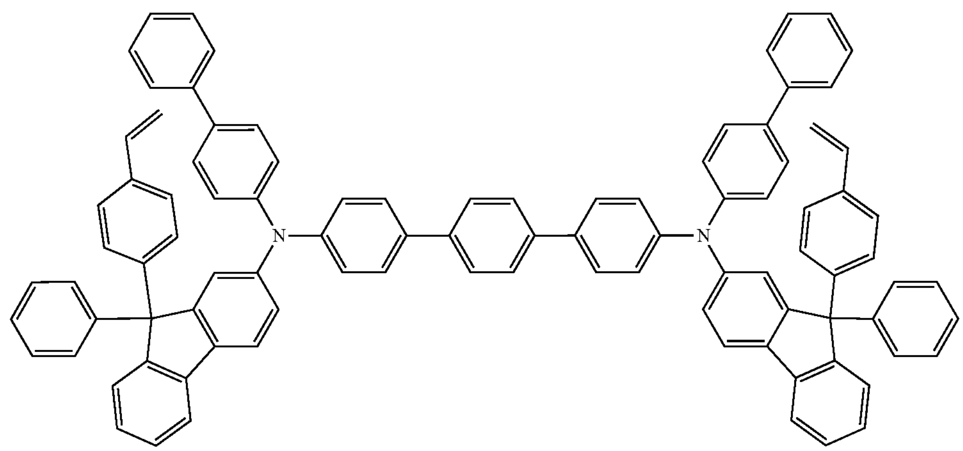

-continued
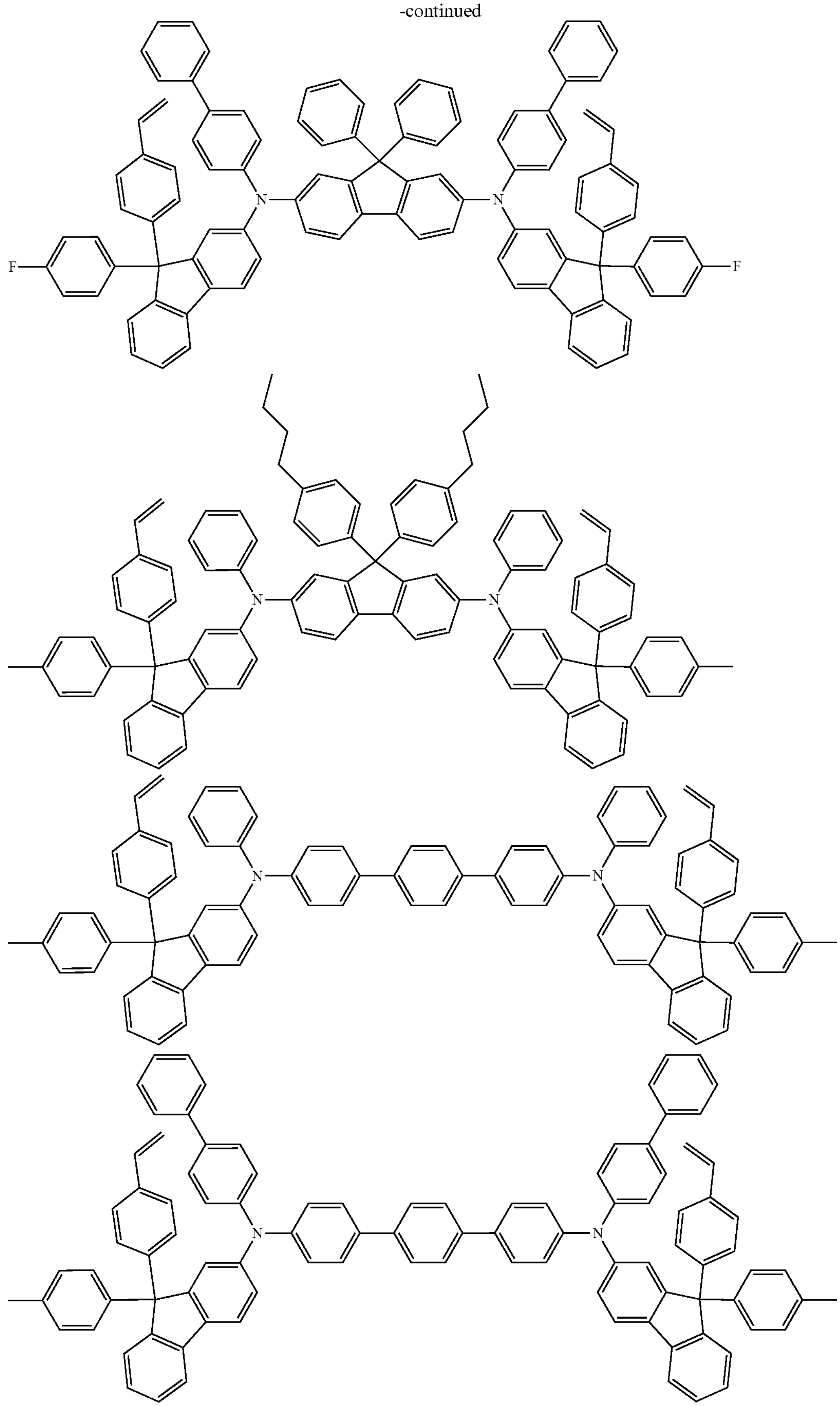

-continued
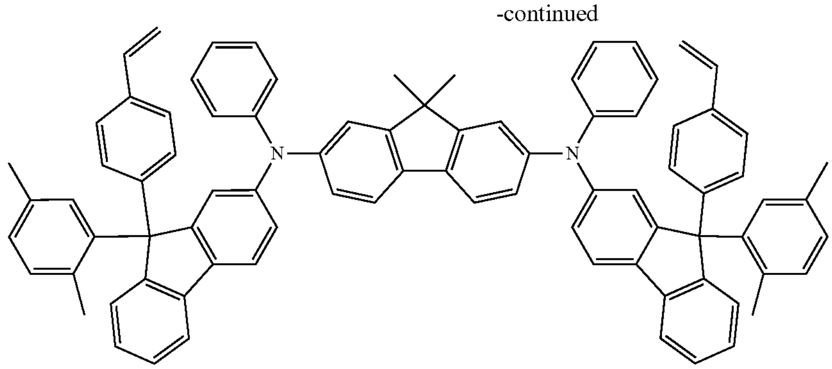
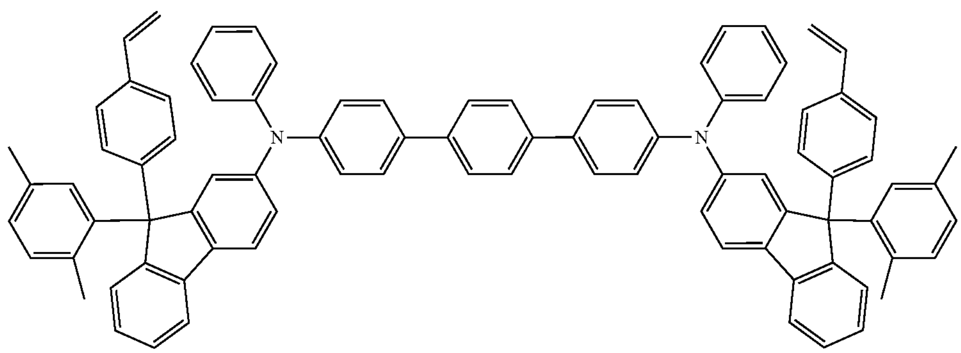
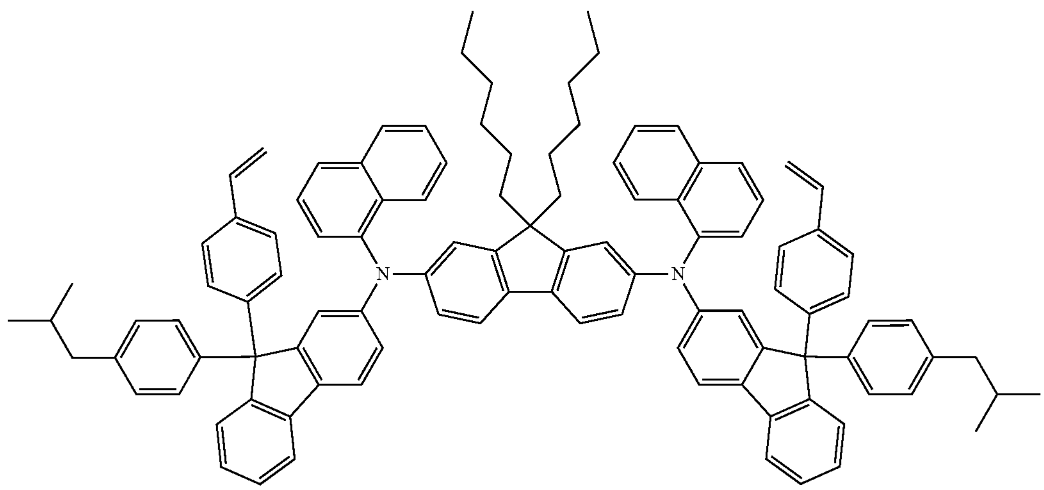
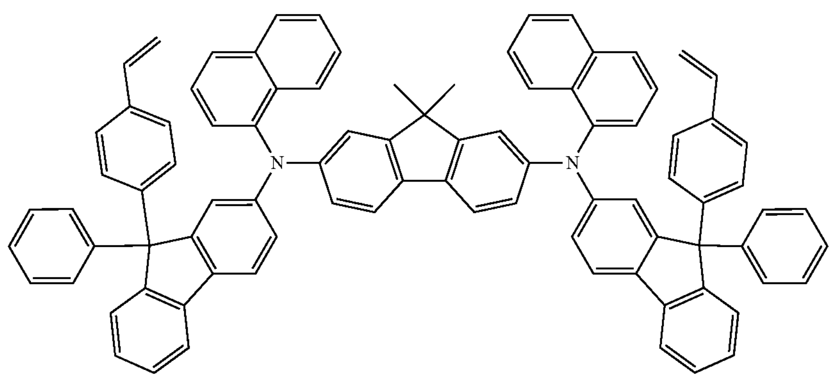

-continued
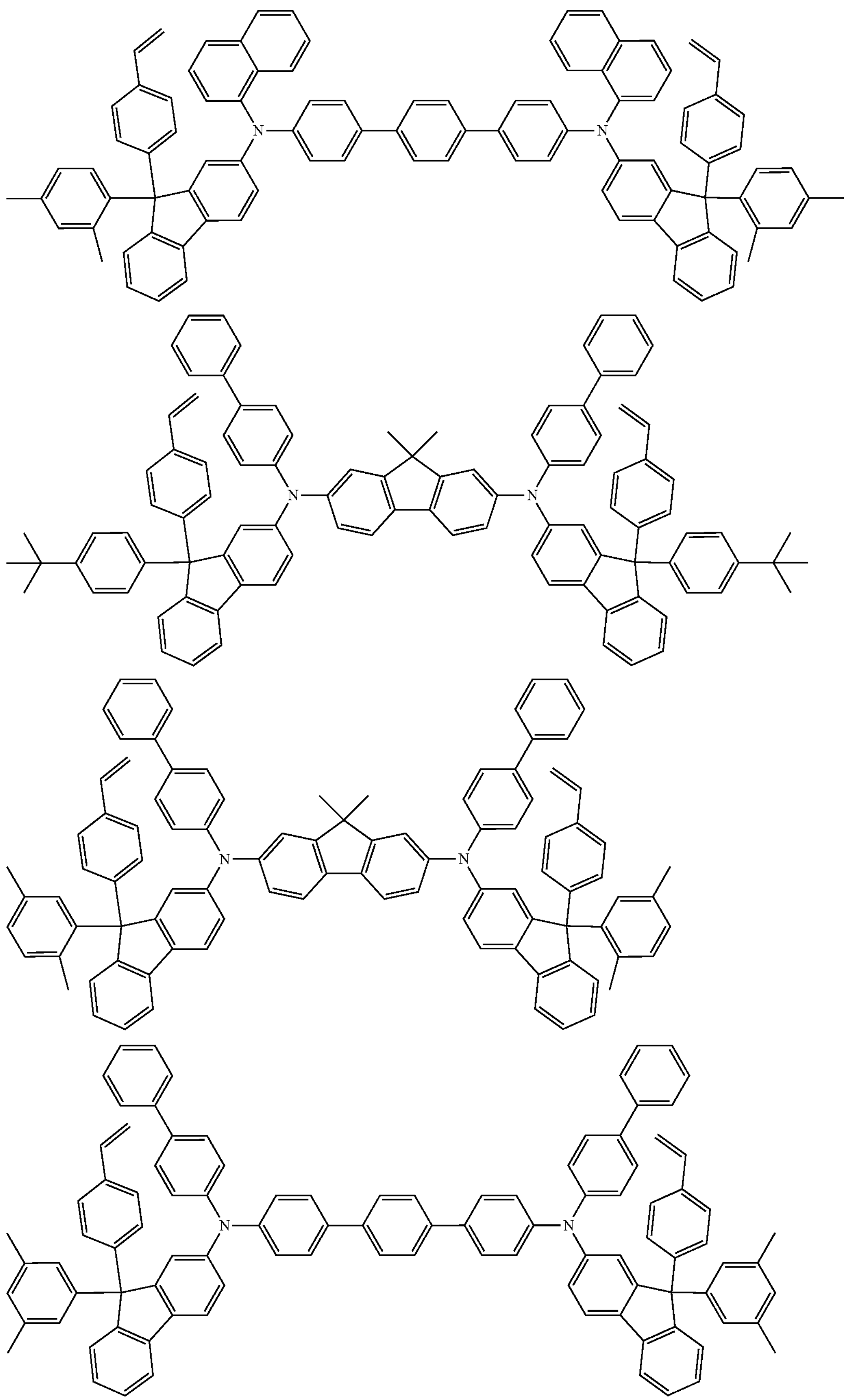

-continued
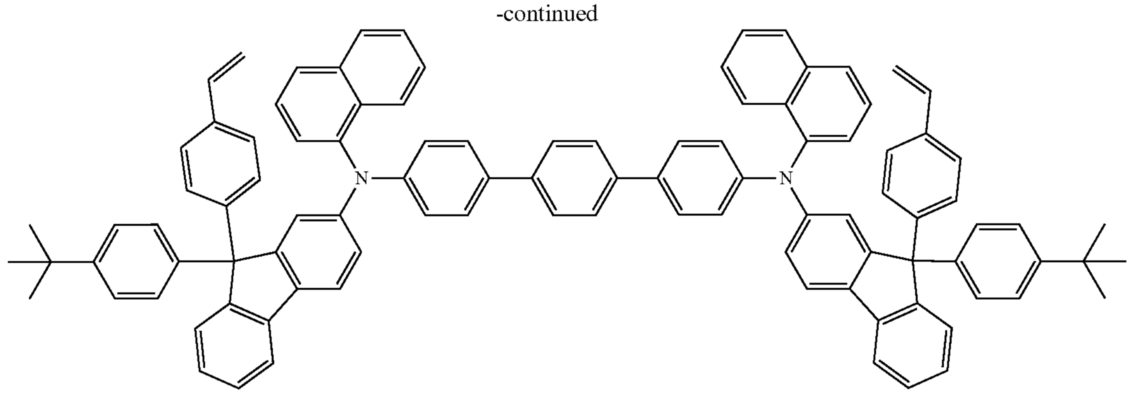
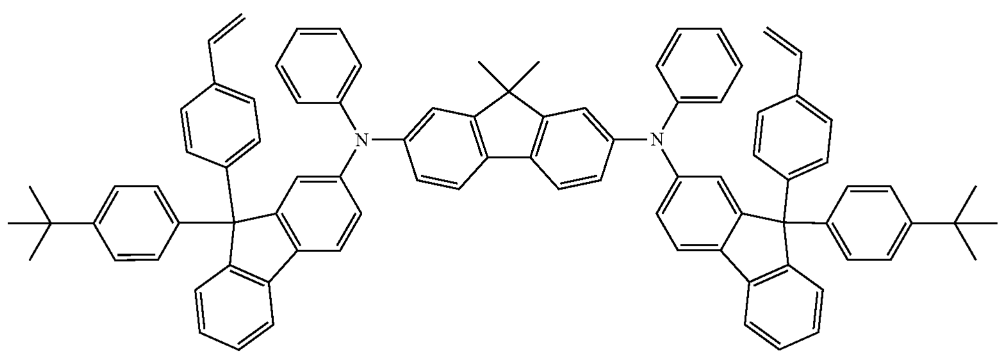
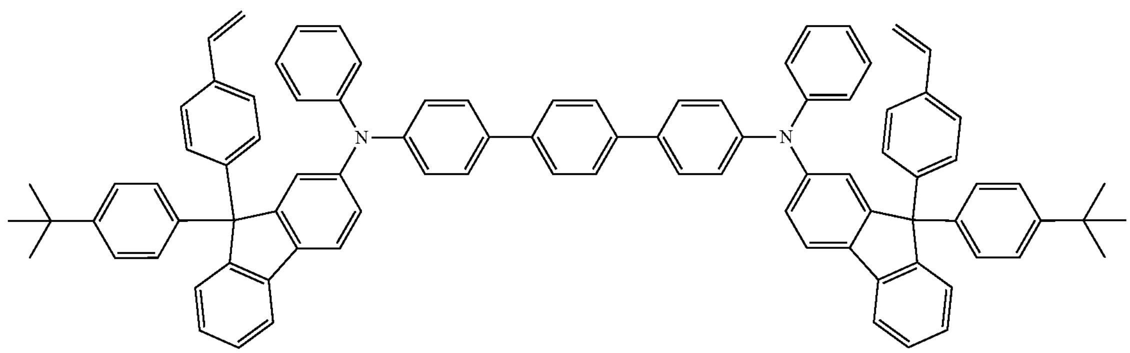
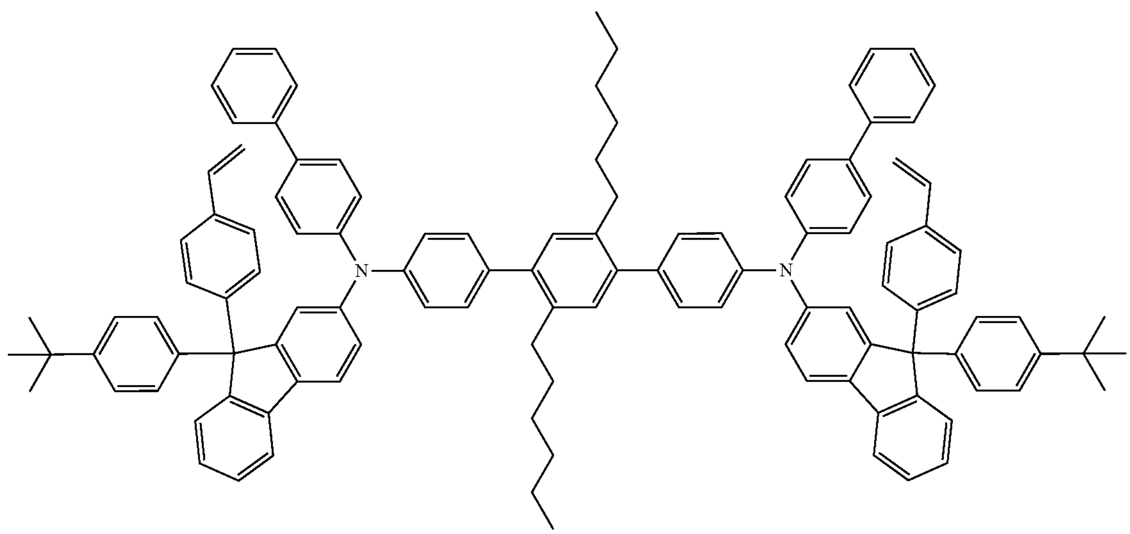

-continued
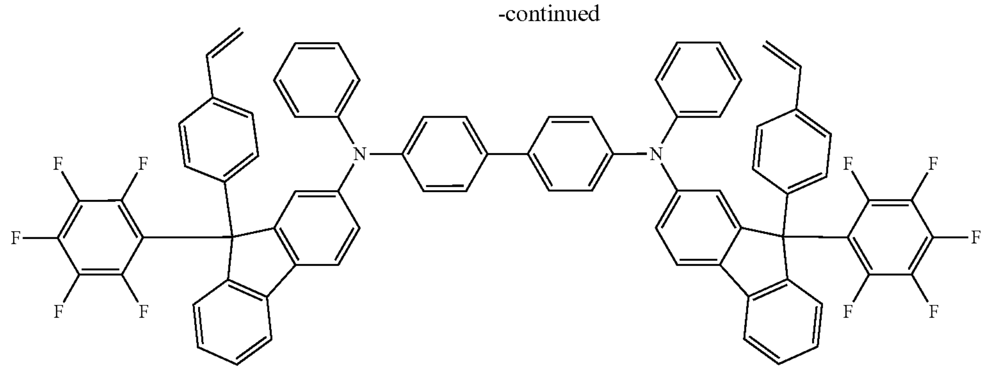
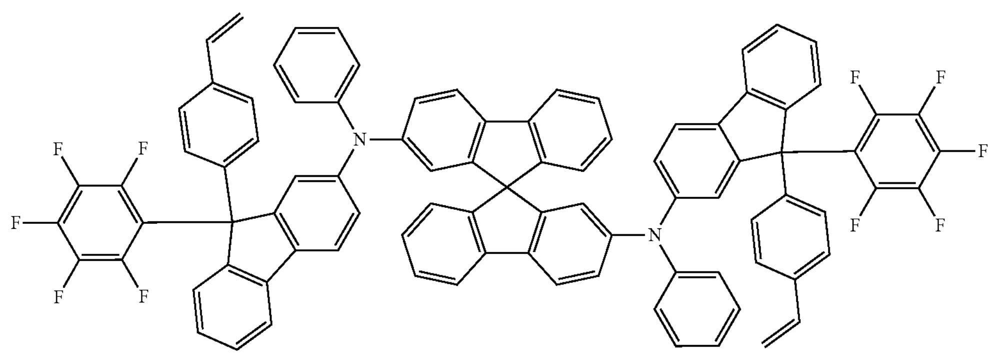
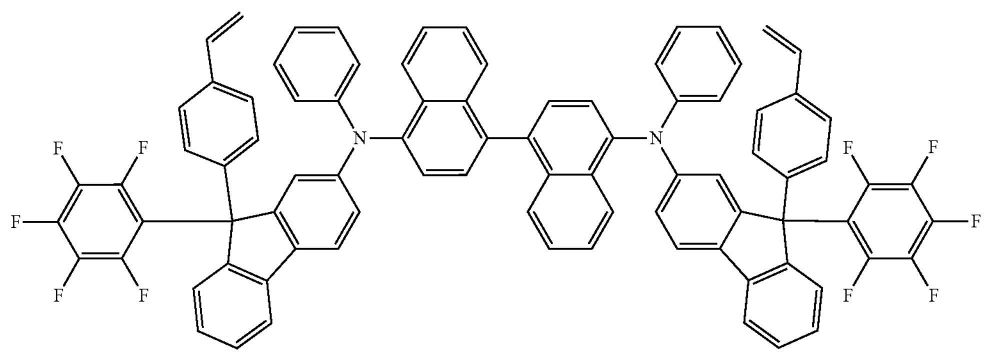
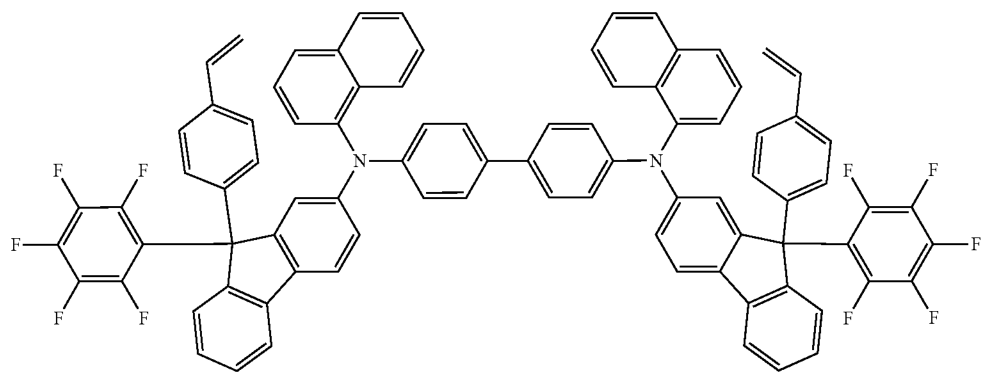

-continued
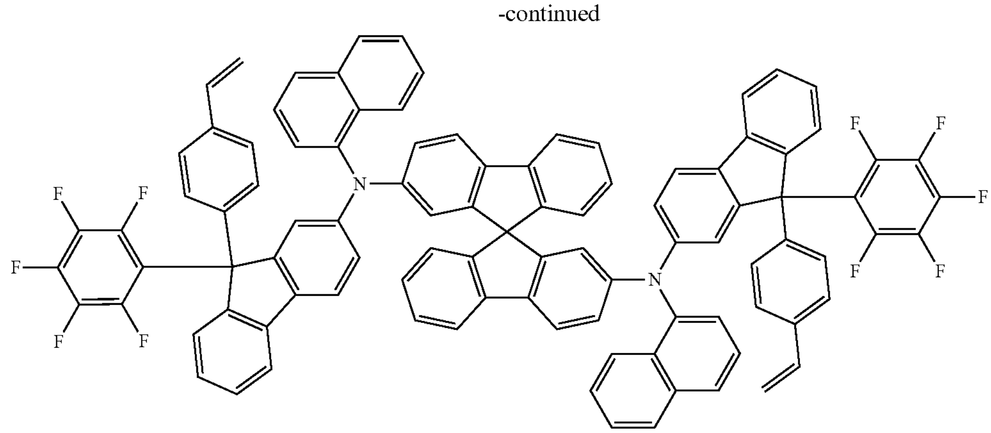
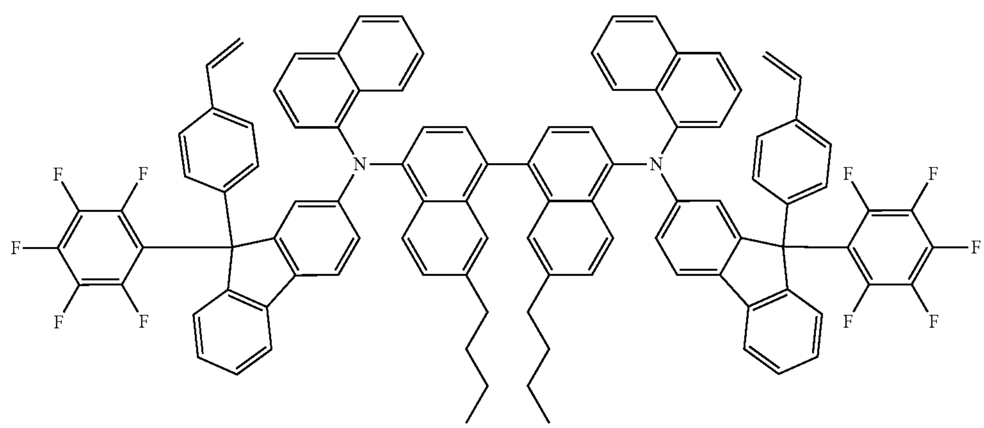
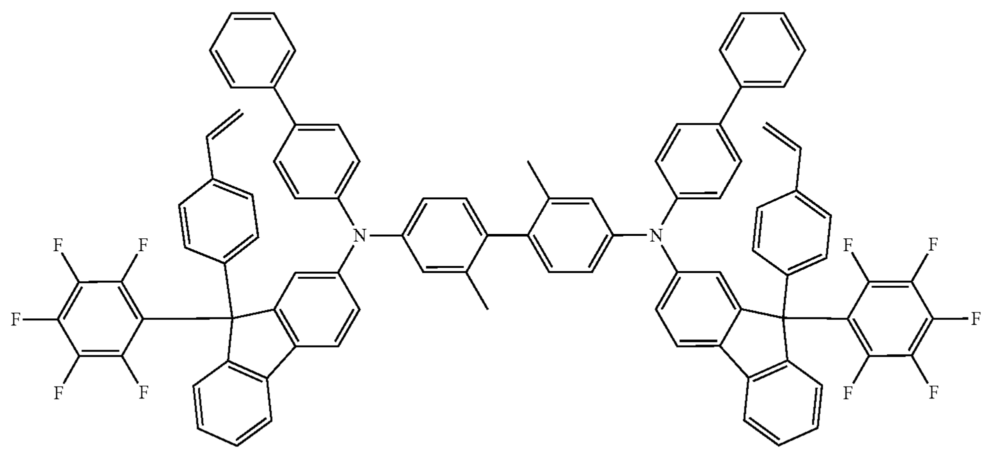

-continued
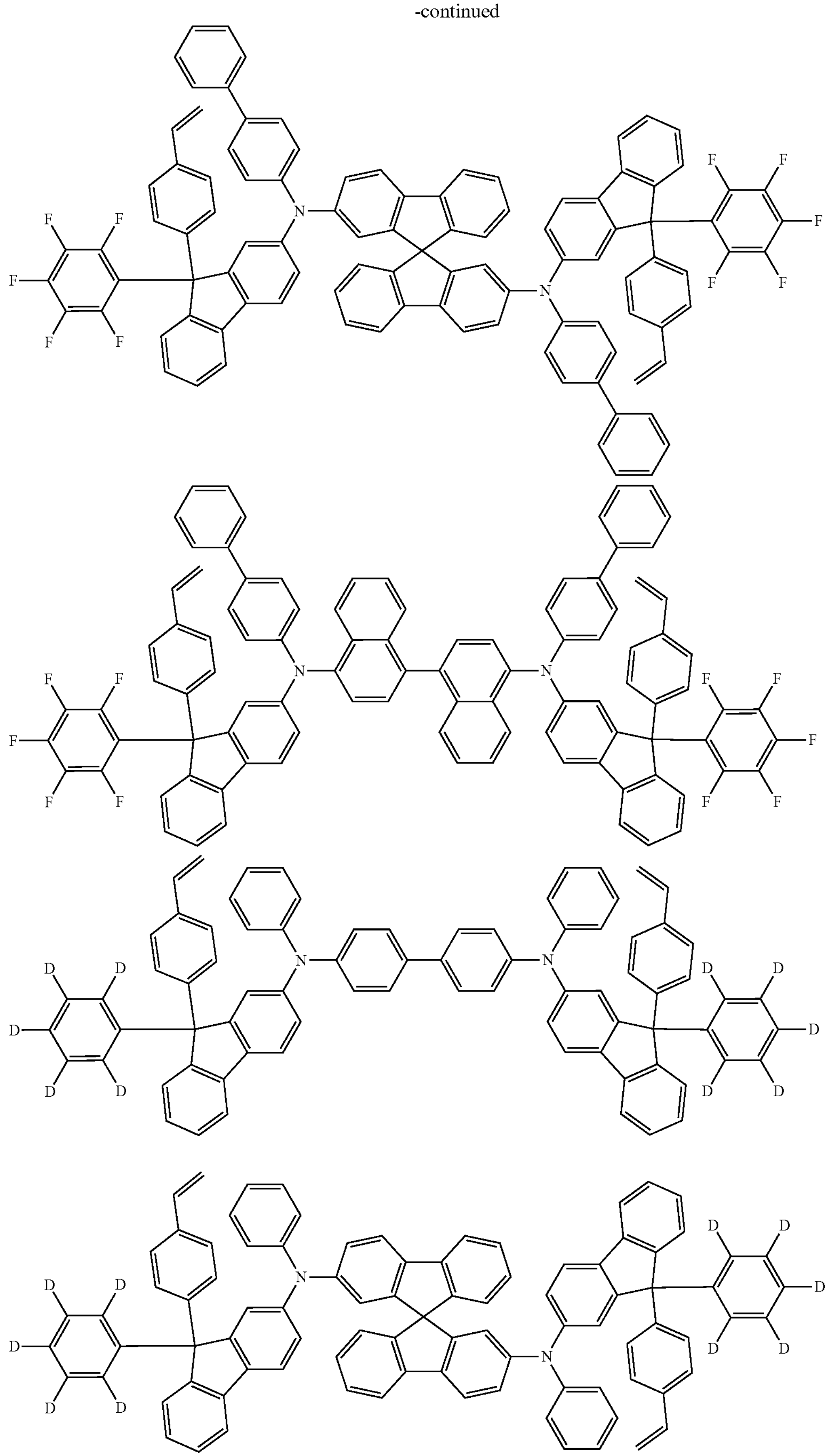

-continued
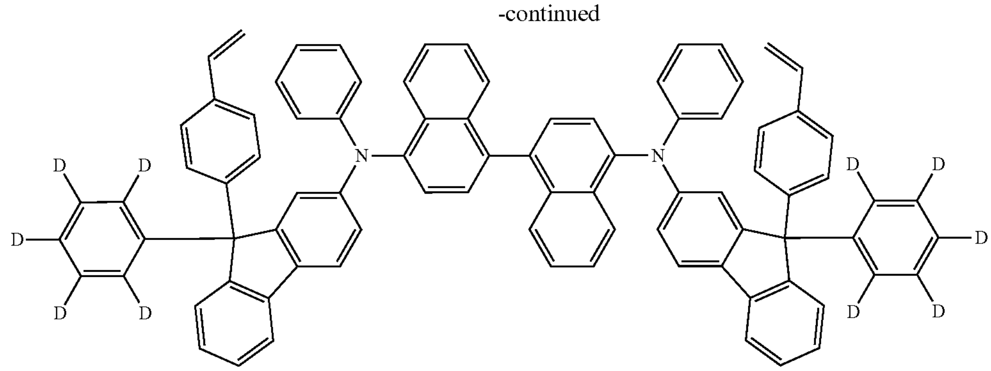
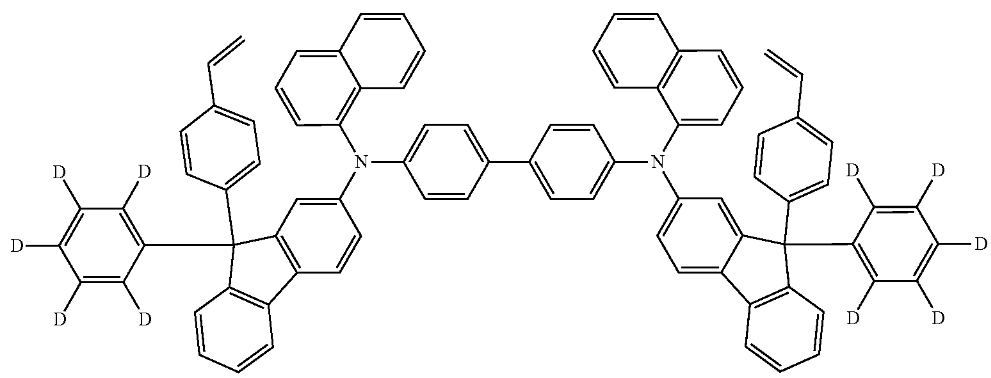
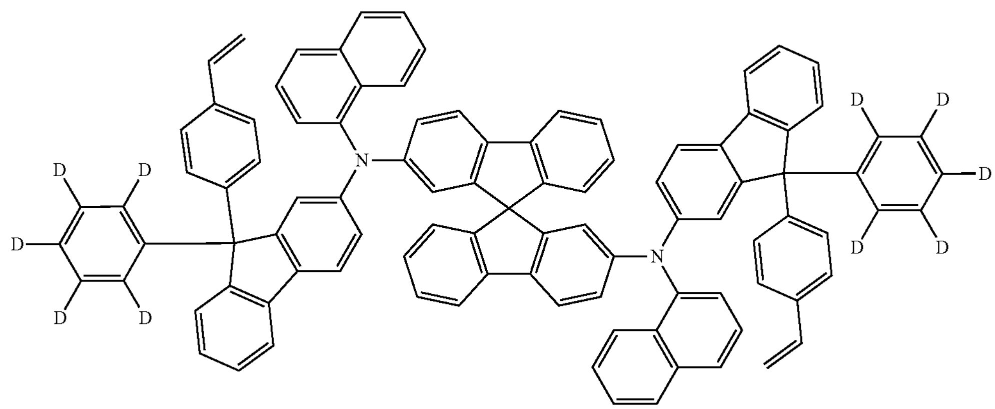
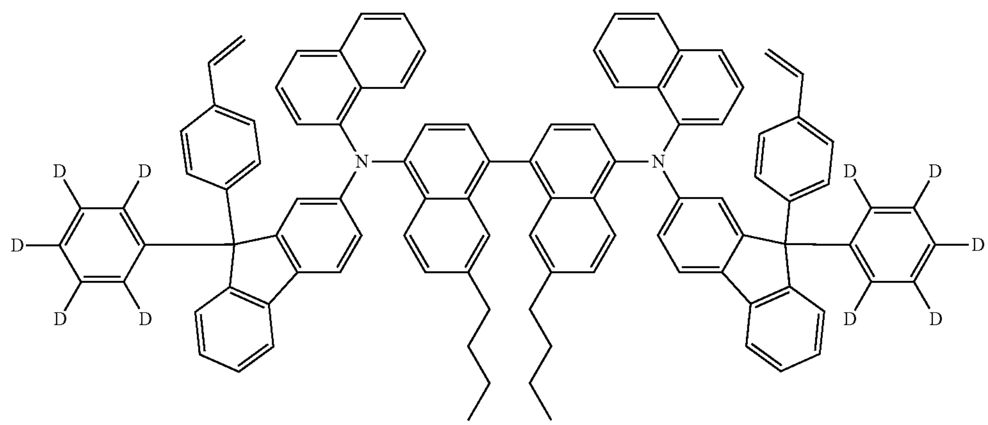

-continued
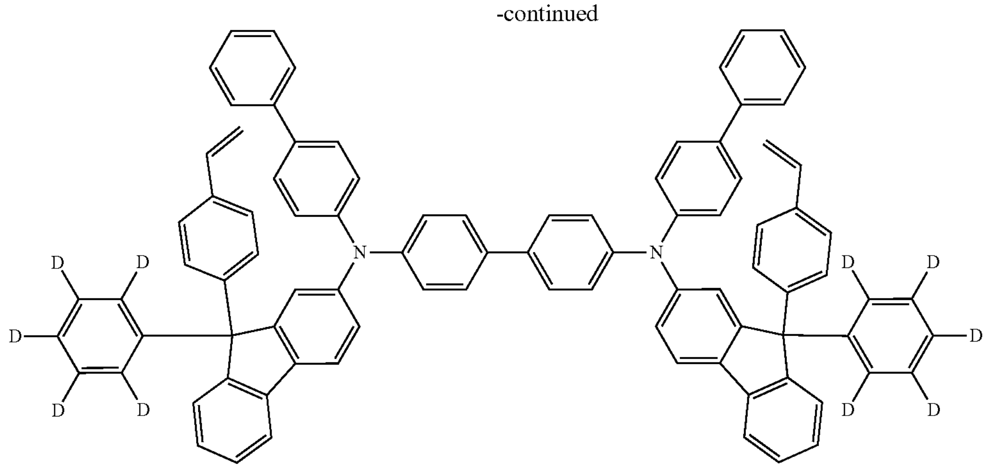
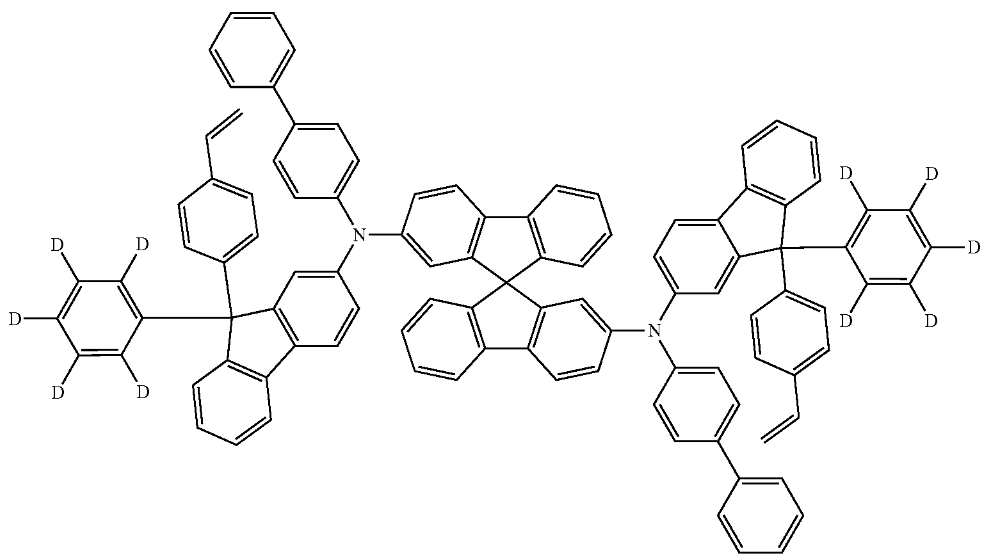
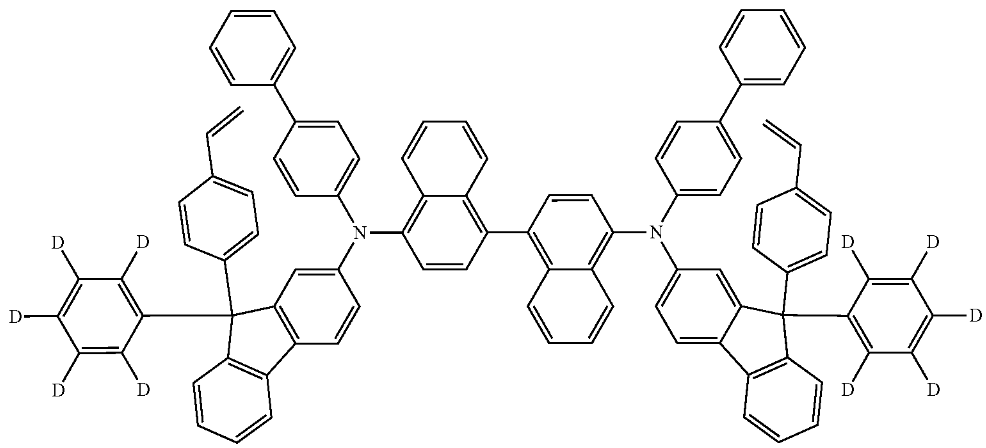

-continued
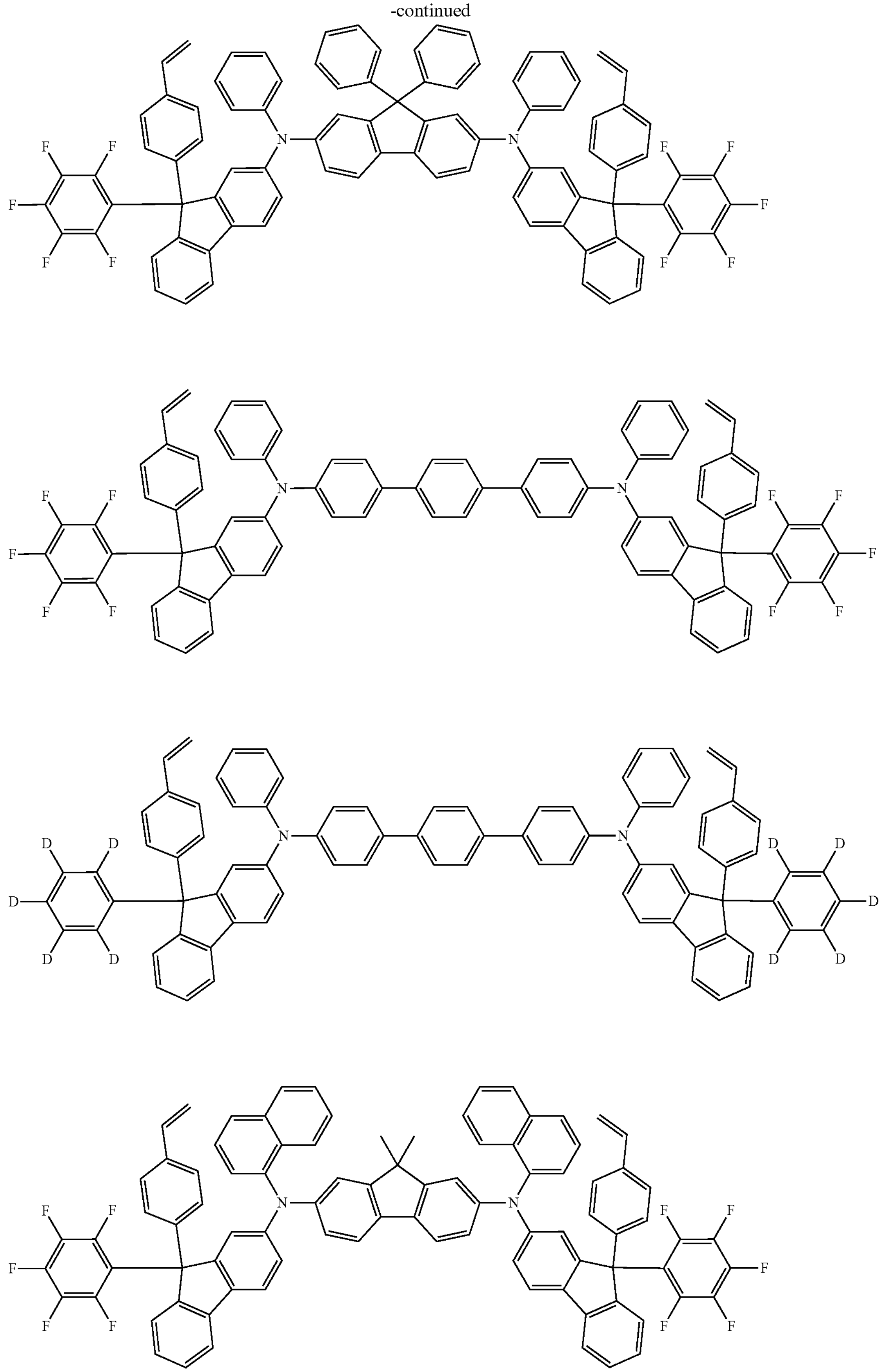

-continued
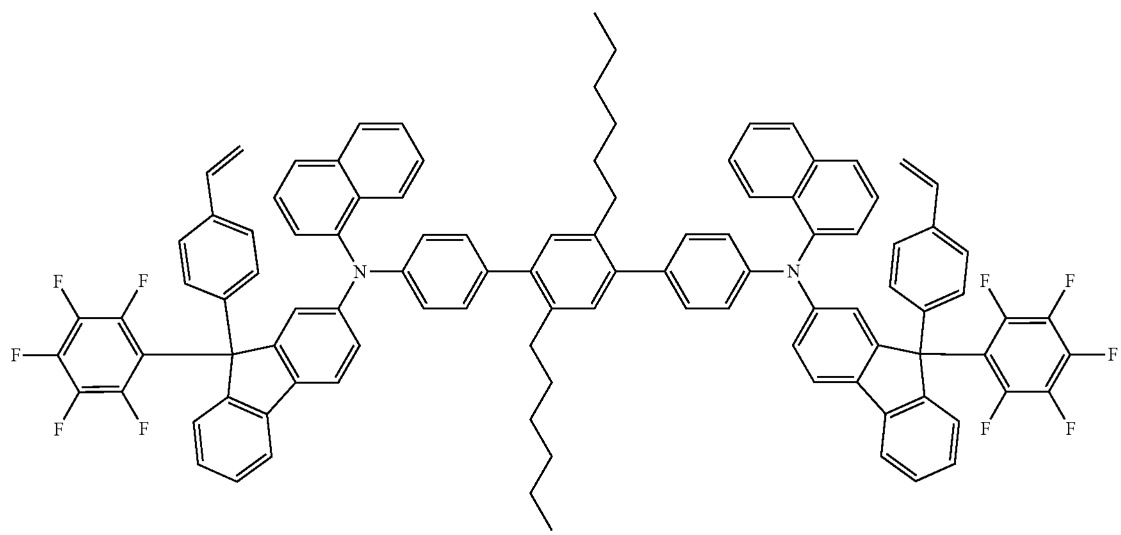
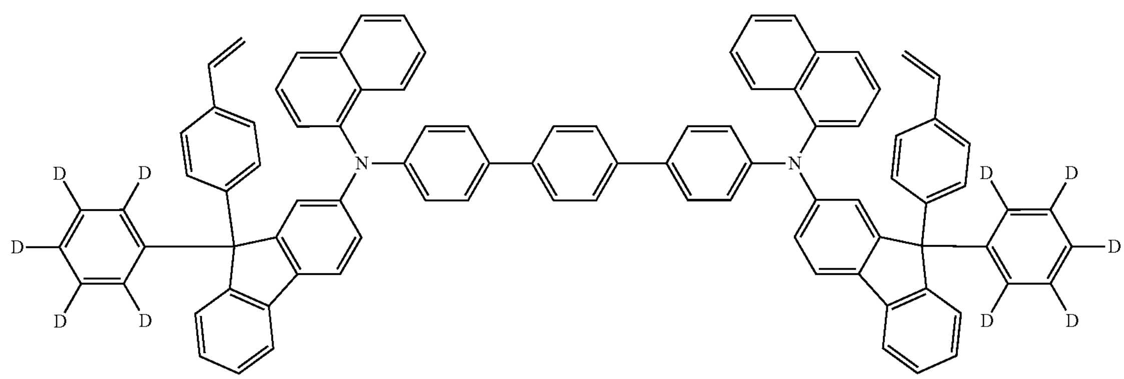
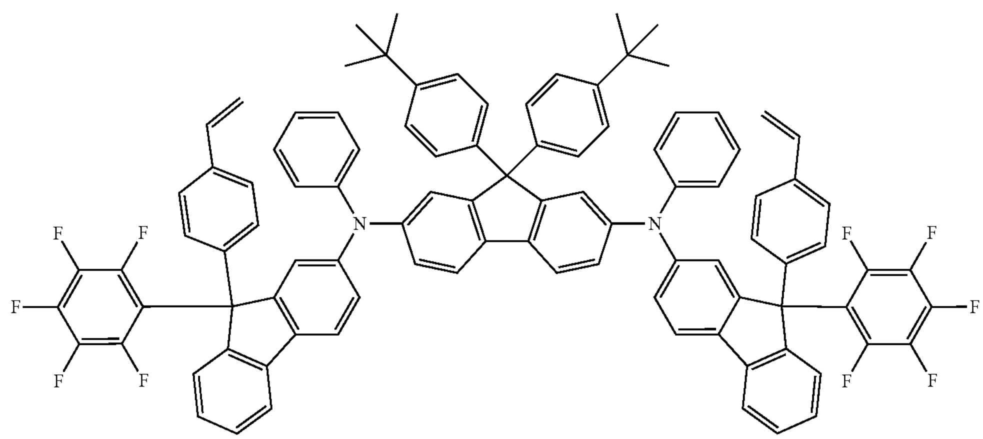

-continued
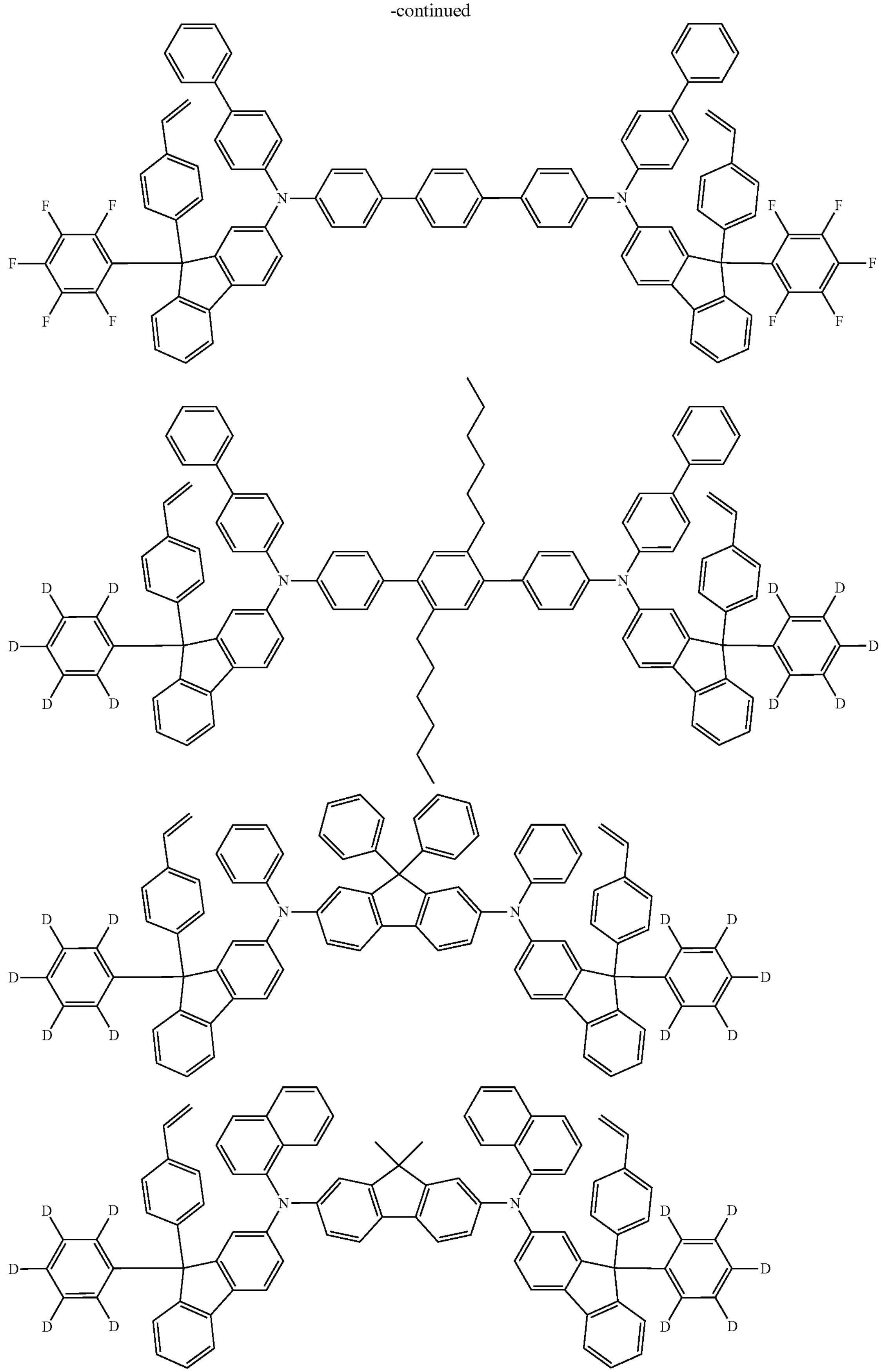

-continued
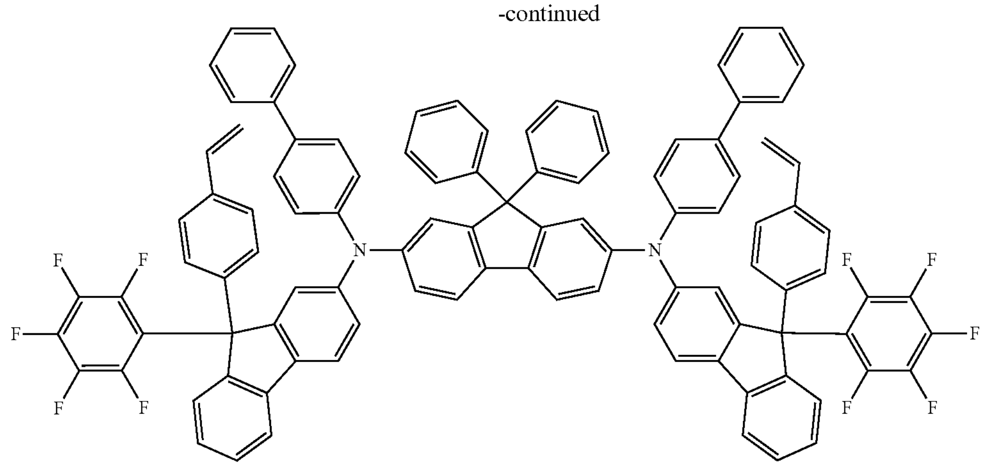
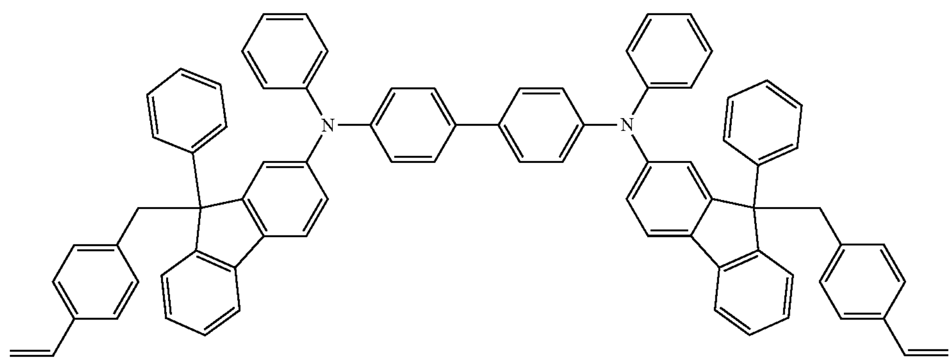
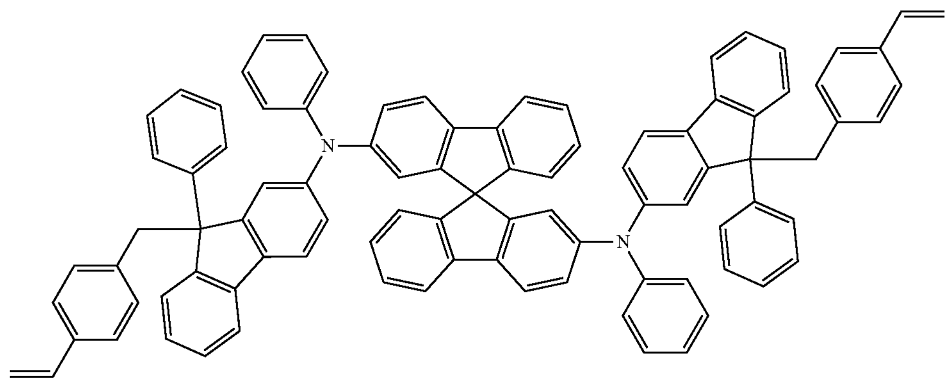
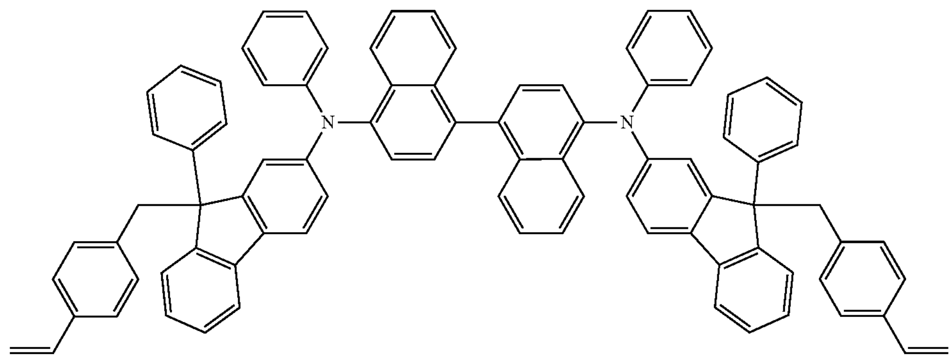

-continued
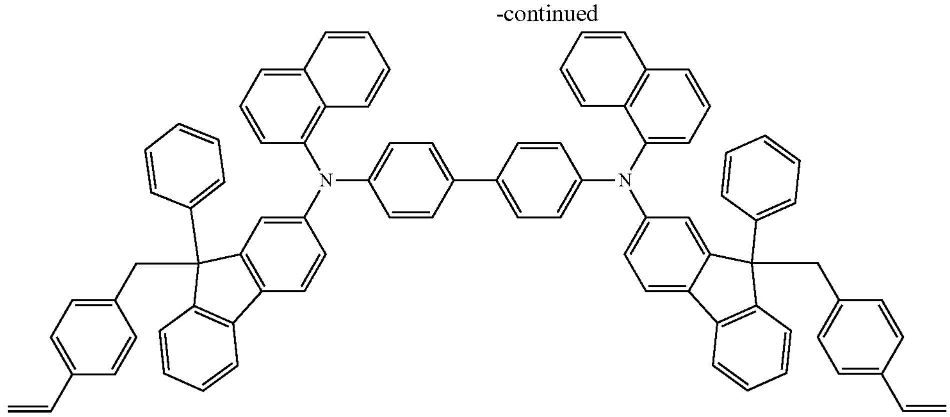
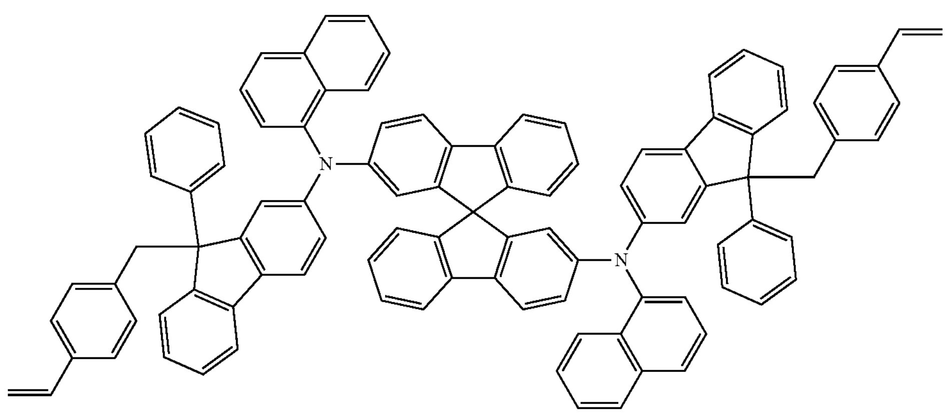
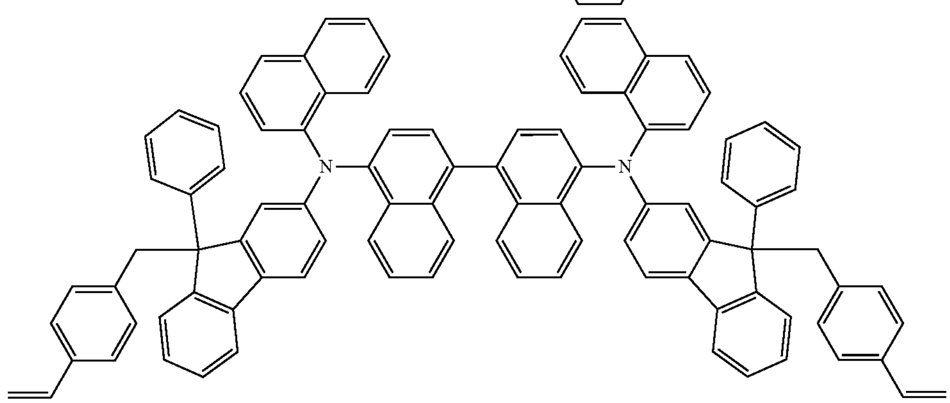
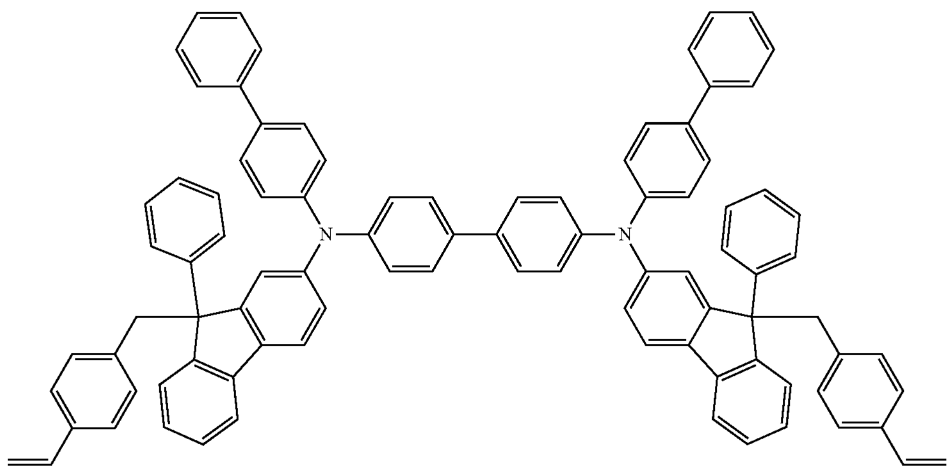

-continued
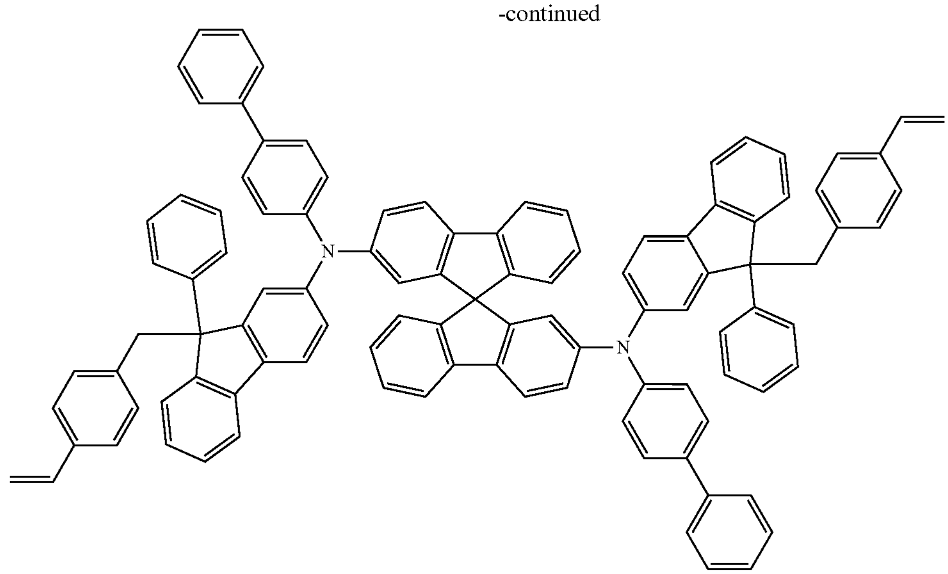
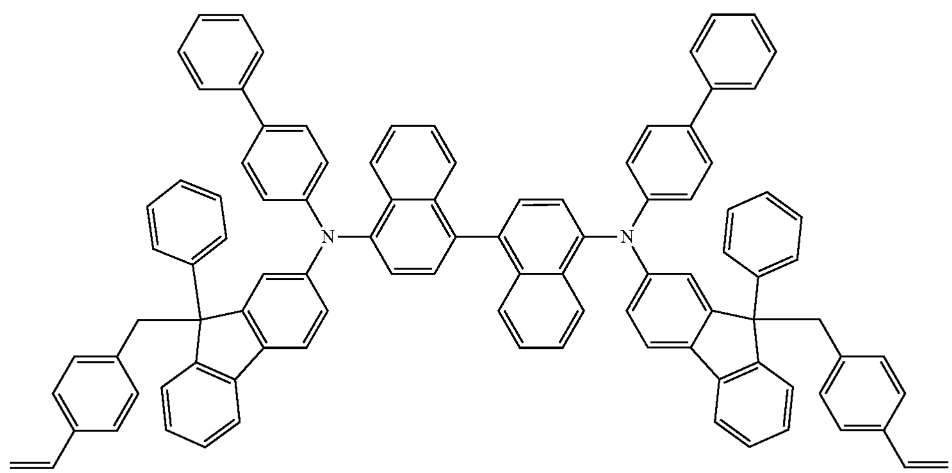
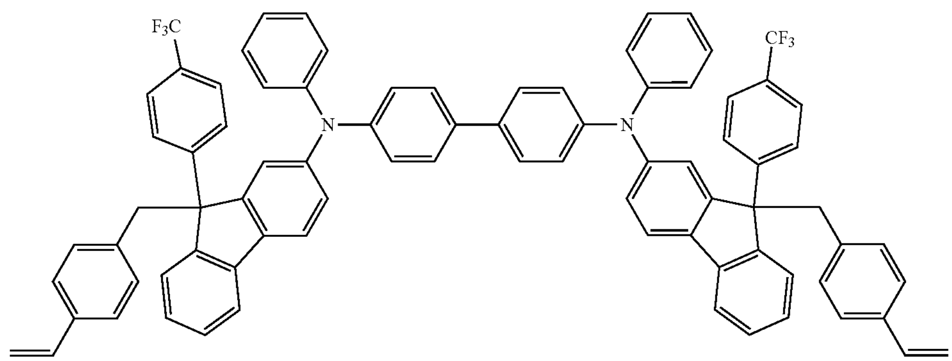

-continued
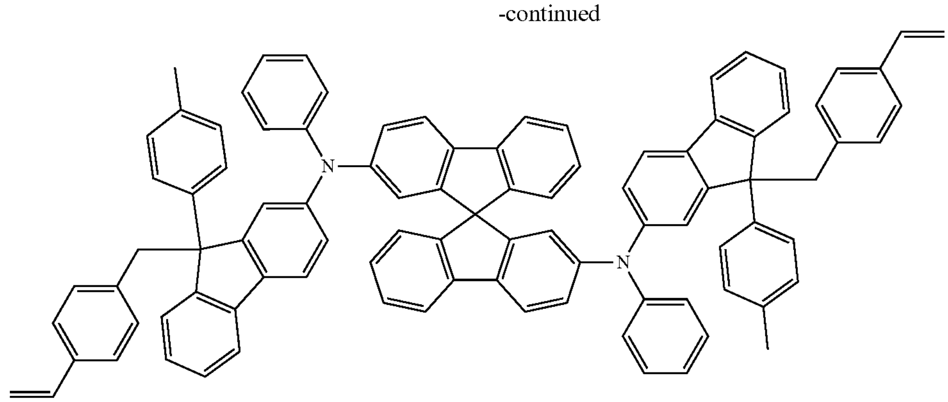
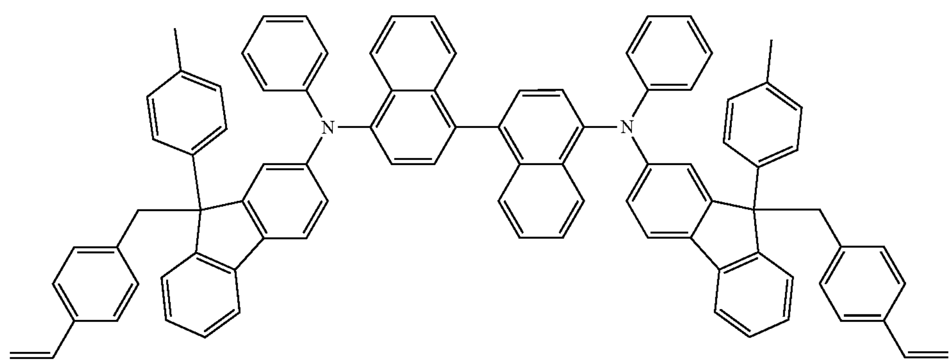
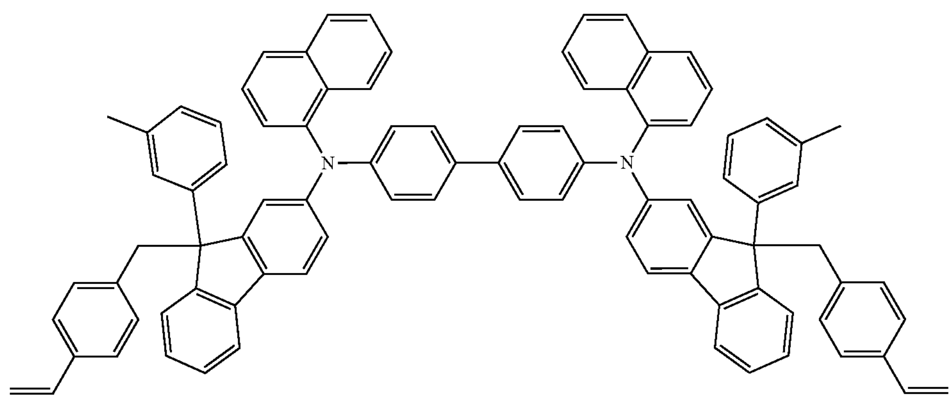
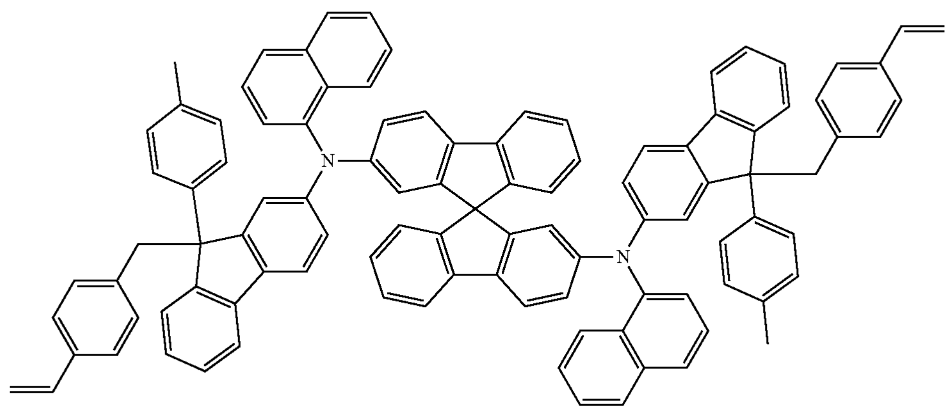

-continued
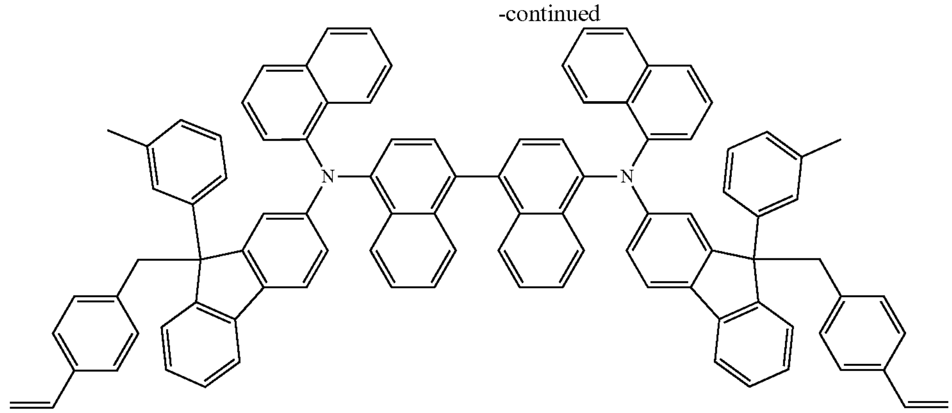
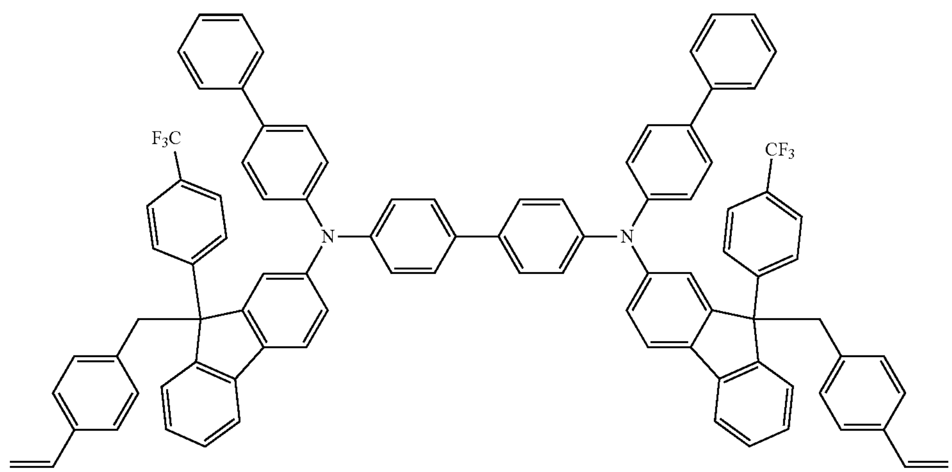
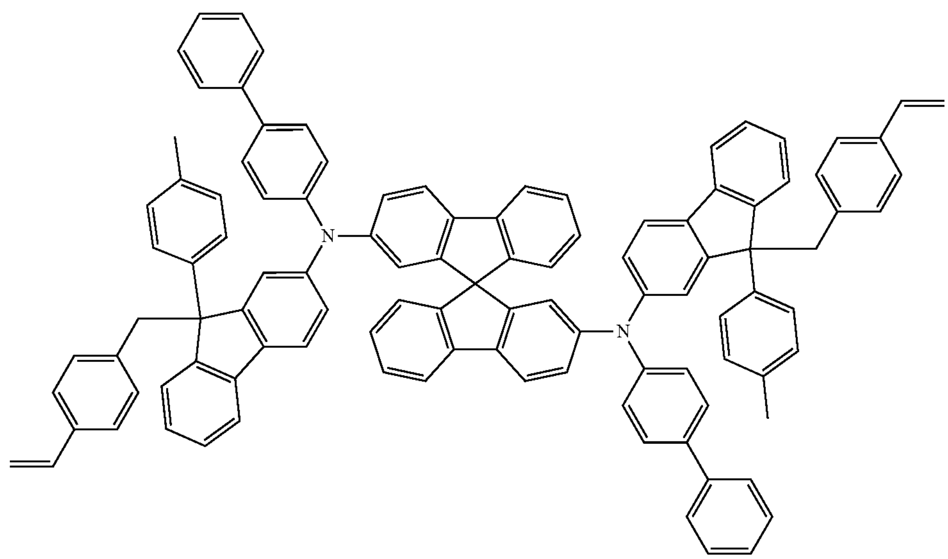

-continued
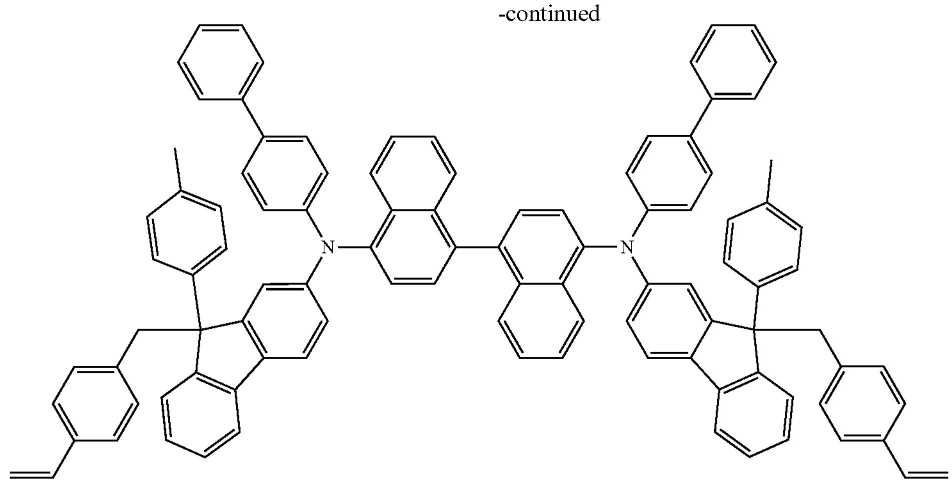
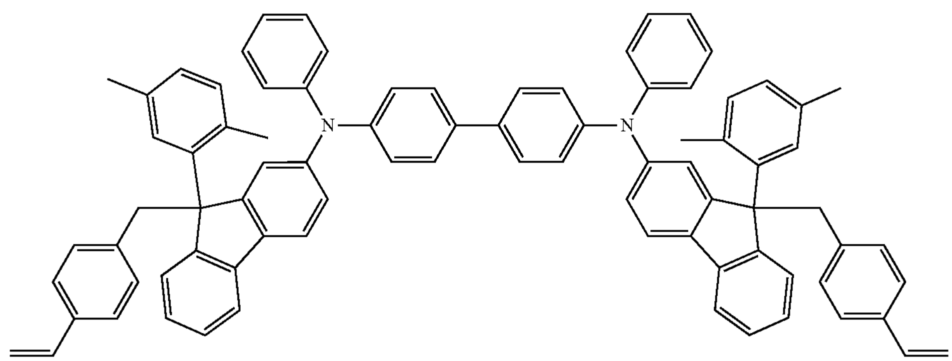
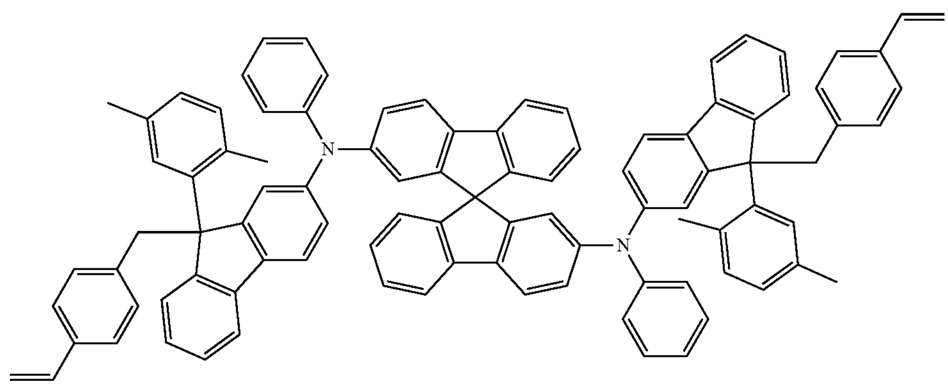
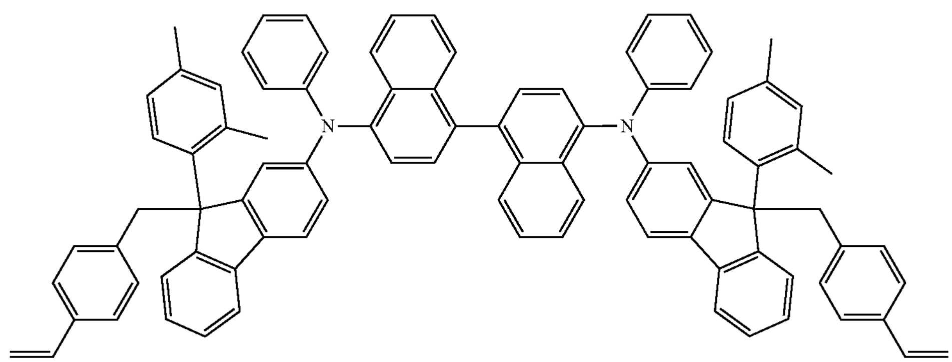

-continued
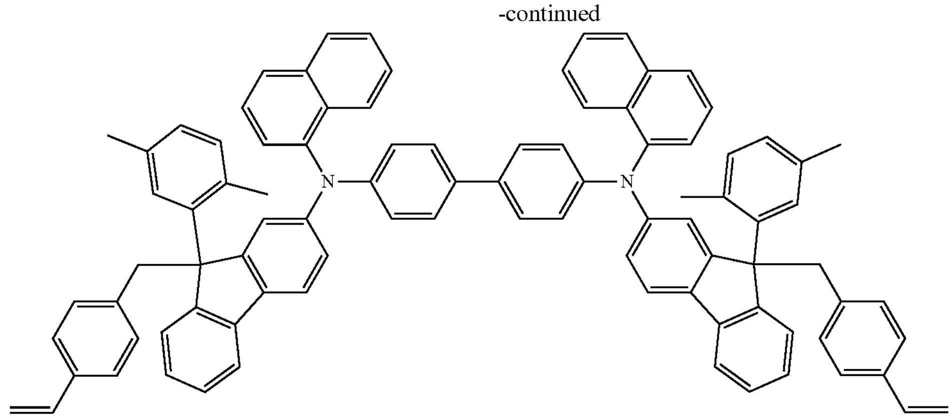
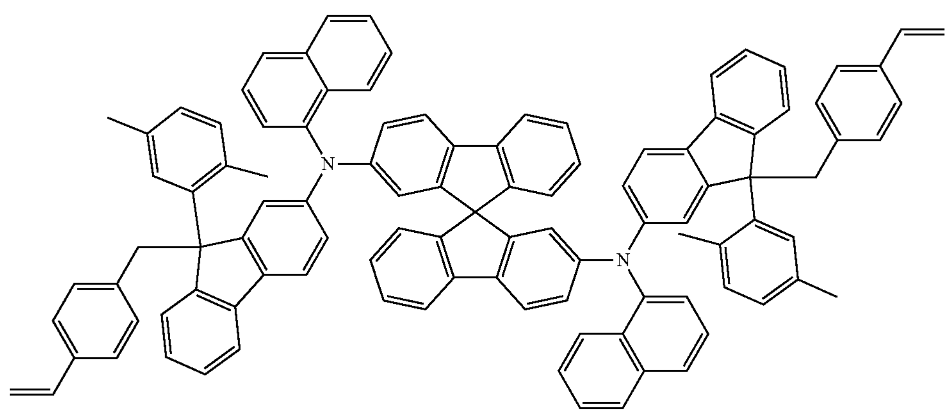
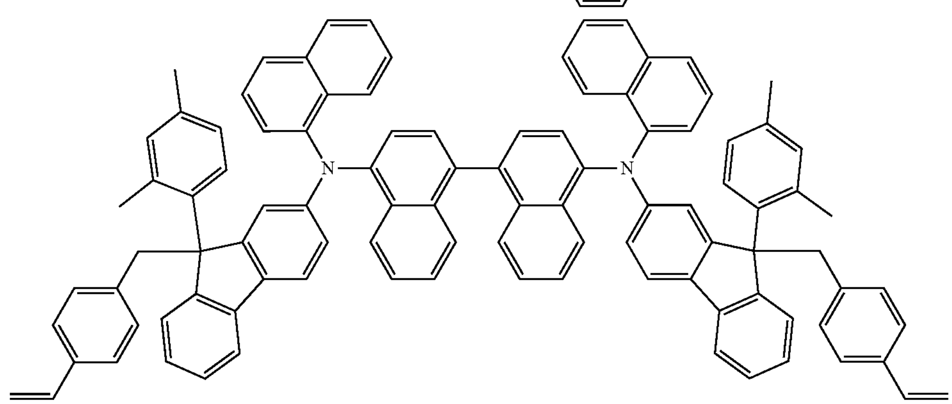
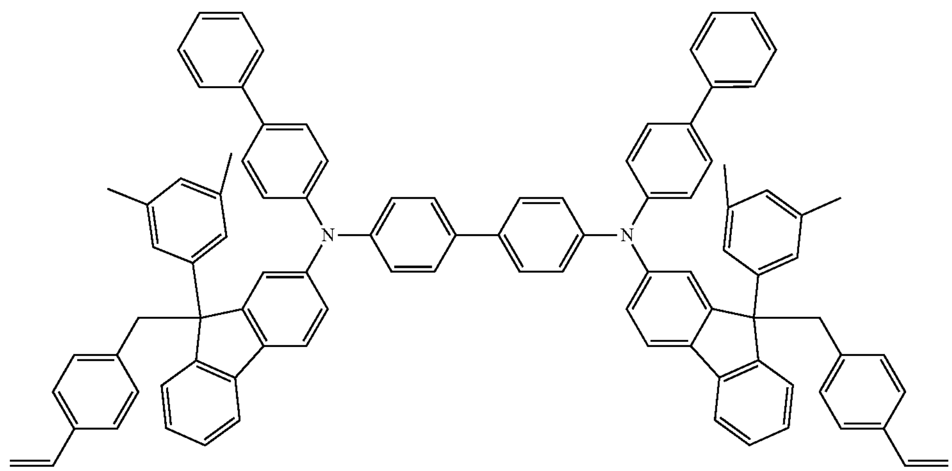

-continued
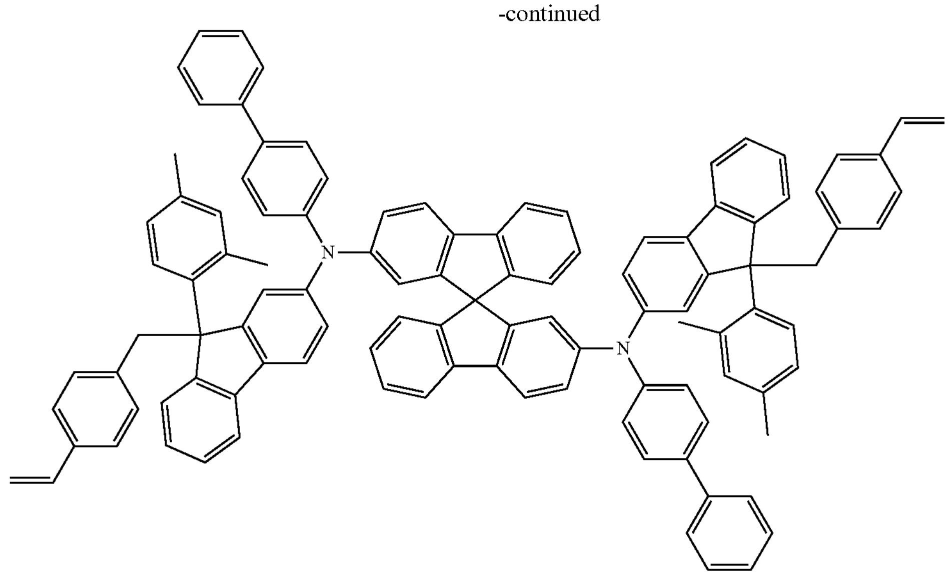
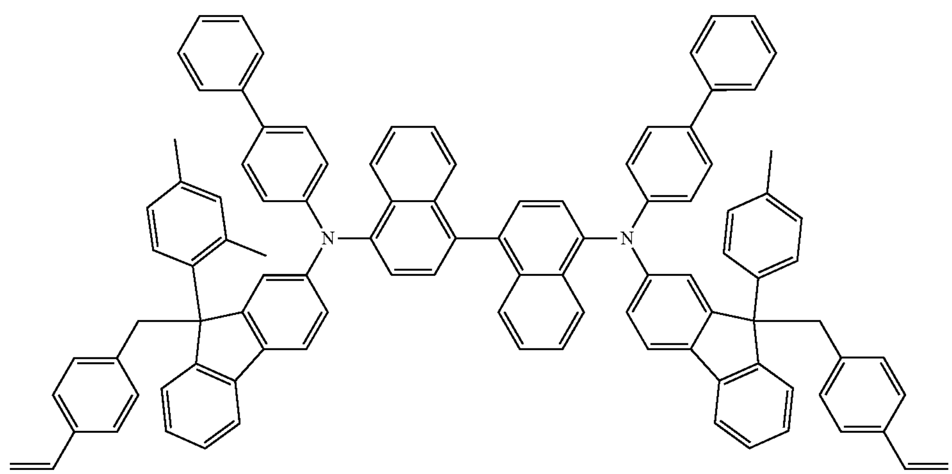
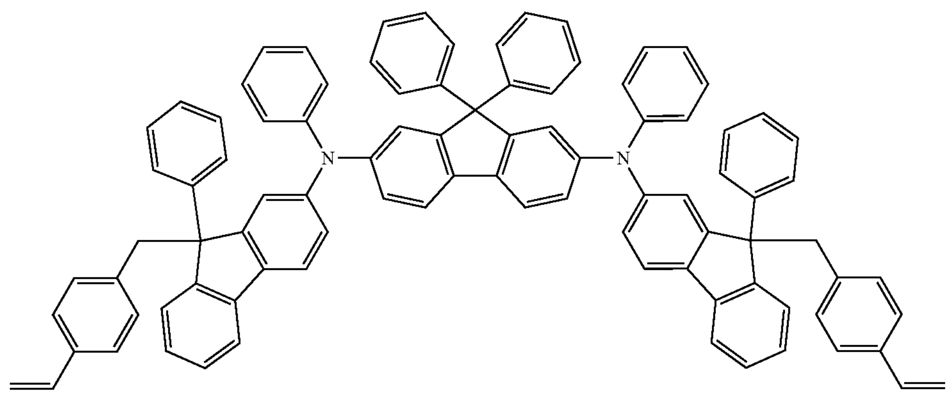

-continued
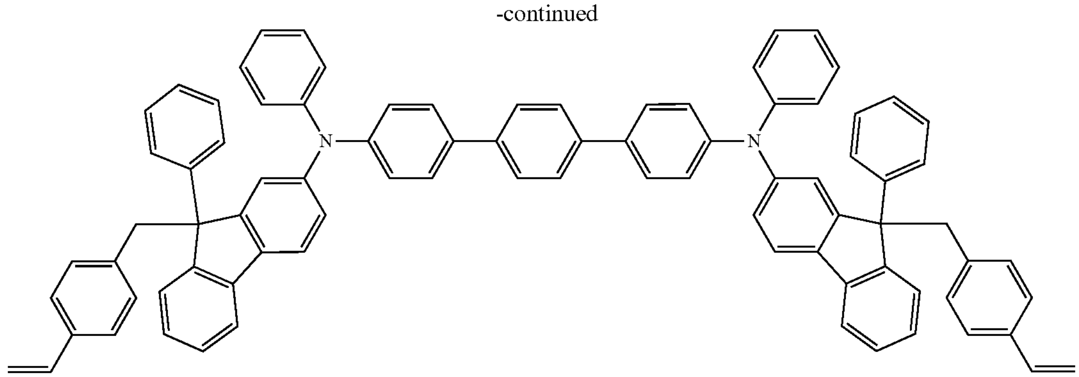
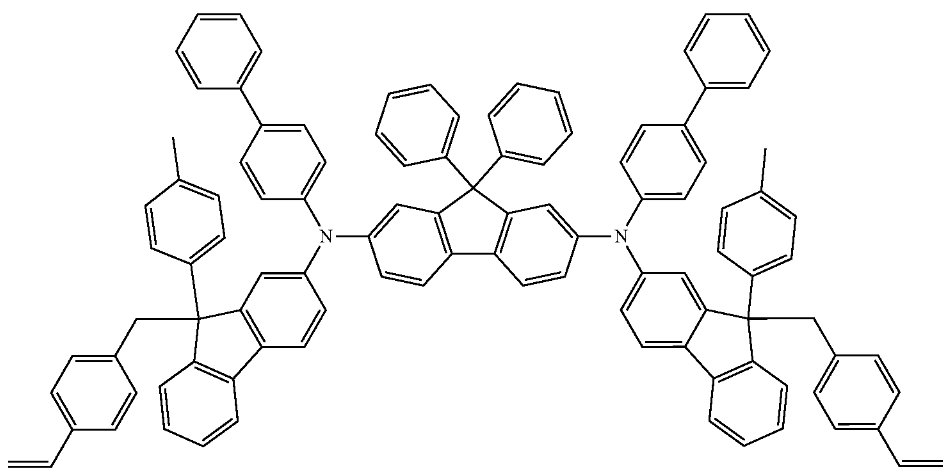
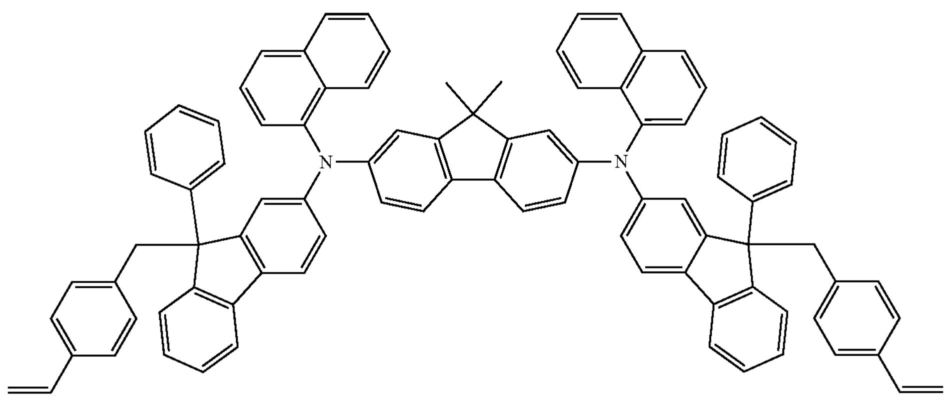
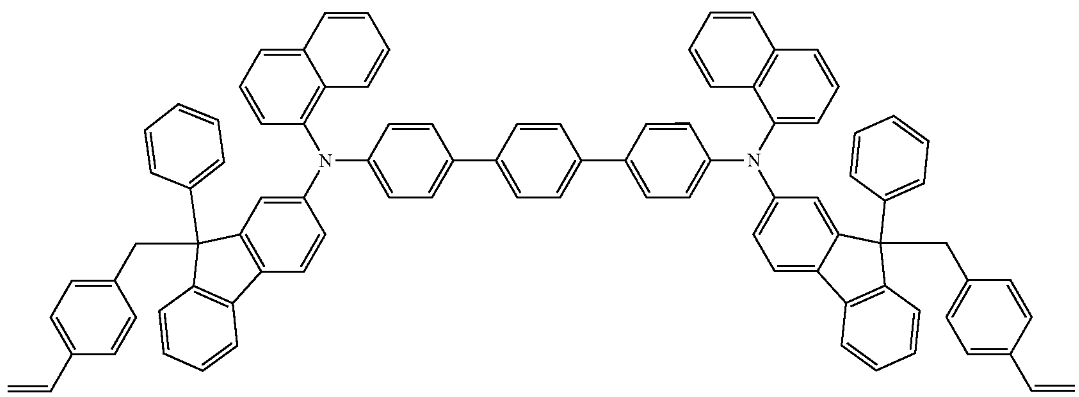

-continued
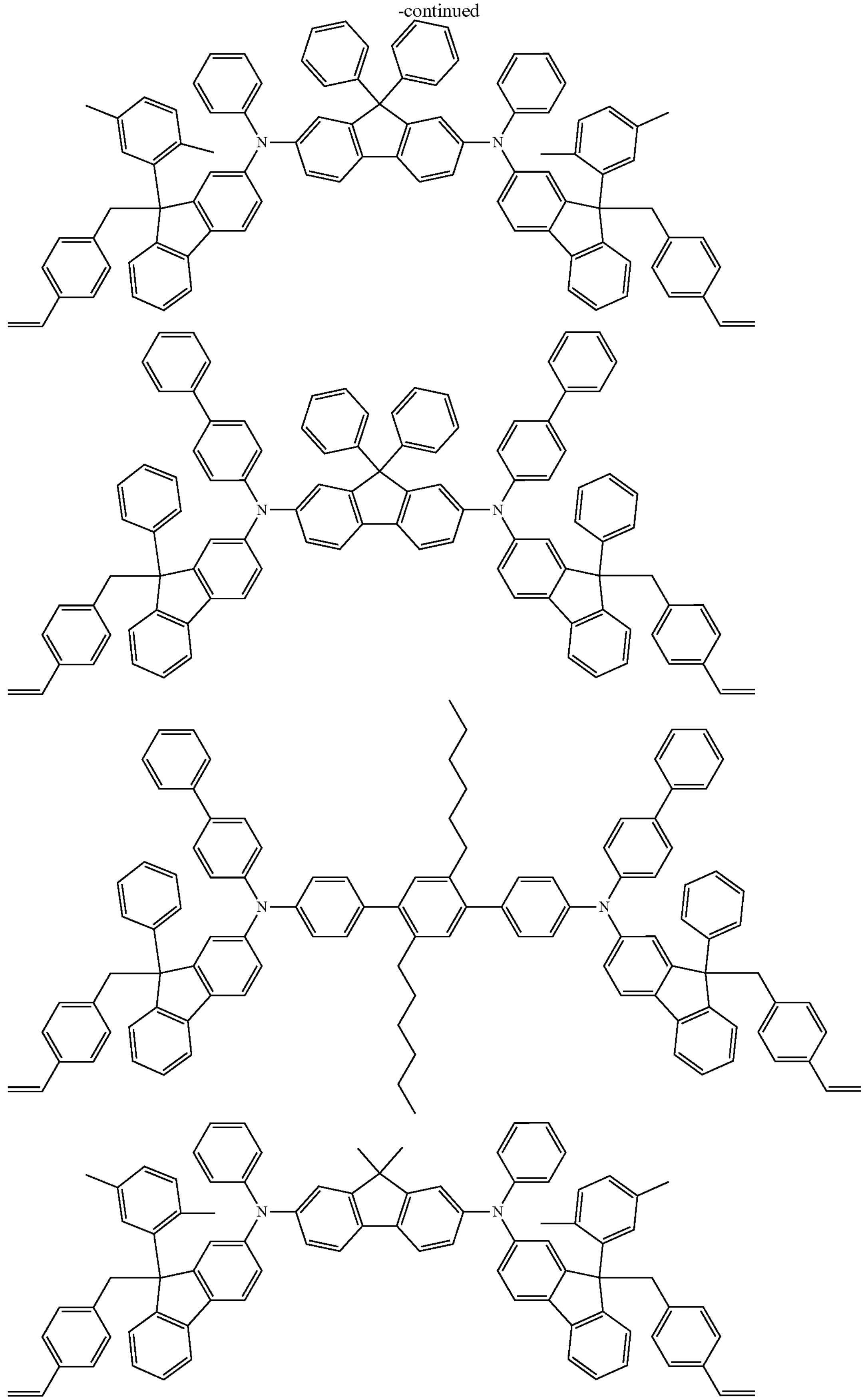

-continued
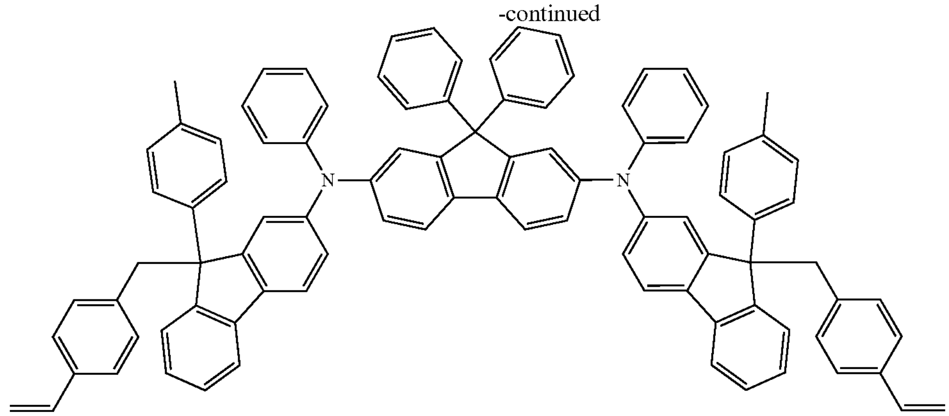
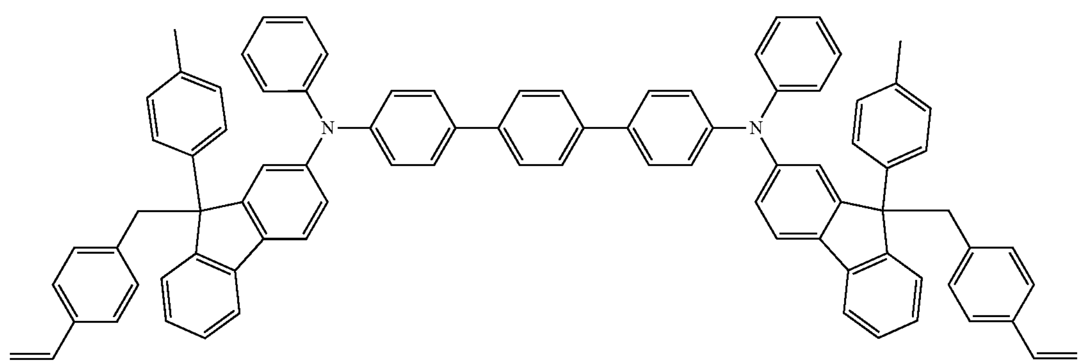
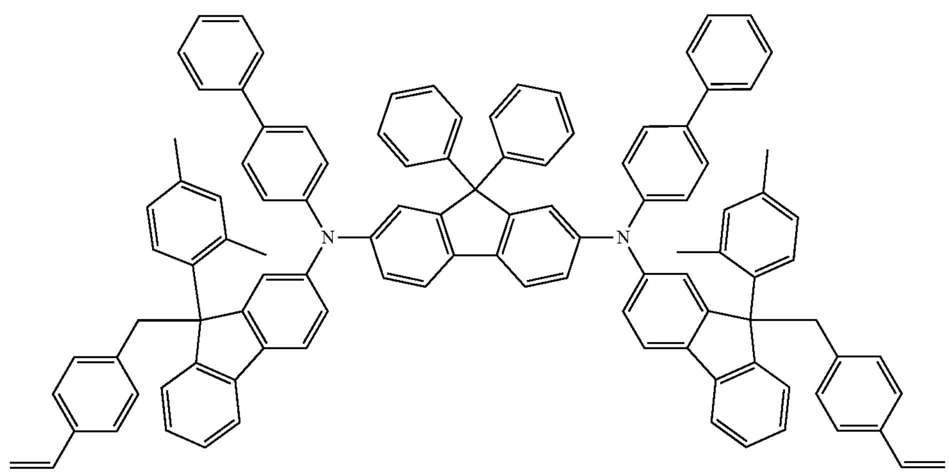
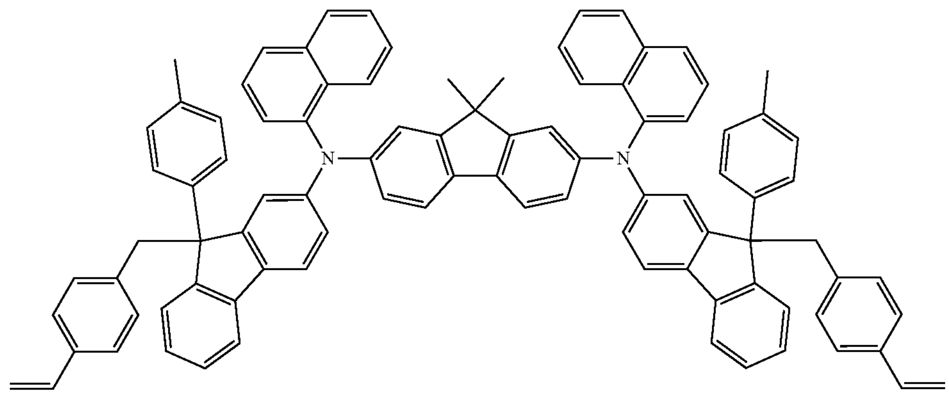

-continued
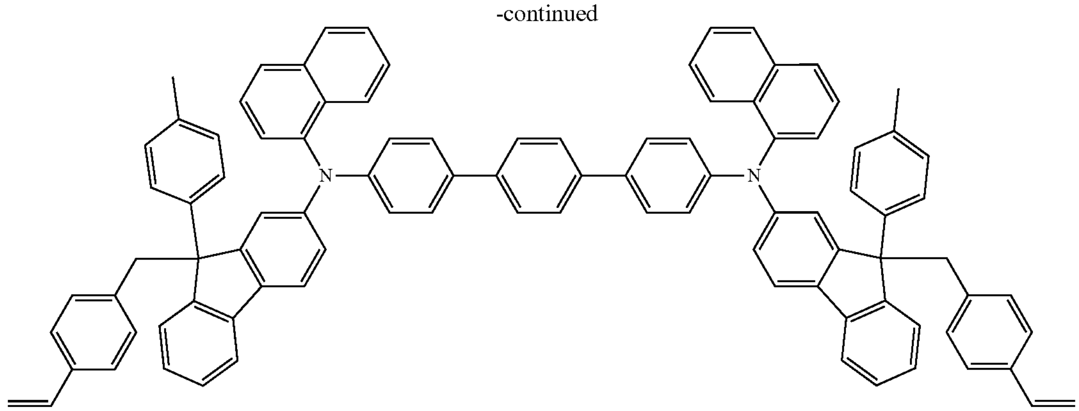
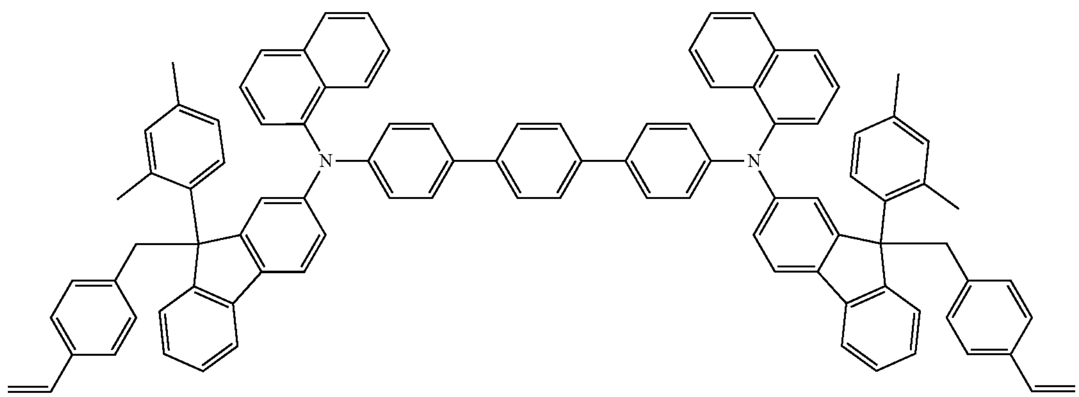
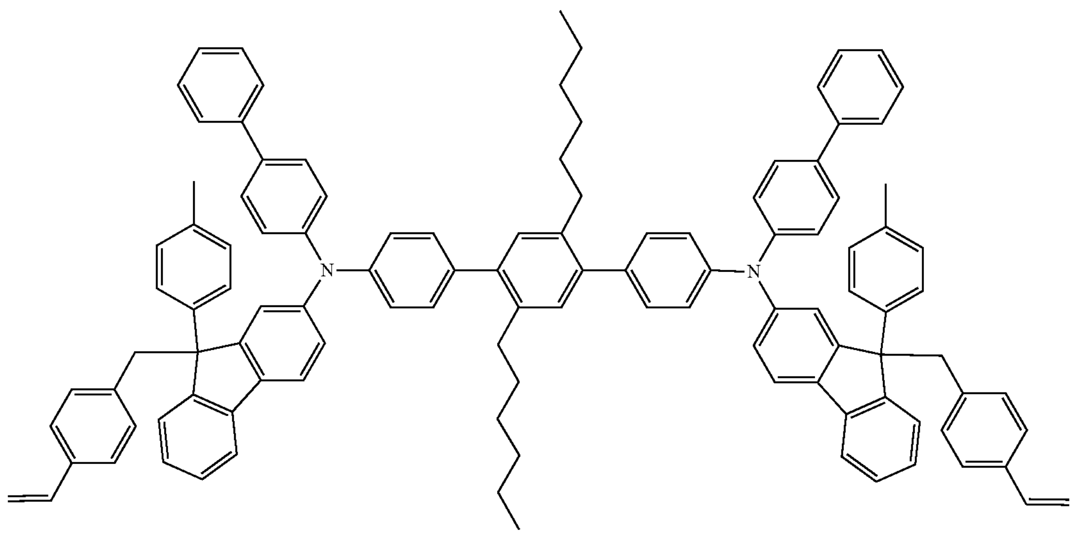

-continued
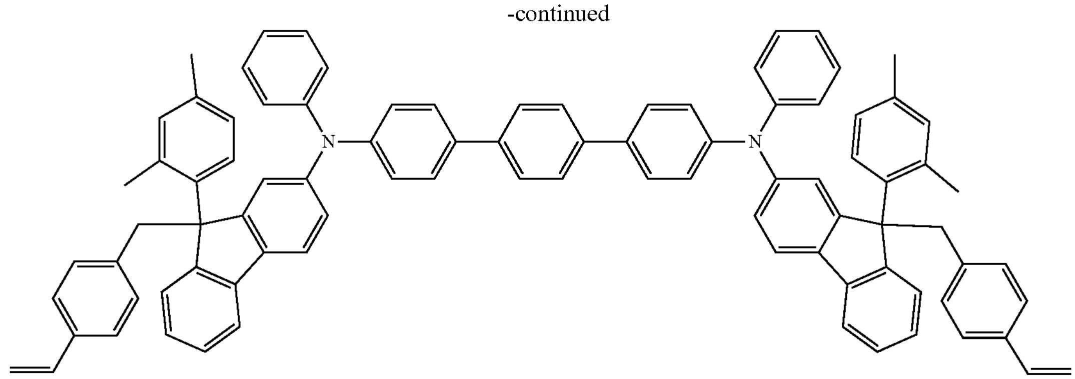
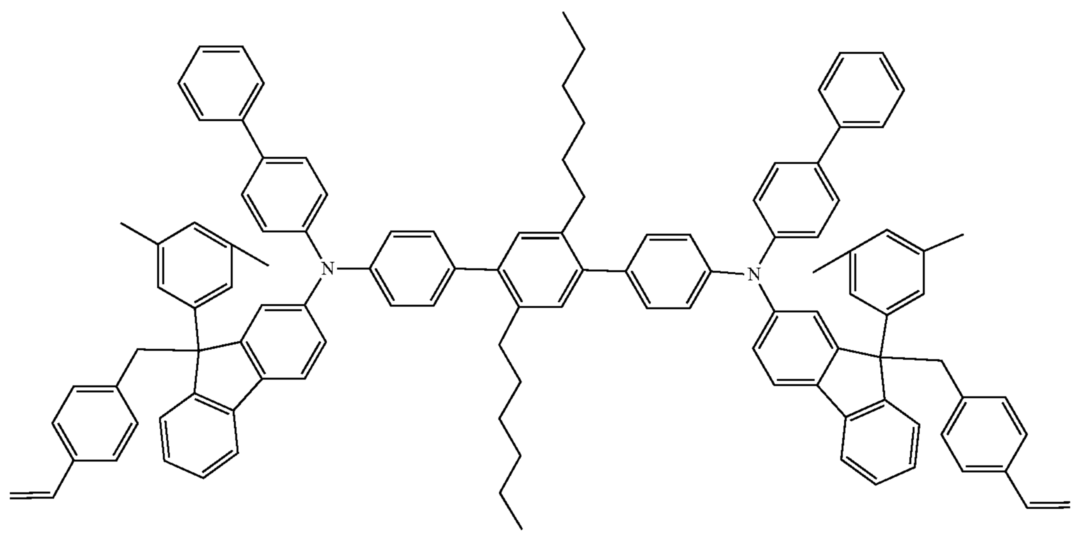
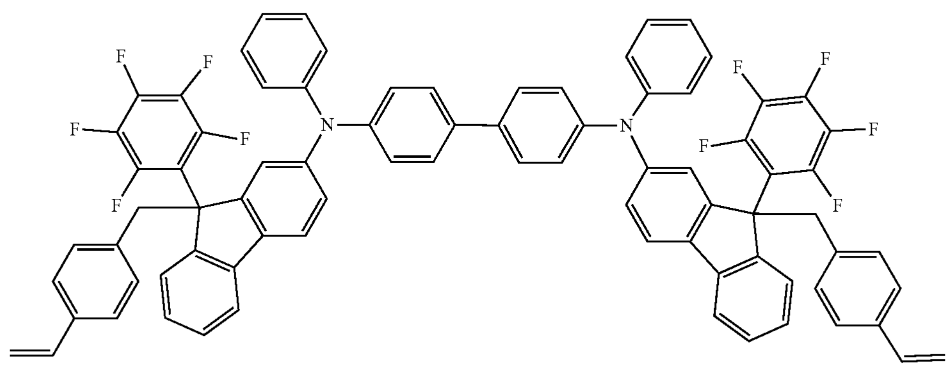
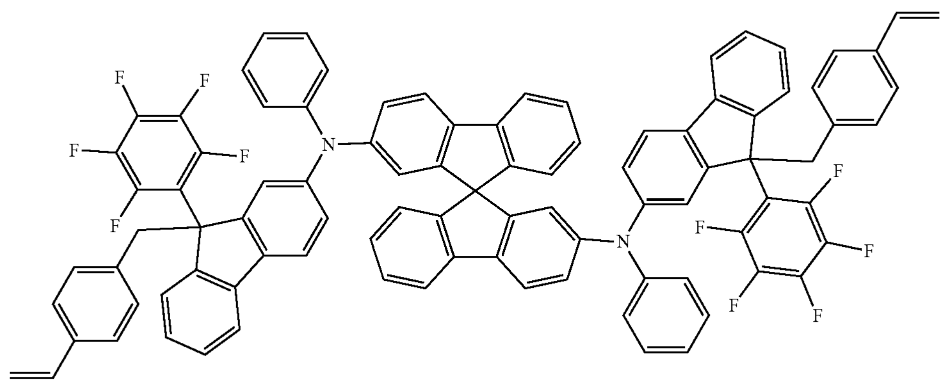

-continued
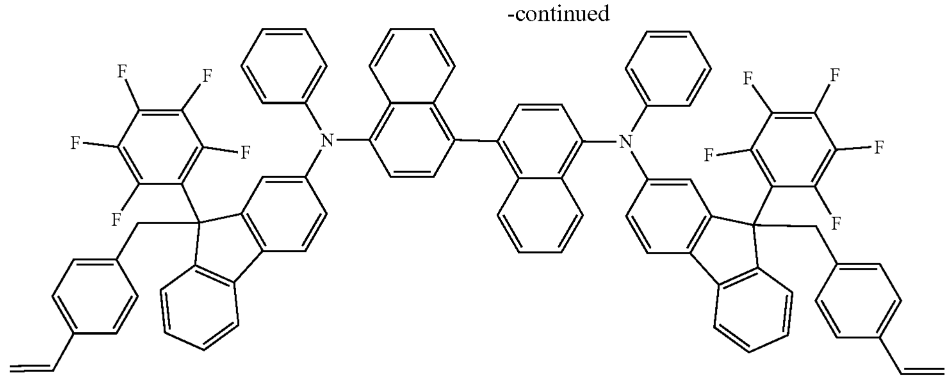
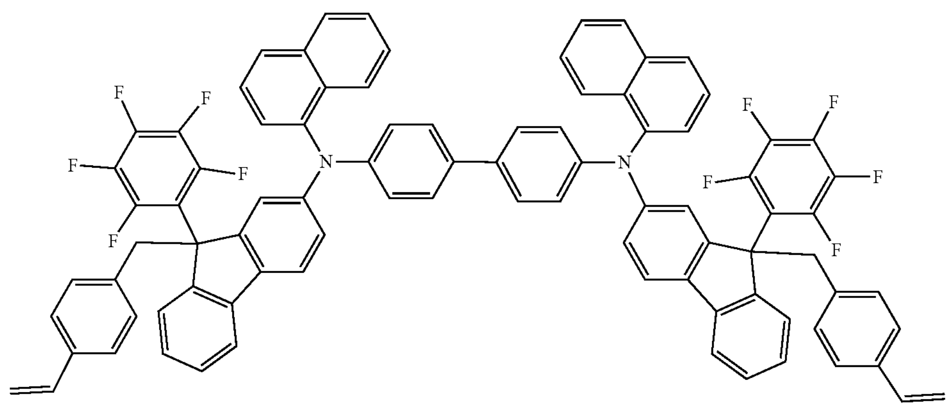
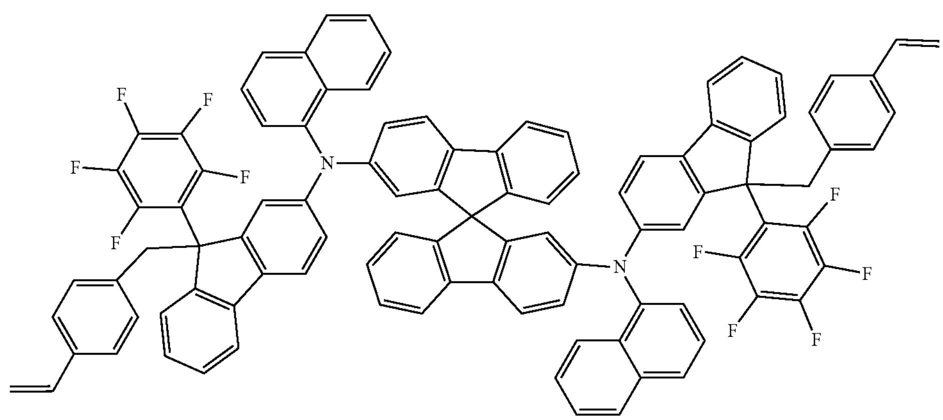 [SMILES: C=Cc1ccc(CC2(c3c(F)c(F)c(F)c(F)c3F)c3ccccc3-c3ccc(N(c4ccc5c(c4)C4(c6ccccc6-5)c5ccccc5-c5ccc(N(c6ccc7c(c6)C(Cc6ccc(C=C)cc6)(c6c(F)c(F)c(F)c(F)c6F)c6ccccc6-7)c6cccc7ccccc67)cc54)c4cccc5ccccc45)cc32)cc1]
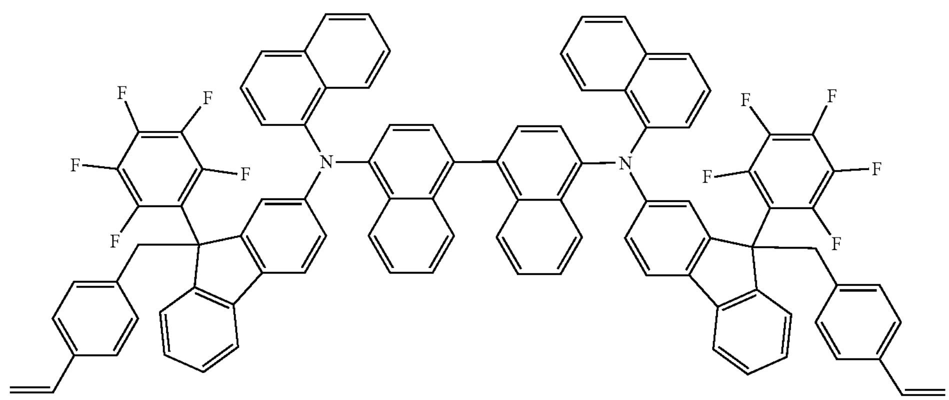

-continued
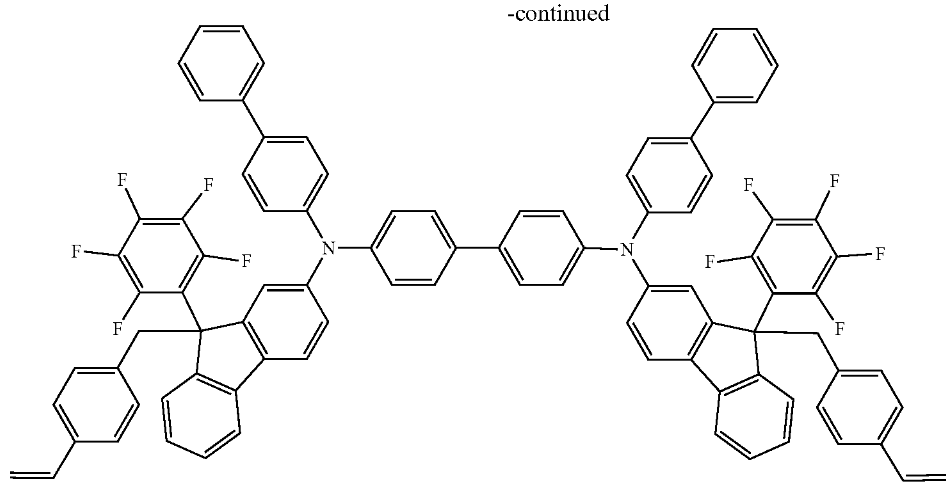
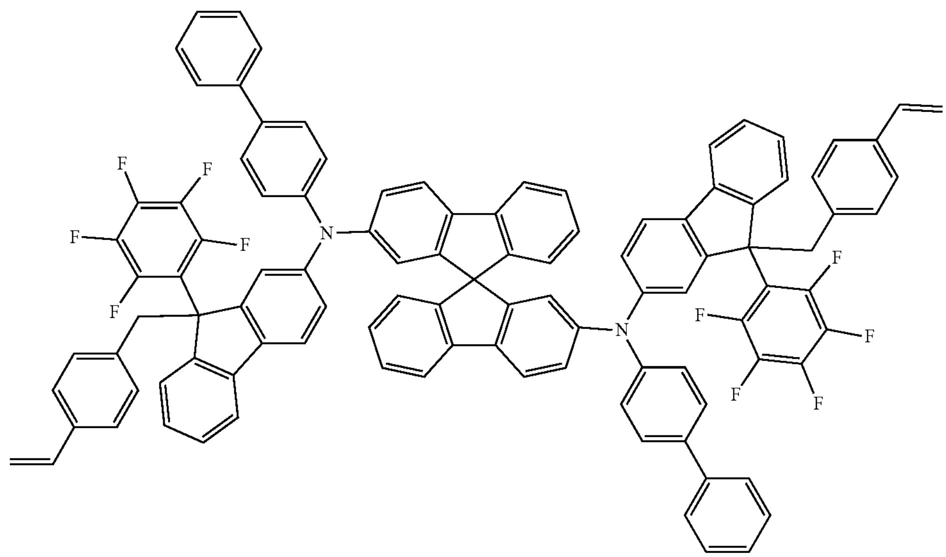
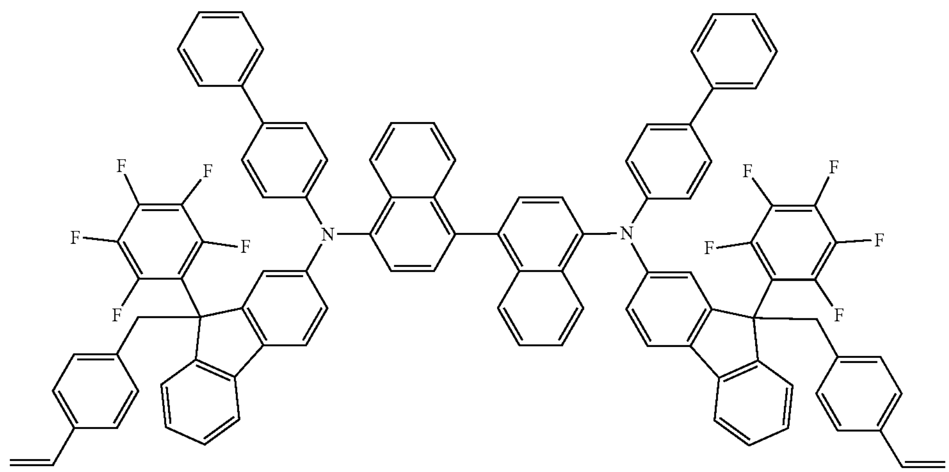

-continued
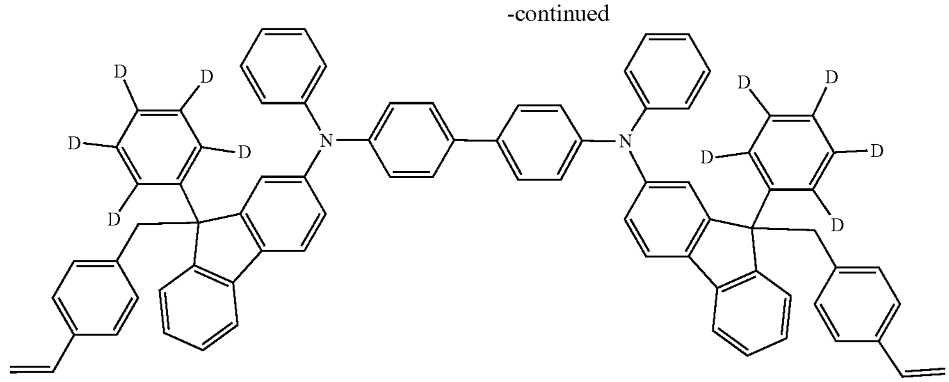
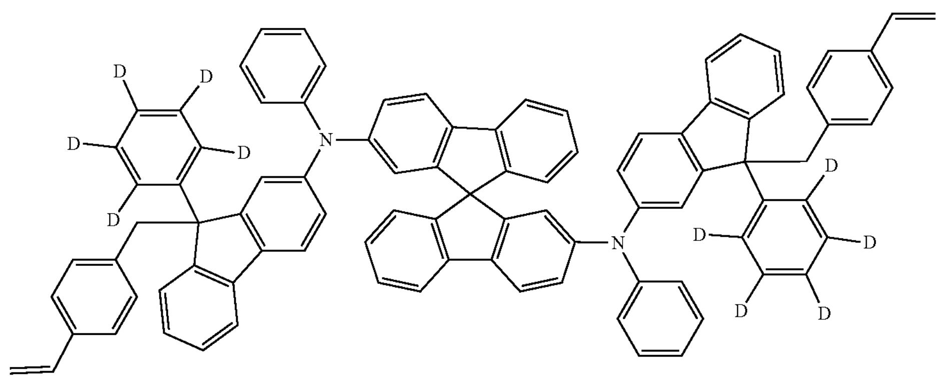
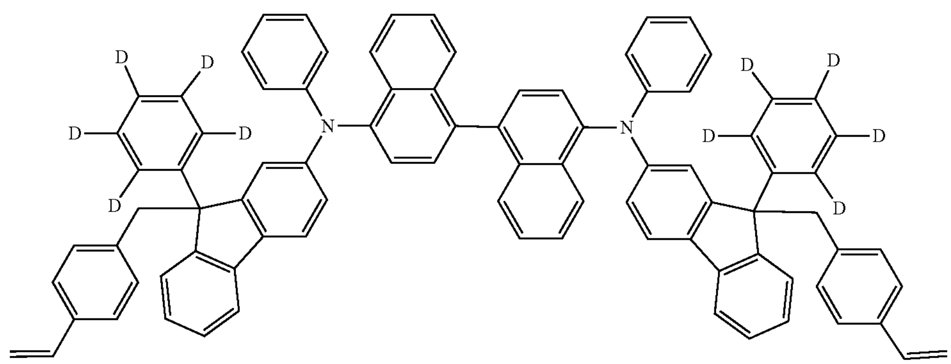
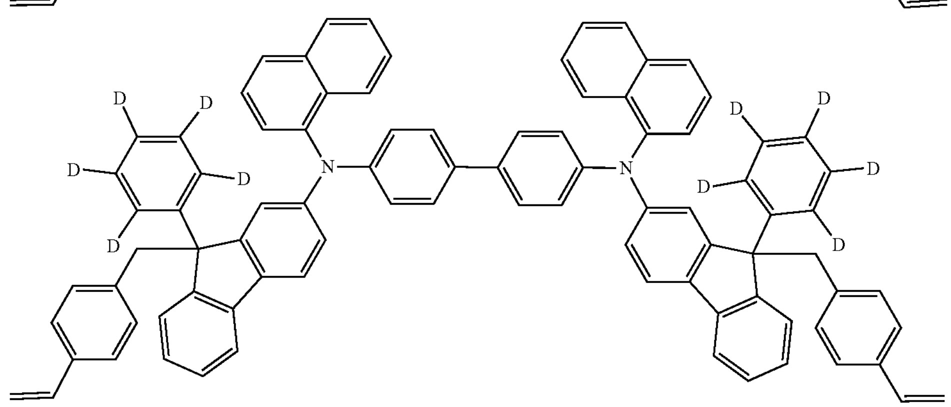

-continued
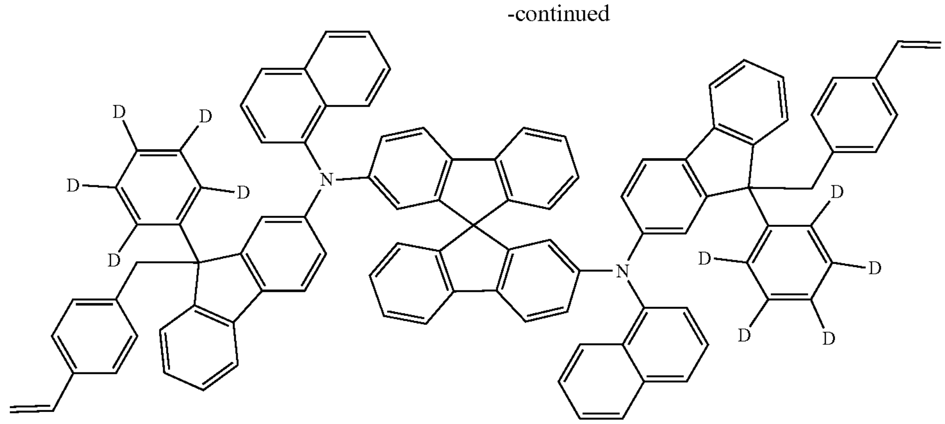
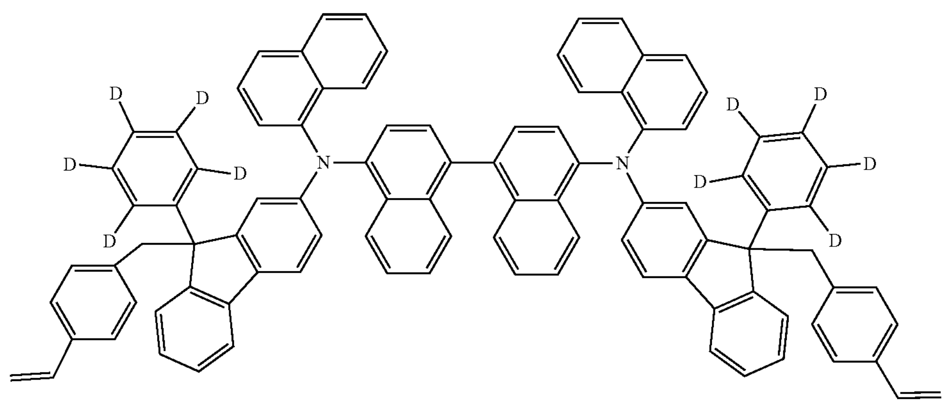
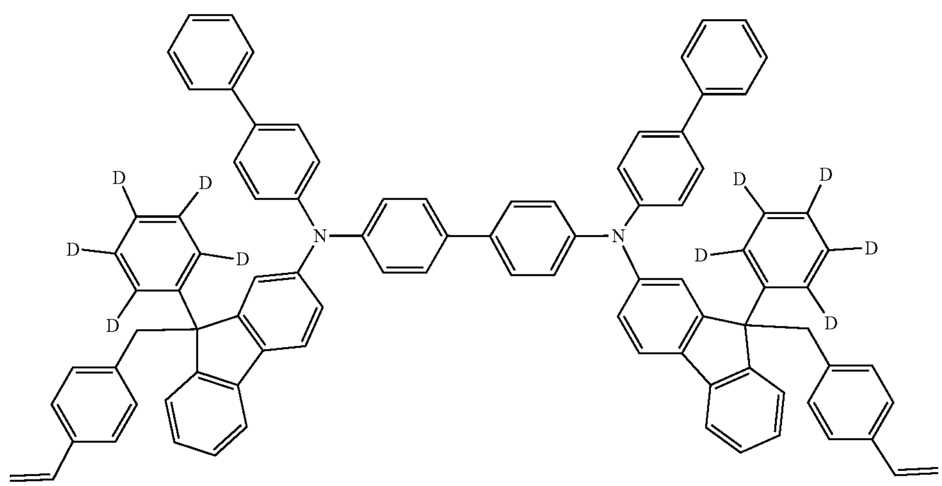

-continued
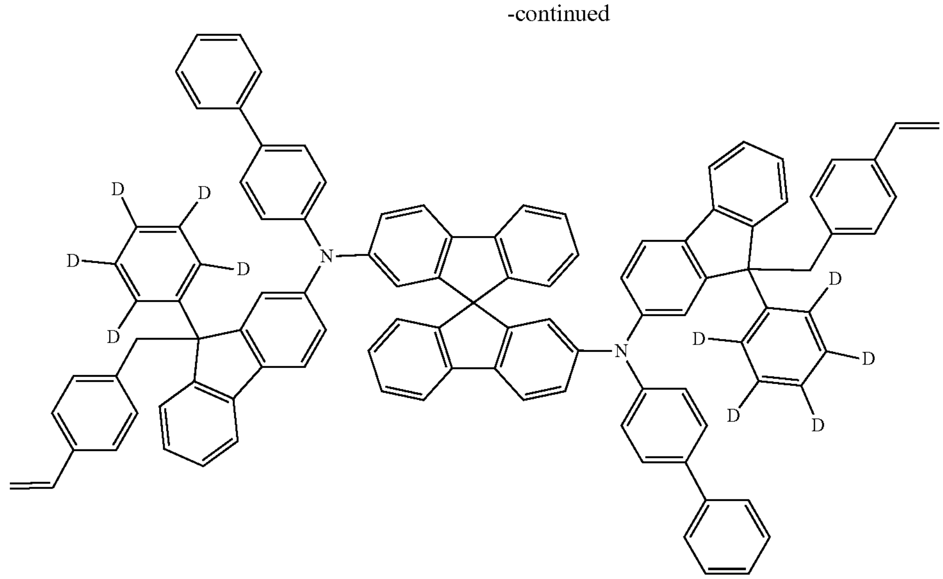
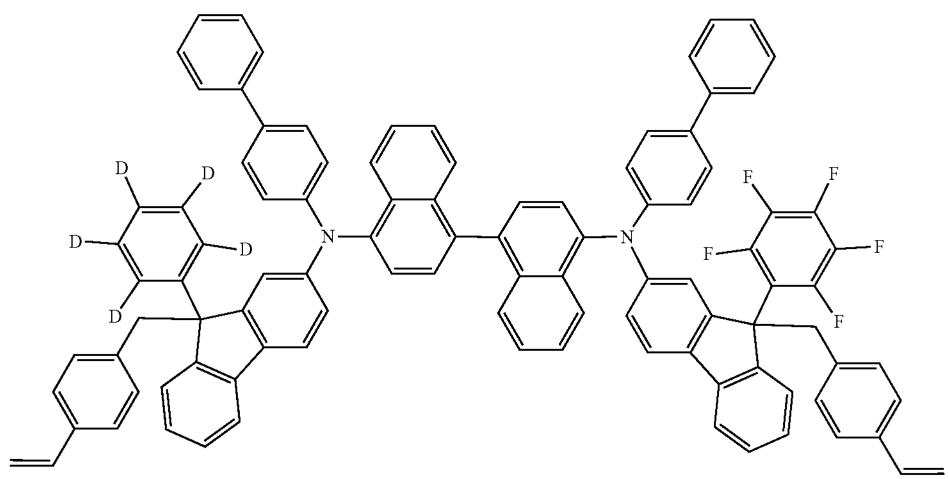
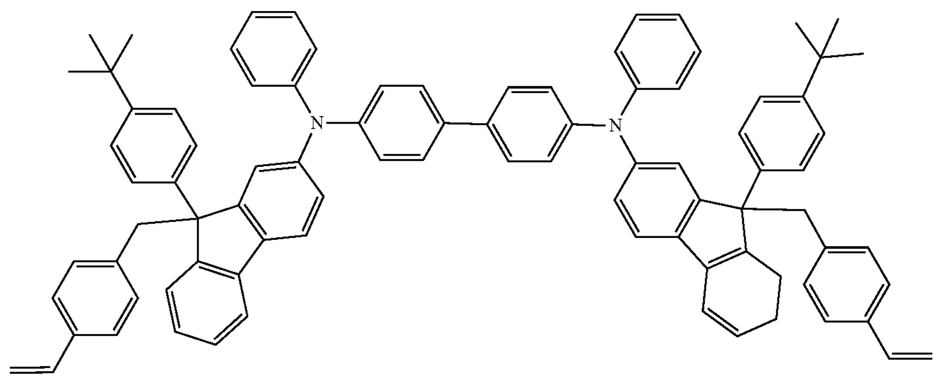

-continued
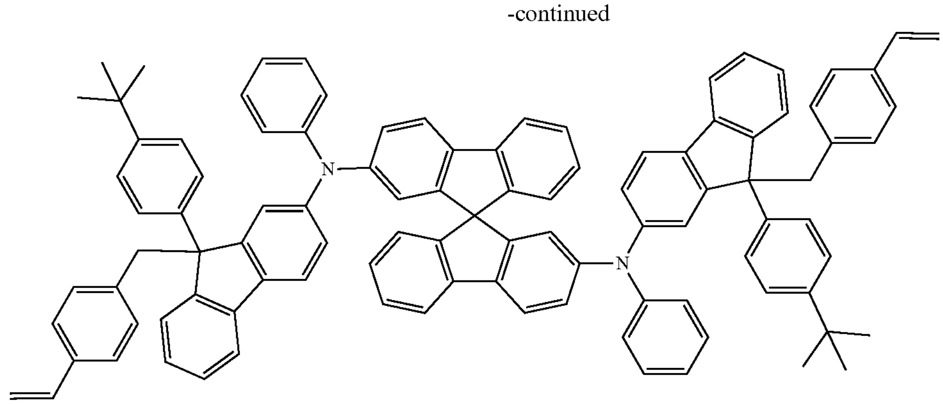
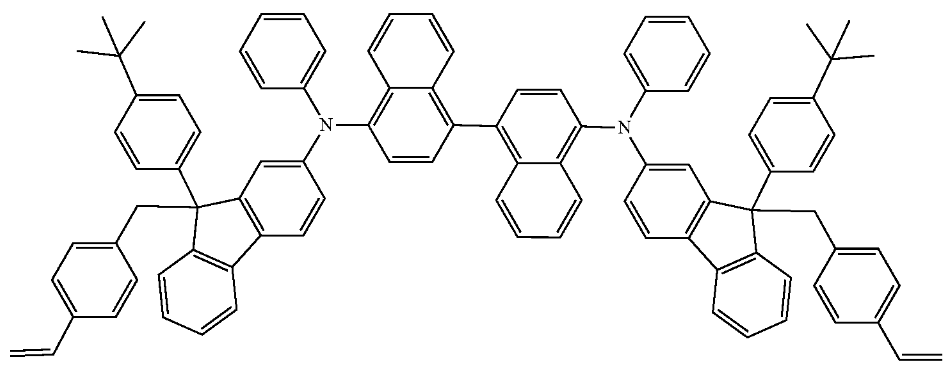
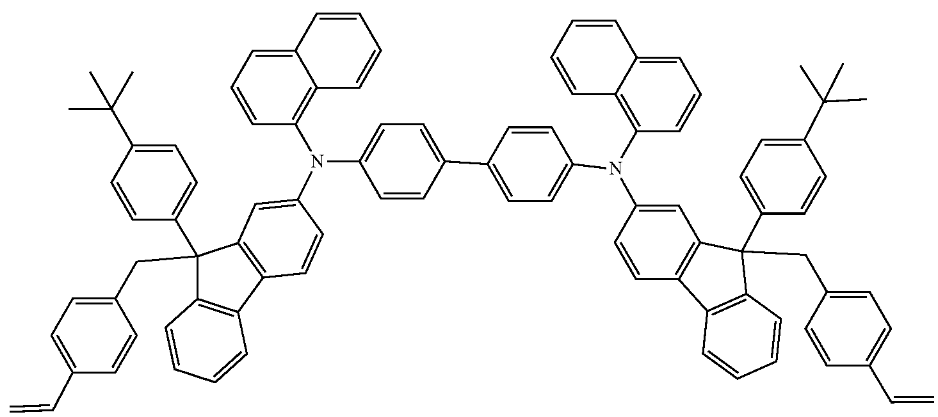
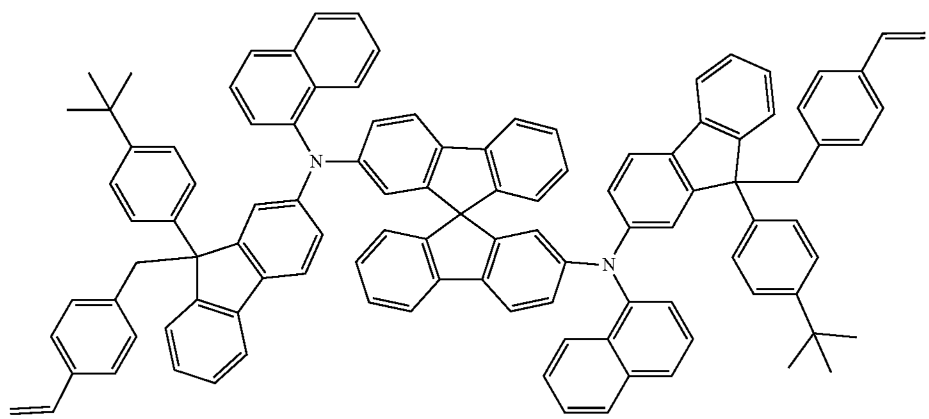

-continued
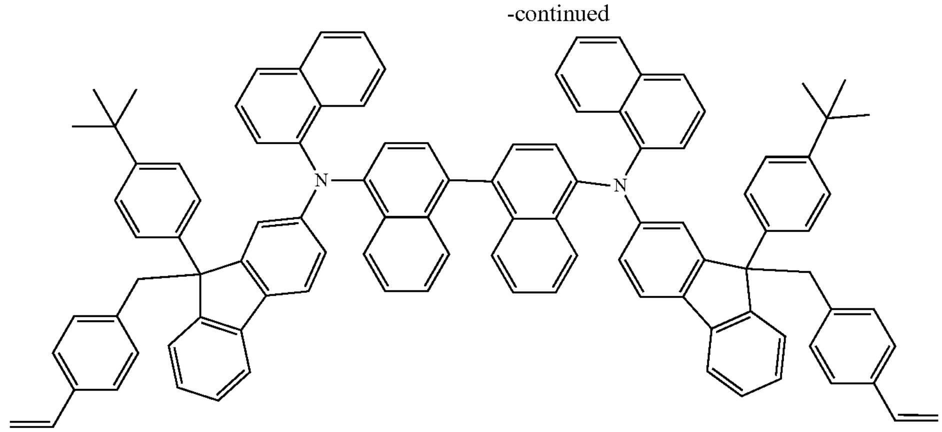
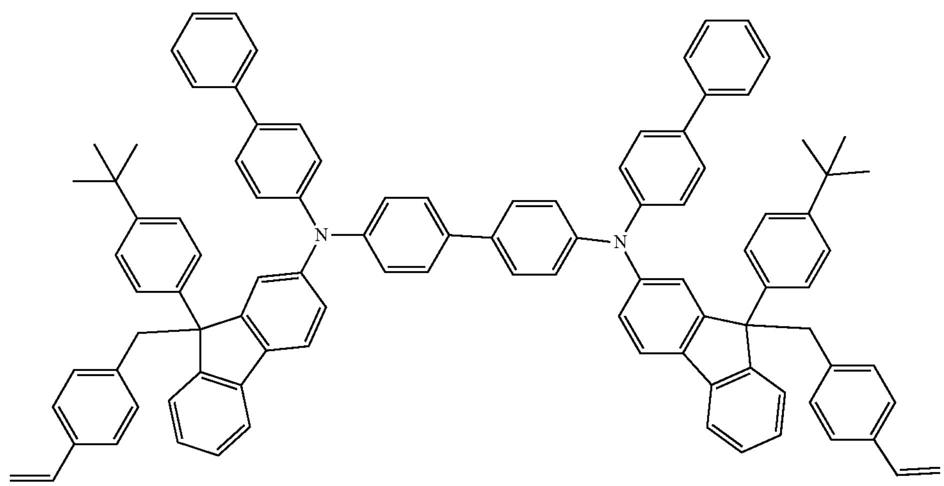
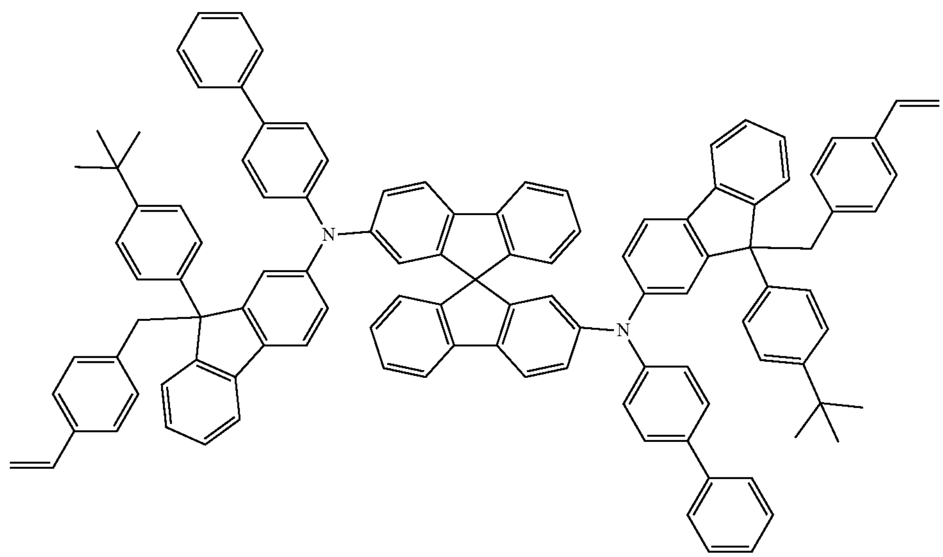

-continued
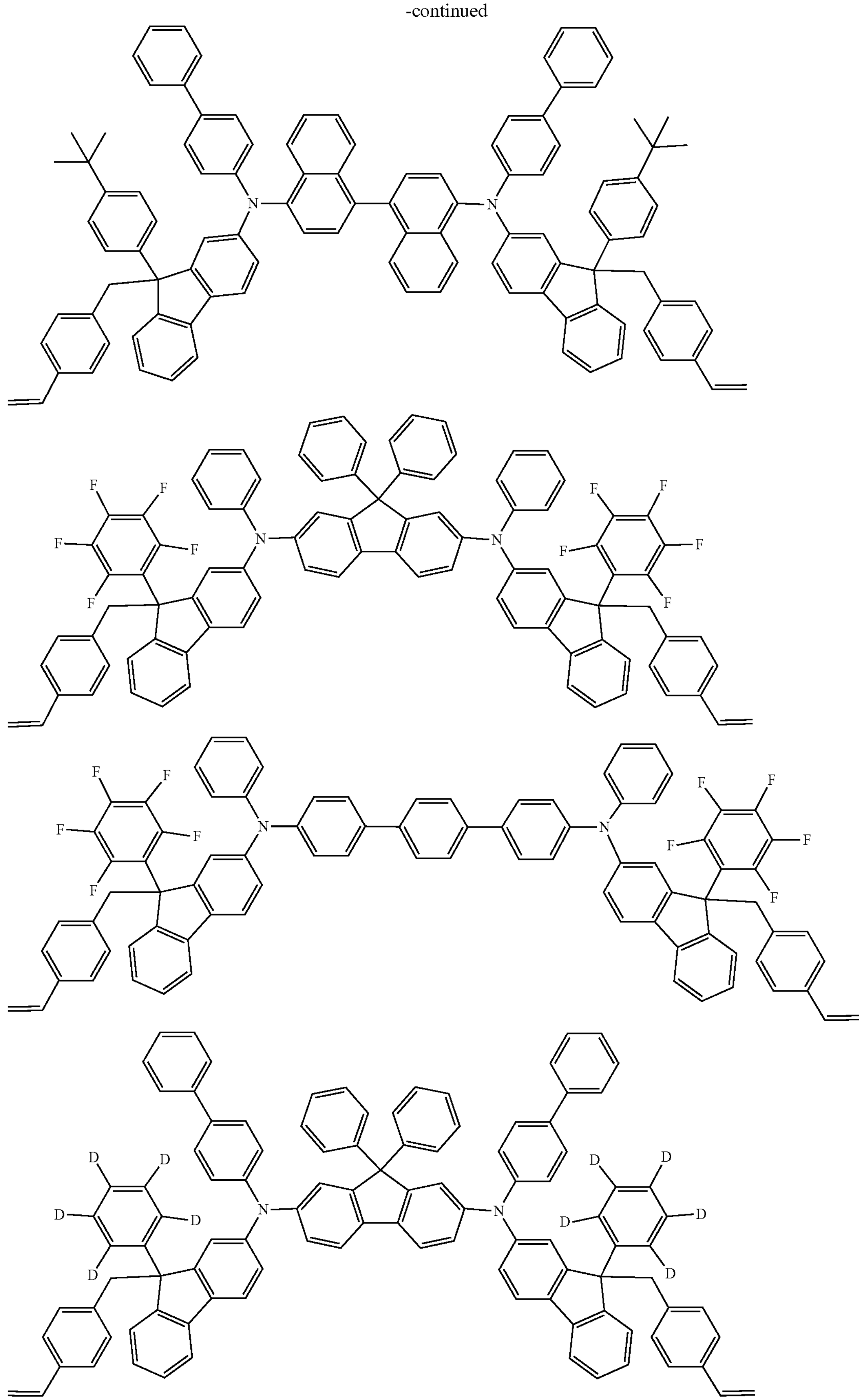

-continued
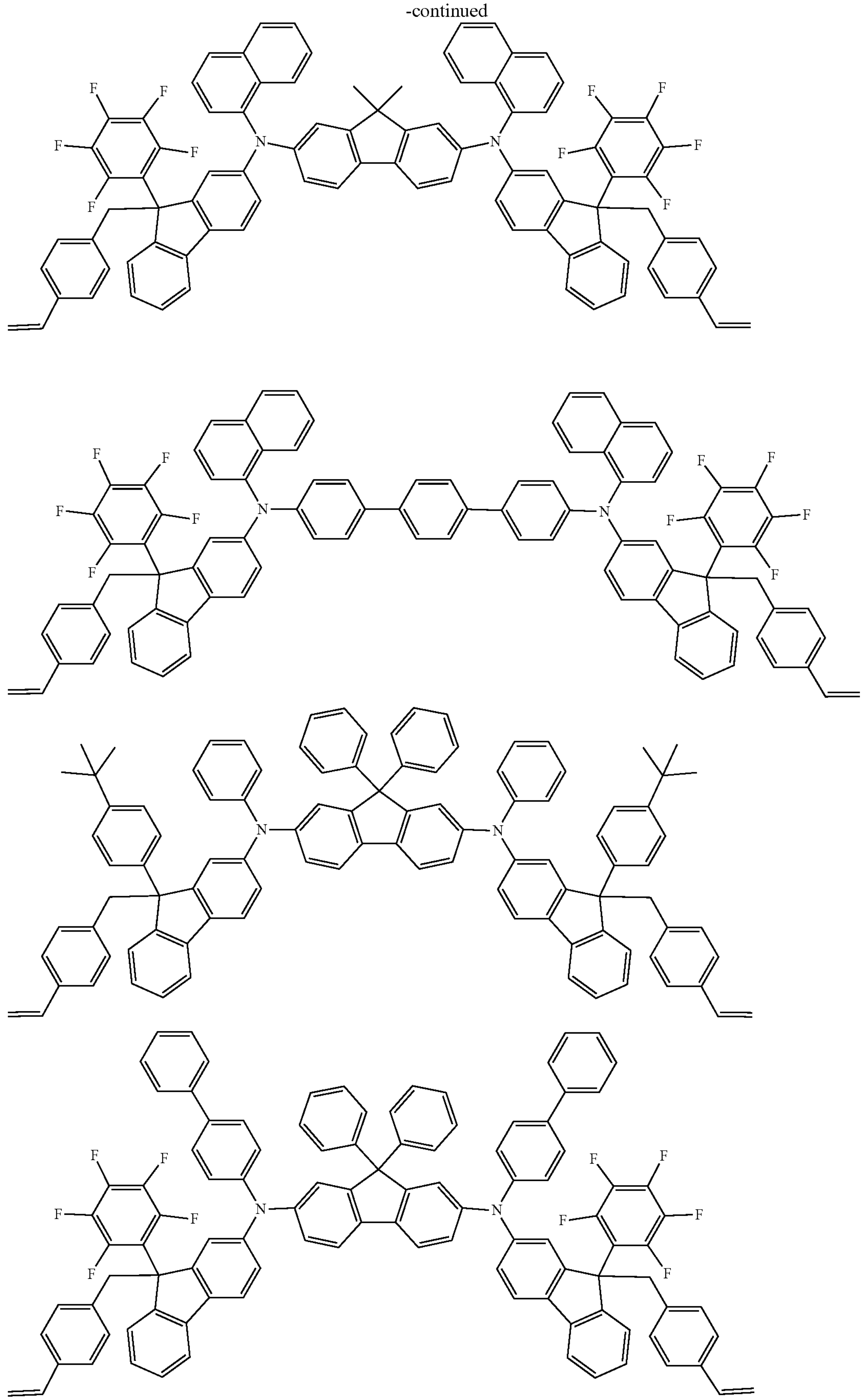

-continued
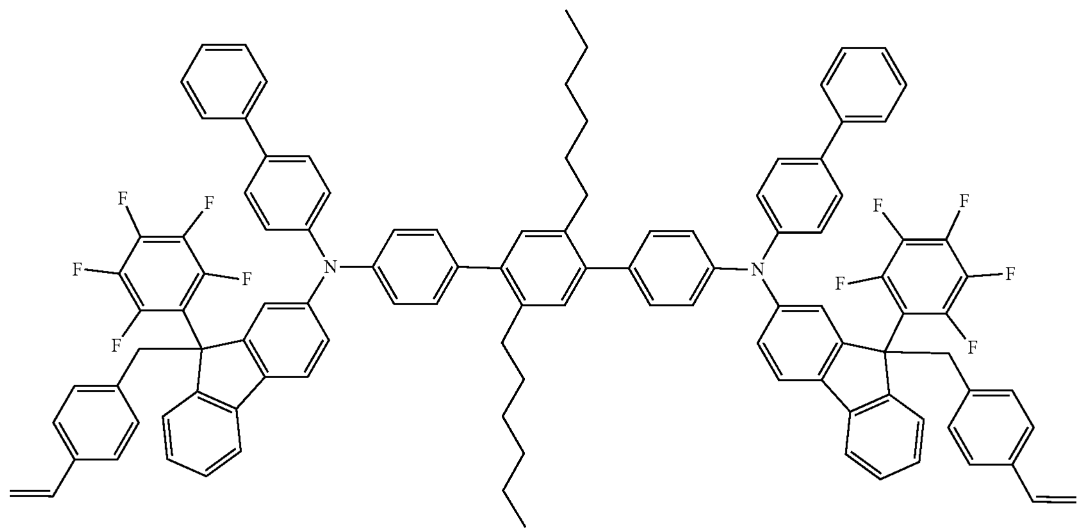
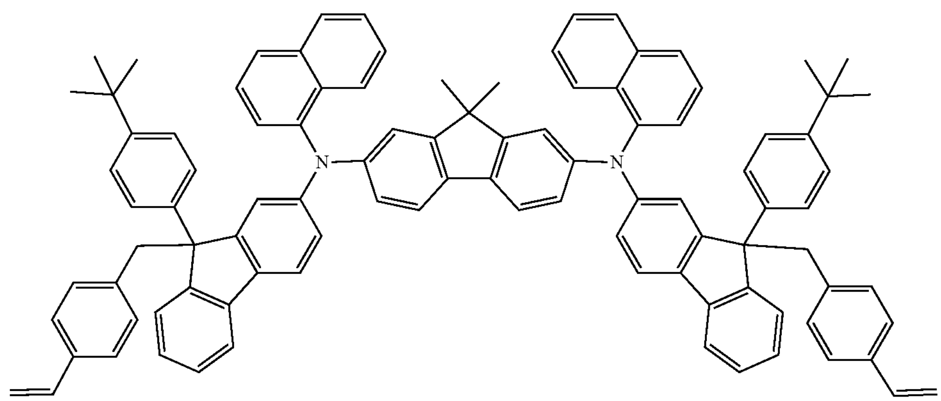
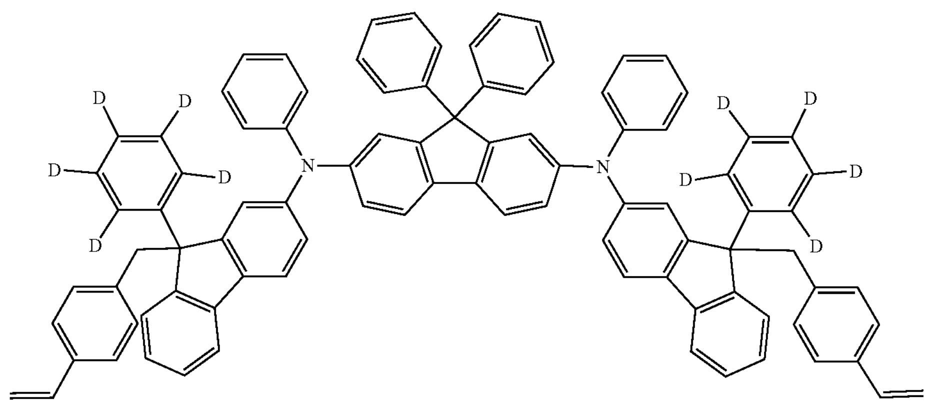
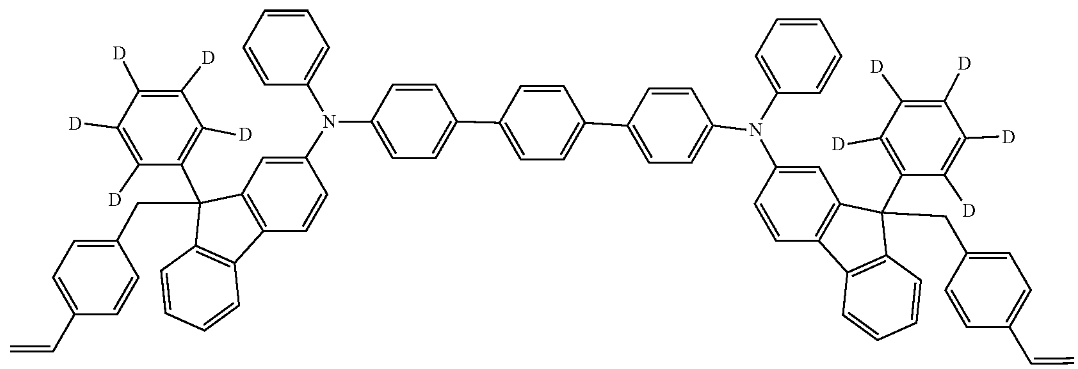

-continued
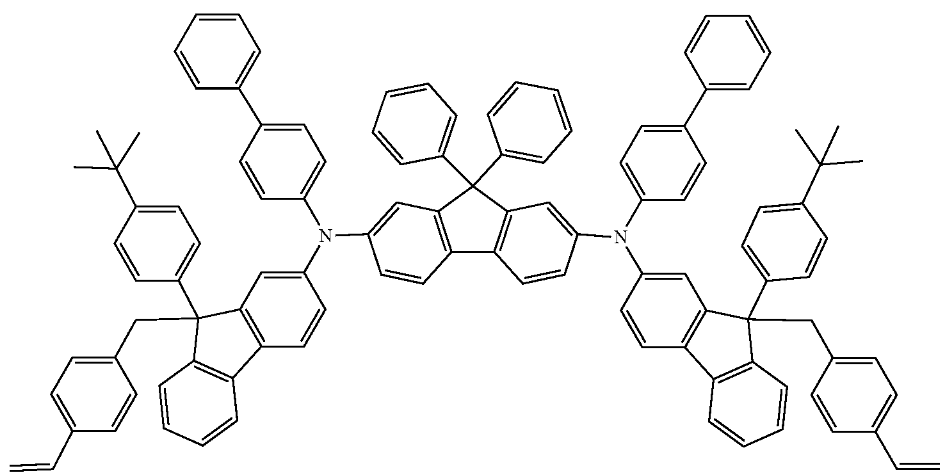
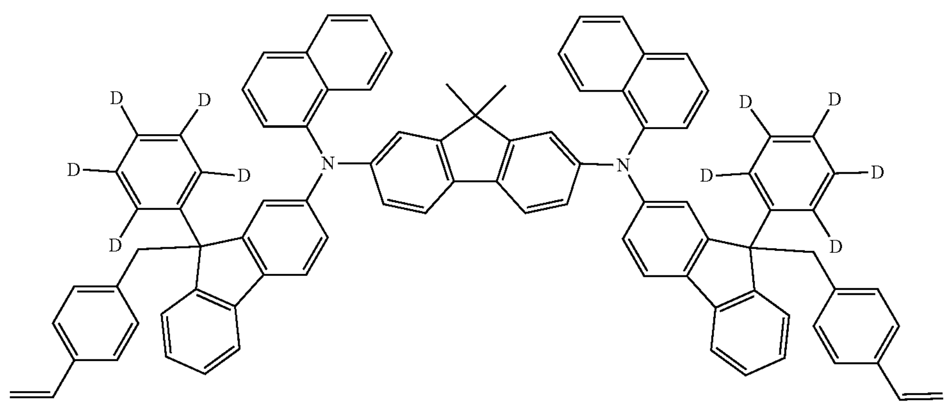
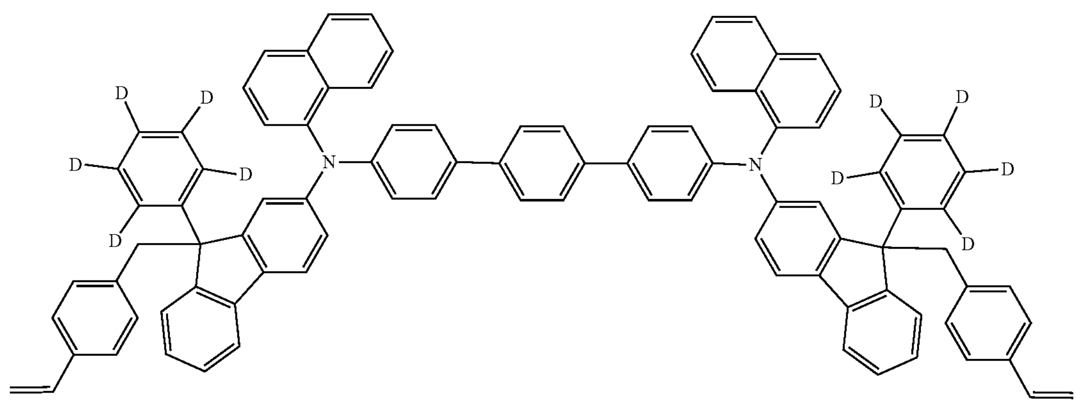

-continued
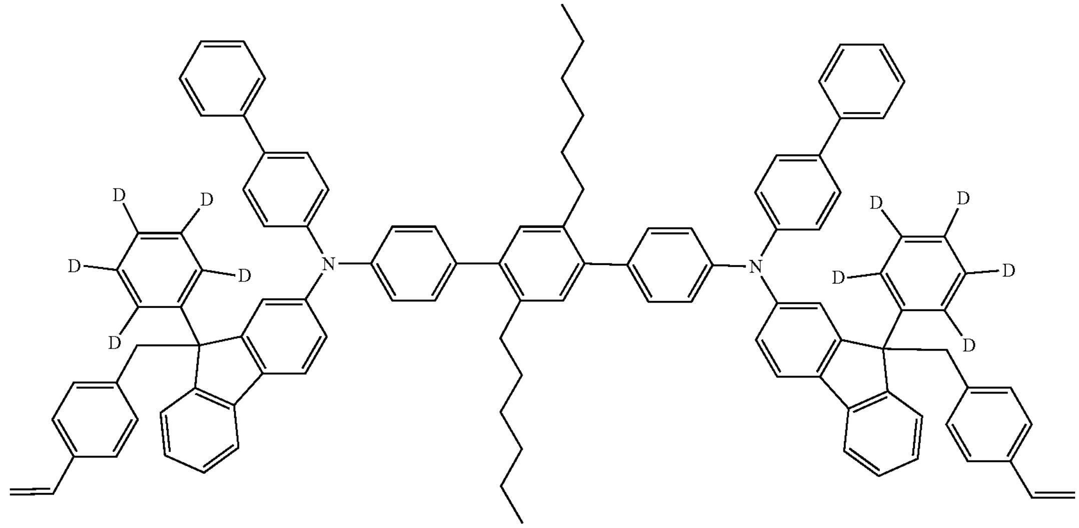
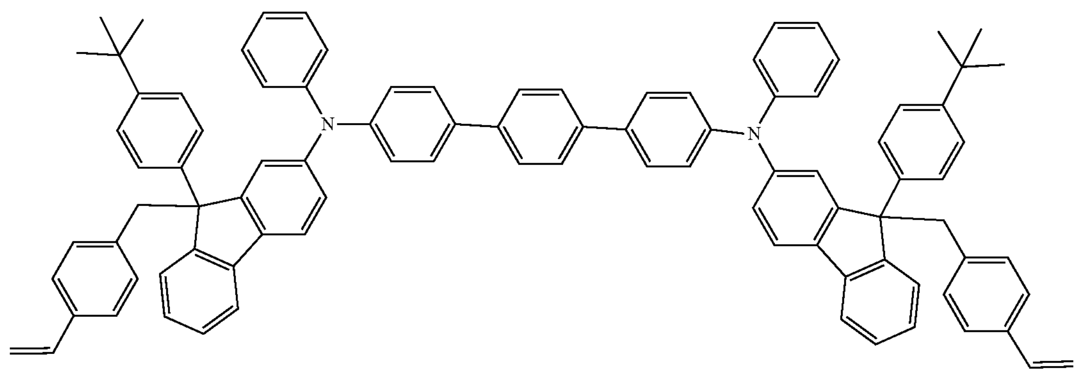
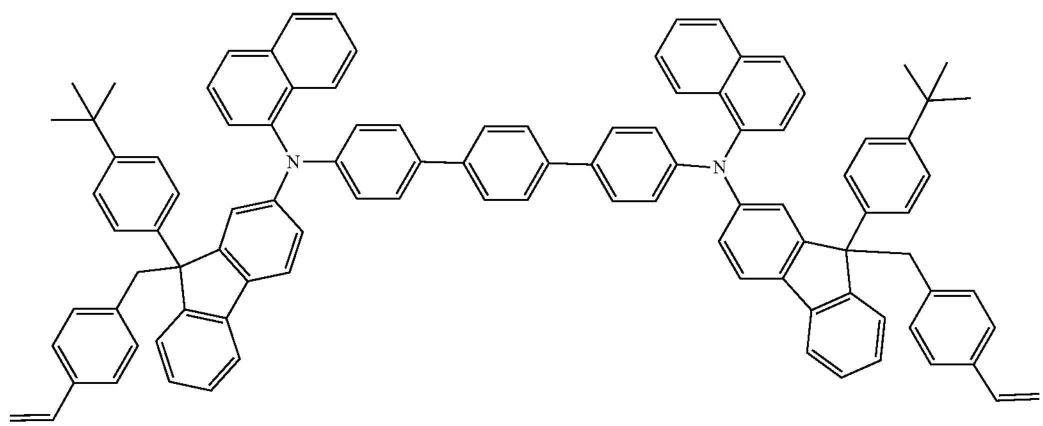

-continued
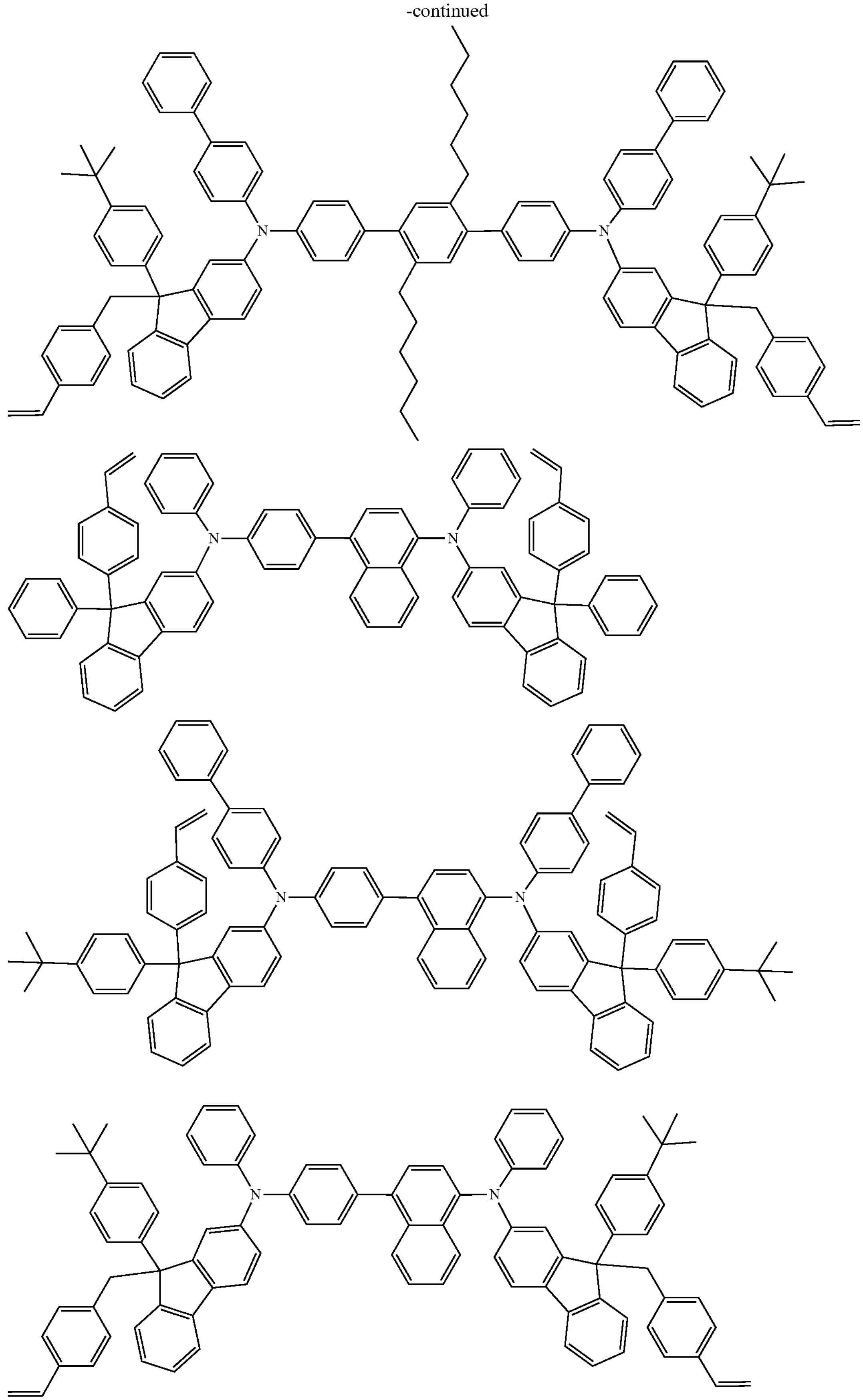

-continued
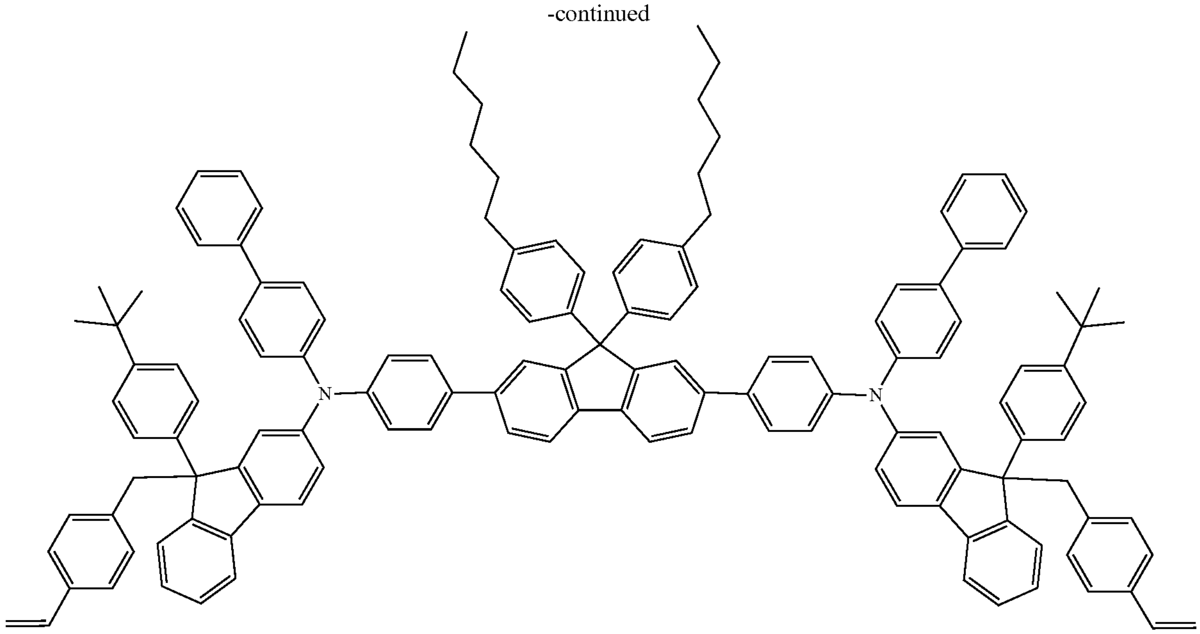
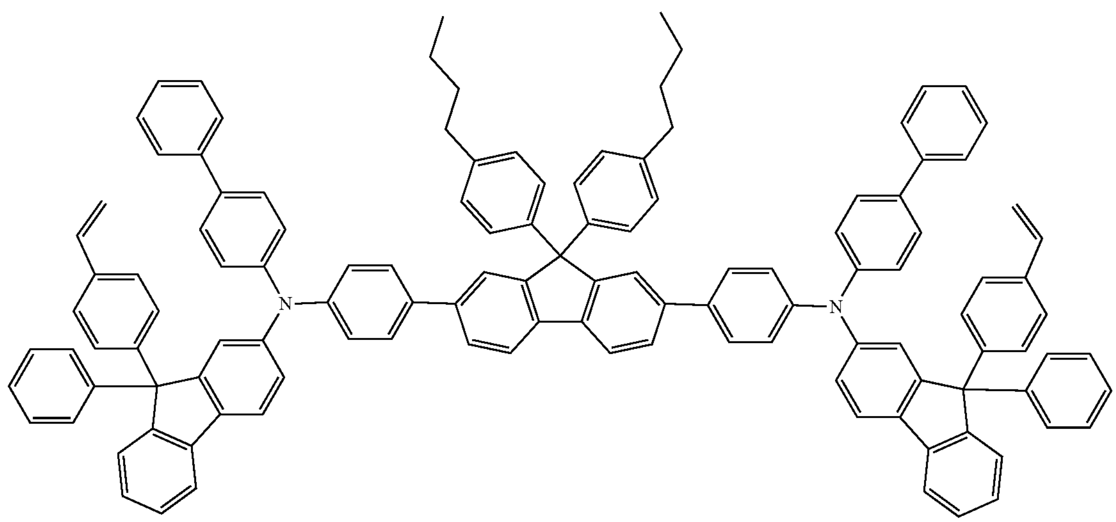

-continued
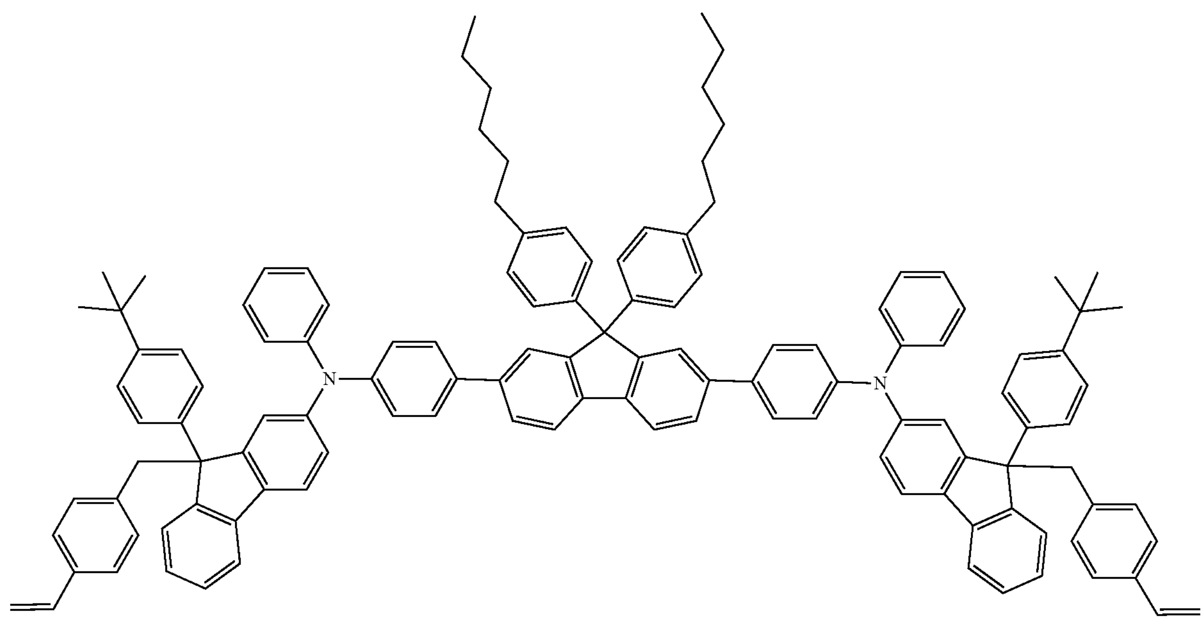
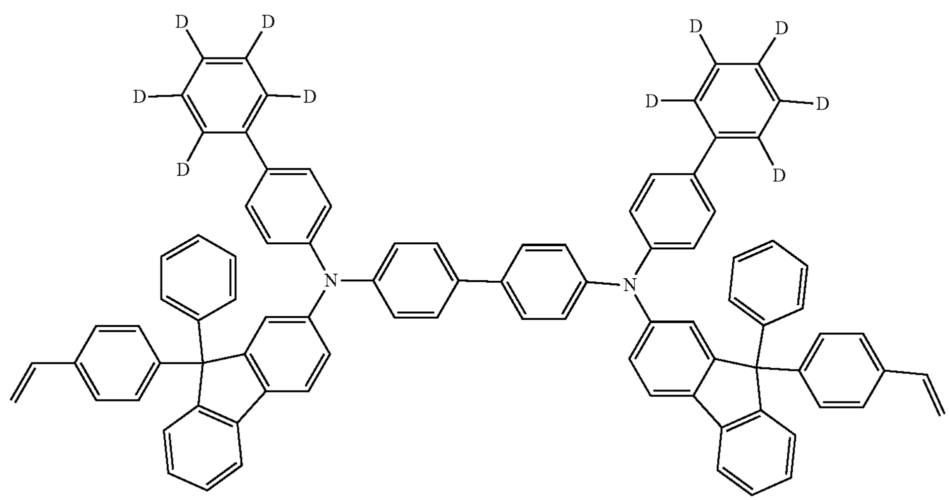

-continued
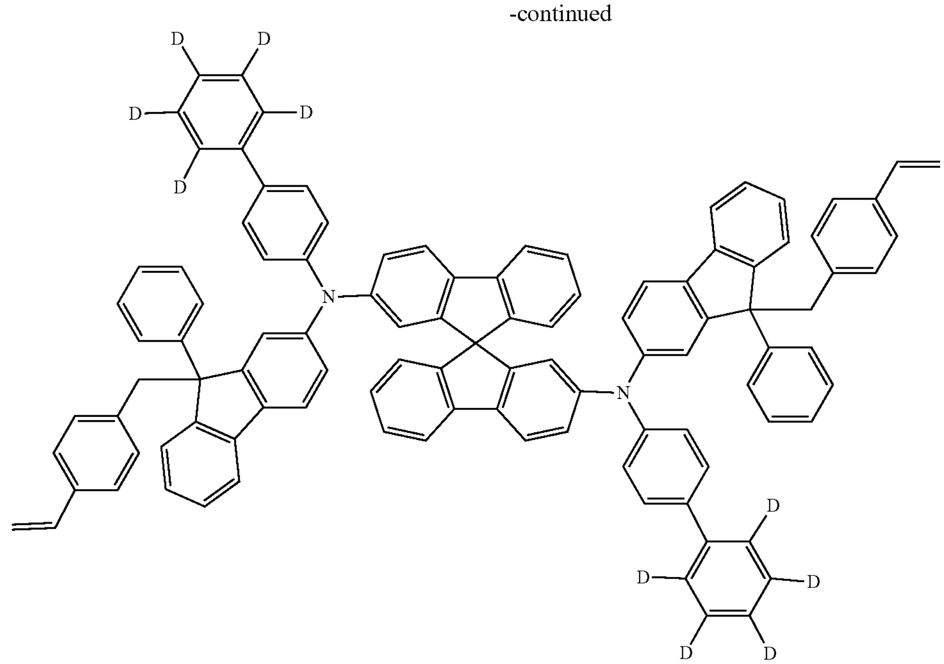
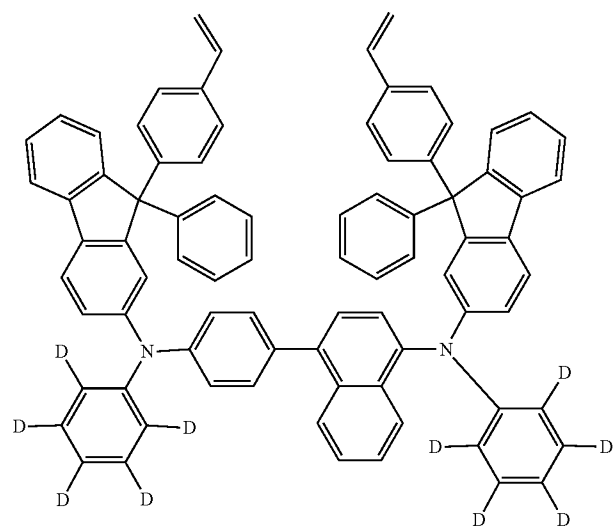

-continued
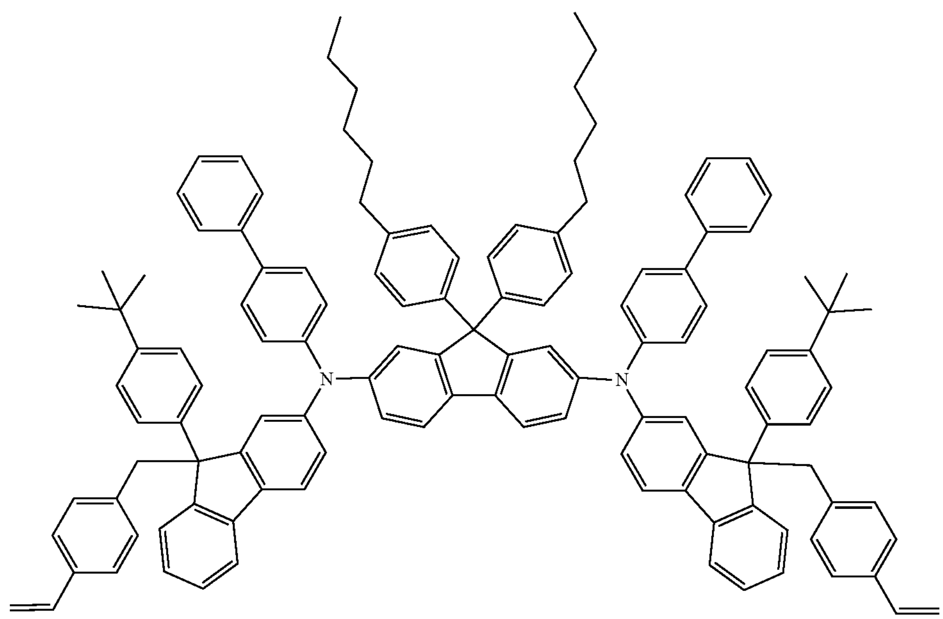
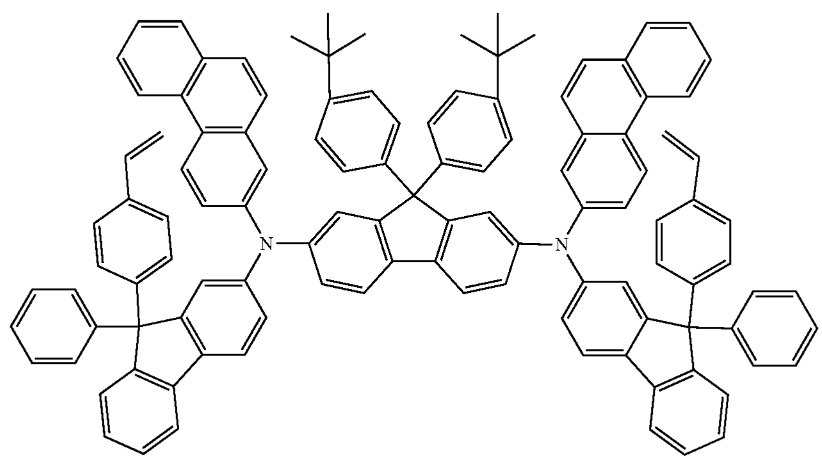
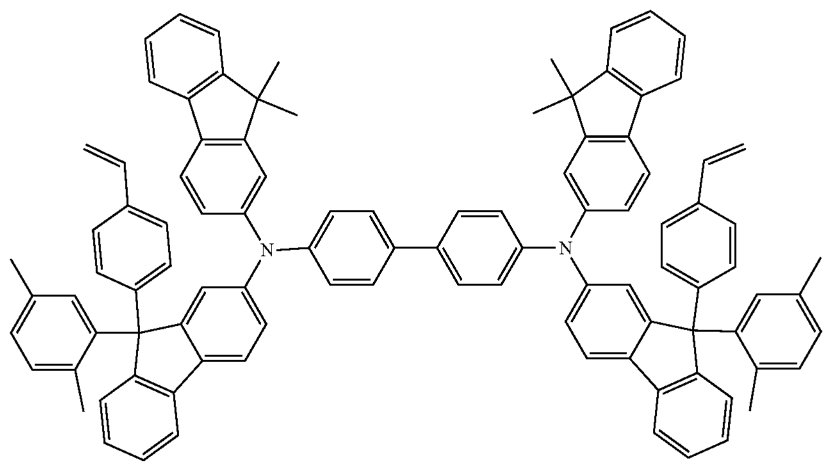

-continued
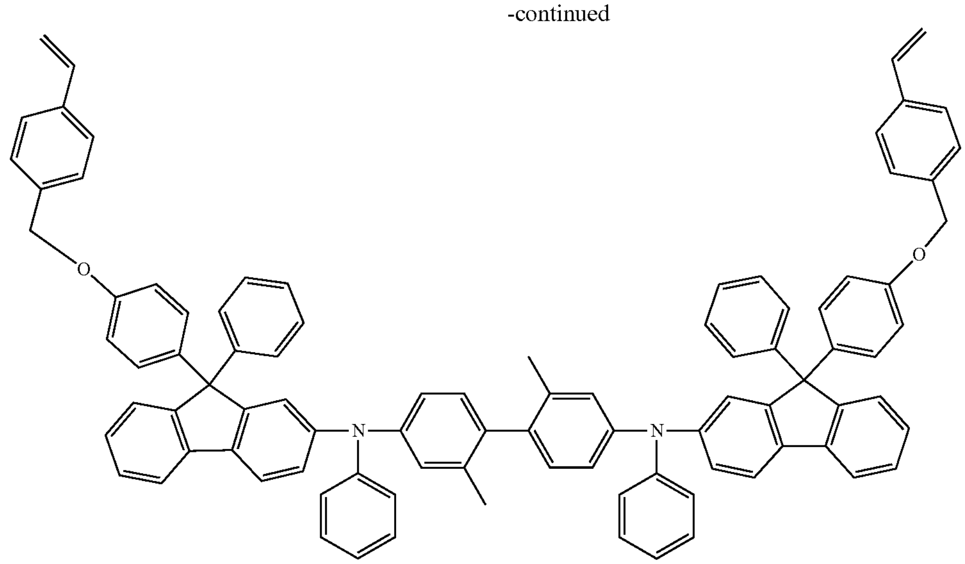
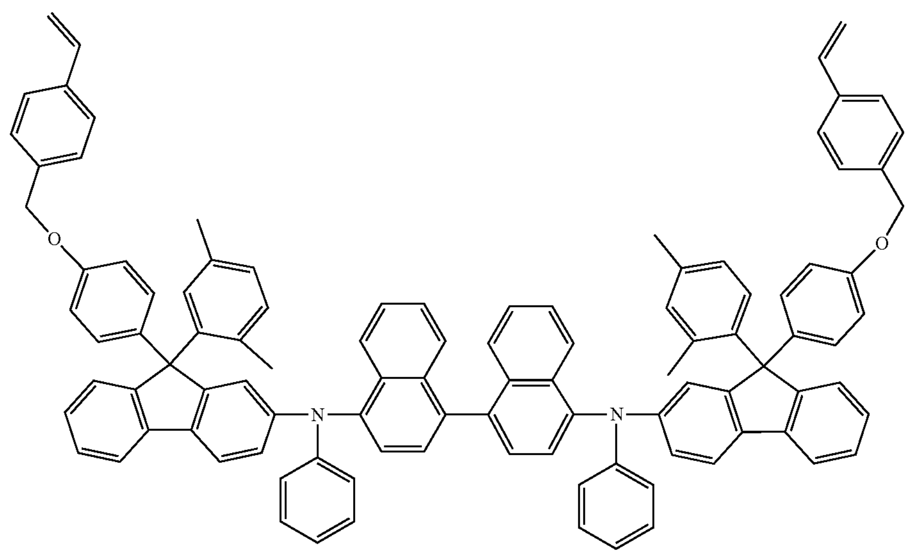
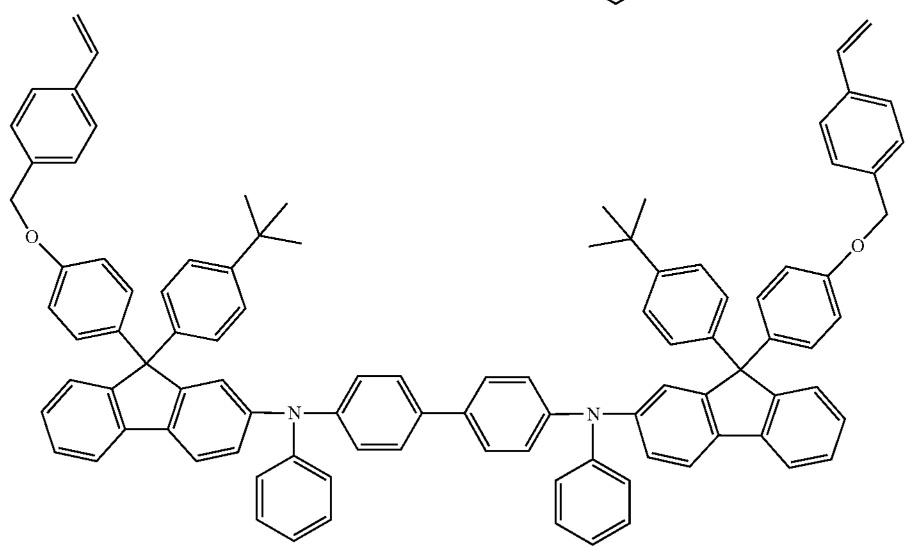

-continued
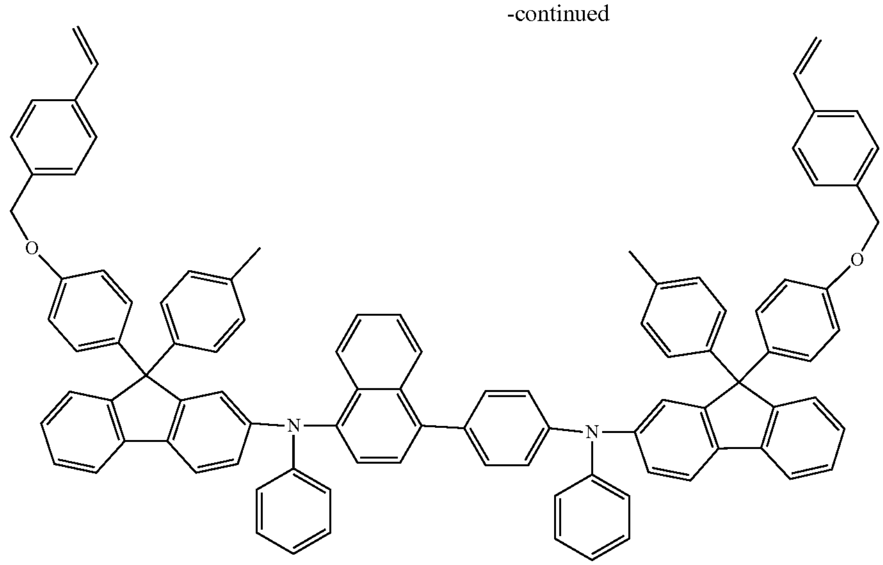
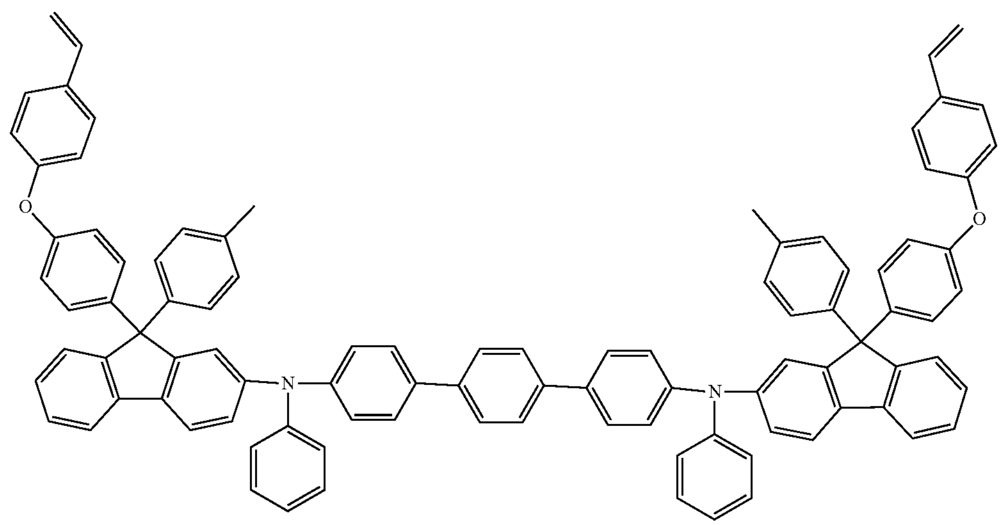
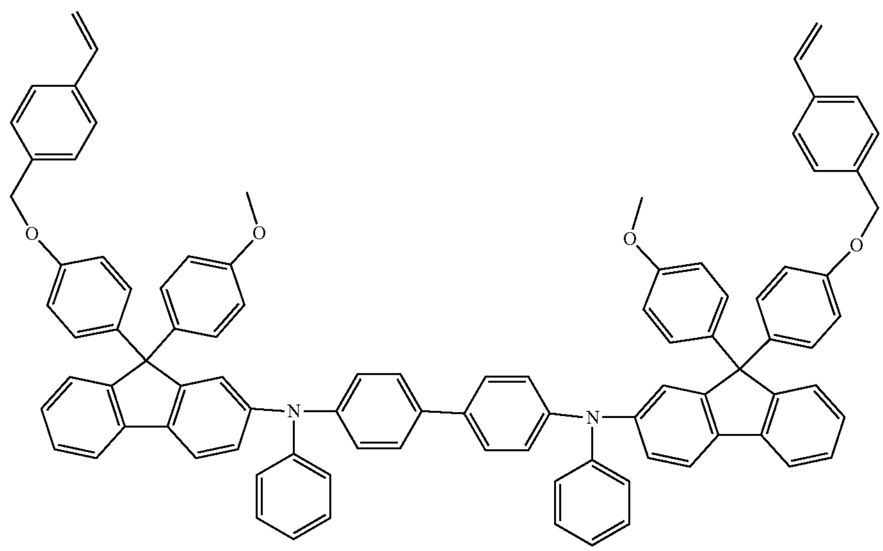

-continued
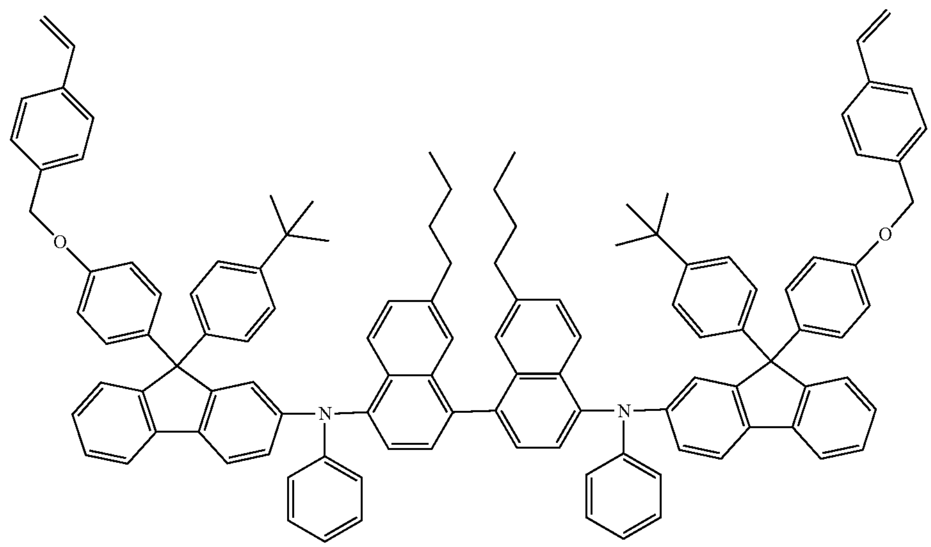
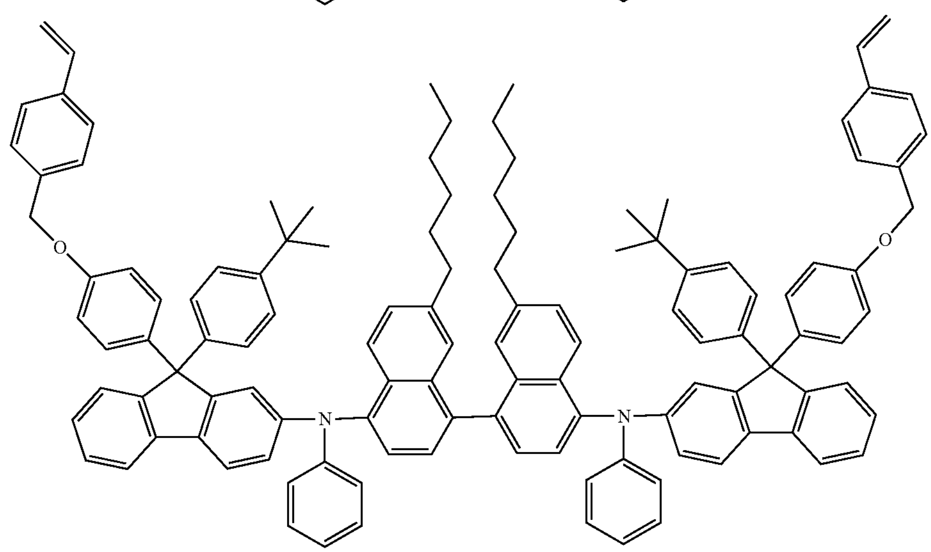
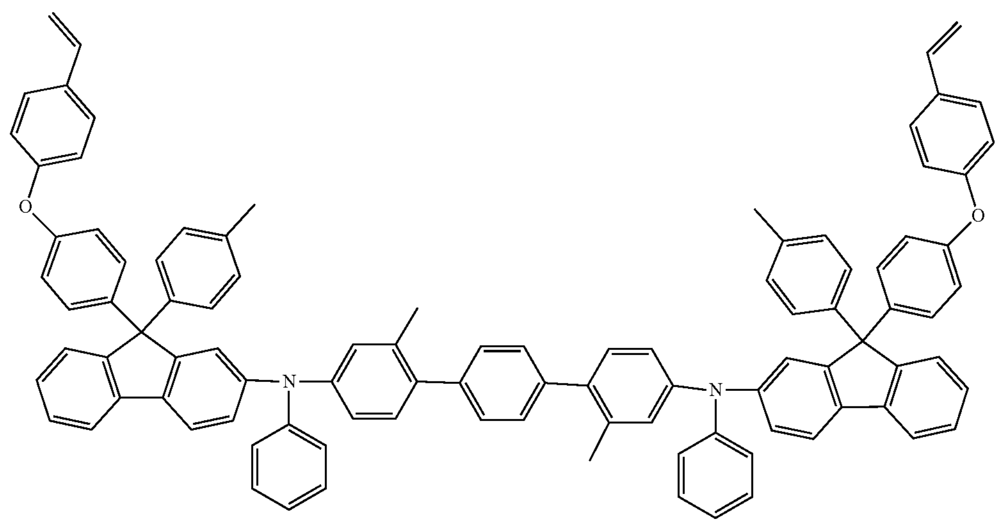

The compound represented by Chemical Formula 1 may be at least 10% deuterated. Preferably, the compound represented by Chemical Formula 1 may be at least 20%, at least 30%, at least 40%, at least 50%, at least 60%, at least 70%, at least 80%, at least 90%, or 100% deuterated.

According to another embodiment, there is provided a method for preparing a compound represented by Chemical Formula 1, as shown in the following Reaction Scheme 1:

[Reaction Scheme 1]

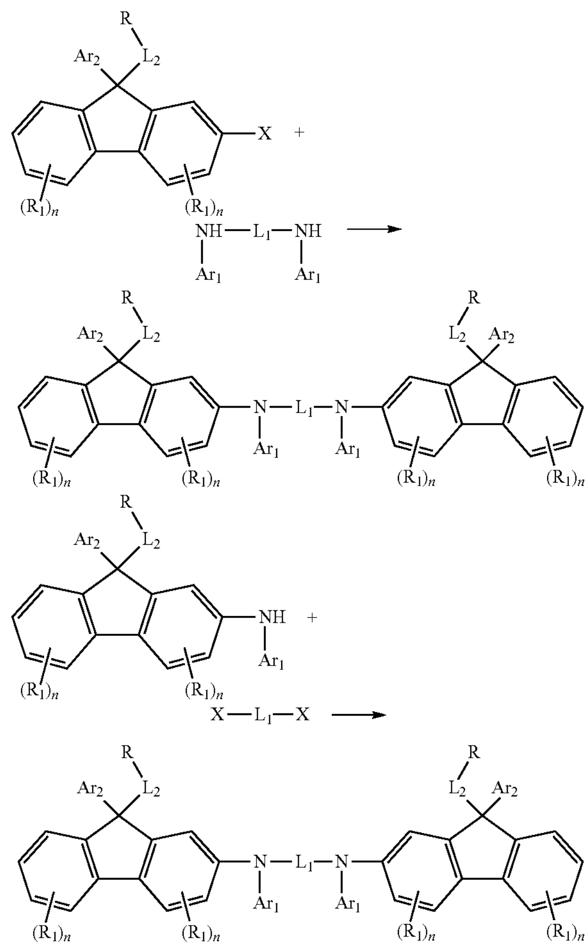

in the Reaction Schemes 1, the definition of the remaining substituents except for X is the same as defined above, and X is halogen, and more preferably, chloro or bromo. The reaction is an amine substitution reaction which is preferably carried out in the presence of a palladium catalyst and a base, and a reactive group for the amine substitution reaction can be changed as known in the art. The above preparation method may be further embodied in the Preparation Examples described hereinafter.

In addition, the hole injection layer according to the present disclosure may further include a compound represented by the following Chemical Formula 3:

[Chemical Formula 3]

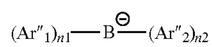

in the Chemical Formula 3, n1 and n2 are each independently an integer of 1 to 3, provided that n1+n2 is 4, Ar"$_1$ is

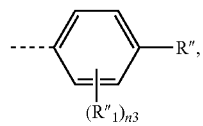

R" is a photo-curable group; or a thermo-curable group, each R"$_1$ is independently hydrogen, halogen, or $C_{1-60}$ haloalkyl, n3 is an integer from 1 to 4, Ar"$_2$ is

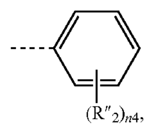

each R"$_2$ is independently hydrogen, halogen, $C_{1-60}$ haloalkyl, a photo-curable group, or a thermo-curable group, and n4 is an integer of 1 to 5.

Preferably, as for the photo-curable group; or the thermo-curable group of R", the contents concerning R defined in Chemical Formula 1 above may be applied.

Preferably, each R"$_1$ is independently hydrogen, fluoro, or $CF_3$.

Preferably, Ar"$_1$ is any one selected from the group consisting of the following:

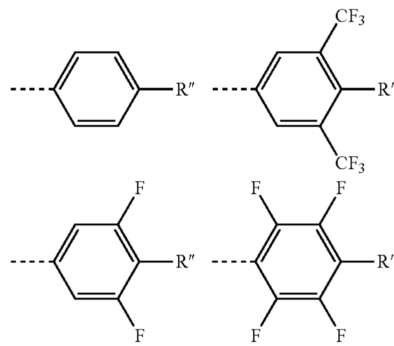

wherein, R" is as defined above.

Preferably, each R"$_2$ is independently hydrogen, fluoro, $CF_3$, $CF(CF_3)_2$, $CF_2CF_2CF_2CF_3$, a photo-curable group, or a thermo-curable group. In this case, as for the photo-curable group, or the thermo-curable group, the contents concerning R defined in Chemical Formula 1 above may be applied.

Preferably, Ar"$_2$ is any one selected from the group consisting of the following:

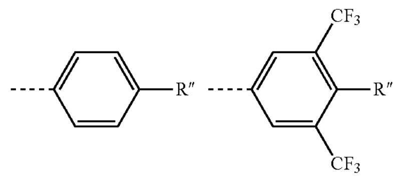

-continued
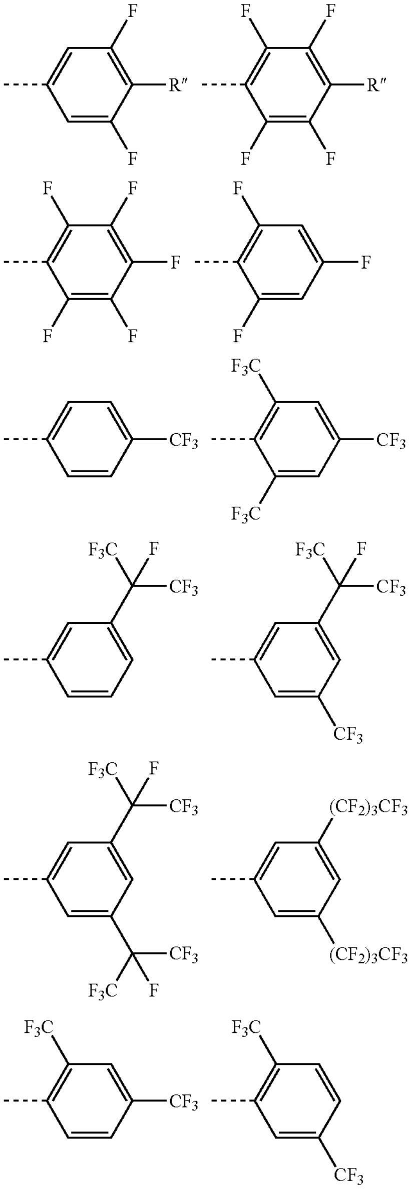
wherein, R" is as defined above.
Representative examples of the compound represented by Chemical Formula 3 are as follows:
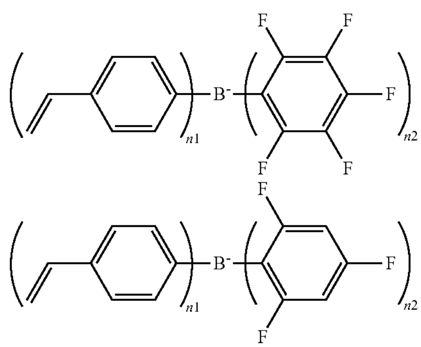
-continued
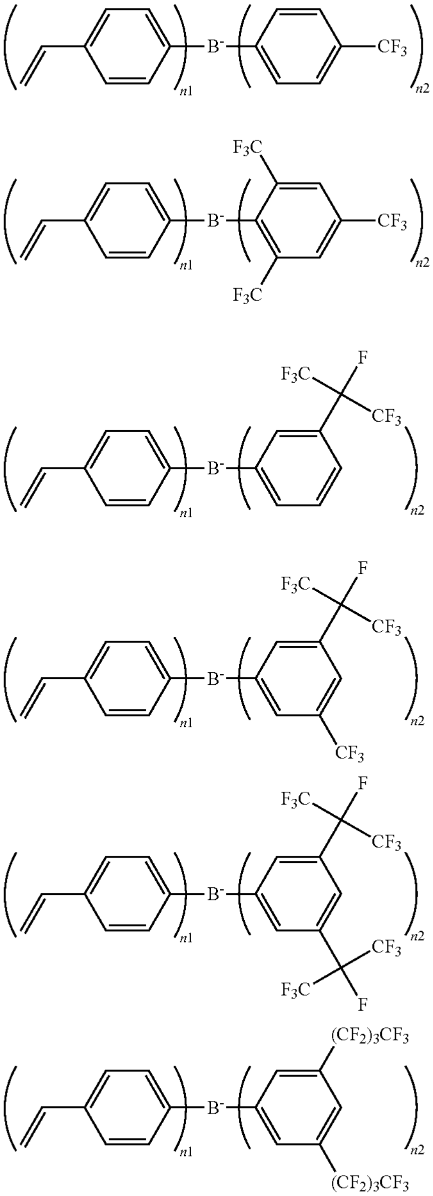
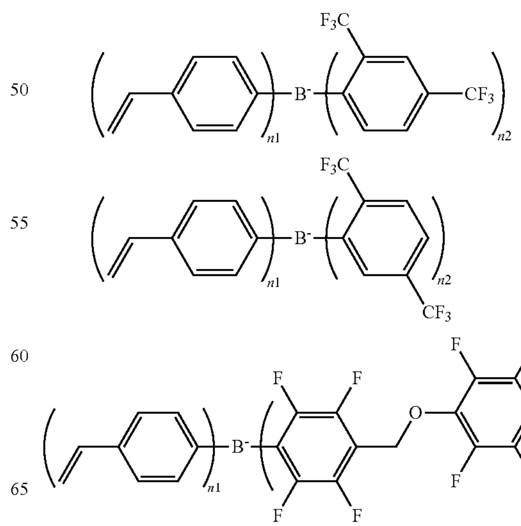

-continued
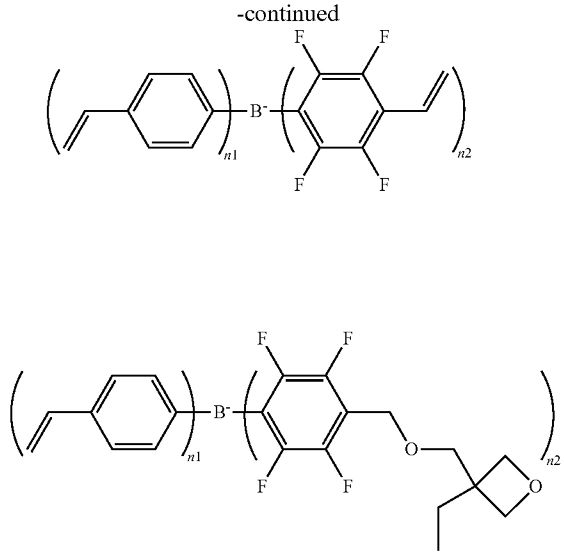
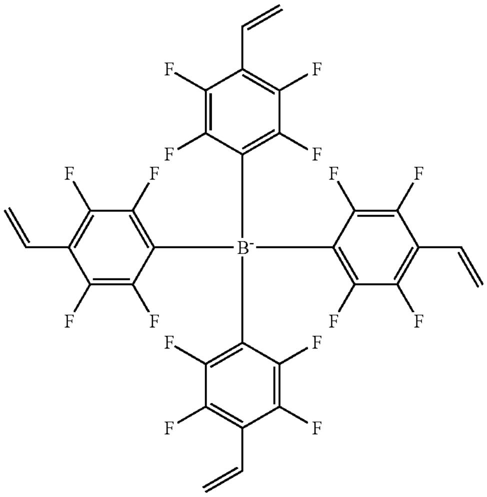
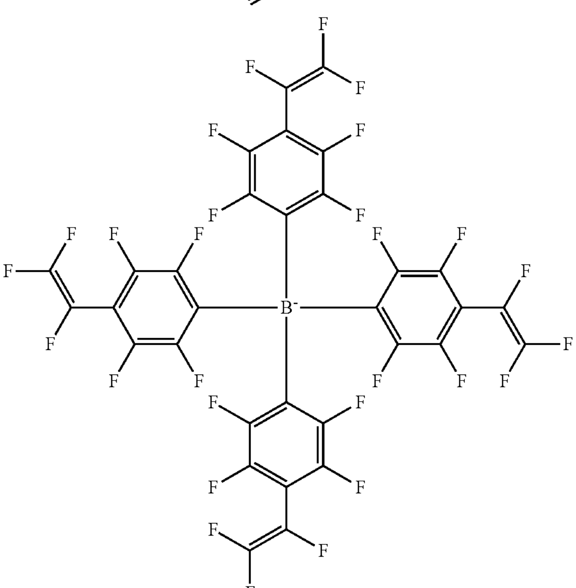
-continued
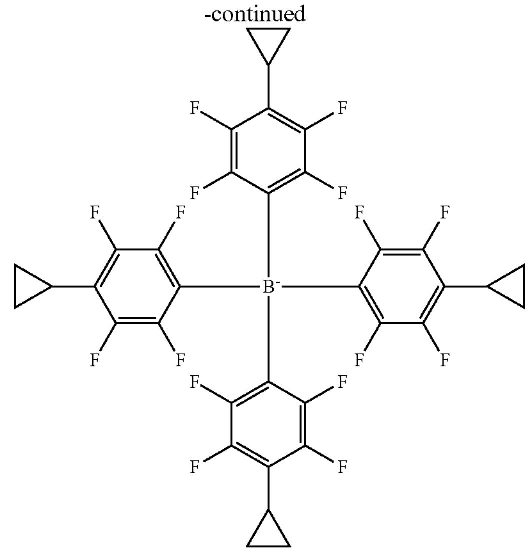
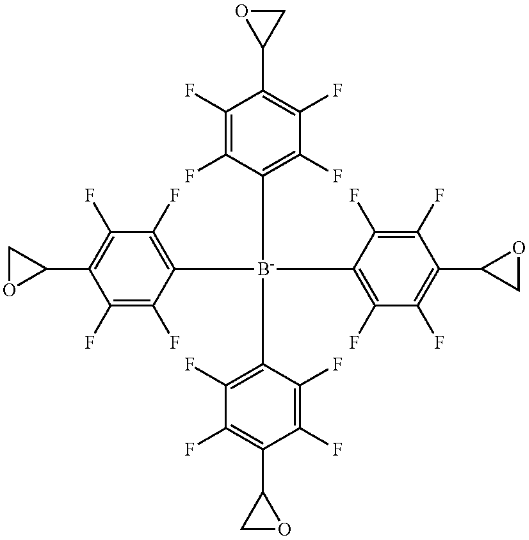
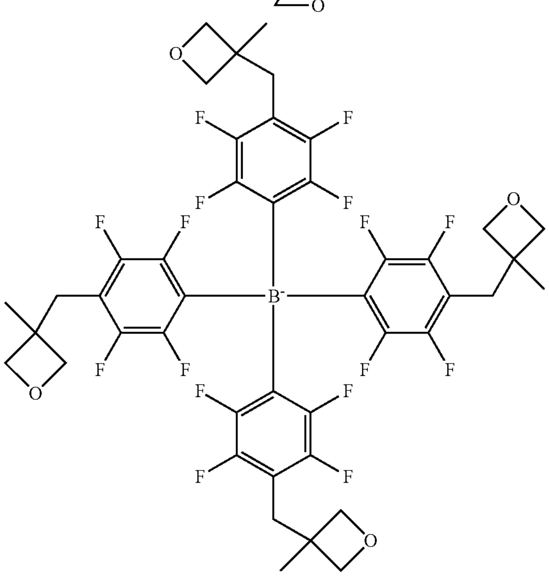

-continued
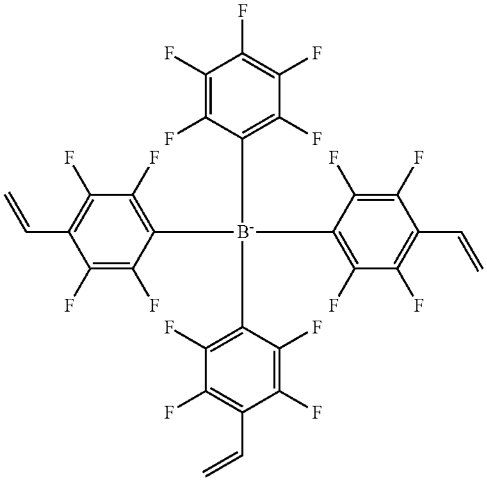
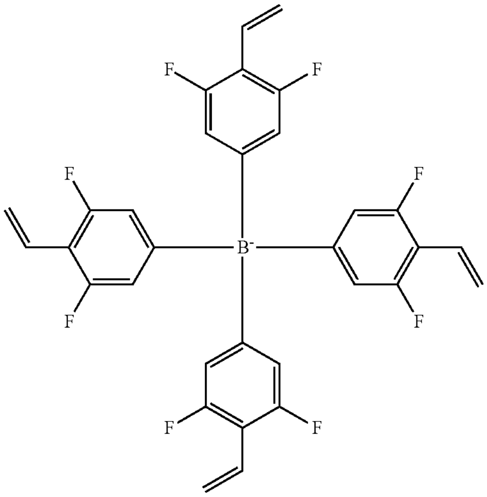
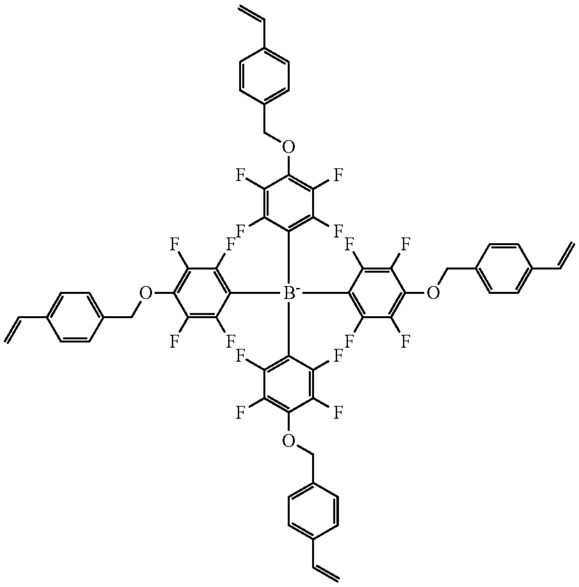
-continued
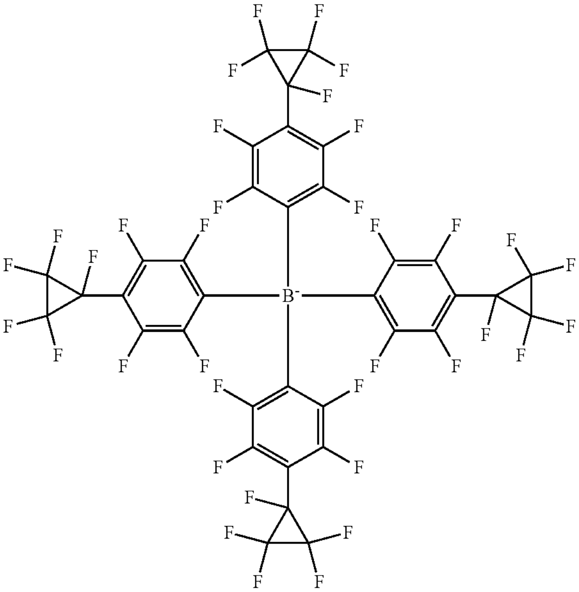
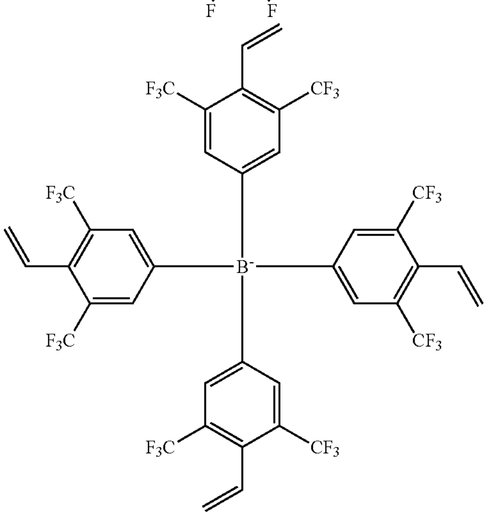
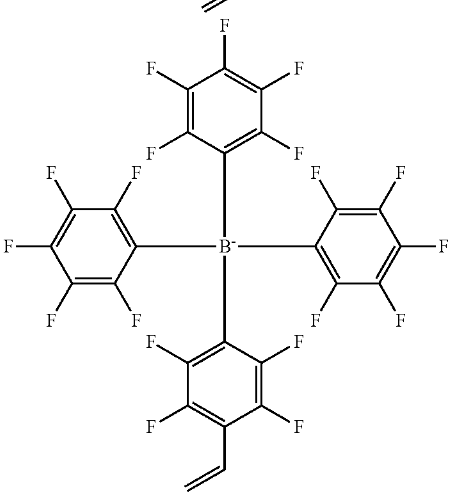
wherein,
n1 and n2 are as defined in Chemical Formula 3.
The compound represented by Chemical Formula 3 may be at least 10% deuterated. Alternatively, the compound represented by Chemical Formula 3 may be at least 20%, at least 30%, at least 40%, at least 50%, at least 60%, at least 70%, at least 80%, at least 90%, or 100% deuterated.

In addition, the hole injection layer according to the present disclosure may further include a cationic compound in addition to the compound represented by Chemical Formula 3. That is, the hole injection layer may include an anionic compound represented by Chemical Formula 3 and an ionic compound in which the cationic compound is ionically bonded.

Examples of the cationic compound are as follows.

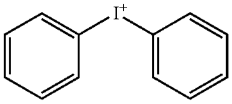

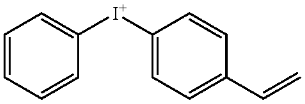

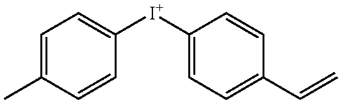

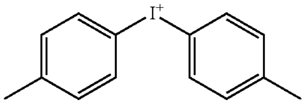

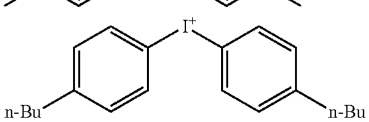

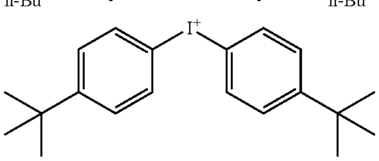

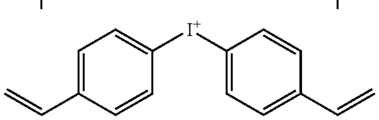

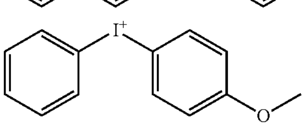

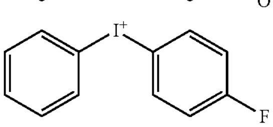

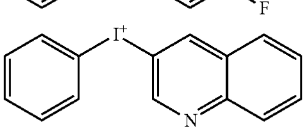

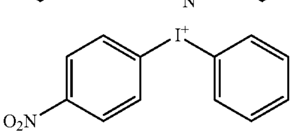

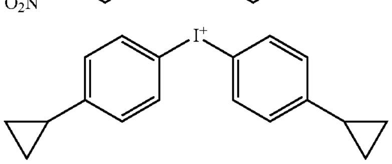

-continued

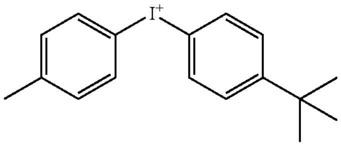

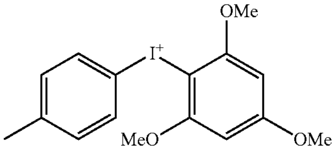

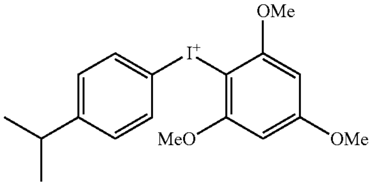

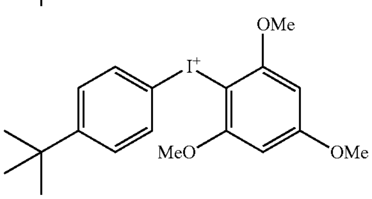

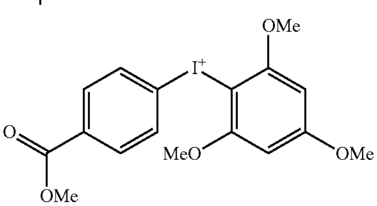

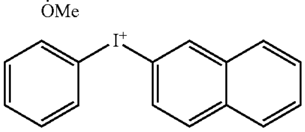

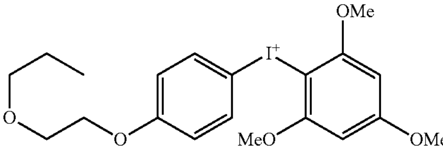

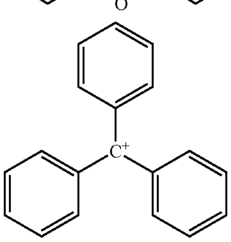

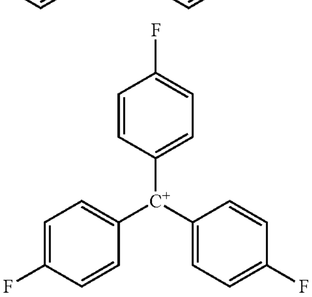

-continued
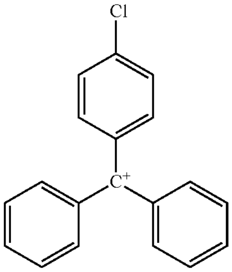
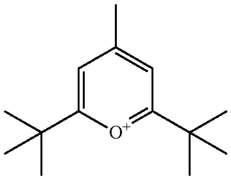
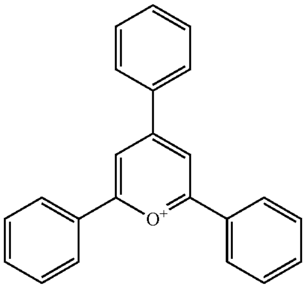
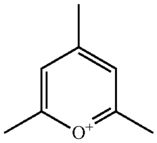
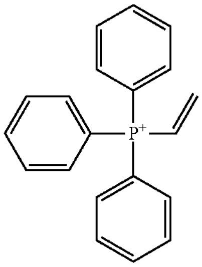
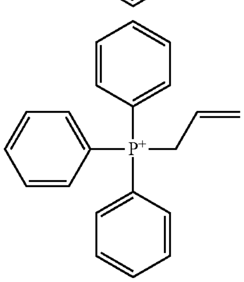
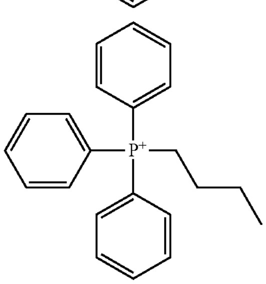
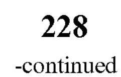
-continued
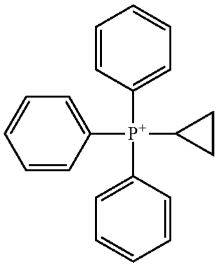
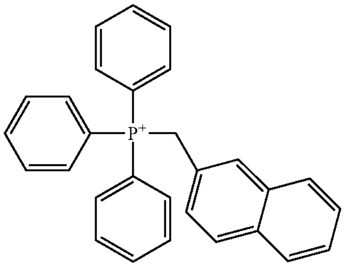
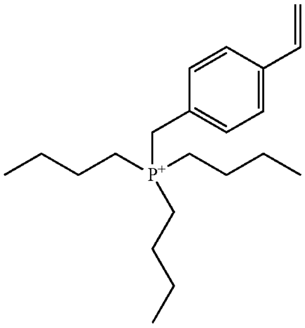
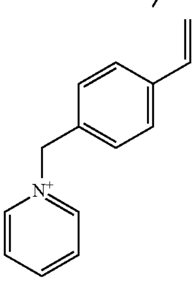
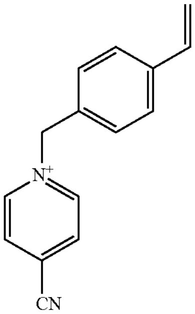
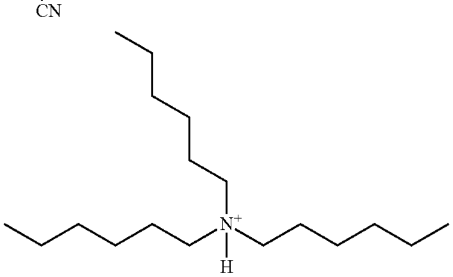

-continued
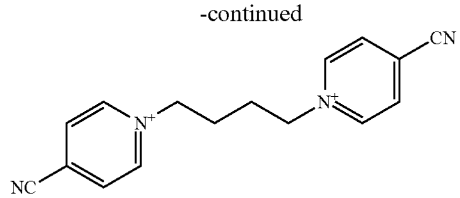
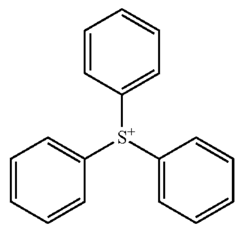
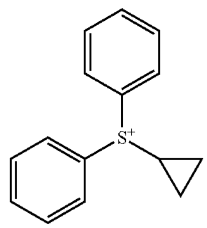
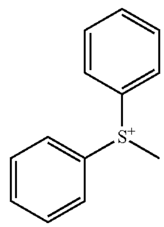
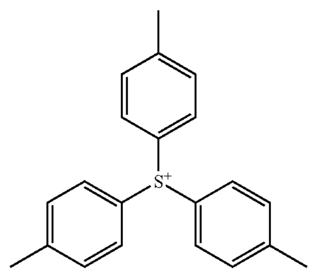
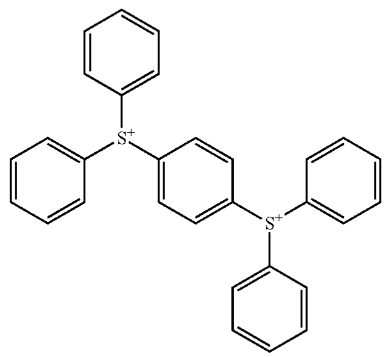
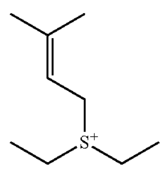
-continued
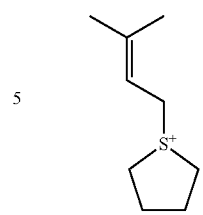
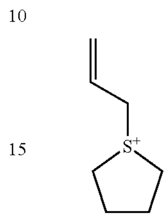
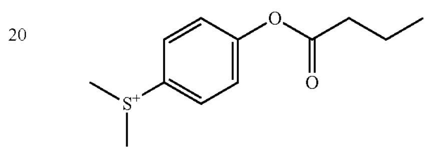
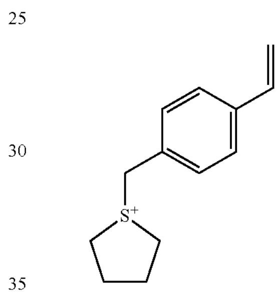
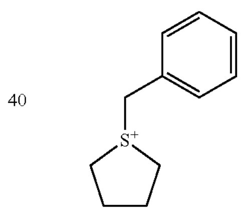
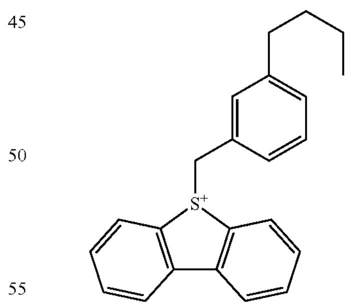
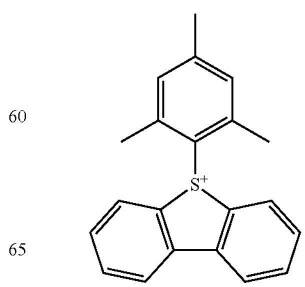

-continued

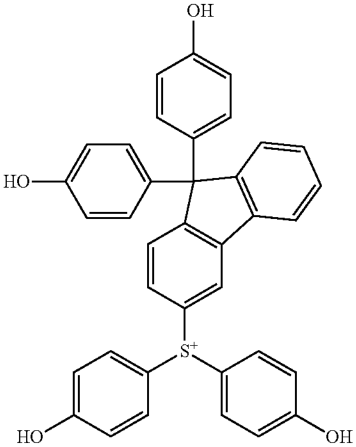

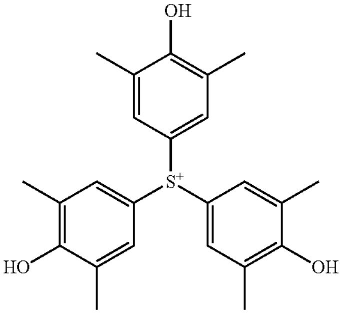

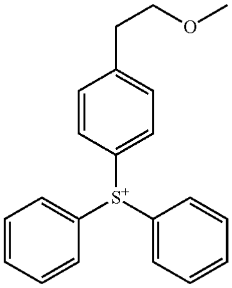

The ionic compound may be at least 10% deuterated. Preferably, the ionic compound may be at least 20%, at least 30%, at least 40%, at least 50%, at least 60%, at least 70%, at least 80%, at least 90%, or 100% deuterated.

Meanwhile, the method of forming the hole injection layer according to the present disclosure is a method in which the compound represented by Chemical Formula 1 (or together with the compound represented by Chemical Formula 3 and/or the cationic compound) is subjected to heat treatment or photo treatment to prepare a cured product, which will be described later.

(Hole Transport Layer)

The organic light emitting device according to the present disclosure includes a hole transport layer between the hole injection layer and the light emitting layer, wherein a polymer including the repeating unit represented by Chemical Formula 2 is used as a material for the hole transport layer.

Meanwhile, the repeating unit represented by Chemical Formula 2 may be represented by the following Chemical Formula 2A:

[Chemical Formula 2A]

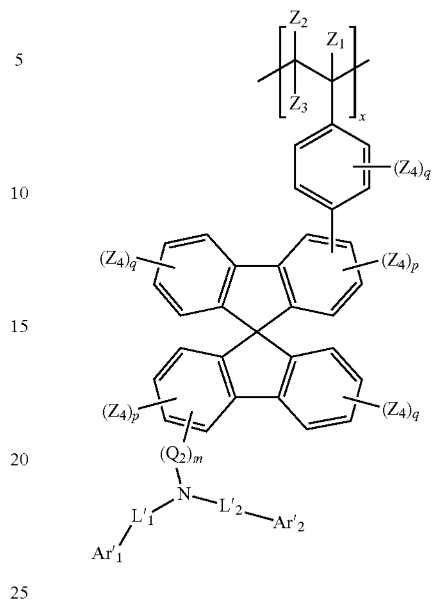

in the Chemical Formula 2A, $Q_2$, $L'_1$ and $L'_2$ are each independently a single bond; a substituted or unsubstituted $C_{6-60}$ arylene; or a substituted or unsubstituted $C_{2-60}$ heteroarylene containing any one or more heteroatoms selected from the group consisting of N, O and S, $Ar'_1$ and $Ar'_2$ are each independently a substituted or unsubstituted $C_{6-60}$ aryl; or a substituted or unsubstituted $C_{2-60}$ heteroaryl containing any one or more heteroatoms selected from the group consisting of N, O and S $Z_1$ to $Z_3$ are each independently hydrogen or $C_{1-10}$ alkyl, each $Z_4$ is independently hydrogen; deuterium; halogen; hydroxy; cyano; a substituted or unsubstituted $C_{1-60}$ alkyl; a substituted or unsubstituted $C_{3-60}$ cycloalkyl; a substituted or unsubstituted $C_{1-60}$ alkoxy; a substituted or unsubstituted $C_{6-60}$ aryl; or a substituted or unsubstituted $C_{2-60}$ heteroaryl containing any one or more heteroatoms selected from the group consisting of N, O and S, m is an integer of 1 to 10, each p is independently an integer of 0 to 3, each q is independently an integer of 0 to 4, and x is an integer of 1 to 10,000.

The polymer containing the repeating unit represented by Chemical Formula 2A can minimize steric hindrance and improve solvent orthogonality because a phenyl group and an amino group connected to the main chain are linked to a spirobifluorene structure. Accordingly, the thin film formed using the polymer has excellent stability and does not have solubility in other solvents, thereby enabling the implementation of an organic light emitting device exhibiting high efficiency and long lifetime. Therefore, the polymer containing the repeating unit represented by Chemical Formula 2 is suitable for producing an organic light-emitting device by a solution process.

Alternatively, the repeating unit represented by Chemical Formula 2 may be represented by the following Chemical Formula 2B:

[Chemical Formula 2B]

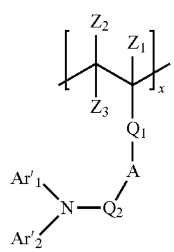

in the Chemical Formula 2B, $Z_1$ to $Z_3$ are each independently hydrogen or $C_{1-10}$ alkyl, $Q_1$ and $Q_2$ are each independently a single bond; a substituted or unsubstituted $C_{6-60}$ arylene; or a substituted or unsubstituted $C_{2-60}$ heteroarylene containing any one or more heteroatoms selected from the group consisting of N, O and S, $Ar'_1$ and $Ar'_2$ are each independently a substituted or unsubstituted $C_{6-60}$ aryl; or a substituted or unsubstituted $C_{2-60}$ heteroaryl containing any one or more heteroatoms selected from the group consisting of N, O and S A is $-L'_3-A'-$, $L'_3$ is a single bond, —O—, $—(CH_2)_y—$, $—O(CH_2)_y—$, or $—(CH_2)_yO—$, where y is an integer of 1 to 10, A' is any one selected from the group consisting of the following:

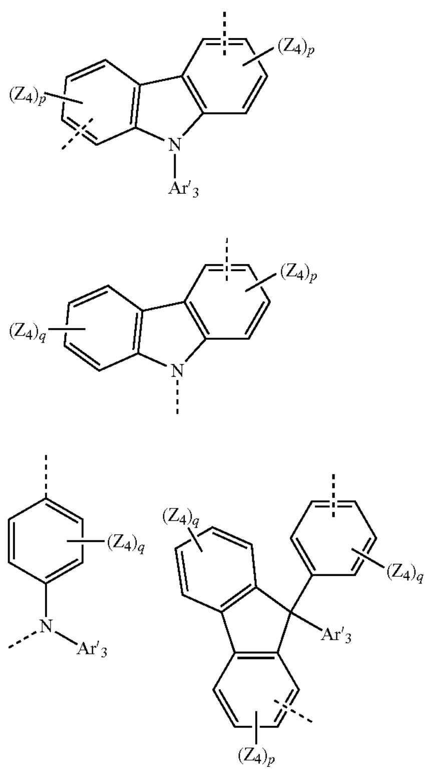

-continued

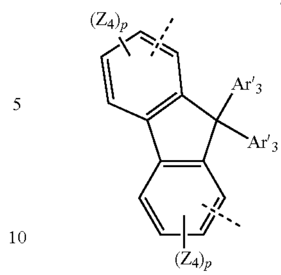

wherein, each $Ar'_3$ is independently a substituted or unsubstituted $C_{6-60}$ aryl; or a $C_{2-60}$ heteroaryl containing any one or more heteroatoms selected from the group consisting of N, O and S, each $Z_4$ is independently hydrogen; deuterium; halogen; hydroxy; cyano; a substituted or unsubstituted $C_{1-60}$ alkyl; a substituted or unsubstituted $C_{3-60}$ cycloalkyl; a substituted or unsubstituted $C_{1-60}$ alkoxy; a substituted or unsubstituted $C_{6-60}$ aryl; or a substituted or unsubstituted $C_{2-60}$ heteroaryl containing any one or more heteroatoms selected from the group consisting of N, O and S, p and q are each independently an integer of 0 to 3, and x is an integer of 1 to 10,000.

The polymer containing the repeating unit represented by Chemical Formula 2B has excellent stability when applied to a solution process, and can form a thin film that does not have solubility in other solvents, because the main chain and the amino group are linked to the A structure, specifically, a carbazole-based moiety, an aminophenyl-based moiety, or a fluorene-based moiety. Thereby, the organic light emitting device including the polymer may exhibit low driving voltage, high efficiency, and long lifetime. Therefore, the polymer containing the repeating unit represented by Chemical Formula 2B is suitable for producing an organic light emitting device by a solution process.

Preferably, $Q_1$ and $Q_2$ are each independently a single bond, or $C_{6-20}$ arylene. Alternatively, $Q_2$ is $C_{6-20}$ arylene, and each $Q_2$ is independently a single bond or $C_{6-20}$ arylene.

Preferably, $Q_1$ is a single bond, phenylene, or biphenyldiyl, $Q_2$ is a single bond, phenylene, biphenyldiyl, naphthylene, fluorenediyl, or carbazolylene, the $Q_2$ may be unsubstituted, or substituted with one or two $C_{1-10}$ alkyls; or $C_{6-20}$ aryl.

Preferably, in Chemical Formula 2A, $Q_2$ is a single bond; a substituted or unsubstituted phenylene; a substituted or unsubstituted biphenyldiyl; a substituted or unsubstituted naphthylene; a substituted or unsubstituted fluorenediyl; or a substituted or unsubstituted carbazolylene.

More preferably, $Q_2$ is a single bond, phenylene, biphenyldiyl, naphthylene, fluorenediyl, or carbazolylene, the $Q_2$ is unsubstituted, or substituted with one or two $C_{1-10}$ alkyls; or $C_{6-20}$ aryl.

For example, $Q_2$ is a single bond, phenylene, biphenyldiyl, naphthylene, fluorenediyl, 9,9-dimethyl-9H-fluorenediyl, carbazolylene, or 9-phenyl-9H-carbazolyl.

Preferably, in Chemical Formula 2A, m is 1, 2, or 3.

Preferably, in Chemical Formula 2A, $-(Q_2)_m-$ is a single bond, or any one selected from the group consisting of the following:

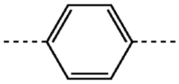

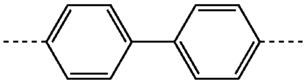

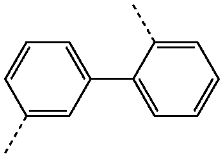

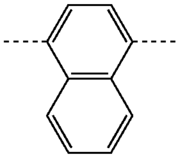

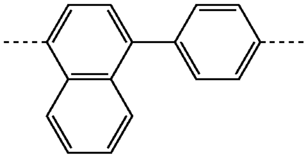

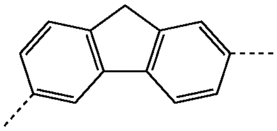

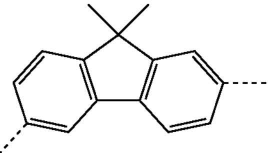

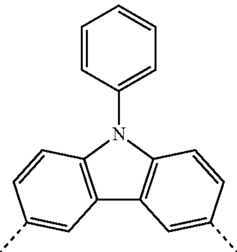

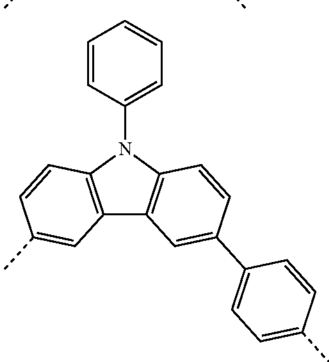

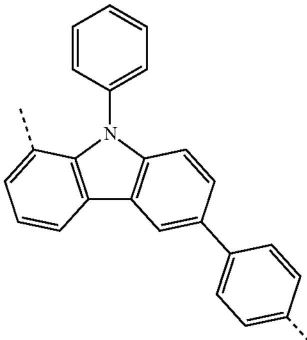

-continued

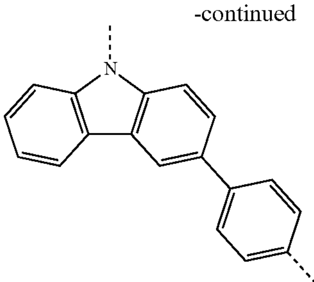

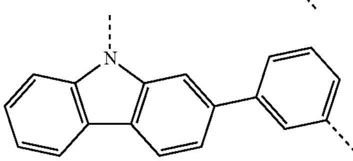

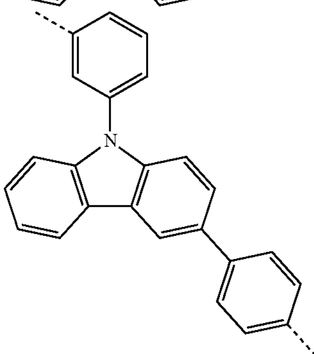

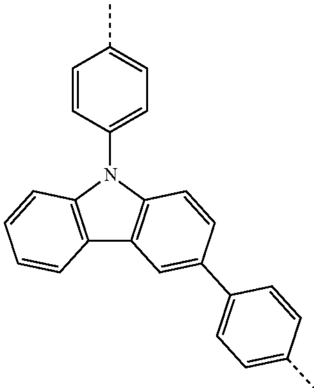

Preferably, in Chemical Formula 2B, $Q_1$ and $Q_2$ are each independently a single bond, phenylene, or biphenyldiyl. More preferably, $Q_1$ is phenylene or biphenyldiyl. For example, $L'_1$ is 1,4-phenylene, or 4,4'-biphenyldiyl. Further, $Q_2$ is a single bond, phenylene, or biphenyldiyl.

Preferably, $L'_1$ and $L'_2$ are each independently a single bond, phenylene, or 9,9-dimethyl-9H-fluorenediyl.

Preferably, in Chemical Formula 2A, $L'_1$ and $L'_2$ are each independently a single bond, 1,4-phenylene, 1,3-phenylene, or

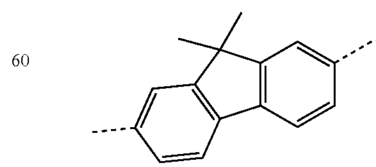

For example, both $L'_1$ and $L'_2$ are a single bond; one of $L'_1$ and $L'_2$ is a single bond, the remainder is 1,4-phenylene; or one of $L'_1$ and $L'_2$ is a single bond, and the remainder is 1,3-phenylene; or one of $L'_1$ and $L'_2$ may be a single bond, and the remainder may be

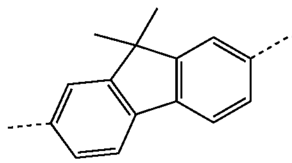

Preferably, $Ar'_1$ and $Ar'_2$ are each independently phenyl, biphenylyl, fluorenyl, carbazolyl, or dibenzofuranyl, the $Ar'_1$ and $Ar'_2$ are unsubstituted, or substituted with one or two $C_{1-10}$ alkyls; $C_{6-20}$ aryl; or $C_{6-20}$ aryl substituted with $C_{1-4}$ alkoxy group.

At this time, $Ar'_1$ and $Ar'_2$ may be the same as or different from each other.

Preferably, in Chemical Formula 2A, $Ar'_1$ and $Ar'_2$ are each independently phenyl, biphenylyl, 9,9-dimethyl-9H-fluorenyl, 9-phenyl-9H-carbazolyl, 9-(4-methoxyphenyl)-9H-carbazolyl, or dibenzofuranyl.

Further, preferably, in Chemical Formula 2A, one of $Ar'_1$ and $Ar'_2$ is biphenylyl, and the remaining one is any one selected from the group consisting of the following:

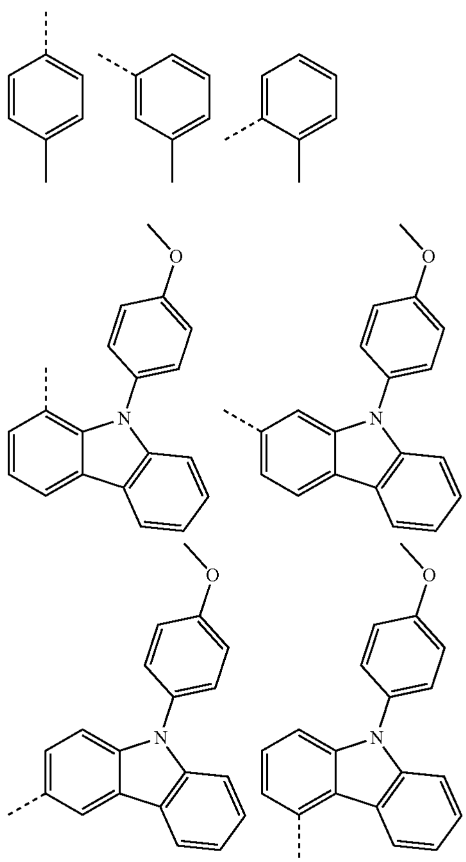

-continued

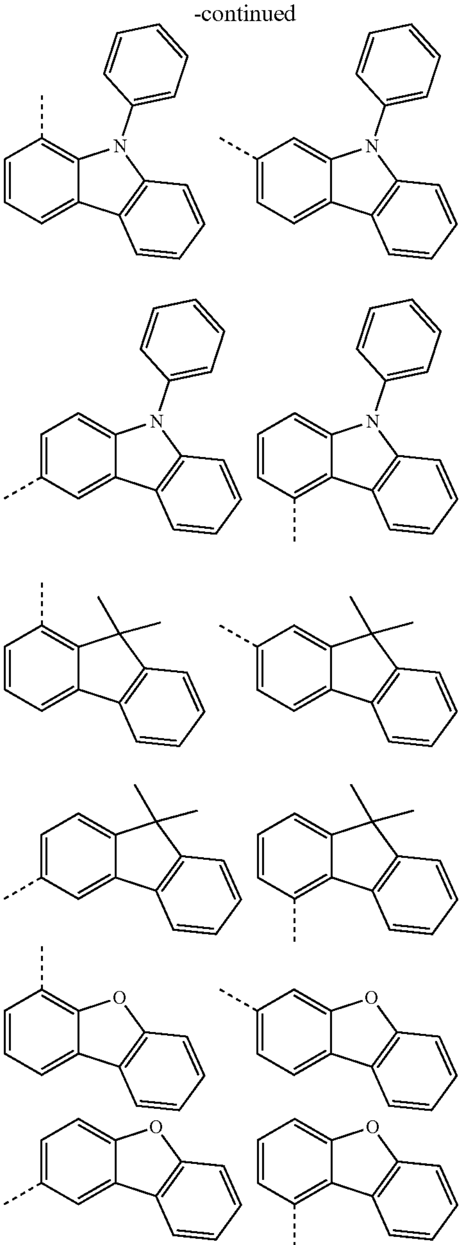

one of $Ar'_1$ and $Ar'_2$ is 9,9-dimethyl-9H-fluorenyl, and the remaining one is 9-phenyl-9H-carbazolyl; or $Ar'_1$ and $Ar'_2$ are dibenzofuranyl; or $Ar'_1$ and $Ar'_2$ are 9,9-dimethyl-9H-fluorenyl; or $Ar'_1$ and $Ar'_2$ are 9-phenyl-9H-carbazolyl.

At this time, in Chemical Formula 2A, both $Ar'_1$ and $Ar'_2$ are dibenzofuranyl, 9,9-dimethyl-9H-fluorenyl, or when both are 9-phenyl-9H-carbazolyl, $Ar'_1$ and $Ar'_2$ may be identical to each other.

Preferably, in Chemical Formula 2B, $Ar'_1$ and $Ar'_2$ are each independently phenyl, biphenylyl, or fluorenyl, $Ar'_1$ and $Ar'_2$ may be unsubstituted, or substituted with one or two $C_{1-10}$ alkyls; or $C_{6-20}$ aryl.

Preferably, $L'_3$ is a single bond, —O—, —$CH_2$—, —$CH_2O$—, or —$OCH_2$—, and A' is any one selected from the group consisting of the following:

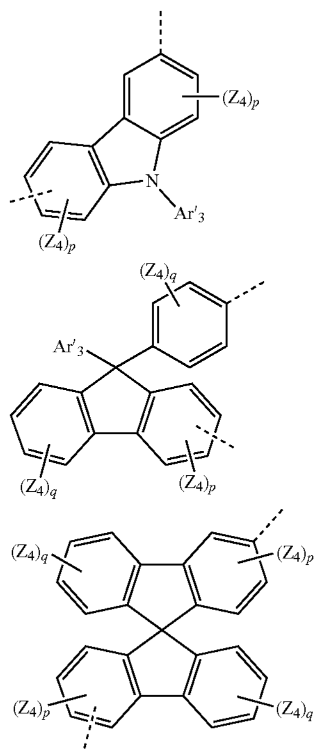

wherein, each $Ar'_3$ is independently $C_{6-20}$ aryl, the $Ar'_3$ is unsubstituted, or substituted with one or two $C_{1-10}$ alkyls; or $C_{1-10}$ alkoxy, and $Z_4$, p and q are as defined in Chemical Formula 2.

Preferably, in Chemical Formula 2B, $L'_3$ is a single bond, $L'_3$ is a single bond, —O—, —$CH_2$—, —$CH_2O$—, or —$OCH_2$—, A' is any one selected from the group consisting of the following:

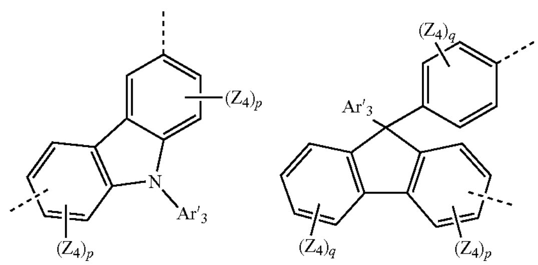

wherein, $Ar'_3$, $Z_4$, p and q are as defined in Chemical Formula 2.

Preferably, in Chemical Formula 2B,

A is any one selected from the group consisting of the following:

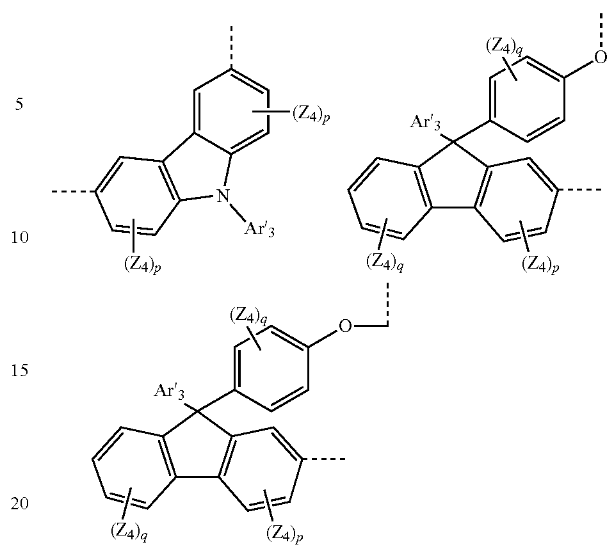

wherein, $Ar'_3$ is each independently phenyl which is unsubstituted, or substituted with one or two substituents each independently selected from the group consisting of methyl, isopropyl, tert-butyl, n-hexyl, methoxy, isopropoxy and tert-butoxy, and $Z_4$, p and q are as defined in Chemical Formula 2.

Preferably, each $Z_4$ is independently hydrogen or deuterium, and $Z_1$ to $Z_3$ is each independently hydrogen or methyl.

For example, all of $Z_4$ may be hydrogen.

Alternatively, all of $Z_4$ may be deuterium.

At this time, p is 0, 1, 2, or 3, and q is 0, 1, 2, 3, or 4.

Preferably, the repeating unit represented by Chemical Formula 2 is represented by the following Chemical Formulas 2A-1, 2B-1 or 2B-2:

[Chemical Formula 2A-1]

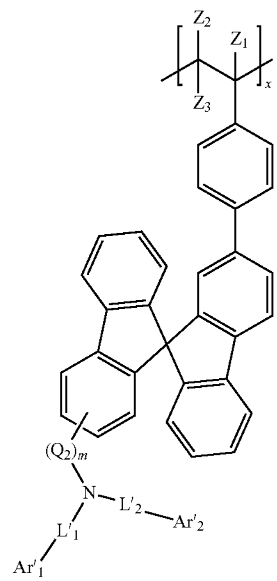

-continued

[Chemical Formula 2B-1]

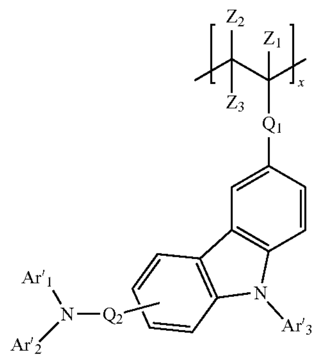

[Chemical Formula 2B-2]

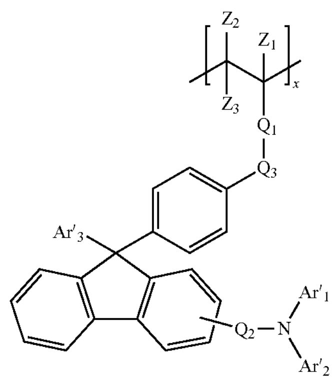

in Chemical Formulas 2A-1, 2B-1 and 2B-2, $Z_1$ to $Z_3$, $Q_1$ to $Q_2$, m, $L'_1$, $L'_2$, $Ar'_1$ to $Ar'_3$ and x are as defined in Chemical Formula 2, and $Q_3$ is —O—, or —$CH_2O$—.

At this time, in Chemical Formulas 2B-1 and 2B-2, $Q_1$ is phenylene or biphenylyl.

Further, for example, in Chemical Formula 2B-2, $Q_3$ is —O—, or —$CH_2O$—.

Preferably, the repeating unit represented by Chemical Formula 2A is represented by Chemical Formula 2A-1.

Further, the repeating unit represented by Chemical Formula 2B is represented by Chemical Formula 2B-1 or 2B-2.

More preferably, the repeating unit represented by Chemical Formula 2A is represented by the following Chemical Formula 2A-1-1:

[Chemical Formula 2A-1-1]

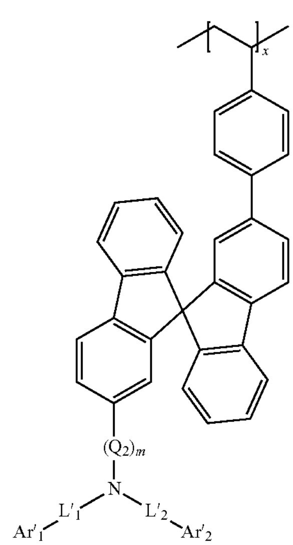

in Chemical Formula 2A-1-1, $Q_2$, m, $L'_1$, $L'_2$, $Ar'_1$, $Ar'_2$ and x are as defined in Chemical Formula 2.

Further, preferably, the repeating unit represented by Chemical Formula 2B is represented by any one of the following Chemical Formulas 2B-1-1, 2B-2-1, and 2B-2-2:

[Chemical Formula 2B-1-1]

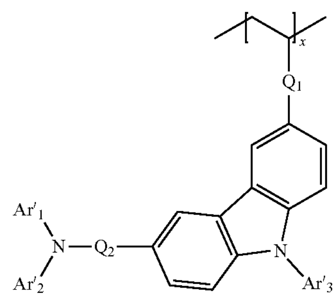

[Chemical Formula 2B-2-1]

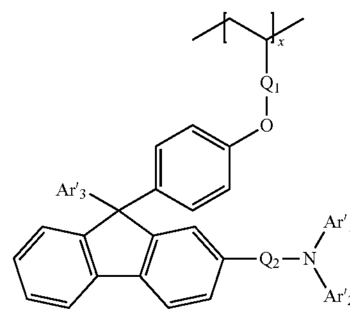

[Chemical Formula 2B-2-2]
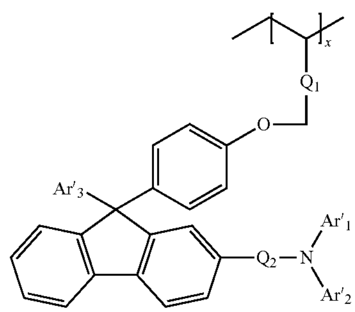
in Chemical Formulas 2B-1-1, 2B-2-1 and 2B-2-2,
$Q_1$, $Q_2$, $Ar'_1$ to $Ar'_3$ and x are as defined in Chemical Formula 2.
For example, in Chemical Formulas 2B-1-1, 2B-2-1 and 2B-2-2,
$Q_1$ is 1,4-phenylene, or 4,4'-biphenyldiyl.
Preferably, the repeating unit represented by Chemical Formula 2 is any one selected from the group consisting of repeating units represented by the following:
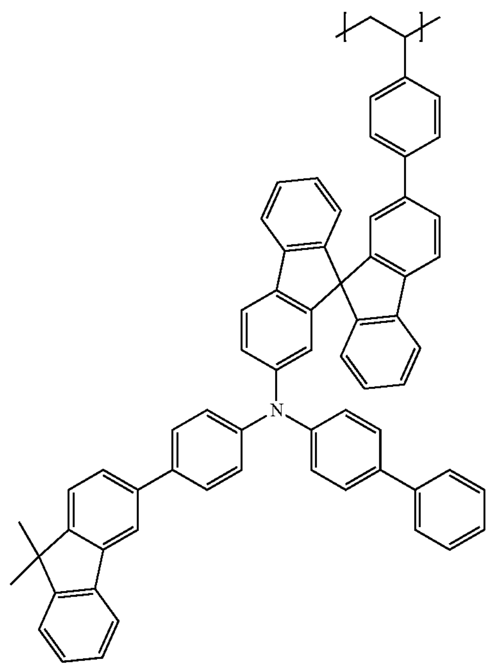
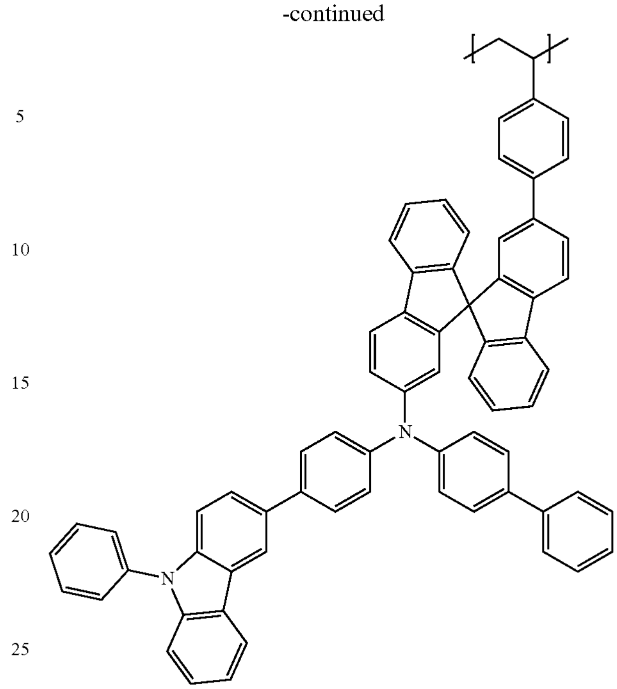
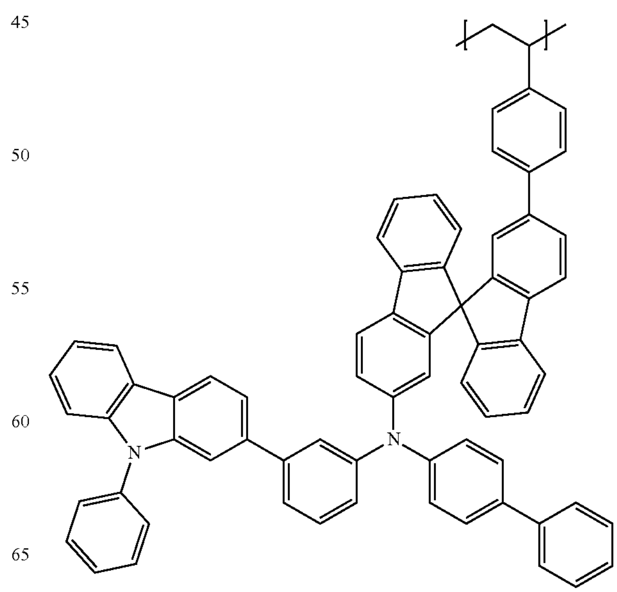

-continued
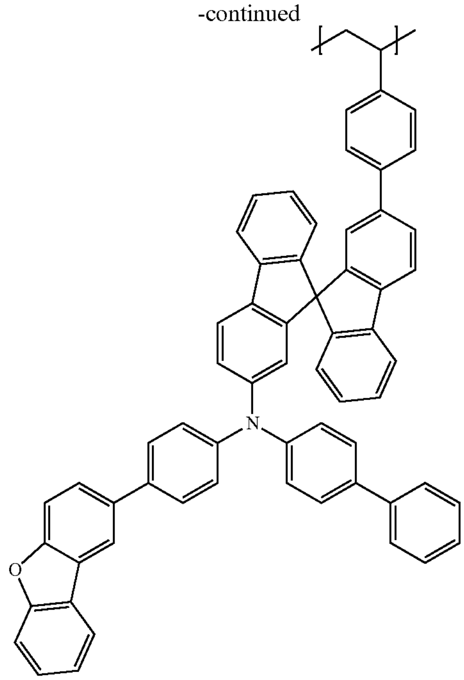
-continued
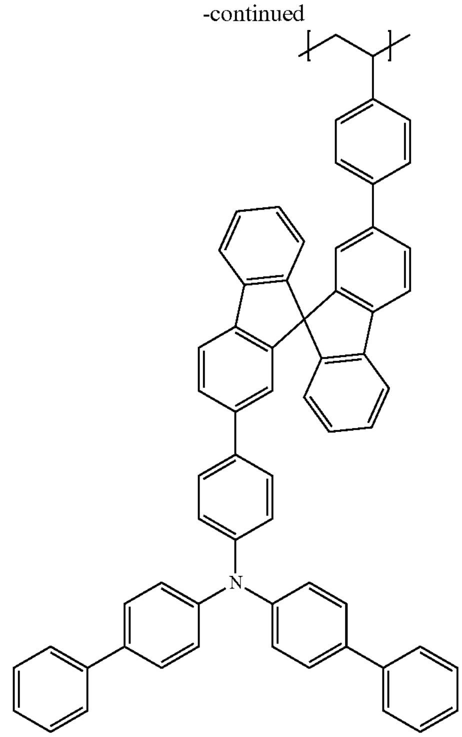
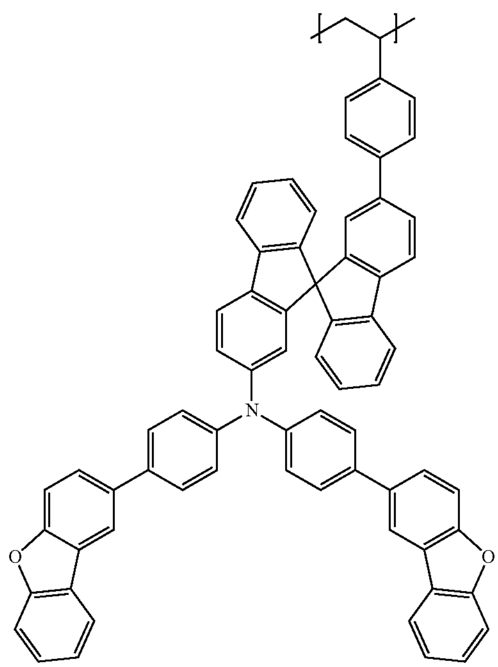
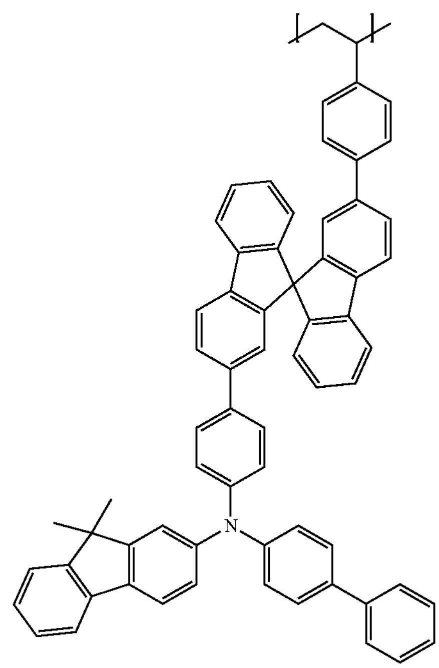

-continued
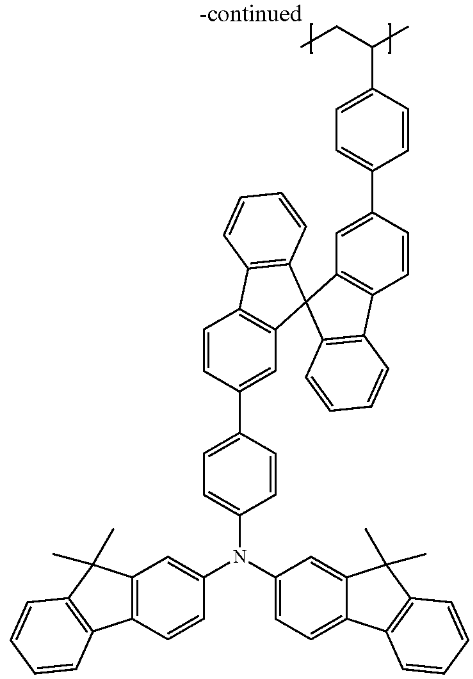
-continued
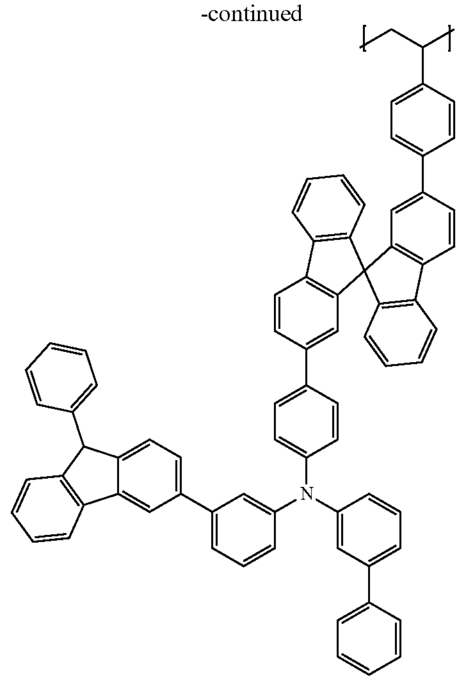
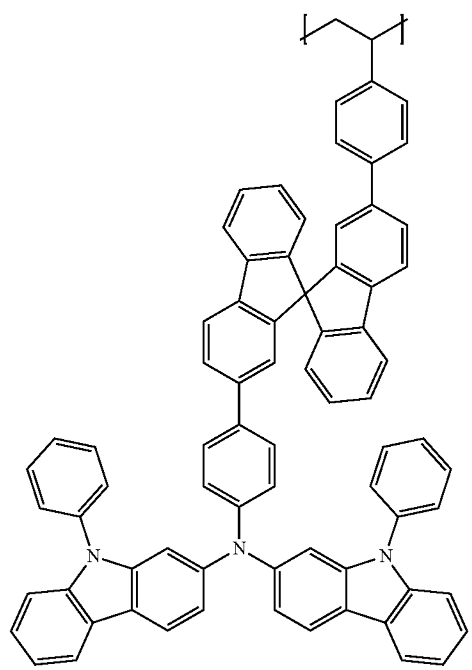
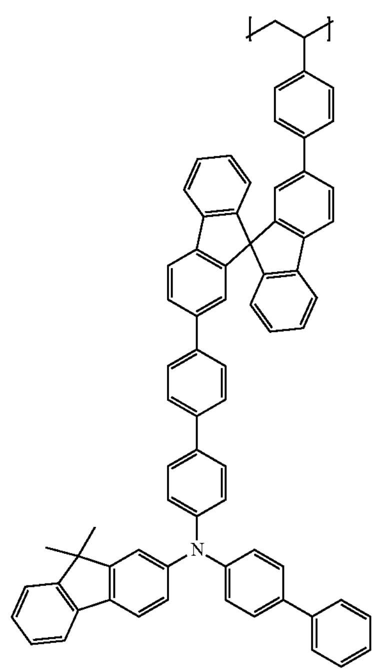

-continued
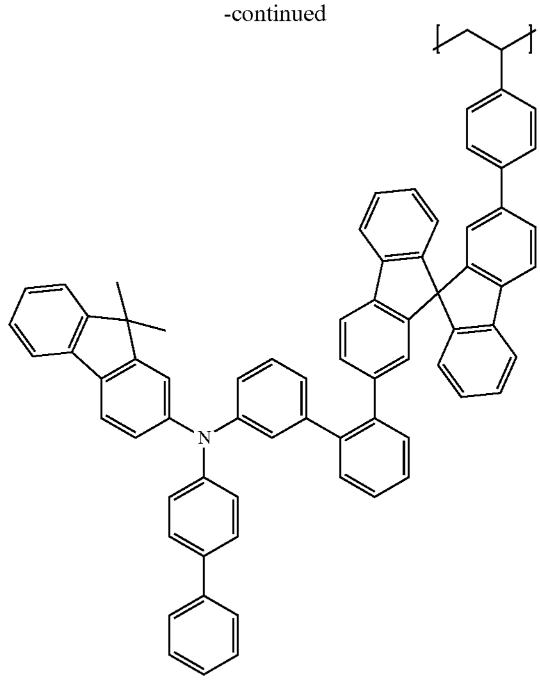
-continued
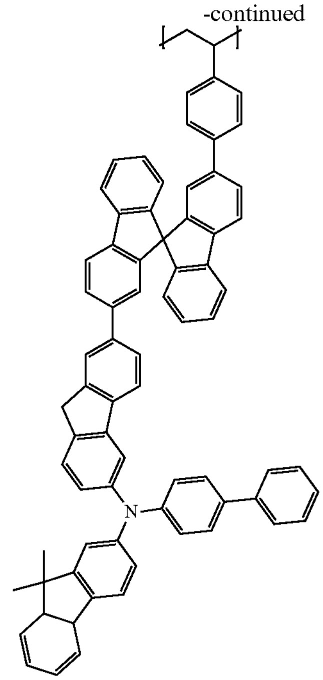
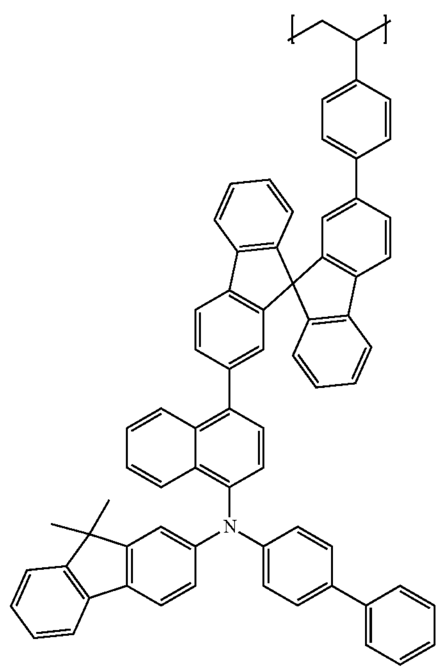
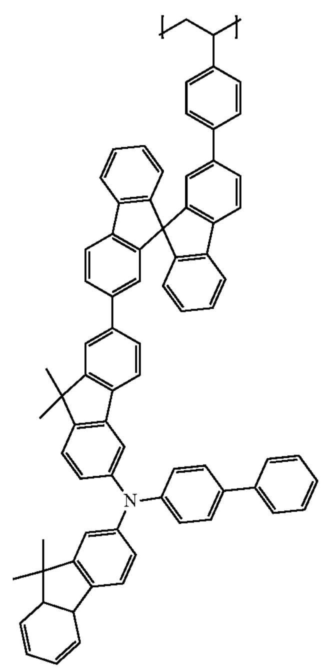

-continued
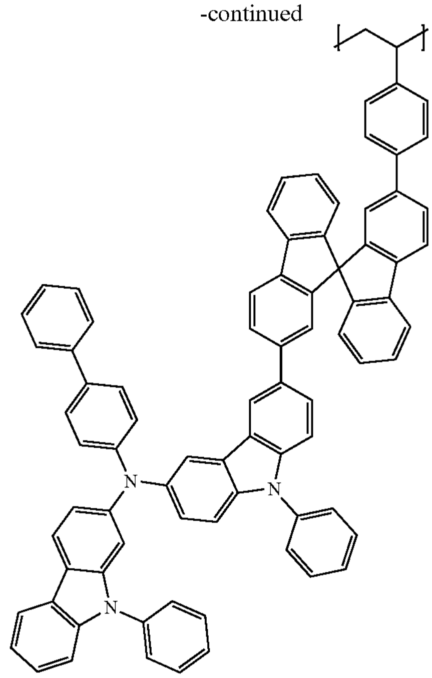
-continued
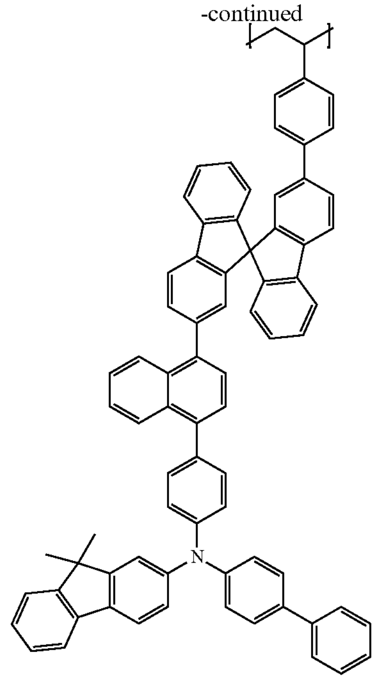
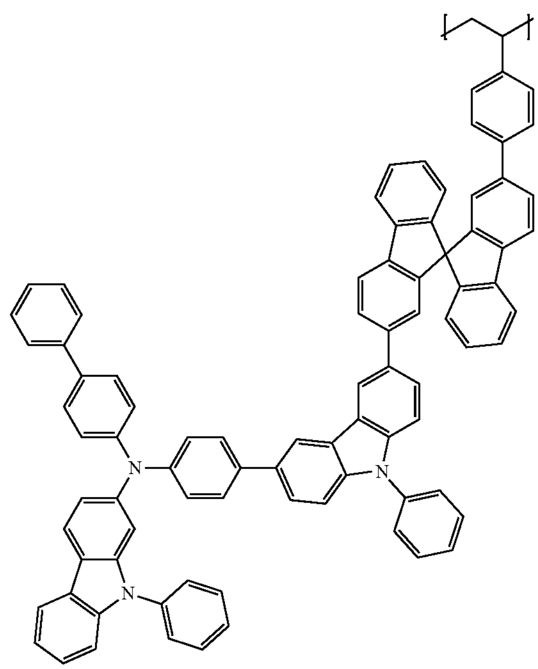
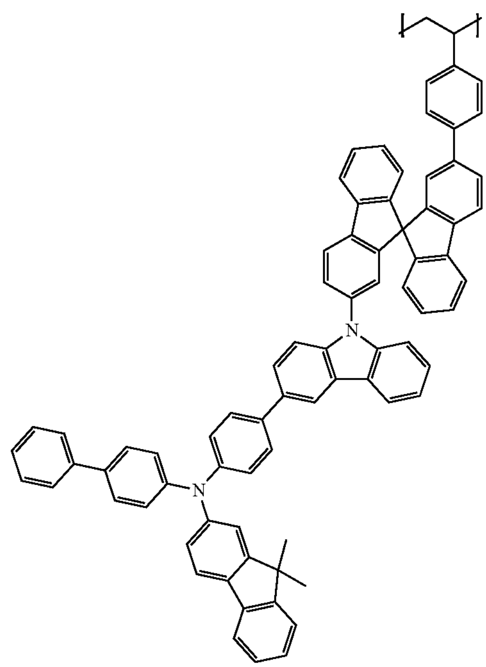

-continued
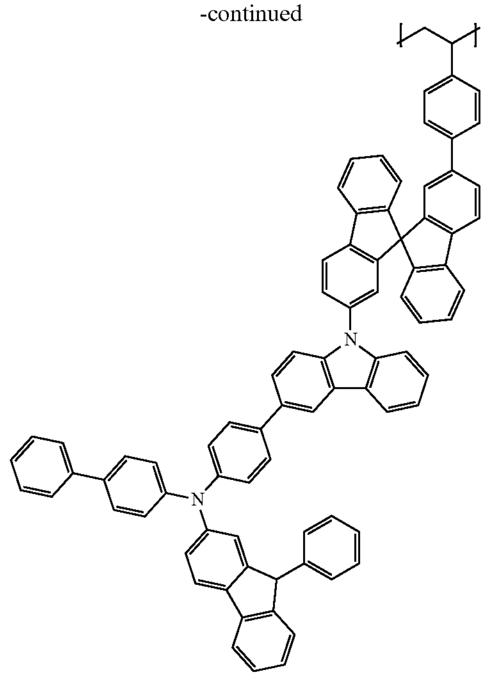
-continued
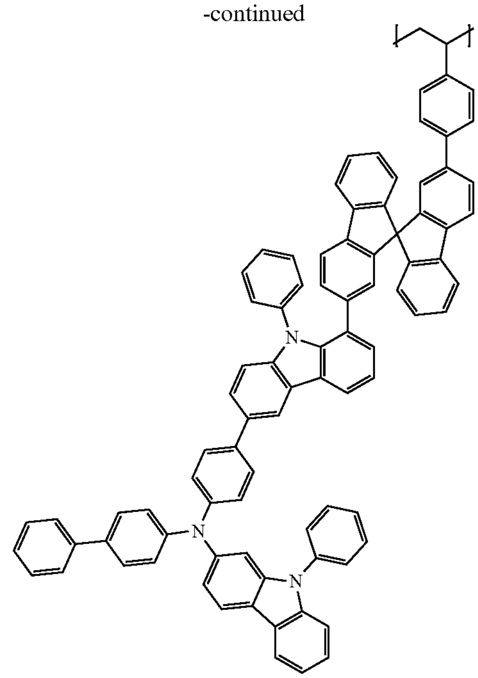
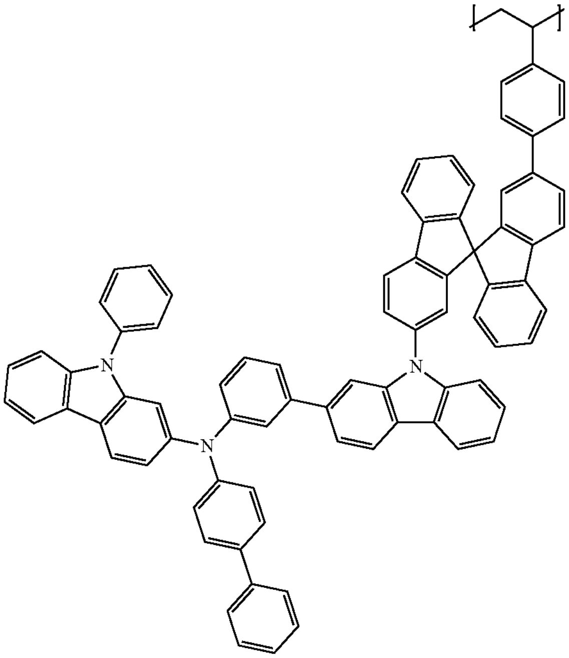
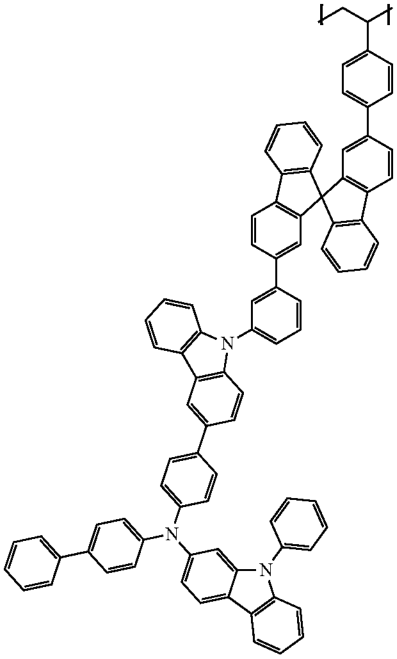

-continued
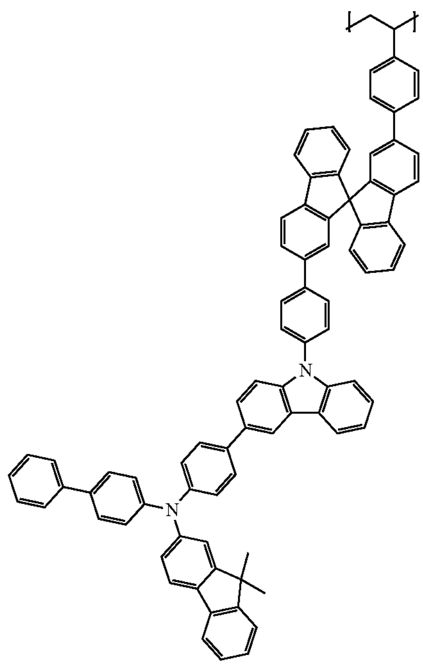
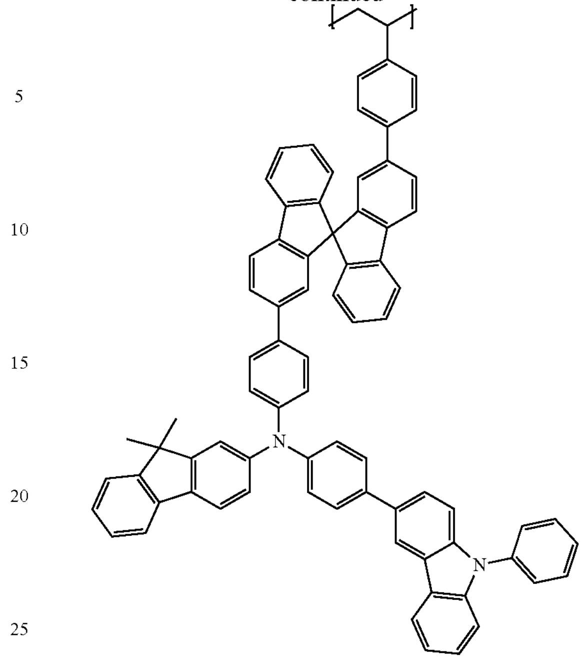
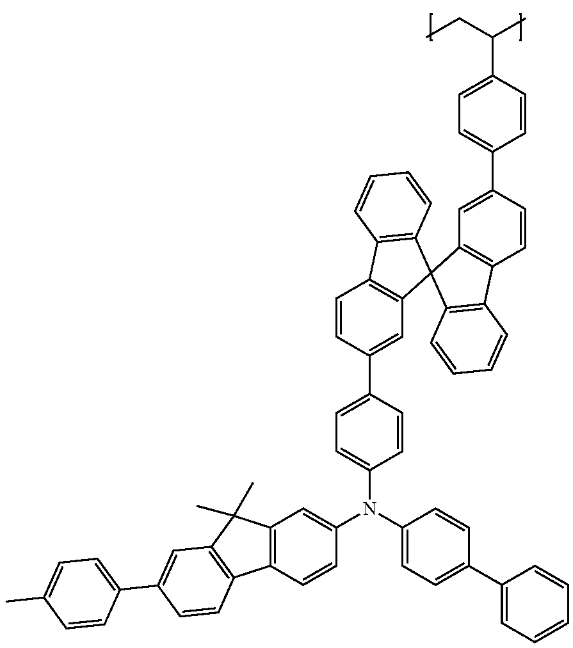
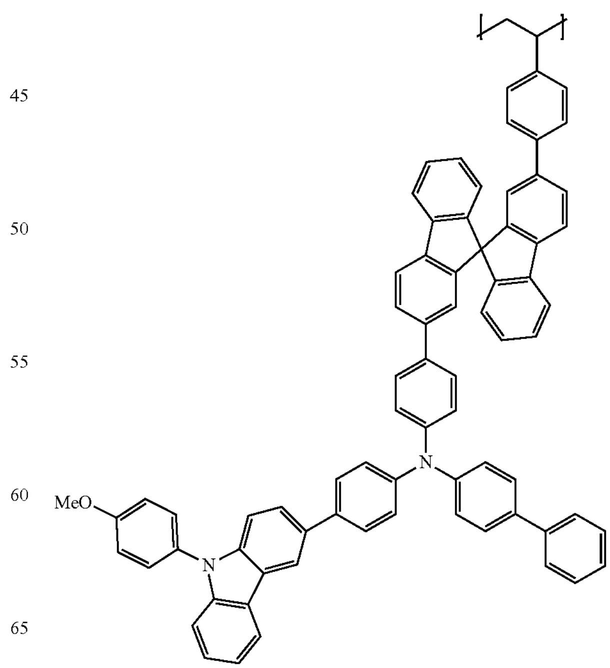

-continued
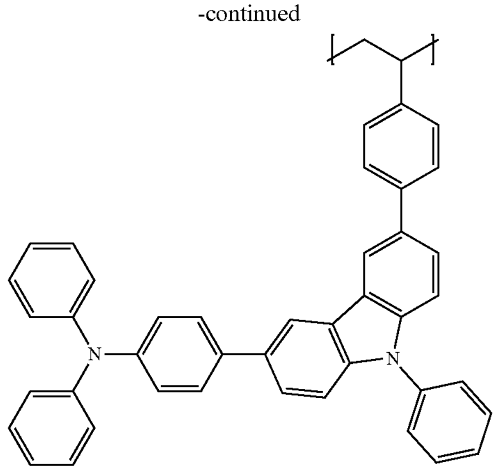
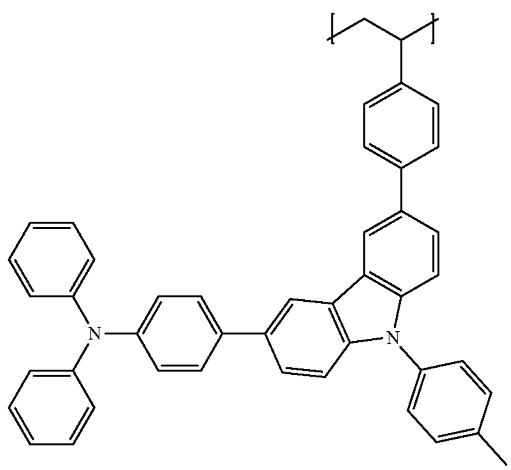
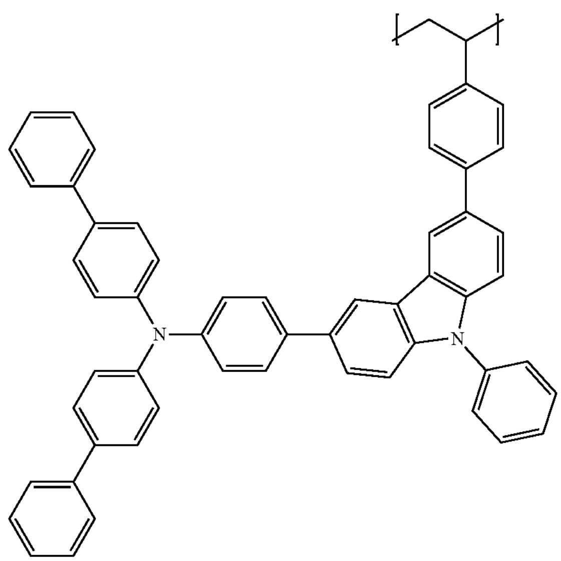
-continued
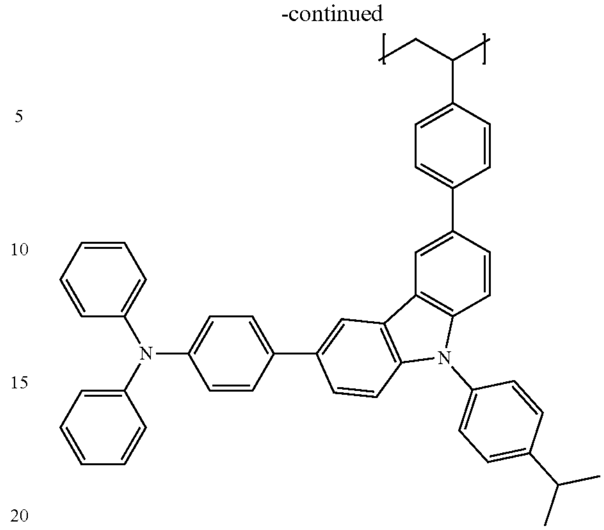
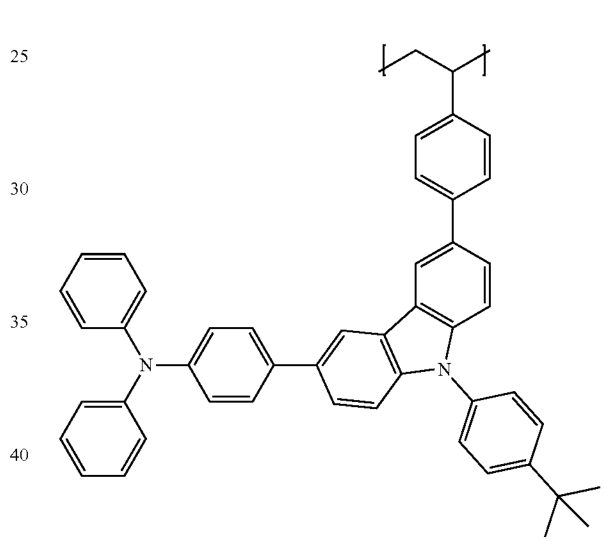
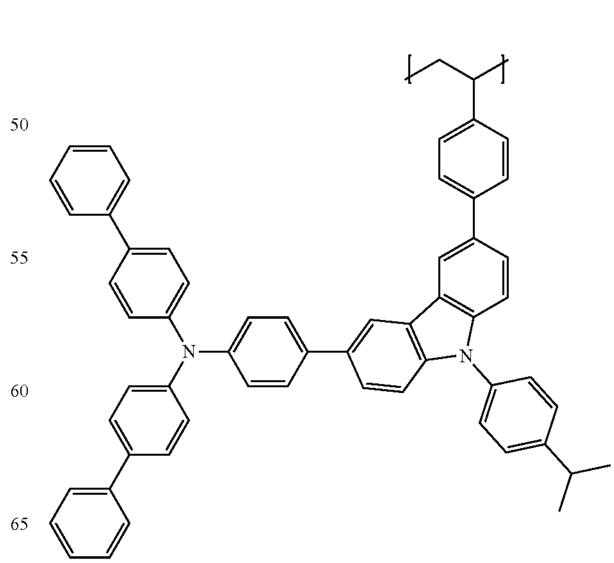

-continued
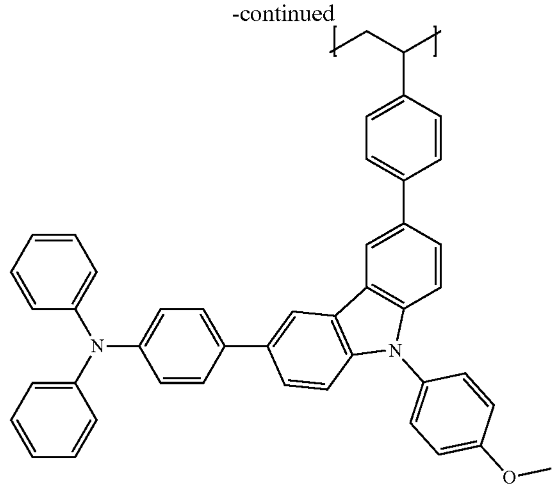
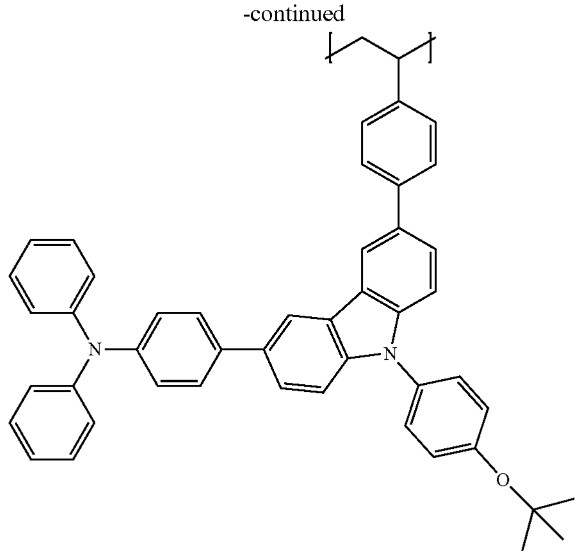
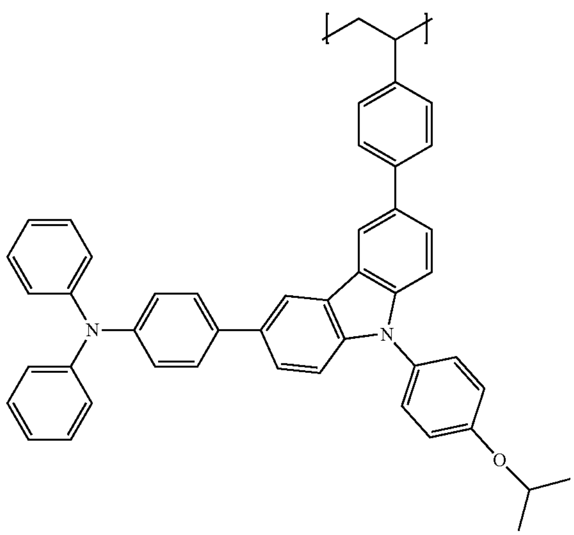
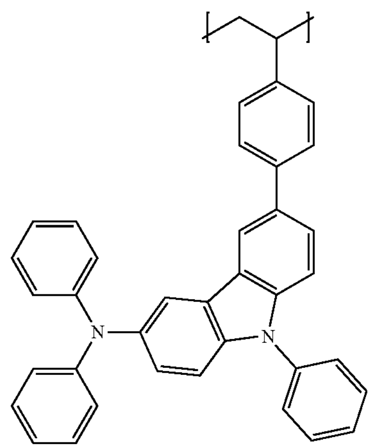
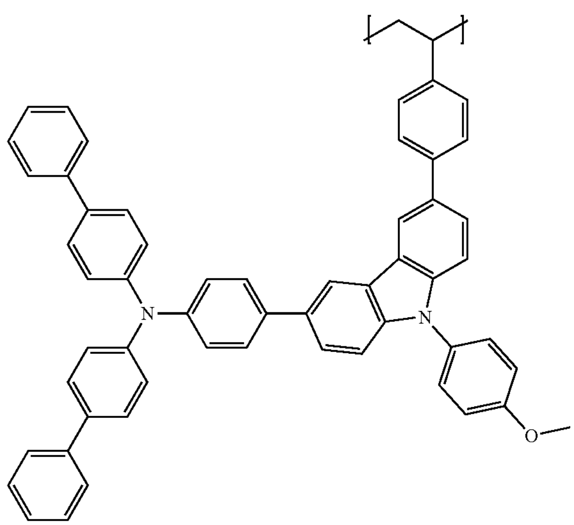
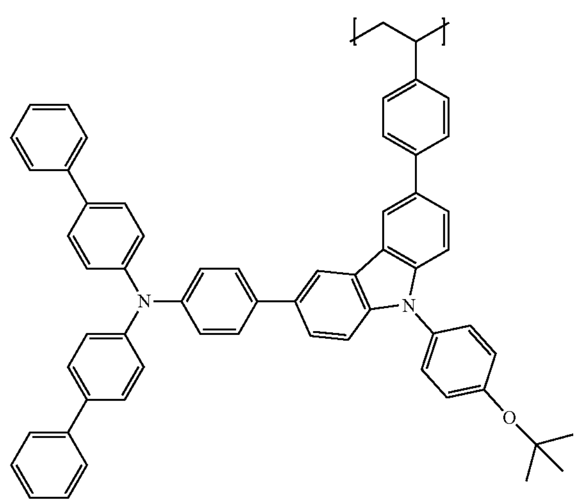

-continued
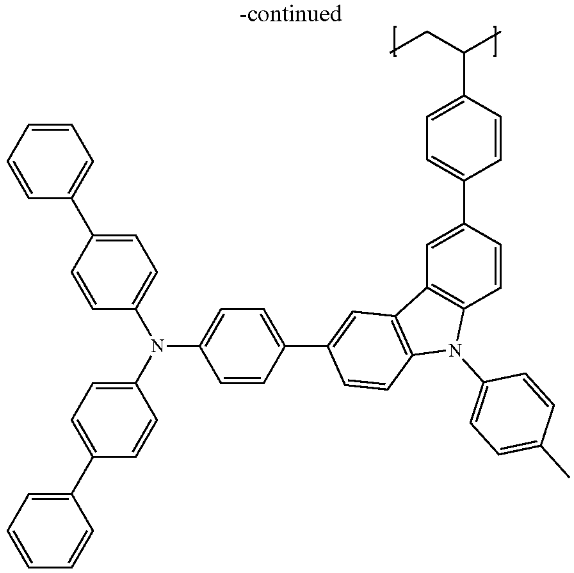
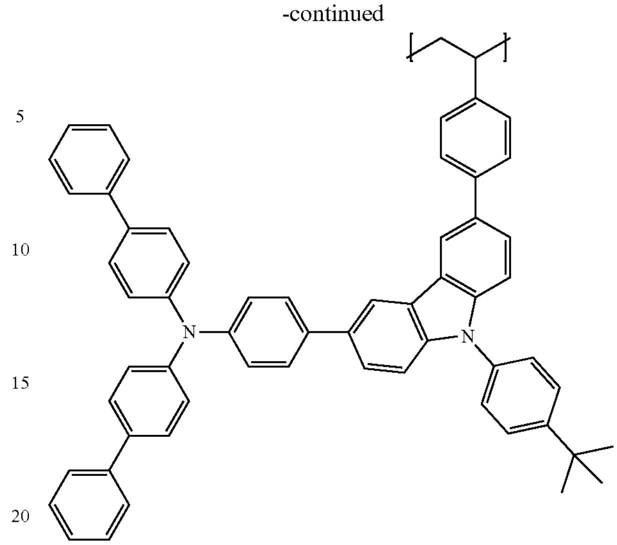
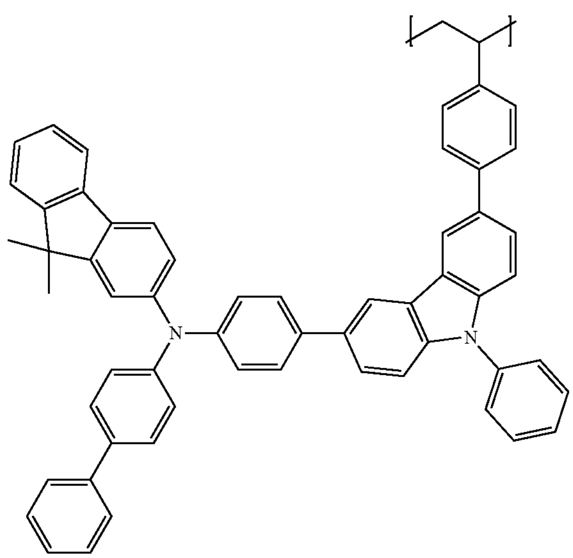
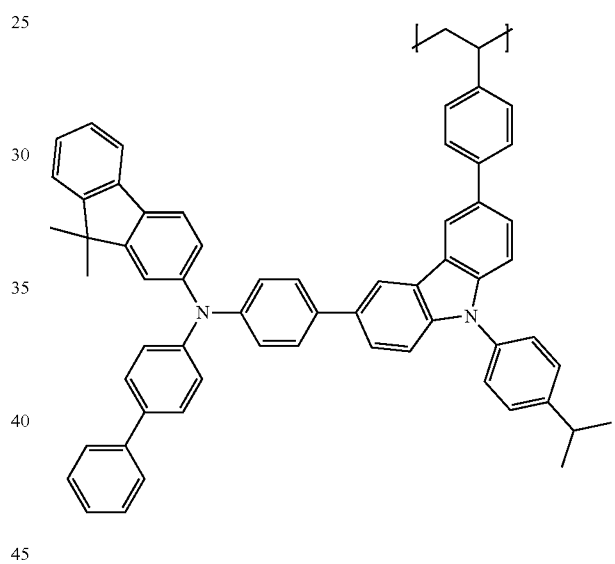
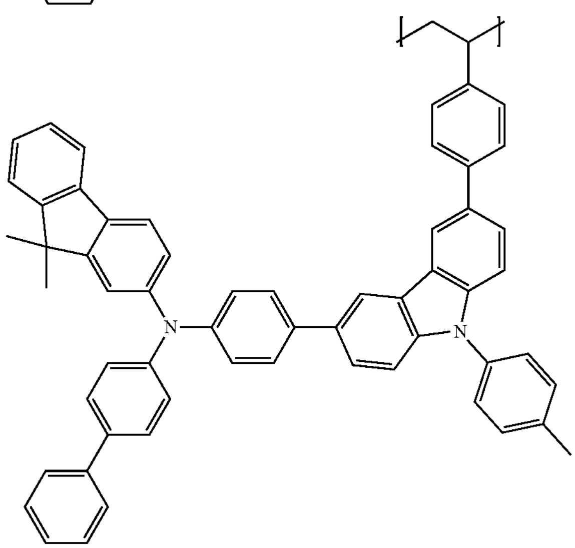
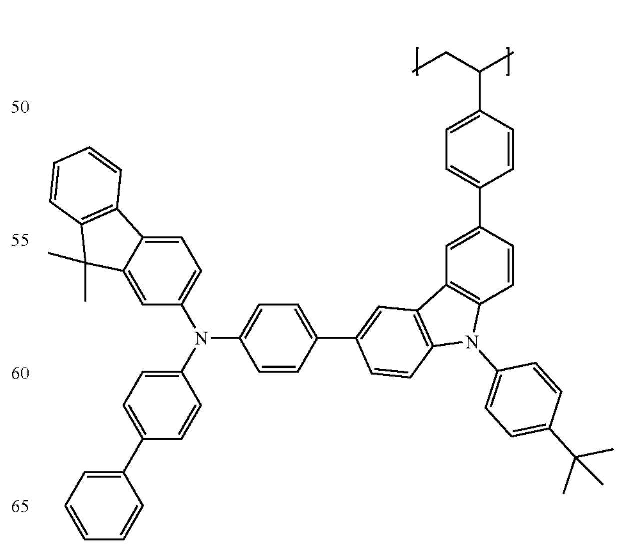
-continued -continued
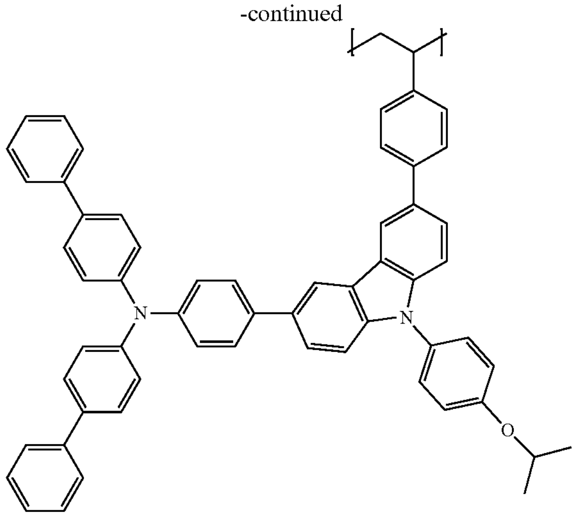
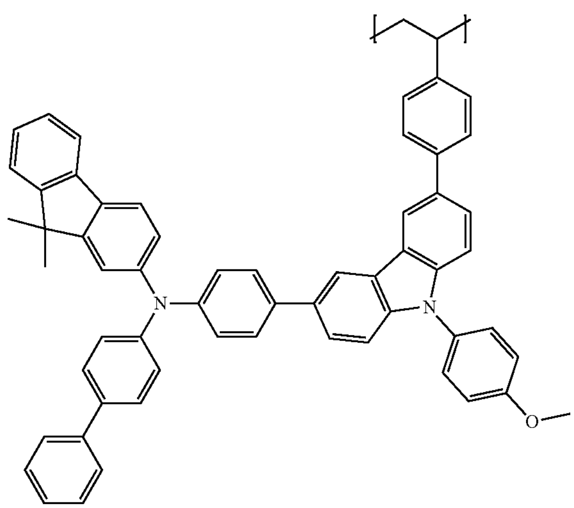
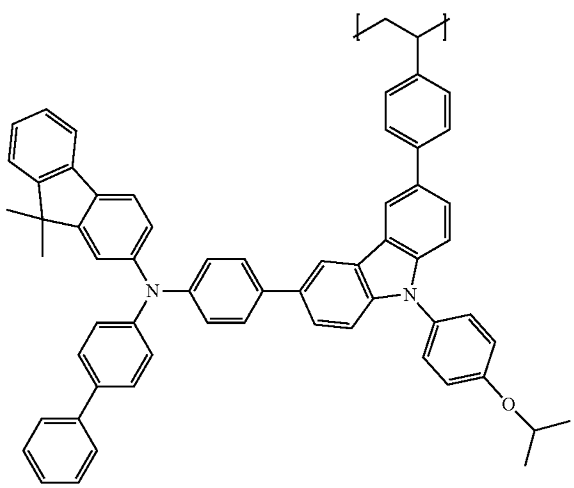
-continued
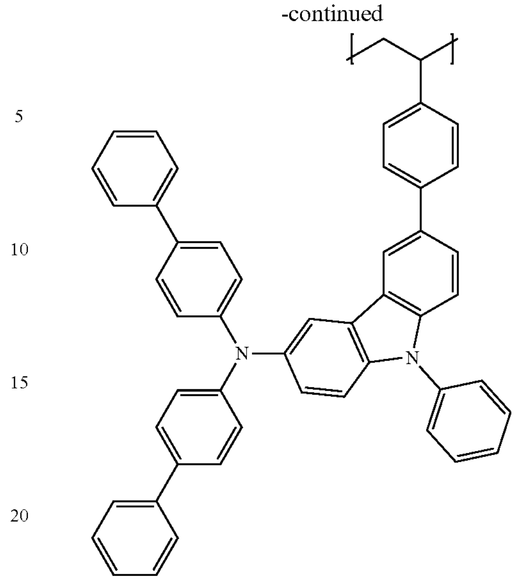
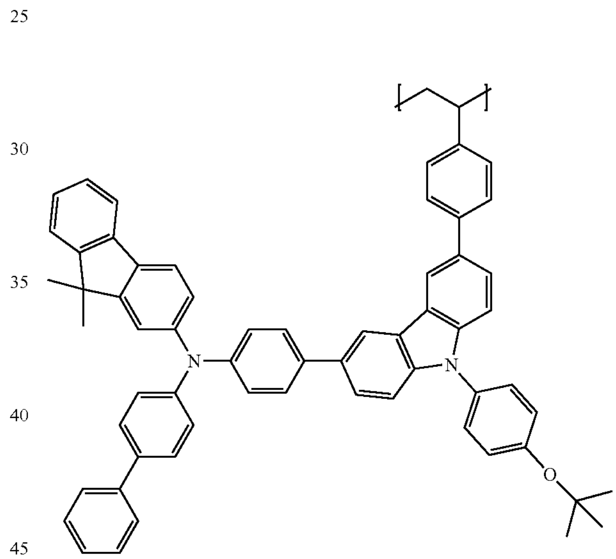
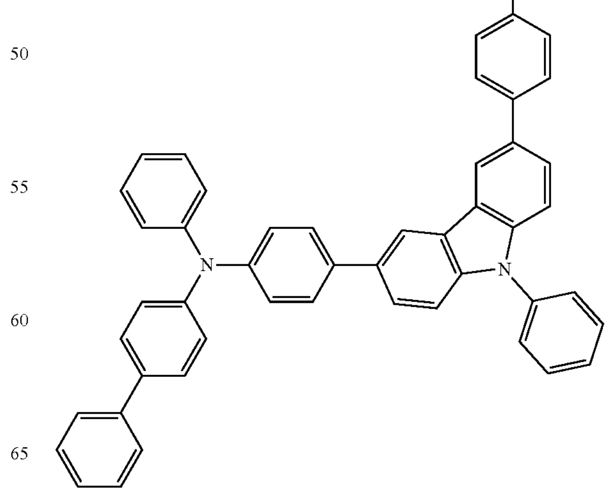

-continued
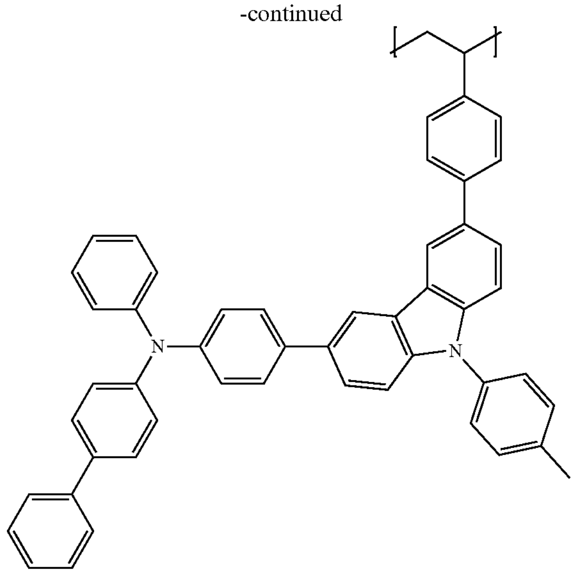
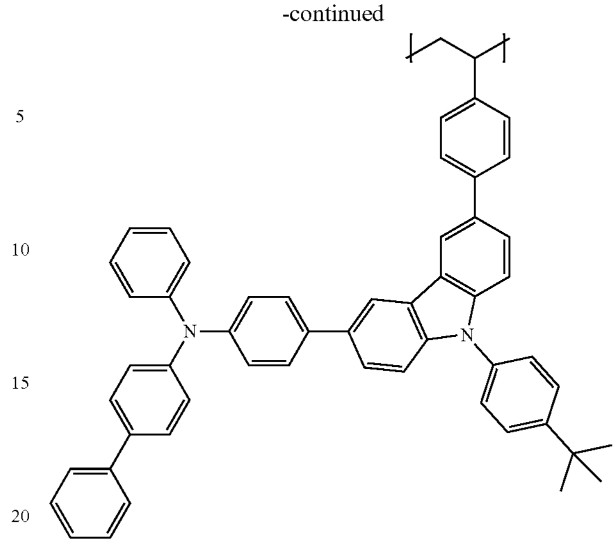
-continued
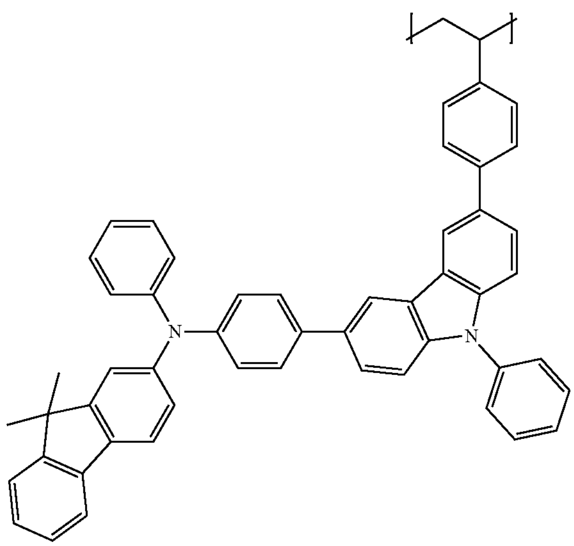
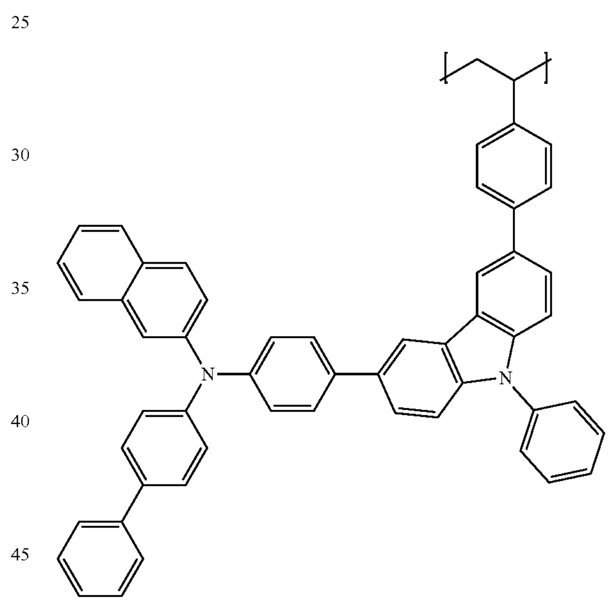
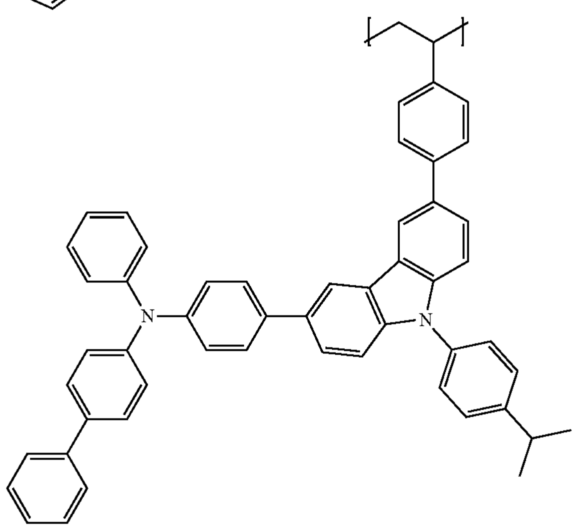
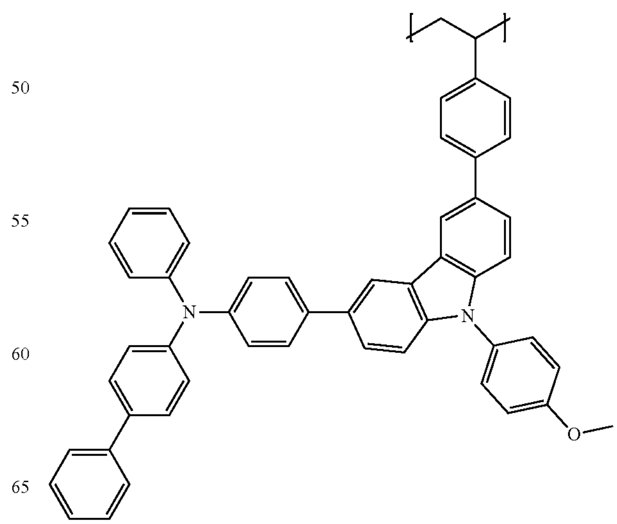

-continued
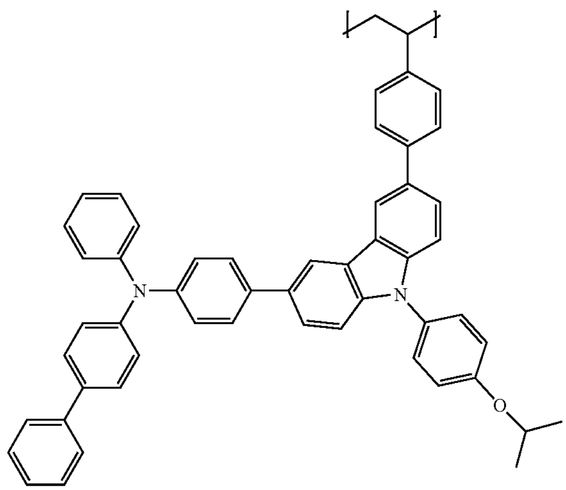
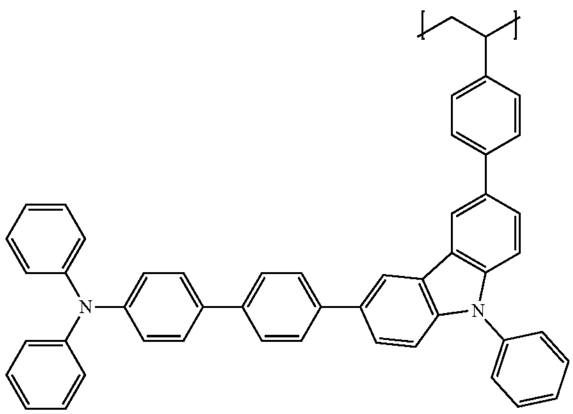
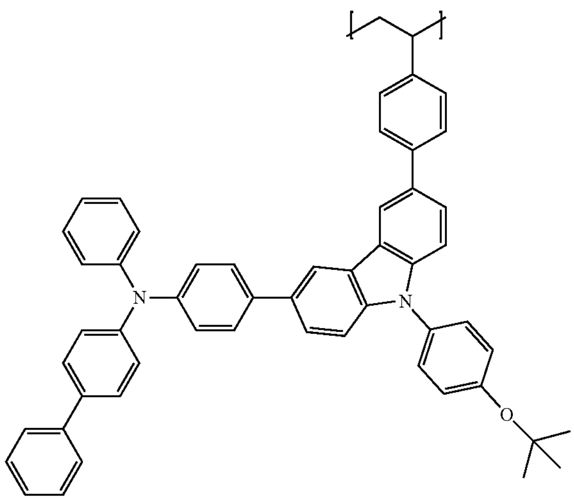
-continued
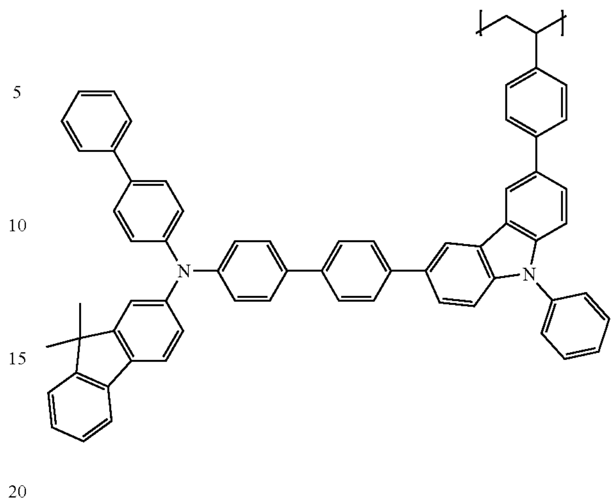
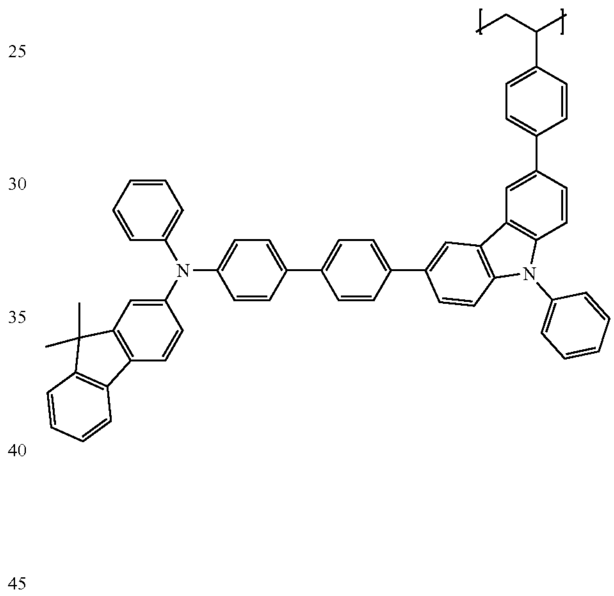
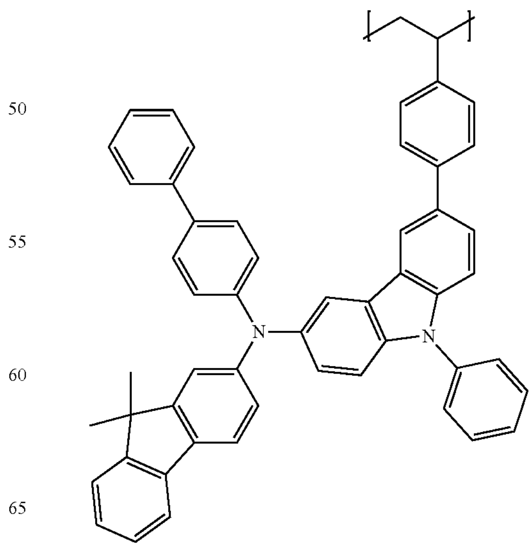

-continued
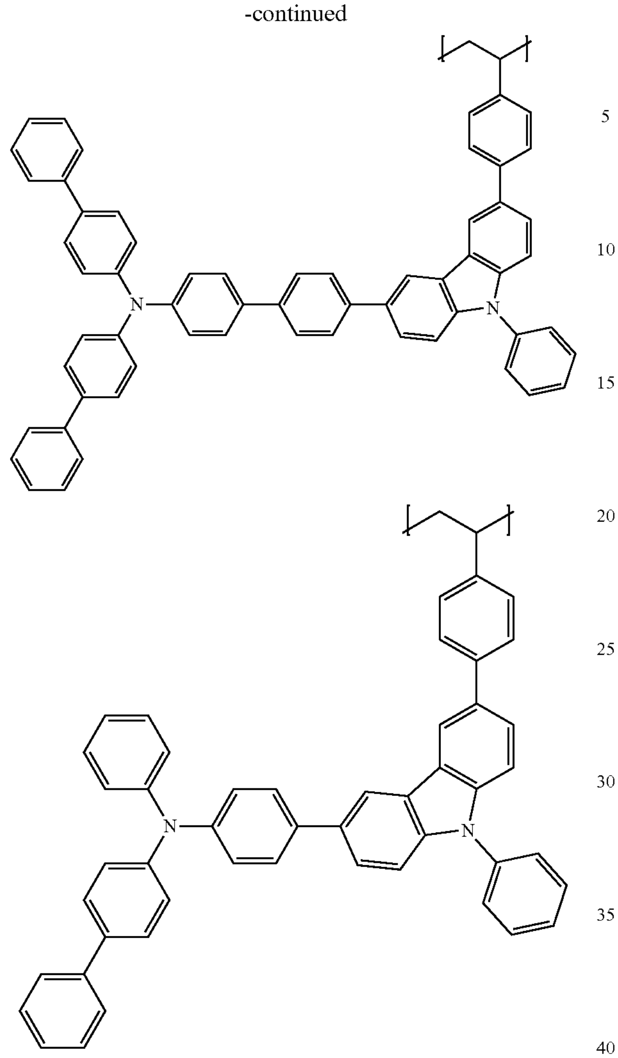
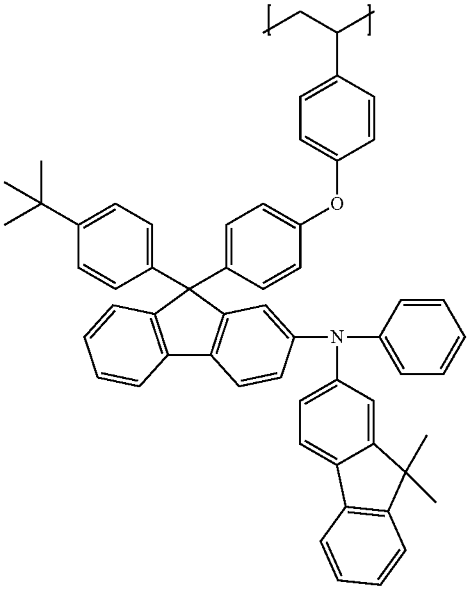
-continued
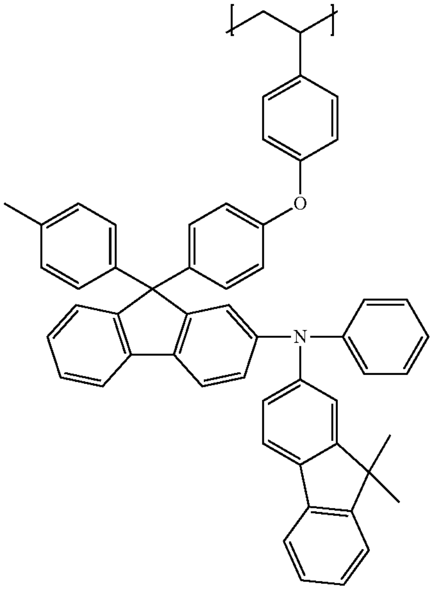
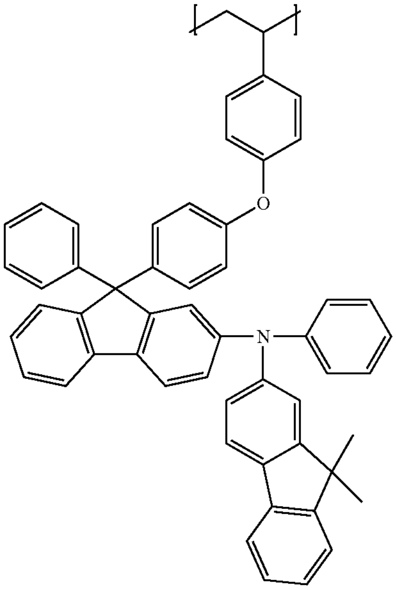

-continued
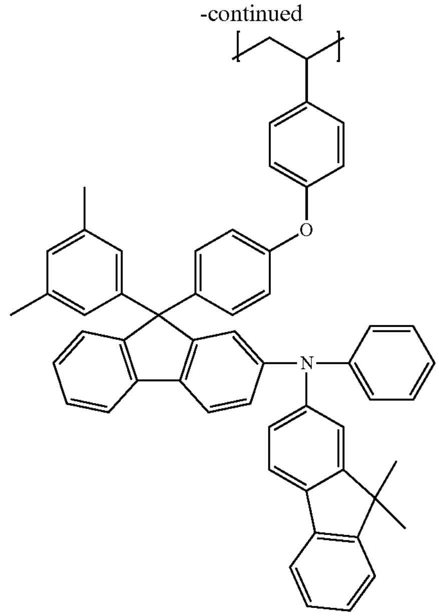
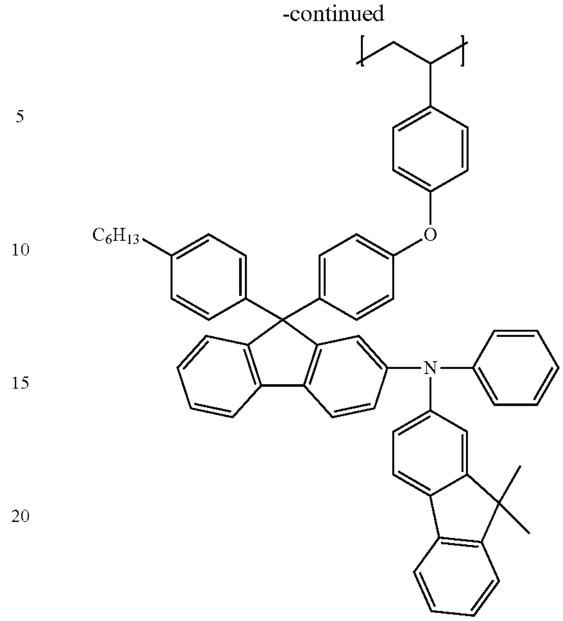
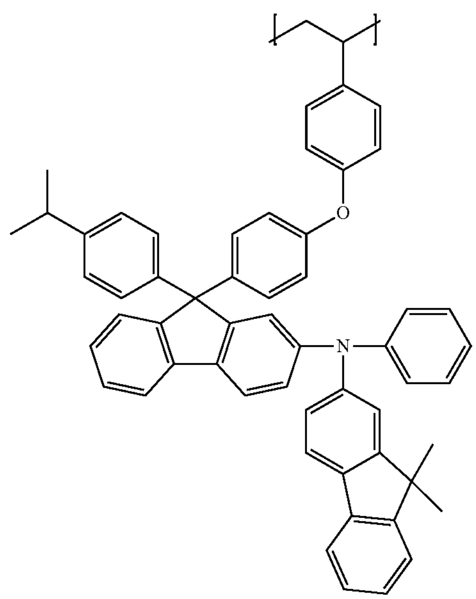
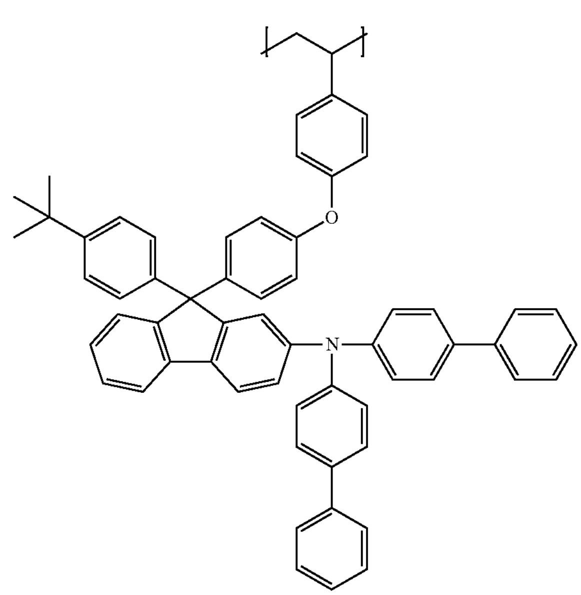

-continued
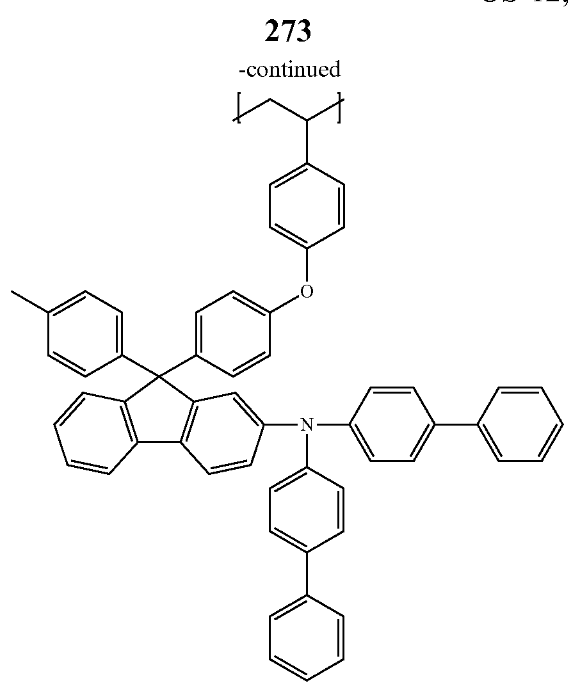
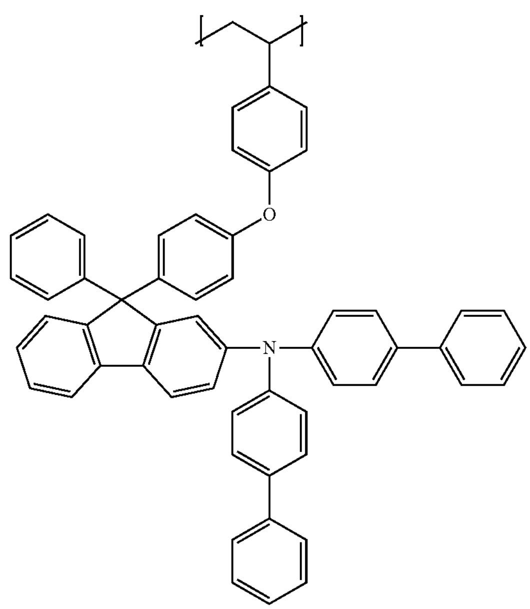
-continued
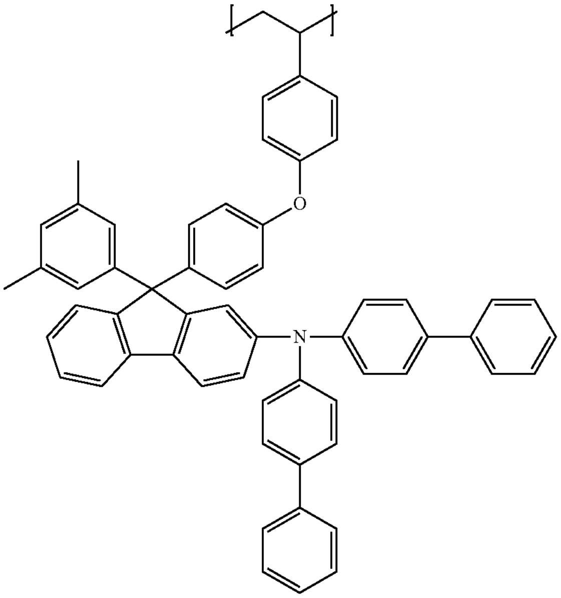
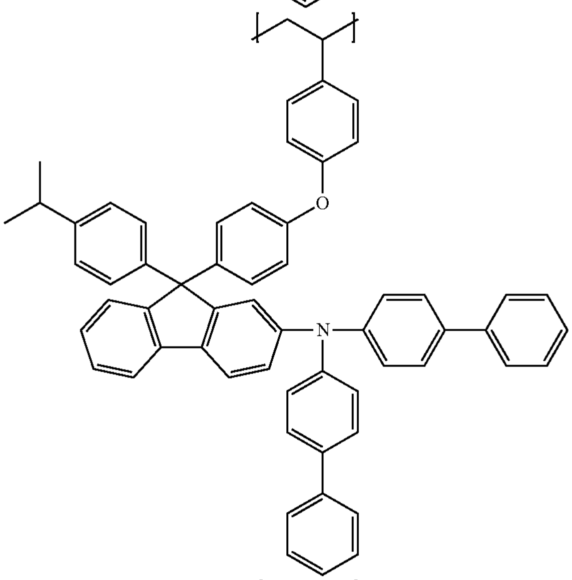
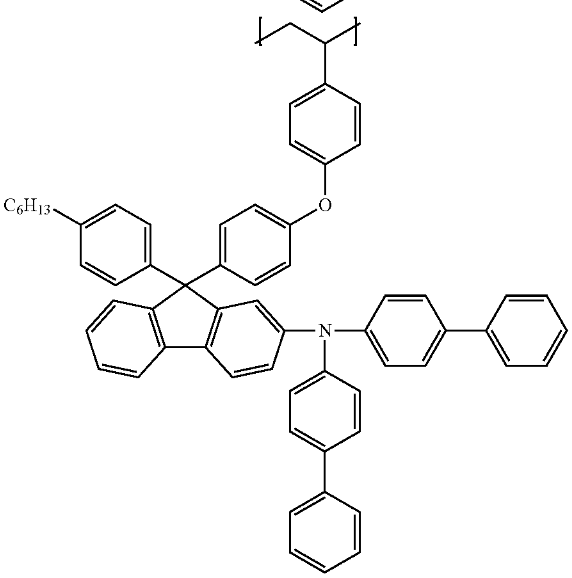

-continued
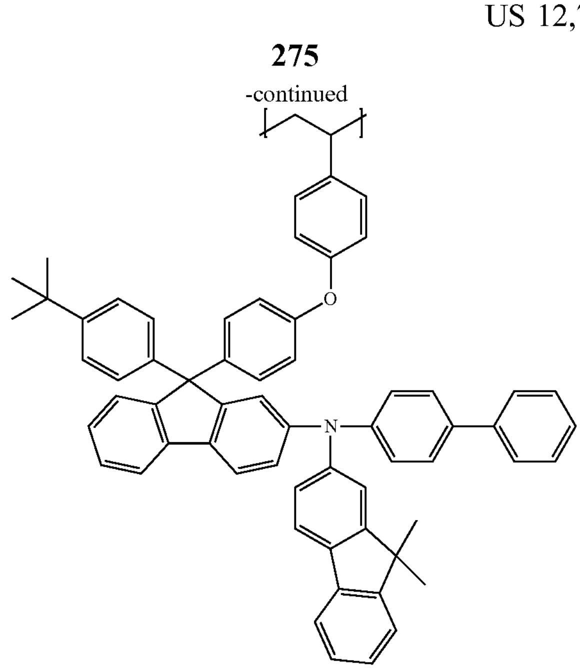
-continued
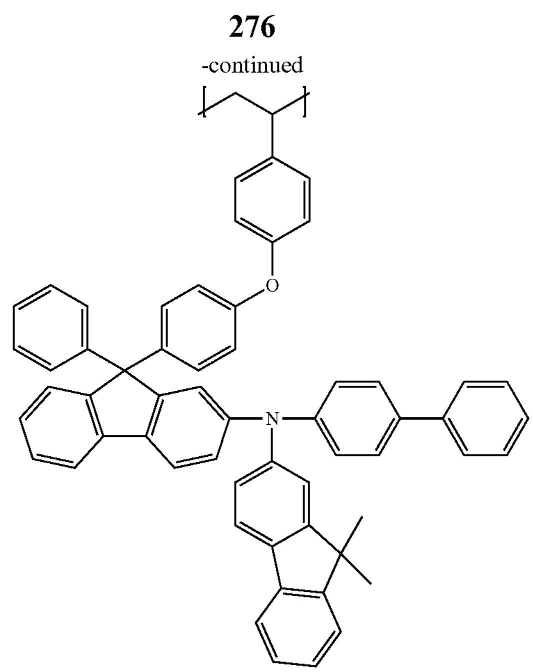
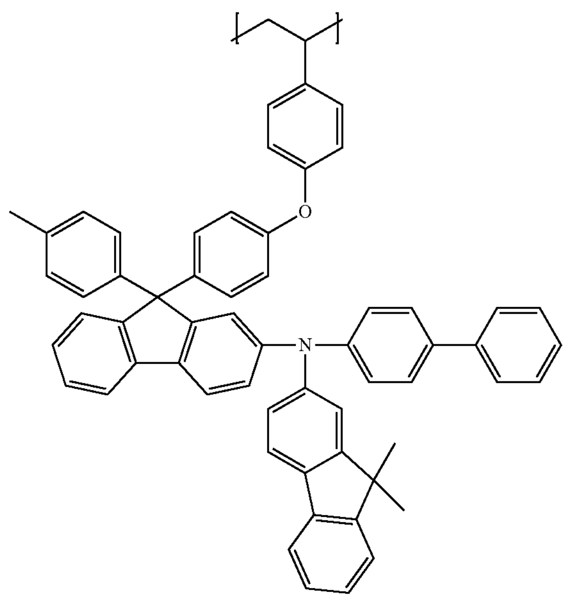
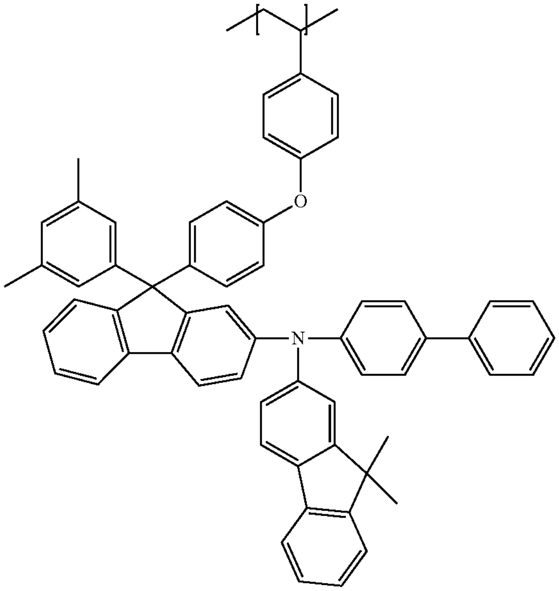

-continued
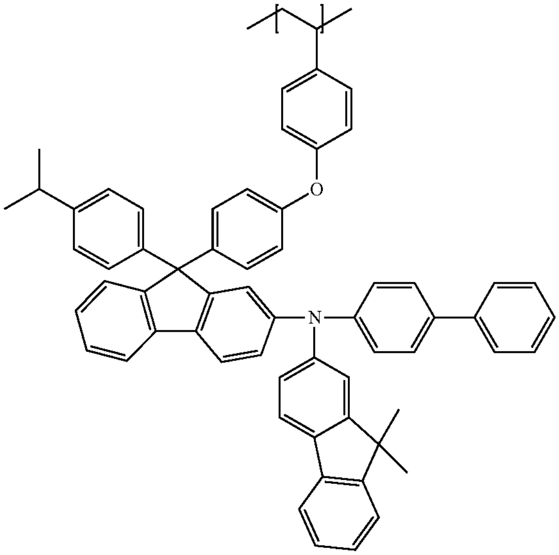
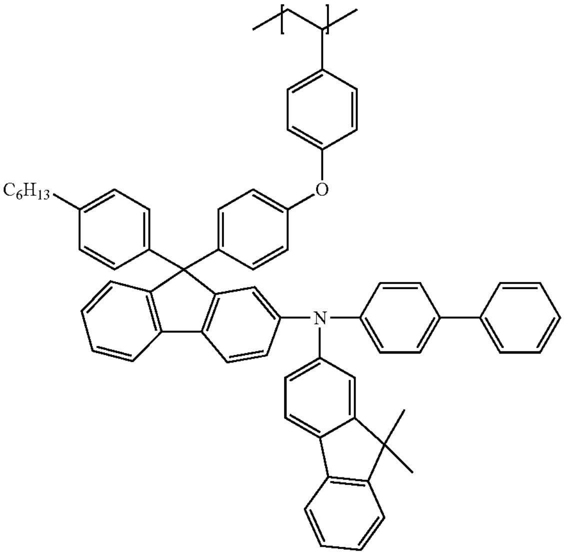
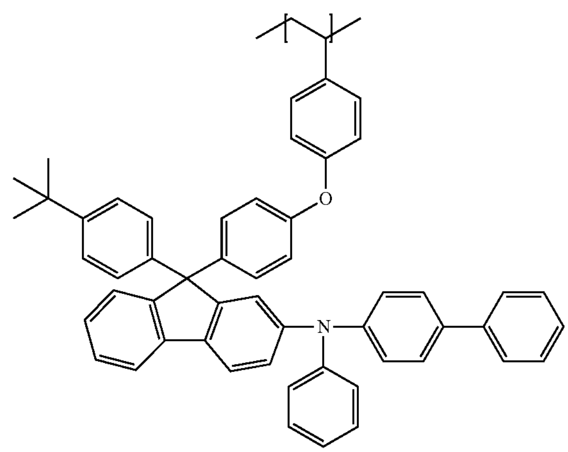
-continued
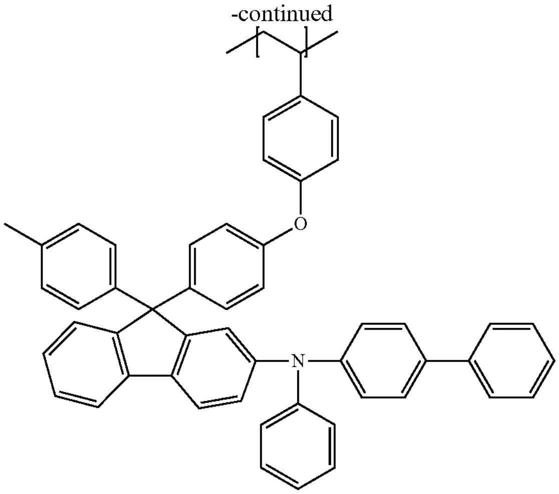
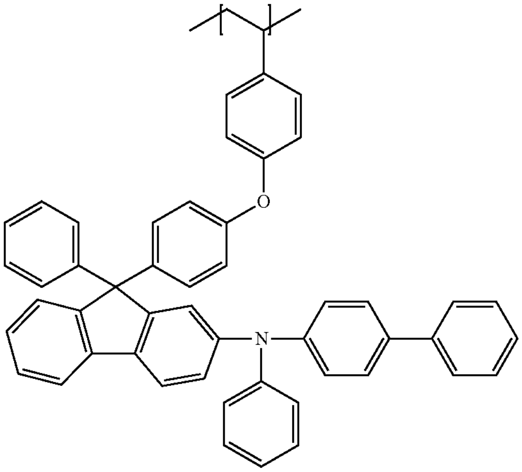
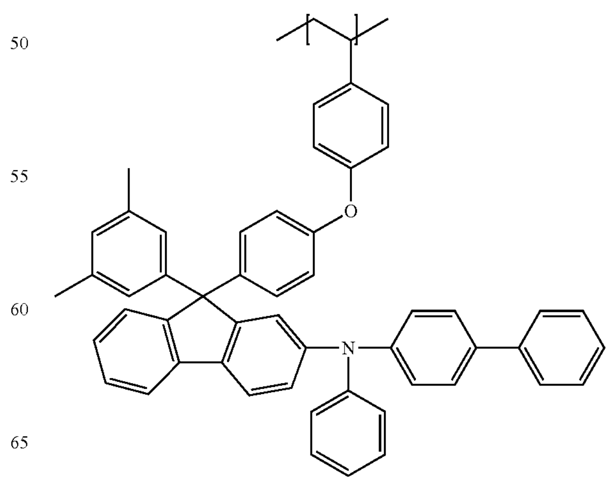

-continued
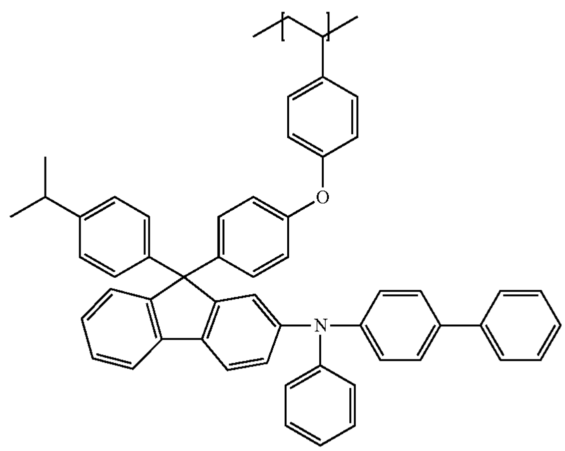
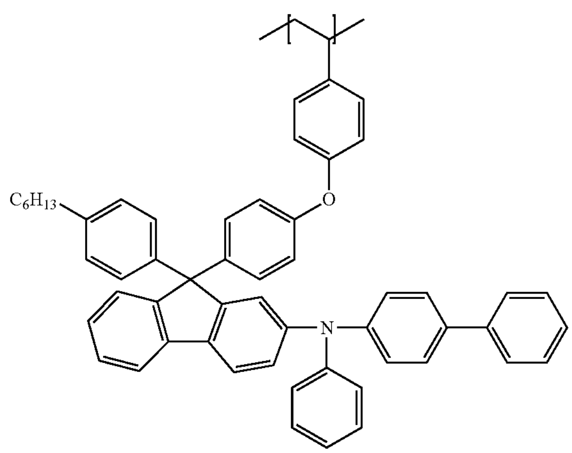
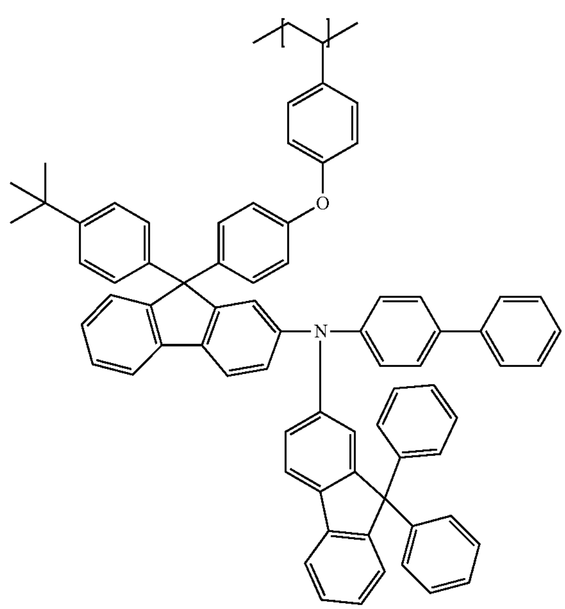
-continued
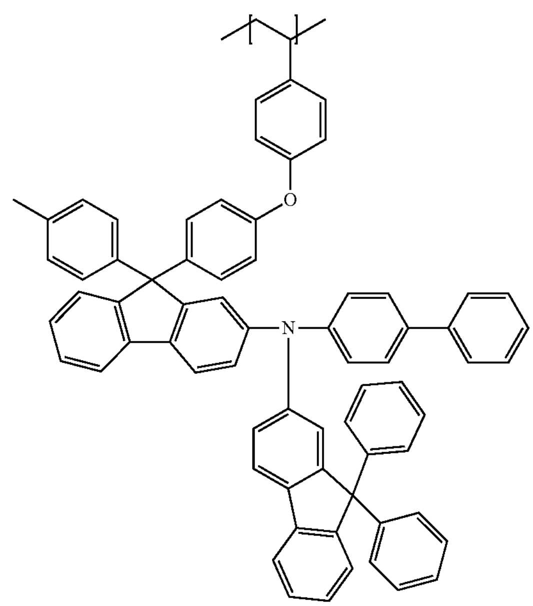
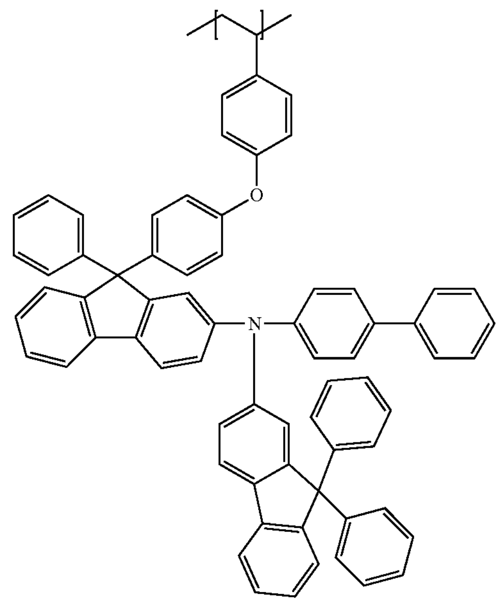

-continued
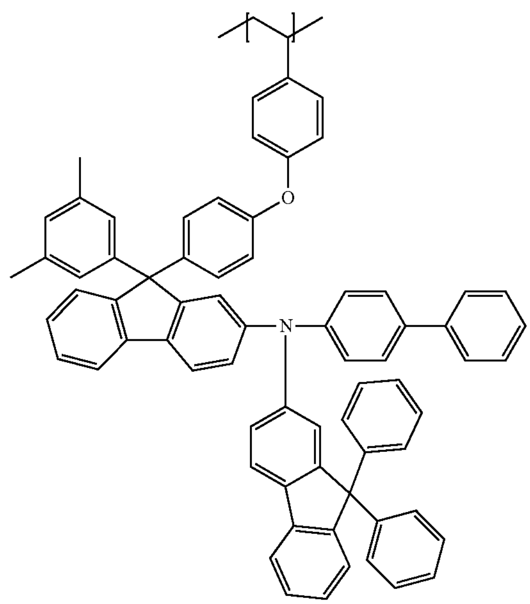
-continued
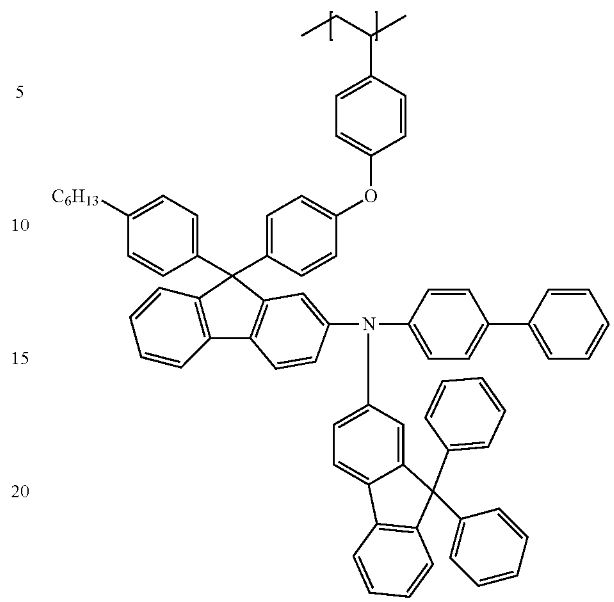
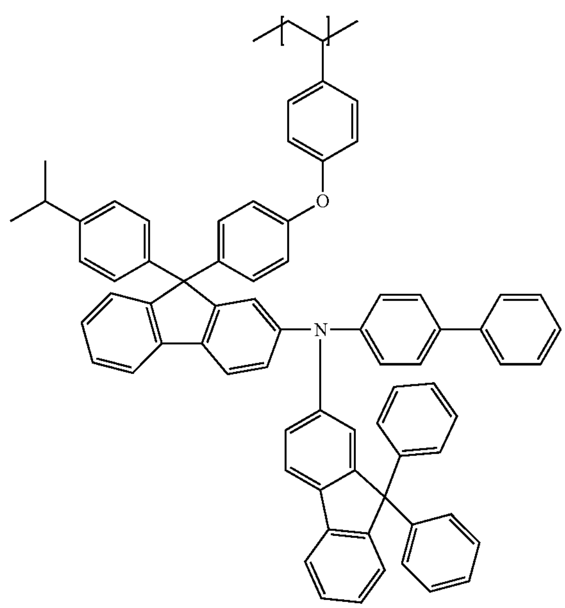
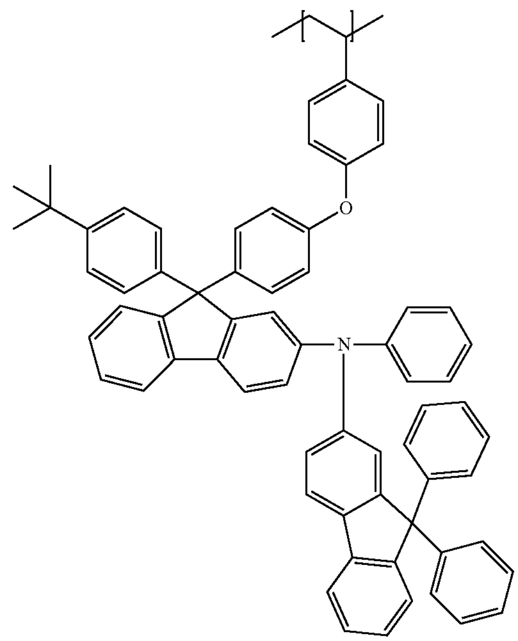

-continued
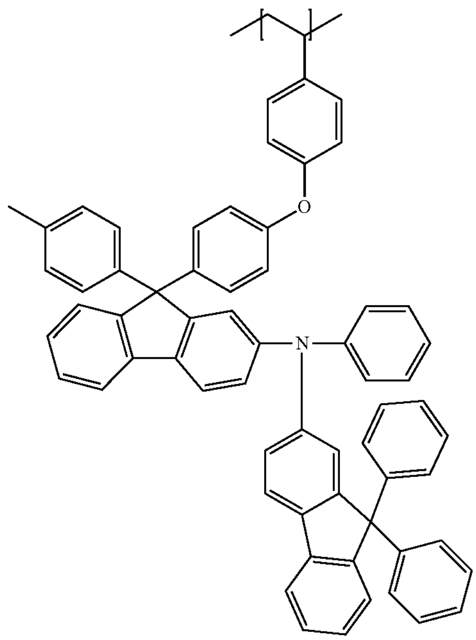
-continued
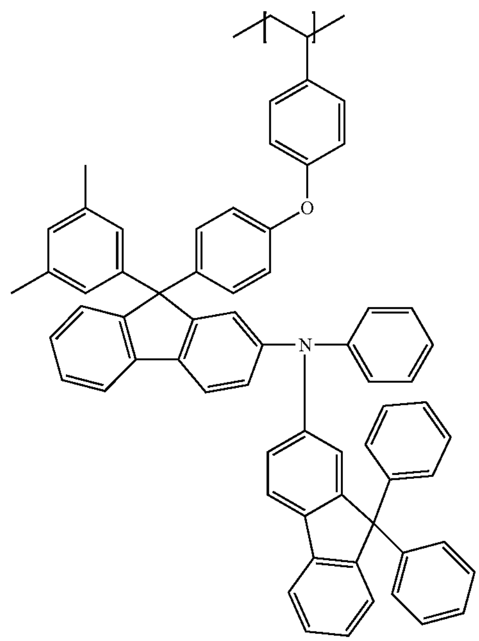
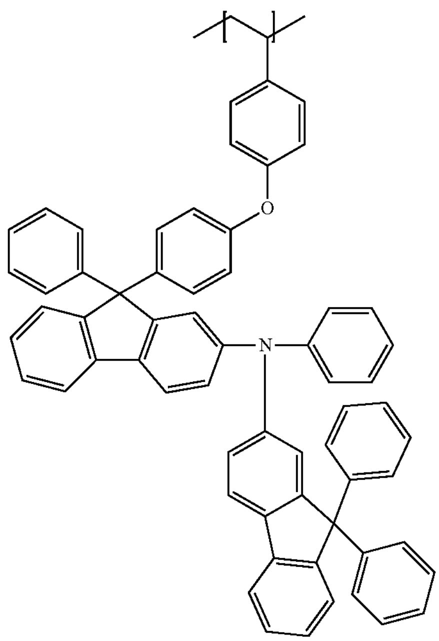
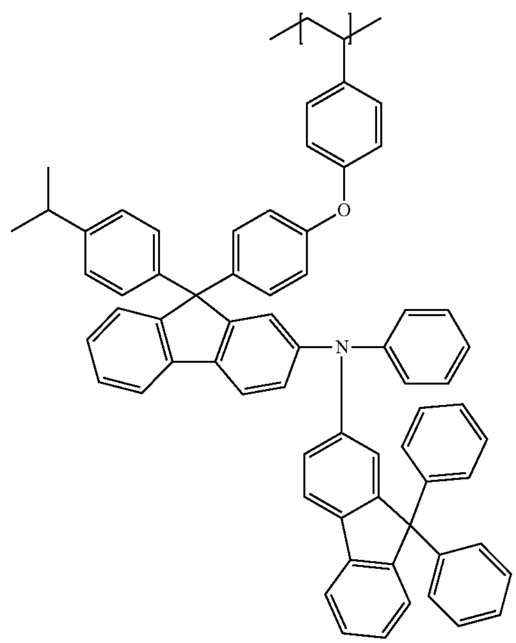

-continued
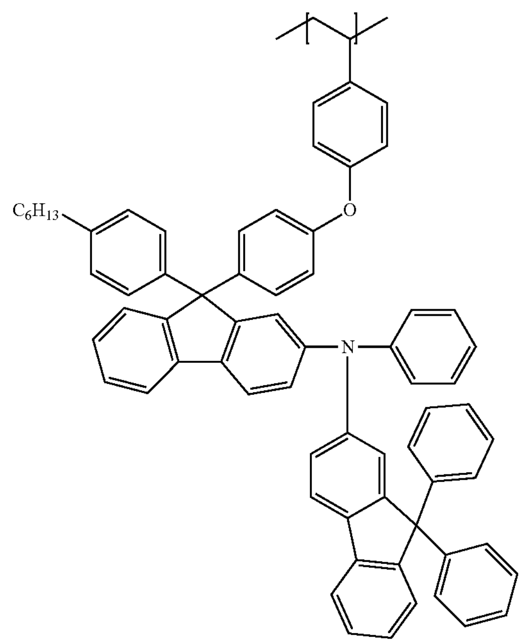
-continued
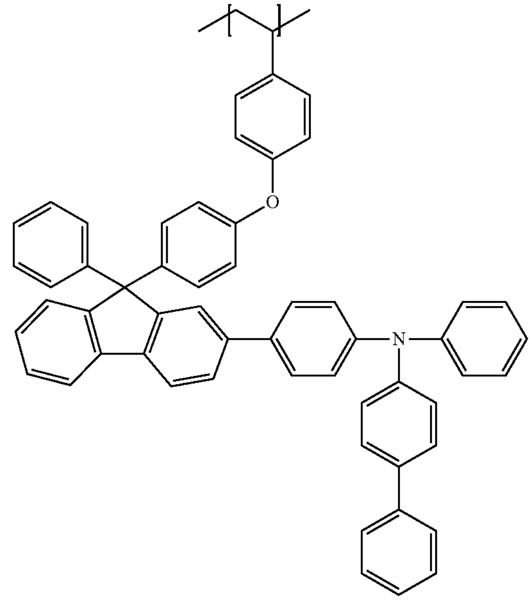
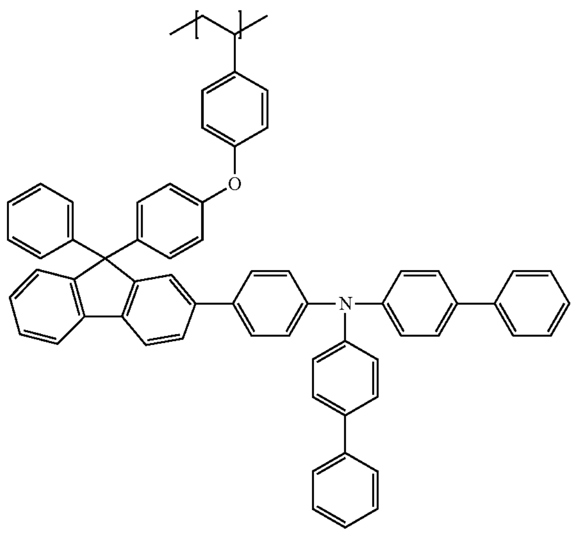
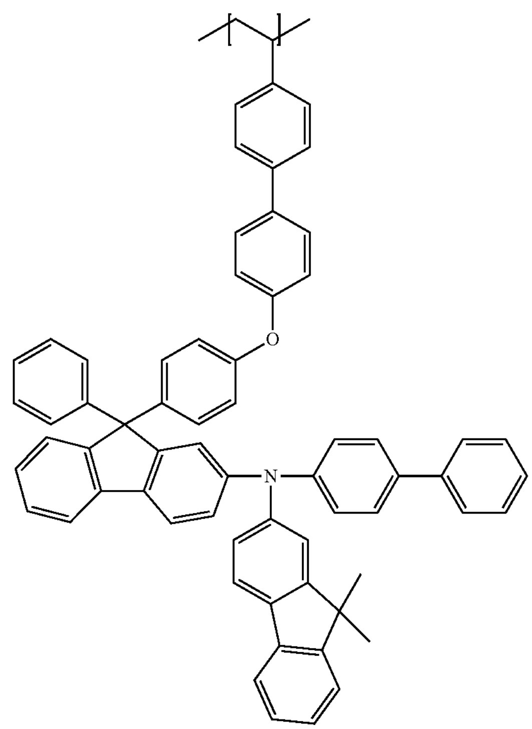

-continued
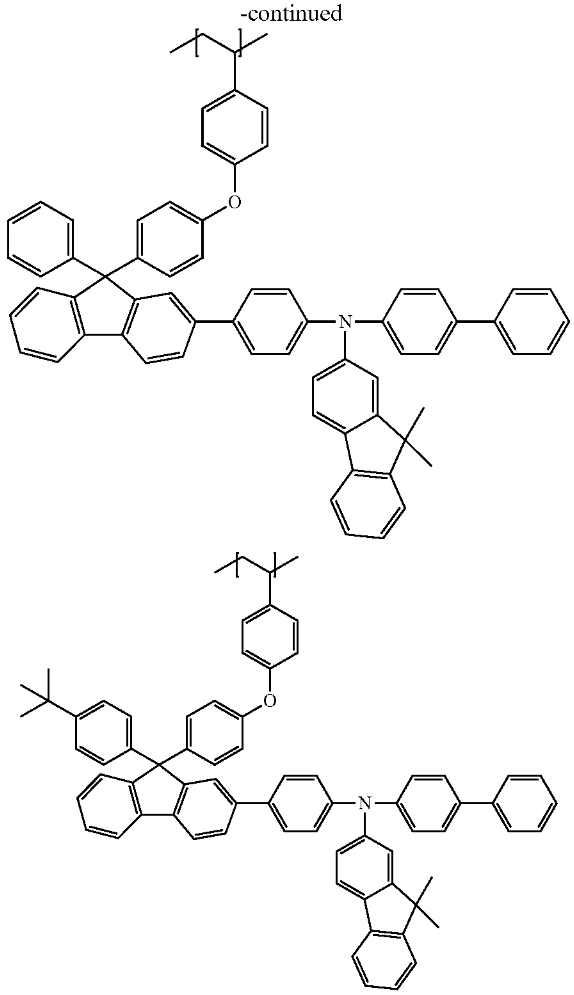
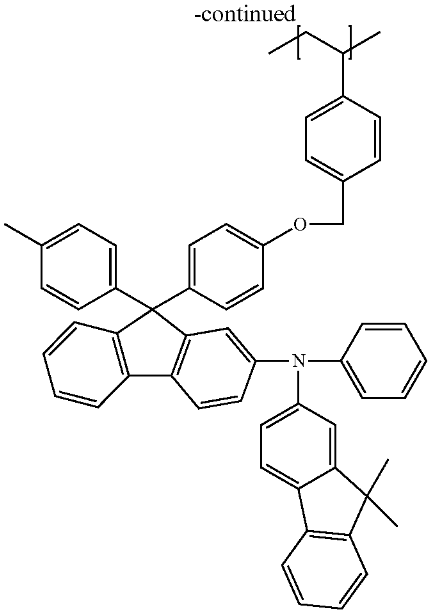
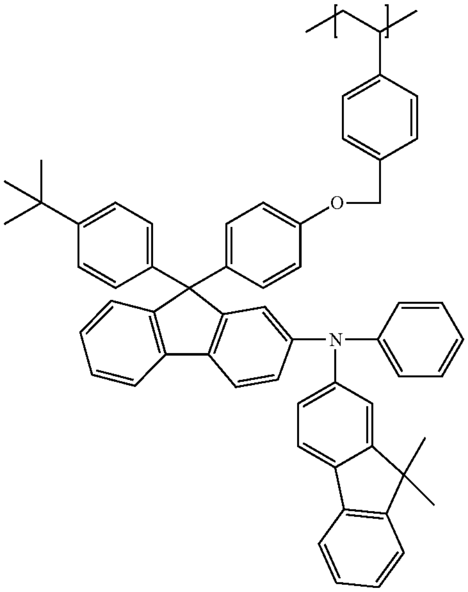
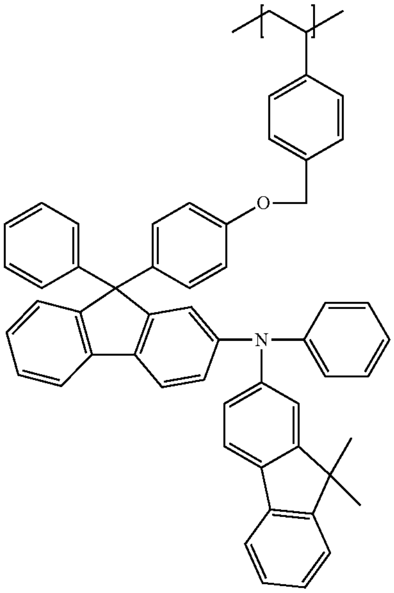

-continued
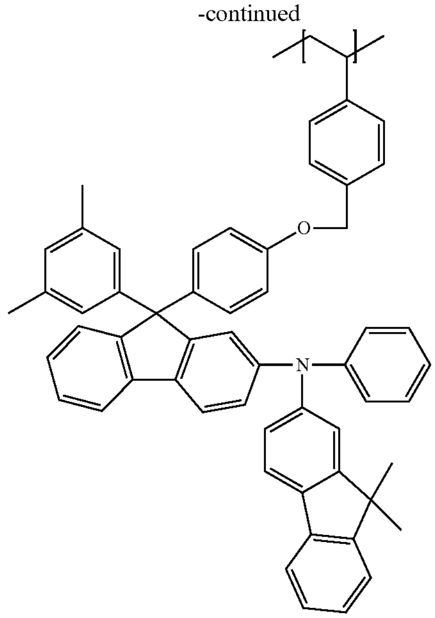
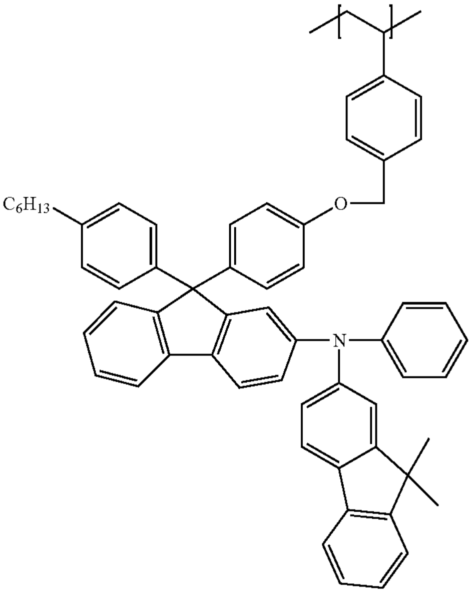
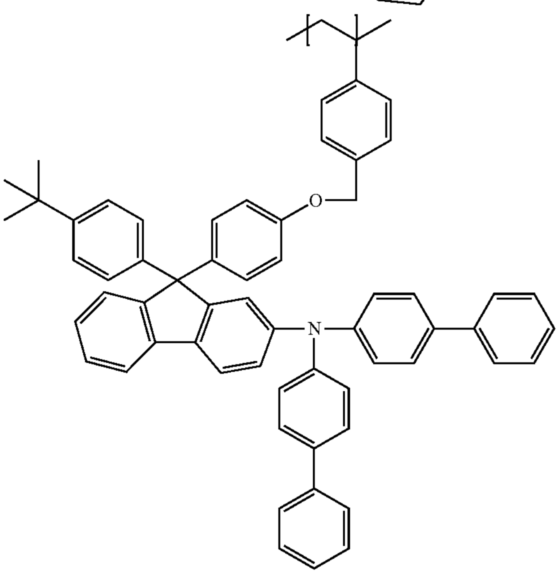
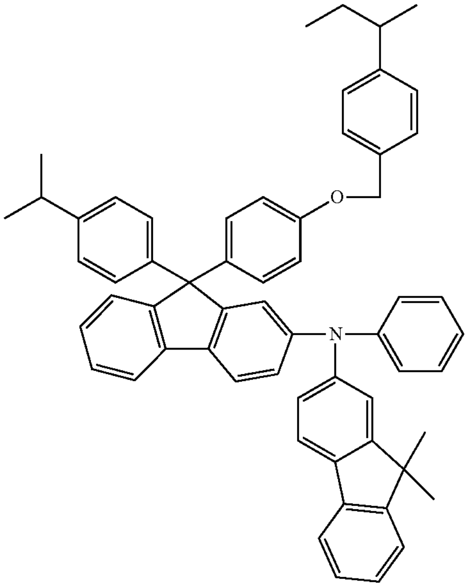
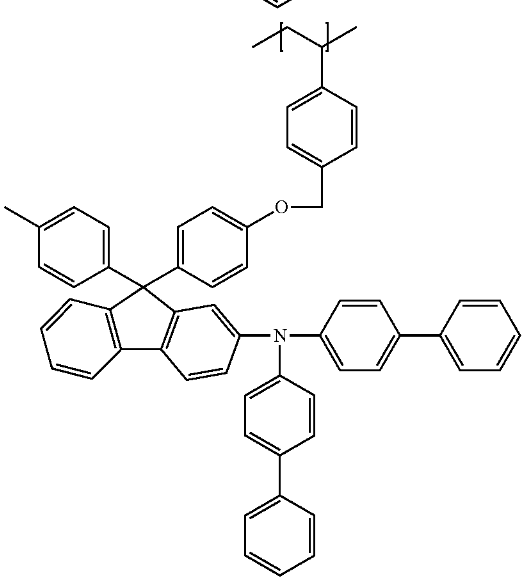

-continued
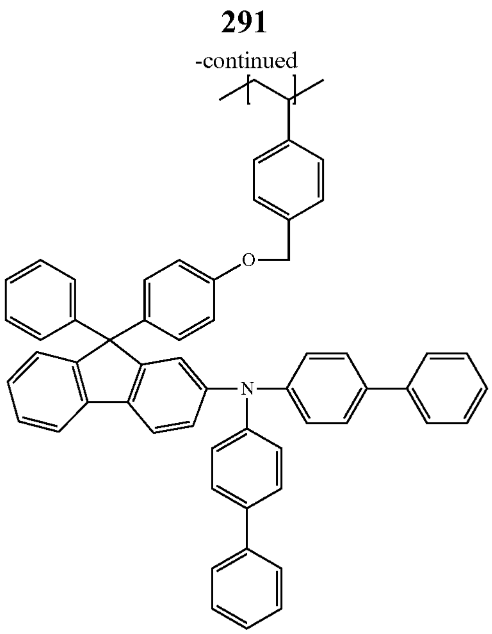
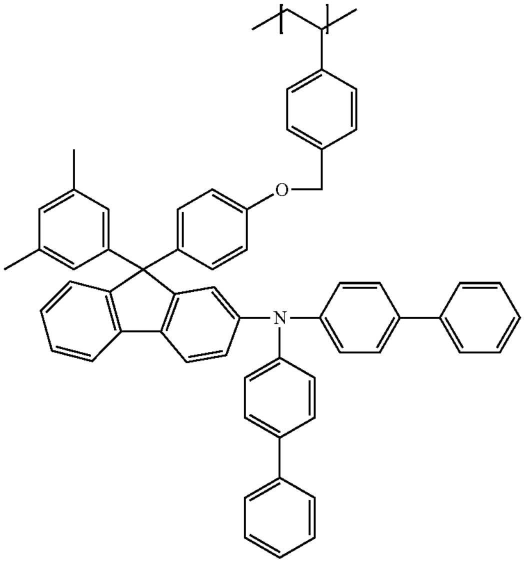
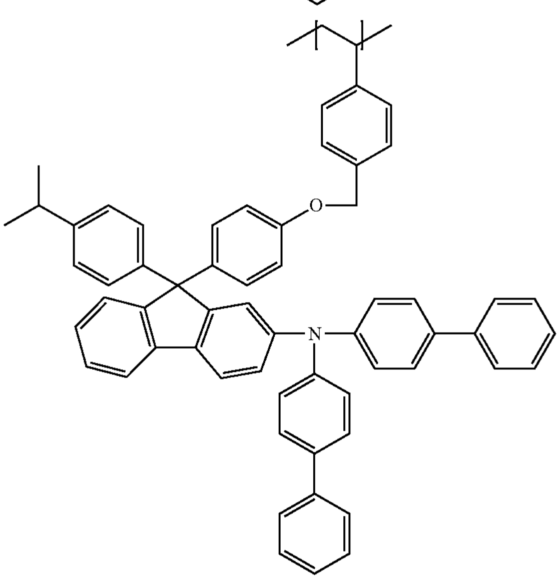
-continued
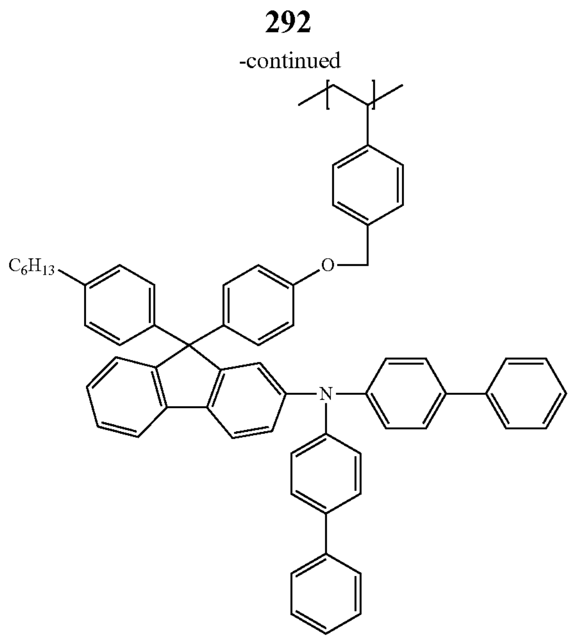
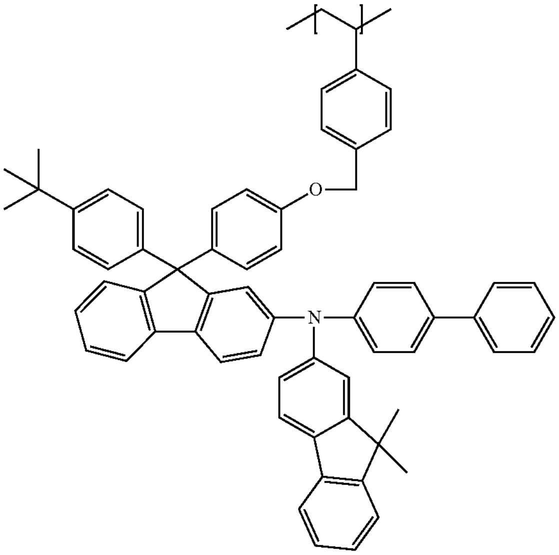
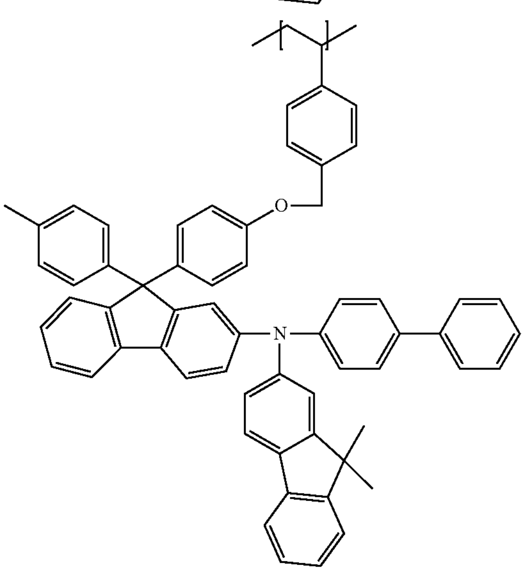

-continued
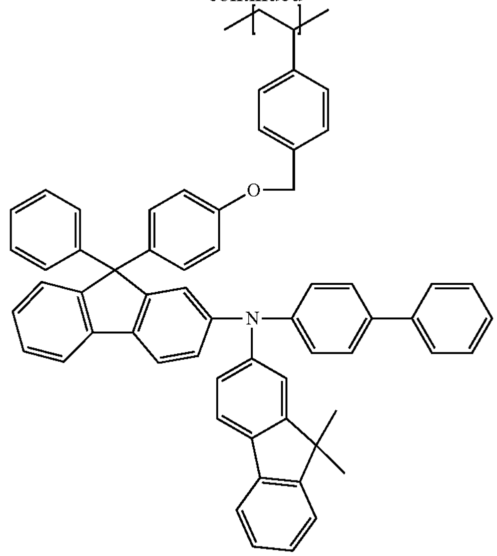
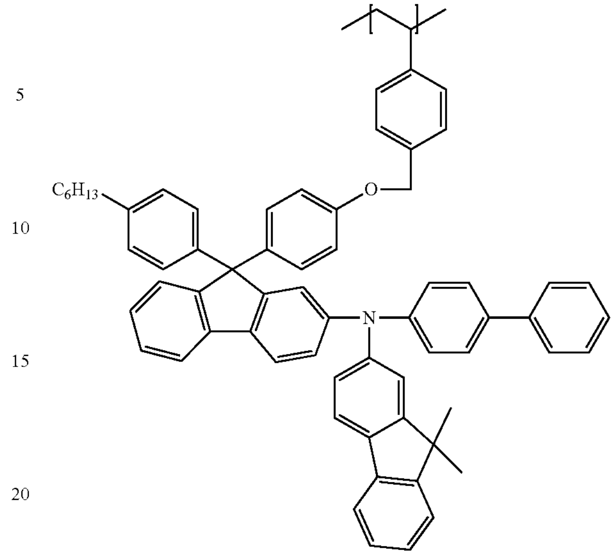
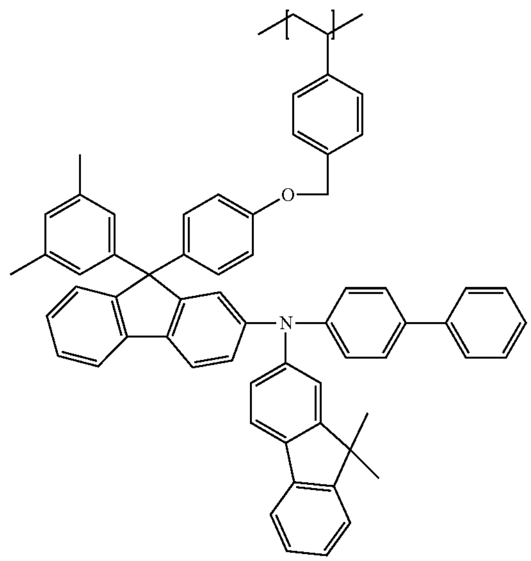
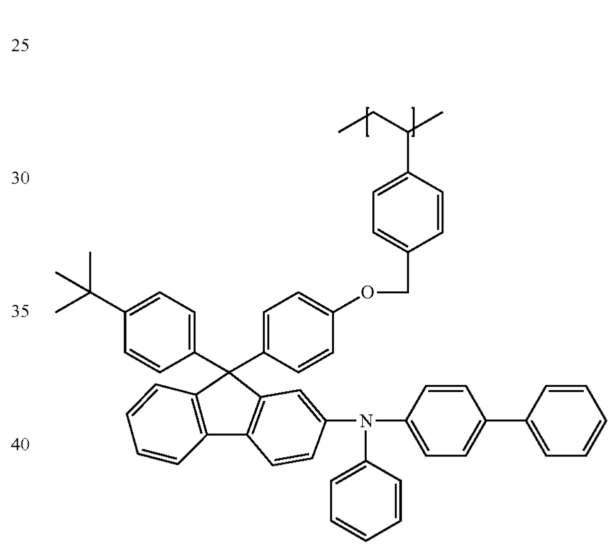
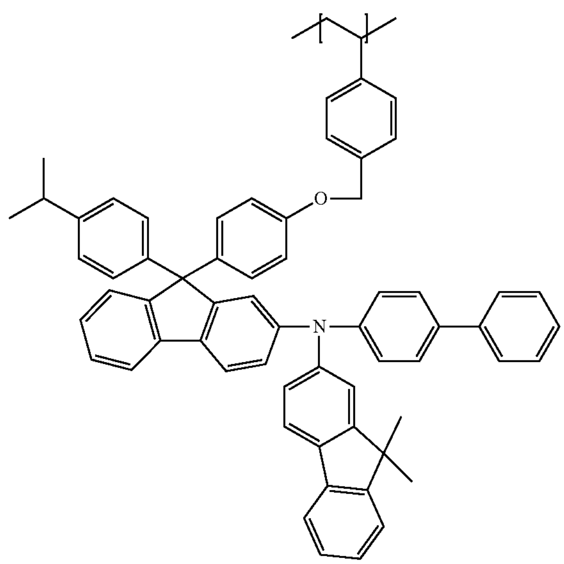
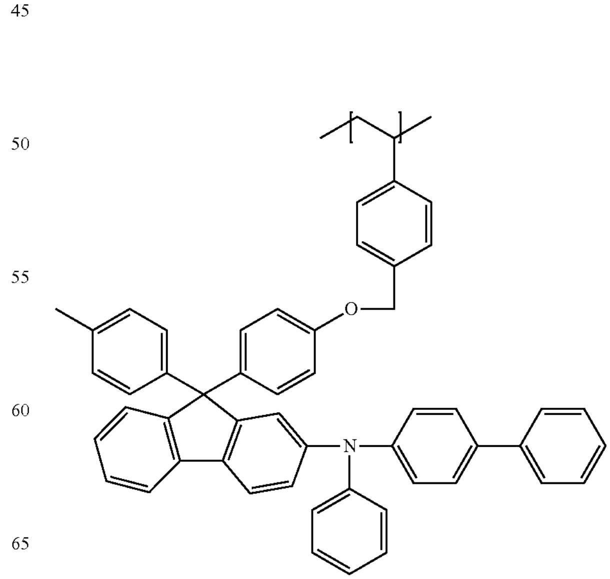
-continued -continued
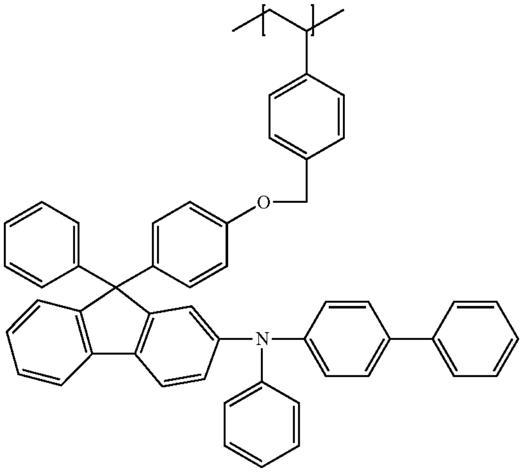
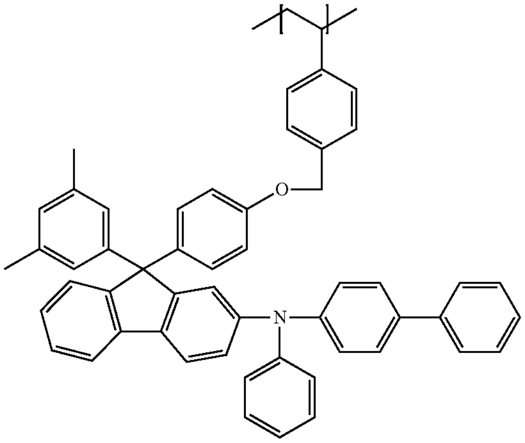
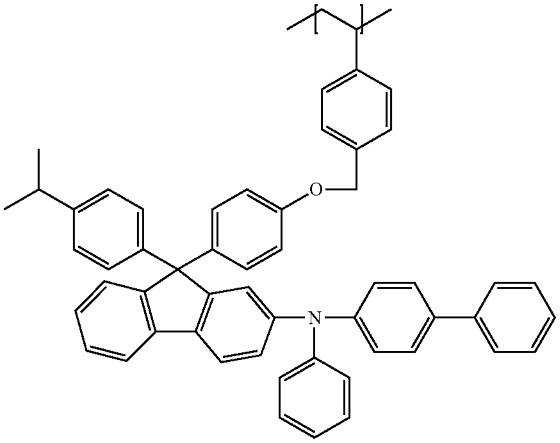
-continued
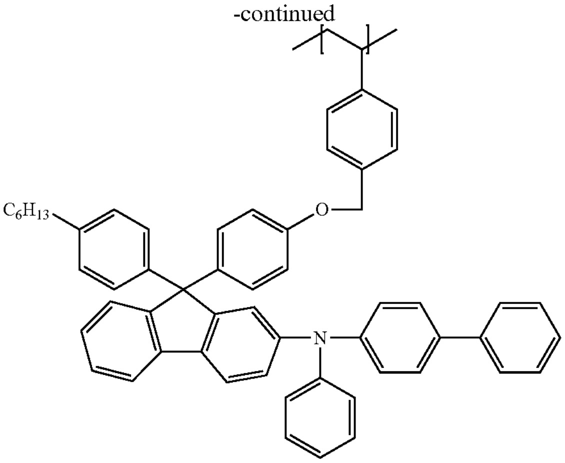
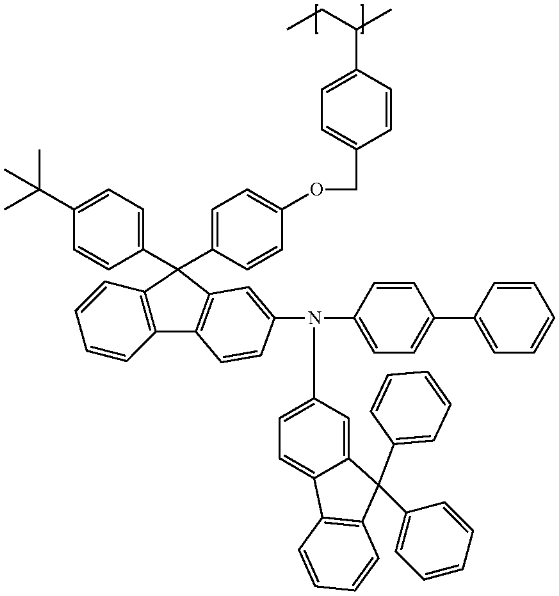
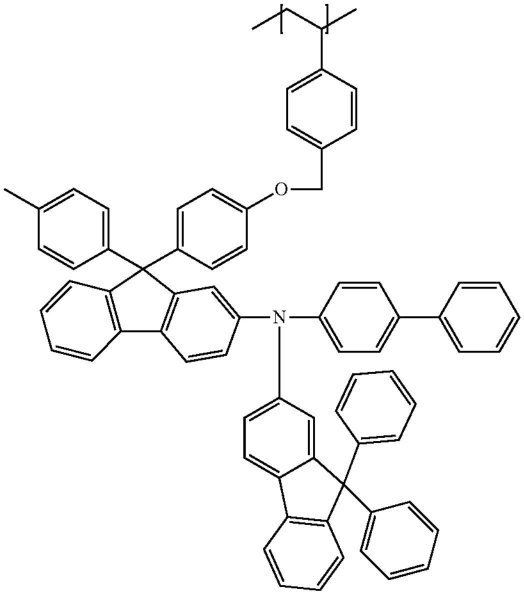

-continued
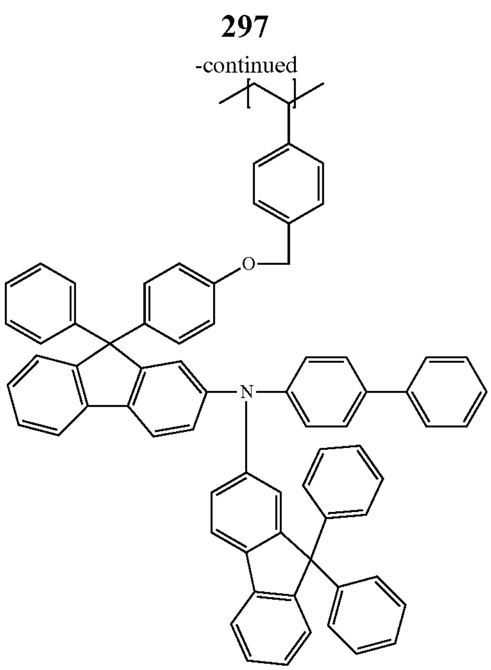
-continued
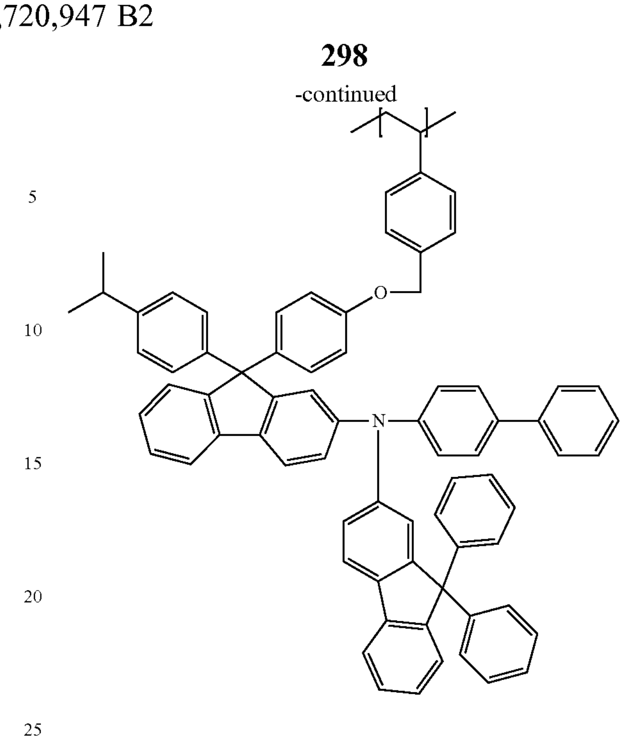
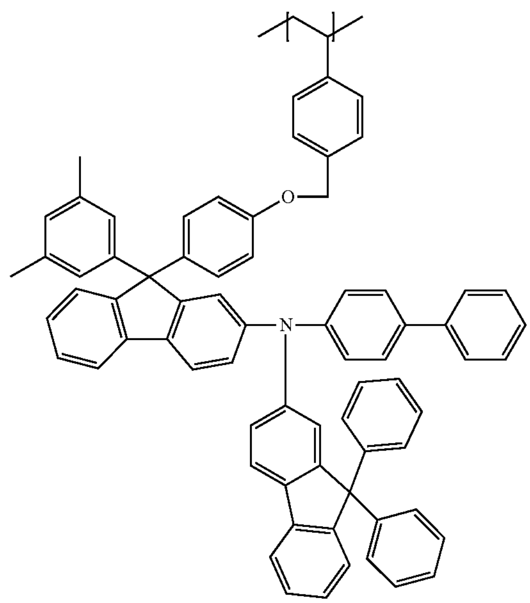
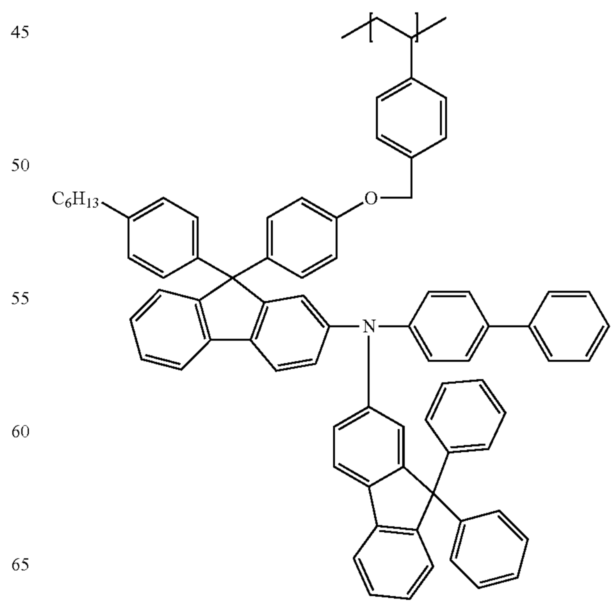

-continued
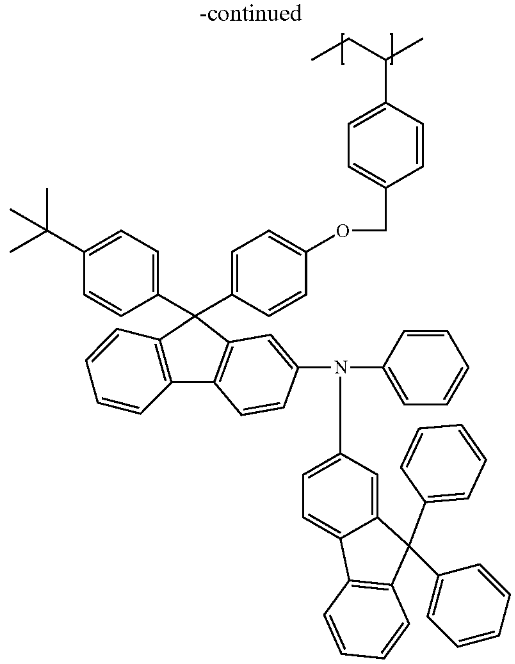
-continued
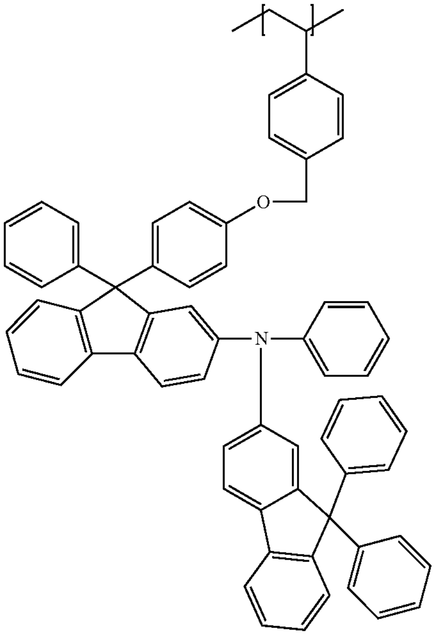
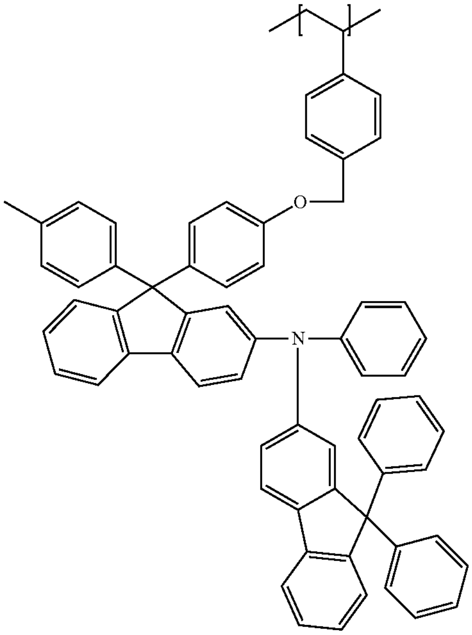
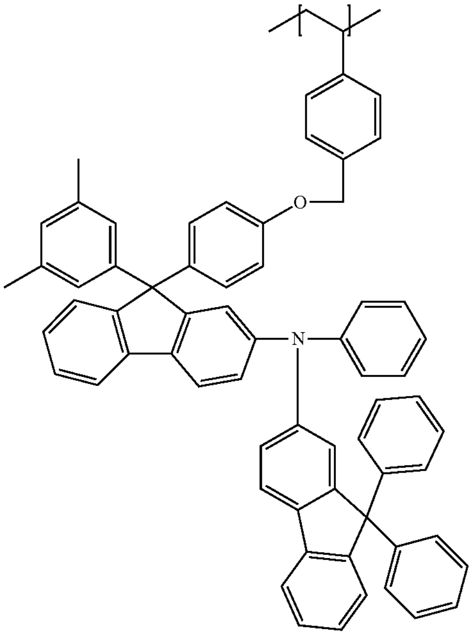

-continued

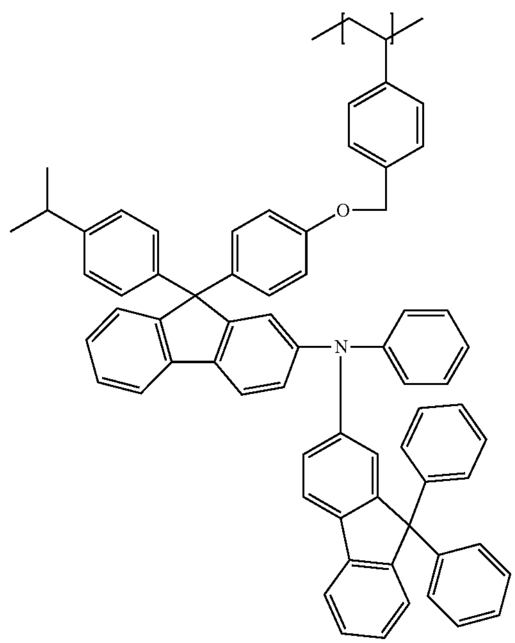

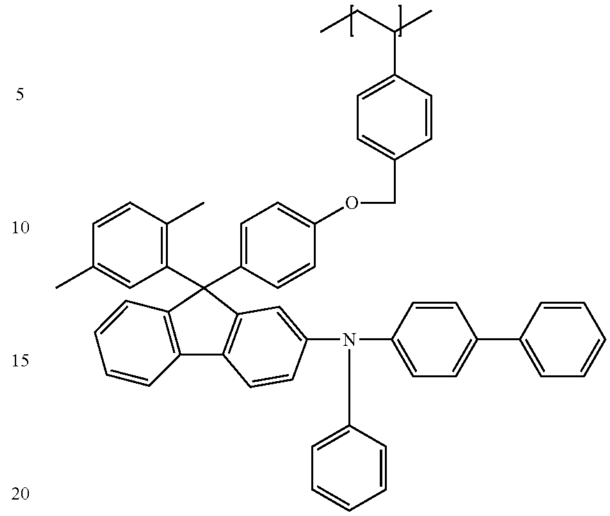

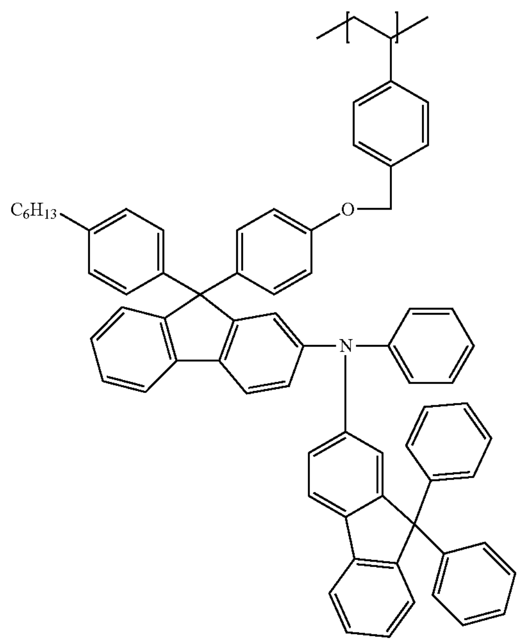

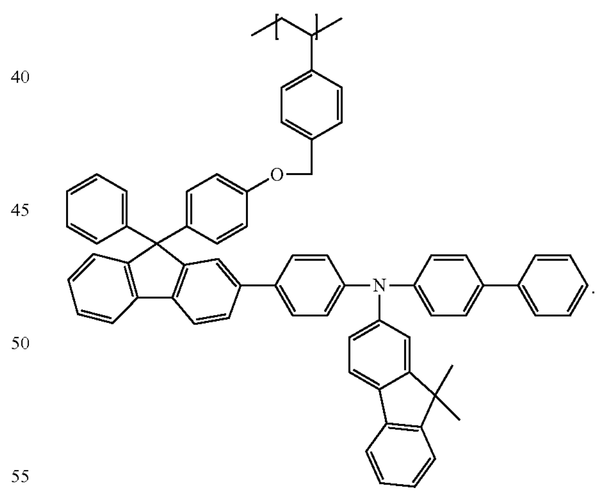

In Chemical Formula 2, x means the number of repetitions of the repeating unit represented by Chemical Formula 2, and may be an integer of 1 to 10,000. More preferably, it is an integer of 8 or more, or more, or 20 or more, and 3,000 or less, 1,000 or less, 500 or less, 200 or less, or 100 or less.

Preferably, the polymer is a homopolymer containing only the repeating unit represented by Chemical Formula 2. At this time, the terminal of the polymer may be hydrogen. When the polymer is a homopolymer containing only the repeating unit represented by Chemical Formula 2 in this way, it may be advantageous in terms of improving the lifetime of the organic light-emitting device, as compared with the copolymer further containing other repeating units.

Preferably, the polymer has a number average molecular weight (Mn) of 5,000 g/mol to 1,000,000 g/mol. More preferably, the polymer has a number average molecular weight (Mn, g/mol) of 5,000 or more, 10,000 or more, 20,000 or more, or 30,000 or more, and 300,000 or less, 100,000 or less, or 80,000 or less.

Preferably, the polymer has a weight average molecular weight (Mw) of 5,000 g/mol to 1,000,000 g/mol. More preferably, the polymer has a weight average molecular weight (Mw, g/mol) of 5,000 or more, 10,000 or more, 30,000 or more, or 40,000 or more, and 300,000 or less, 200,000 or less, or 100,000 or less.

Preferably, the polymer has a molecular weight distribution of 1 to 10. More preferably, the polymer has a molecular weight distribution of 1 to 3. Here, the molecular weight distribution means a value obtained by dividing the weight average molecular weight (Mw) by the number average molecular weight (Mn), that is, the weight average molecular weight (Mw)/number average molecular weight (Mn).

The number average molecular weight (Mn) and the weight average molecular weight (Mw) can be determined by GPC using PS standards. Specifically, for the analysis of molecular weight, PL mixed Bx2 can be used as the column, and tetrahydrofuran (THF) (filtered with 0.45 m) can be used as the solvent. At this time, it is preferable that 100 L of the sample is injected (a sample concentration of 1 mg/mL and a flow rate of 1.0 mL/min), and the column temperature is set at 40° C. Then, an Agilent RI detector is used as the detector, and the molecular weight of the polymer to be analyzed is determined through the data processing of the ChemStation program.

The polymers can be at least 10% deuterated. Preferably, the polymer may be at least 20%, at least 30%, at least 40%, at least 50%, at least 60%, at least 70%, at least 80%, at least 90%, or 100% deuterated.

Meanwhile, the repeating unit represented by Chemical Formula 2 is derived from a monomer represented by the following Chemical Formula 2':

[Chemical Formula 2']

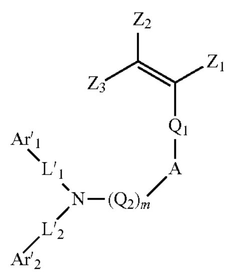

in Chemical Formula 2', $Z_1$ to $Z_3$, $Q_1$, $Q_2$, m, A, $L'_1$, $L'_2$, $Ar'_1$ and $Ar'_2$ are as defined in Chemical Formula 2.

At this time, the repeating unit represented by Chemical Formula 2A is derived from a monomer represented by the following Chemical Formula 2A', and the repeating unit represented by Chemical Formula 2B is derived from a monomer represented by the following Chemical Formula 2B':

[Chemical Formula 2A']

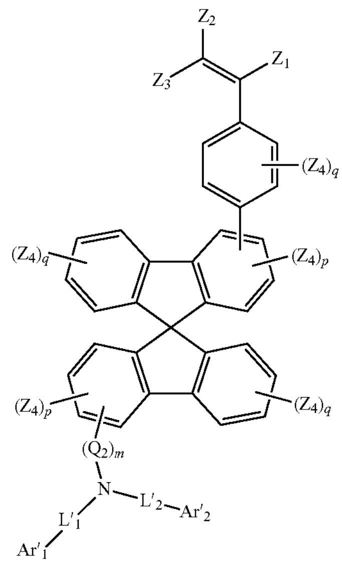

[Chemical Formula 2B']

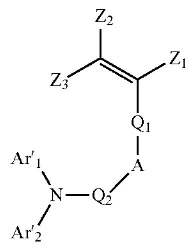

in Chemical Formulas 2A' and 2B', $Z_1$ to $Z_3$, $Q_1$, $Q_2$, m, A, $L'_1$, $L'_2$, $Z_4$, p, q, $Ar'_1$ and $Ar'_2$ are as defined in Chemical Formula 2.

Further, the monomer represented by Chemical Formula 2' can be prepared by a preparation method as shown in the following Reaction Scheme 2:

[Reaction Scheme 2]

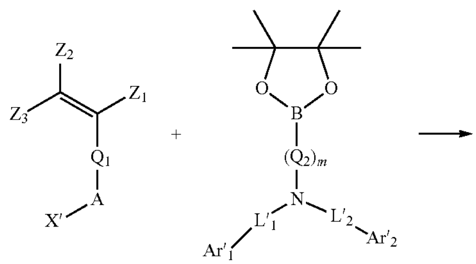

-continued

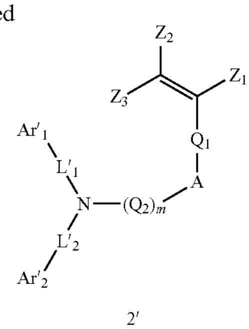

2' in the Reaction Scheme 2, the remaining substituents except for X' are the same as defined above, and X' is halogen, preferably bromo or chloro. The Reaction Scheme 2 is performed by a Suzuki coupling reaction, and the substituent group for the reaction can be changed as known in the art. The above preparation method may be further embodied in the Examples described hereinafter.

On the other hand, the method of forming the hole transport layer according to the present disclosure is a method of subjecting the polymer containing the repeating unit represented by Chemical Formula 2 to heat treatment or photo treatment to prepare a cured product, which will be described later.

(Light Emitting Layer)

The light emitting layer may include a host material and a dopant material. The host material may be a fused aromatic ring derivative, a heterocycle-containing compound or the like. Specific examples of the fused aromatic ring derivatives include anthracene derivatives, pyrene derivatives, naphthalene derivatives, pentacene derivatives, phenanthrene compounds, fluoranthene compounds, and the like. Examples of the heterocyclic-containing compounds include carbazole derivatives, dibenzofuran derivatives, ladder-type furan compounds, pyrimidine derivatives, and the like, but are not limited thereto.

Examples of the dopant material include an aromatic amine derivative, a styrylamine compound, a boron complex, a fluoranthene compound, a metal complex, and the like. Specifically, the aromatic amine derivative is a substituted or unsubstituted fused aromatic ring derivative having an arylamino group, and examples thereof include pyrene, anthracene, chrysene, periflanthene and the like, which have an arylamino group. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, the metal complex includes an iridium complex, a platinum complex, and the like, but is not limited thereto.

(Electron Transport Layer)

The organic light emitting device according to the present disclosure may include an electron transport layer on the light emitting layer.

The electron transport layer is a layer receiving electrons from an electron injection layer and transporting the electrons to a light emitting layer, the electron transport material is a material that can receive the electrons well from a cathode and transport the electrons to a light emitting layer, and a material having large mobility to the electrons is suitable. Specific examples thereof include an 8-hydroxyquinoline Al complex; a complex including $Alq_3$; an organic radical compound; a hydroxyflavone-metal complex, and the like, but are not limited thereto. The electron transport layer may be used together with a predetermined desired cathode material as used according to the prior art. In particular, an example of an appropriate cathode material is a general material having the low work function and followed by an aluminum layer or a silver layer. Specific examples thereof include cesium, barium, calcium, ytterbium, and samarium, and each case is followed by the aluminum layer or the silver layer.

(Electron Injection Layer)

The organic light emitting device according to the present disclosure may include an electron injection layer between an electron transport layer (or a light emitting layer) and a cathode, if necessary.

The electron injection layer is a layer for injecting electrons from the electrode, and a compound which has a capability of transporting the electrons, an electron injecting effect from the cathode, and an excellent electron injecting effect to the light emitting layer or the light emitting material, prevents movement of an exciton generated in the light emitting layer to the hole injection layer, and has an excellent thin film forming ability is preferable. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone, and the like, and its derivative, a metal complex compound, a nitrogen-containing 5-membered cycle derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

Meanwhile, the organic light emitting device may include the electron transport layer and the electron injection layer as separate layers, or alternatively, it may include a single layer such as an electron injection and transport layer.

(Organic Light Emitting Device)

The organic light emitting device according to the present disclosure may be a normal type organic light emitting device in which an anode, at least one organic material layer, and a cathode are sequentially stacked on a substrate. Further, the organic light emitting device according to the present disclosure may be an inverted type organic light emitting device in which a cathode, at least one organic material layer and an anode are sequentially stacked on a substrate. For example, the structure of an organic light emitting device according to one embodiment of the present disclosure is illustrated in FIGS. 1 and 2.

FIG. 1 shows an example of an organic light emitting device comprising a substrate 1, an anode 2, a hole injection layer 3, a hole transport layer 4, a light emitting layer 5 and a cathode 6. In such a structure, the hole injection layer includes a cured product of the compound represented by Chemical Formula 1, and the hole transport layer includes a polymer including the repeating unit represented by Chemical Formula 2.

FIG. 2 shows an example of an organic light emitting device comprising a substrate 1, an anode 2, a hole injection layer 3, a hole transport layer 4, a light emitting layer 5, an electron transport layer 7, an electron injection layer 8 and a cathode 6. In such a structure, the hole injection layer includes a cured product of the compound represented by Chemical Formula 1, and the hole transport layer includes a polymer including a repeating unit represented by Chemical Formula 2. In this case, the electron transport layer and the electron injection layer may be provided as one layer such as an electron injection and transport layer.

In one example, at least one of the compound represented by Chemical Formula 1 and the polymer including the repeating unit represented by Chemical Formula 2 is at least 10% deuterated.

The organic light emitting device according to the present disclosure may be manufactured by materials and methods known in the art, except that the above-mentioned elements are used.

For example, the organic light emitting device according to the present disclosure can be manufactured by sequentially stacking an anode, an organic material layer and a cathode on a substrate. In this case, the organic light emitting device may be manufactured by depositing a metal, metal oxides having conductivity, or an alloy thereof on the substrate by using a PVD (physical vapor deposition) method such as a sputtering method or an e-beam evaporation method to form the anode, forming the organic material layer including the hole injection layer, the hole transport layer, the light emitting layer, and the electron transport layer thereon, and then depositing a material that can be used as the cathode thereon.

In addition to such a method, the organic light emitting device may be manufactured by sequentially depositing a cathode material, an organic material layer, and an anode material on a substrate (International Publication WO 2003/012890). However, the manufacturing method is not limited thereto.

In addition to such a method, the organic light emitting device may be manufactured by sequentially depositing a cathode material, an organic material layer, and an anode material on a substrate (International Publication WO 2003/012890). However, the manufacturing method is not limited thereto.

The organic light emitting device according to the present disclosure may be a front side emission type, a backside emission type, or a double side emission type according to the used material.

In addition, the compound according to the present disclosure may be included in an organic solar cell or an organic transistor in addition to an organic light emitting device.

(Coating Composition)

Meanwhile, the hole injection layer and the hole transport layer according to the present disclosure may be formed by a solution process, respectively. For this purpose, in some embodiments, there is provided a coating composition for forming a hole injection layer comprising the compound represented by Chemical Formula 1 and a solvent; and a coating composition for forming a hole transport layer comprising a polymer containing the repeating unit represented by Chemical Formula 2 and a solvent.

The solvent is not particularly limited as long as it is a solvent capable of dissolving or dispersing the compound according to the present disclosure. Examples of the solvent may include chlorine-based solvents such as chloroform, methylene chloride, 1,2-dichloroethane, 1,1,2-trichloroethane, chlorobenzene and o-dichlorobenzene; ether-based solvents such as tetrahydrofuran and dioxane; aromatic hydrocarbon-based solvents such as toluene, xylene, trimethylbenzene and mesitylene; aliphatic hydrocarbon-based solvents such as cyclohexane, methylcyclohexane, n-pentane, n-hexane, n-heptane, n-octane, n-nonane and n-decane; ketone-based solvents such as acetone, methyl ethyl ketone, and cyclohexanone; ester-based solvents such as ethyl acetate, butyl acetate and ethyl cellosolve acetate; polyalcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin and 1,2-hexanediol, and derivatives thereof; alcohol-based solvents such as methanol, ethanol, propanol, isopropanol and cyclohexanol; sulfoxide-based solvents such as dimethyl sulfoxide; amide-based solvents such as N-methyl-2-pyrrolidone and N,N-dimethylformamide; benzoate-based solvents such as butyl benzoate and methyl-2-methoxybenzoate; tetraline; 3-phenoxy-toluene, and the like. In addition, the above-mentioned solvents may be used singly or in combination of two or more solvents.

Preferably, the solvent of the coating composition for forming the hole injection layer and the solvent of the coating composition for forming the hole transport layer are different from each other.

Moreover, the viscosities of the coating compositions are preferably 1 cP to 10 cP, respectively, and coating is easy within the above range. Further, the concentration of the compound according to the present disclosure in the coating composition is preferably 0.1 wt/v % to 20 wt/v %.

In addition, the coating composition may further include one or two or more additives selected from the group consisting of a thermal polymerization initiator and a photopolymerization initiator.

Examples of the thermal polymerization initiator may include peroxide initiators such as methyl ethyl ketone peroxide, methyl isobutyl ketone peroxide, acetyl acetone peroxide, methyl cyclohexanone peroxide, cyclohexanone peroxide, isobutyryl peroxide, 2,4-dichlorobenzoyl peroxide, bis-3,5,5-trimethylhexanoyl peroxide, lauryl peroxide, benzoyl peroxide, or azo-based initiators such as azobis isobutylnitrile, azobis dimethylvaleronitrile and azobis cyclohexylnitrile, but are not limited thereto.

Examples of the photopolymerization initiator may include acetophenone-based or ketal-based photopolymerization initiators such as diethoxyacetophenone, 2,2-dimethoxy-1,2-diphenylethan-1-one, 1-hydroxy-cyclohexyl-phenyl-ketone, 4-(2-hydroxyethoxy)phenyl-(2-hydroxy-2-propyl)ketone, 2-benzyl-2-dimethylamino-1-(4-morpholinophenyl)butanone-1,2-hydroxy-2-methyl-1-phenylpropan-1-one, 2-methyl-2-morpholino(4-methylthiophenyl)propan-1-one and 1-phenyl-1,2-propanedion-2-(o-ethoxycarbonyl)oxime; benzoin ether-based photopolymerization initiators such as benzoin, benzoin methyl ether and benzoin ethyl ether; benzophenone-based photopolymerization initiators such as benzophenone, 4-hydroxybenzophenone, 2-benzoyl naphthalene, 4-benzoylbiphenyl and 4-benzoylphenyl ether; hioxanthone-based photopolymerization initiators such as 2-isopropylthioxanthone, 2-chlorothioxanthone, 2,4-dimethylthioxanthone, 2,4-diethylthioxanthone and 2,4-dichlorothioxanthone; and other photopolymerization initiators such as ethyl anthraquinone, 2,4,6-trimethylbenzoyldiphenylphosphine oxide, 2,4,6-trimethylbenzoylphenylethoxyphosphine oxide, bis(2,4,6-trimethylbenzoyl)phenylphosphine oxide, bis(2,4-dimethoxy benzoyl)-2,4,4-trimethylpentylphosphine oxide, but are not limited thereto.

Moreover, those having a photopolymerization promoting effect can also be used alone or in combination with the photopolymerization initiator. Examples thereof include triethanolamine, methyldiethanolamine, ethyl 4-dimethylaminobenzoate, isoamyl 4-dimethylamino benzoate, (2-dimethylamino)ethyl benzoate, 4,4'-dimethylaminobenzophenone, and the like, but are not limited thereto.

In another embodiment of the present disclosure, there is provided a method for forming a hole injection layer and a hole transport layer using the above-mentioned coating composition. Specifically, the method includes the steps of: coating the above-mentioned coating composition for forming a hole injection layer onto an anode by a solution process; and subjecting the coated coating composition for forming a hole injection layer to heat treatment or photo treatment. Further, the method includes the steps of: coating the above-mentioned coating composition for forming a hole transport layer onto a hole injection layer by a solution process; and subjecting the coated coating composition for forming a hole transport layer to heat treatment or photo treatment.

The solution process uses the coating composition according to the present disclosure, and refers to spin coating, dip coating, doctor blading, inkjet printing, screen printing, spray method, roll coating, and the like, but is not limited thereto.

The heat treatment temperature in the heat treatment step of the coated coating composition for forming a hole injection layer is preferably from 150 to 230° C. In some embodiments, a heat treatment time may be from 1 minute to 3 hours, more preferably 10 minutes to 1 hour. In some embodiments, the heat treatment is preferably carried out in an inert gas atmosphere such as argon and nitrogen. Further, a step of evaporating a solvent may be further included between the coating step and the heat treatment or photo treatment.

Further, the heat treatment temperature in the heat treatment step of the coated coating composition for forming a hole transport layer is preferably from 180 degrees or less, preferably 100 to 180 degrees, and more preferably 150 to 170 degrees. Further, the heat treatment time is 1 minute to 3 hours, more preferably 10 minutes to 90 minutes. Further, it is desirable that the heat treatment is performed in an inert gas atmosphere such as argon or nitrogen. Further, a step of evaporating the solvent may be included between the coating step and the heat treatment or photo treatment step.

The hole transport layer formed by the above-mentioned method has a stable thin film structure because a plurality of polymers contained in the coating composition can be crosslinked and then completely cured through the heat treatment or light irradiation step. Therefore, even if another layer is formed on the hole transport layer by a solution process, it can be prevented from being dissolved by the solvent used or being morphologically affected and decomposed. Thereby, a plurality of layers can be formed through a solution process, and the stability of the formed layers can be increased, so that the lifetime characteristics of the produced organic light emitting device can be improved.

The preparation of the organic light emitting device according to the present disclosure will be described in detail in the following examples. However, these examples are presented for illustrative purposes only, and the scope of the present disclosure is not limited thereto.

Preparation Example—HIL Host

Preparation Example 1-1: Preparation of Compound 1-1

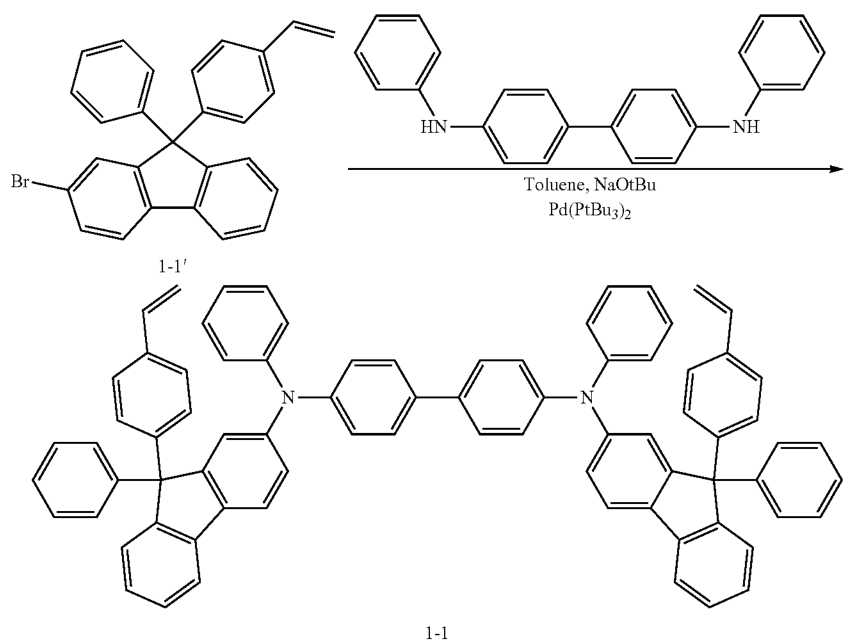

1-1'

1-1

Toluene was placed in a flask containing Compound 1-1' (1.58 g, 3.74 mmol), N4,N4'-diphenyl-[1,1'-biphenyl]-4,4'-diamine (572 mg. 1.7 mmol), and sodium tert-butoxide (980 mg, 10.2 mmol). The flask containing the reactants was immersed in an oil bath at 90° C., and then $Pd(P(tBu)_3)_2$ (43 mg, 0.085 mmol) was added and agitated for 1 hour. The reaction was stopped by adding water, the mixture was extracted with dichloromethane, and then the organic layer was dried with $MgSO_4$. The organic solvent was removed using a rotary vacuum concentrator, and then the residue was subjected to column purification to give Compound 1-1 (950 mg, yield: 55%, HPLC purity: 99.5%).

$^1$H NMR (500 MHz, $CDCl_3$): δ 7.71 (d, 2H), 7.65 (d, 2H), 7.42 (d, 4H), 7.35 (d, 4H), 7.27-7.20 (m, 18H), 7.17-7.13 (m, 4H), 7.11-7.06 (m, 14H), 7.03 (t, 2H), 6.70-6.64 (dd, 2H), 5.69 (d, 2H), 5.19 (d, 2H)

Preparation Example 1-2: Preparation of Compound 1-2

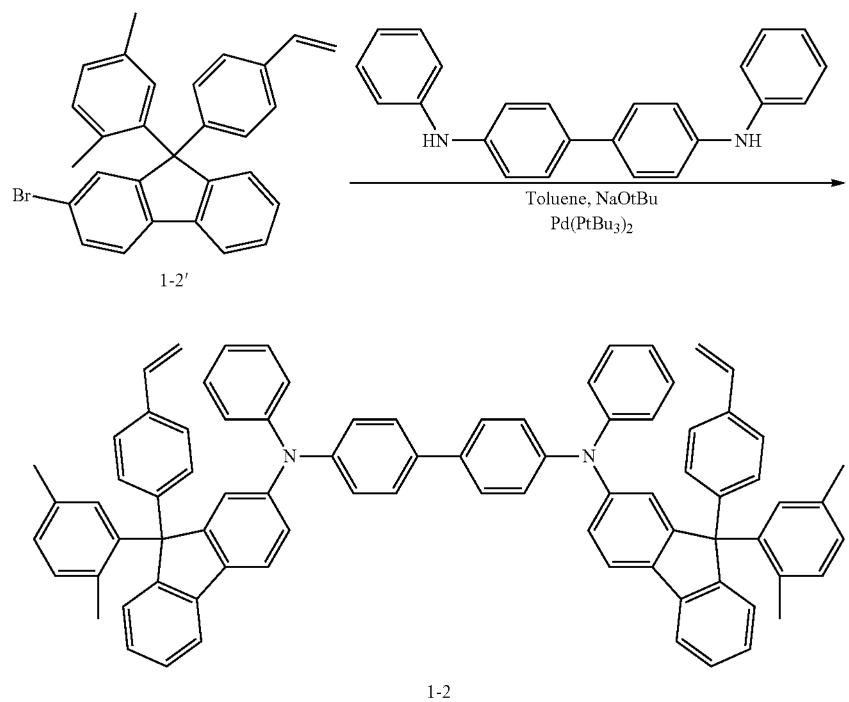

1-2'

1-2

Toluene was placed in a flask containing Compound 1-2' (1.37 g, 3.03 mmol), N4,N4'-diphenyl-[1,1'-biphenyl]-4,4'-diamine (464 mg. 1.38 mmol), and sodium tert-butoxide (769 mg, 8.3 mmol). The flask containing the reactants was immersed in an oil bath at 90° C., and then $Pd(P(tBu)_3)_2$ (36 mg, 0.085 mmol) was added and agitated for 1 hour. The reaction was stopped by adding water, the mixture was extracted with dichloromethane, and then the organic layer was dried with $MgSO_4$. The organic solvent was removed using a rotary vacuum concentrator, and then the residue was subjected to column purification to give Compound 1-2 (500 mg, yield: 34%, HPLC purity: 99.8%).

$^1$H NMR (500 MHz, $CDCl_3$): δ 7.70 (d, 2H), 7.63 (d, 2H), 7.43 (d, 4H), 7.37 (t, 2H), 7.30-7.20 (m, 14H), 7.15-7.05 (m, 14H), 7.02 (t, 2H), 6.93 (s, 4H), 6.86 (s, 2H), 6.71-6.65 (dd, 2H), 5.70 (d, 2H), 5.20 (d, 2H), 2.15 (s, 6H), 1.57 (s, 6H)

Preparation Example 1-3: Preparation of Compound 1-3

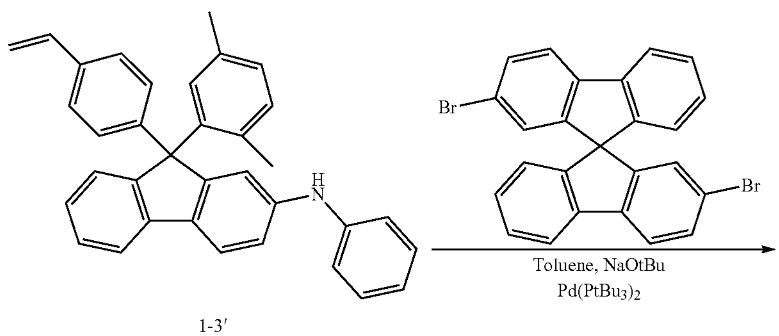

1-3'

-continued

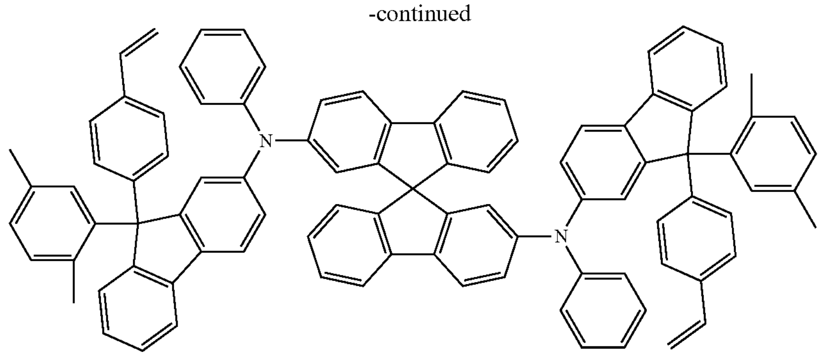

1-3

Toluene was placed in a flask containing Compound 1-3' (2.32 g, 5.0 mmol), 2,2'-dibromo-9,9'-spirobi(fluorene) (948 mg. 2.0 mmol), and sodium tert-butoxide (960 mg, 10.0 mmol). The flask containing the reactants was immersed in an oil bath at 90° C., and then $Pd(P(tBu)_3)_2$ (72 mg, 0.14 mmol) was added and agitated for 1 hour. The reaction was stopped by adding water, the mixture was extracted with dichloromethane, and then the organic layer was dried with $MgSO_4$. The organic solvent was removed using a rotary vacuum concentrator, and then the residue was subjected to column purification to give Compound 1-3 (1.46 g, yield: 59%, HPLC purity: 99.2%).

$^1H$ NMR 500 MHz, $CDCl_3$): δ 7.74-7.69 (m, 4H), 7.68-7.63 (m, 2H), 7.62-7.56 (m, 2H), 7.39 (td, 2H), 7.33 (ddddd, 4H), 7.26 (tdd, 6H), 7.19-7.04 (m, 12H), 7.04-6.90 (m, 14H), 6.85 (d, 2H), 6.76-6.68 (m, 4H), 6.65-6.55 (m, 2H), 5.78-5.70 (m, 2H), 5.25 (dq, 2H), 2.16 (s, 6H), 1.57 (s, 6H)

Preparation Example 1-4: Preparation of Compound 1-4

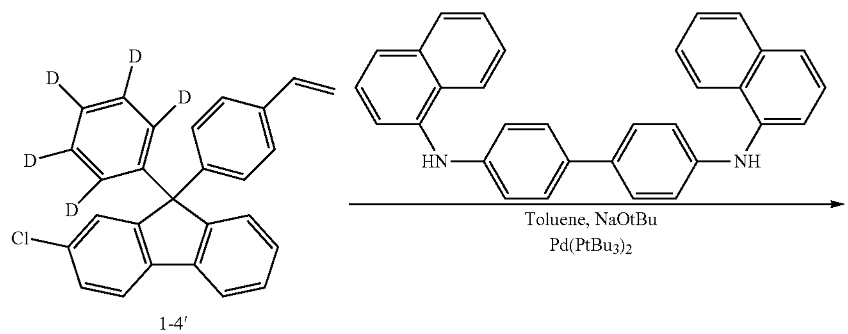

1-4′

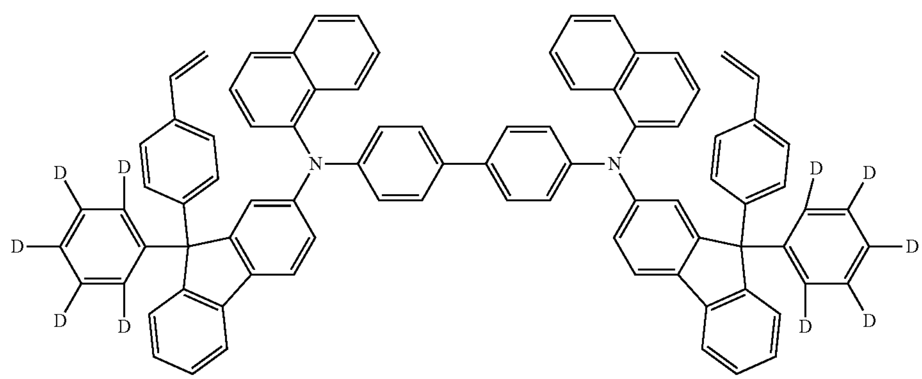

1-4

Toluene was placed in a flask containing Compound 1-4' (1.6 g, 4.2 mmol), N4,N4'-di(naphthalen-1-yl)-[1,1'-biphenyl]-4,4'-diamine (873 mg, 2.0 mmol), and sodium tert-butoxide (769 mg, 8.0 mmol), and bubbled with nitrogen. The flask containing the reactants was immersed in an oil bath at 100° C., and then $Pd(P(tBu)_3)_2$ (82 mg, 0.16 mmol) was added and agitated for 12 hours. The reaction was stopped by adding water, the mixture was extracted with dichloromethane, and then the organic layer was dried with $MgSO_4$. The organic solvent was removed using a rotary vacuum concentrator, and then the residue was subjected to column purification to give Compound 1-4 (1.2 g, yield: 53%, HPLC purity: 99.1%).

$^1$H NMR (500 MHz, $CDCl_3$): δ 7.90-7.88 (m, 2H), 7.87 (dd, 2H), 7.79-7.75 (m, 2H), 7.64 (dt, 2H), 7.59 (dd, 2H), 7.49-7.41 (m, 4H), 7.37-7.30 (m, 12H), 7.22-7.11 (m, 8H), 7.09-7.03 (m, 4H), 7.02-6.96 (m, 6H), 6.64 (dd, 2H), 5.67 (dd, 2H), 5.18 (dd, 2H)

Preparation Example—HTL

Preparation Example 2-1: Preparation of Polymer 2-1

Step 1) Preparation of Compound 2-1'

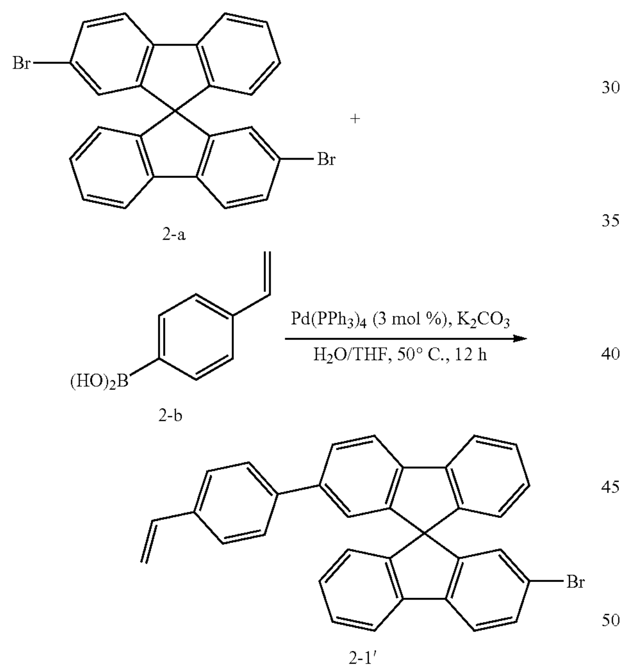

2-a 2-b 2-1'

Compound 2-a (50 g, 105.4 mmol, 1.0, eq) and Compound 2-b (31.2 g, 211 mmol, 2.0 eq) were dissolved in 300 g of tetrahydrofuran (THF), and stirred in a water bath at 80° C. for 10 minutes. $K_2CO_3$ (37.89 g, 274 mmol, 2.60 eq) was dissolved in 300 mL of water, and then added dropwise for 10 minutes. Pd catalyst (3.66 g, 3.2 mmol, 0.03 eq) was added under reflux. After stirring for 2 hours, the mixture was washed with ethyl acetate (EA)/$H_2O$, the organic layer was separated, and the solvent was dried in vacuo. The resulting material was purified by column chromatography through n-hexane (n-Hex) and ethyl acetate (EA), and then recrystallized from tetrahydrofuran (THF) and ethanol to give Compound 2-1' (22.8 g) as a white solid.

MS: $[M+H]^+$=496

Step 2) Preparation of Monomer 2-1

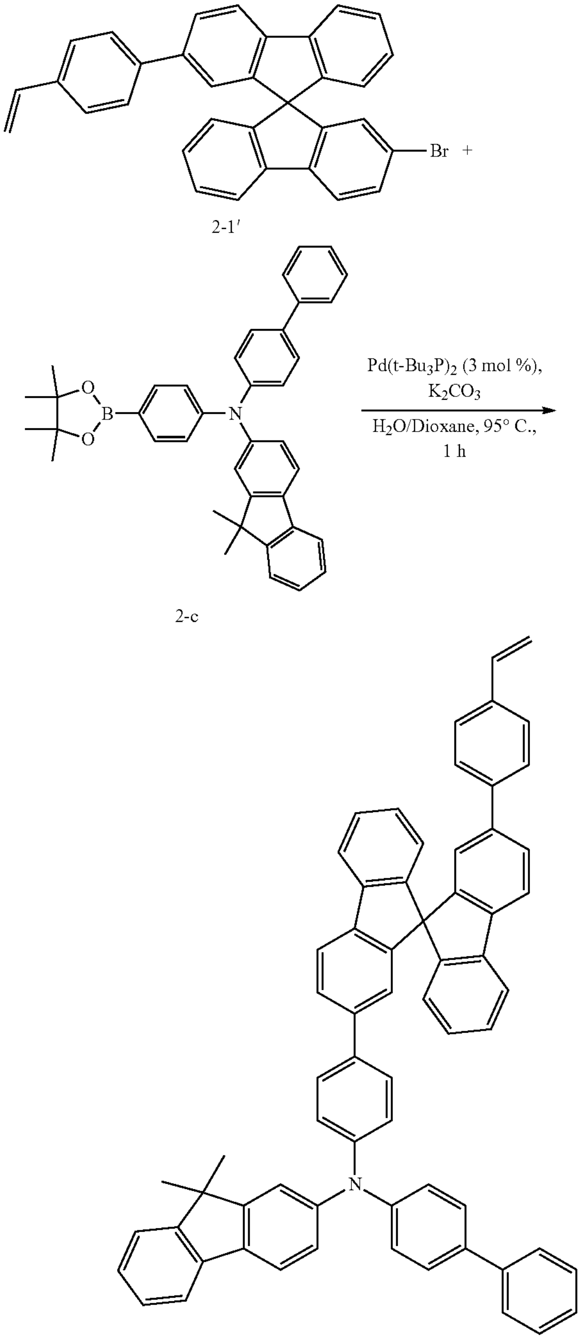

2-1'

2-c monomer 2-1

Compound 2-1' (2.4 g, 5.0 mmol, 1.0 eq) and Compound 2-c (2.82 g, 5.0 mmol, 1.0 eq) were dissolved in 20 ml of 1,4-dioxane, and stirred in a water bath at 120° C. for 30 minutes. $K_2CO_3$ (5.10 g, 37 mmol, 1.75 eq) was dissolved in 40 mL of water, and then the solution was added dropwise for 10 minutes while maintaining the internal temperature at 90° C. Pd catalyst (0.077 g, 0.15 mmol, 0.03 eq) was added under reflux. After stirring for 1 hour, the mixture was washed with ethyl acetate (EA)/$H_2O$, the organic layer was separated and the solvent was dried in vacuo. The resulting material was purified by column chromatography through n-hexane (n-Hex) and dichloromethane (DCM) and recrystallized from n-hexane (n-Hex) to give Monomer 2-1.

MS: $[M+H]^+$=854.5

Step 3) Preparation of Polymer 2-1

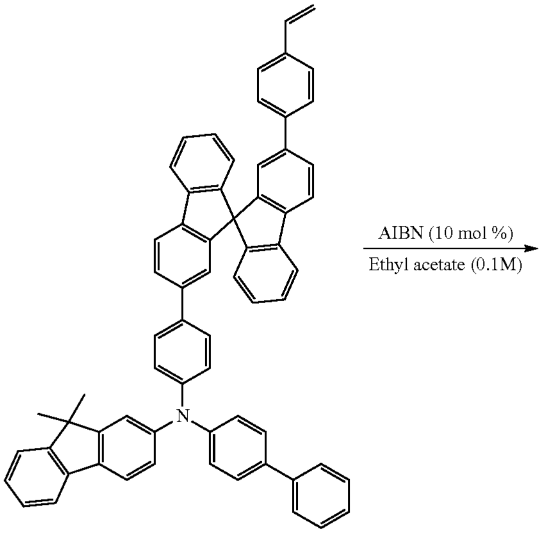

monomer 2-1

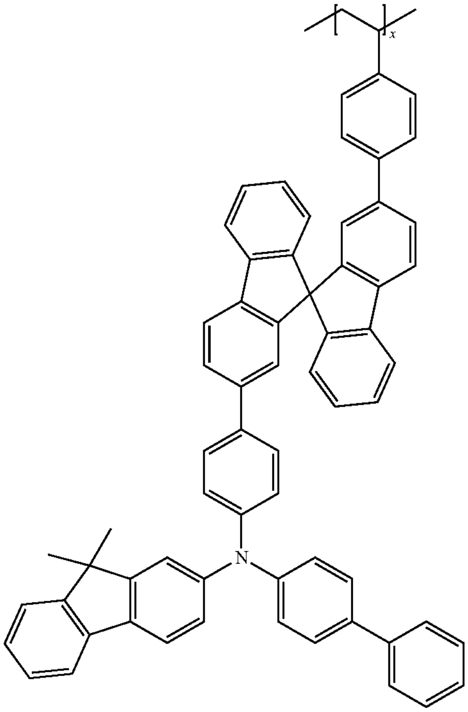

polymer 2-1

Monomer 2-1 (500 mg) and azobisisobutyronitrile (AIBN) (1.2 mg) were added to ethyl acetate (EA), and reacted at 80° C. for 4 hours under nitrogen substitution. The precipitate formed after the reaction was filtered to prepare Polymer 2-1.

The prepared Polymer 2-1 where x is 43 had a number average molecular weight of 37,100 g/mol, and a weight average molecular weight of 78,600 g/mol. At this time, the molecular weight was measured by GPC using PS standards and Agilent 1200 series.

Preparation Example 2-2: Preparation of Polymer 2-2

Step 1) Preparation of Compound 2-f

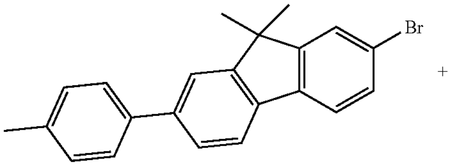

2-d

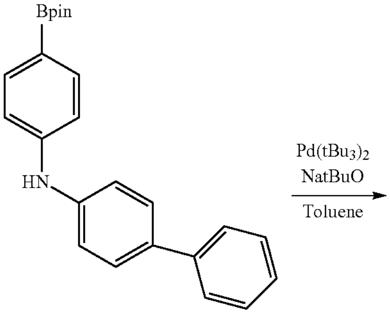

2-e

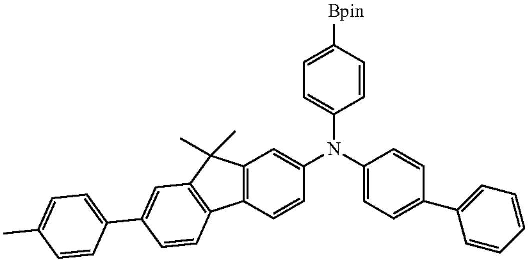

2-f

Compound 2-d (10 g), Compound 2-e (13.29 g) and NatBuO (7.93 g) were dissolved in 91 ml of toluene, and stirred in a water bath at 110° C. for 30 minutes. Pd catalyst (0.703 g) was added under reflux. After stirring for 3 hours, the mixture was washed with dichloromethane/water, the organic layer was separated and the solvent was dried in vacuo. The resulting material was purified by column chromatography through n-hexane (n-Hex) and dichloromethane (DCM) and then ecrystallized from n-hexane (n-Hex) to give Compound 2-f (12.59 g).

MS: $[M+H]^+$=654

Step 2) Preparation of Monomer 2-2

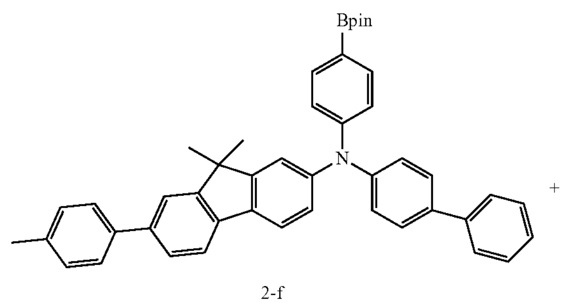

2-f

+

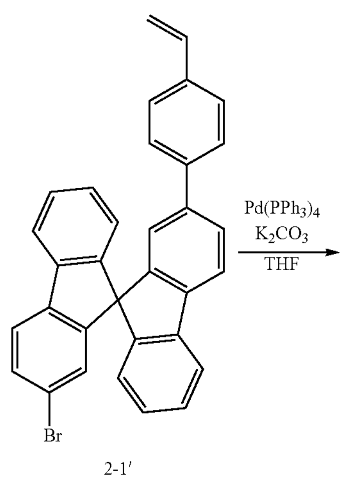

2-1'

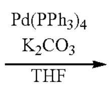

-continued

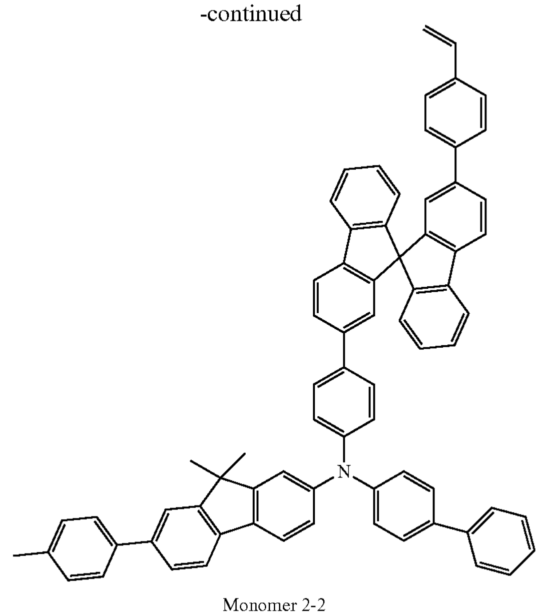

Monomer 2-2

Compound 2-f (10 g) and Compound 2-1' (7.23 g) were dissolved in 110 ml of tetrahydrofuran, and stirred in a water bath at 60° C. for 30 minutes. $K_2CO_3$ (6.34 g) was dissolved in 40 mL of water, and then the solution was added dropwise for 5 minutes while maintaining the internal temperature at 60° C. Pd catalyst (0.884 g) was added under reflux. After stirring for 1 hour, the mixture was washed with ethyl acetate (EA)/$H_2O$, the organic layer was separated and the solvent was dried in vacuo. The resulting material was purified by column chromatography through n-hexane (n-Hex) and dichloromethane (DCM) and recrystallized from n-hexane (n-Hex) to give Monomer 2-2 (10.79 g).

MS: $[M+H]^+$=945

Step 3) Preparation of Polymer 2-2

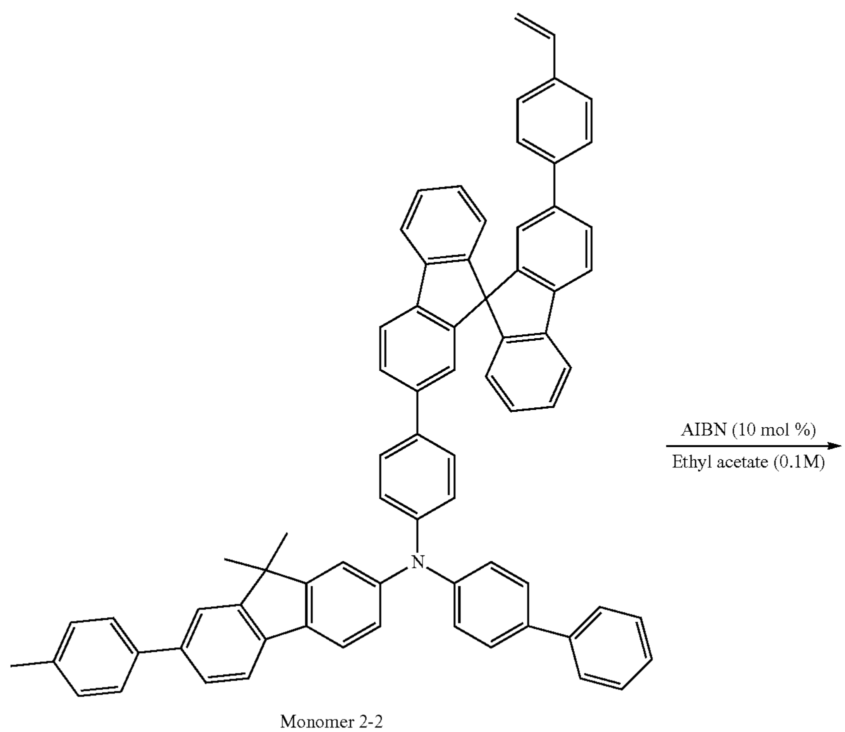

Monomer 2-2

-continued

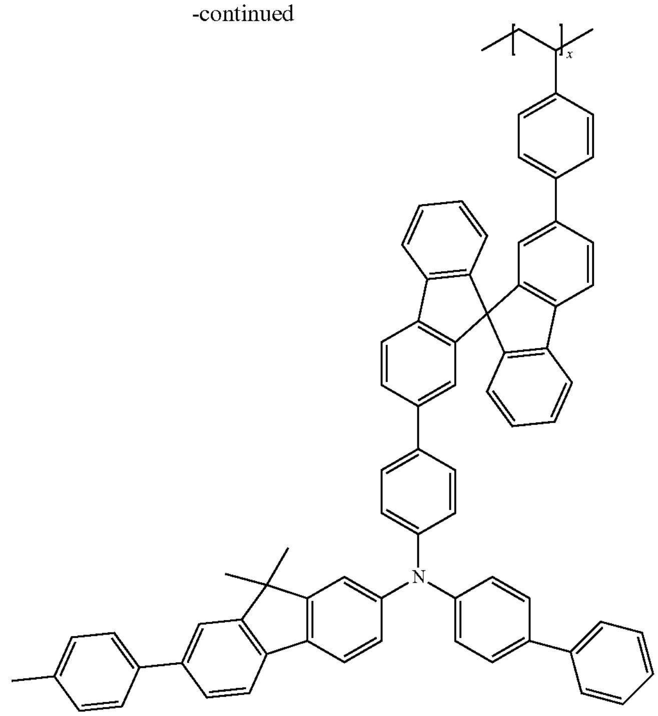

Polymer 2-2

Polymer 2-2 was prepared in the same manner as in step 3) of Preparation Example 2-1, except that Monomer 2-2 was used instead of Monomer 2-1.

The prepared Polymer 2-2 where x is 55 had a number average molecular weight of 51,938 g/mol, and a weight average molecular weight of 68,350 g/mol. At this time, the molecular weight was measured by GPC using PS standards and Agilent 1200 series.

Preparation Example 2-3: Preparation of Polymer 2-3

Step 1) Preparation of Compound 2-i

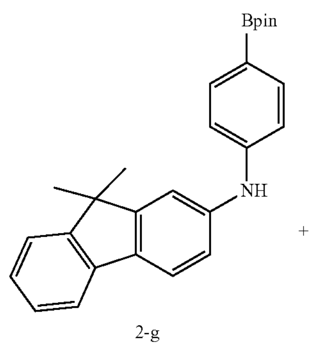

2-g

+

-continued

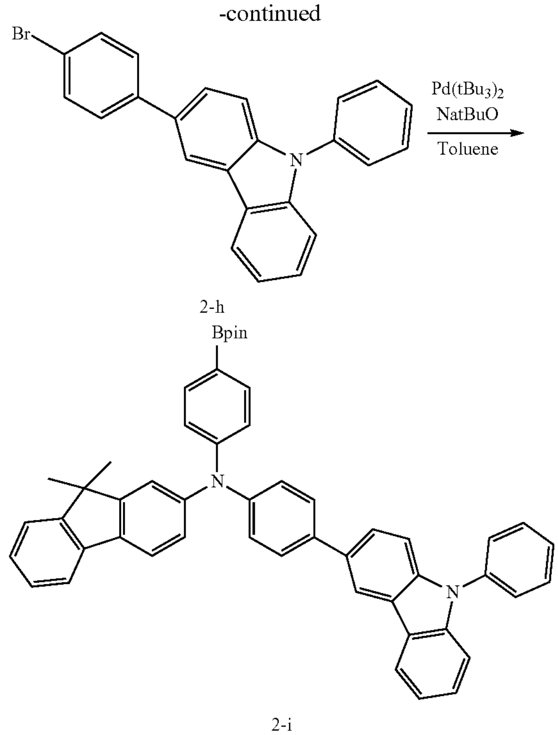

2-h 2-i

Compound 2-g (10 g), Compound 2-h (9.12 g) and NatBuO (7.00 g) were dissolved in 120 ml of toluene, and stirred in a water bath at 110° C. for 30 minutes. Pd catalyst (0.62 g) was added under reflux. After stirring for 4 hours, the mixture was washed with dichloromethane/water, the organic layer was separated and the solvent was dried in vacuo. The resulting material was purified by column chromatography through n-hexane (n-Hex) and dichloromethane (DCM) and then recrystallized from n-hexane (n-Hex) to give Compound 2-i (10.35 g).

MS: $[M+H]^+$=729

Step 2) Preparation of Monomer 2-3

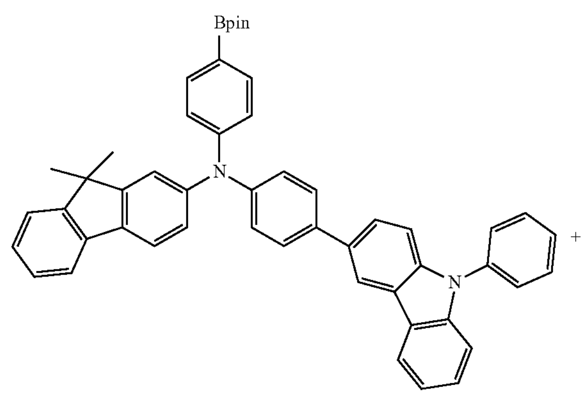

2-i

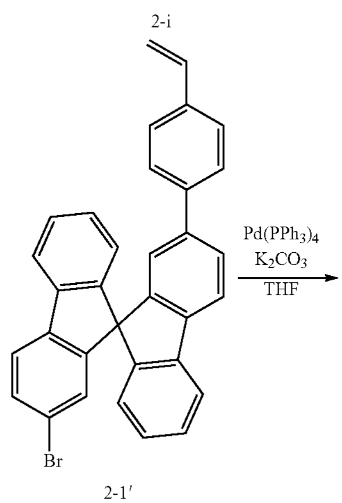

2-1′

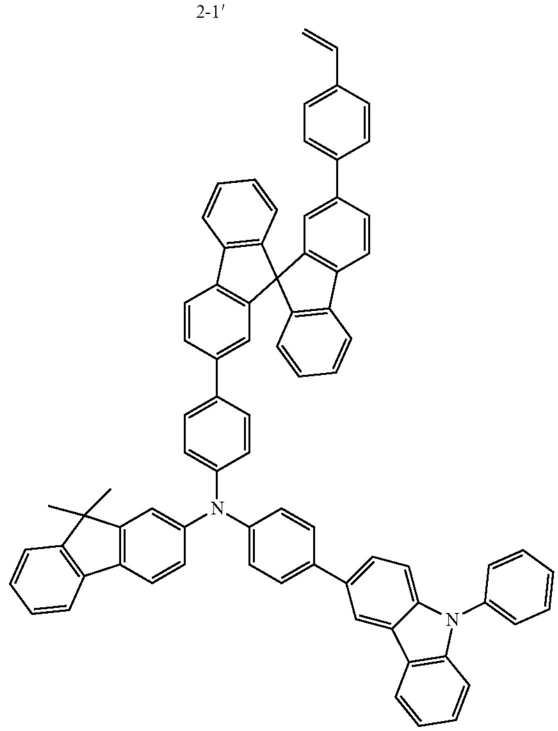

Monomer 2-3

Compound 2-i (10 g) and Compound 2-1' (6.48 g) were dissolved in 100 ml of tetrahydrofuran, and stirred in a water bath at 60° C. for 30 minutes. $K_2CO_3$ (5.69 g) was dissolved in 30 mL of water, and then the solution was added dropwise for 5 minutes while maintaining the internal temperature at 60° C. Pd catalyst (790 mg) was added under reflux. After stirring for 1 hour, the mixture was washed with ethyl acetate (EA)/$H_2O$, the organic layer was separated and the solvent was dried in vacuo. The resulting material was purified by column chromatography through n-hexane (n-Hex) and dichloromethane (DCM) and then recrystallized from n-hexane (n-Hex) to give Monomer 2-3 (9.48 g).

MS: $[M+H]^+$=1020

Step 3) Preparation of Polymer 2-3

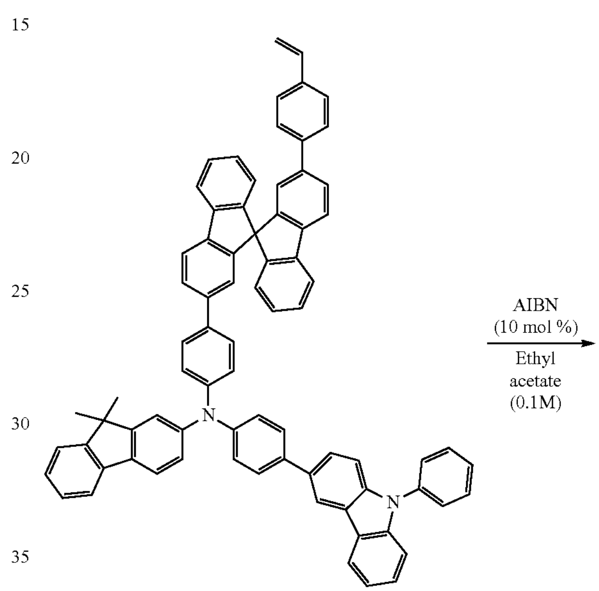

Monomer 2-3

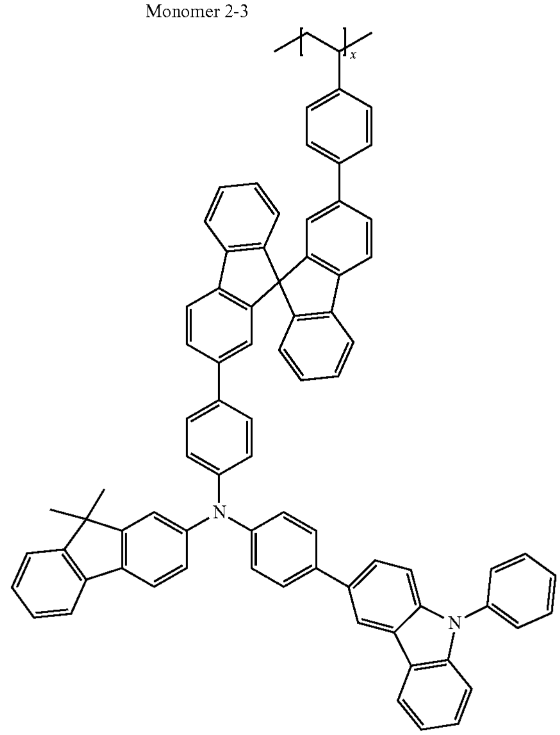

Polymer 2-3

Polymer 2-3 was prepared in the same manner as in step (3 of Preparation Example 2-1, except that Monomer 2-3 was used instead of Monomer 2-1.

The prepared Polymer 2-3 where x is 38 had a number average molecular weight of 38,743 g/mol, and a weight average molecular weight of 57,890 g/mol. At this time, the molecular weight was measured by GPC using PS standards and Agilent 1200 series.

Preparation Example 2-4: Preparation of Polymer 2-4

Step 1) Preparation of Compound 2-1

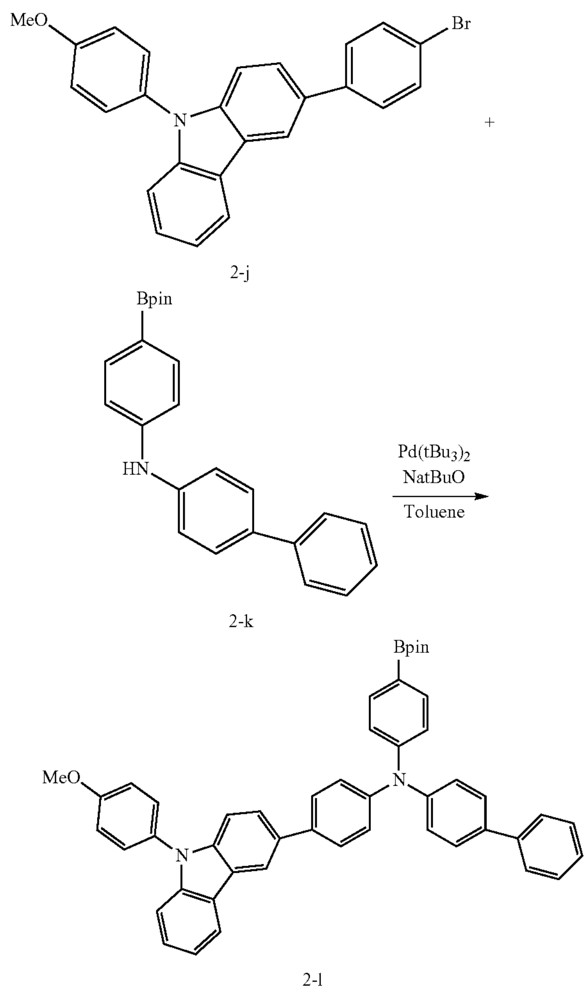

2-j 2-k 2-l

Compound 2-j (10 g), Compound 2-k (8.23 g) and NatBuO (6.73 g) were dissolved in 120 ml of toluene, and stirred in a water bath at 110° C. for 30 minutes. Pd catalyst (0.511 g) was added under reflux. After stirring for 4 hours, the mixture was washed with dichloromethane/water, the organic layer was separated and the solvent was dried in vacuo. The resulting material was purified by column chromatography through n-hexane (n-Hex) and dichloromethane (DCM) and then recrystallized from n-hexane (n-Hex) to give Compound 2-1 (11.7 g).

MS: $[M+H]^+=719$

Step 2) Preparation of Monomer 2-4

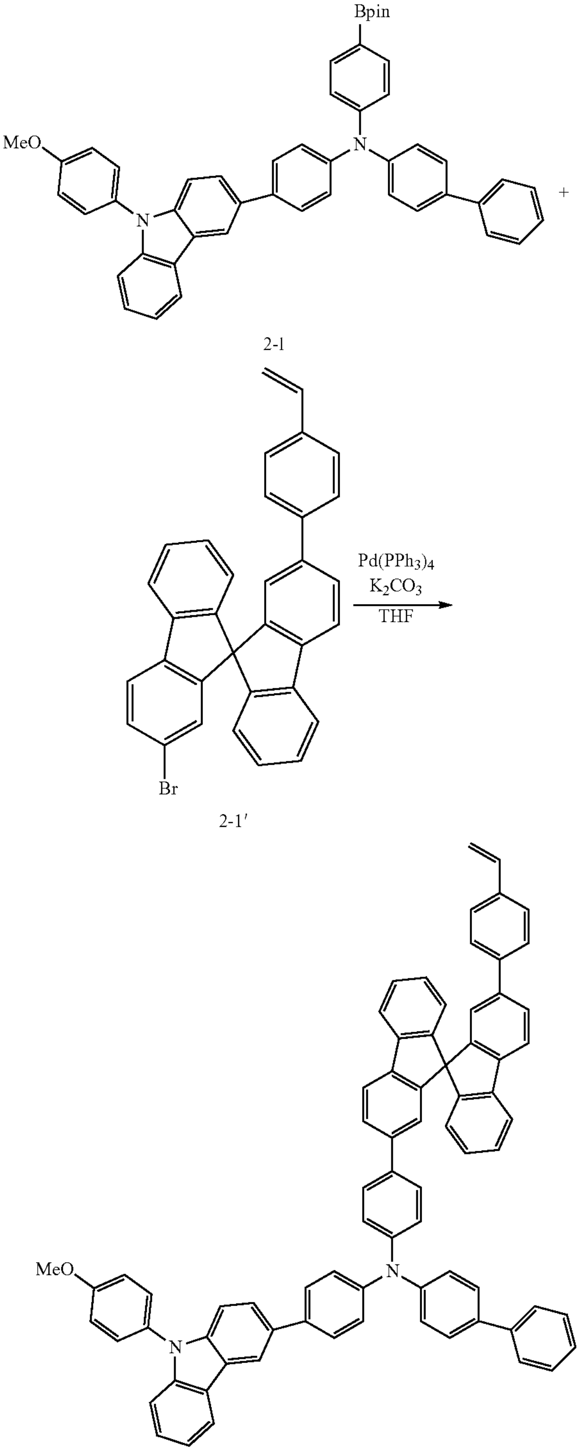

2-1

2-1'

Monomer 2-4

Compound 2-1 (10 g) and Compound 2-1' (6.58 g) were dissolved in 100 ml of tetrahydrofuran, and stirred in a water bath at 60° C. for 30 minutes. $K_2CO_3$ (5.77 g) was dissolved in 30 mL of water, and then the solution was added dropwise for 5 minutes while maintaining the internal temperature at 60° C. Pd catalyst (804 mg) was added under reflux. After stirring for 1 hour, the mixture was washed with ethyl acetate (EA)/$H_2O$, the organic layer was separated and the solvent was dried in vacuo. The resulting material was purified by column chromatography through n-hexane (n-Hex) and dichloromethane (DCM) and then recrystallized from n-hexane (n-Hex) to give Monomer 2-4 (8.94 g).

MS: $[M+H]^+=1009$

Step 3) Preparation of Polymer 2-4

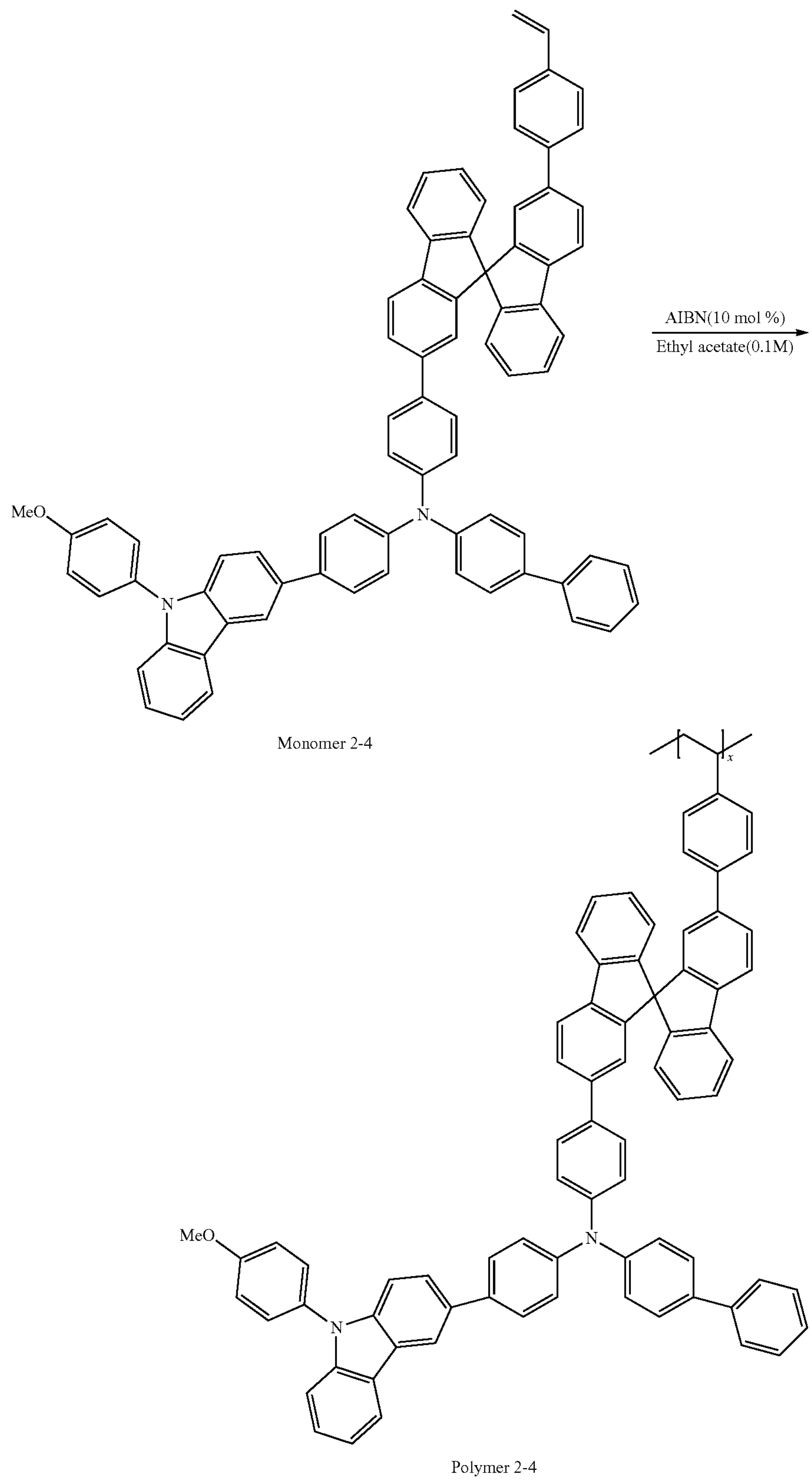

Monomer 2-4

Polymer 2-4

Polymer 2-4 was prepared in the same manner as in step (3 of Preparation Example 2-1, except that Monomer 2-4 was used instead of Monomer 2-1.

The prepared Polymer 2-4 where x is 47 had a number average molecular weight of 47,480 g/mol, and a weight average molecular weight of 61,388 g/mol. At this time, the molecular weight was measured by GPC using PS standards and Agilent 1200 series.

Preparation Example 2-5: Preparation of Polymer 2-5

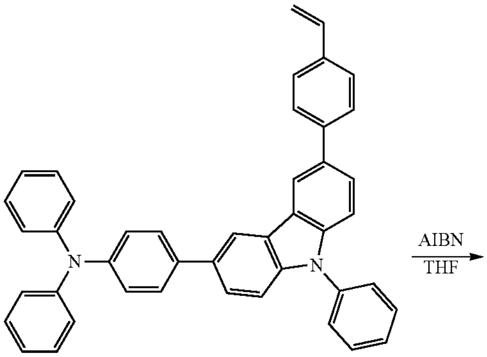

monomer 2-5

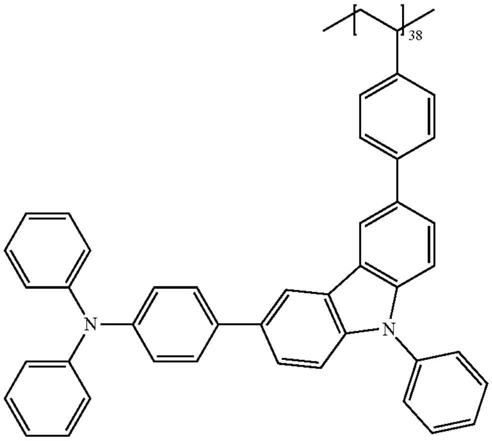

polymer 2-5

After Monomer 2-5 (1 g) was dissolved in 5 ml of tetrahydrofuran (THF), azobisisobutyronitrile (AIBN) (4 mg) was added thereto, and then stirred at 75° C. for 5 hours. Then, precipitation was performed using ethanol, and the obtained solid was dried to prepare Polymer 2-(420 mg).

The prepared Polymer 2-5 had a number average molecular weight of 22,400 g/mol, and a weight average molecular weight of 39,500 g/mol. At this time, the molecular weight was measured by GPC using PS standards and Agilent 1200 series.

Preparation Example 2-6: Preparation of Polymer 2-6

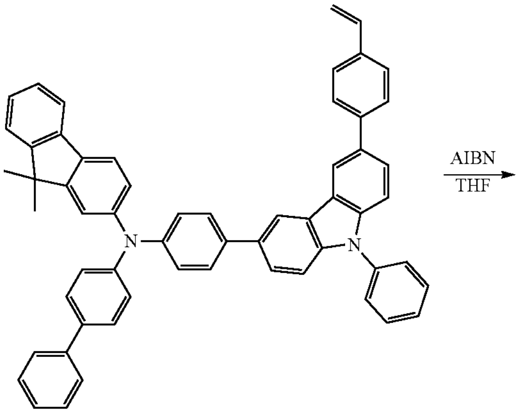

monomer 2-6

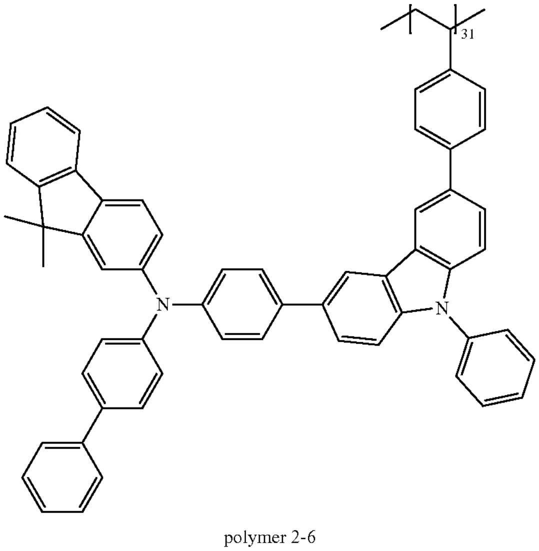

polymer 2-6

Polymer 2-6 (490 mg) was prepared in the same manner as in Preparation Example 2-5, except that Monomer 2-6 was used instead of Monomer 2-5 in Preparation Example 2-5.

The prepared Polymer 2-6 had a number average molecular weight of 24,200 g/mol, and a weight average molecular weight of 43,800 g/mol. At this time, the molecular weight was measured by GPC using PS standards and Agilent 1200 series.

Preparation Example 2-7: Preparation of Polymer 2-7

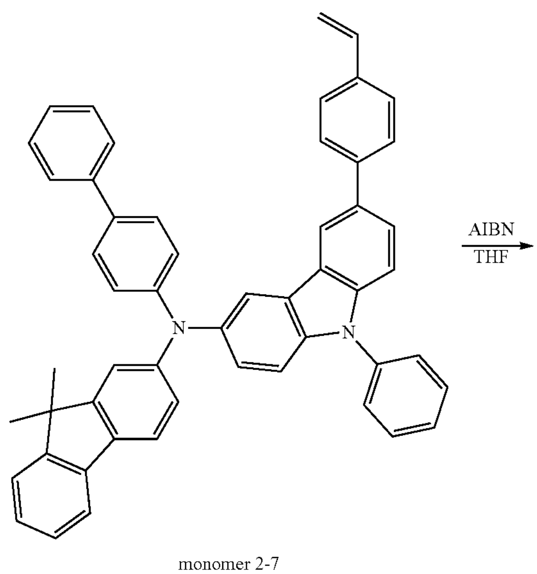

monomer 2-7

-continued

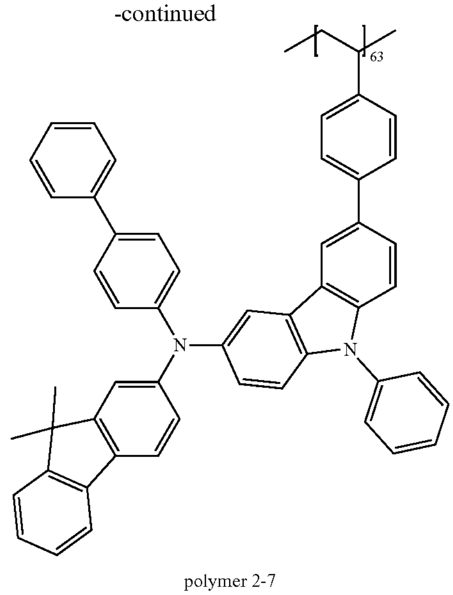

polymer 2-7

Polymer 2-7 (620 mg) was prepared in the same manner as in Preparation Example 2-5, except that Monomer 2-7 was used instead of Monomer 2-5 in Preparation Example 2-5.

The prepared Polymer 2-7 had a number average molecular weight of 44,400 g/mol, and a weight average molecular weight of 80,100 g/mol. At this time, the molecular weight was measured by GPC using PS standards and Agilent 1200 series.

Preparation Example 2-8: Preparation of Polymer 2-8

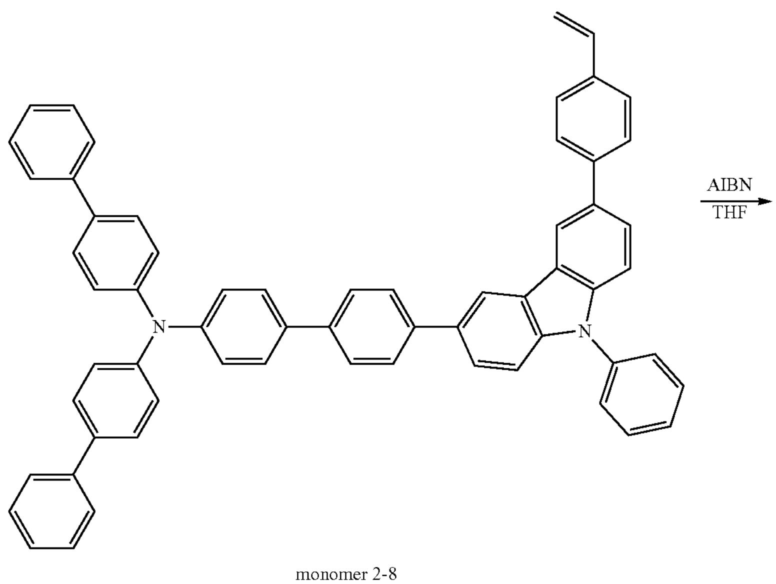

monomer 2-8

-continued

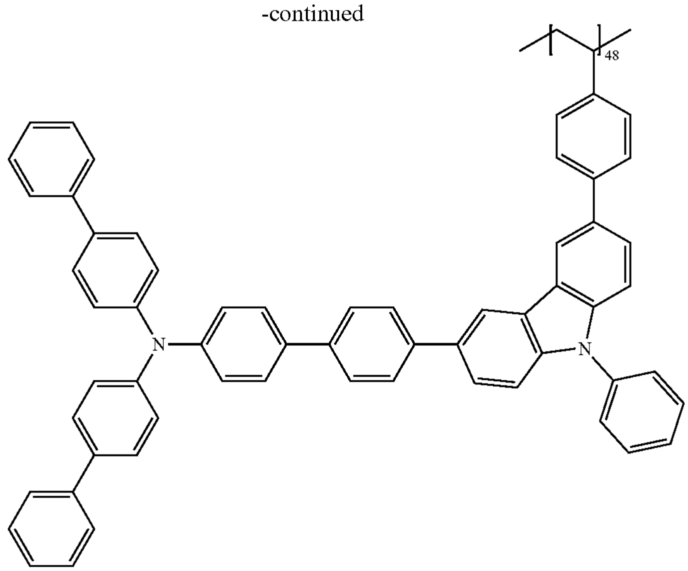

polymer 2-8

Polymer 2-8 (530 mg) was prepared in the same manner as in Preparation Example 2-5, except that Monomer 2-8 was used instead of Monomer 2-5 in Preparation Example 2-5.

The prepared Polymer 2-8 had a number average molecular weight of 39,600 g/mol, and a weight average molecular weight of 75,400 g/mol. At this time, the molecular weight was measured by GPC using PS standards and Agilent 1200 series.

Preparation Example 2-9: Preparation of Polymer 2-9

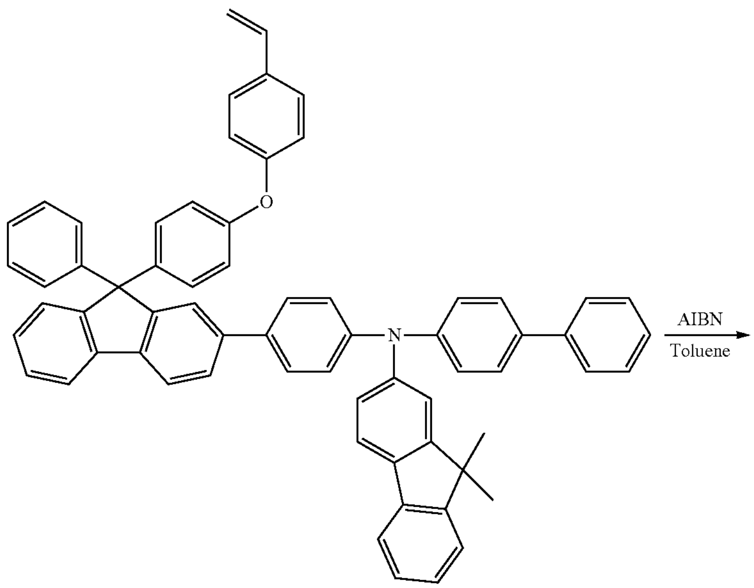

monomer 2-9

-continued

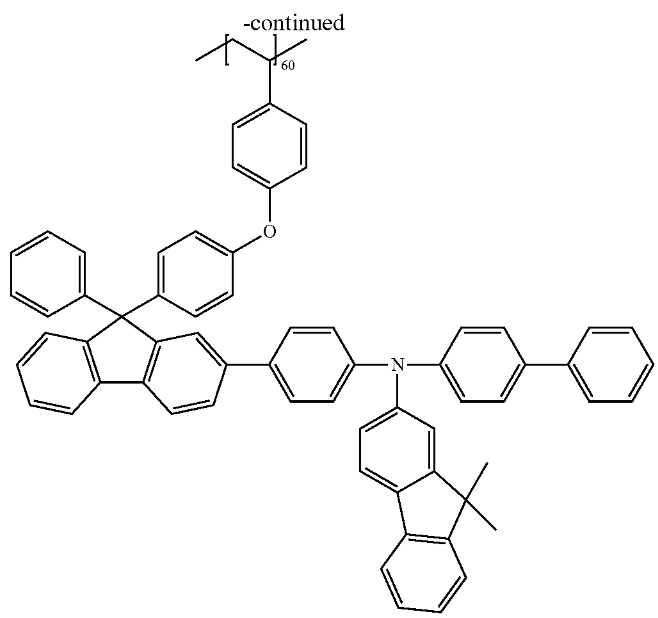

polymer 2-9

Monomer 2-9 (1 g) and azobisisobutyronitrile (6.5 mg) were placed in a round bottom flask, then added to anhydrous toluene (8 mL) under a nitrogen atmosphere, and stirred at 60° C. for 2 hours. After completion of the reaction, the precipitate precipitated in ethanol was filtered, washed with ethyl acetate, and then the obtained solid was dried to prepare Polymer 2-9 (800 mg, yield: 80%).

The prepared Polymer 2-9 had a number average molecular weight of 54,408 g/mol, and a weight average molecular weight of 98,552 g/mol. At this time, the molecular weight was measured by GPC using PS standards and Agilent 1200 series.

Preparation Example 2-10: Preparation of Polymer 2-10

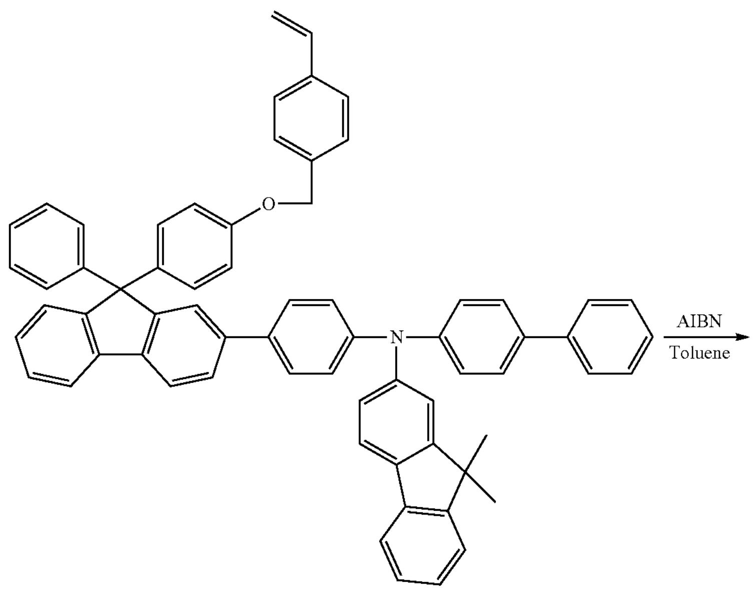

monomer 2-10

-continued

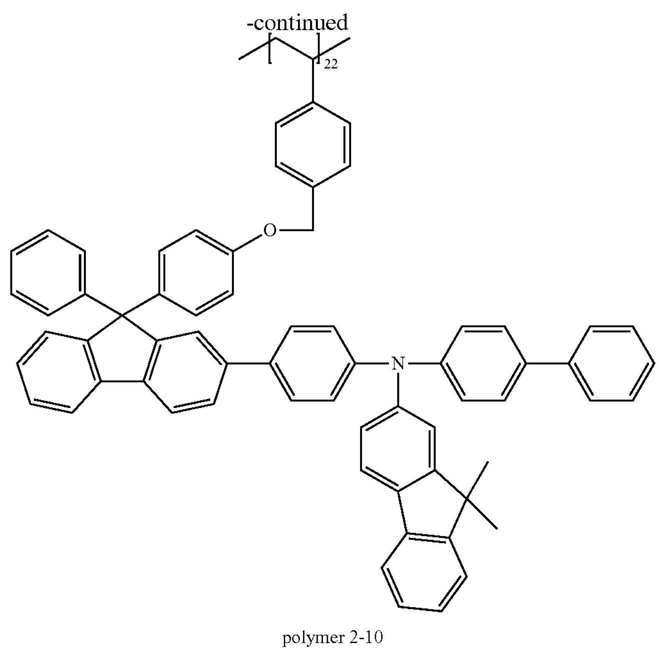

polymer 2-10

Polymer 2-10 (830 mg, yield: 83%) was prepared in the same manner as in Preparation Example 2-9, except that Monomer 2-10 was used instead of Monomer 2-9 in Preparation Example 2-9.

The prepared Polymer 2-10 had a number average molecular weight of 20,872 g/mol, and a weight average molecular weight of 37,961 g/mol. At this time, the molecular weight was measured by GPC using PS standards and Agilent 1200 series.

Preparation Example 2-11: Preparation of Polymer 2-11

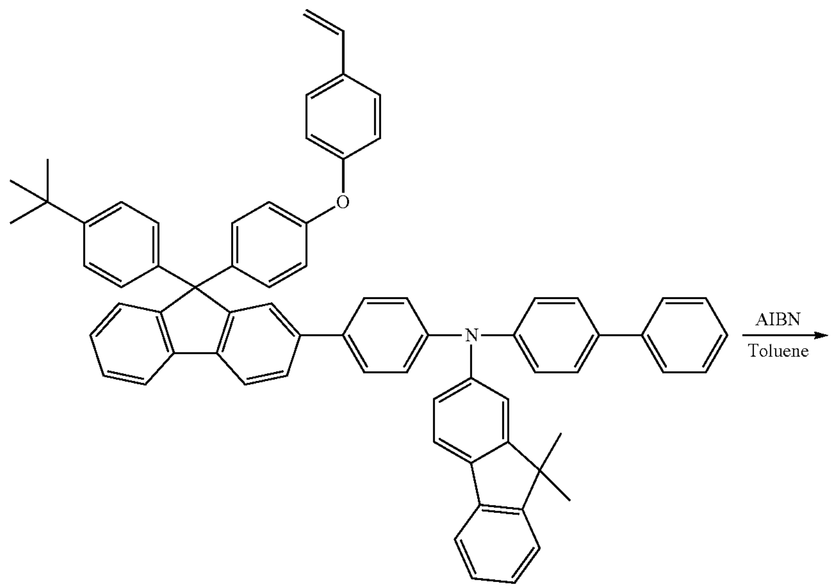

monomer 2-11

-continued

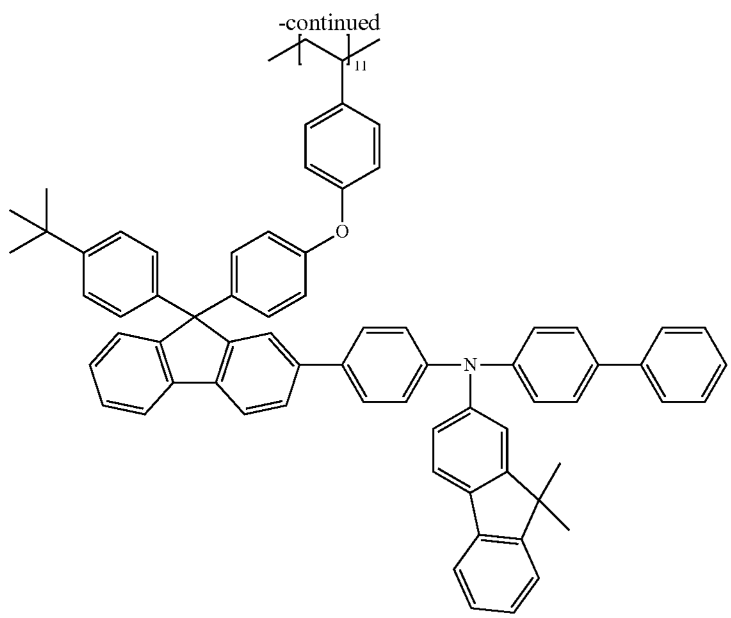

polymer 2-11

Polymer 2-11 (590 mg, yield: 59%) was prepared in the same manner as in Preparation Example 2-9, except that Monomer 2-11 was used instead of Monomer 2-9 in Preparation Example 2-9.

The prepared Polymer 2-11 had a number average molecular weight of 10,610 g/mol, and a weight average molecular weight of 18,537 g/mol. At this time, the molecular weight was measured by GPC using PS standards and Agilent 1200 series.

Preparation Example—HIL Dopant

Preparation Example 3-1: Preparation of Compound 3-1

Step 1) Preparation of Compound 3-1'

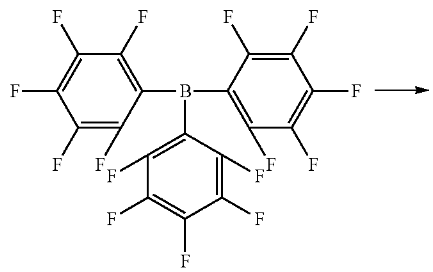

-continued

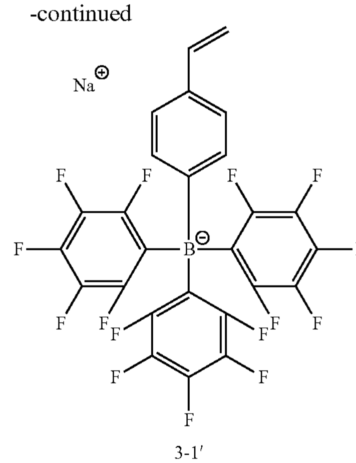

3-1'

Mg (193 mg, 7.92 mmol), 12 (4 mg) and THF (10 mL) were placed in a 100 mL round bottom flask under a nitrogen atmosphere, and stirred for 30 minutes. 4-Bromostyrene (1.04 mL, 7.92 mmol) was added thereto, and the mixture was stirred for a day while a 30° C. water bath was placed under a round bottom flask. Dissolution of Mg was identified by the solution becoming black. Ether (5 mL) was added to dilute the reaction solution. Tris(pentafluorophenyl)borane (1 g, 3.96 mmol) was dissolved in ether (5 mL) and slowly added to the reaction solution for 30 minutes. The solution was stirred for a day. $Na_2CO_3$ (0.1 M, 80 mL, 8.0 mmol) was slowly added to the reaction solution. The organic solvent was extracted using ethyl acetate (20 mL×3), and residual water was removed with $MgSO_4$. In order to additionally remove residual water and impurities, the result was distilled with benzene using a Dean-stock. When approximately 10 mL of the solvent was left, the solution was cooled and filtered to give Compound 3-1' (1.6 g, yield: 64%).

Step 2) Preparation of Compound 3-1

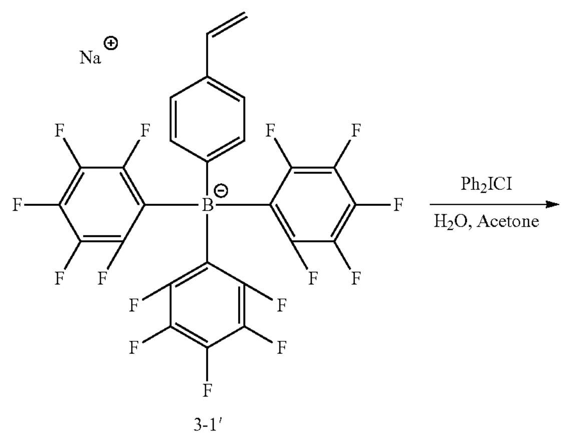

3-1'

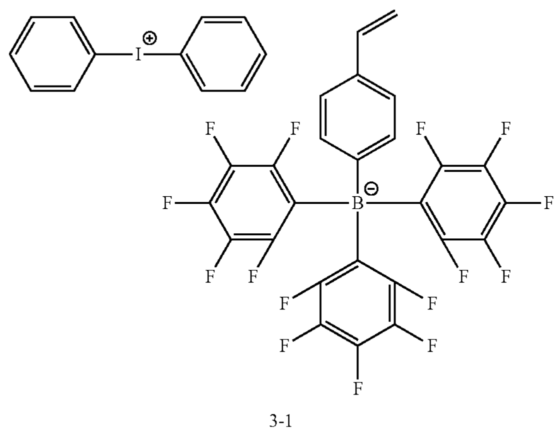

3-1

Compound 3-1' (100 mg, 0.16 mmol), distilled water (10 mL) and $Ph_2ICI$ (60 mg, 0.19 mmol) were placed in a 25 mL round bottom flask, and stirred for 1 hour. Acetone (15 mL) was added to the reaction solution to cause precipitation, and the precipitate was filtered and dried to give Compound 3-1 (140 mg, yield: 100%).

MS: $[M-H]^-$=615 (negative mode)

MS: $[M+H]^+$=281 (positive mode)

Preparation Example 3-2: Preparation of Compound 3-2

Step 1) Preparation of Compound 3-2'

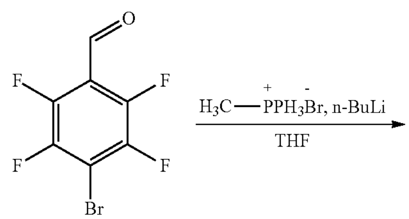

-continued

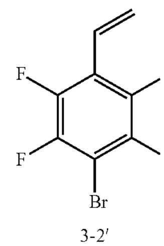

3-2'

Methyltriphenyl potassium bromide (13.90 g, 38.91 mmol) and THF (100 mL) were placed in a 250 mL round bottom flask, and stirred at 0° C. for 30 minutes. n-BuLi (15.6 mL, 38.91 mmol, 2.5 M in hexane) was slowly added to the reaction solution, and stirred at 0° C. for 30 minutes. 4-Formyl-2,3,5,6-tetrafluoro-1-bromobenzene (5.0 g, 19.47 mmol, in 30 mL THF) was slowly added to the reaction solution at 0° C. The reaction solution was stirred while gradually raising the temperature to room temperature. After 3 hours, ether (100 mL) and saturated $NH_4Cl$ solution (400 mL) were added to the reaction solution. The organic solvent was extracted with ether (200 mL×2) and the residual water was removed with $MgSO_4$. The resulting material was subjected to column chromatography with ethyl acetate: hexane=1:9 (v:v) to give Compound 3-2' (1.29 g, yield: 26%).

Step 2) Preparation of Compound 3-2"

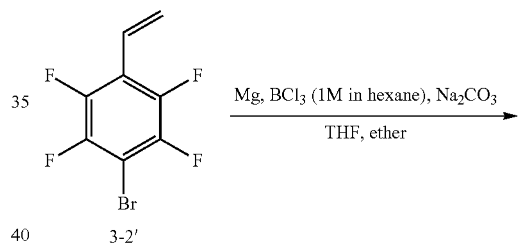

3-2'

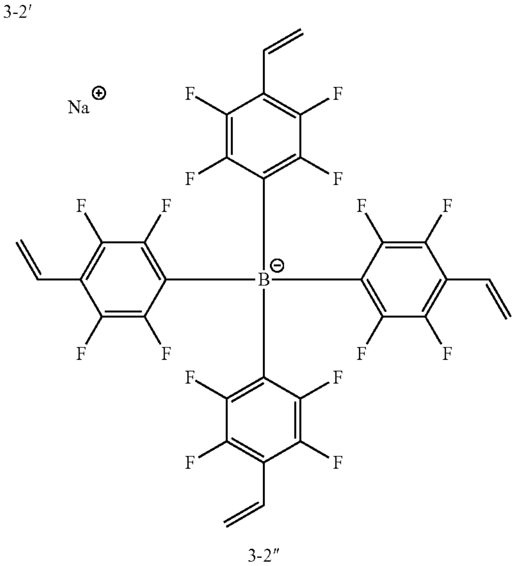

3-2"

Mg (95 mg, 3.92 mmol), THF (10 mL) and $I_2$ (4 mg) were placed in a 25 mL round bottom flask, and stirred. Compound 3-2' (1.0 g, 3.92 mmol) was added to the reaction solution, and stirred at room temperature. After 10 hours, complete dissolution of Mg was identified by the solution becoming black, and ether (10 mL) and $BCl_3$ (1.3 mL, 1.3 mmol, 1M in hexane solution) were added over 30 minutes. After stirring the reaction solution for a day, $Na_2CO_3$ (30 mL, 3.0 mmol, 0.1 M in $H_2O$) was added. The synthesized material was extracted with ethyl acetate (10 mL×3), and then the residual water was removed with $MgSO_4$. After removing all the solvent, water was completely removed with Dean-stock using benzene, and the solids were filtered to give Compound 3-2" (340 mg, yield: 28%).

Step 3) Preparation of Compound 3-2

Compound 3-2" (200 mg, 0.27 mmol), 1-(4-vinylbenzyl) pyridin-1-ium chloride (69 mg, 0.30 mmol), $H_2O$ (10 mL) and methylene chloride (10 mL) were placed in a 25 mL round bottom flask, and vigorously stirred for 30 minutes. The organic solvent was extracted with ether (10 mL×3) and the residual water was removed with $MgSO_4$. The solvent was removed and dried in vacuo to give Compound 3-2 (247 mg, yield: 100%).

MS: $[M-H]^-=711$ (negative mode)

MS: $[M+H]^+=196$ (positive mode)

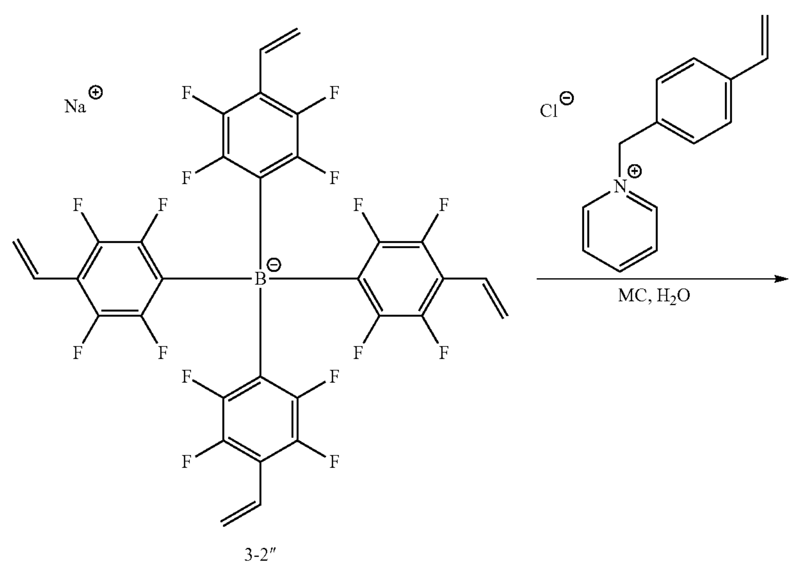

3-2"

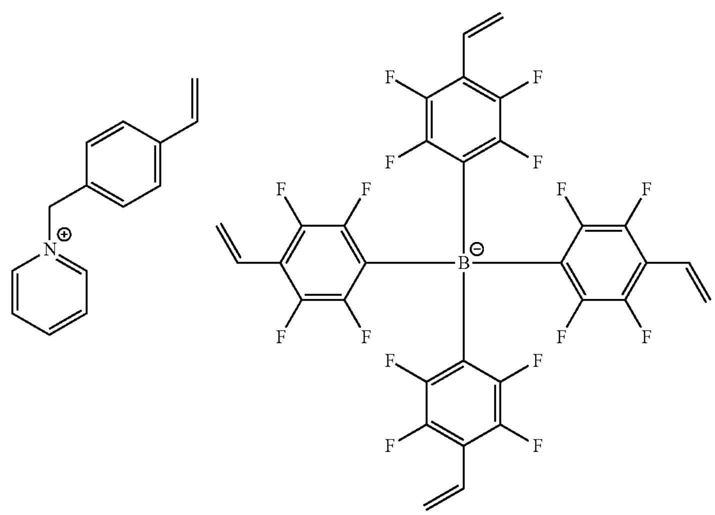

3-2

Preparation Example 3-3: Preparation of Compound 3-3

Step 1) Preparation of Compound 3-3'

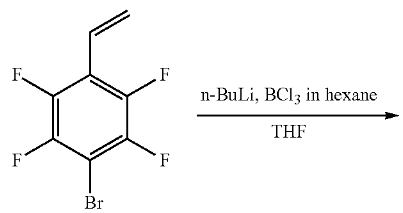

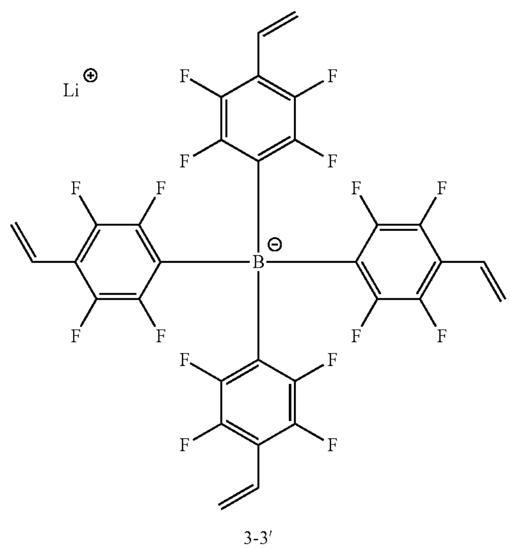

3-3'

1-Bromo-2,3,5,6-tetrafluoro-4-vinylbenzene (2 g, 7.84 mmol) was added to THF (20 mL) in a 50 mL round bottom flask, and stirred at −78° C. for 30 minutes. n-BuLi (3.45 mL, 8.63 mmol, 2.5 M in hexane) was slowly added to the solution, and stirred at −78° C. for 30 minutes. $BCl_3$ (2.6 mL, 2.61 mmol, 1 M in hexane solution) was added to the reaction solution and stirred at −78° C. over 15 minutes. The reaction solution was stirred for a day while slowly raising the temperature to room temperature, and then water (30 mL) was added. The synthesized material was extracted with ethyl acetate (10 mL×3), and then all solvent was removed. Water was completely removed with Dean-stock using benzene, and the solids were filtered to give Compound 3-3' (800 mg), yield: 43%).

Step 2) Preparation of Compound 3-3

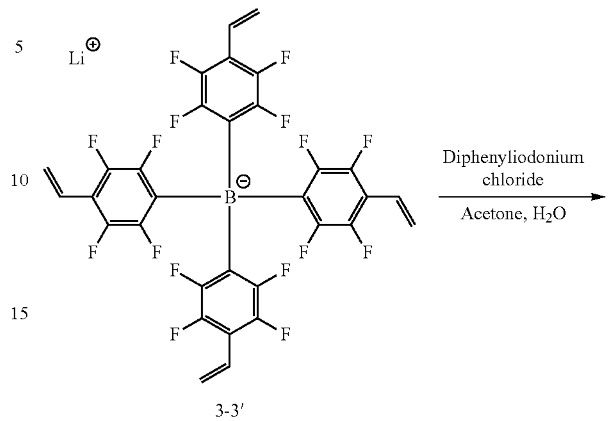

3-3'

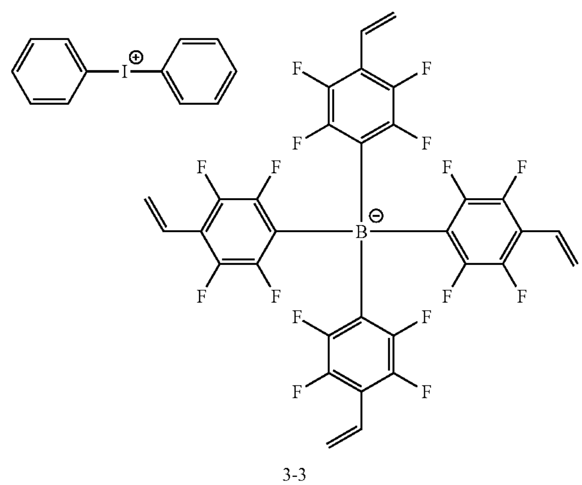

3-3

Compound 3-3' (400 mg, 0.56 mmol), diphenyliodonium chloride (176 mg, 0.56 mmol), water (10 mL) and acetone (10 mL) were placed in a 25 mL round bottom flask, and vigorously stirred for 30 minutes. The result was extracted using dichloromethane (10 mL×3), and then dried after removing the solvent to give Compound 3-3 (552 mg, yield: 100%)

MS: $[M-H]^-=711$ (negative mode)

MS: $[M+H]^+=281$ (positive mode)

Preparation Example 3-4: Preparation of Compound 3-4

Step 1) Preparation of Compound 3-4'

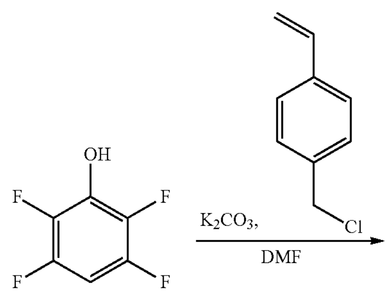

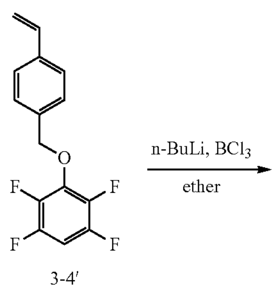

3-4′

Potassium carbonate (10.4 g, 75.3 mmol) was placed in a 500 mL round bottom flask, to which DMF (200 ml) was added. 2,3,5,6-tetrafluorophenol (10.0 g, 60.22 mmol) was added to the flask and the mixture was stirred at 60° C. for 30 minutes. 4-Vinylbenzyl chloride (7.66 g, 50.18 mmol) was slowly added to the reaction solution and stirred at 60° C. for 16 hours. Then, water (300 mL) and ethyl acetate (200 ml) were added. The organic layer was extracted with ethyl acetate (200 mL×2) and the residual water was removed with $MgSO_4$. The resulting material was subjected to column chromatography from ethyl acetate:hexane=1:9 (v:v) to give Compound 3-4' (11.2 g, yield: 79%).

Step 2) Preparation of Compound 3-4"

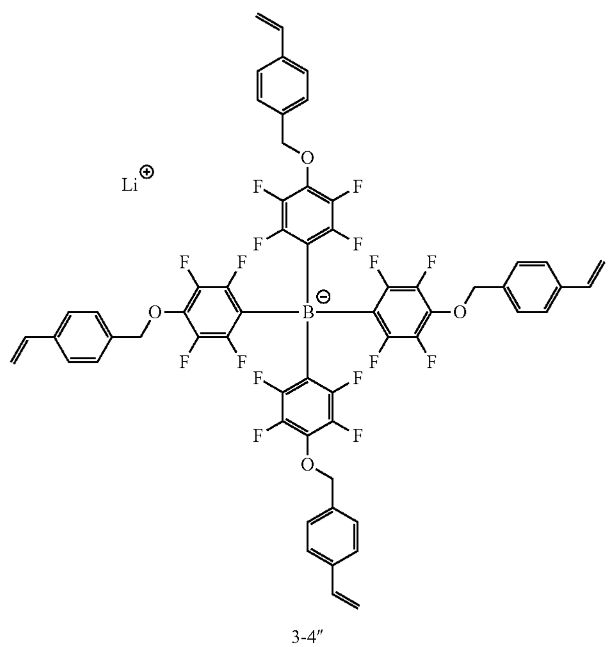

3-4″

-continued

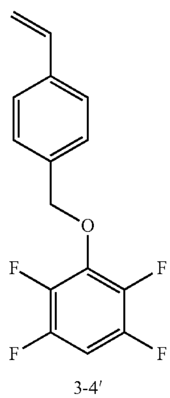

3-4′

Compound 3-4' (10 g, 35.43 mmol) was placed in a 250 ml round bottom flask, to which ether (130 ml) was added, and the mixture was stirred. The reaction solution was cooled to −78° C., and stirred for 30 minutes. n-BuLi (17 ml, 42.52 mmol, 2.5 M in hexane) was slowly injected thereto over 30 minutes. Then, the result was stirred for 1 hour. $BCl_3$ (8.15 ml, 8.15 mmol, 1 M in hexane) was slowly added over 30 minutes. The temperature of the reaction solution was slowly raised to room temperature. After stirring the reaction solution for a day, water (200 mL) was added thereto. The synthesized material was extracted using ether (100 mL*3), and all the solvent was removed. After that, water was completely removed with Dean-stock using benzene, and the solids were filtered to give Compound 3-4" (6.2 g, yield: 66%).

Step 3) Preparation of Compound 3-4

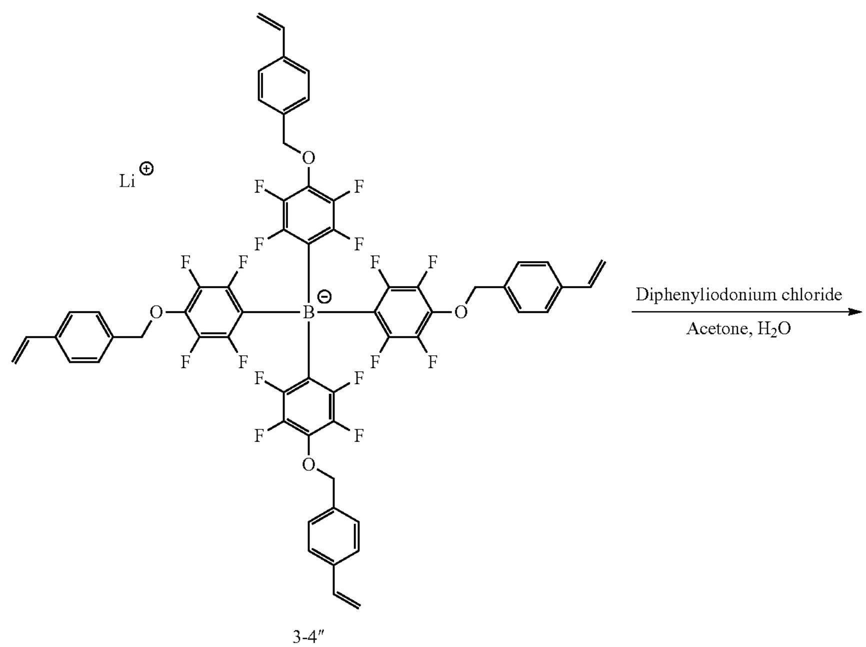

3-4″

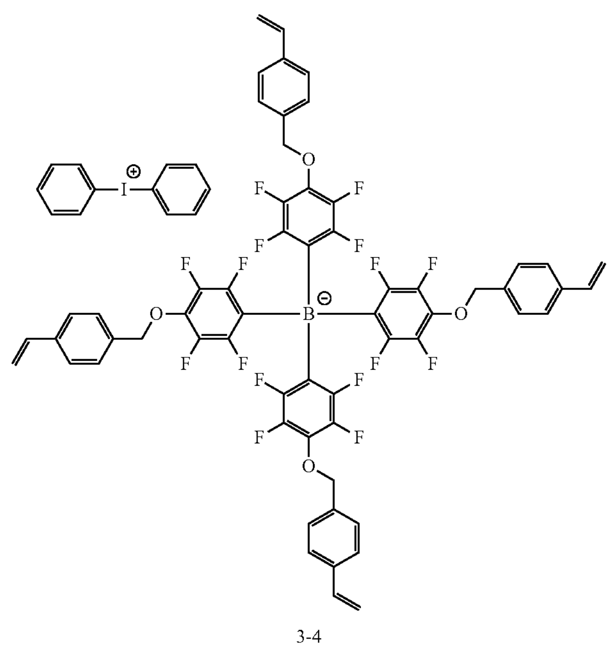

3-4

Compound 3-4" (6.2 g, 5.42 mmol), diphenyl iodonium chloride (2.57 g, 8.13 mmol), water (50 mL) and acetone (10 mL) were placed in a 25 mL round bottom flask, and vigorously stirred for 30 minutes. The organic solvent was extracted with methylene chloride (20 mL×3) and the solvent was removed. The resulting material was subjected to column chromatography from methylene chloride:acetone=9:1 (v:v) to give Compound 3-4 (5.0 g, yield: 65%).

MS: $[M-H]^-$=1135 (negative mode)

MS: [M+H]+=281 (positive mode)

Preparation Example A: Preparation of Comparative Compound 1

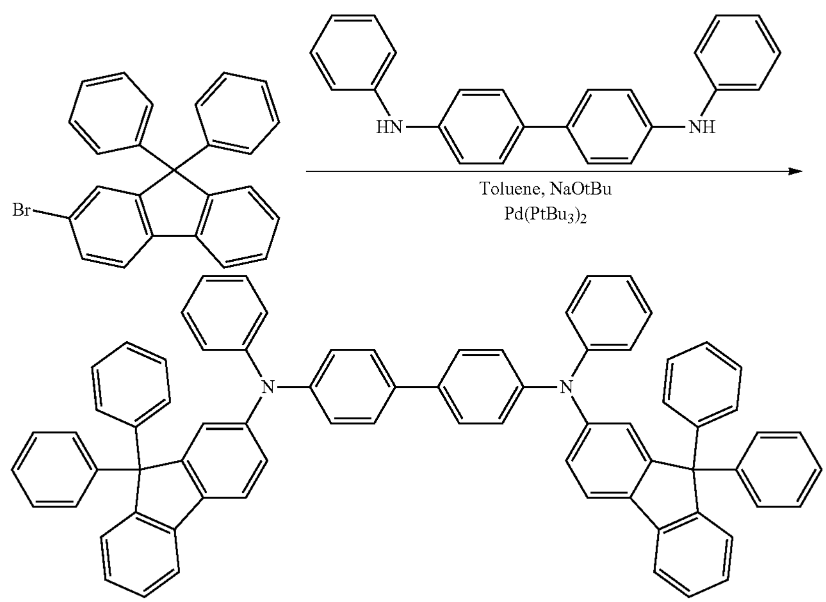

Toluene was placed in a flask containing 2-bromo-9,9-diphenyl-9H-fluorene (1.49 g, 3.74 mmol), N4,N4'-diphenyl-[1,1'-biphenyl]-4,4'-diamine (572 mg. 1.7 mmol), and sodium tert-butoxide (980 mg, 10.2 mmol). The flask containing the reactants was immersed in an oil bath at 90° C., and then $Pd(P(tBu)_3)_2$ (43 mg, 0.085 mmol) was added and agitated for 1 hour. The reaction was stopped by adding water, the mixture was extracted with dichloromethane, and then the organic layer was dried with $MgSO_4$. The organic solvent was removed using a rotary vacuum concentrator, and the residue was subjected to column purification to give Comparative Compound 1 (870 mg, HPLC purity: 99.0%).

MS: $[M+H]^+=969$

Preparation Example B: Preparation of Comparative Compound 2

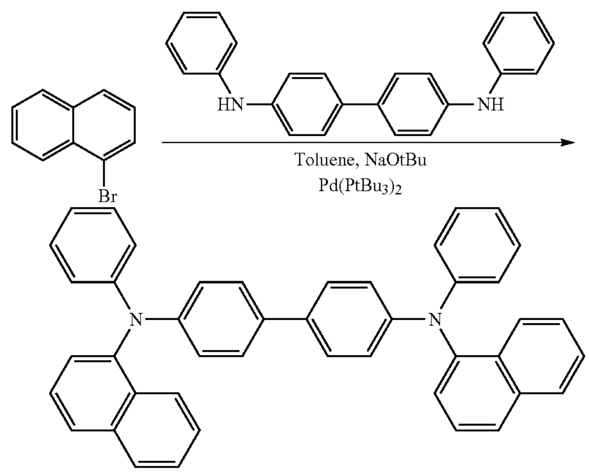

Toluene was placed in a flask containing bromonaphthalene (774 mg, 3.74 mmol), N4,N4'-diphenyl-[1,1'-biphenyl]-4,4'-diamine (572 mg. 1.7 mmol), and sodium tert-butoxide (980 mg, 10.2 mmol). The flask containing the reactants was immersed in an oil bath at 90° C., and then $Pd(P(tBu)_3)_2$ (43 mg, 0.085 mmol) was added and agitated for 1 hour. The reaction was stopped by adding water, the mixture was extracted with dichloromethane, and then the organic layer was dried with $MgSO_4$. The organic solvent was removed using a rotary vacuum concentrator, and the residue was subjected to column purification to give Comparative Compound 2 (830 mg, HPLC purity: 99.0%).

MS: $[M+H]^+=589$

DEVICE EXAMPLE

Example 1

A glass substrate on which ITO (indium tin oxide) was coated as a thin film to a thickness of 1500 Å was ultrasonically cleaned using an acetone solvent for 10 minutes. The substrate was then put into distilled water in which a detergent was dissolved, ultrasonically cleaned for 10 minutes, and then ultrasonic cleaning was repeated twice using distilled water for 10 minutes. After the cleaning with distilled water was completed, the substrate was ultrasonically cleaned with a solvent of isopropyl alcohol for 10 minutes, and then dried. The substrate was then transported to a glove box.

On the transparent ITO electrode prepared as above, a 2 wt. % cyclohexanone solution containing the previously prepared Compound 1-1 and Compound 3-1 in a weight ratio of 8:2 was spin-coated and heat treated at 230° C. for 30 minutes to form a hole injection layer having a thickness of 60 nm. A 0.8 wt % toluene solution containing the previously prepared Polymer 2-1 was spin-coated on the hole injection layer to form a hole transport layer having a thickness of 140 nm.

Subsequently, the result was transferred to a vacuum depositor, and then Compound A below and Compound B below were vacuum-deposited in a weight ratio of 9:1 on the hole transport layer to form a light emitting layer having a thickness of 30 nm. Compound C below was vacuum-deposited on the light emitting layer to form an electron injection and transport layer having a thickness of 40 nm. LiF and aluminum were sequentially deposited to have a thickness of 0.5 nm and 100 nm, respectively, on the electron injection and transport layer, thereby forming a cathode.

A

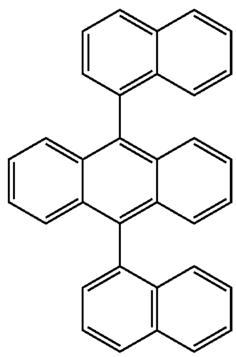

B

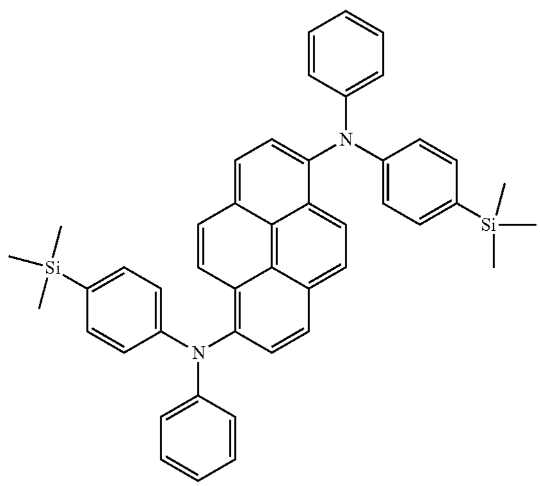

-continued

C

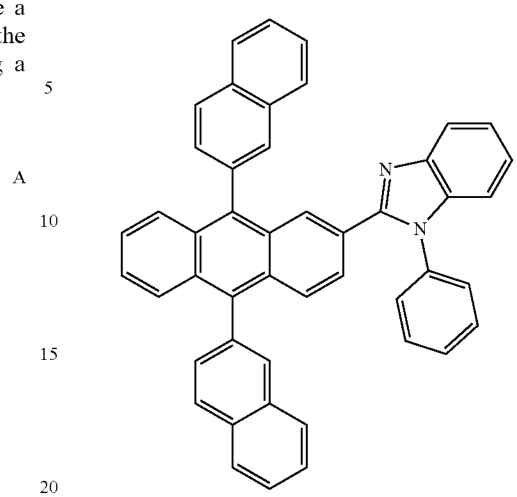

In the above-mentioned processes, the deposition rates of the organic materials were maintained at 0.4 to 1.0 Å/sec, the deposition rates of the LiF and the aluminum of the cathode were maintained at 0.3 Å/sec and 2 Å/sec, respectively, and the degree of vacuum during the deposition was maintained at $2\times10^{-8}$ to $5\times10^{-6}$ torr.

Examples 2 to 28, and Comparative Examples 1 to 3

The organic light emitting devices were manufactured in the same manner as in Example 1, except that instead of Compound 1-1 and Compound 3-1 of the hole injection layer of Example 1, the compounds shown in Table 1 were used as the materials for the hole injection layer, respectively, and instead of Compound Polymer 2-1 for the hole transport layer, the polymers shown in Table 1 was used as the materials for the hole transport layer.

Experimental Example 1: Evaluation of Characteristics of Organic Light Emitting Devices The driving voltage, current efficiency, and lifetime (LT90) were measured by applying a current to the organic light emitting devices manufactured in the Examples and Comparative Examples, and the results are shown in Table 1 below. In this case, LT90 means the time (hr) required for the luminance to be reduced to 90% of the initial luminance.

TABLE 1

| | HIL Host | HIL Dopant | HTL | Driving Voltage (V @10 mA/cm$^2$) | Current efficiency (cd/A @10 mA/cm$^2$) | LT90 (hr @10 mA/cm$^2$) |
|---|---|---|---|---|---|---|
| Example 1 | Compound 1-1 | Compound 3-1 | Polymer 2-1 | 4.7 | 6.52 | 97 |
| Example 2 | Compound 1-1 | Compound 3-3 | Polymer 2-1 | 4.7 | 6.71 | 102 |
| Example 3 | Compound 1-2 | Compound 3-1 | Polymer 2-1 | 4.8 | 6.76 | 133 |
| Example 4 | Compound 1-2 | Compound 3-2 | Polymer 2-1 | 4.6 | 7.13 | 128 |
| Example 5 | Compound 1-2 | Compound 3-3 | Polymer 2-1 | 4.5 | 7.09 | 154 |
| Example 6 | Compound 1-2 | Compound 3-4 | Polymer 2-1 | 4.8 | 6.92 | 132 |
| Example 7 | Compound 1-3 | Compound 3-1 | Polymer 2-1 | 4.8 | 6.42 | 119 |
| Example 8 | Compound 1-3 | Compound 3-3 | Polymer 2-1 | 4.8 | 7.08 | 127 |
| Example 9 | Compound 1-4 | Compound 3-1 | Polymer 2-1 | 4.7 | 6.49 | 103 |
| Example 10 | Compound 1-4 | Compound 3-4 | Polymer 2-1 | 4.8 | 6.55 | 115 |
| Example 11 | Compound 1-1 | Compound 3-2 | Polymer 2-2 | 4.9 | 6.18 | 84 |
| Example 12 | Compound 1-3 | Compound 3-3 | Polymer 2-3 | 4.8 | 6.33 | 89 |
| Example 13 | Compound 1-2 | Compound 3-4 | Polymer 2-3 | 4.8 | 6.27 | 91 |
| Example 14 | Compound 1-4 | Compound 3-2 | Polymer 2-4 | 4.9 | 6.38 | 83 |
| Example 15 | Compound 1-3 | Compound 3-3 | Polymer 2-3 | 5.0 | 6.31 | 92 |

TABLE 1-continued

| | HIL Host | HIL Dopant | HTL | Driving Voltage (V @10 mA/cm$^2$) | Current efficiency (cd/A @10 mA/cm$^2$) | LT90 (hr @10 mA/cm$^2$) |
|---|---|---|---|---|---|---|
| Example 16 | Compound 1-2 | Compound 3-4 | Polymer 2-2 | 4.8 | 6.25 | 90 |
| Example 17 | Compound 1-4 | Compound 3-1 | Polymer 2-4 | 4.9 | 6.49 | 81 |
| Example 18 | Compound 1-1 | Compound 3-1 | Polymer 2-11 | 4.9 | 6.31 | 80 |
| Example 19 | Compound 1-1 | Compound 3-2 | Polymer 2-9 | 4.9 | 6.57 | 88 |
| Example 20 | Compound 1-1 | Compound 3-3 | Polymer 2-6 | 5.1 | 6.19 | 79 |
| Example 21 | Compound 1-2 | Compound 3-1 | Polymer 2-8 | 5.0 | 6.49 | 88 |
| Example 22 | Compound 1-2 | Compound 3-2 | Polymer 2-6 | 5.1 | 6.33 | 91 |
| Example 23 | Compound 1-2 | Compound 3-3 | Polymer 2-9 | 5.0 | 6.28 | 78 |
| Example 24 | Compound 1-2 | Compound 3-4 | Polymer 2-5 | 4.9 | 6.44 | 79 |
| Example 25 | Compound 1-3 | Compound 3-2 | Polymer 2-9 | 4.9 | 6.31 | 85 |
| Example 26 | Compound 1-3 | Compound 3-3 | Polymer 2-10 | 5.2 | 6.24 | 90 |
| Example 27 | Compound 1-4 | Compound 3-1 | Polymer 2-7 | 5.1 | 6.16 | 87 |
| Example 28 | Compound 1-4 | Compound 3-3 | Polymer 2-9 | 5.1 | 6.11 | 84 |
| Comparative Example 1 | Comparative Compound 1 | Compound 3-1 | Polymer 2-1 | 4.9 | 5.10 | 13 |
| Comparative Example 2 | Compound 1-1 | Compound 3-2 | Comparative Compound 2 | 4.7 | 6.16 | 75 |
| Comparative Example 3 | Comparative Compound 1 | Compound 3-2 | Polymer 2-9 | 4.7 | 6.16 | 74 |

As shown in Table 1 above, it was confirmed that the organic light-emitting devices of Examples, in which the cured product of the compound represented by Chemical Formula 1 was used as a host material for the hole injection layer, and a polymer containing the repeating unit represented by Chemical Formula 2 was used as a material for a hole transport layer, exhibited remarkably improved efficiency and lifetime, as compared with the organic light emitting device of Comparative Example 1 not containing a cured product of the compound represented by Chemical Formula 1 and the organic light emitting device of Comparative Example 2 not containing a polymer including the repeating unit represented by Chemical Formula 2. In general, considering that the luminous efficiency and lifetime characteristics of the organic light emitting devices have a trade-off relationship with each other, it can be seen that the organic light emitting devices employing the combination of the compounds of the present disclosure exhibit significantly improved device characteristics as compared with the devices of Comparative Examples.

DESCRIPTION OF SYMBOLS

| | |
|---|---|
| 1: substrate | 2: anode |
| 3: hole injection layer | 4: hole transport layer |
| 5: light emitting layer | 6: cathode |
| 7: electron transport layer | 8: electron injection layer |

The invention claimed is:

1. An organic light emitting device comprising:

an anode, a hole injection layer, a hole transport layer, a light emitting layer, and a cathode, wherein the hole injection layer includes a cured product of a compound represented by the following Chemical Formula 1, and wherein the hole transport layer includes a polymer including a repeating unit represented by the following Chemical Formula 2,

[Chemical Formula 1]

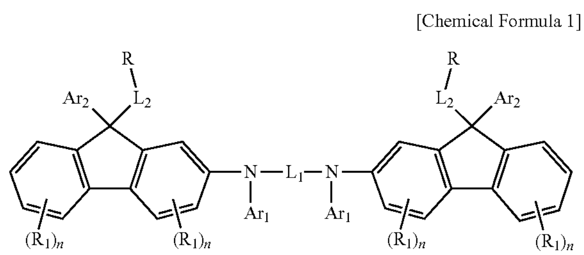

in the Chemical Formula 1, $L_1$ is a substituted or unsubstituted $C_{6-60}$ arylene; or a substituted or unsubstituted $C_{2-60}$ heteroarylene containing one or more heteroatoms selected from the group consisting of N, O and S, each $Ar_1$ is independently a substituted or unsubstituted $C_{6-60}$ aryl, each $Ar_2$ is independently a substituted or unsubstituted $C_{6-60}$ aryl, each $L_2$ is independently a single bond, a substituted or unsubstituted $C_{1-10}$ alkylene, or a substituted or unsubstituted $C_{6-60}$ arylene, each $R_1$ is independently deuterium; halogen; a substituted or unsubstituted $C_{1-60}$ alkyl; a substituted or unsubstituted $C_{1-60}$ alkoxy; a substituted or unsubstituted $C_{6-60}$ aryl; or a substituted or unsubstituted $C_{2-60}$ heteroaryl containing one or more heteroatoms selected from the group consisting of N, O and S, each n is independently an integer of 0 to 3, and each R is independently a photo-curable group; or a thermo-curable group,

[Chemical Formula 2]

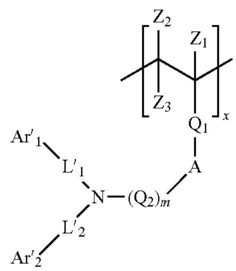

in the Chemical Formula 2, $Z_1$ to $Z_3$ are each independently hydrogen or $C_{1-10}$ alkyl, $Q_1$ is a substituted or unsubstituted $C_{6-60}$ arylene, $Q_2$ is a single bond; a substituted or unsubstituted $C_{6-60}$ arylene; or a substituted or unsubstituted $C_{2-60}$ heteroarylene containing one or more heteroatoms selected from the group consisting of N, O and S, m is an integer of 1 to 10, $L'_1$ and $L'_2$ are each independently a single bond; a substituted or unsubstituted $C_{6-60}$ arylene; or a substituted or unsubstituted $C_{2-60}$ heteroarylene containing one or more heteroatoms selected from the group consisting of N, O and S, $Ar'_1$ and $Ar'_2$ are each independently a substituted or unsubstituted $C_{6-60}$ aryl; or a $C_{2-60}$ heteroaryl containing one or more heteroatoms selected from the group consisting of N, O and S, A is $-L'_3-A'-$, $L'_3$ is a single bond, —O—, $—(CH_2)_y—$, $—O(CH_2)_y—$, or $—(CH_2)_yO—$, where y is 1, wherein the substituted or unsubstituted means being substituted with one or more substituents selected from the group consisting of deuterium, halogen, alkyl, alkoxy, aryl, and aryloxy, or with a substituent to which two or more of the substituents are connected, or being unsubstituted, A' is any one selected from the group consisting of the following:

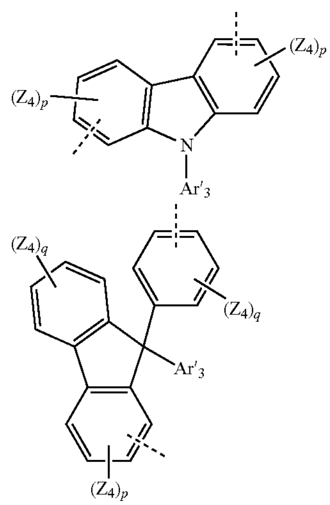

-continued

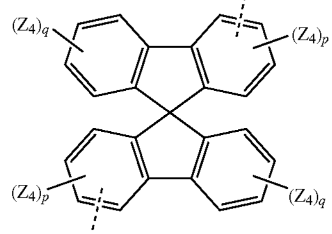

wherein each $Ar'_3$ is independently a $C_{6-20}$ aryl, which is unsubstituted, or substituted with 1 or 2 $C_{1-10}$ alkyl; or $C_{1-10}$ alkoxy, each $Z_4$ is independently deuterium; halogen; hydroxy; or cyano, each p is independently an integer of 0 to 3, each q is independently an integer of 0 to 4, and x is an integer of 8 to 100, the polymer including the repeating unit represented by Chemical Formula 2 has a number average molecular weight (Mn) of 10,000 g/mol to 100,000 g/mol.

2. The organic light emitting device according to claim 1, wherein $L_1$ is phenylene, biphenyldiyl, terphenyldiyl, phenylnaphthalenediyl, binaphthyldiyl, phenanthrendiyl, spirobifluorenediyl, dimethylfluorenediyl, diphenylfluorenediyl, or tetraphenylfluorenediyl, each of which is unsubstituted, or substituted with one or two $C_{1-10}$ alkyls.

3. The organic light emitting device according to claim 1, wherein $L_1$ is any one selected from the group consisting of the following:

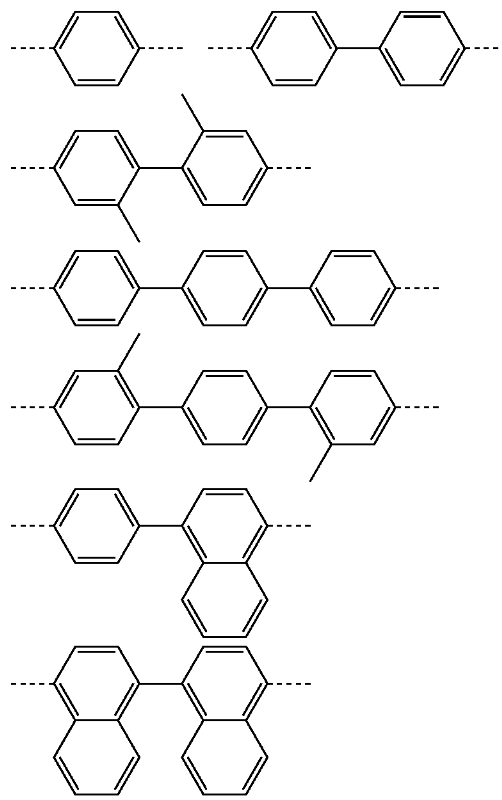

-continued
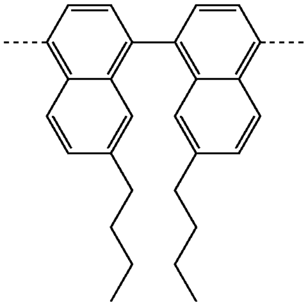
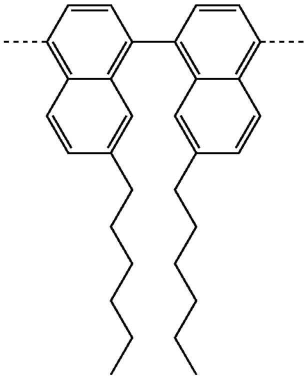
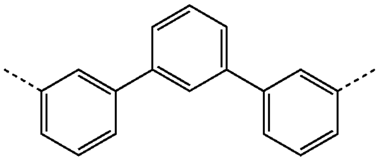
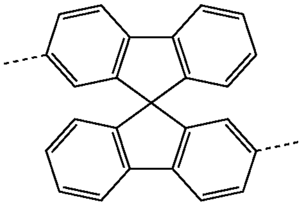
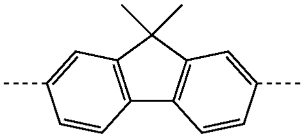
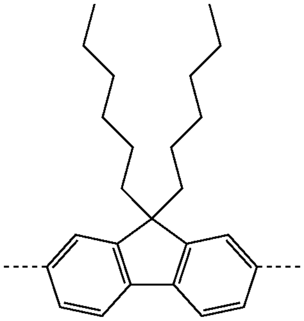
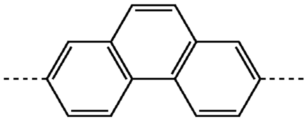
-continued
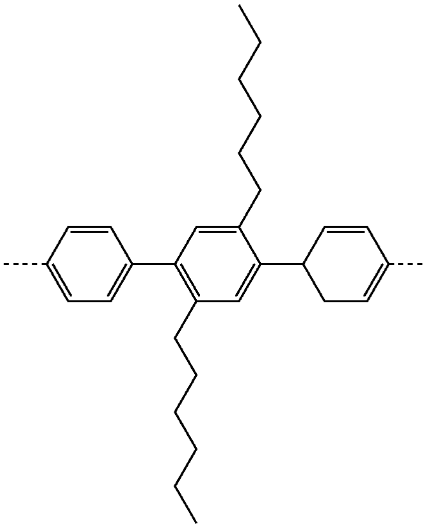
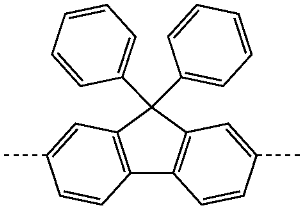
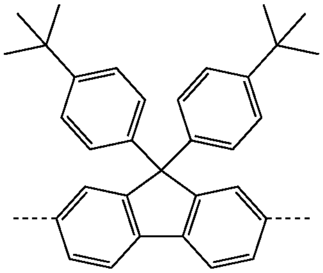
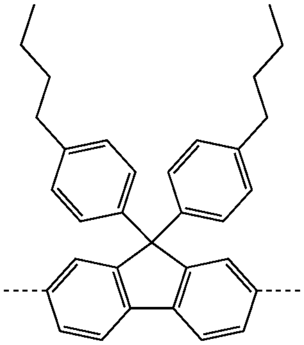

-continued

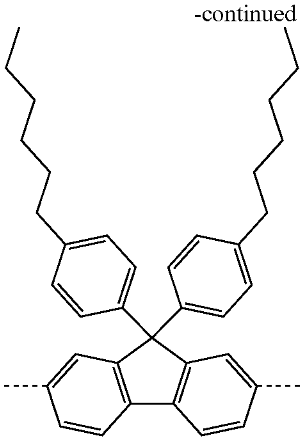

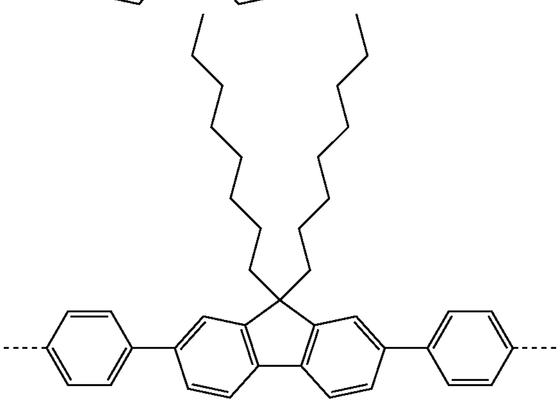

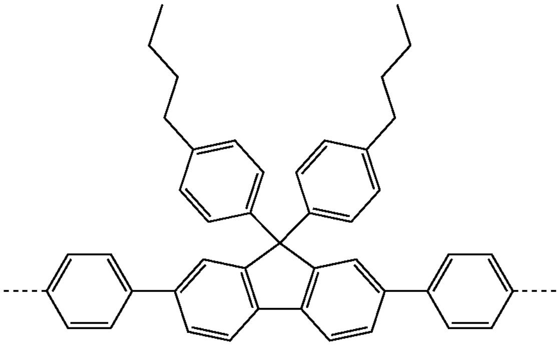

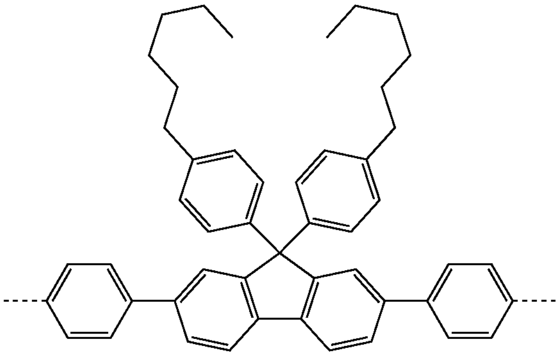

4. The organic light emitting device according to claim 1, wherein each $Ar_1$ is independently phenyl, biphenylyl, naphthyl, phenanthrenyl, or dimethylfluorenyl, each of which is unsubstituted, or substituted with 1 to 5 deuteriums, or halogen.

5. The organic light emitting device according to claim 1, wherein each $Ar_2$ is independently phenyl, biphenylyl, or naphthyl, each of which is unsubstituted, or substituted with —R; 1 to 5 deuteriums; one or two $C_{1-10}$ alkyls; 1 to 5 halogens; a $C_{1-10}$ alkoxy; a $C_{1-10}$ alkoxy substituted with a $C_{1-10}$ alkoxy; $C_{1-10}$ haloalkyl; or phenoxy, and the R is as defined in claim 1.

6. The organic light emitting device according to claim 1, wherein each $L_2$ is independently a single bond, butylene, pentylene, hexylene, heptylene, or phenylene.

7. The organic light emitting device according to claim 1, wherein R is $-L_3-R_2$, and $L_3$ is a single bond, —O—, —S—, —$CH_2$—, —$CH_2O$—, —$OCH_2$—, —$CH_2OCH_2$—, —$CH_2S$—, —$SCH_2$—, or —$CH_2SCH_2$—, and the $R_2$ is any one selected from the group consisting of the following:

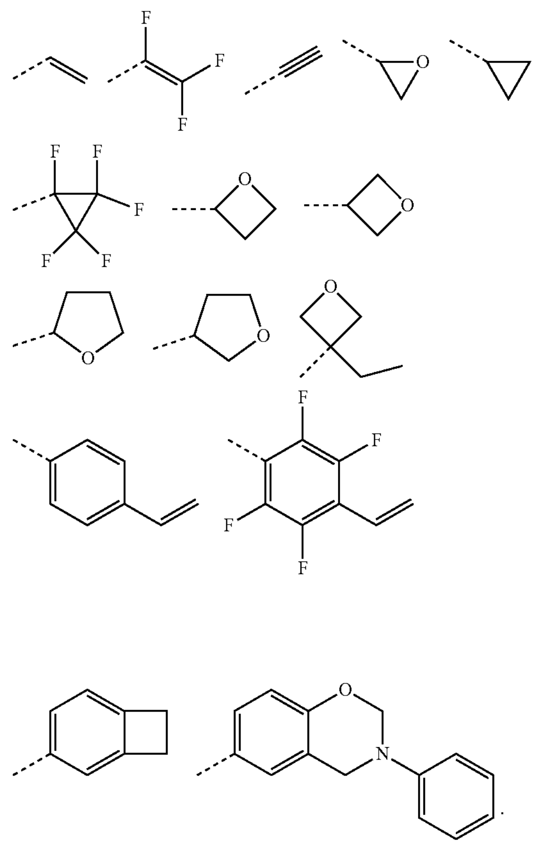

8. The organic light emitting device according to claim 1, wherein the compound represented by Chemical Formula 1 is any one selected from the group consisting of the following:

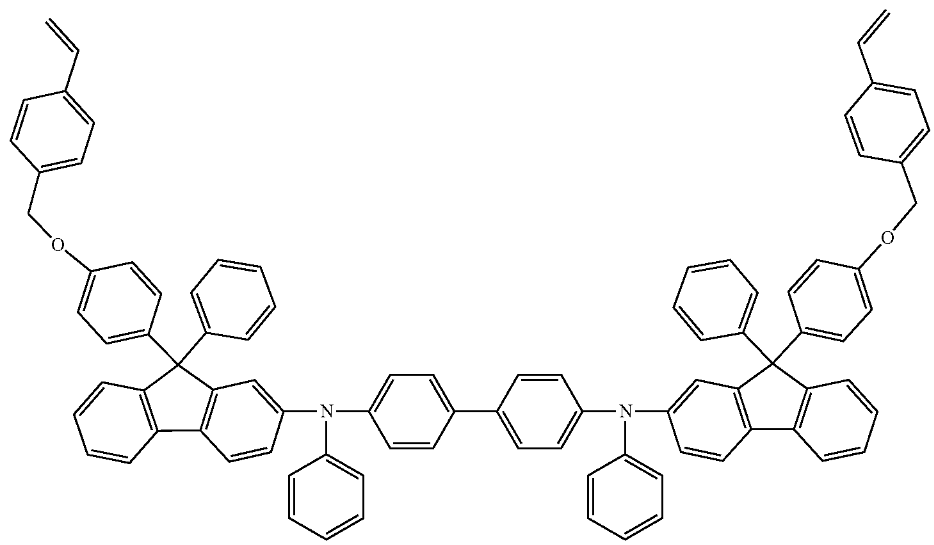
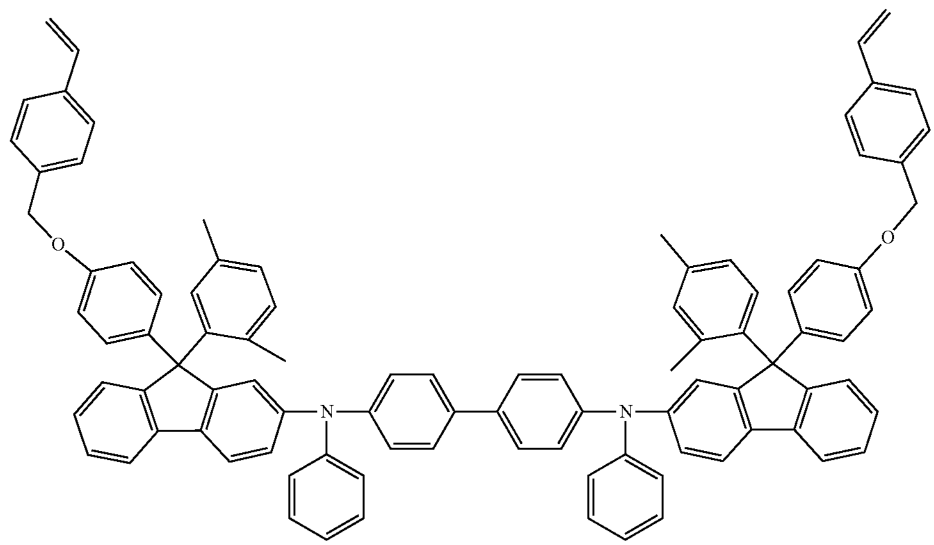
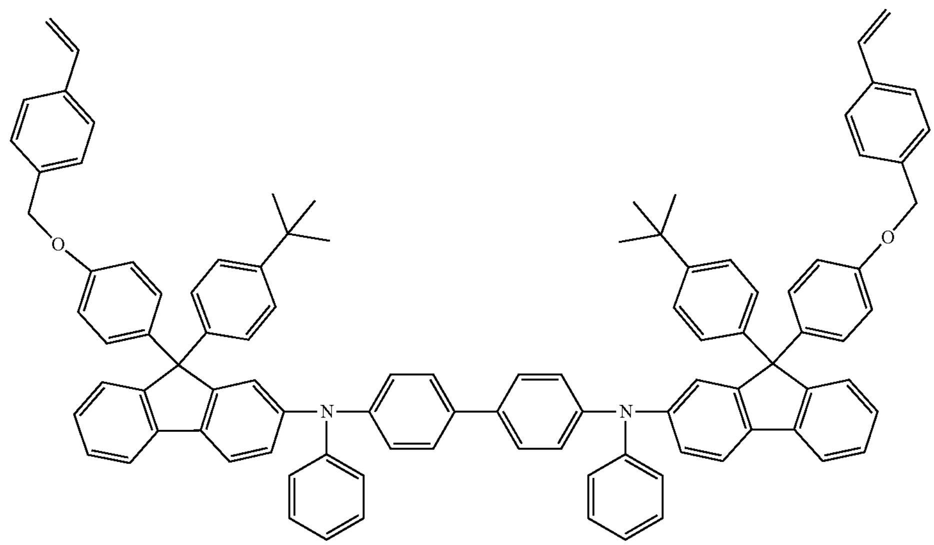

-continued
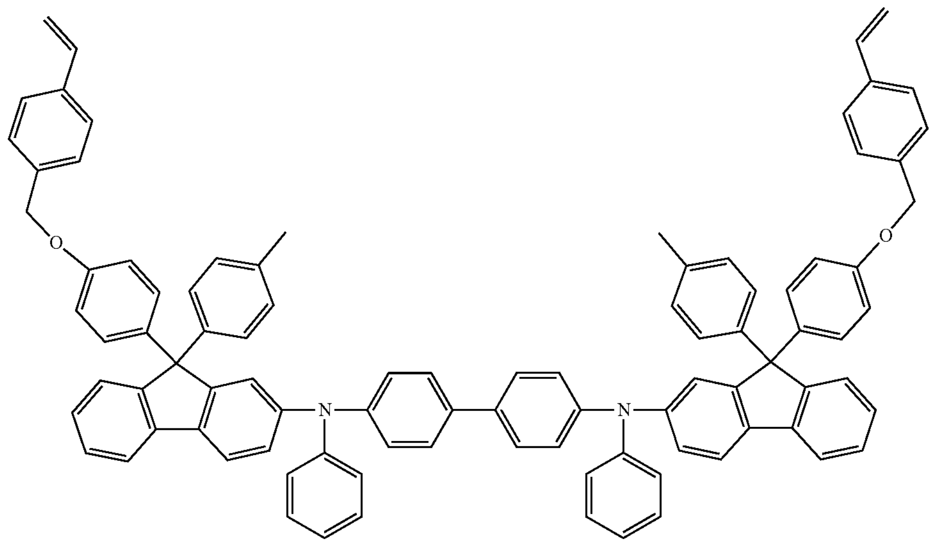
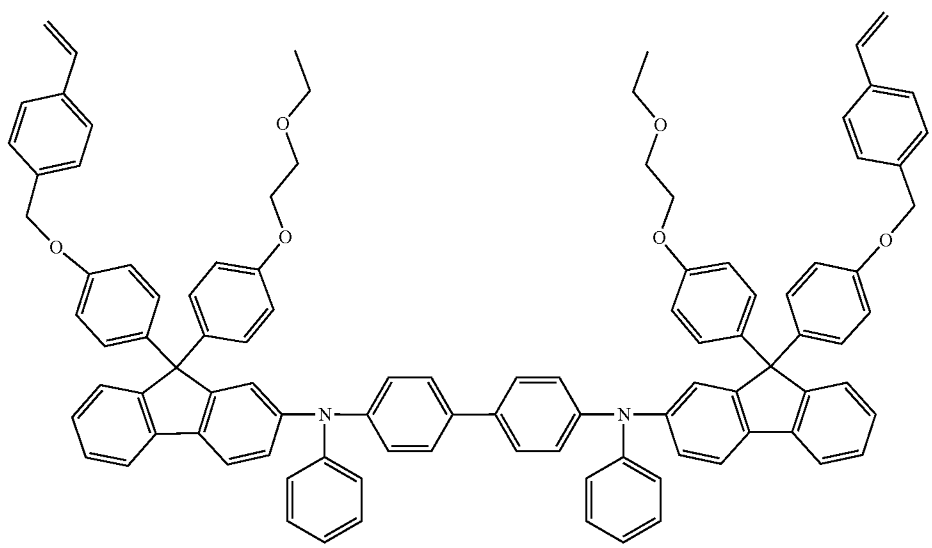
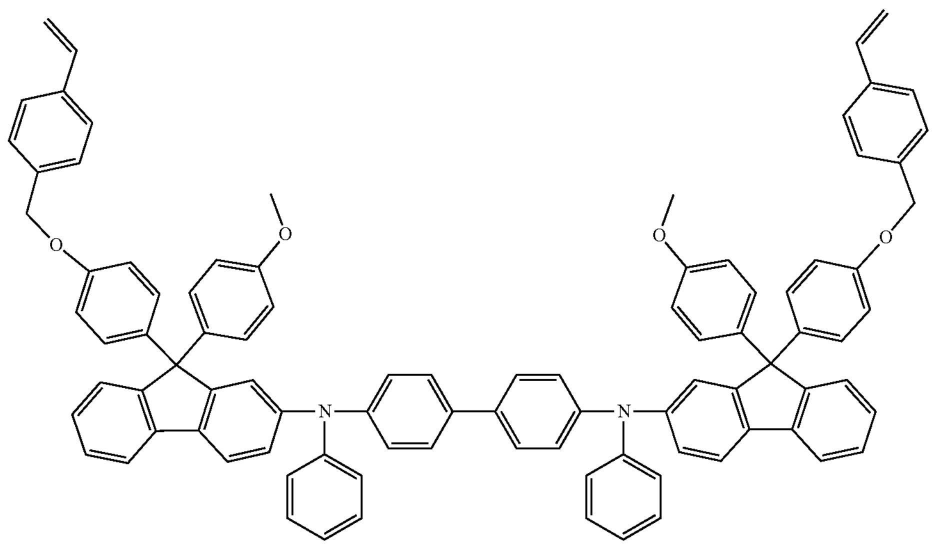

-continued
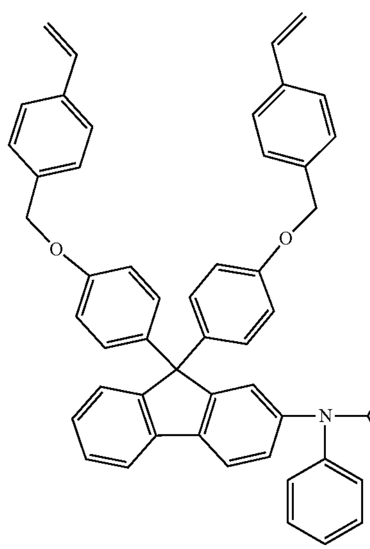
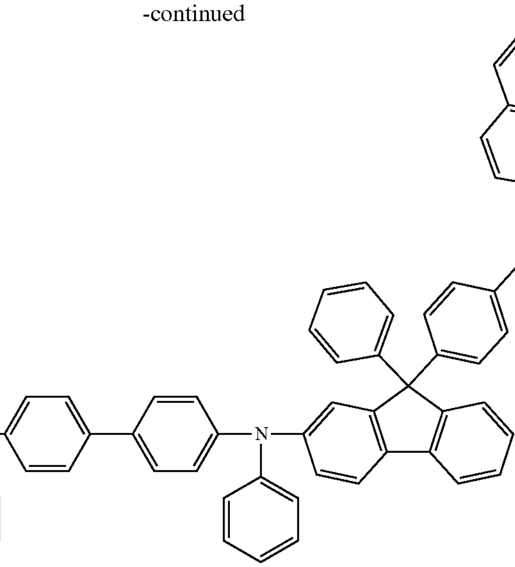
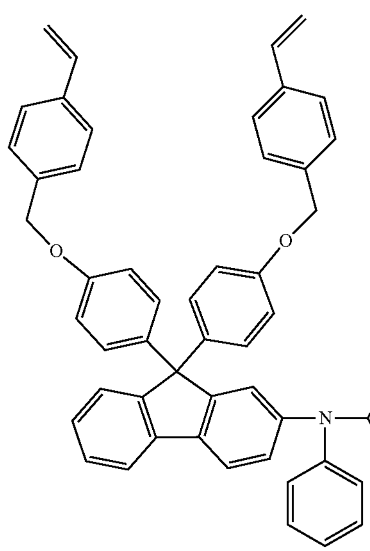
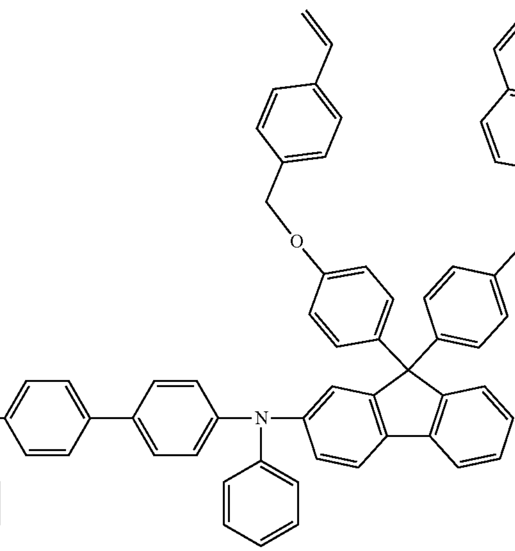
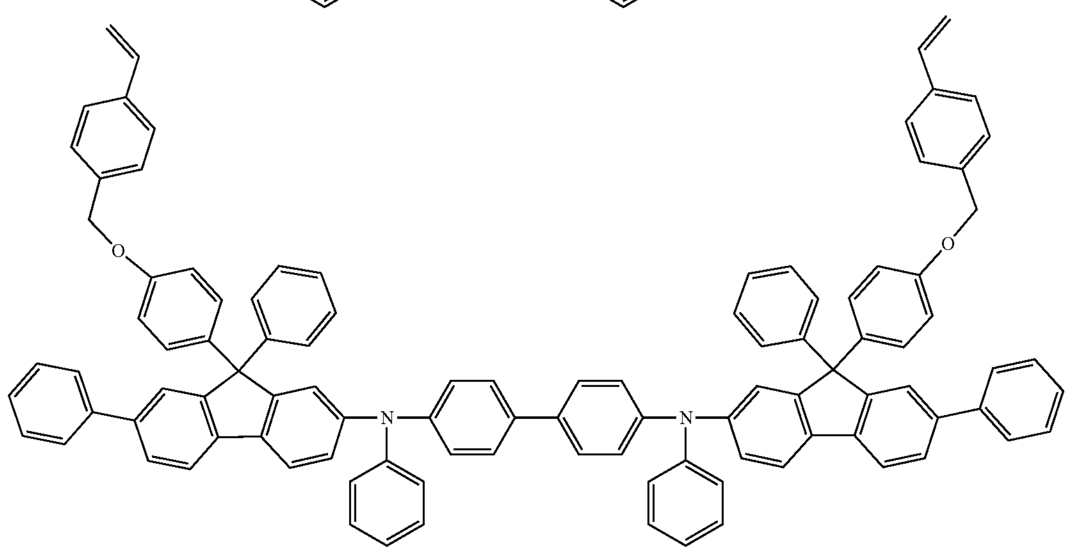
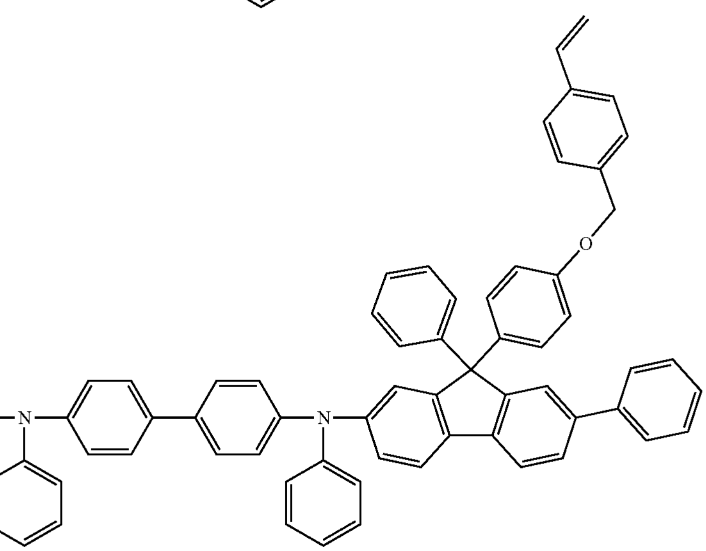

-continued
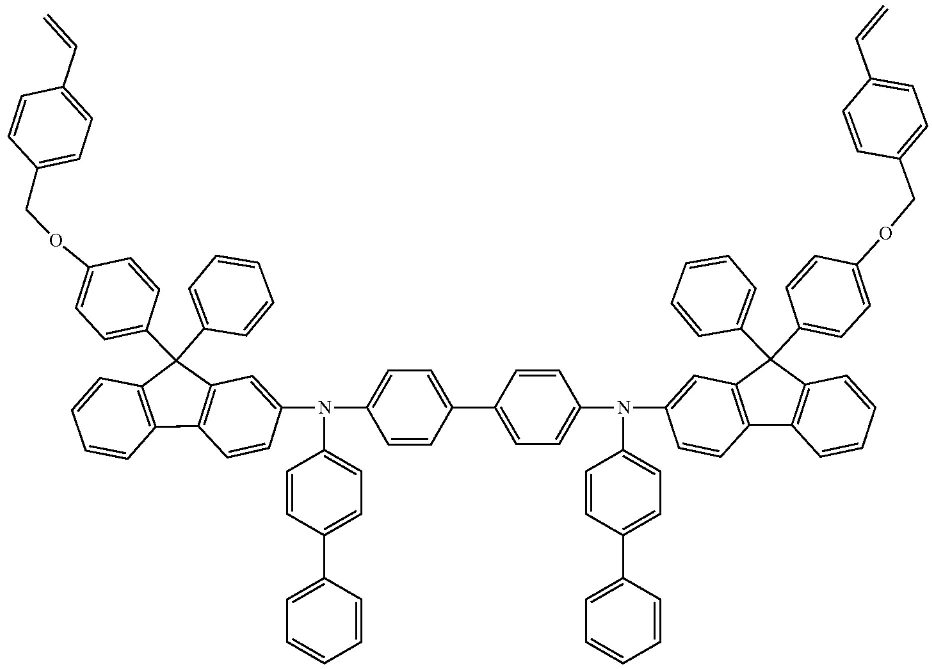
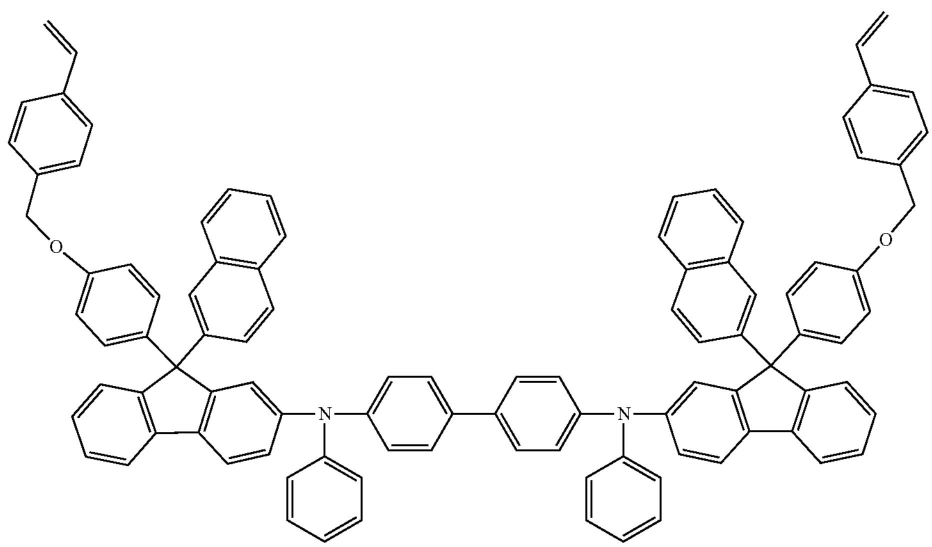

-continued
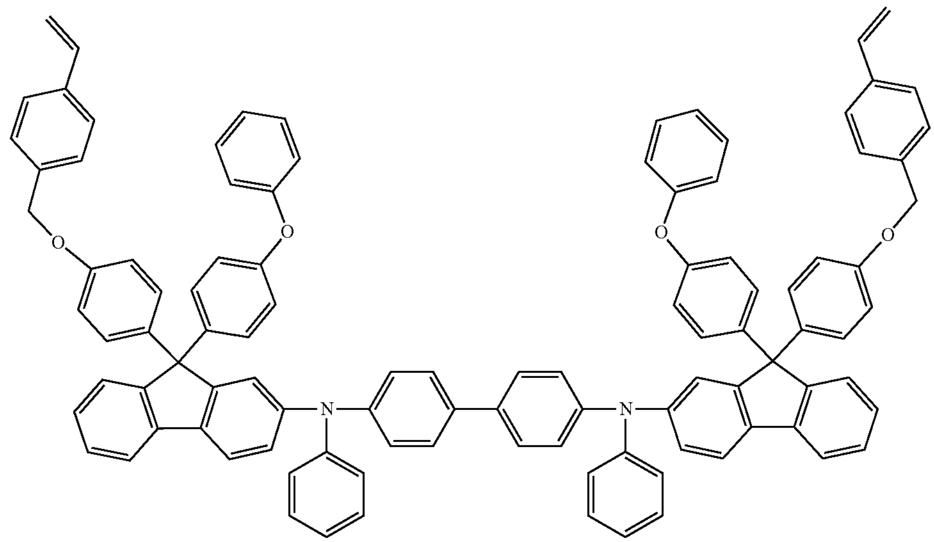
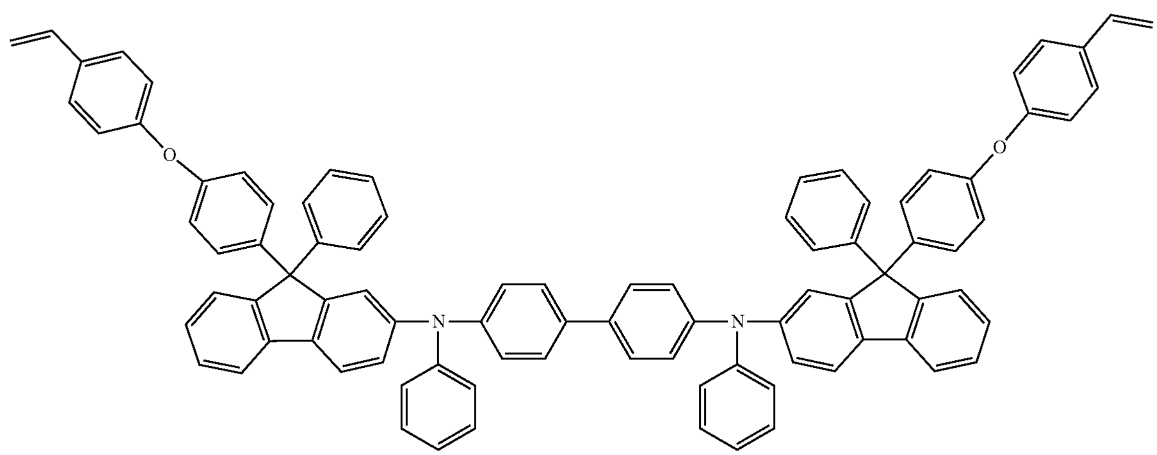
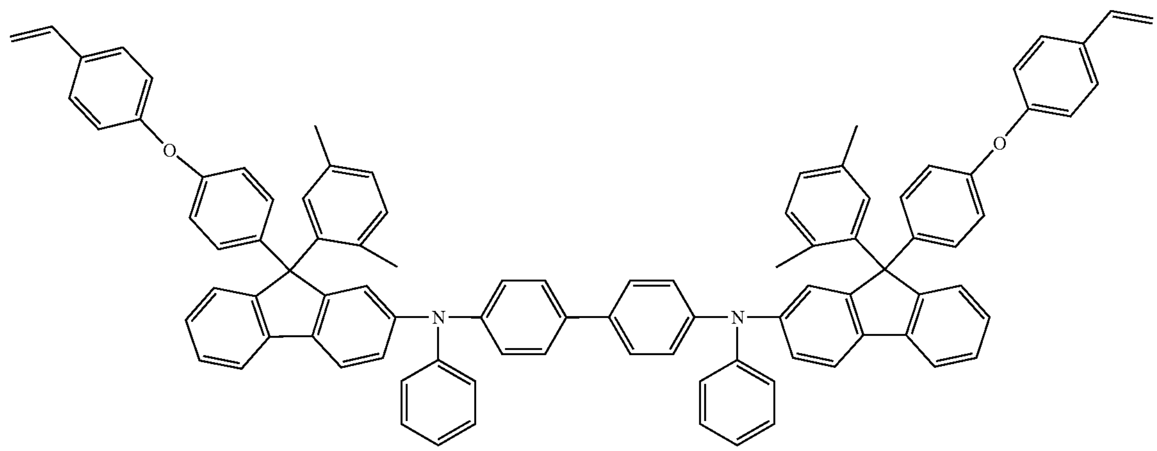

-continued
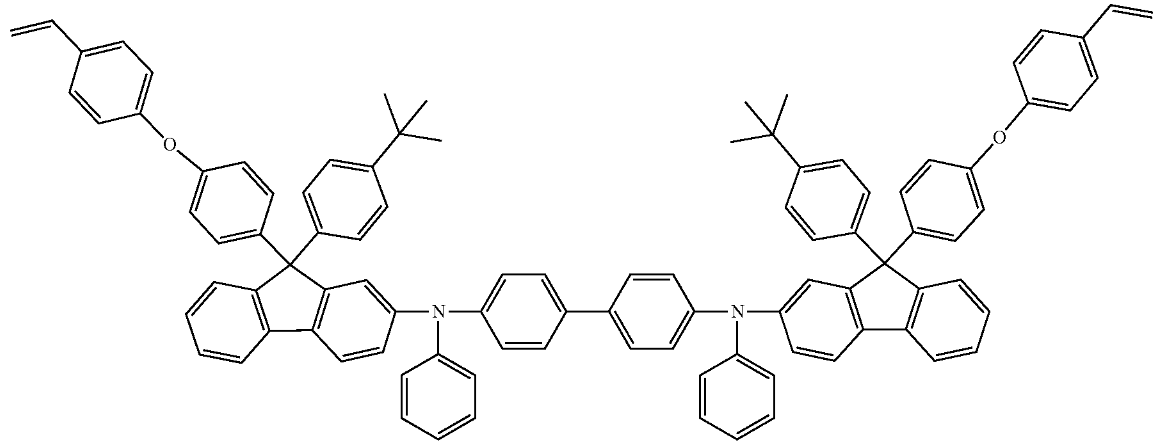
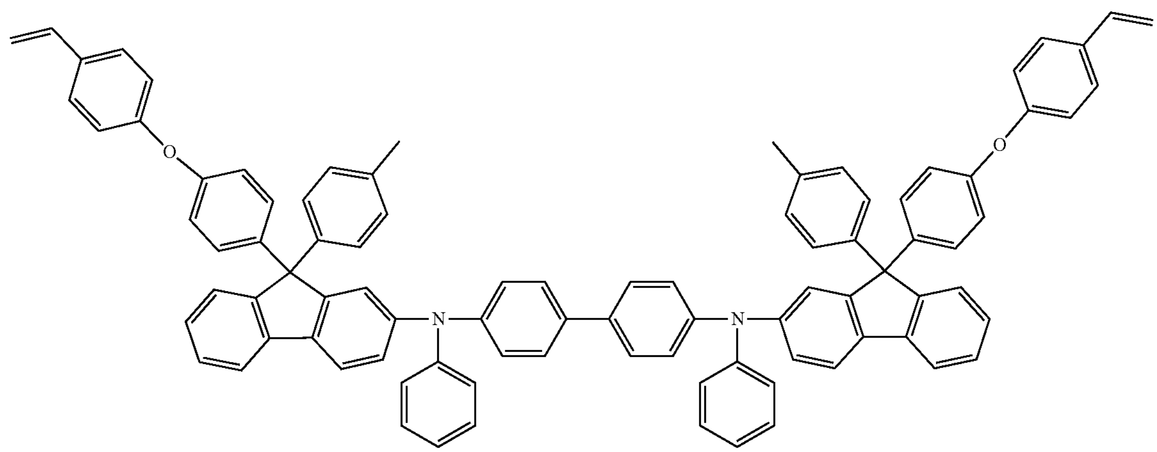
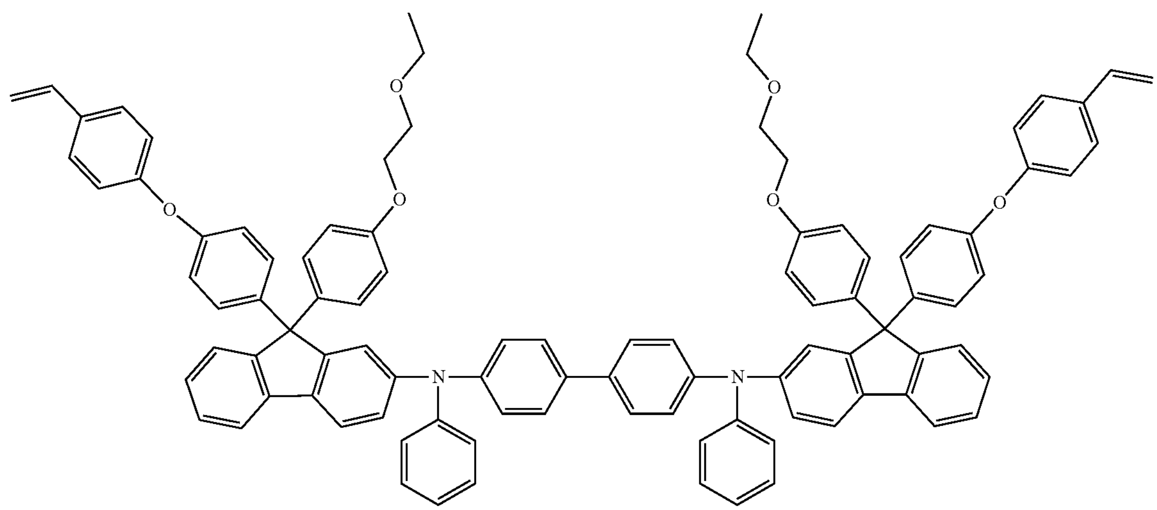

-continued
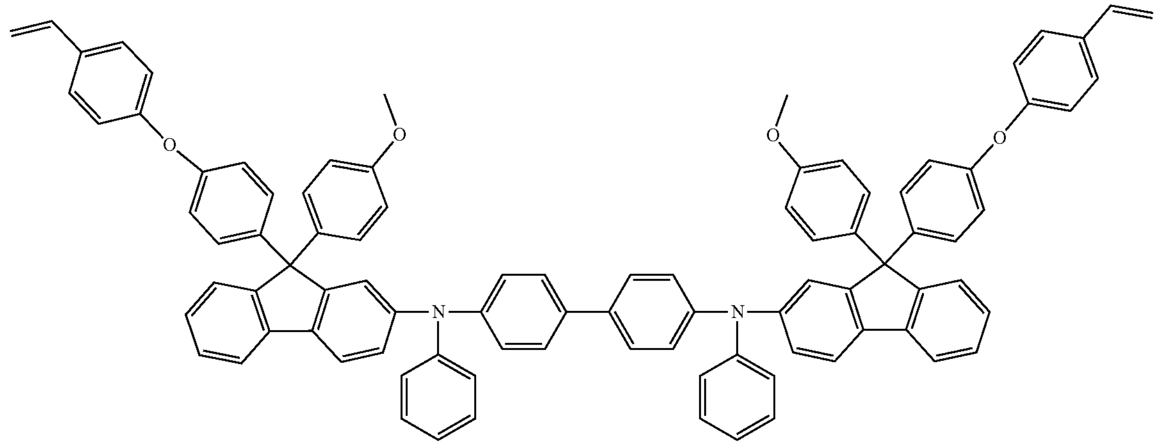
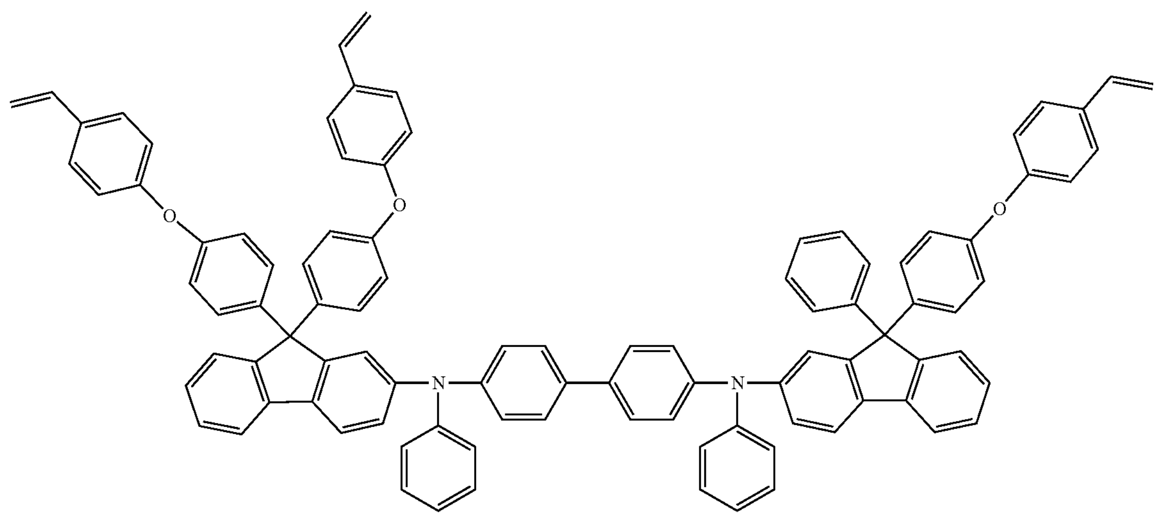
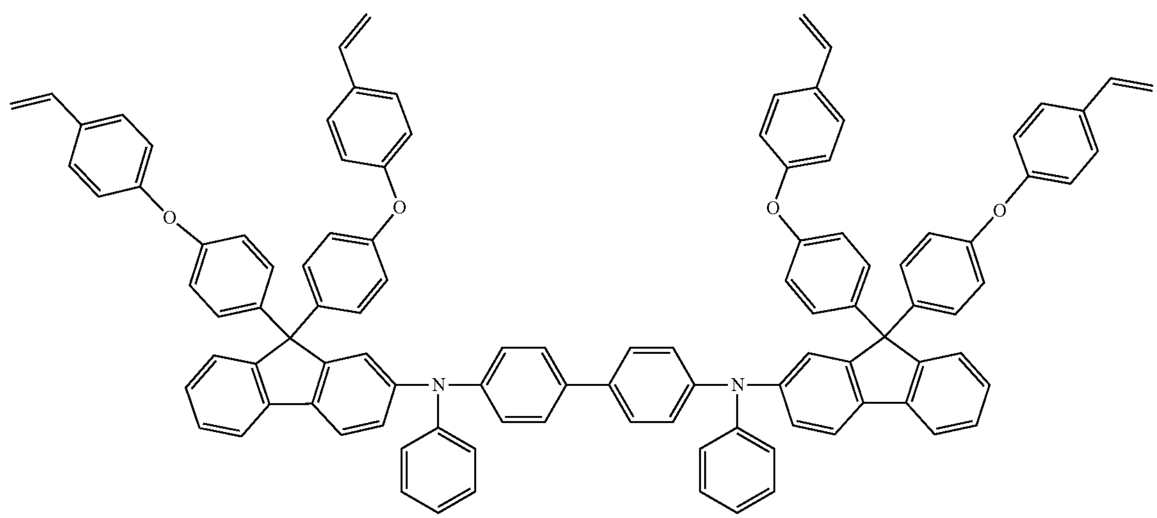

-continued
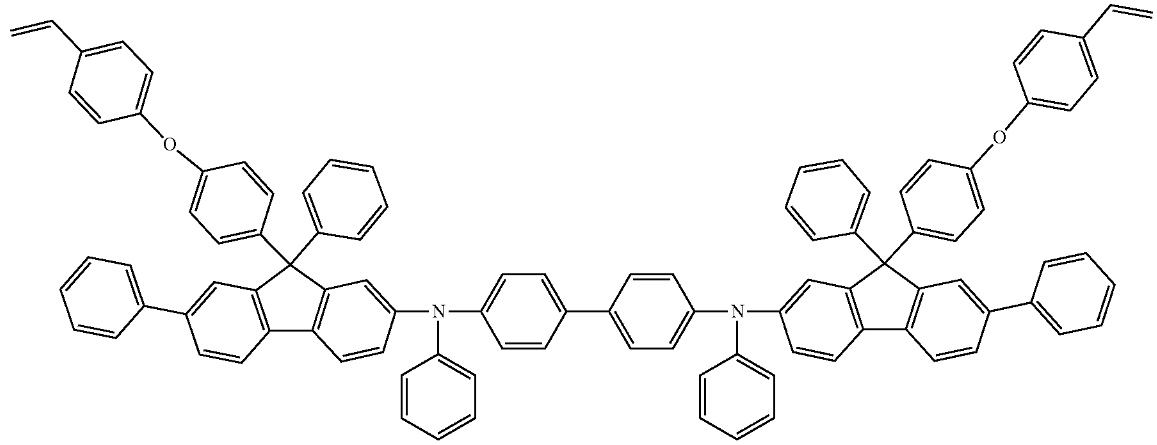
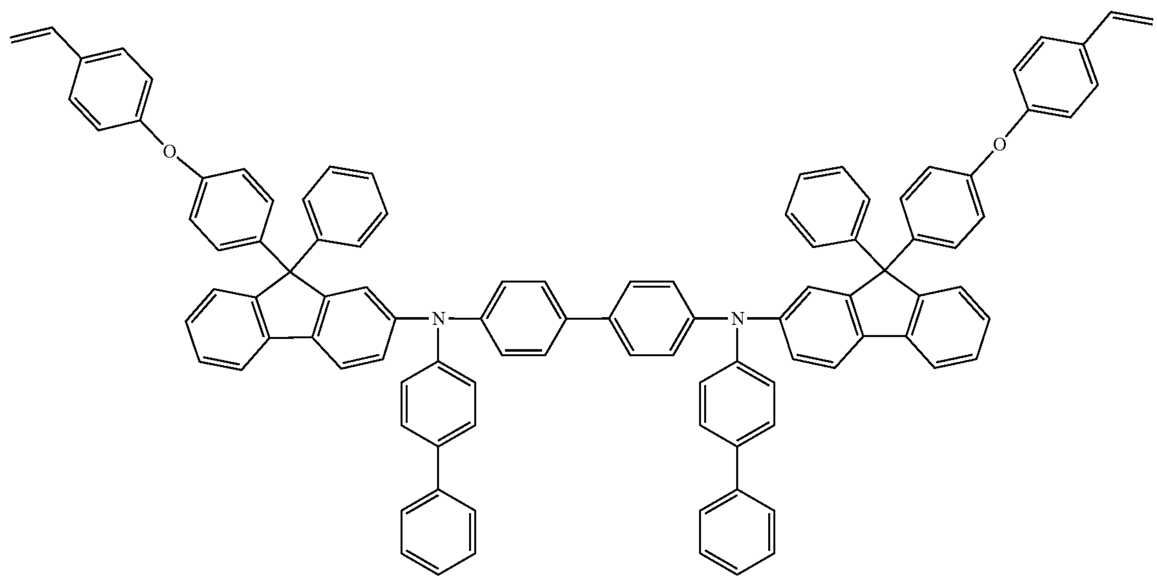
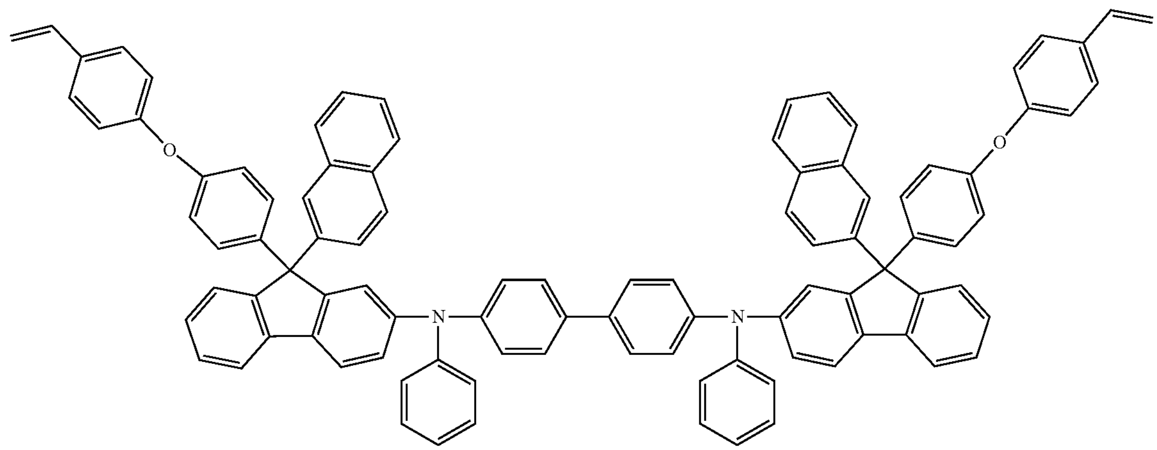

-continued
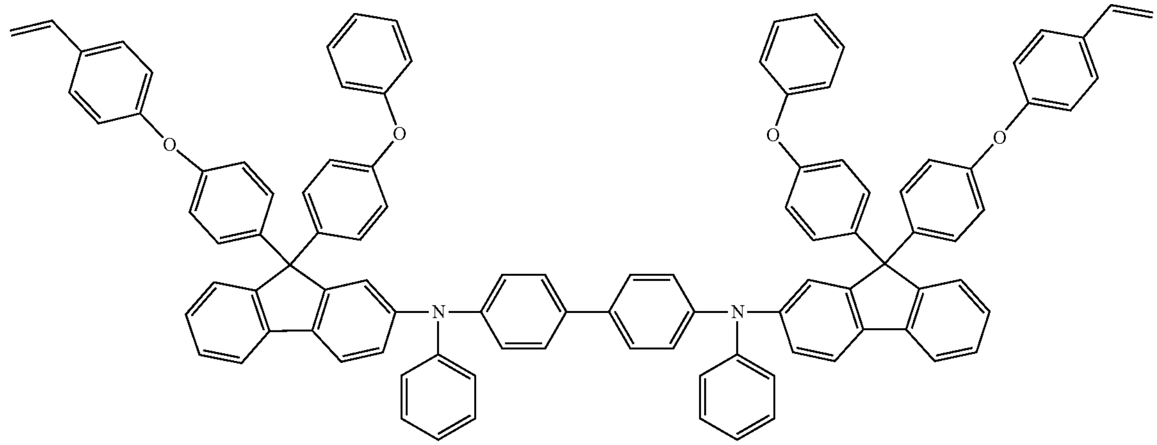
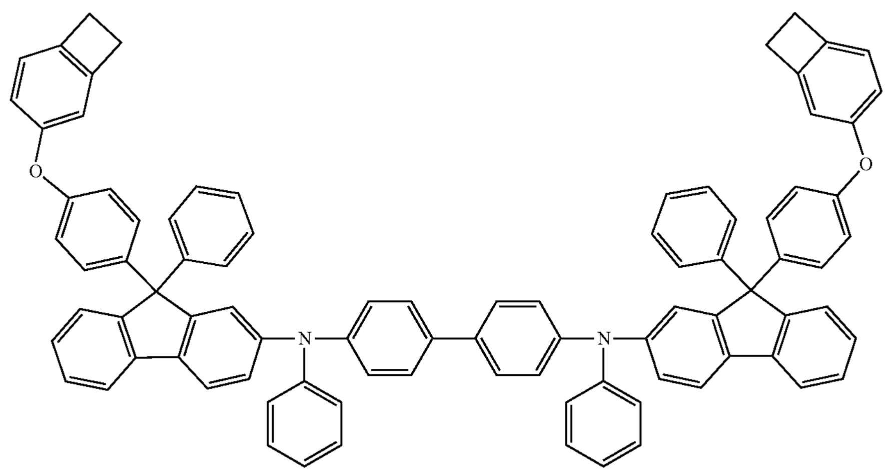
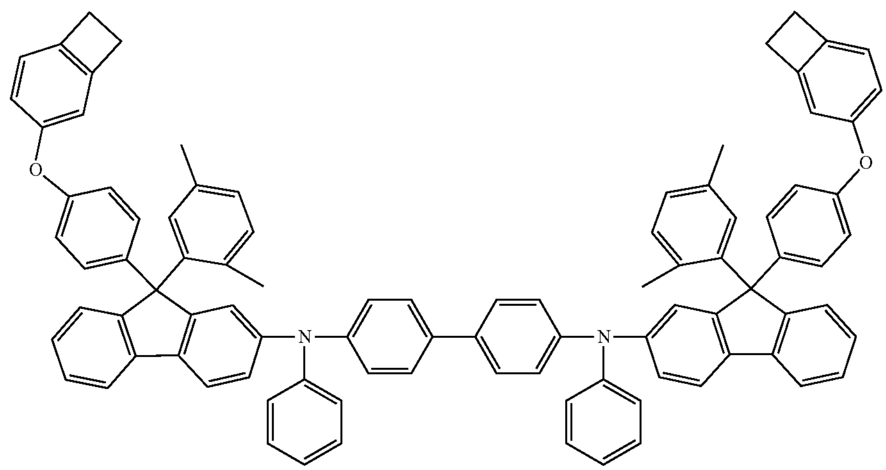

-continued
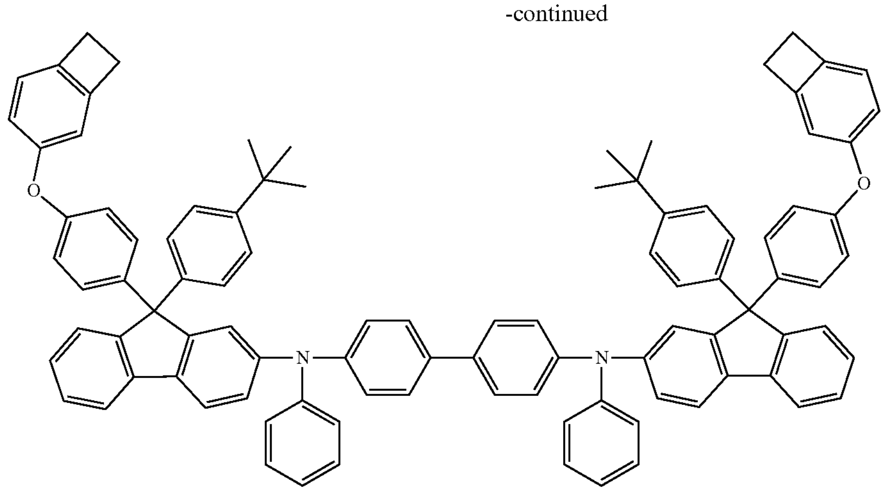
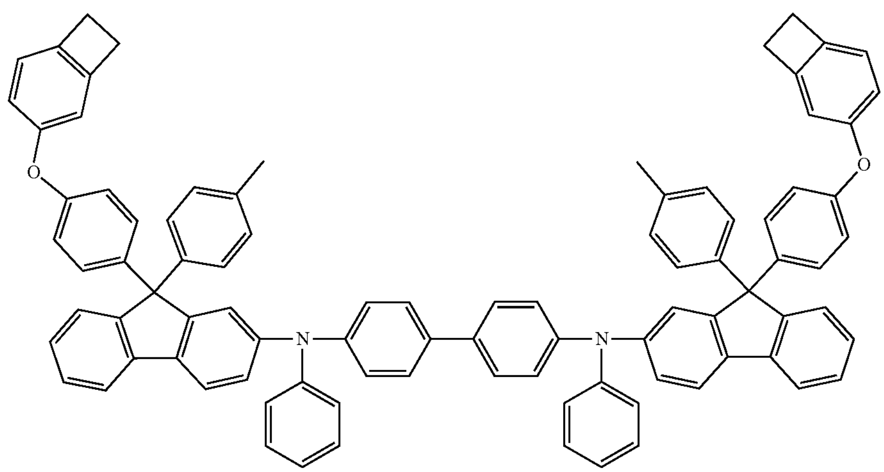
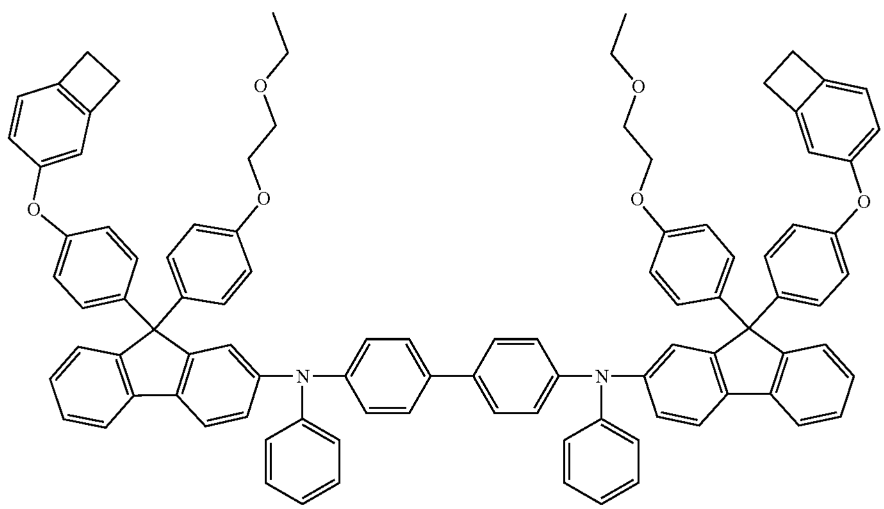

-continued
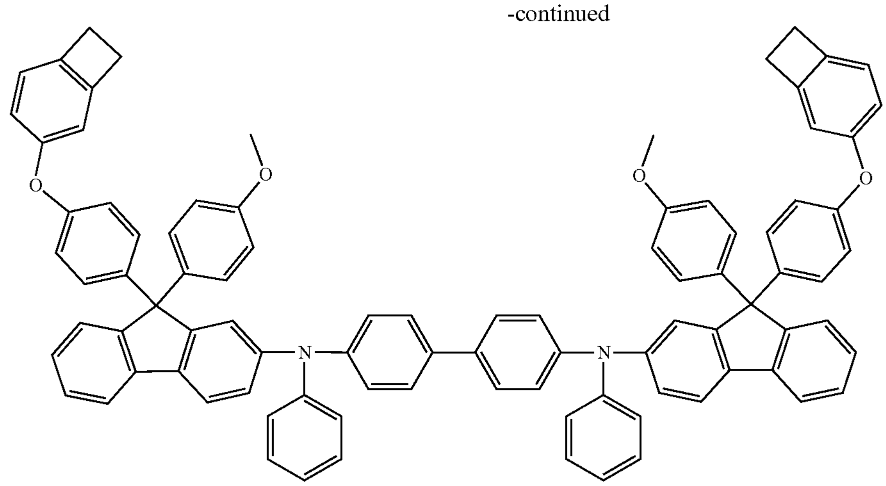
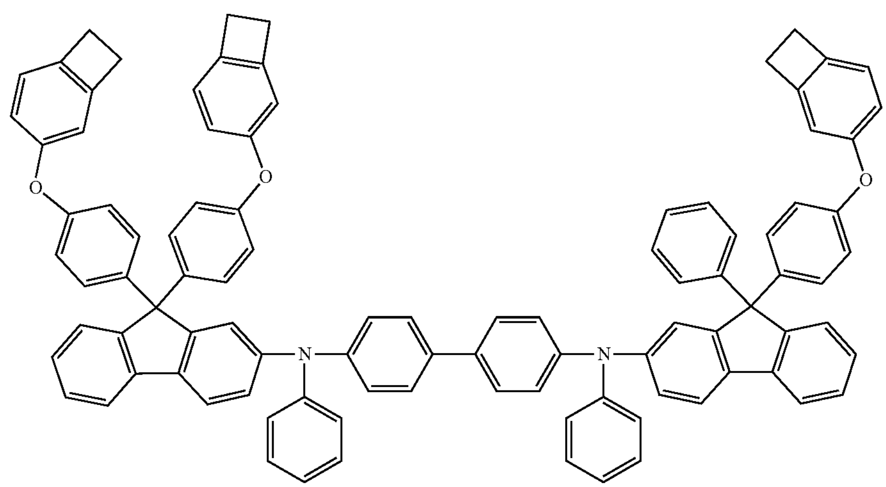
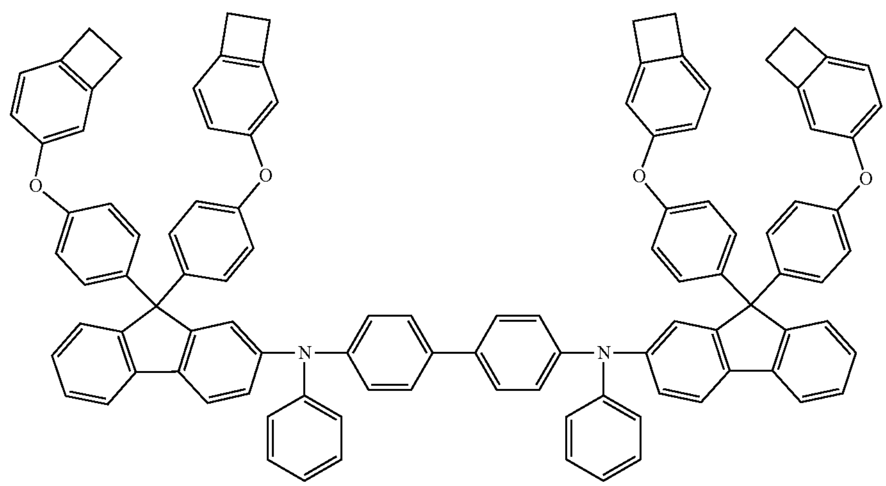

-continued
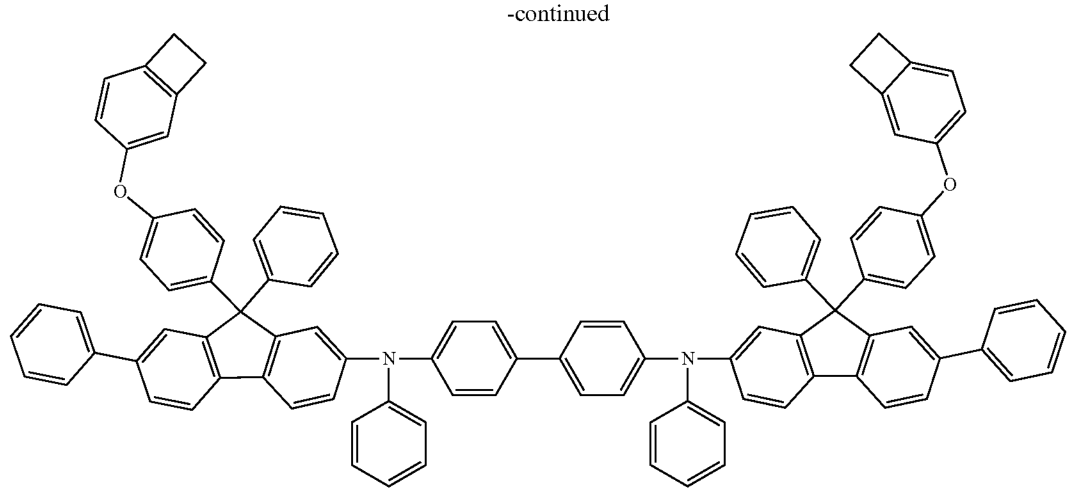
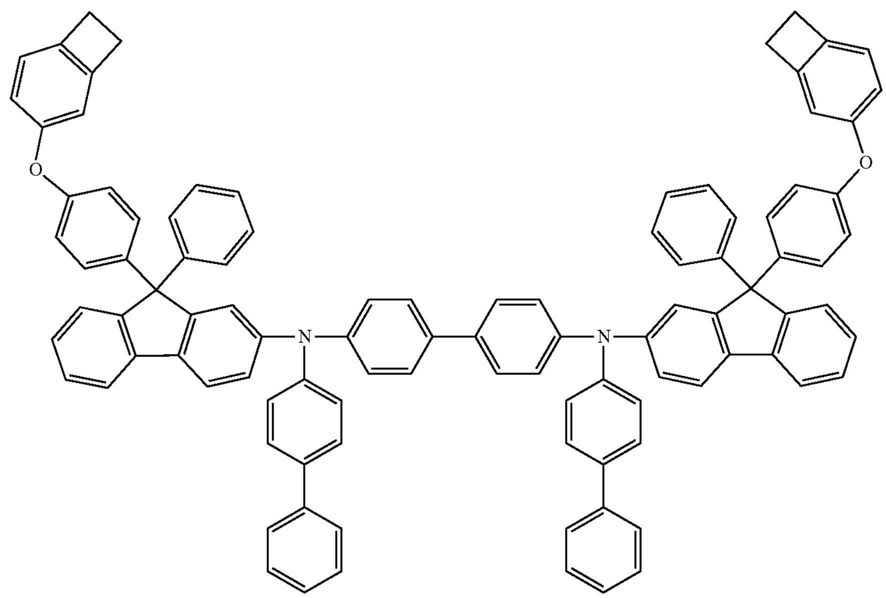
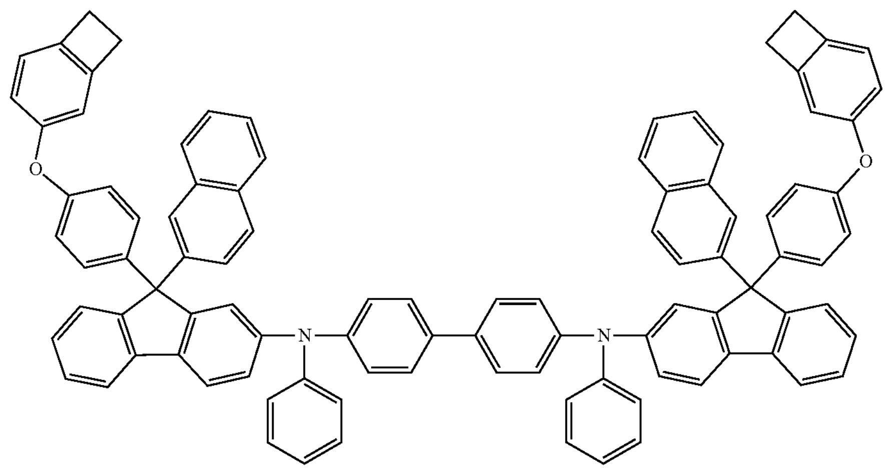

-continued
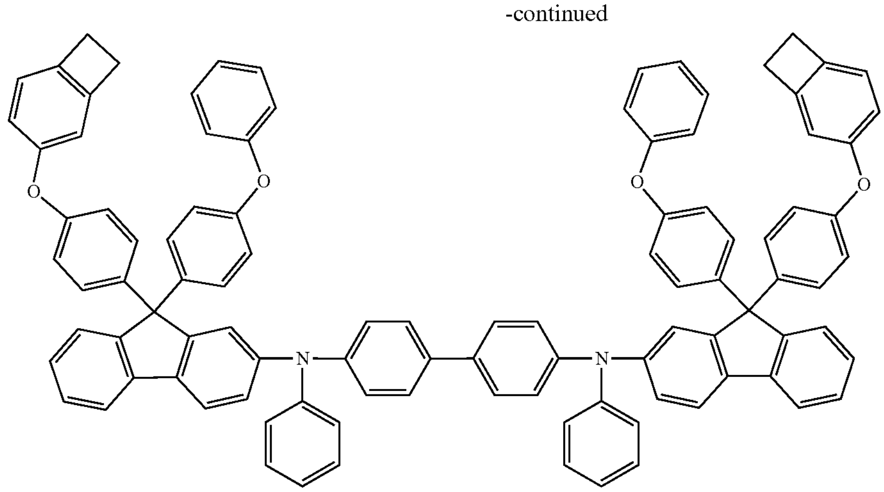
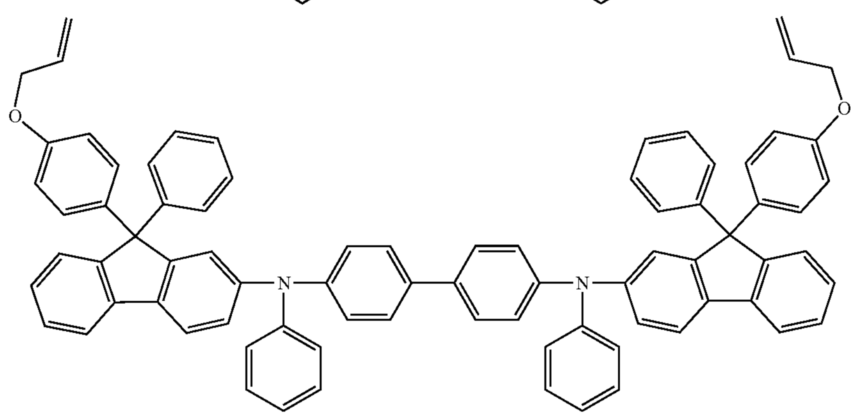
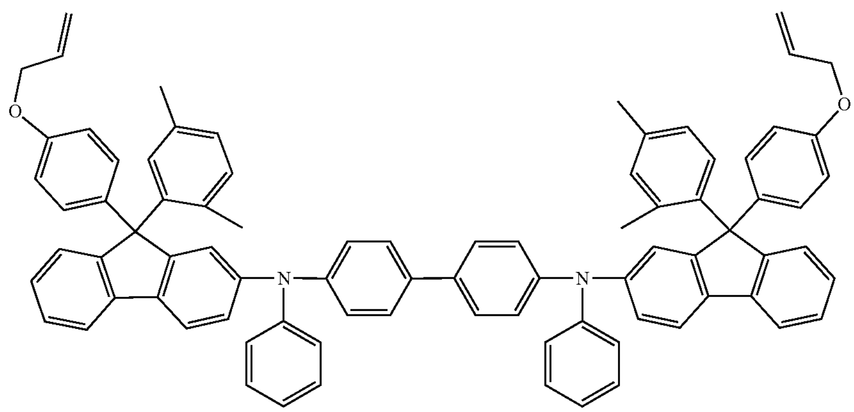
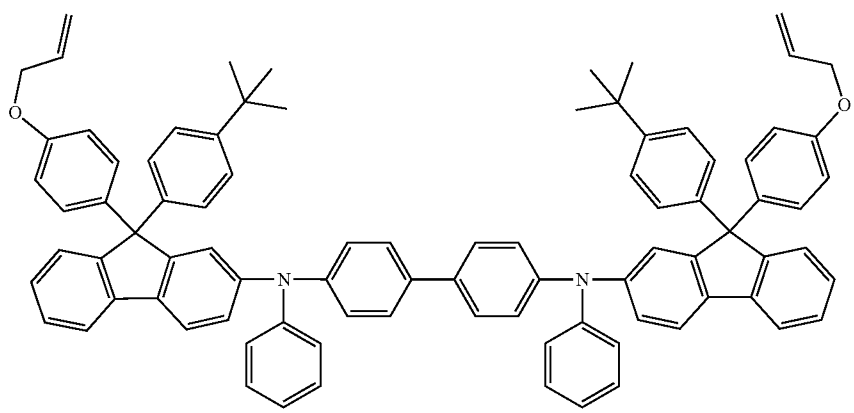

-continued
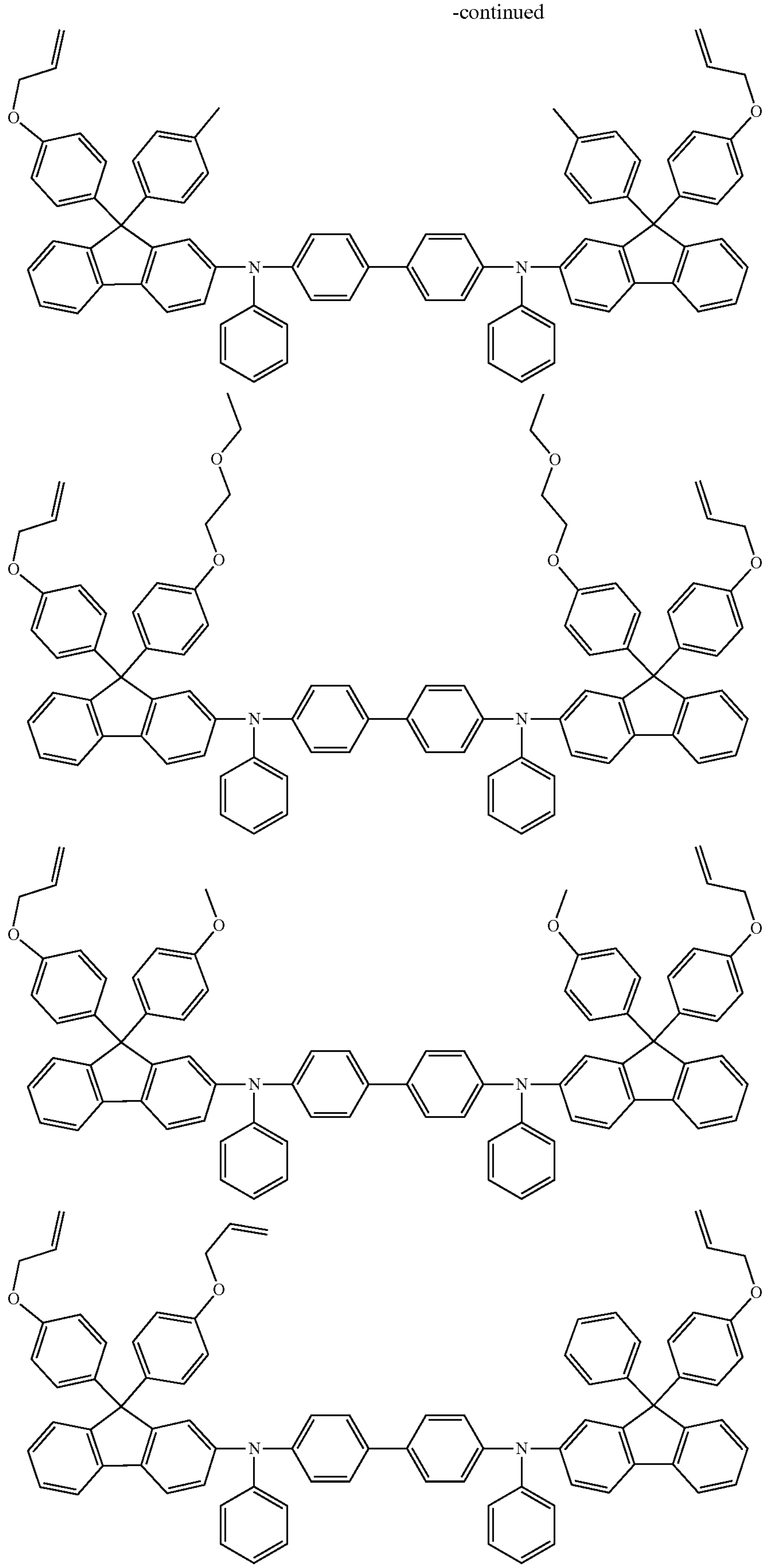

-continued
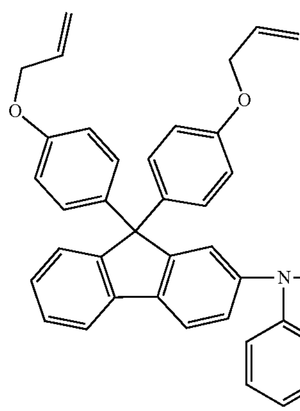
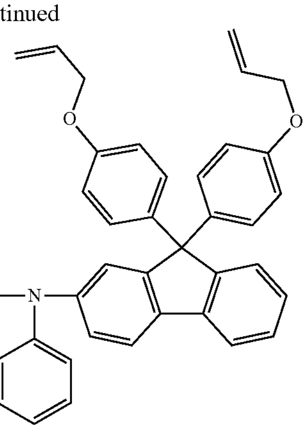
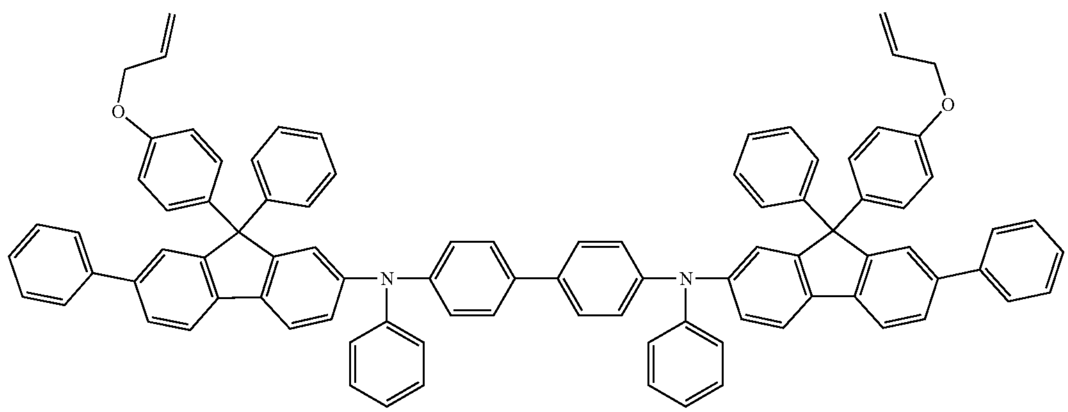
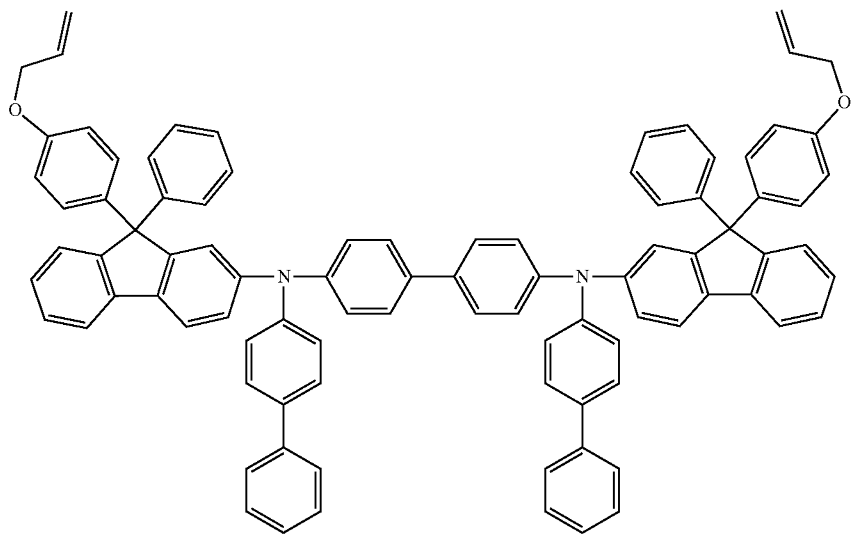

-continued
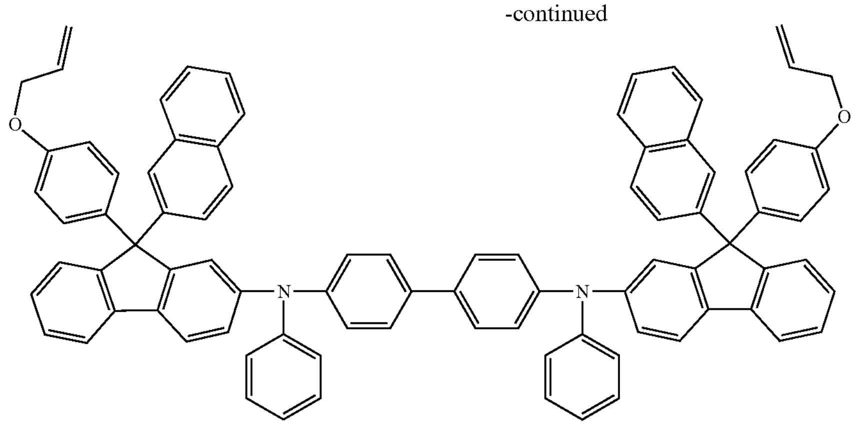
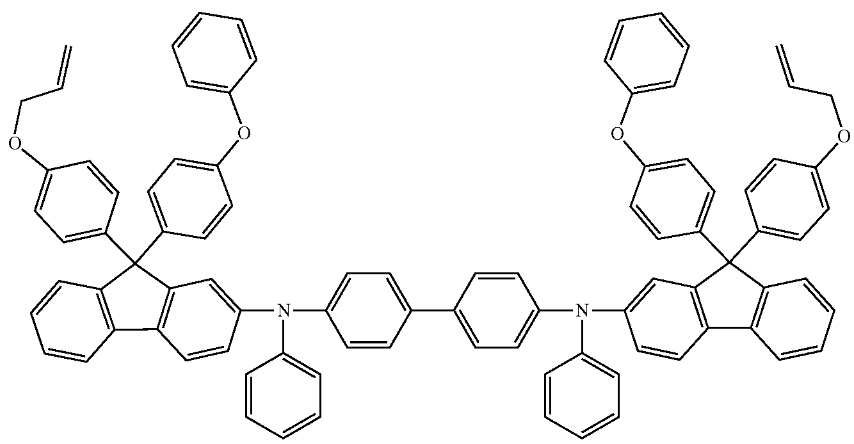
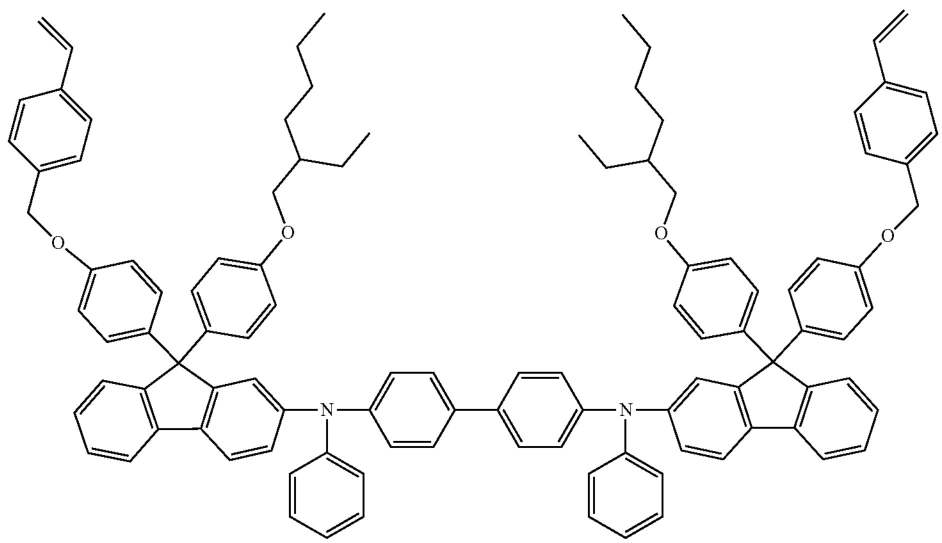

-continued
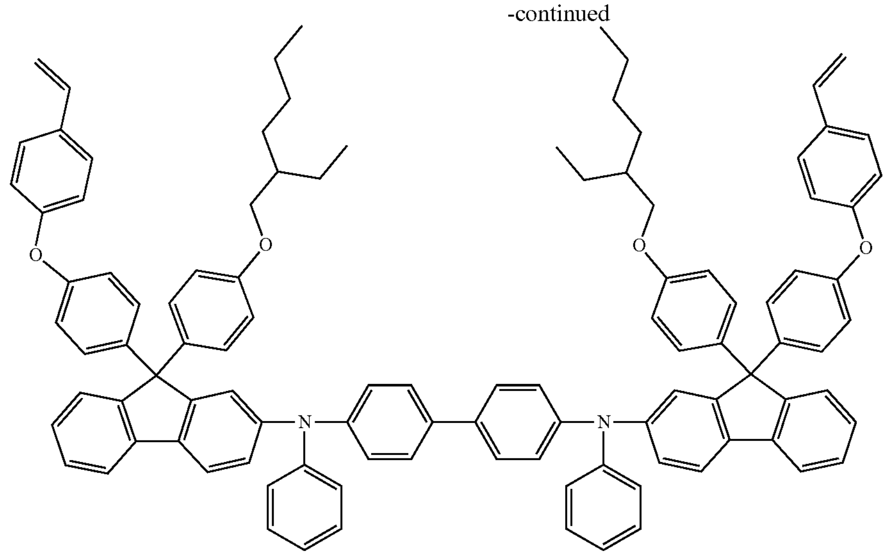
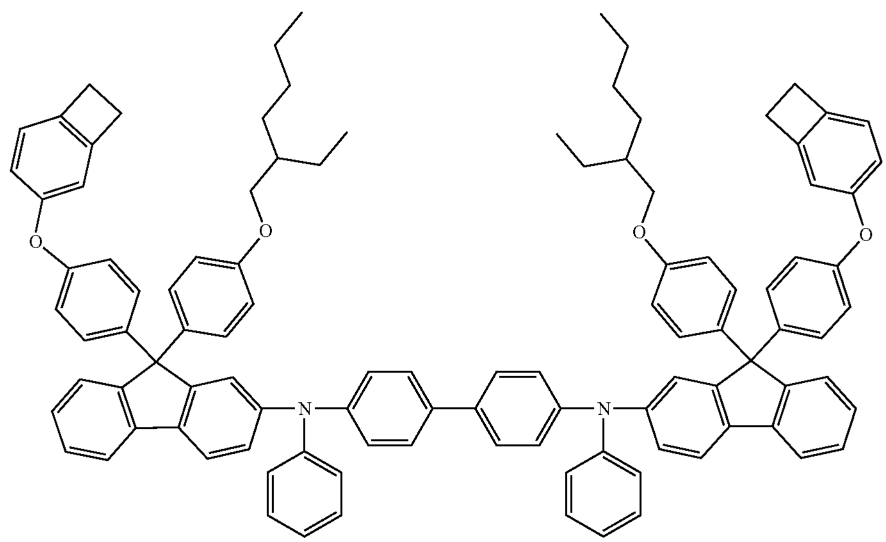
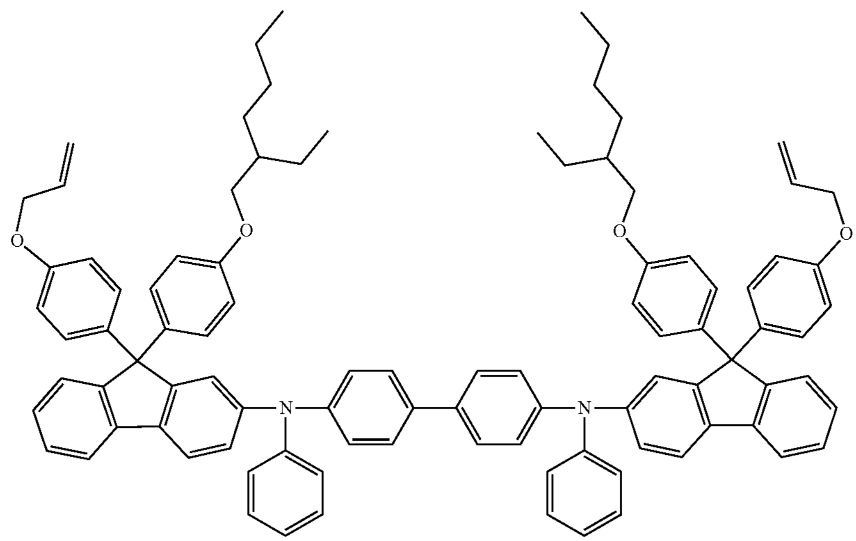

-continued
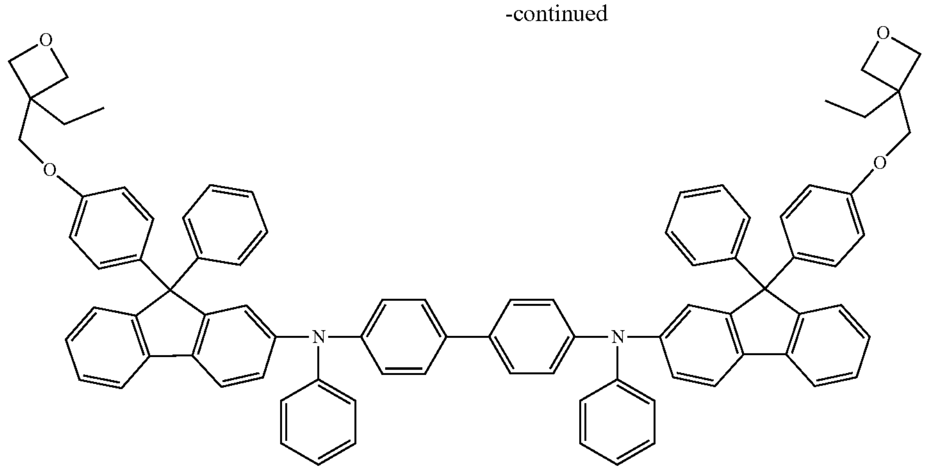
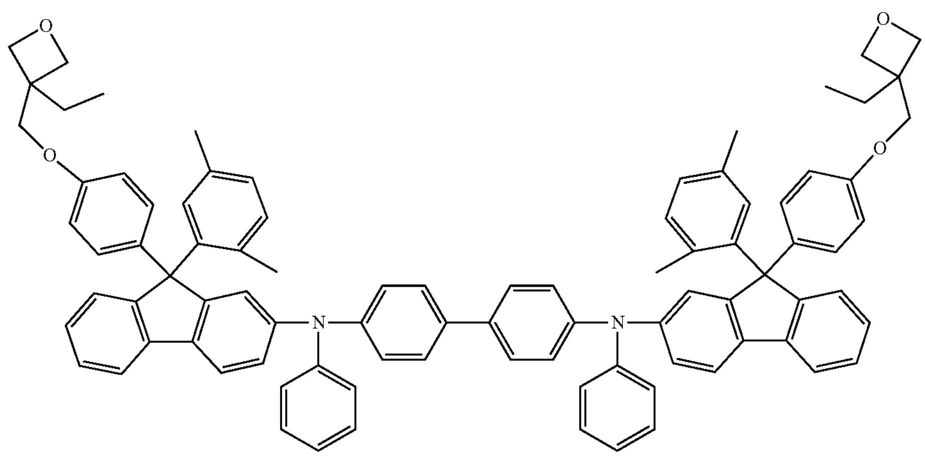
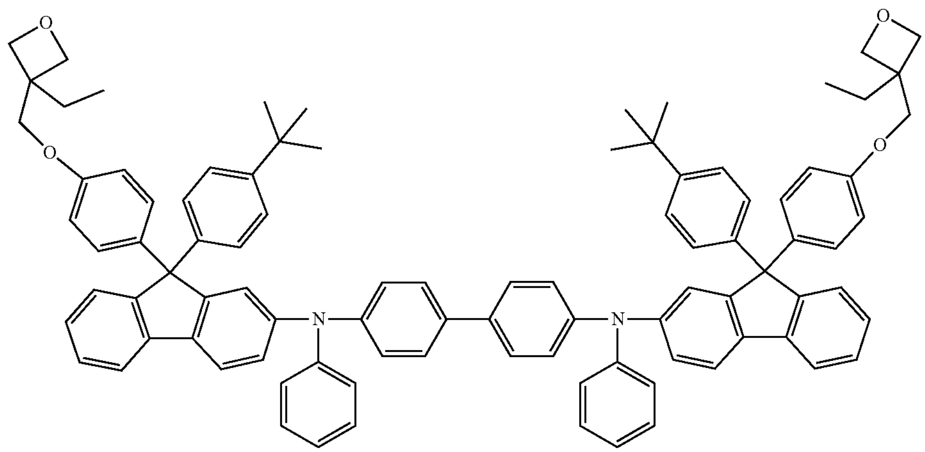

-continued
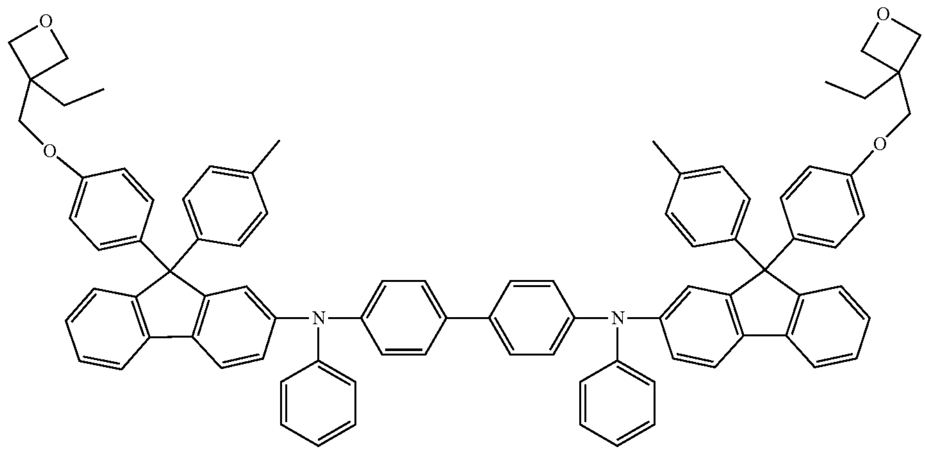
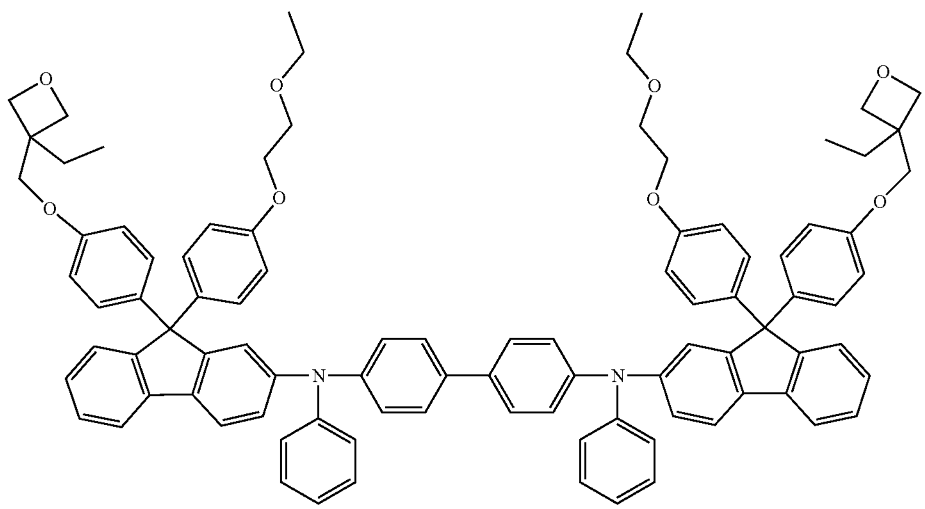
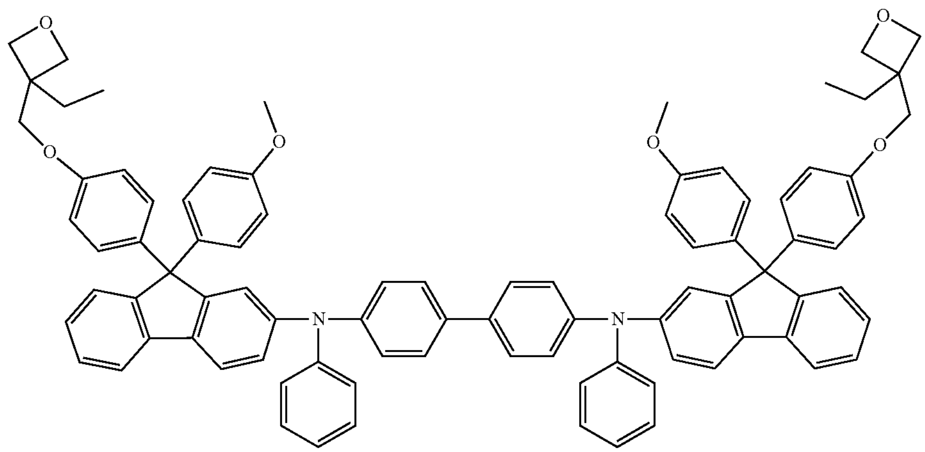

-continued
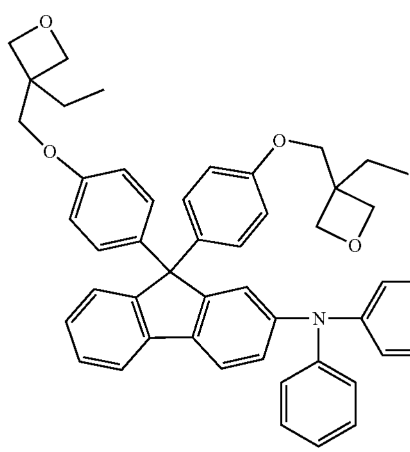
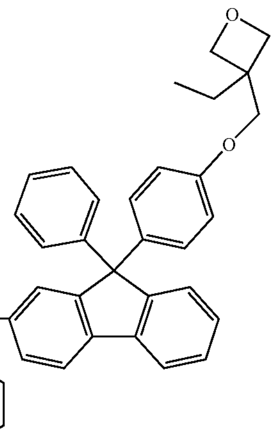
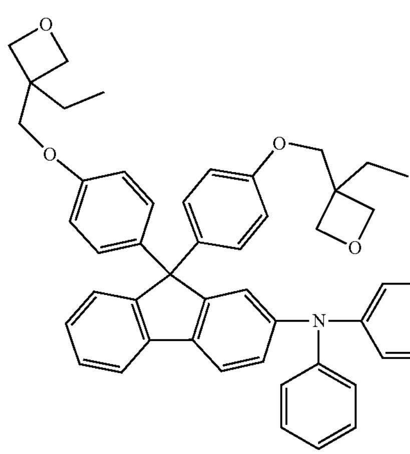
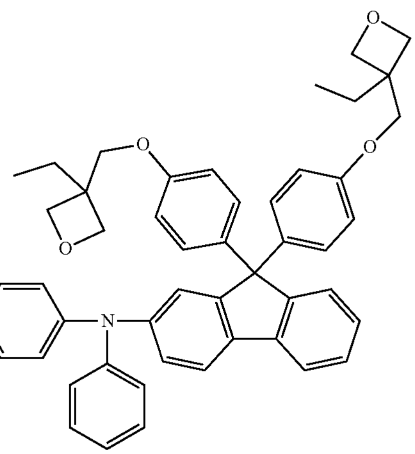
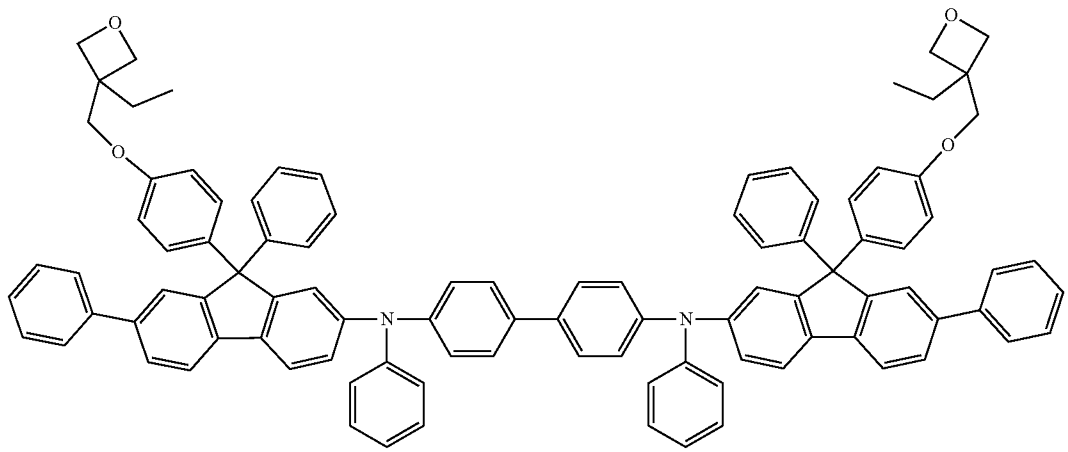

-continued
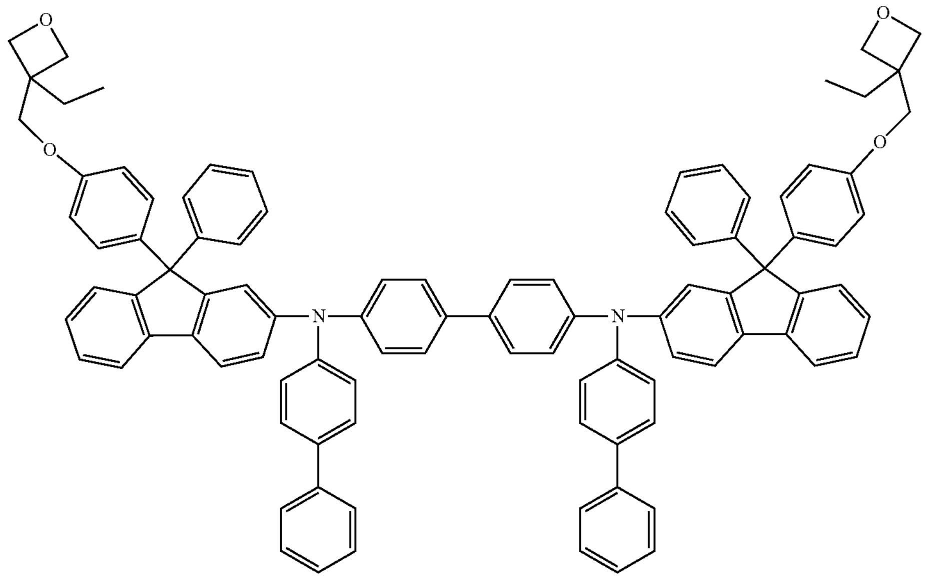
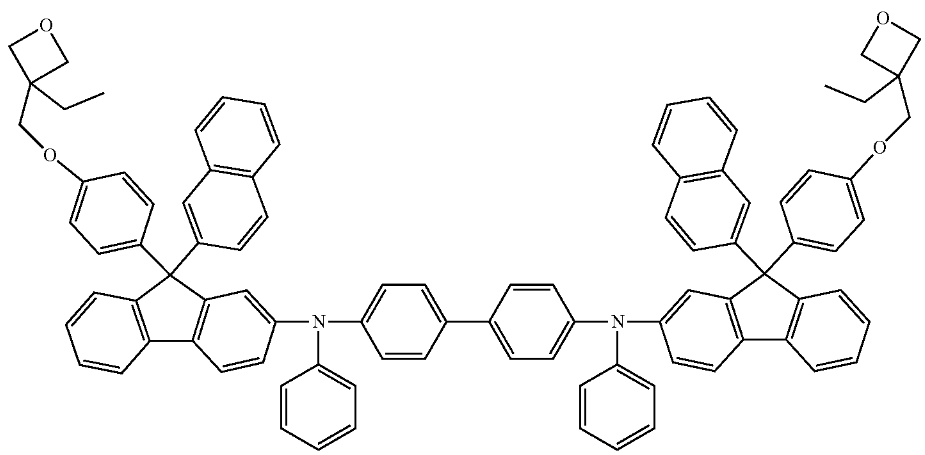
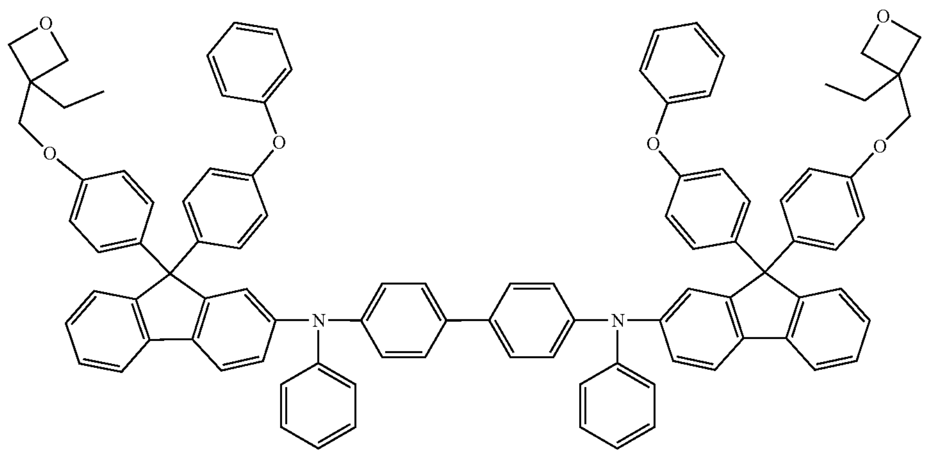

-continued
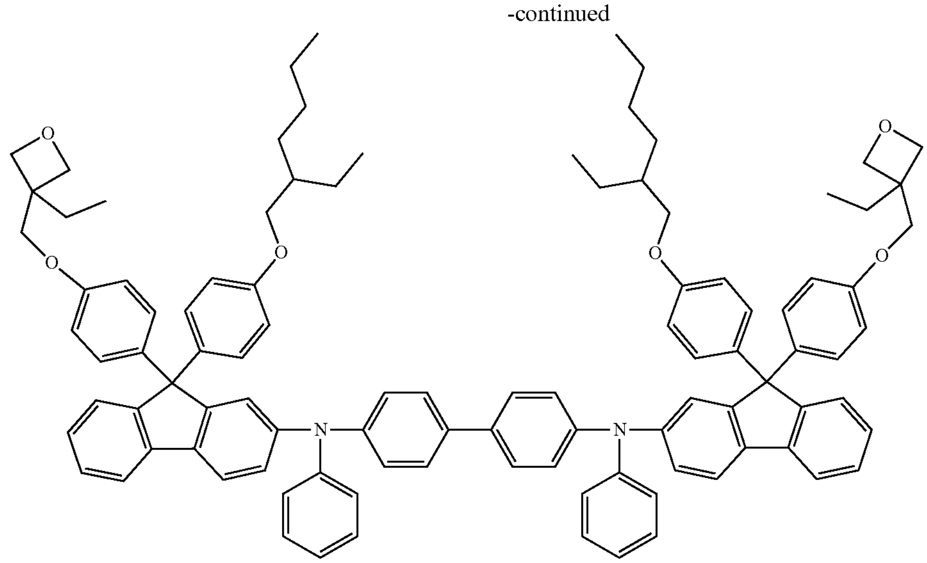
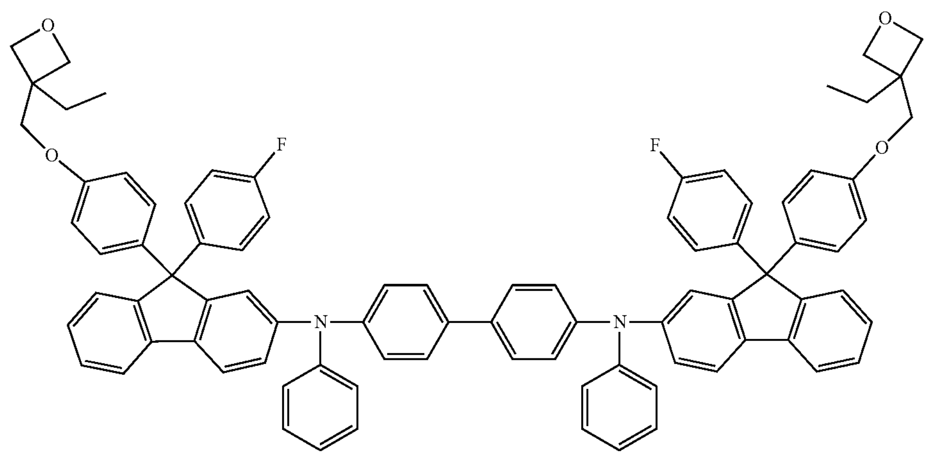
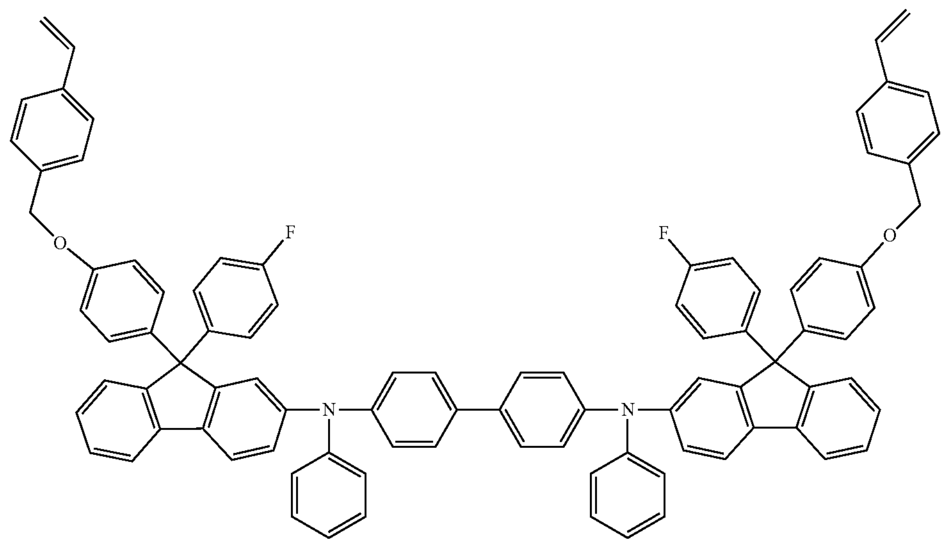

-continued
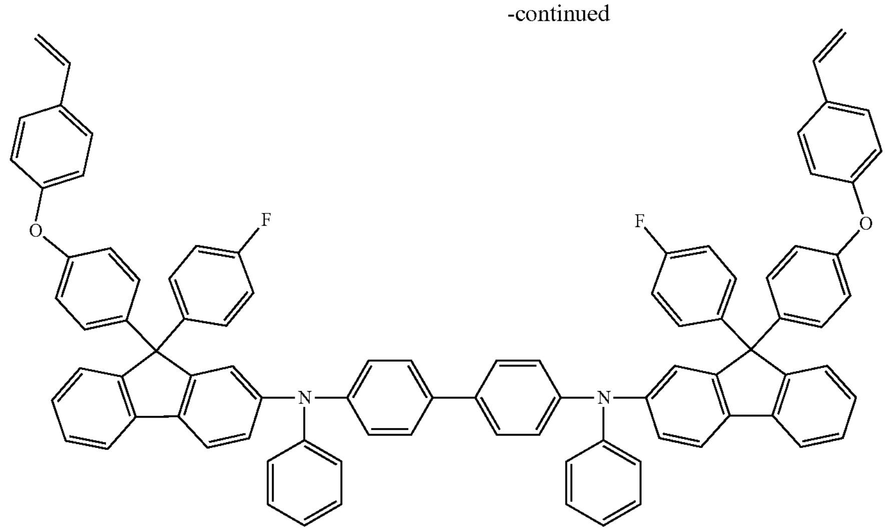
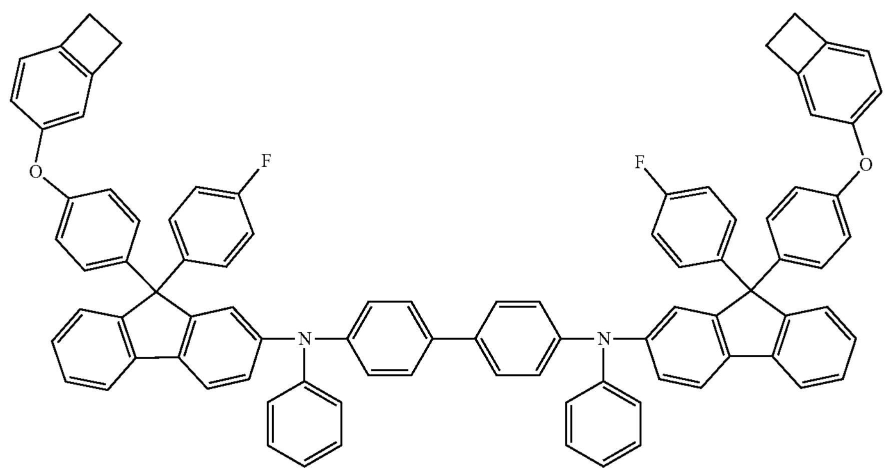
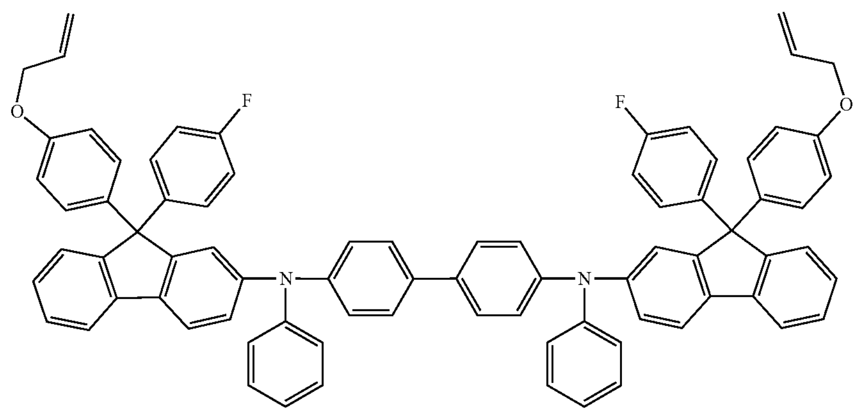

-continued
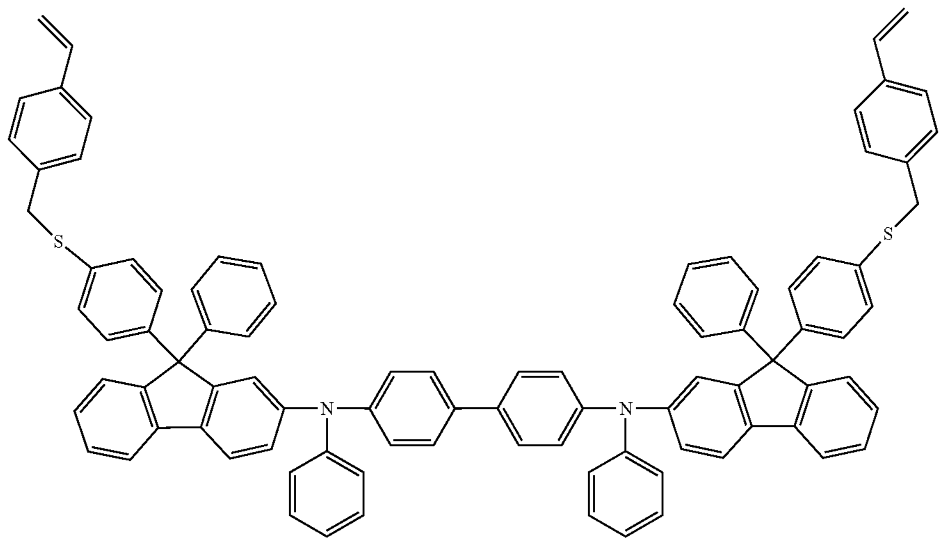
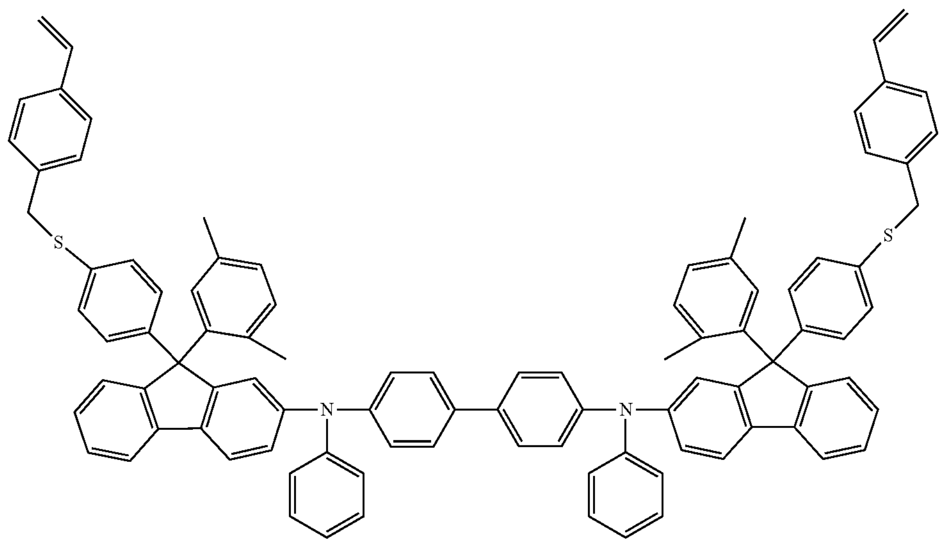
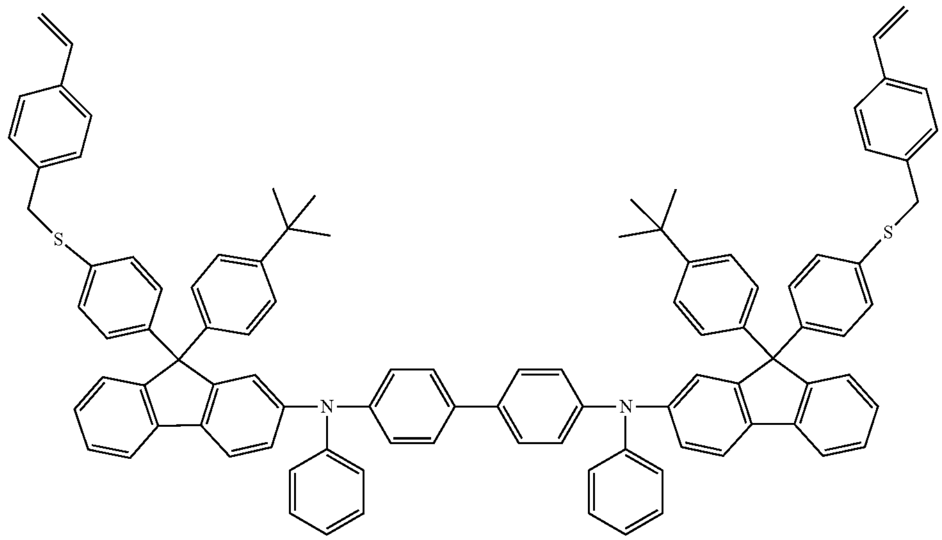

-continued
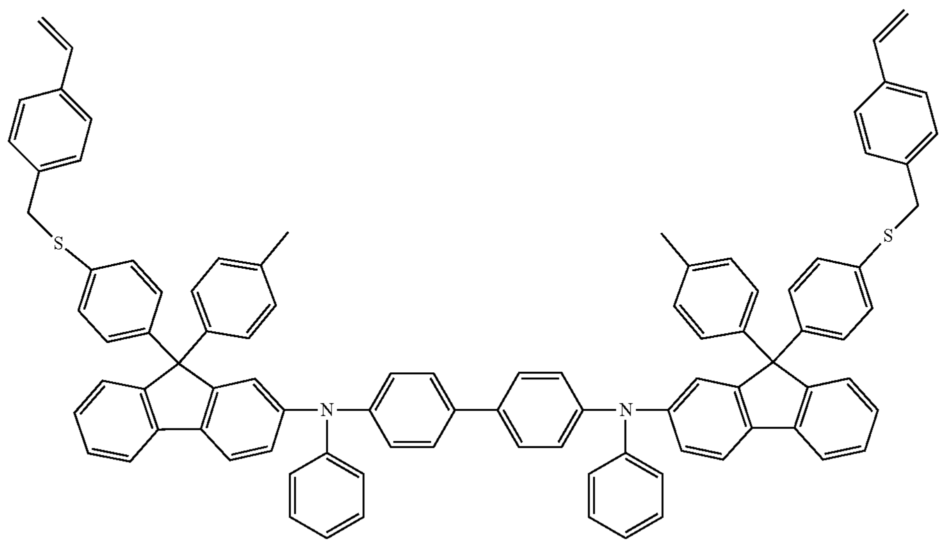
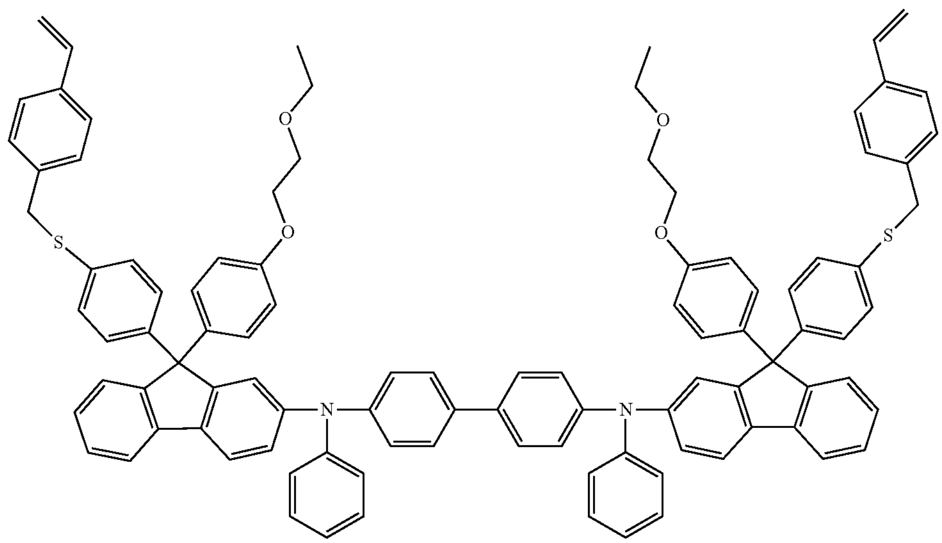
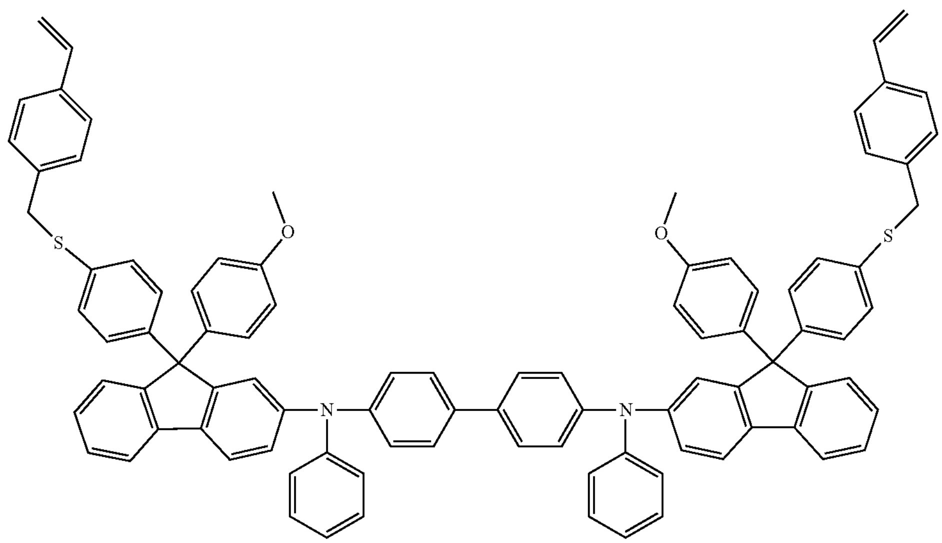

-continued
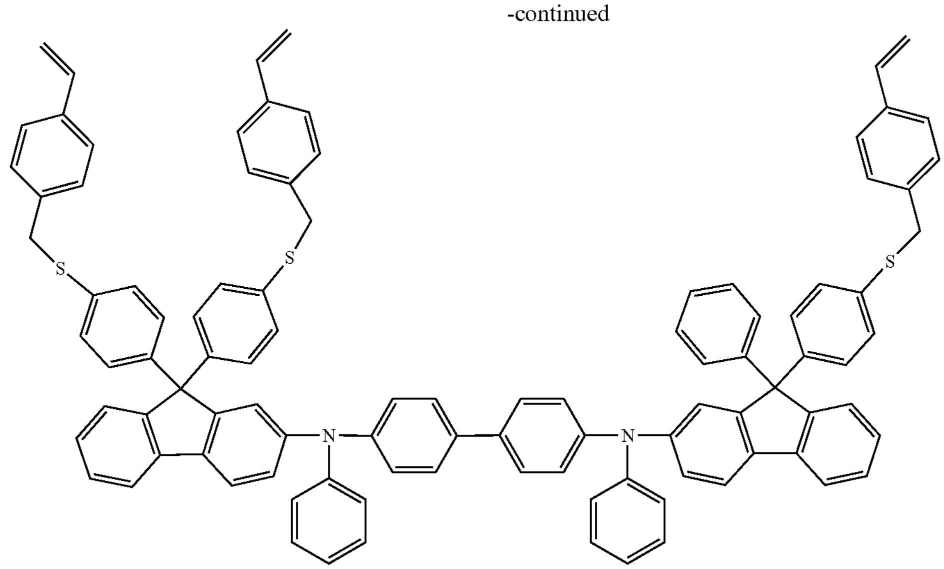
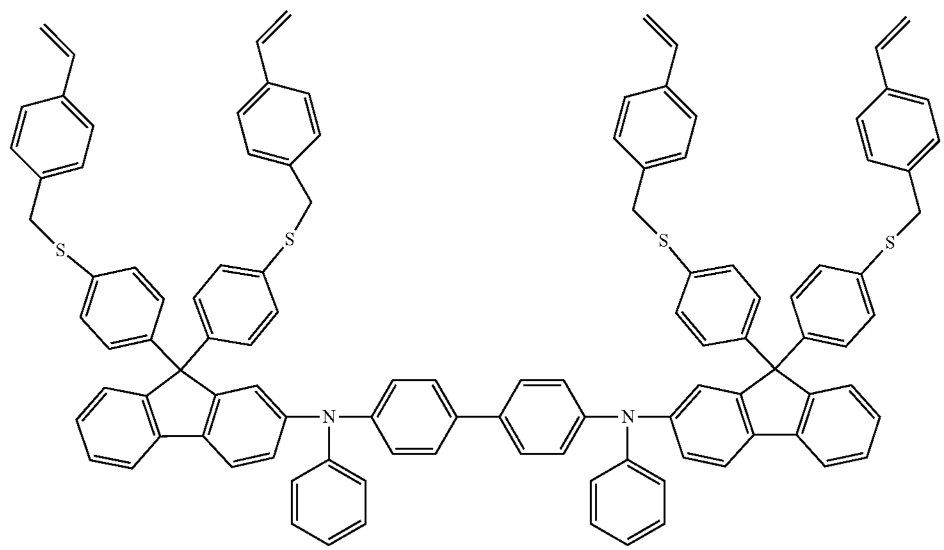
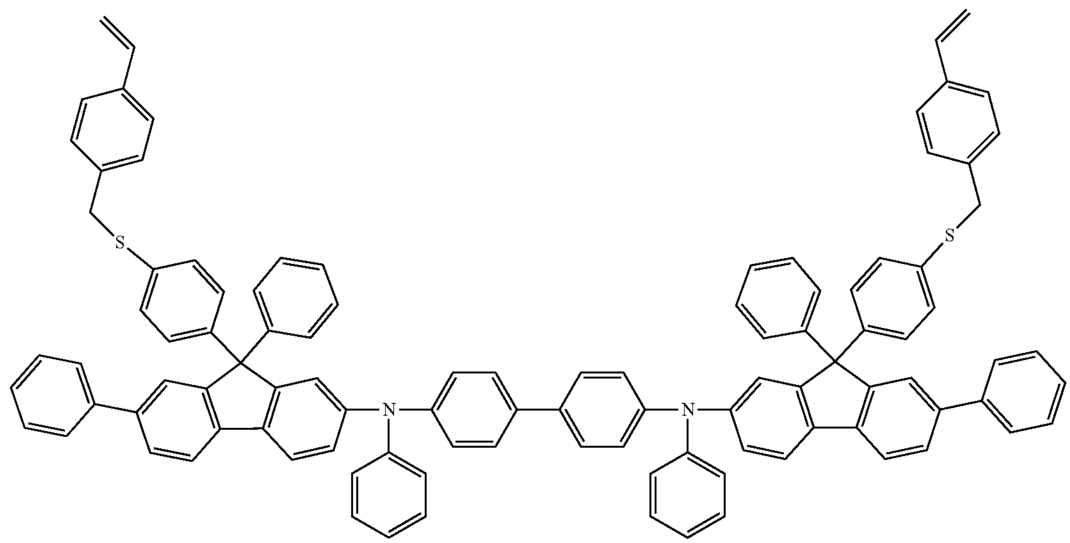

-continued
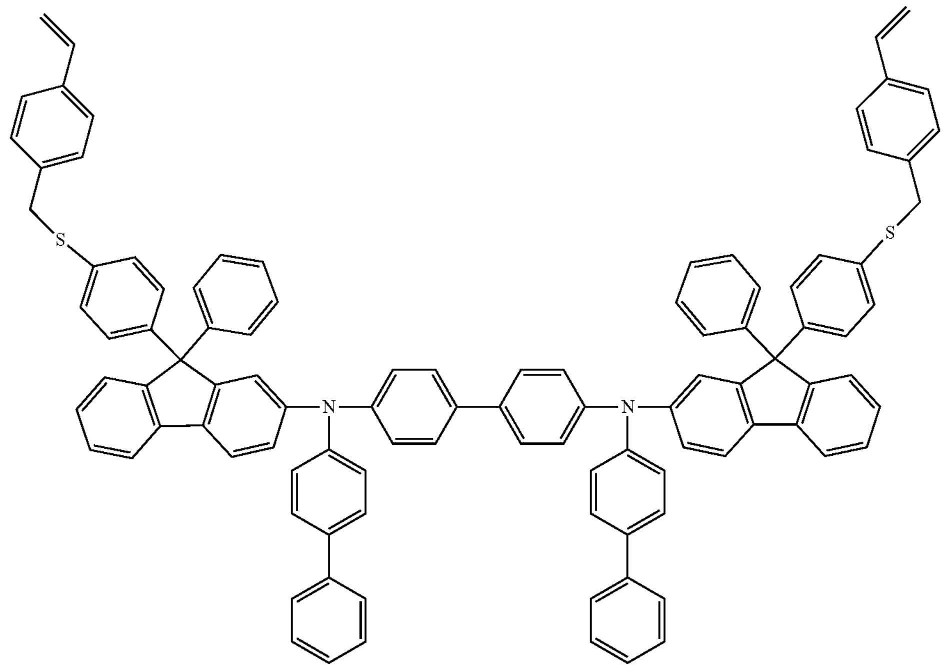
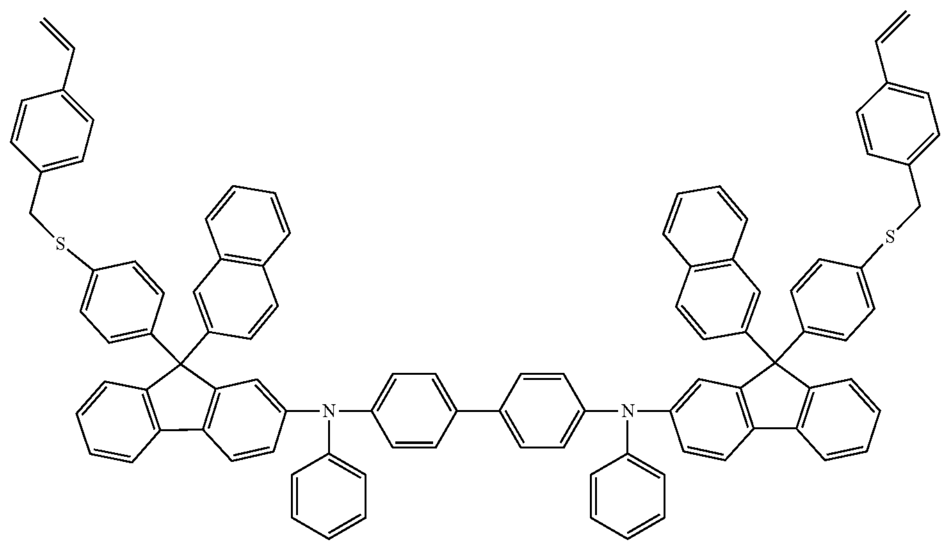

-continued
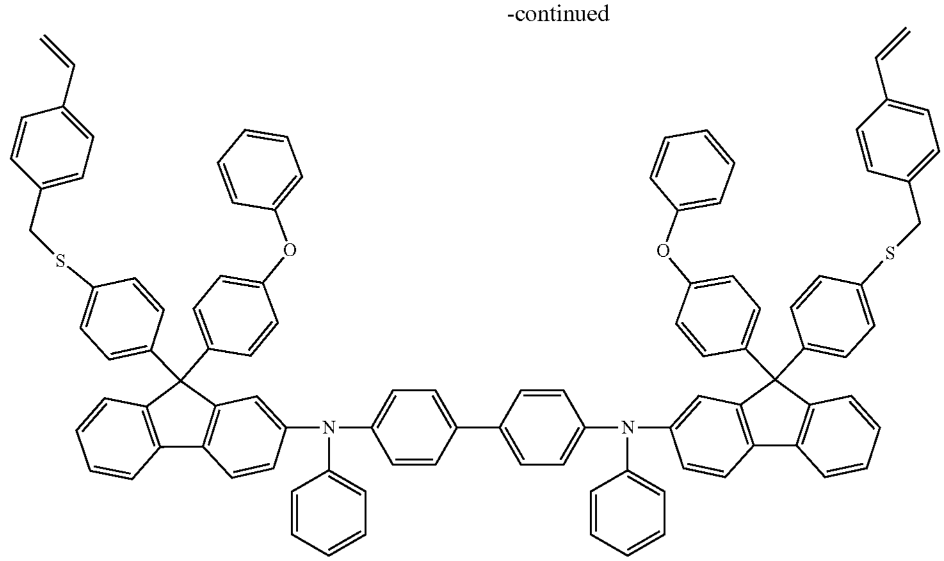
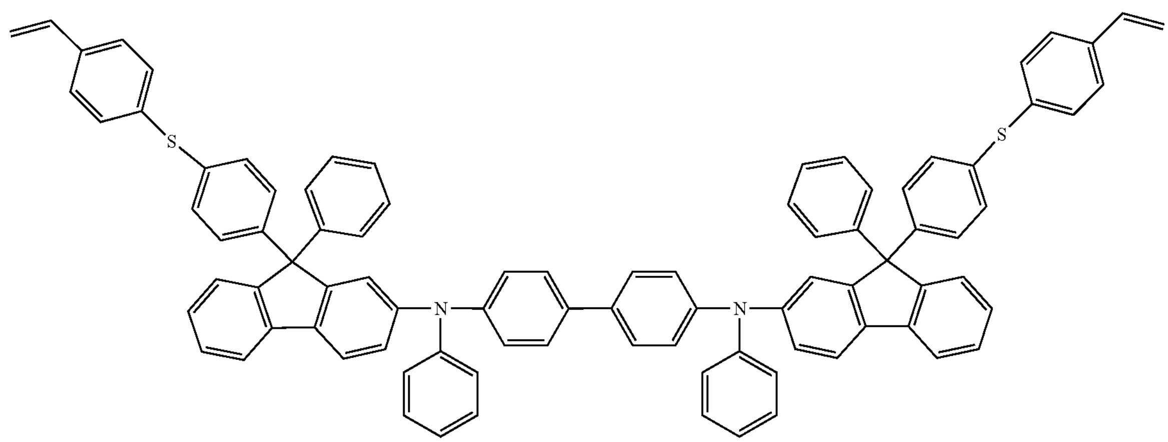
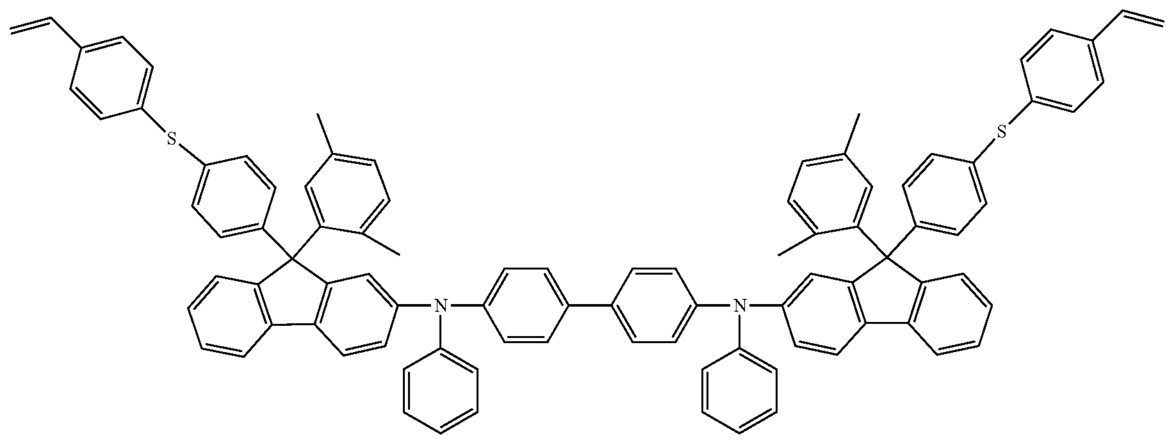

-continued
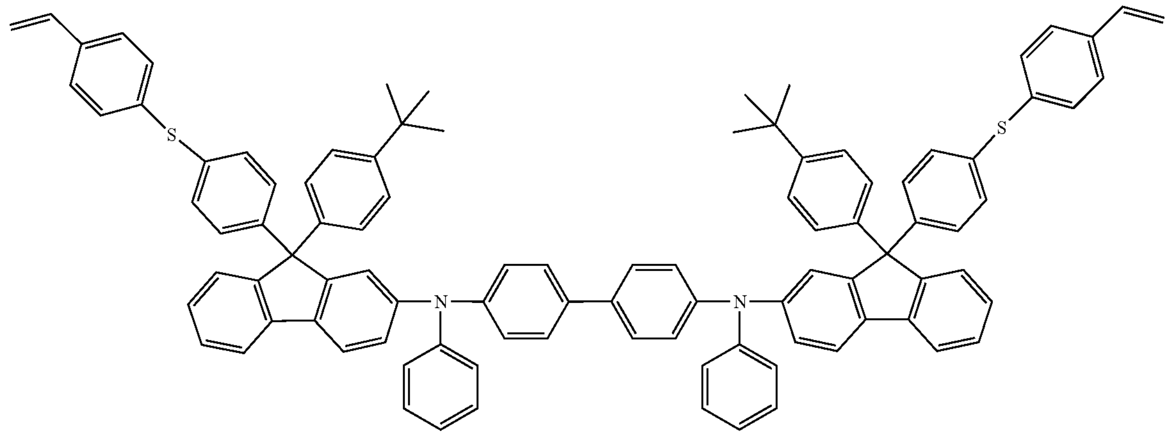
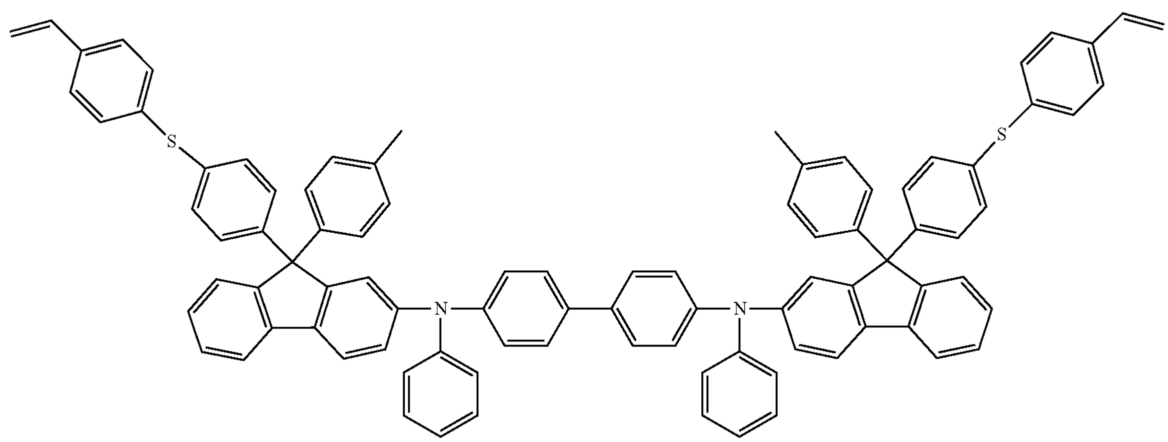
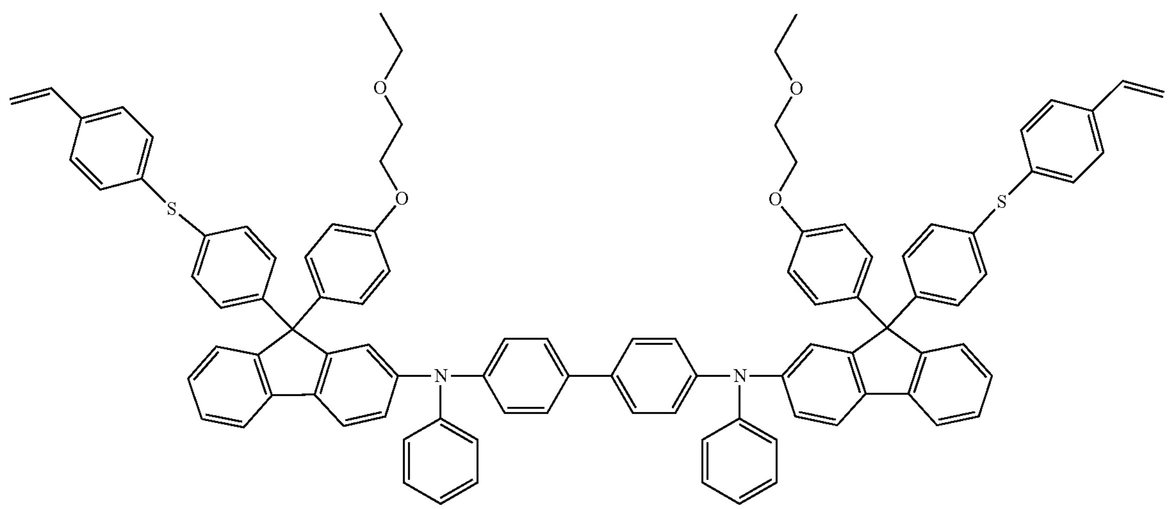

-continued
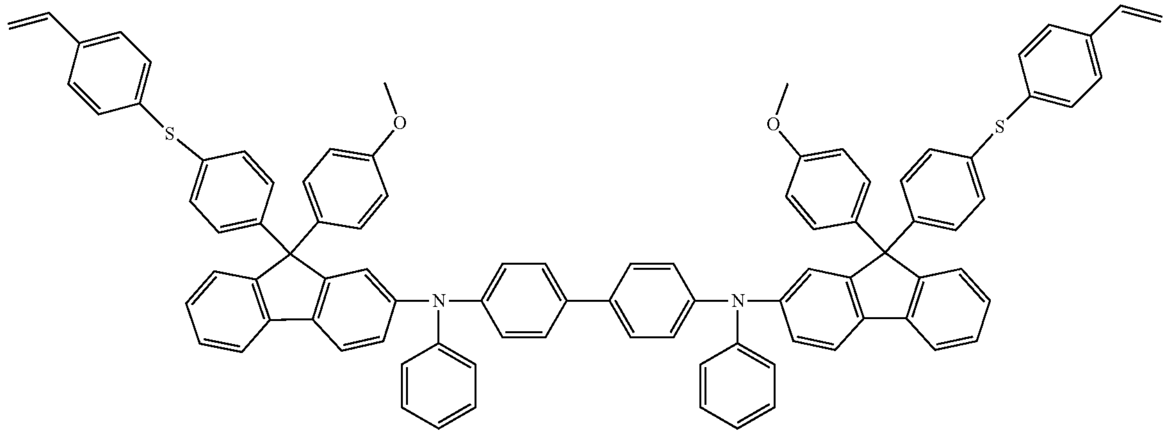
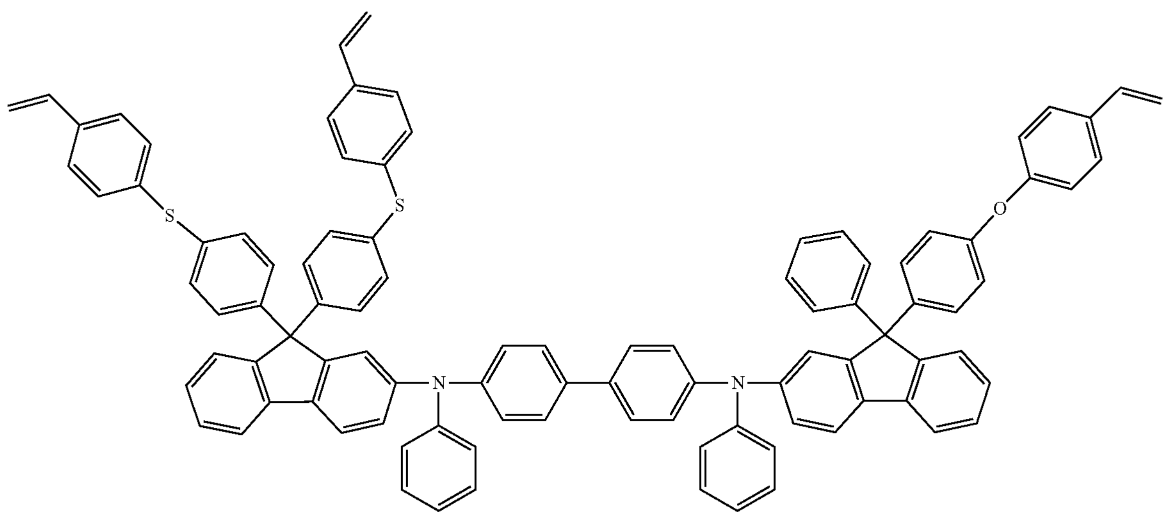
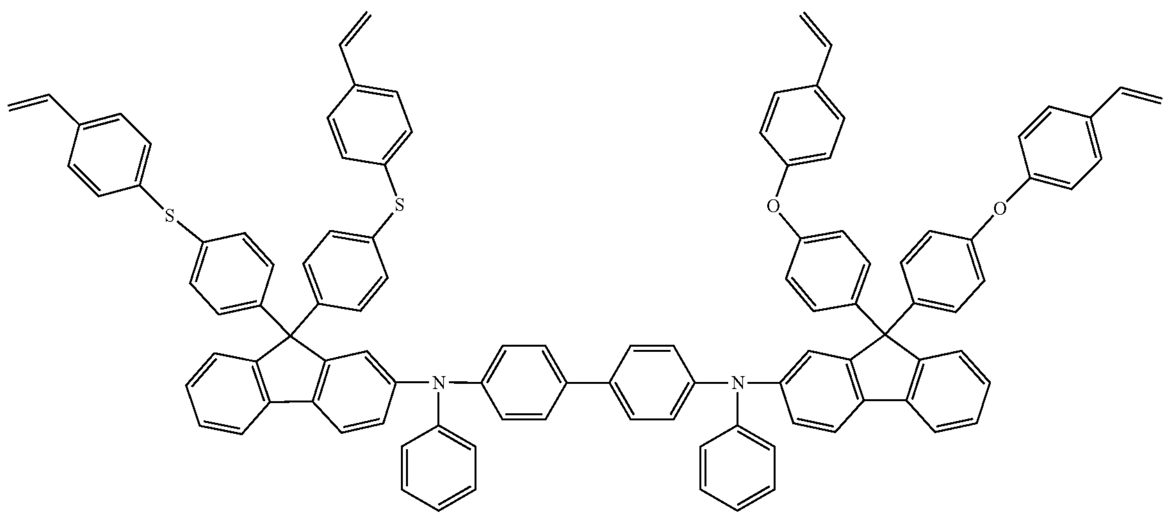

-continued
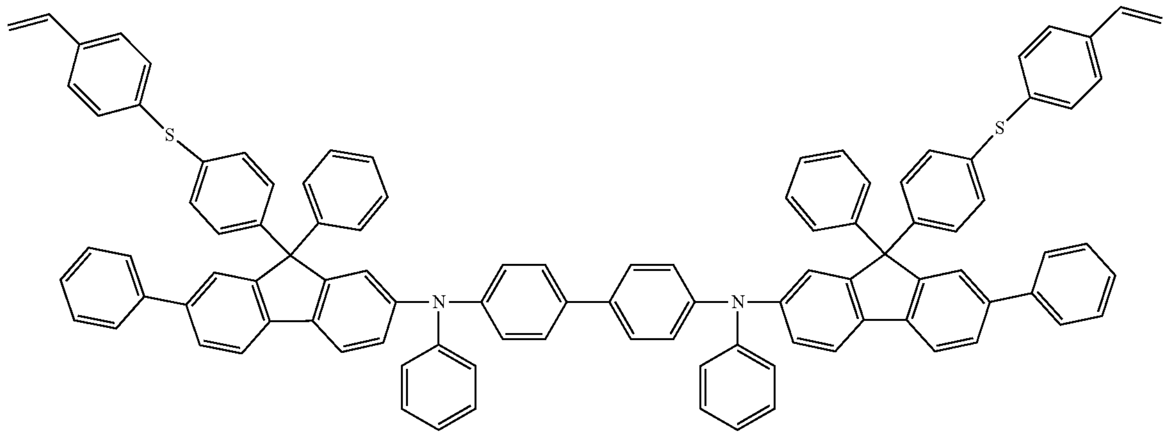
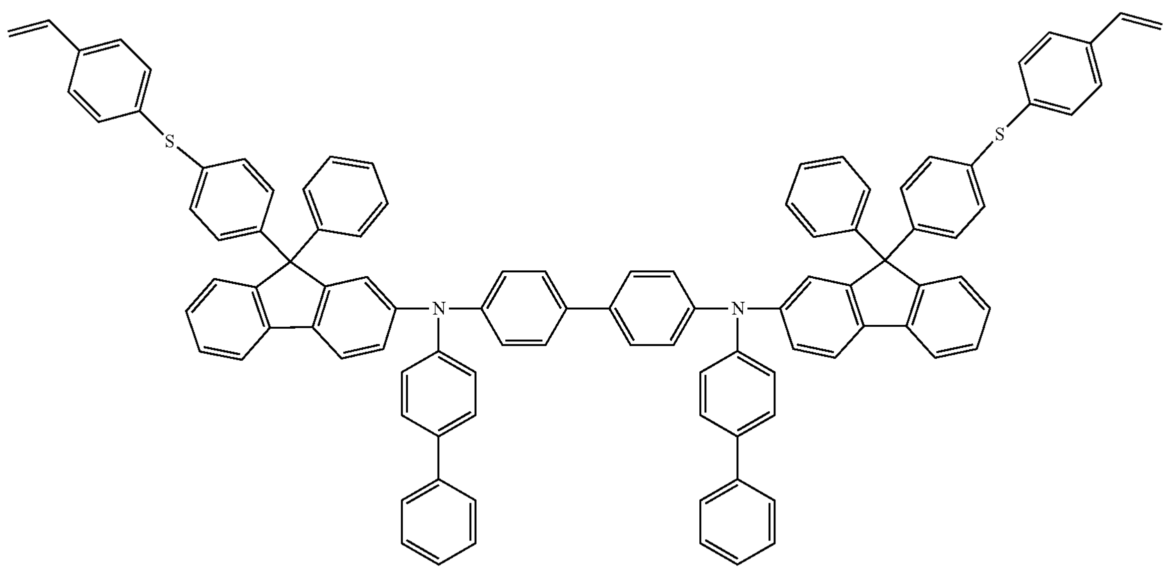
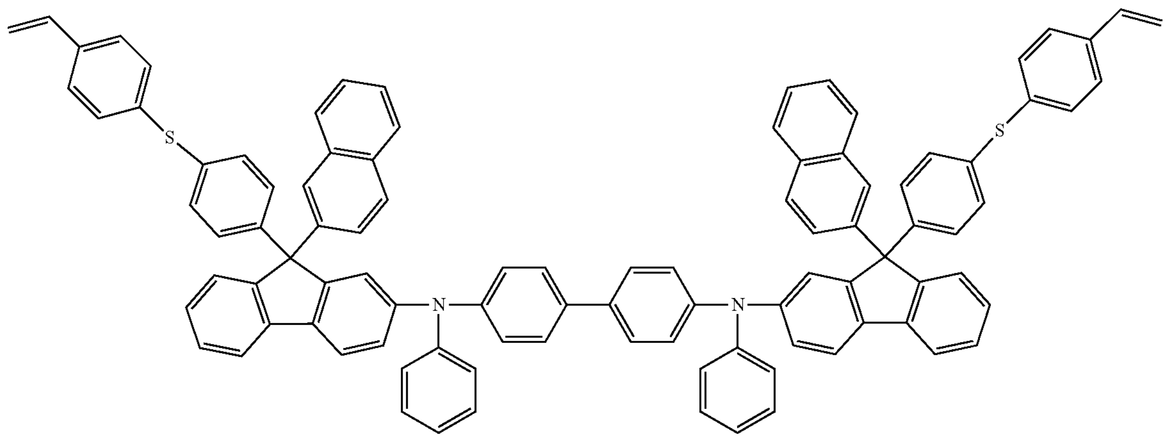

-continued
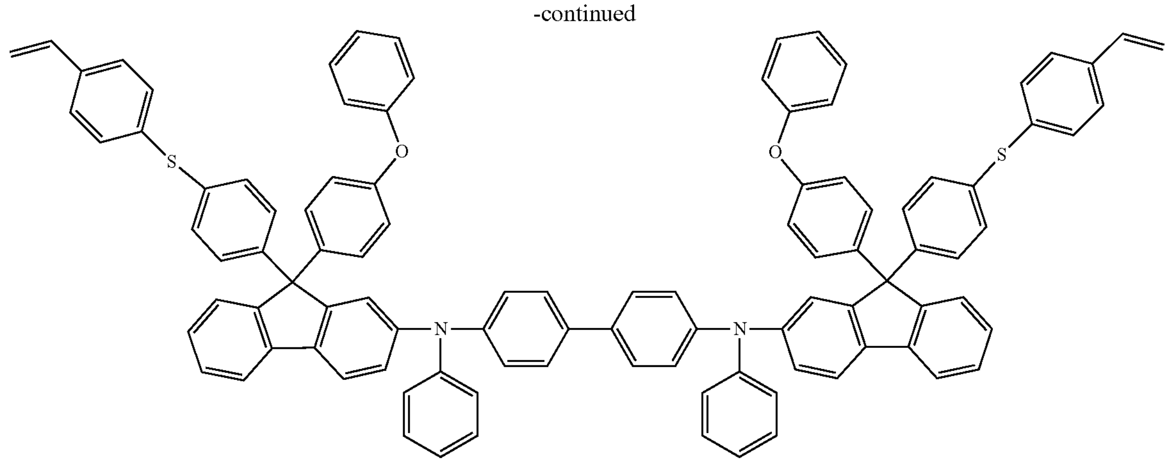
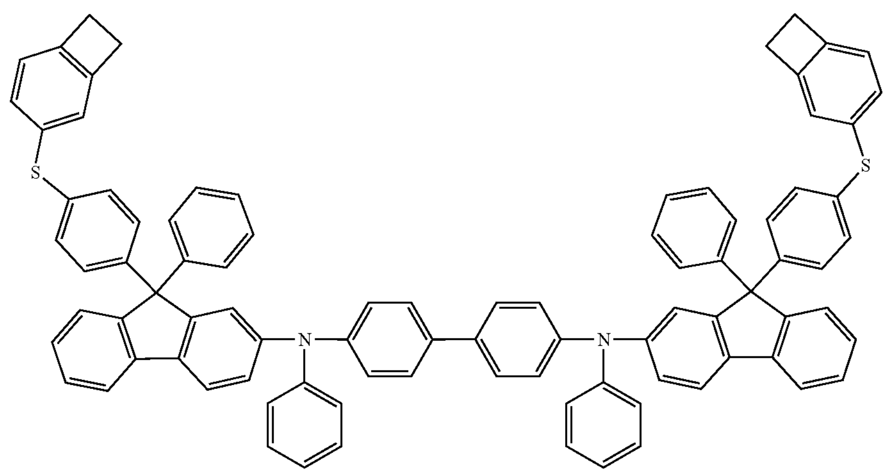
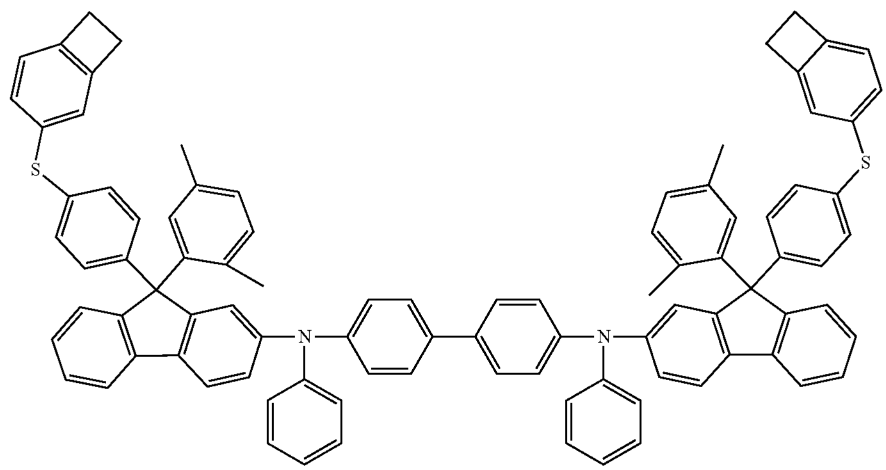

-continued
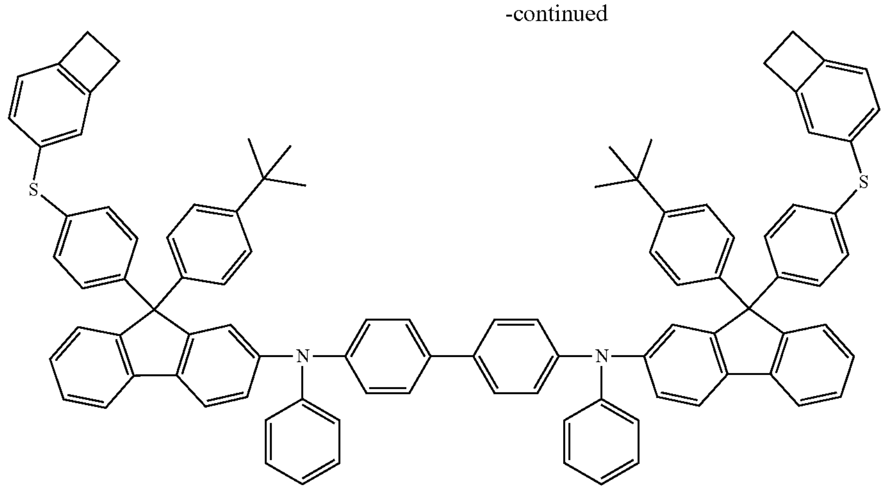
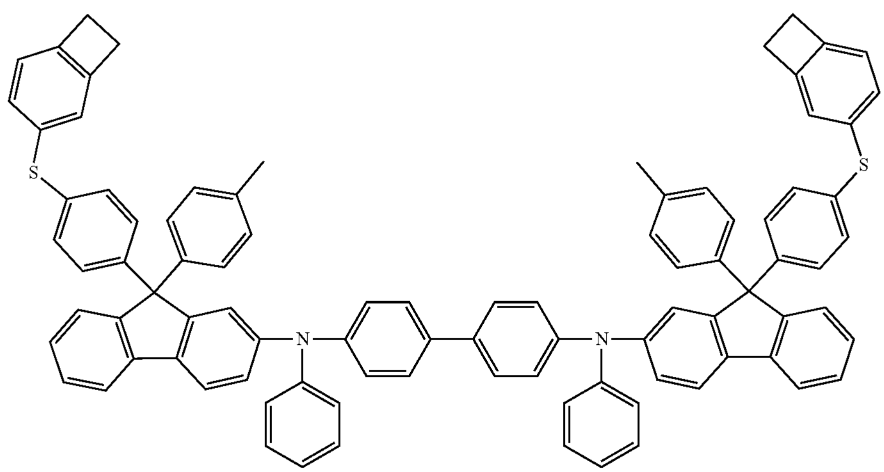
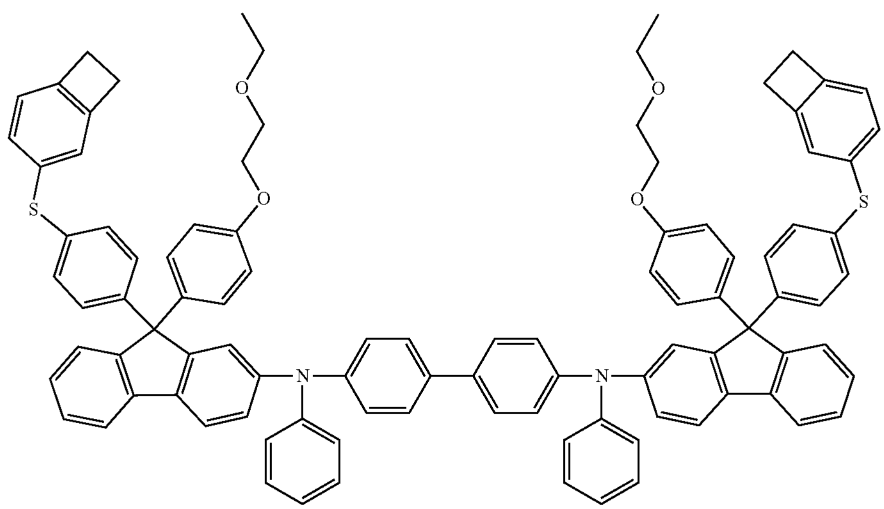

-continued
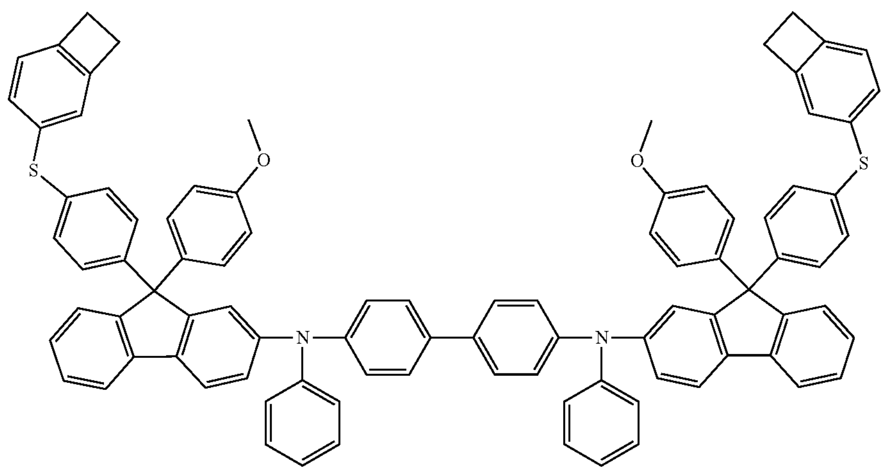
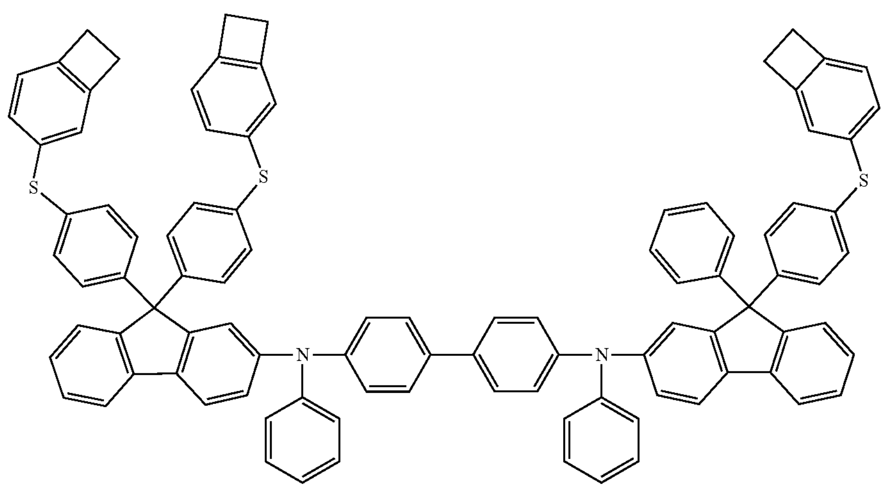
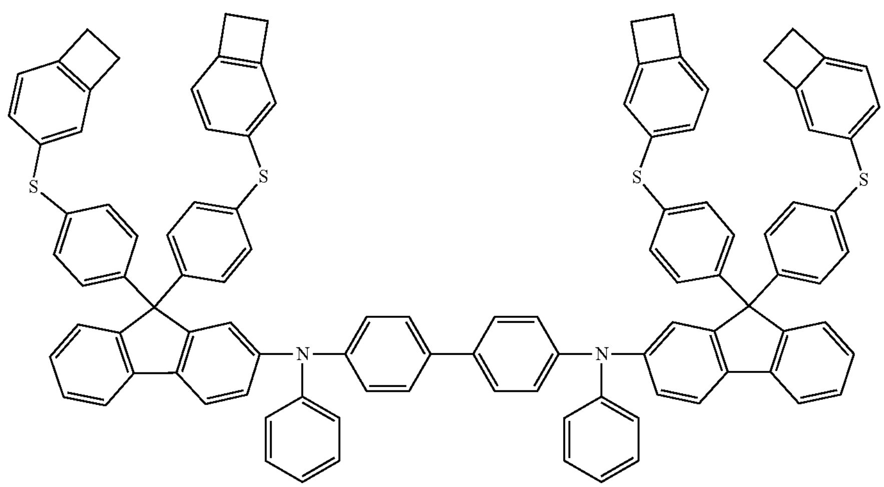

-continued
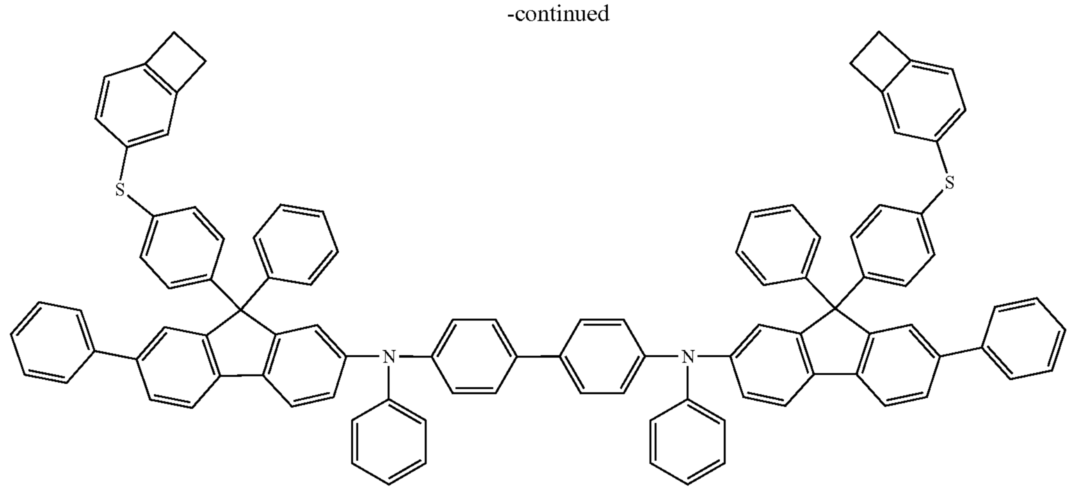
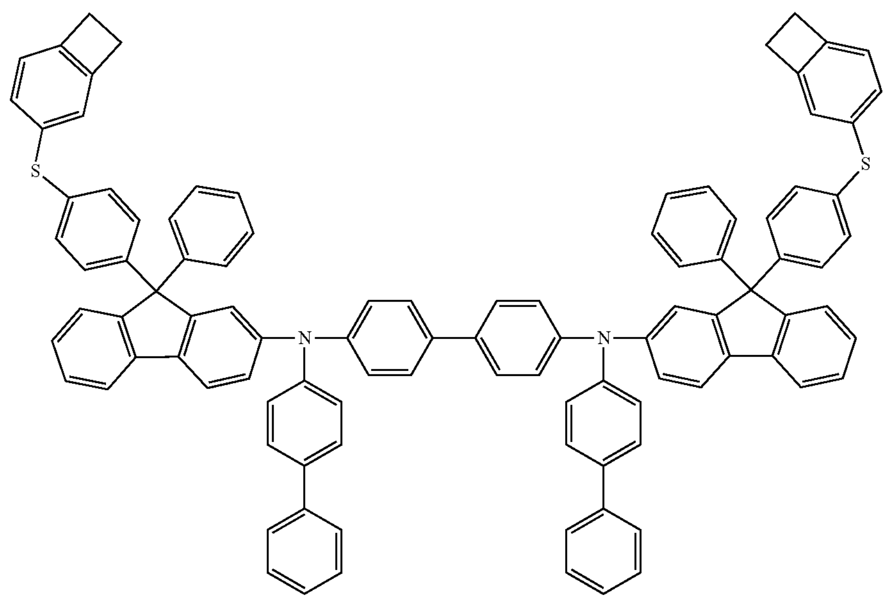
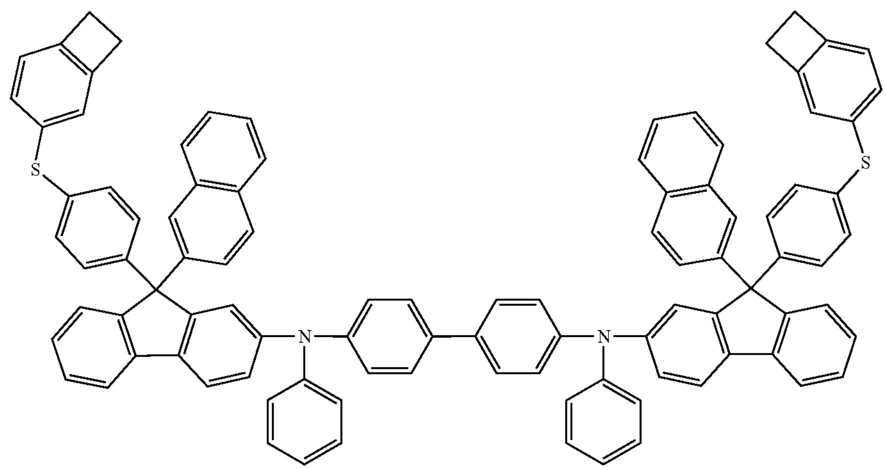

-continued
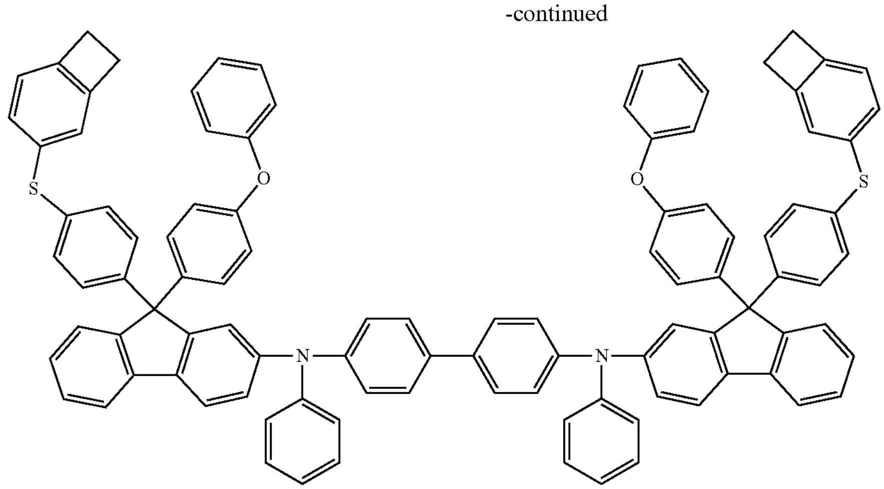
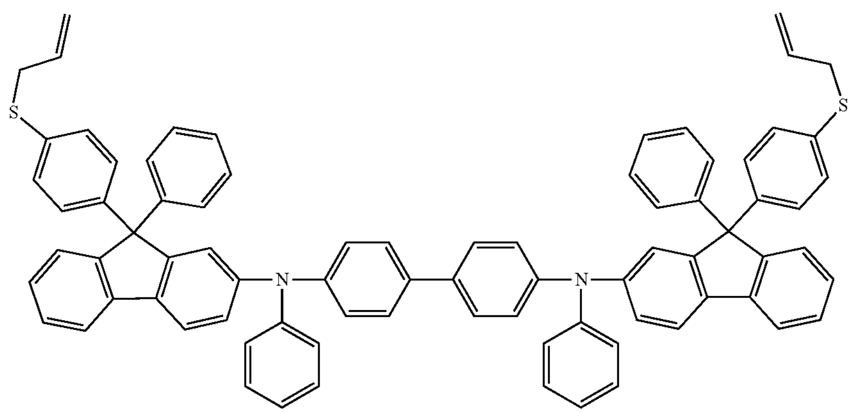
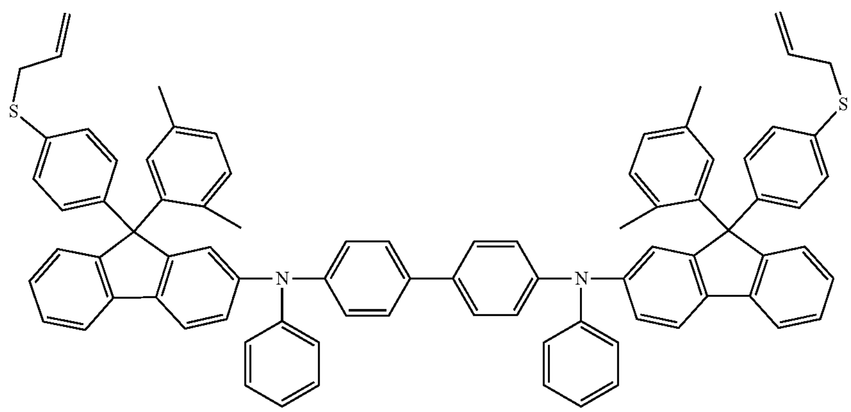
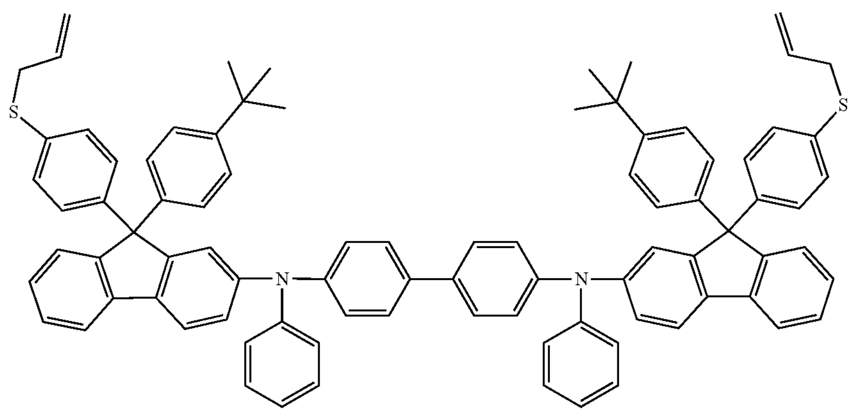

-continued
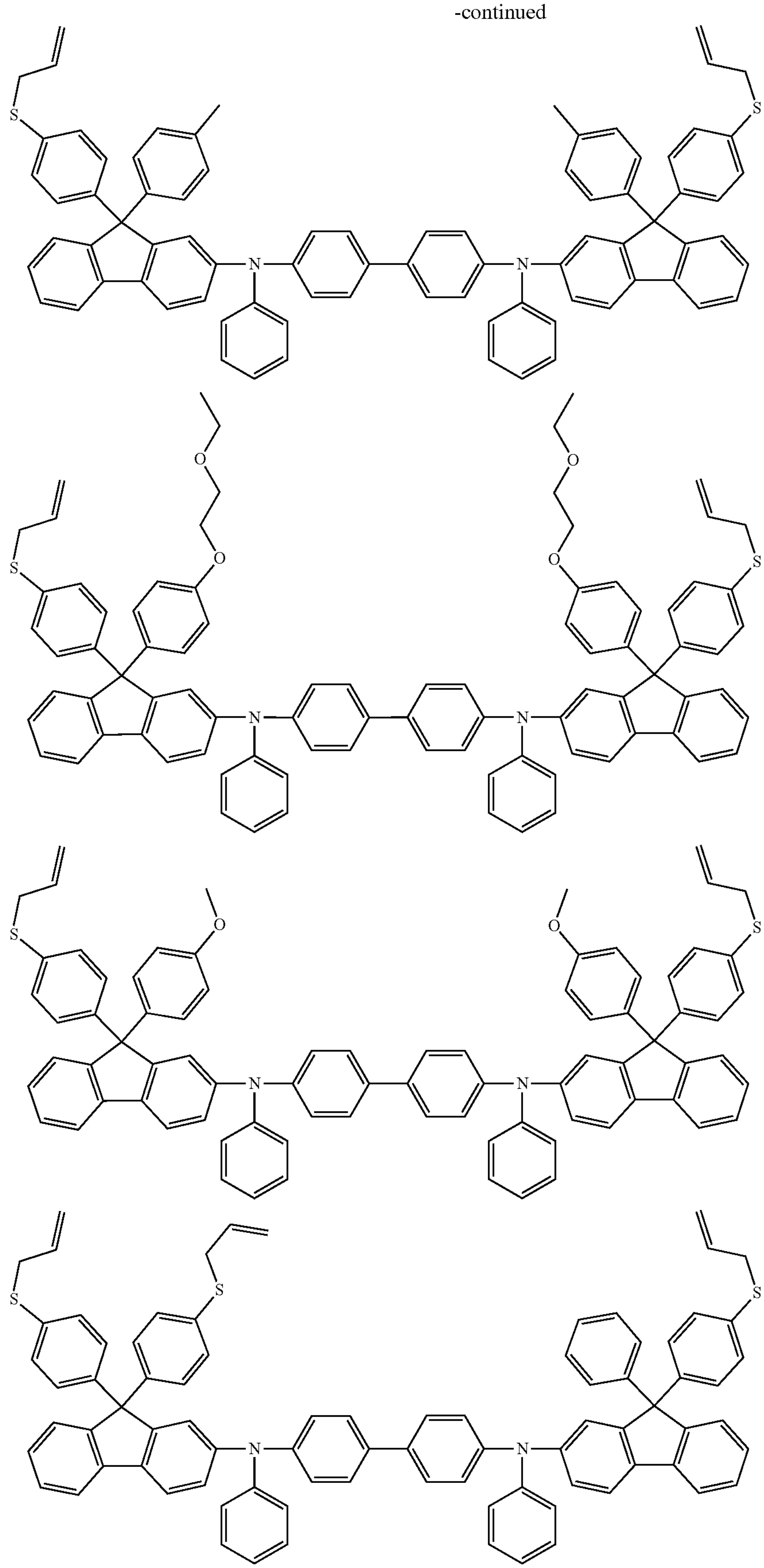

-continued
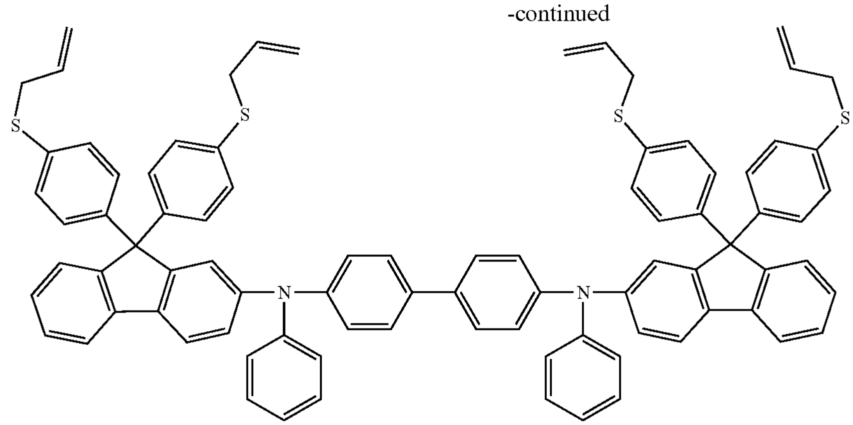
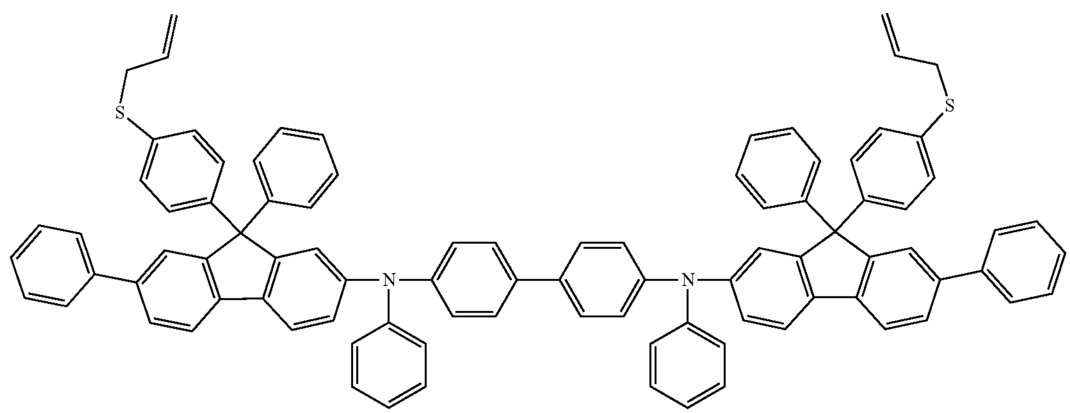
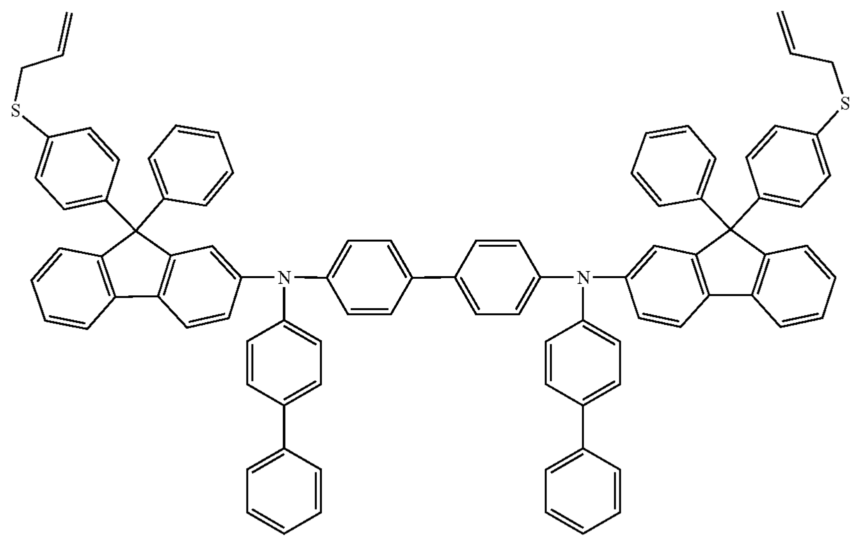

-continued
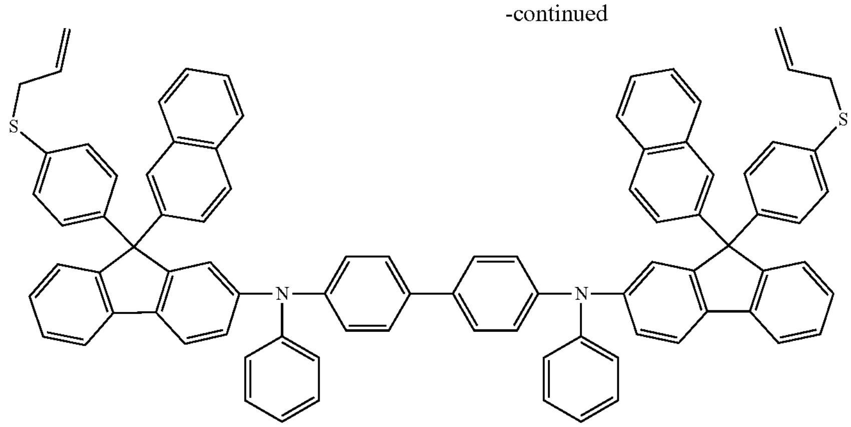
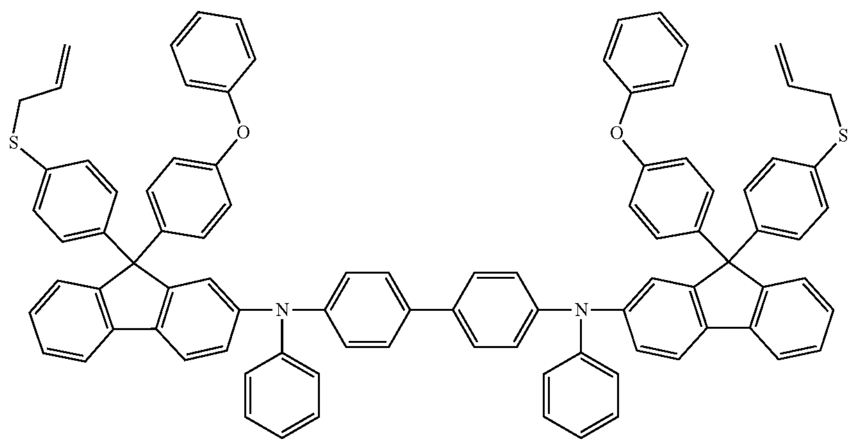
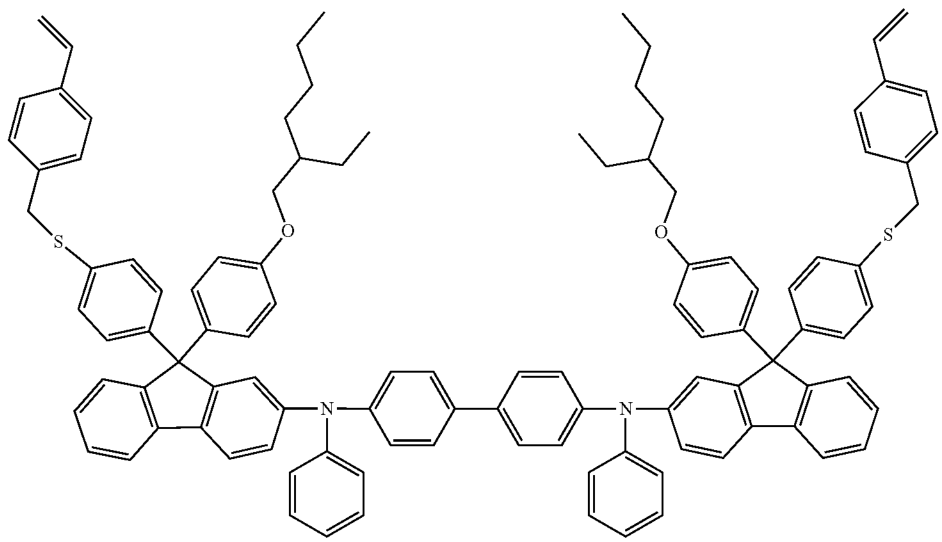

-continued
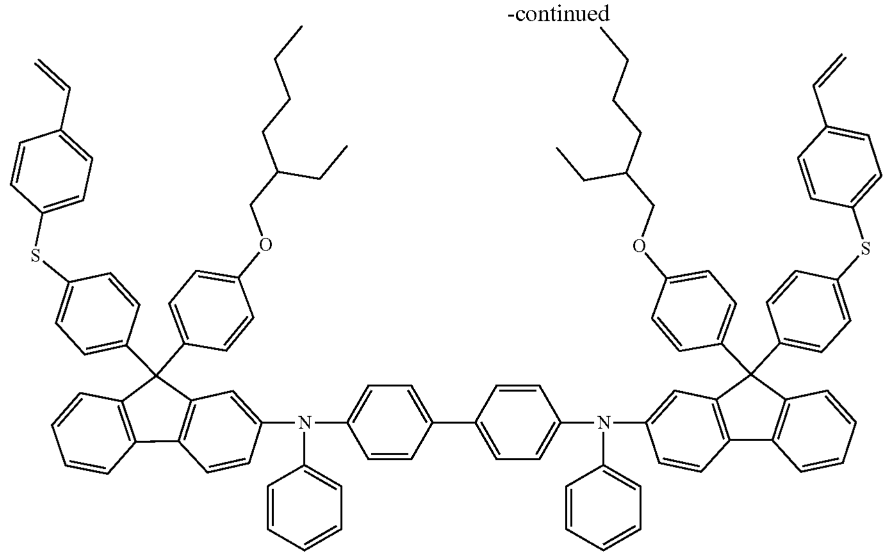
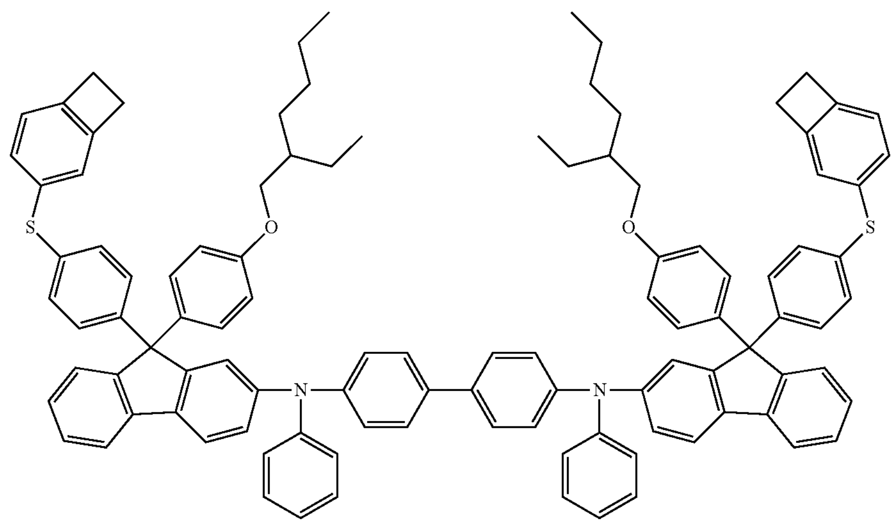
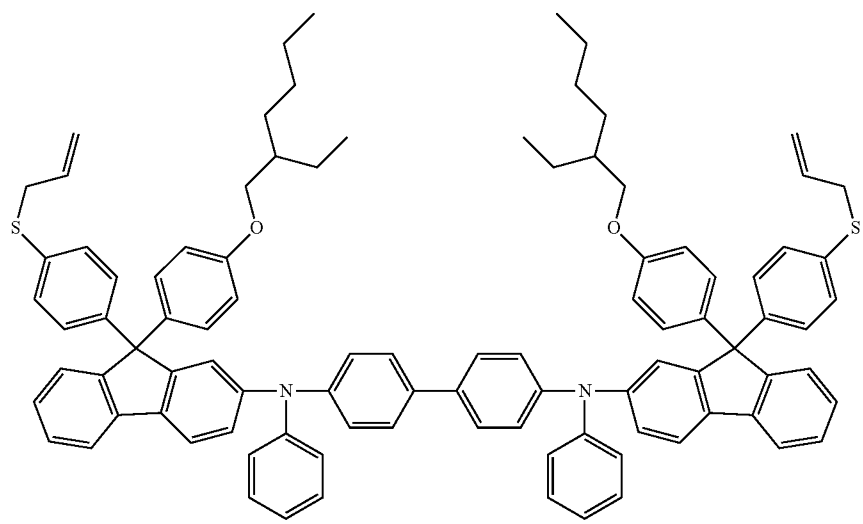

-continued
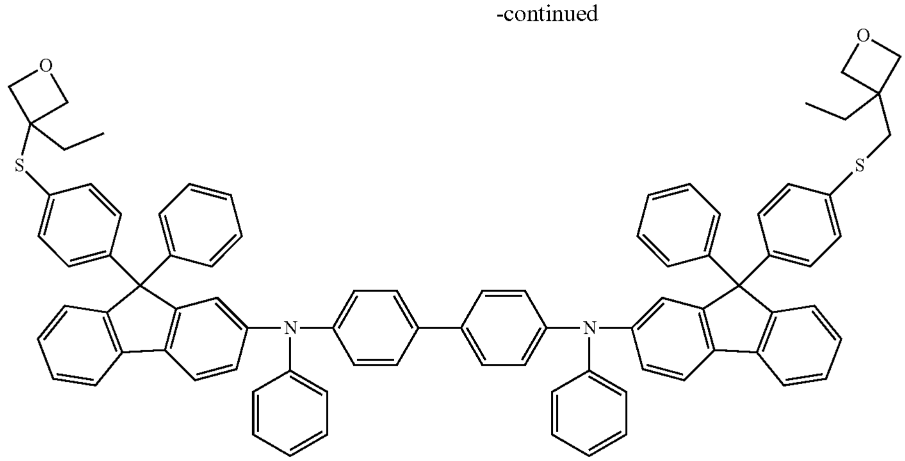
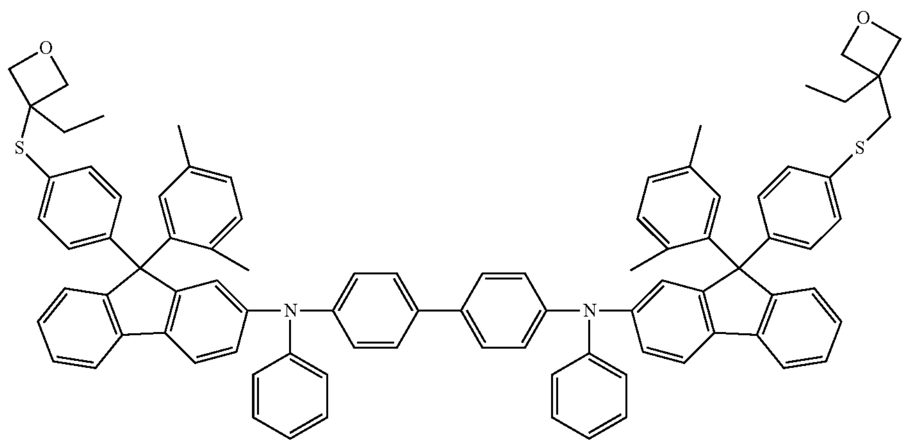
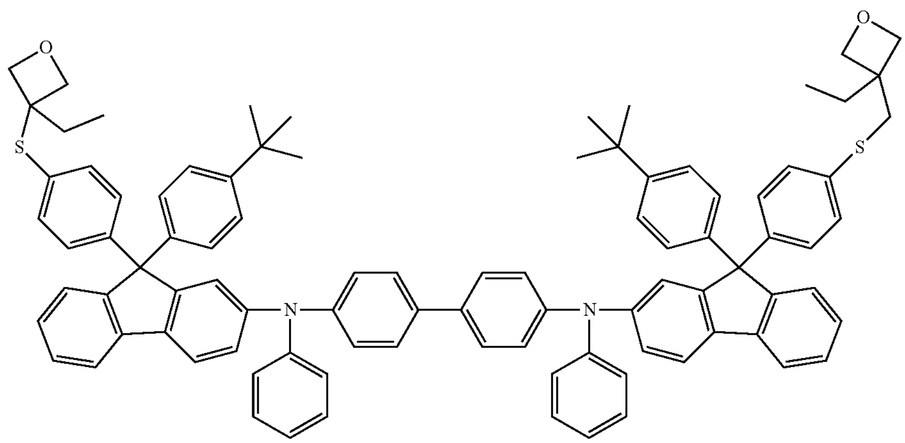

-continued
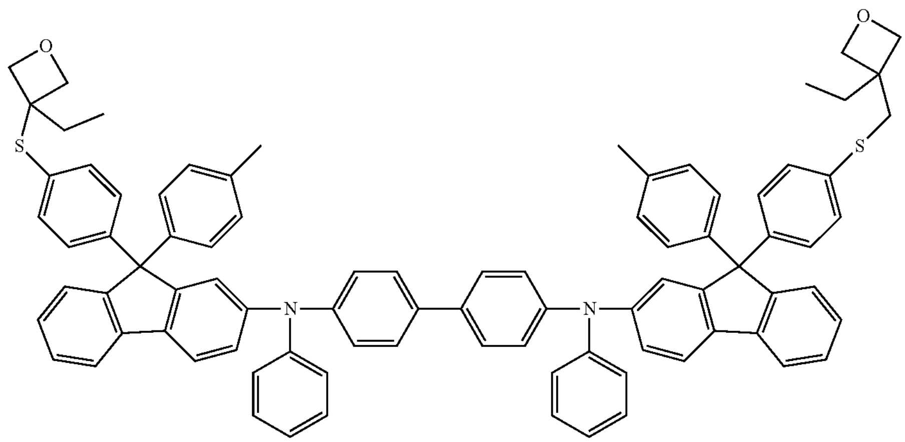
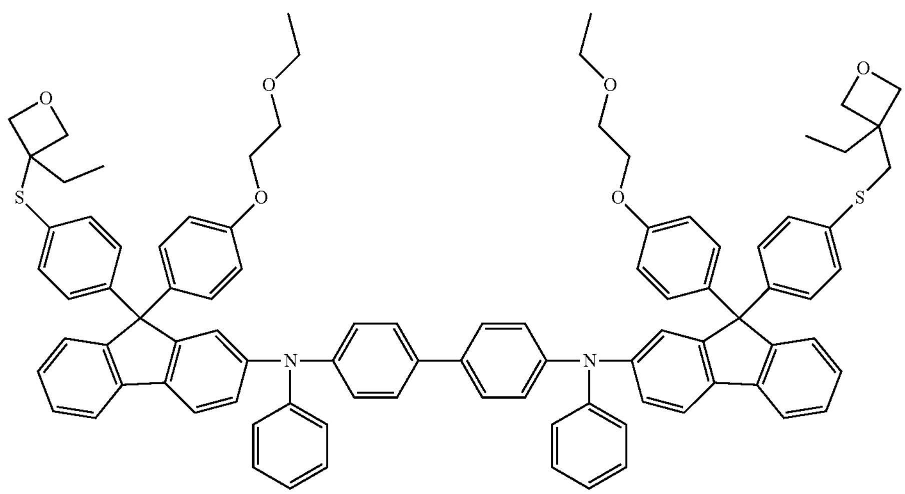
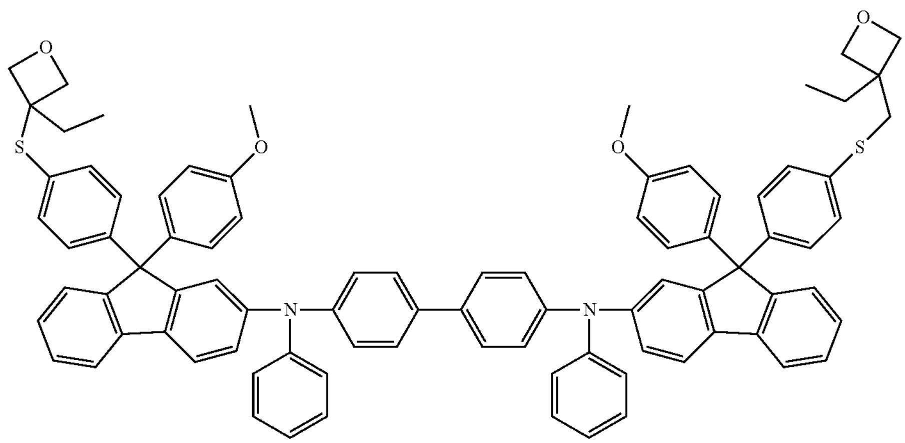

-continued
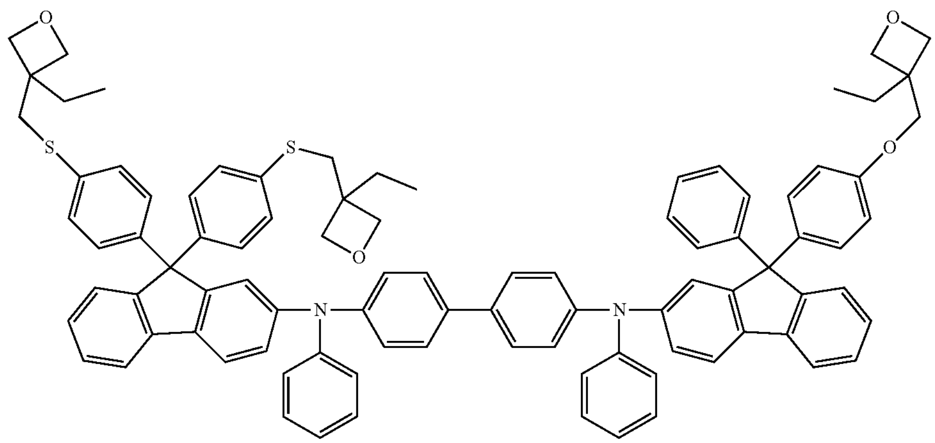
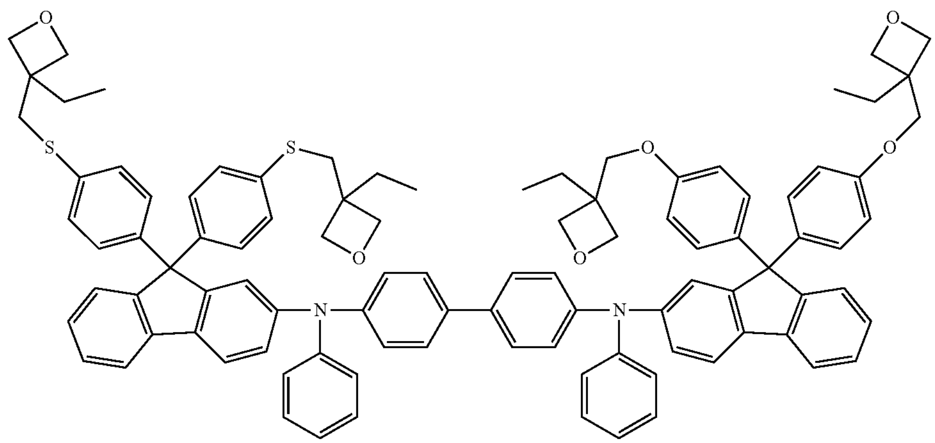
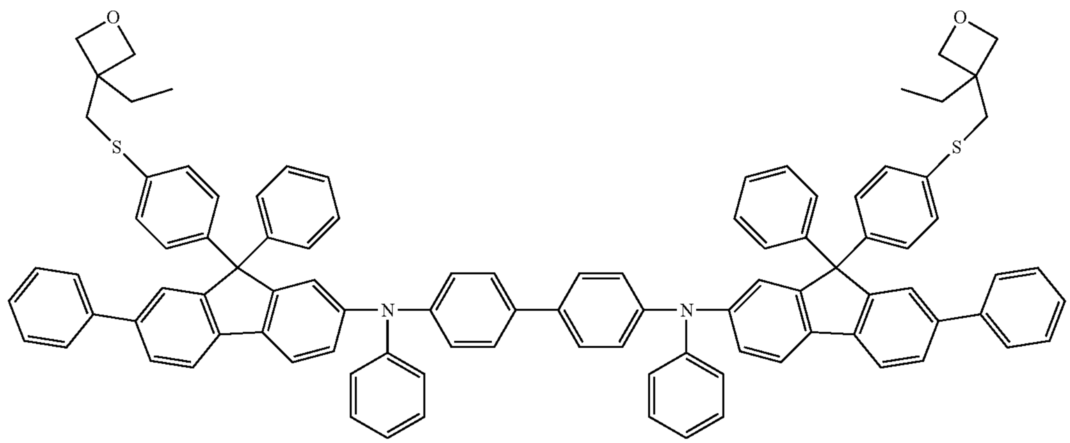

-continued
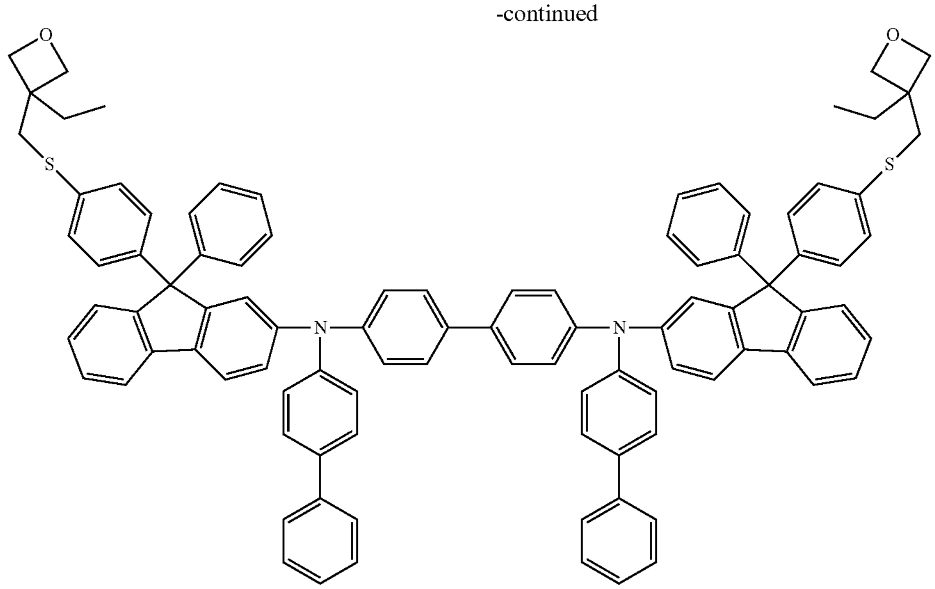
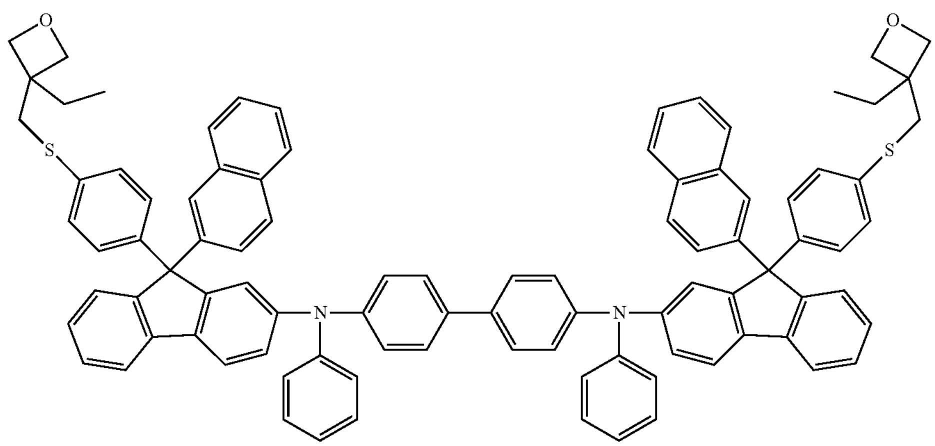
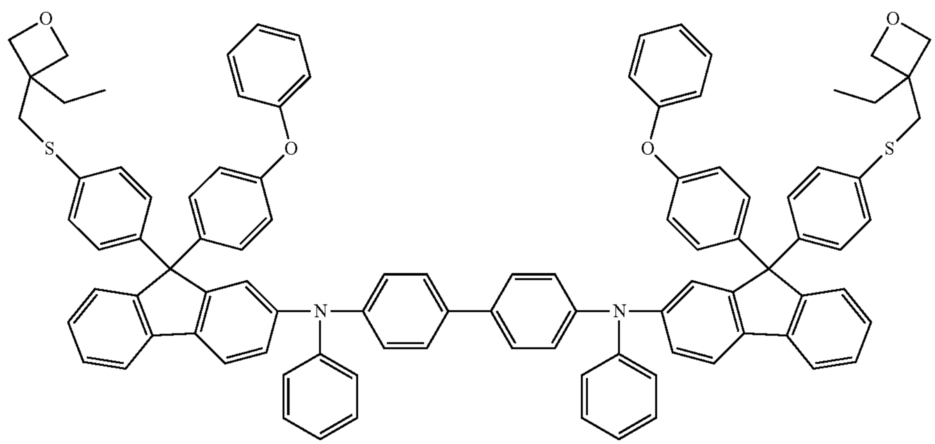

-continued
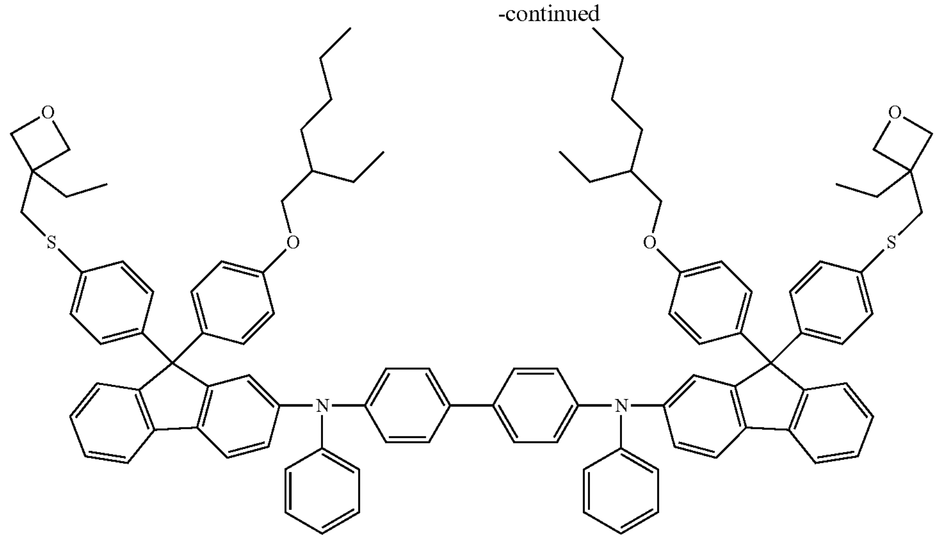
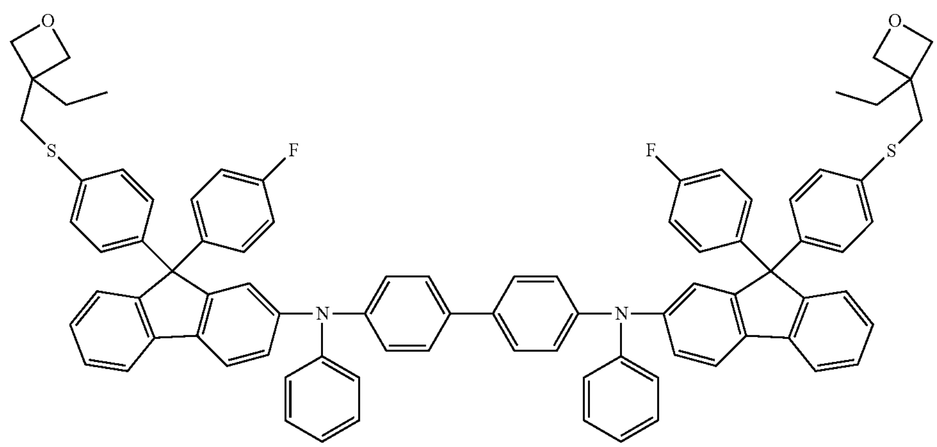
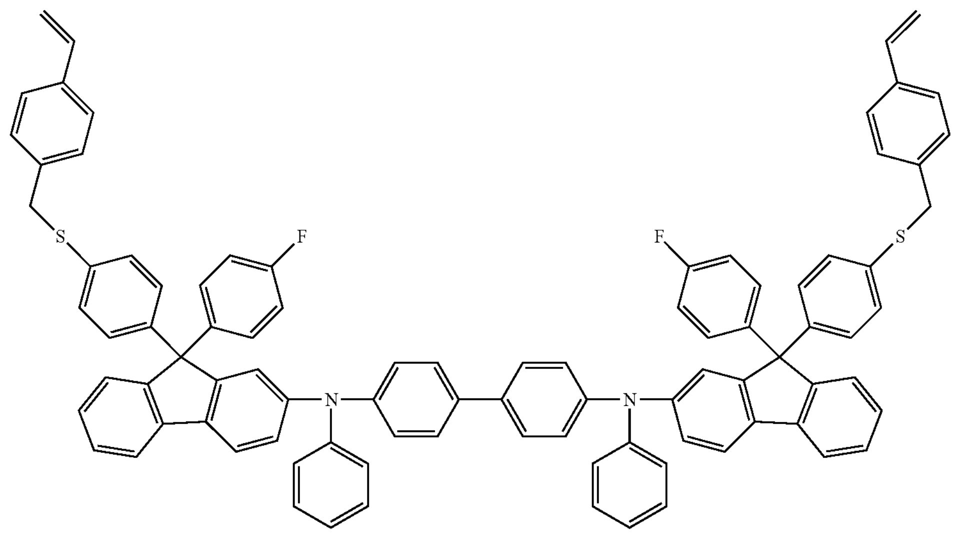

-continued
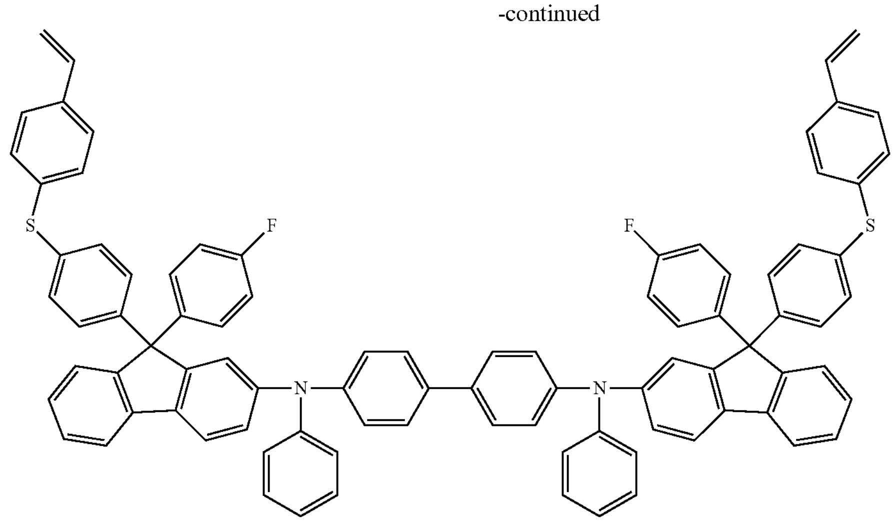
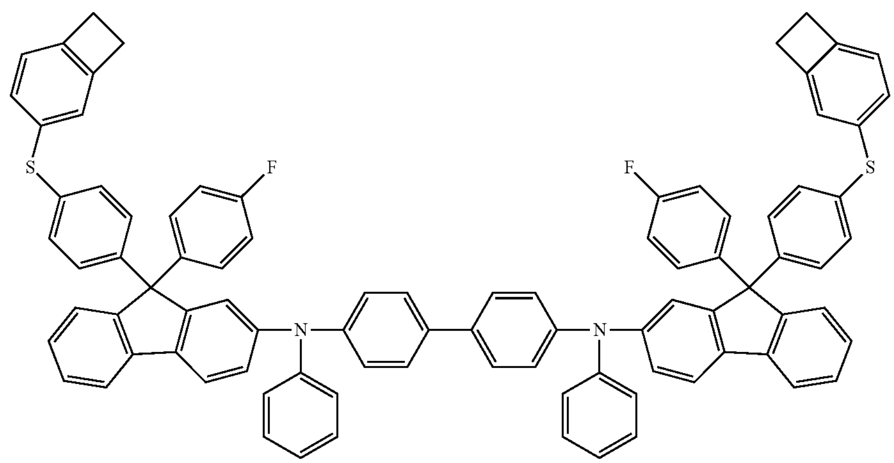
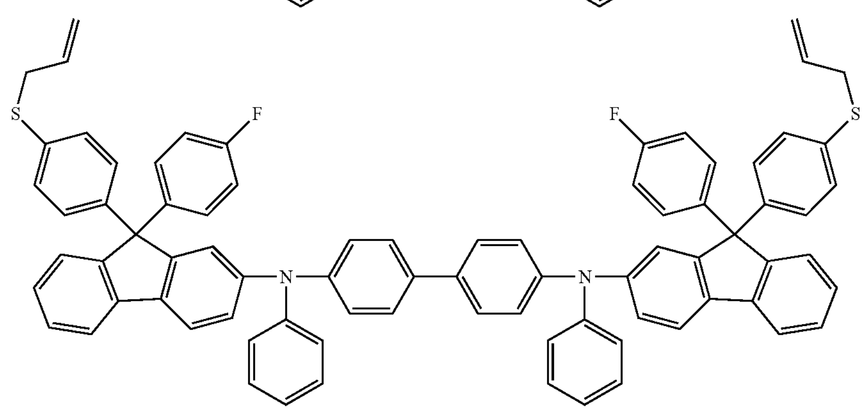
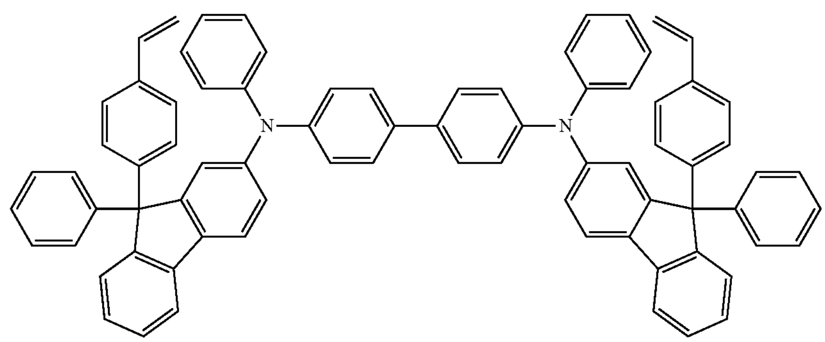

-continued
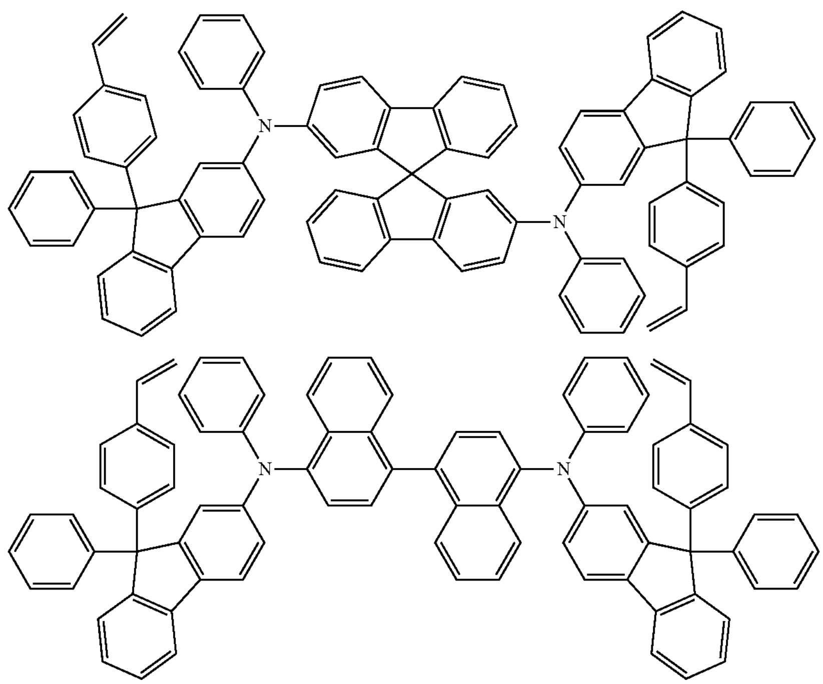
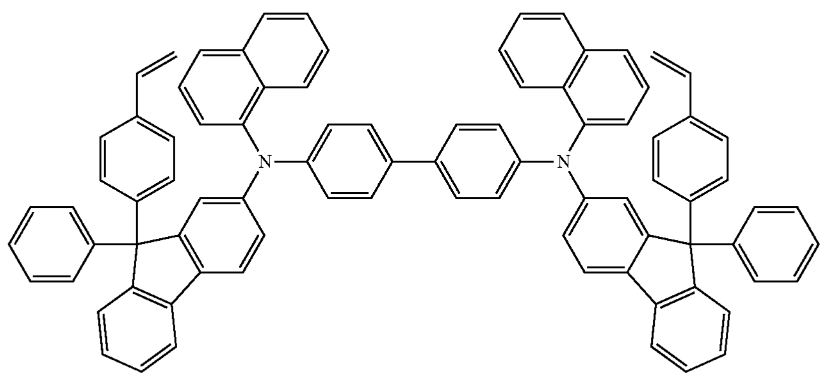
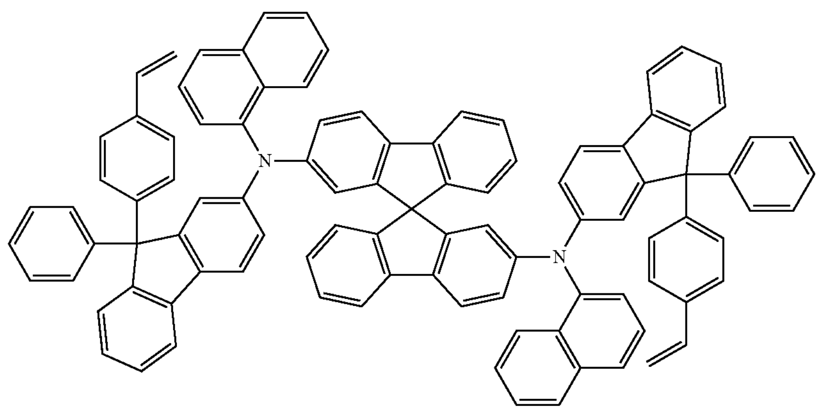

-continued
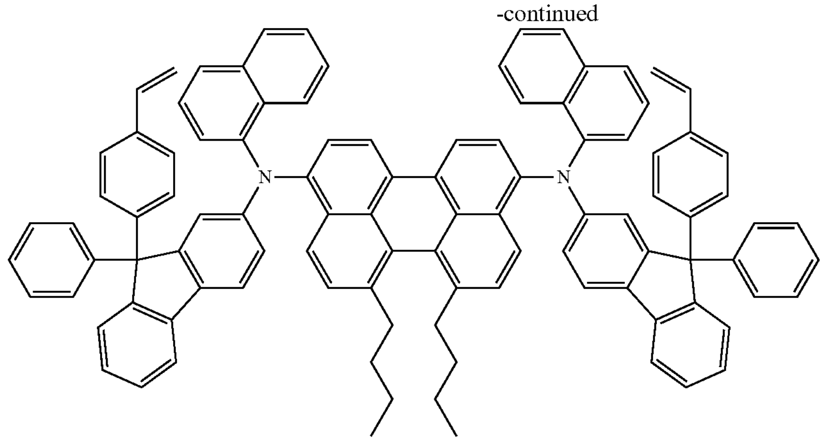
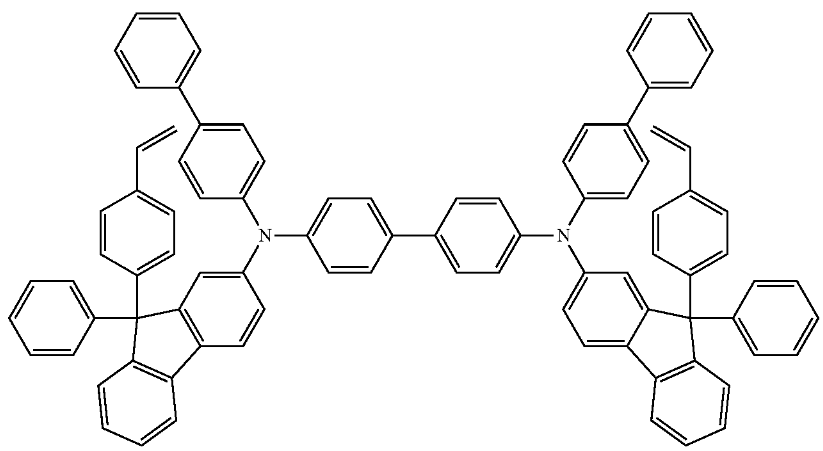
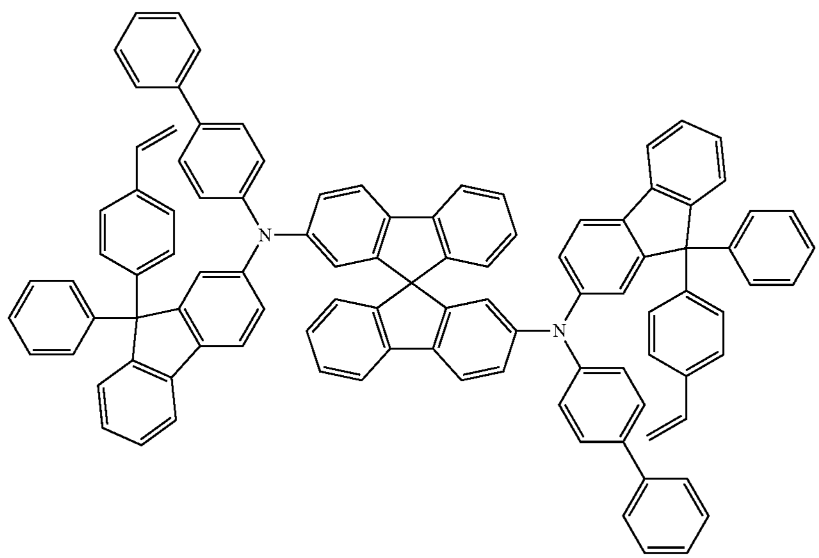

-continued
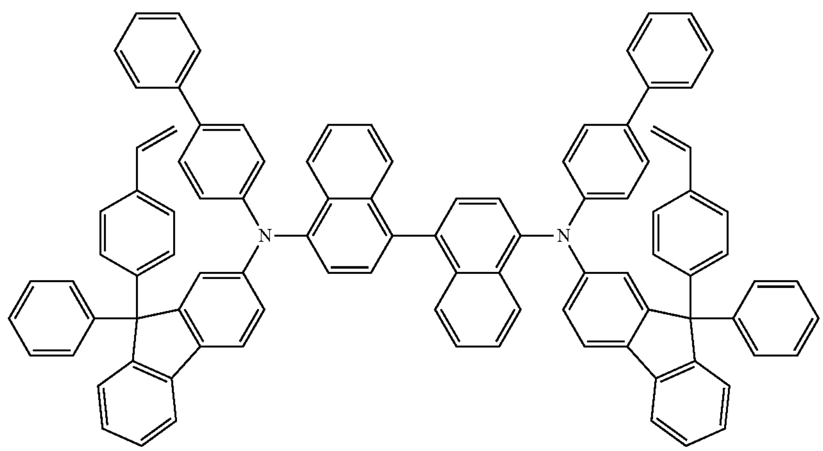
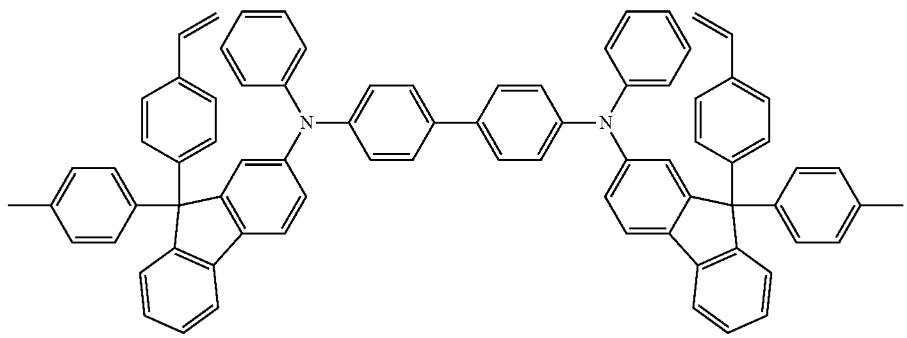
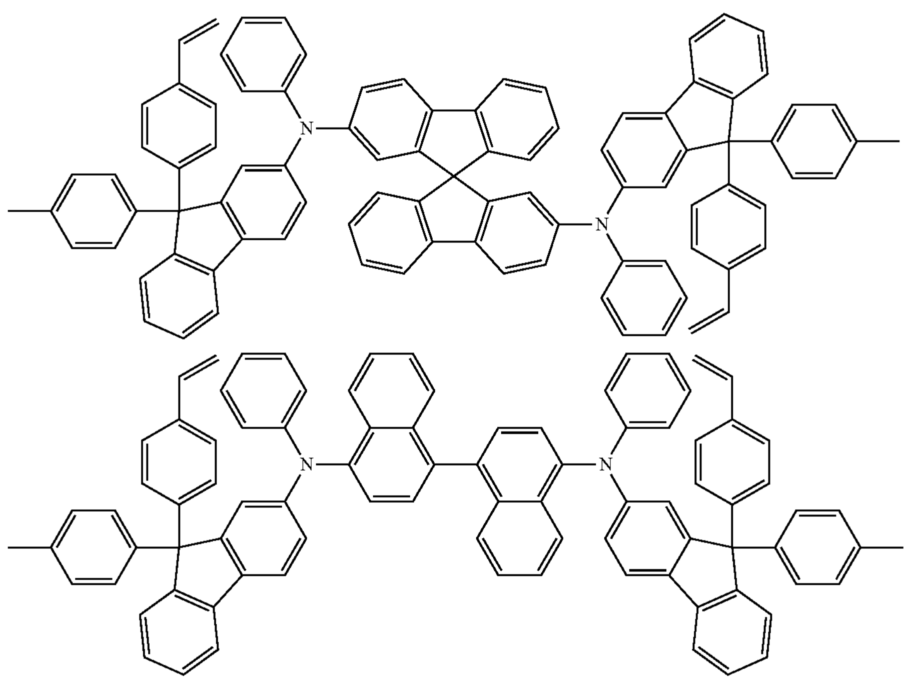

-continued
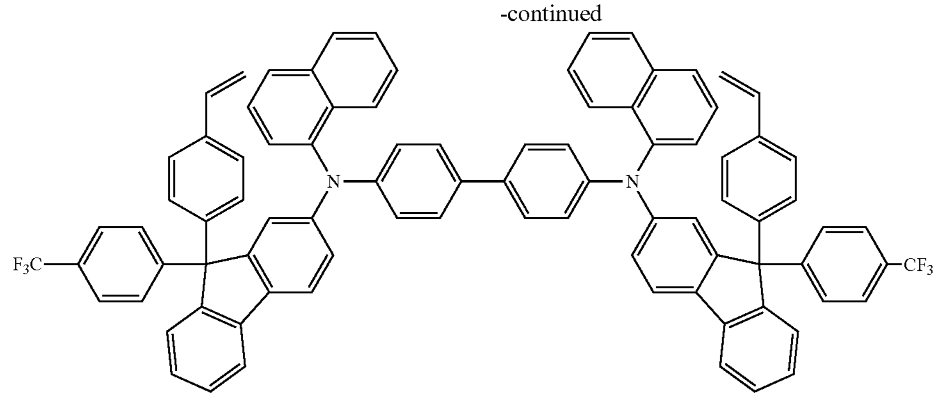
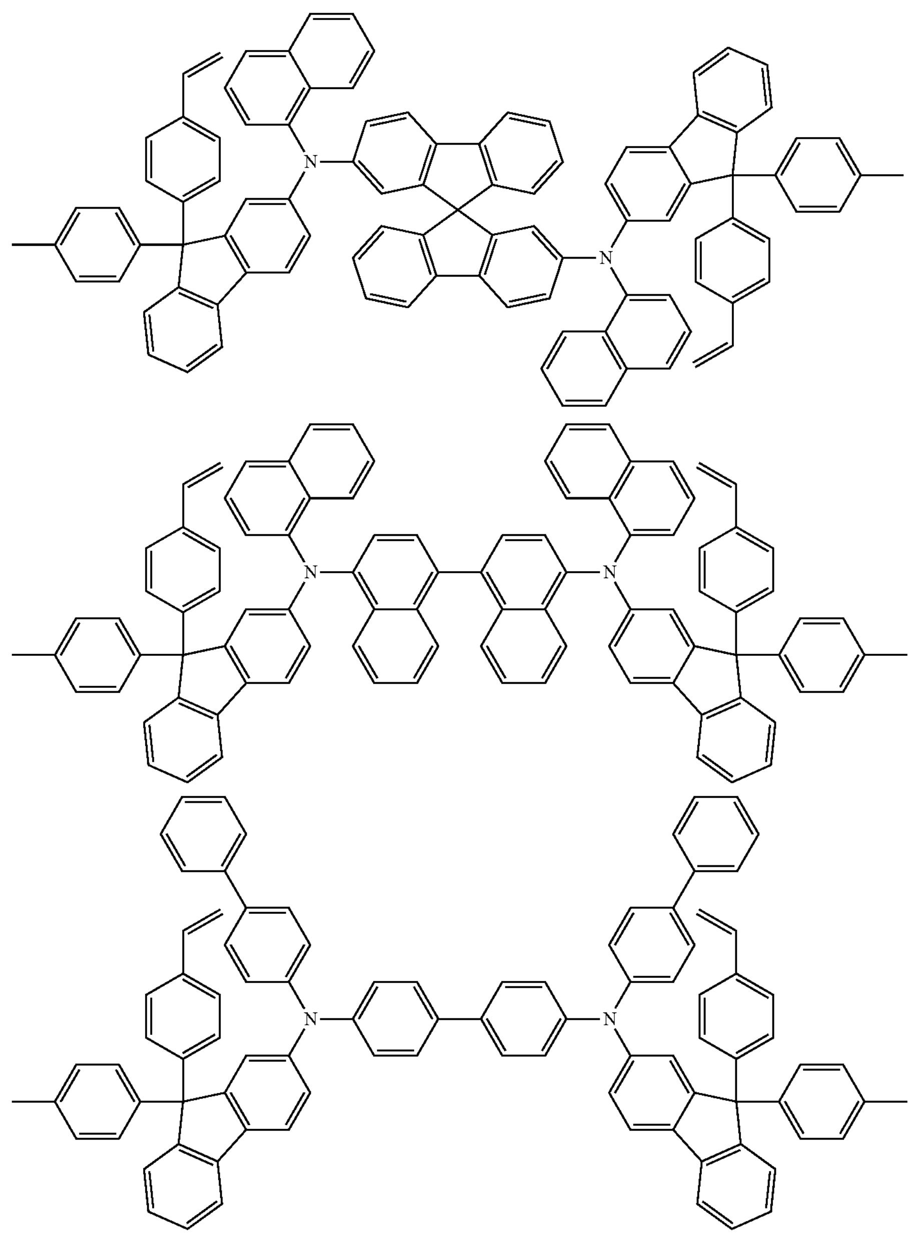

-continued
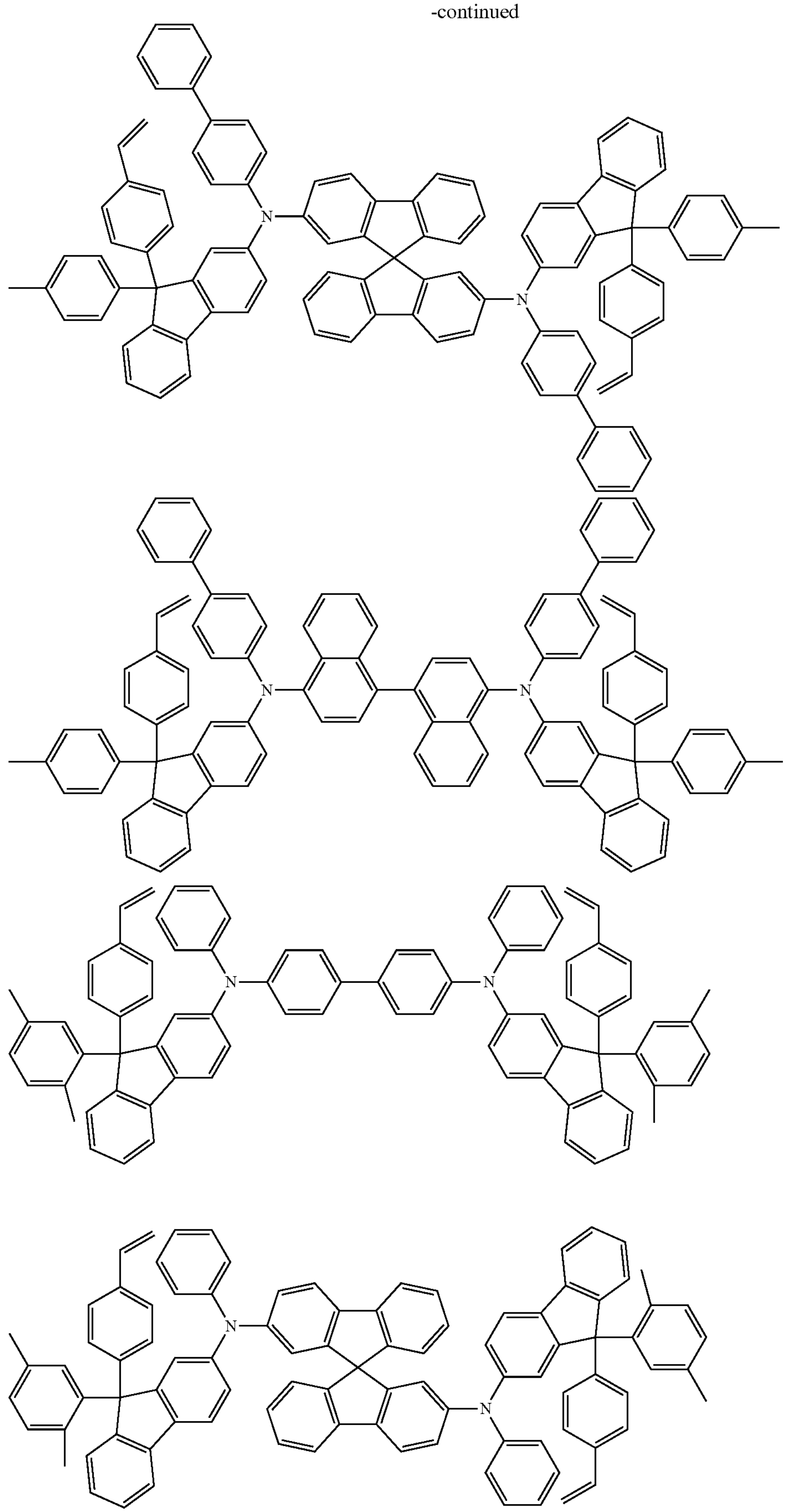

-continued
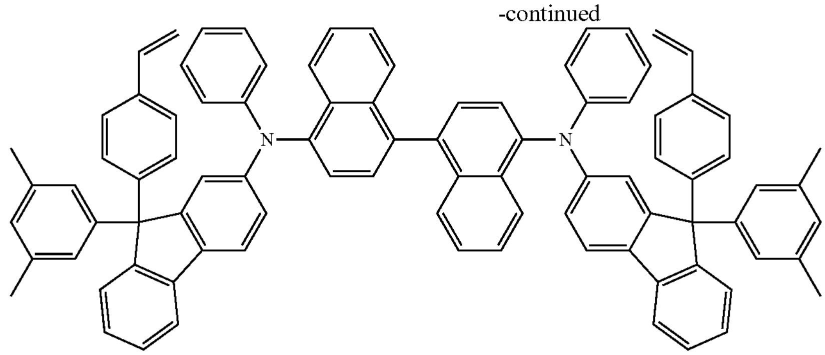
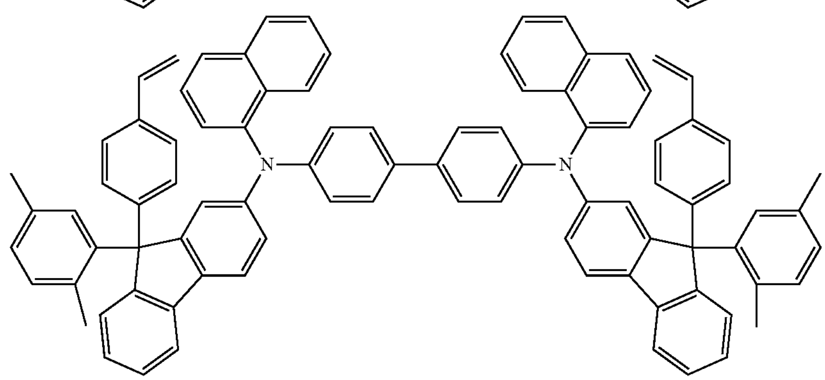
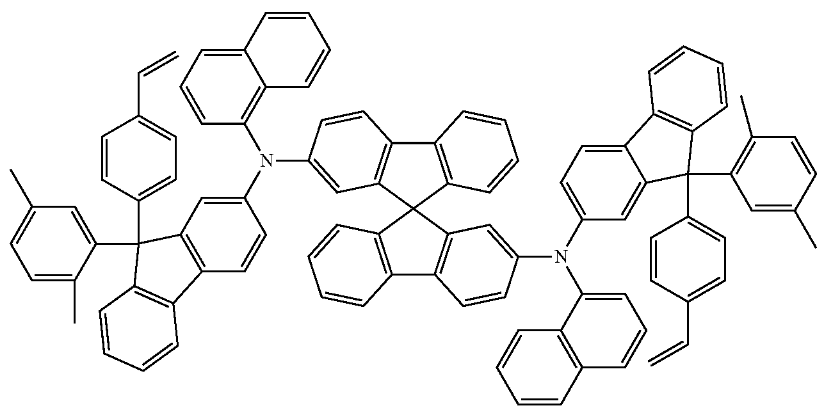
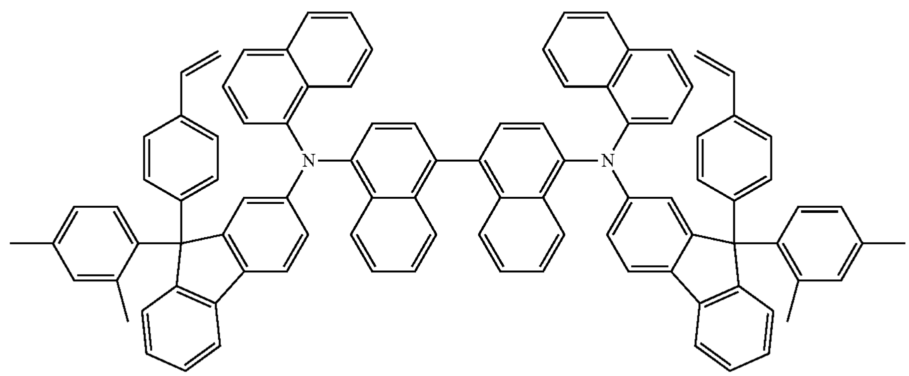

-continued
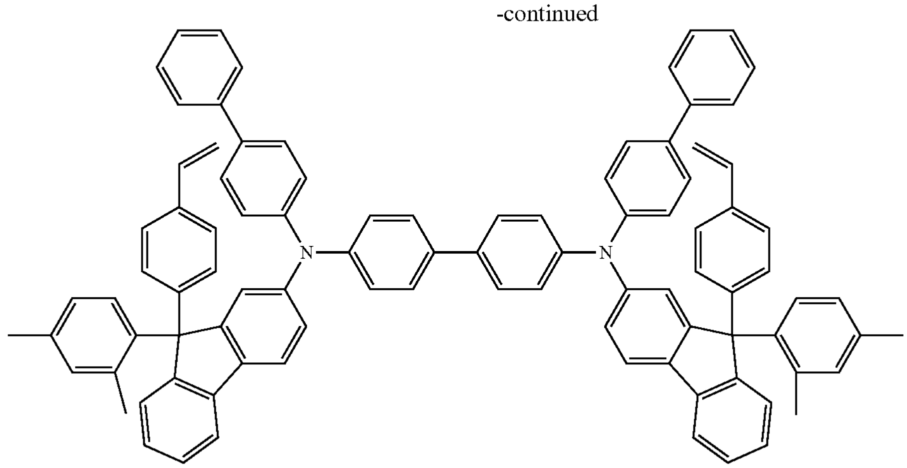
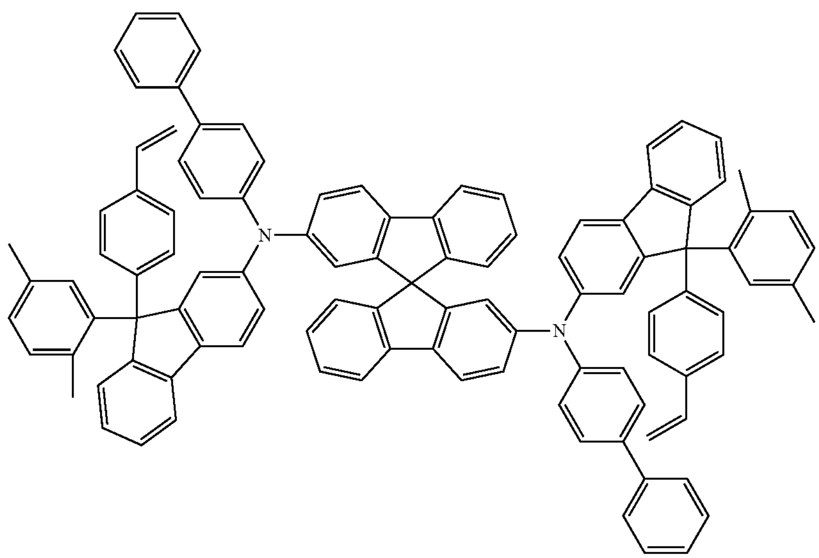
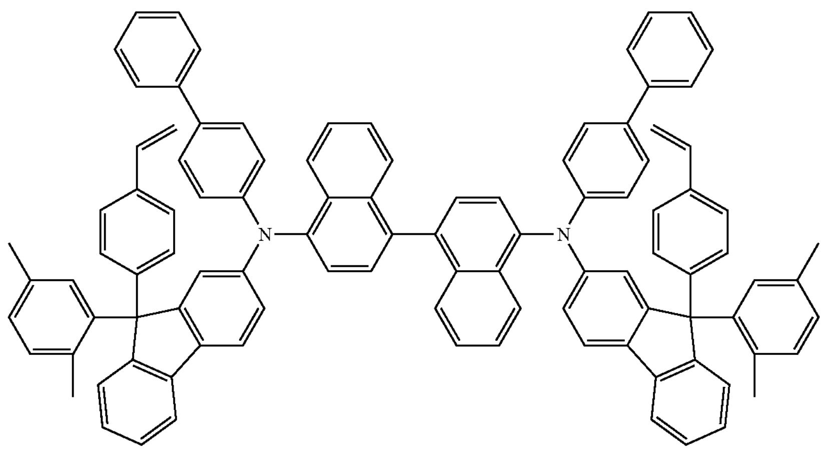

-continued
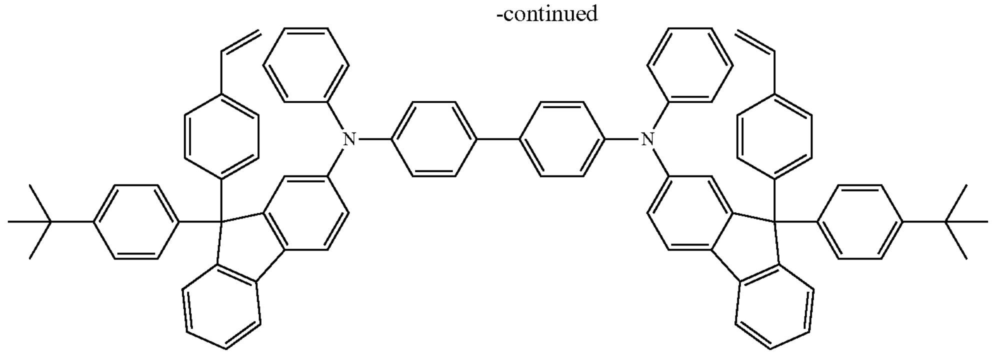
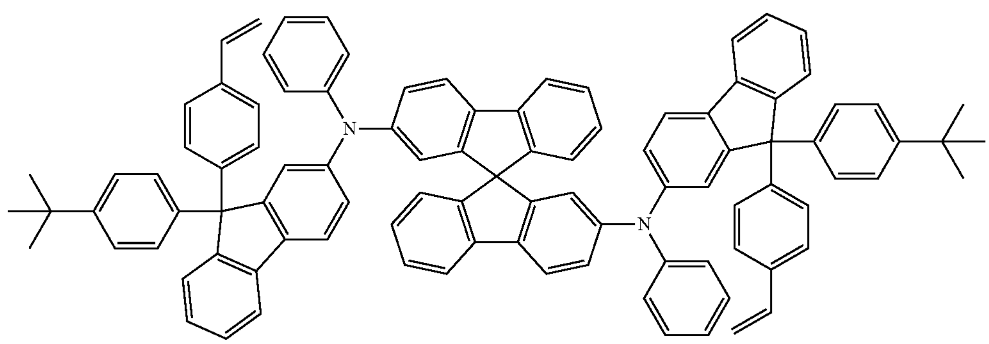
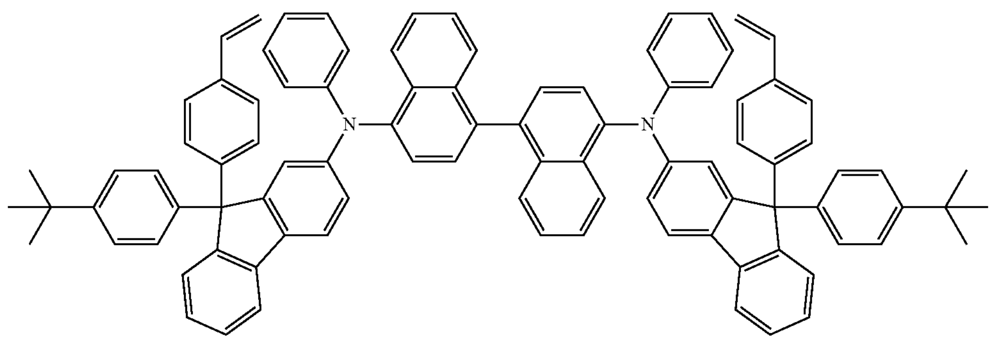
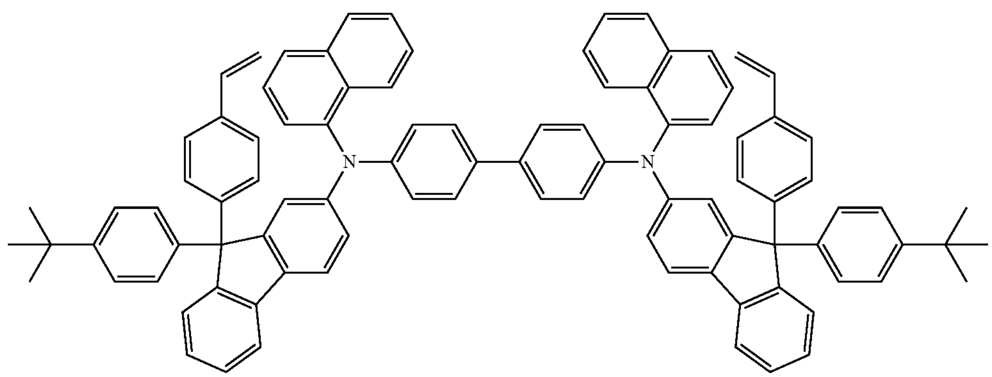

-continued
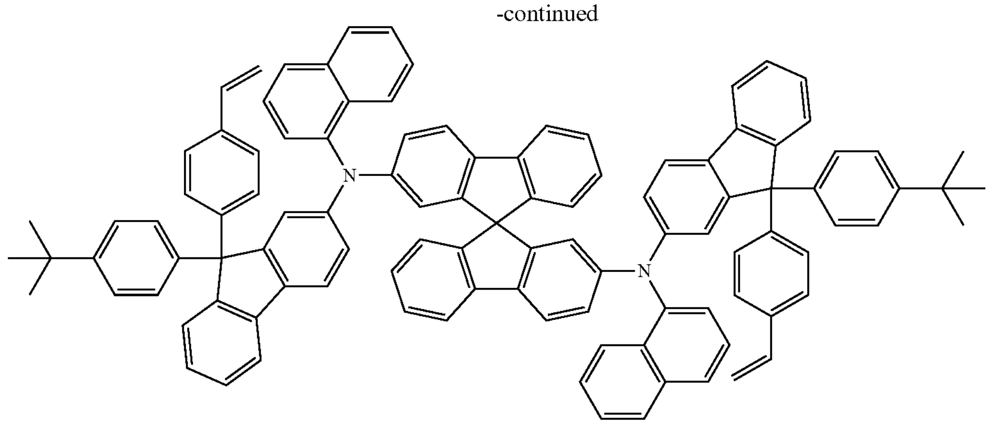
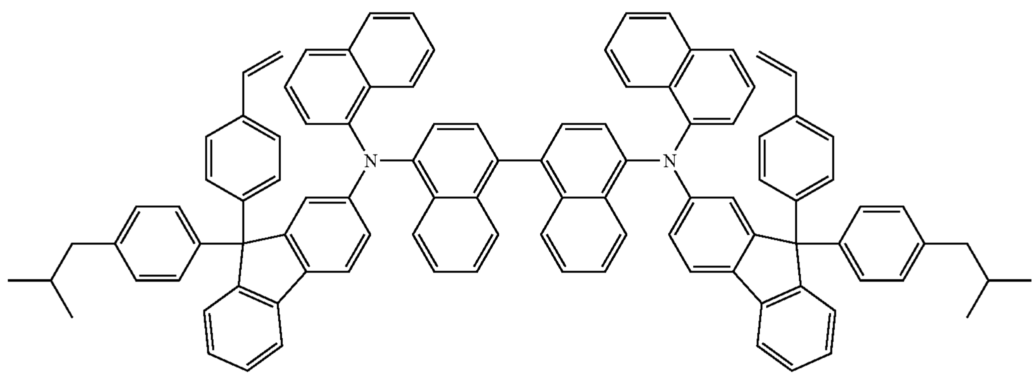
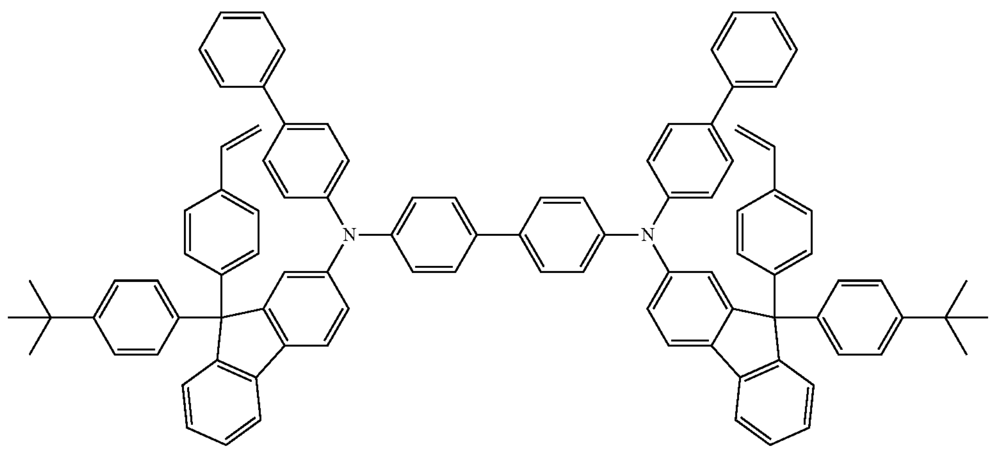

-continued
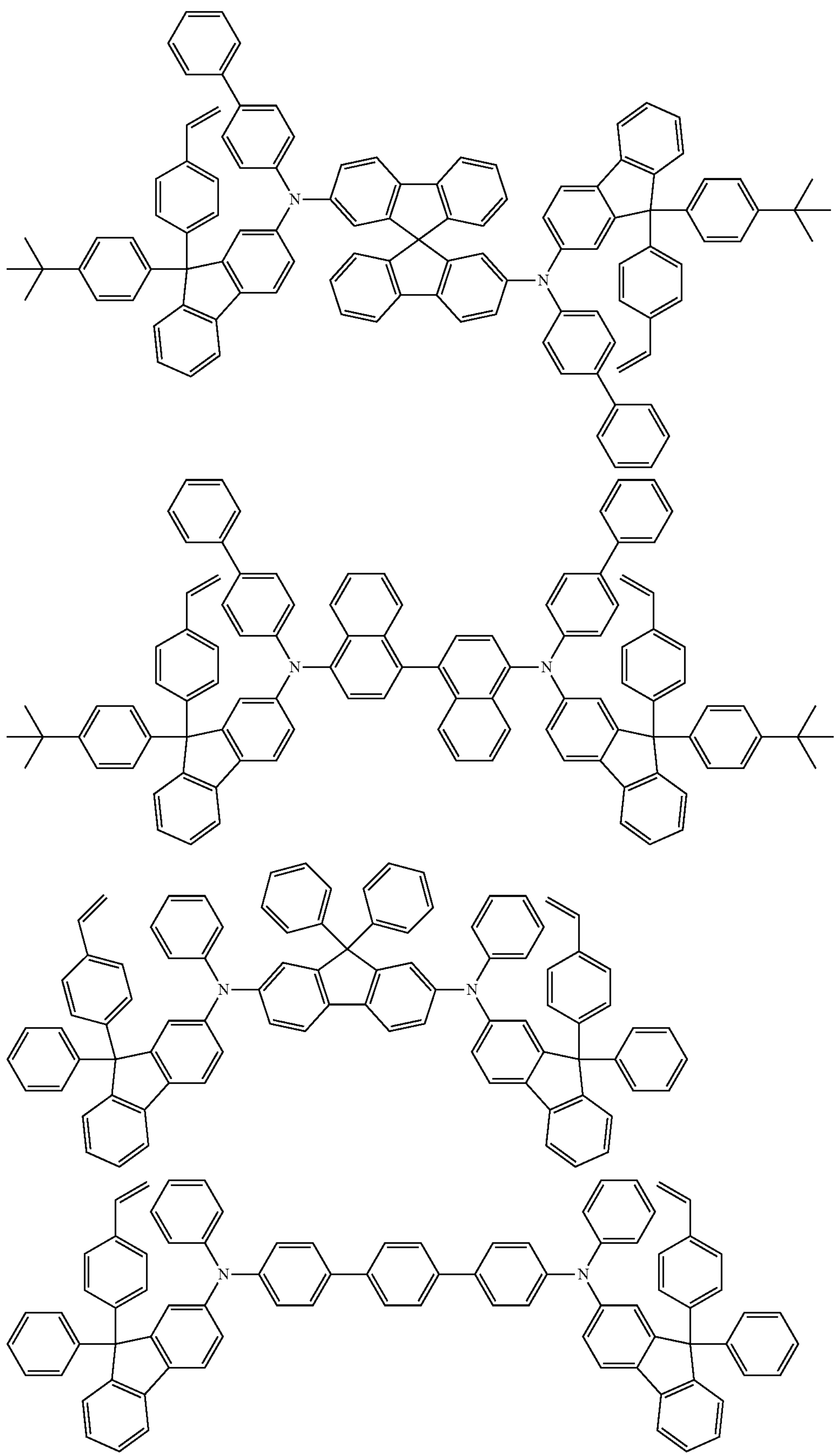

-continued
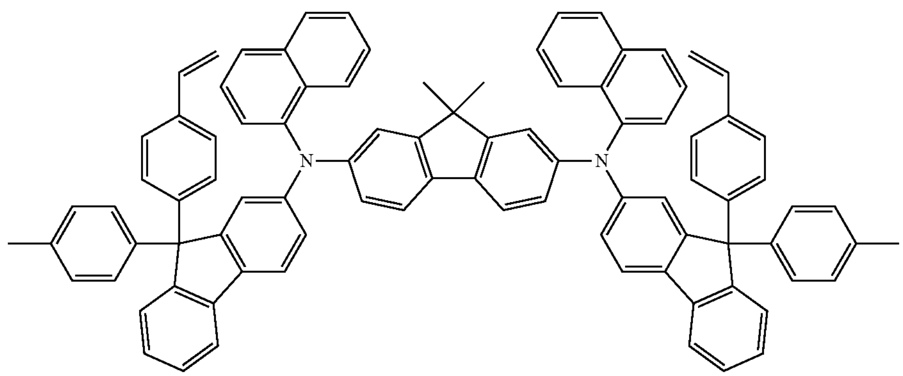
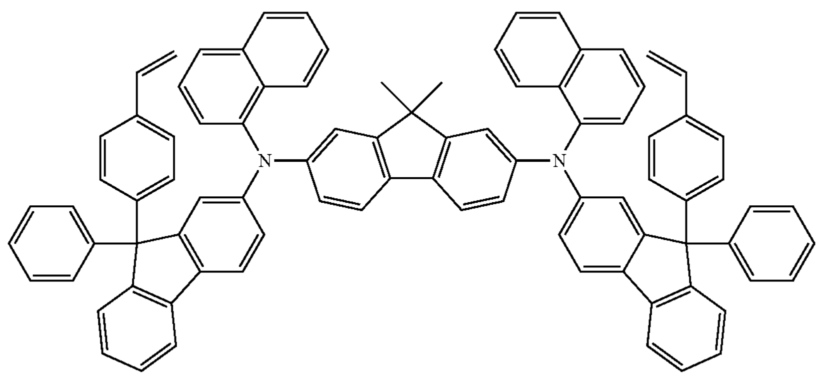
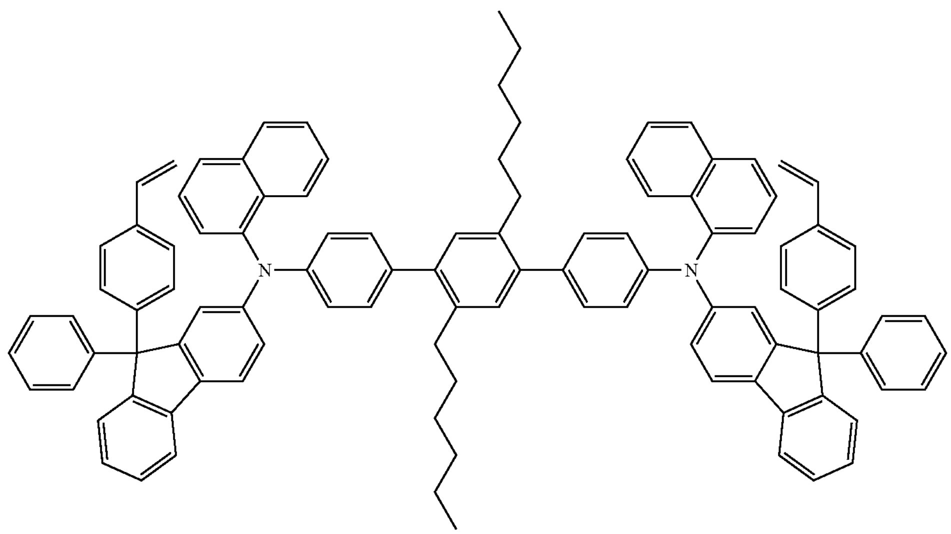

-continued
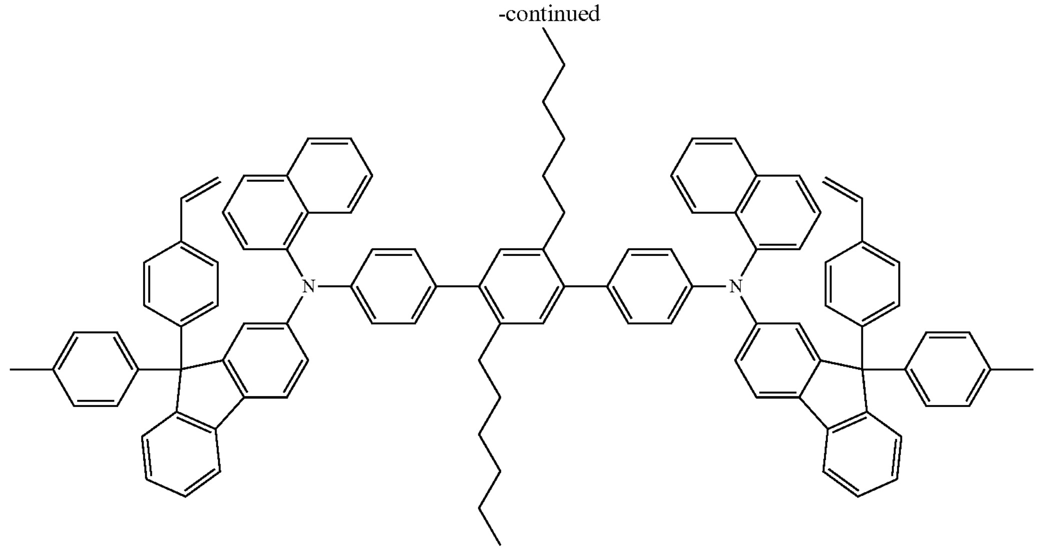
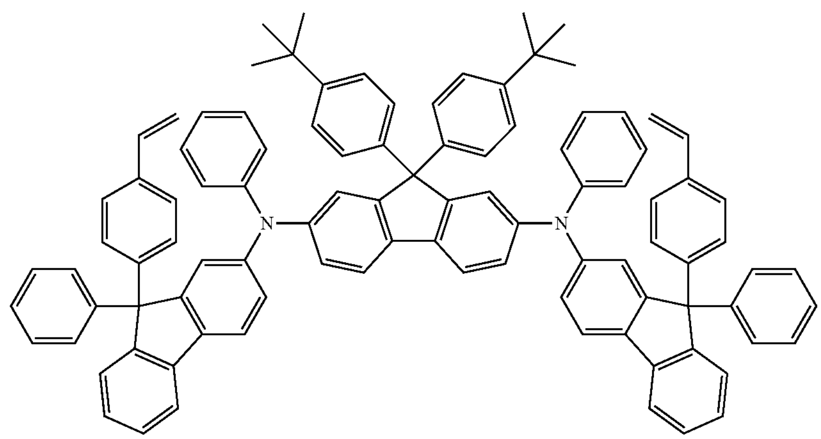
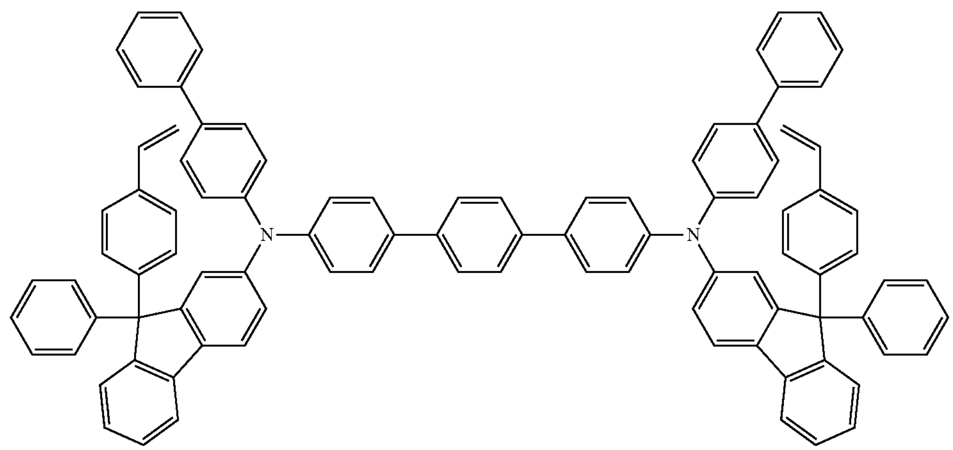

-continued
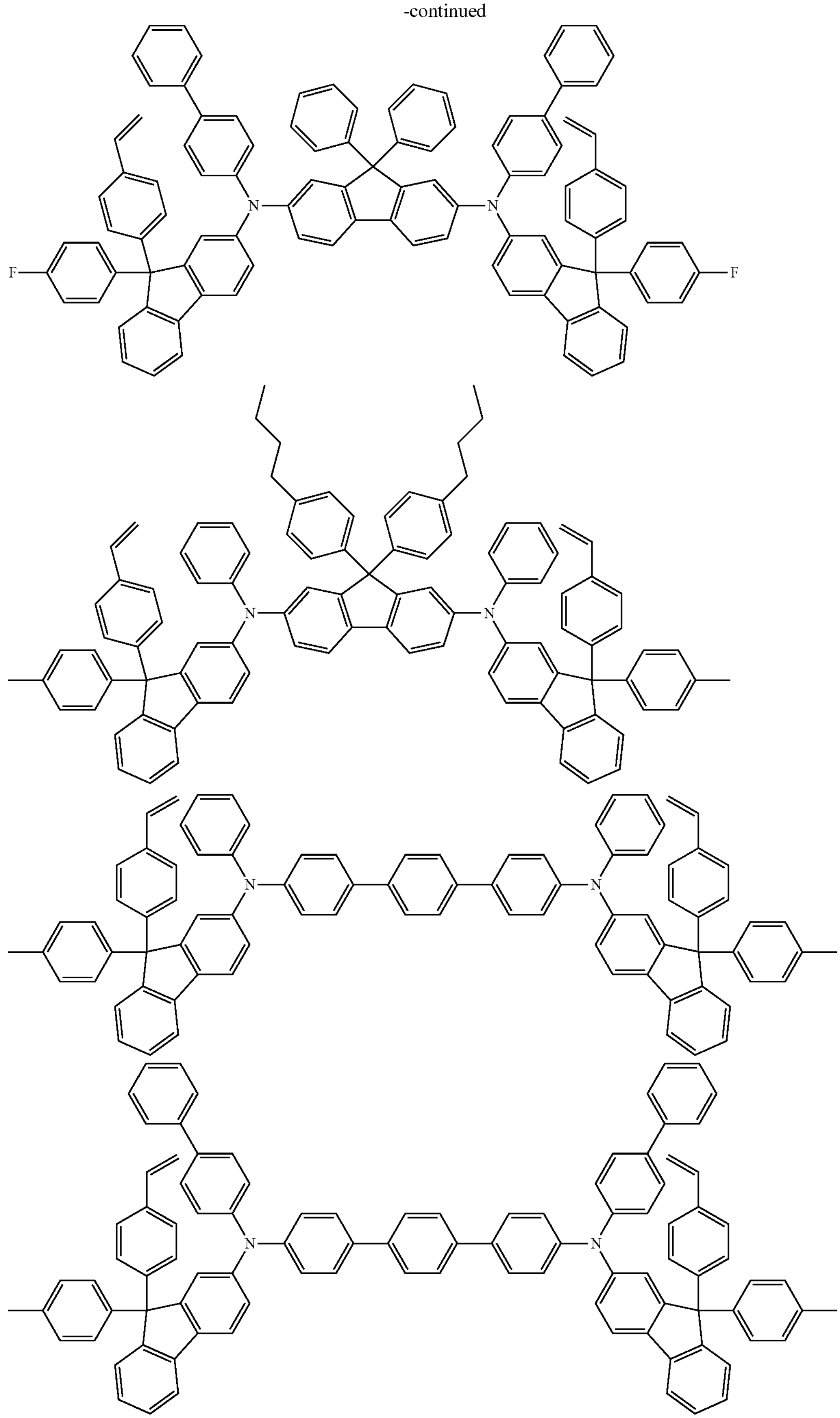

-continued
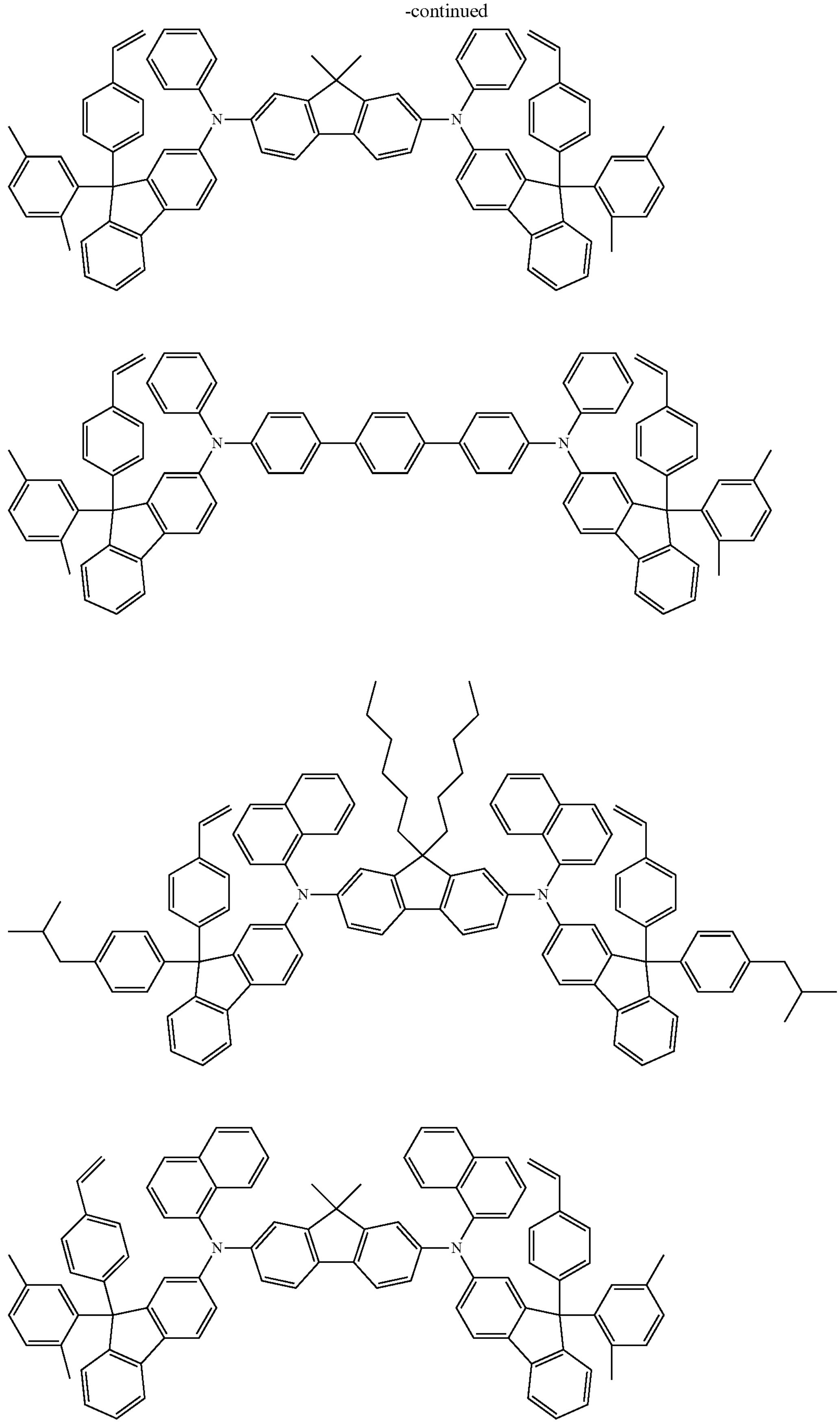

-continued
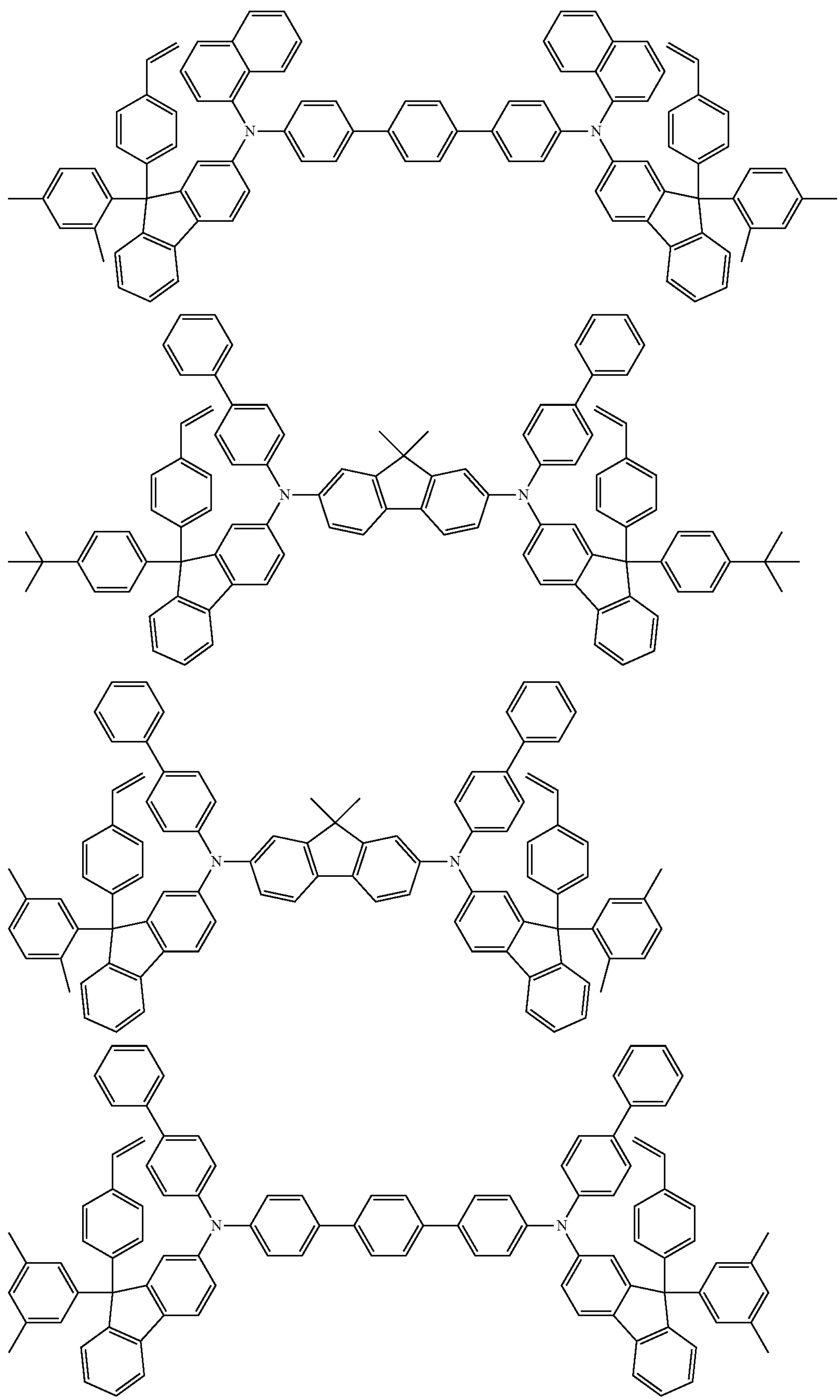

-continued
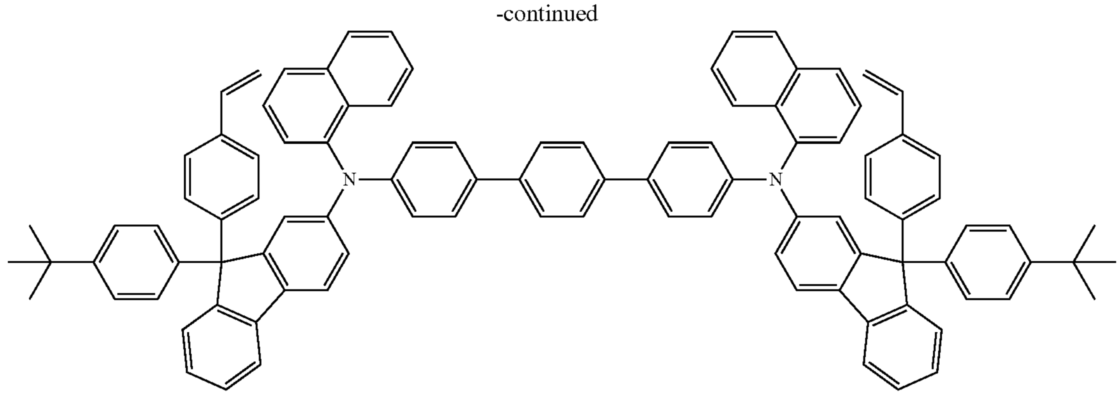
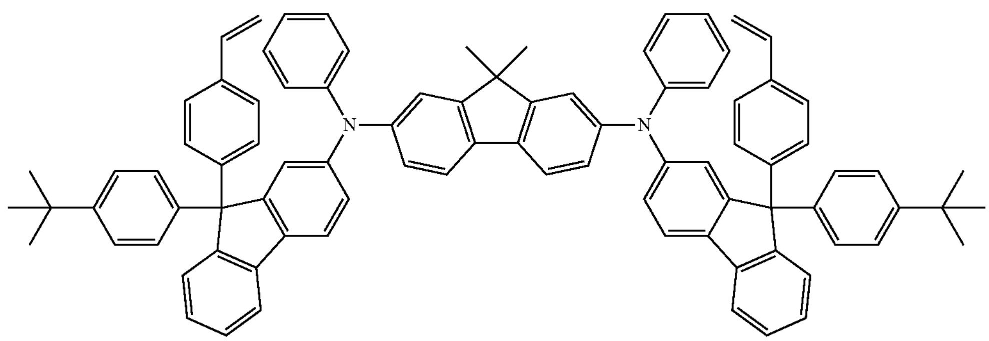
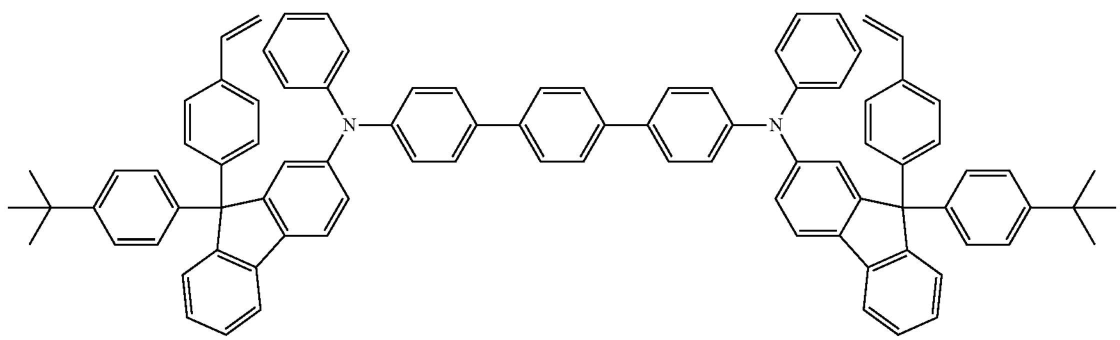
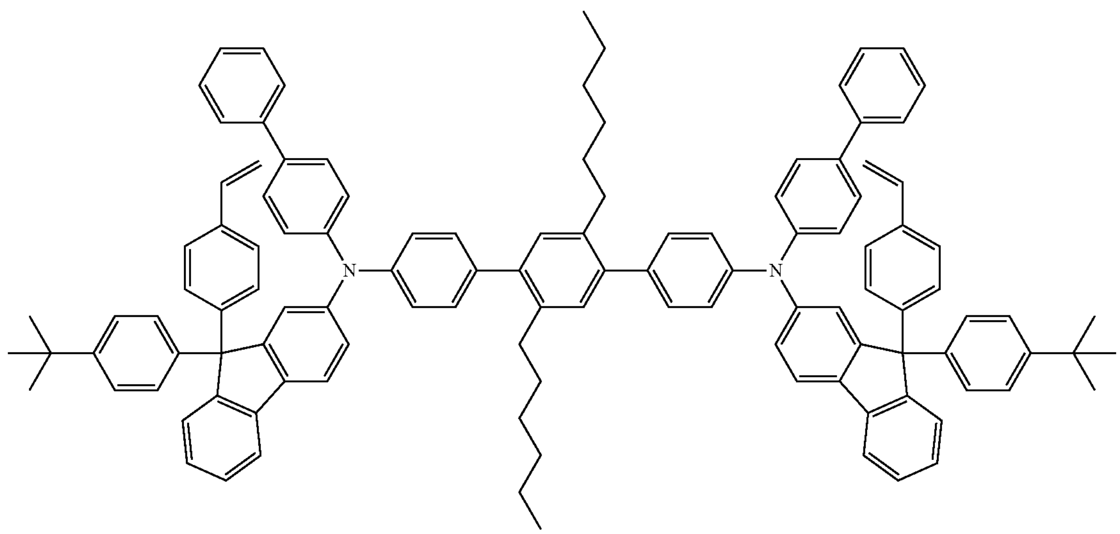

-continued
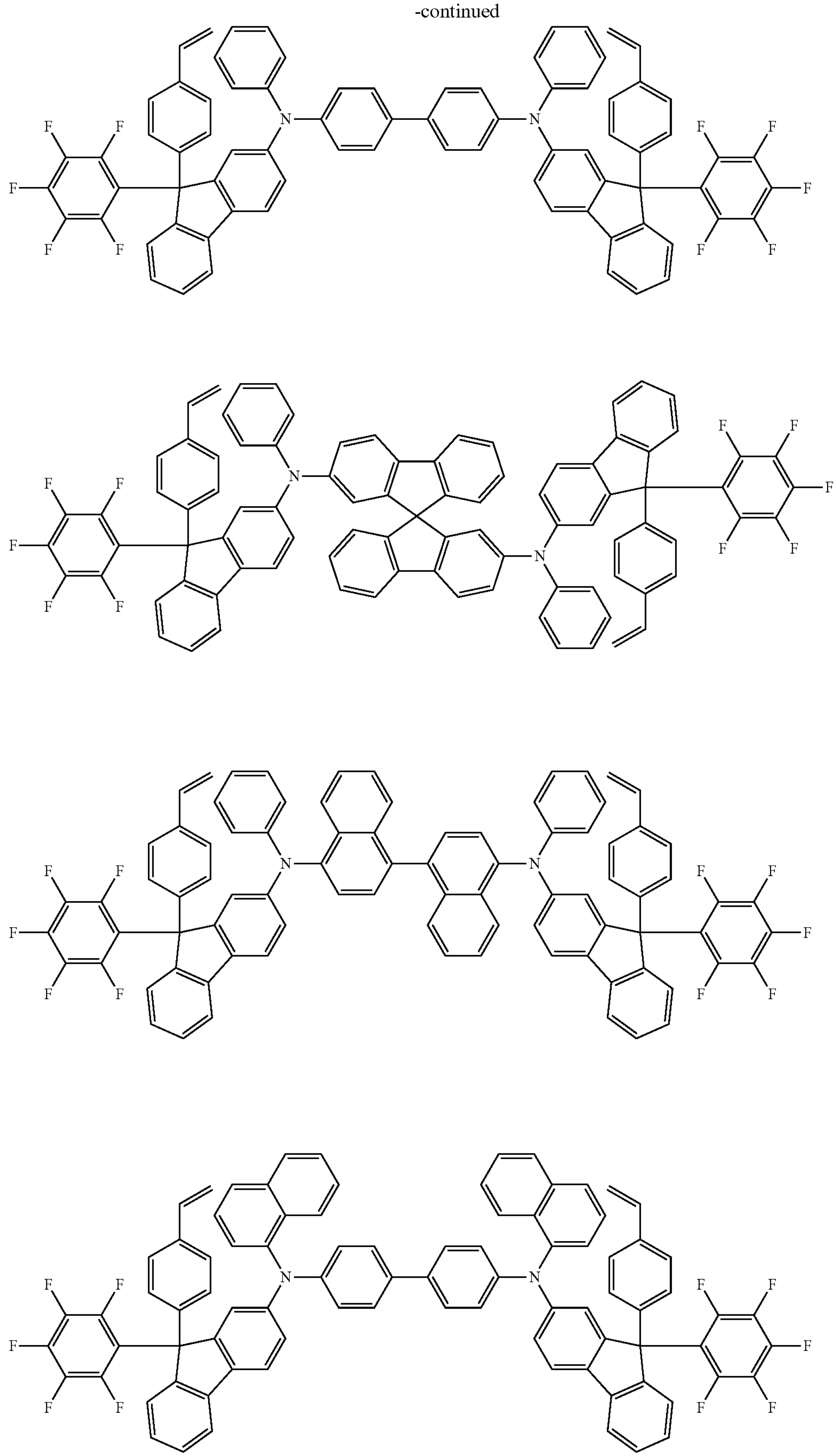

-continued
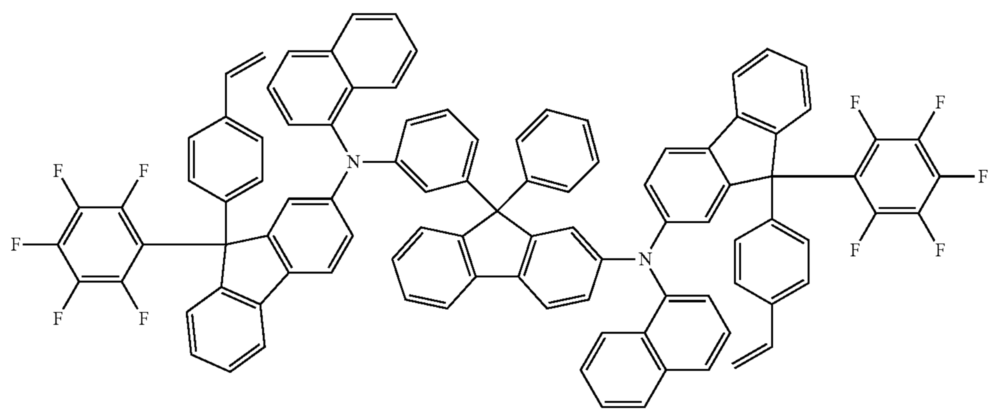
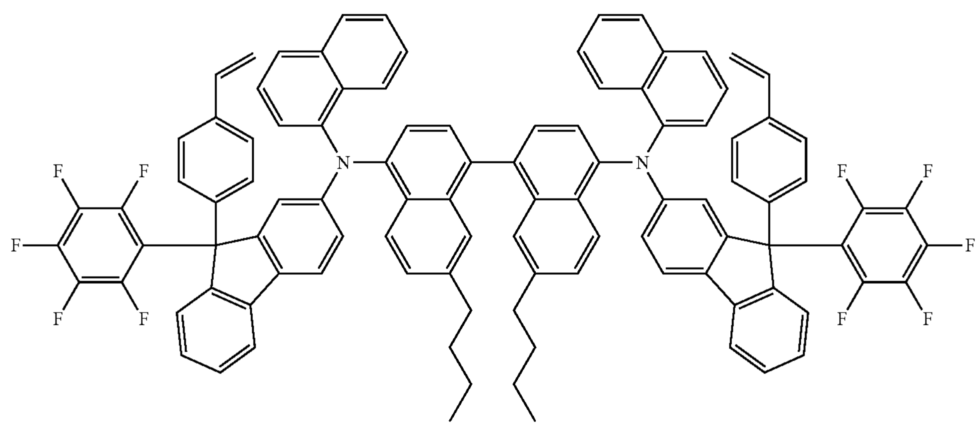
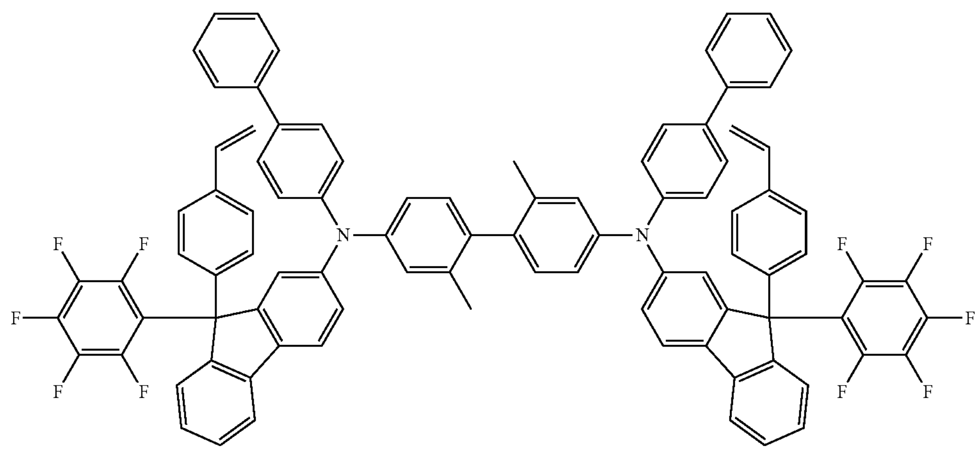

-continued
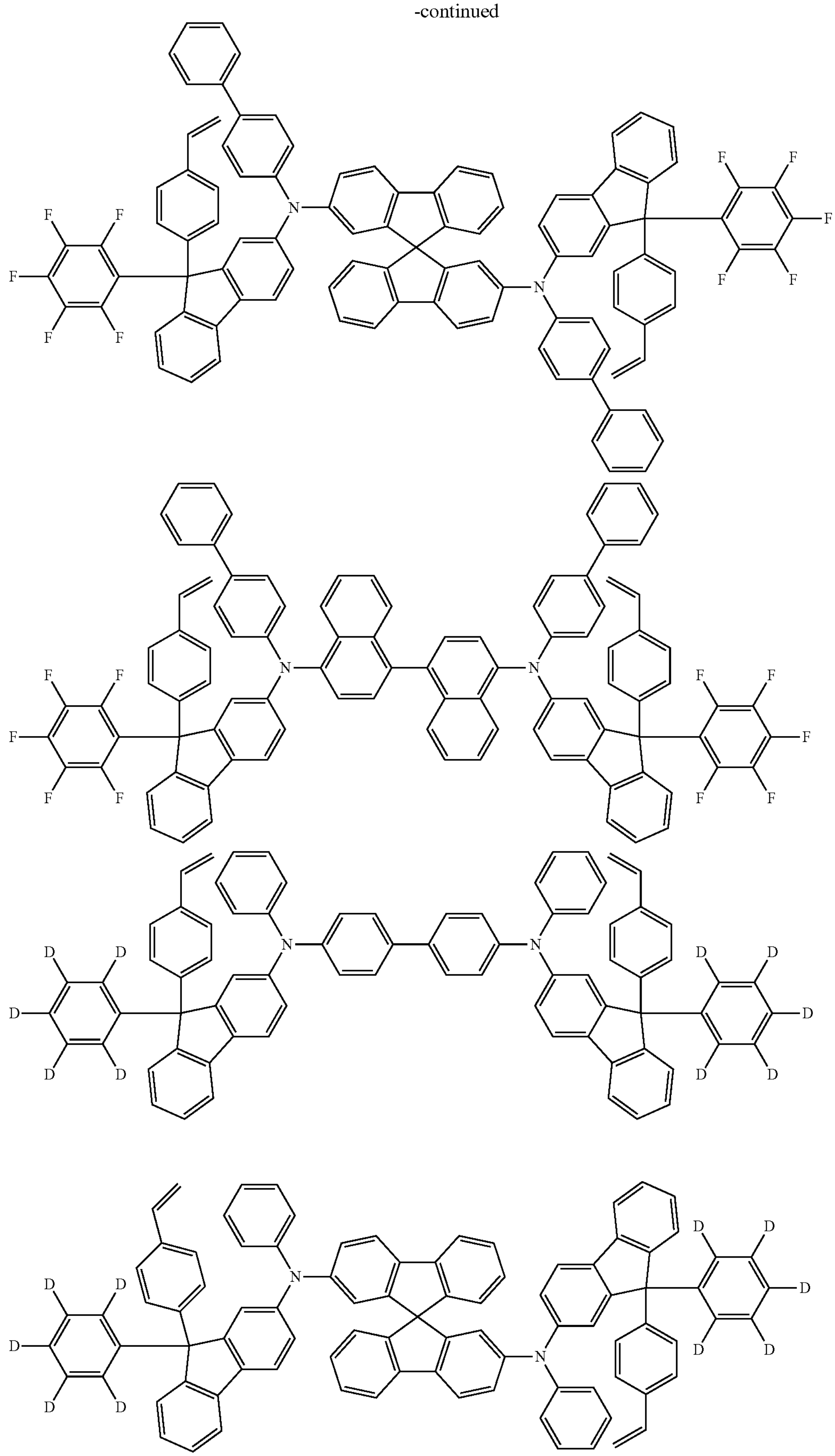

-continued
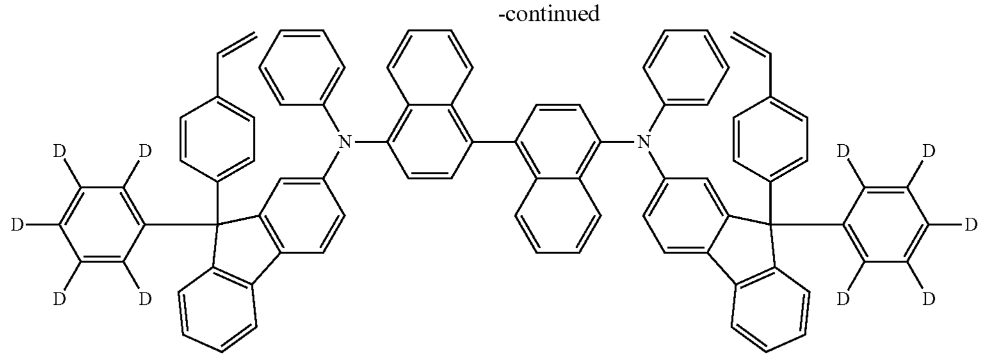
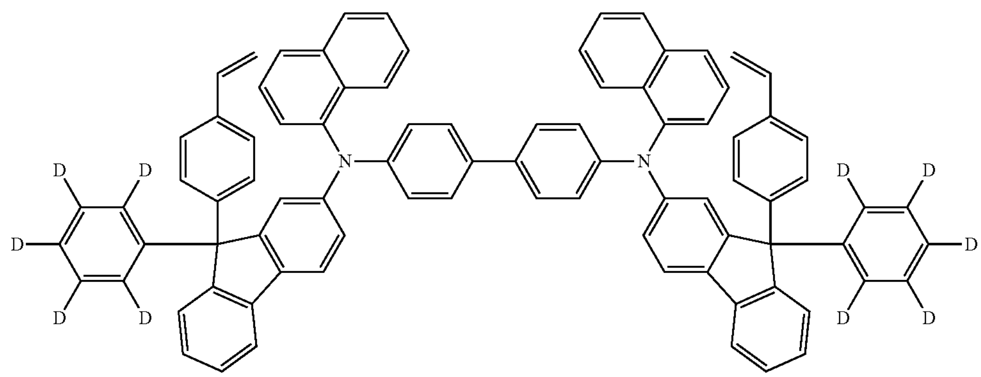
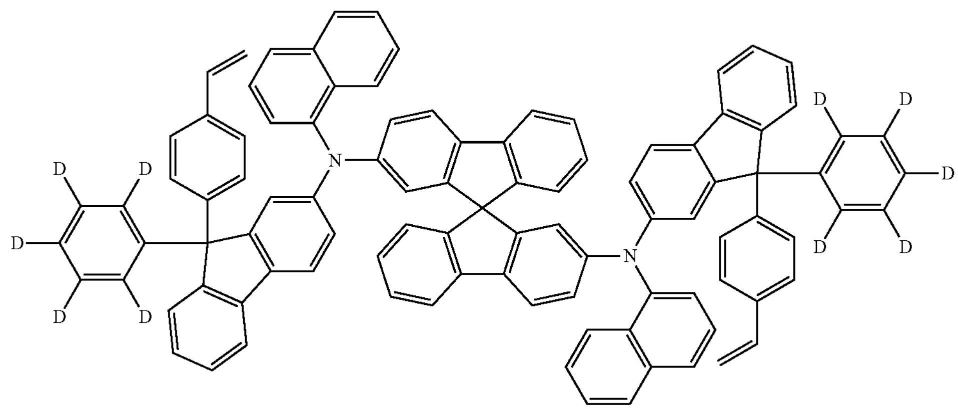
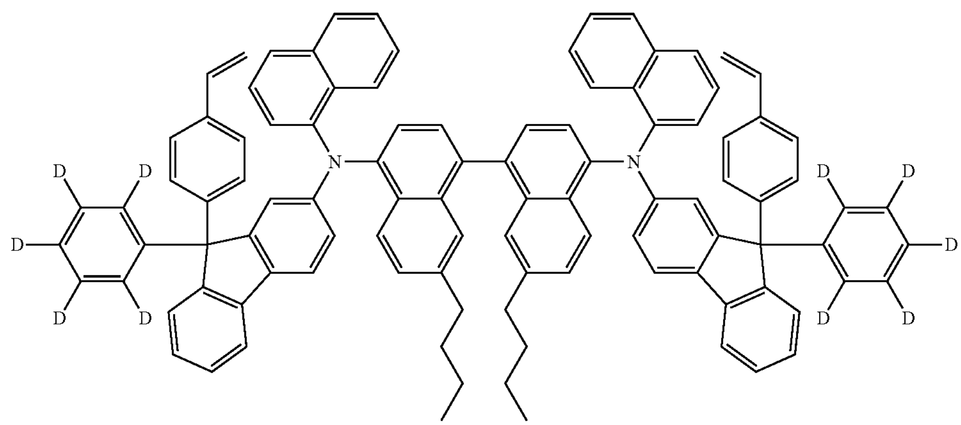

-continued
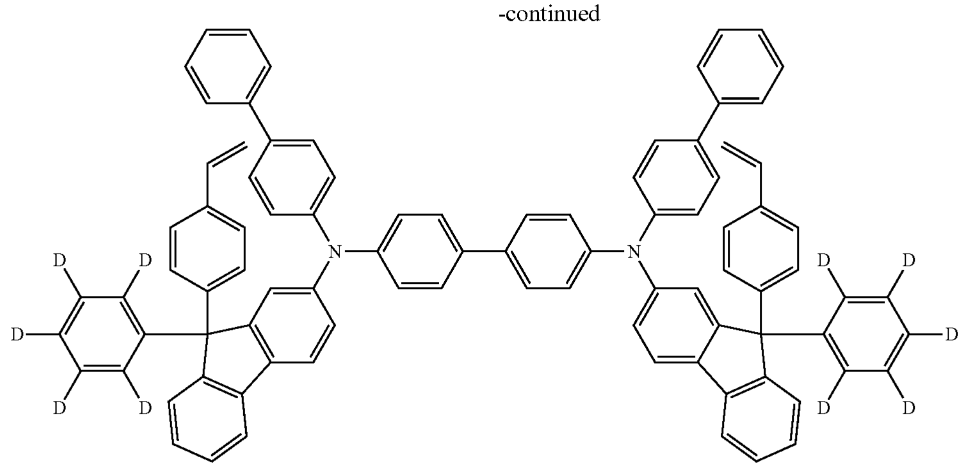
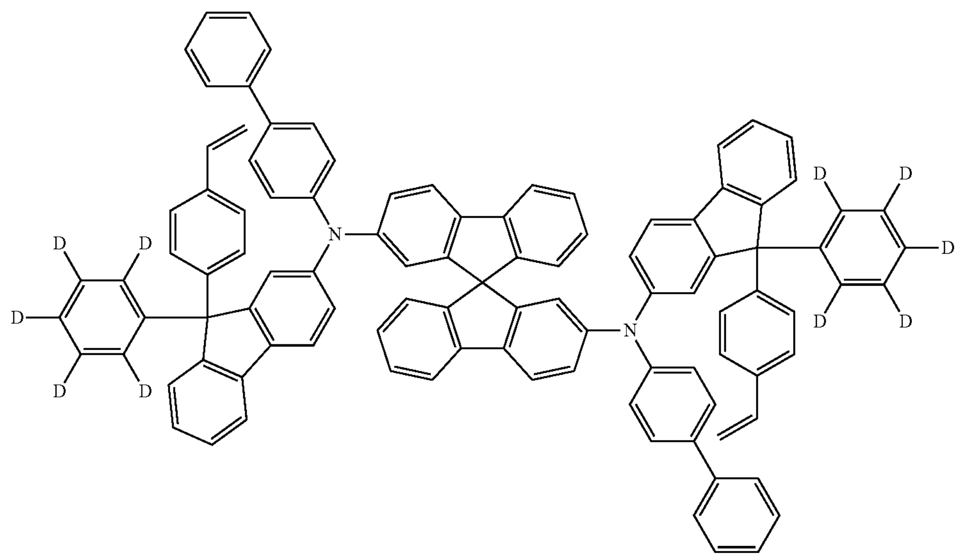
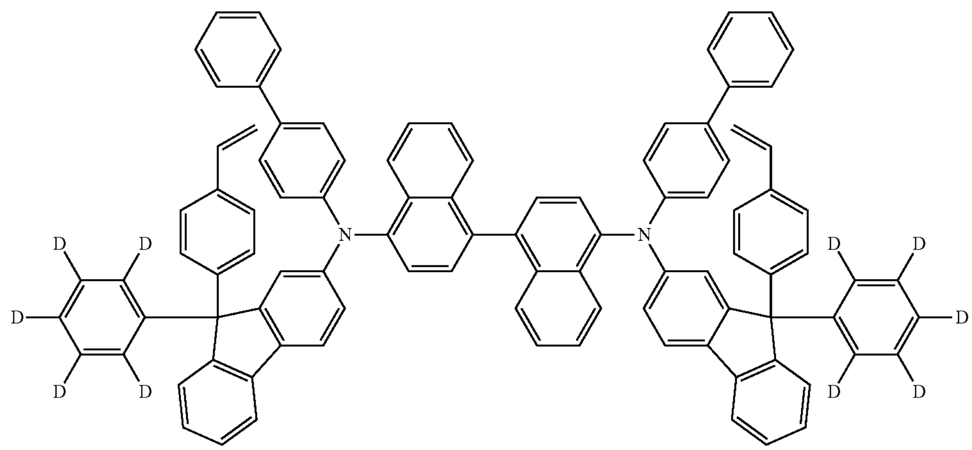

-continued
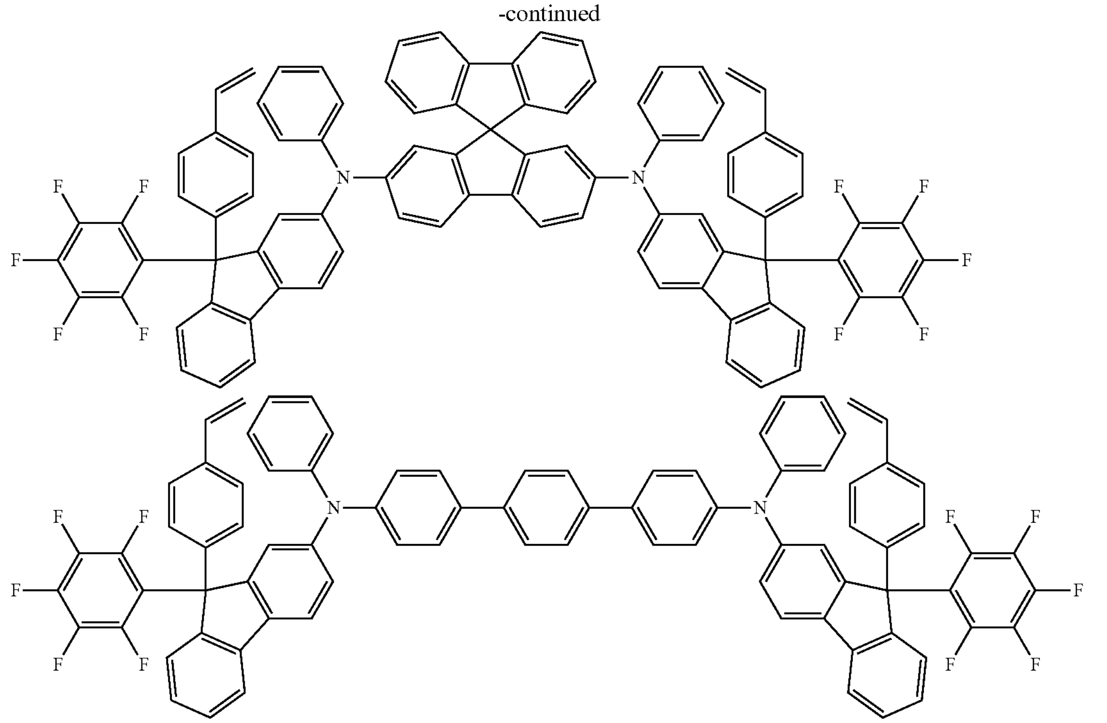
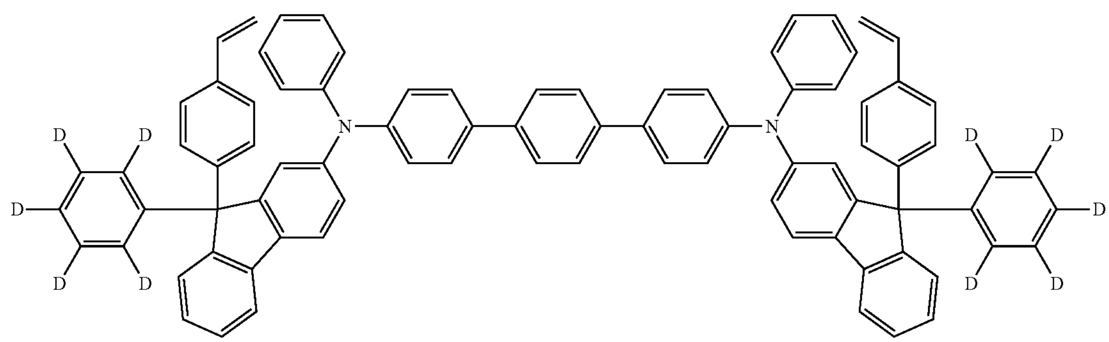
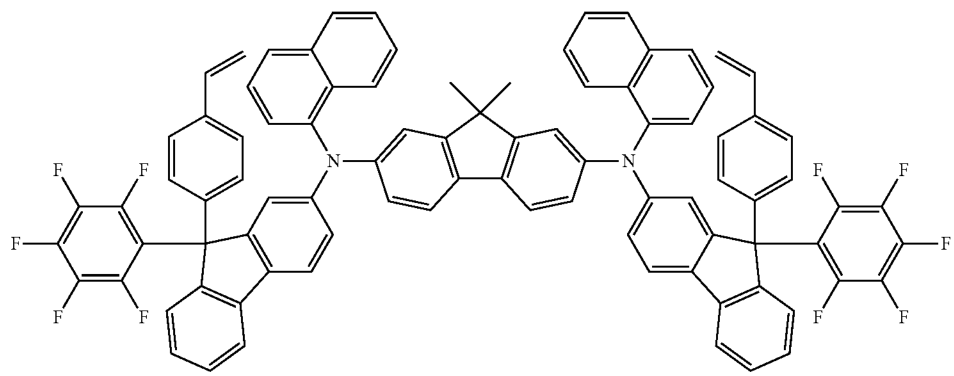

-continued
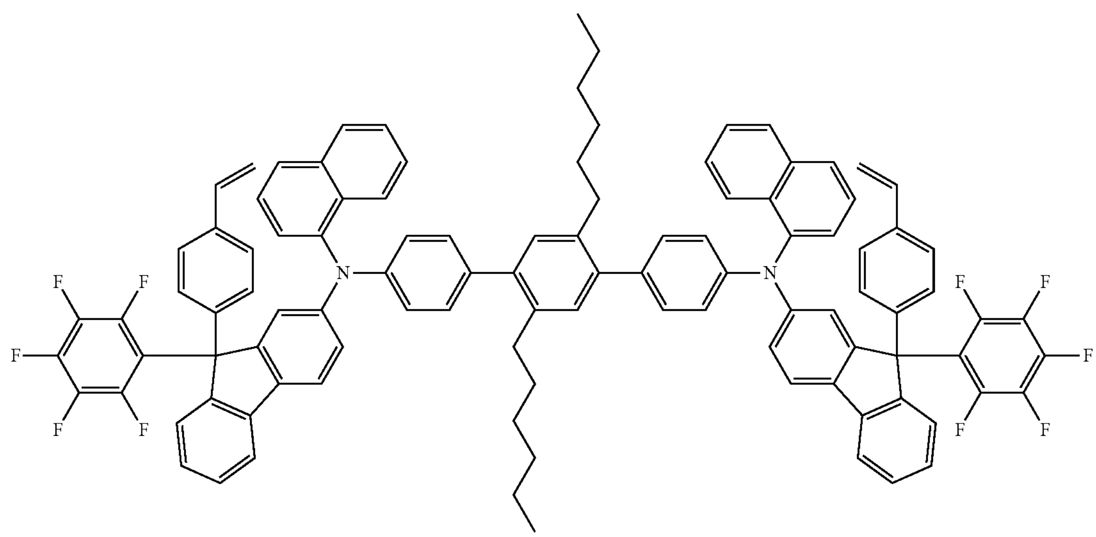
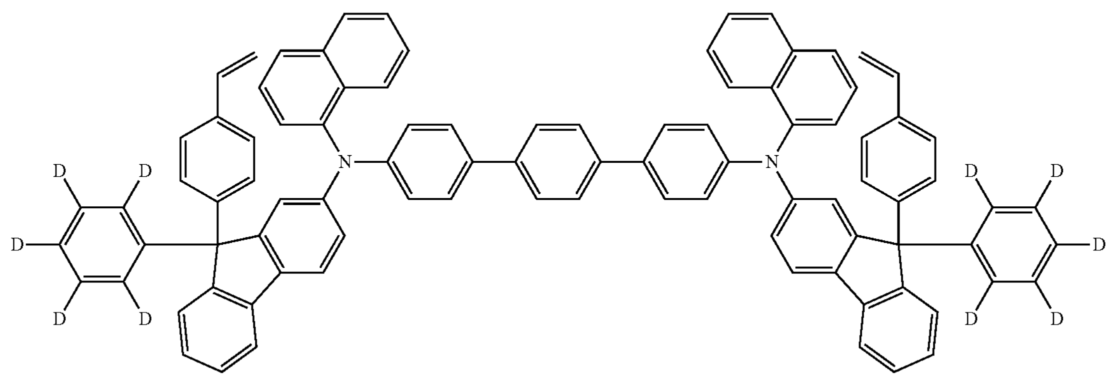
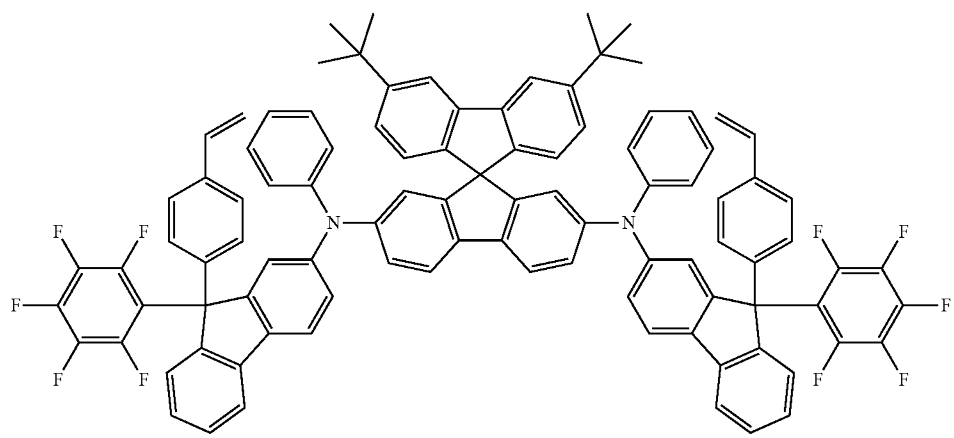

-continued
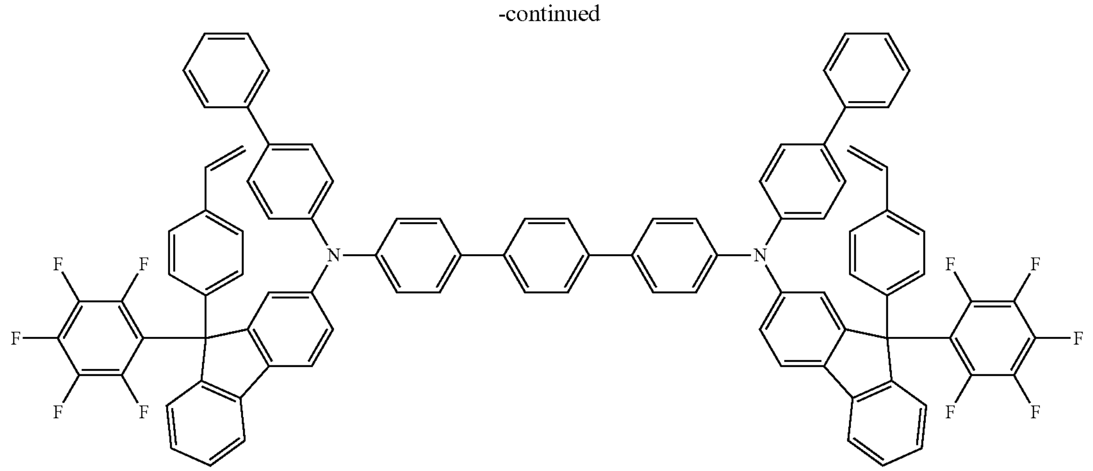
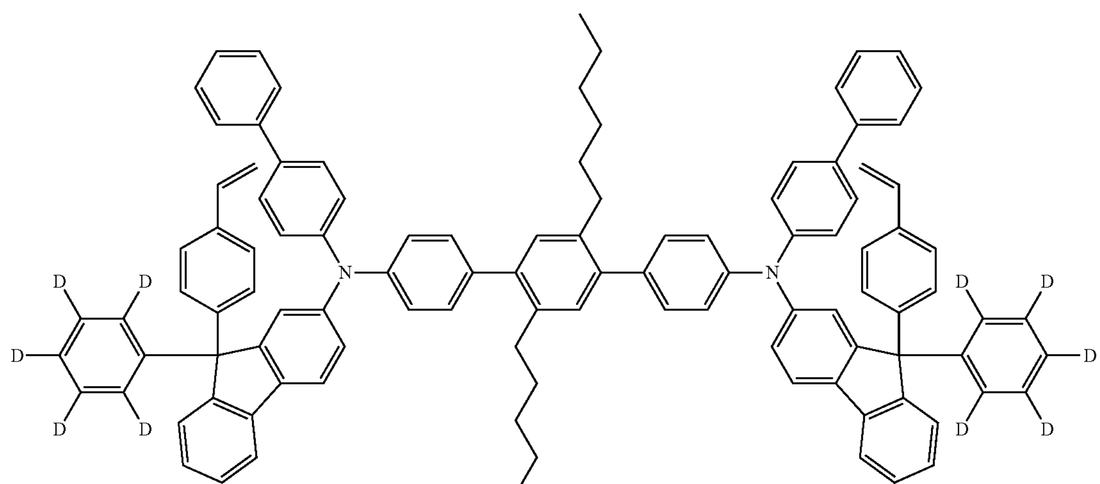
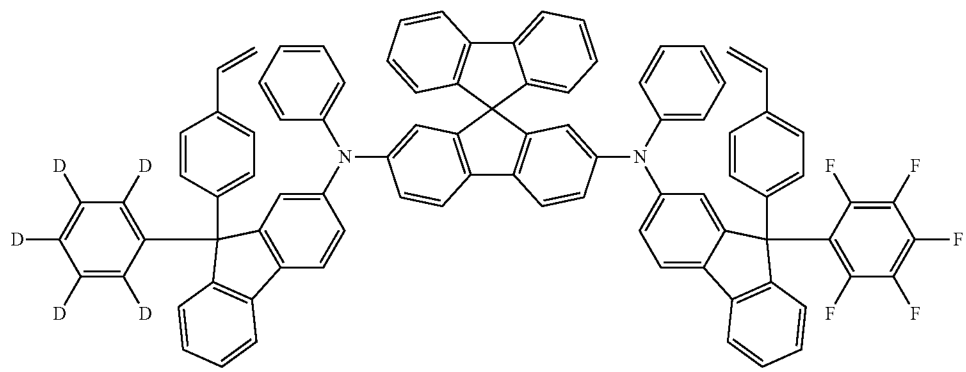
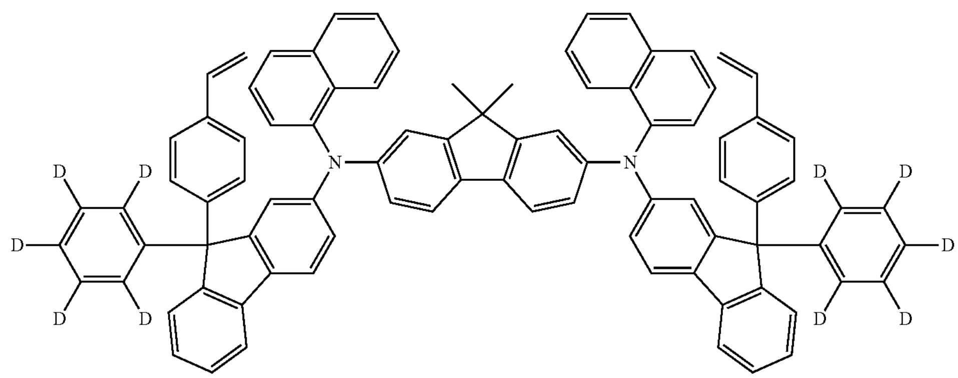

-continued
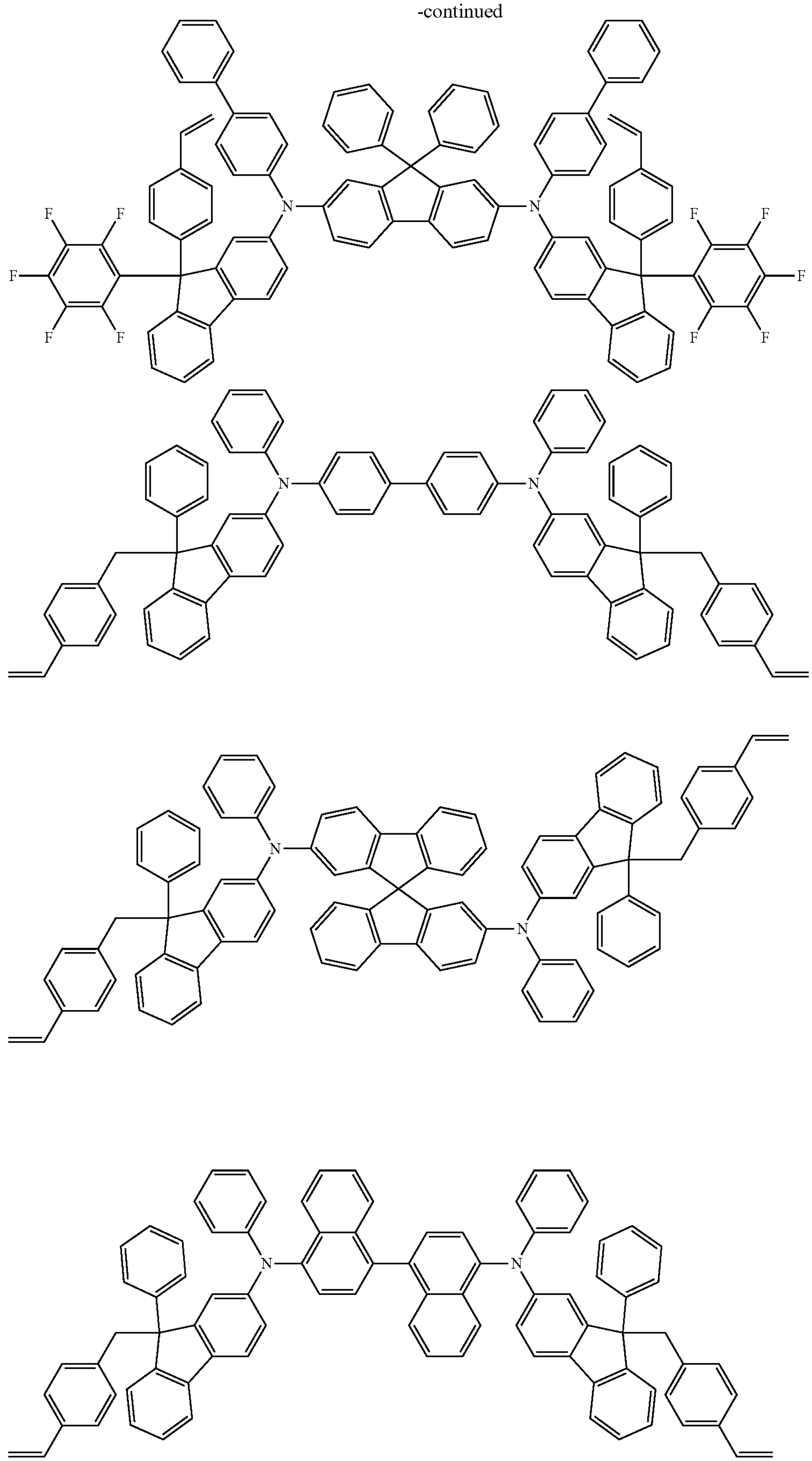

-continued
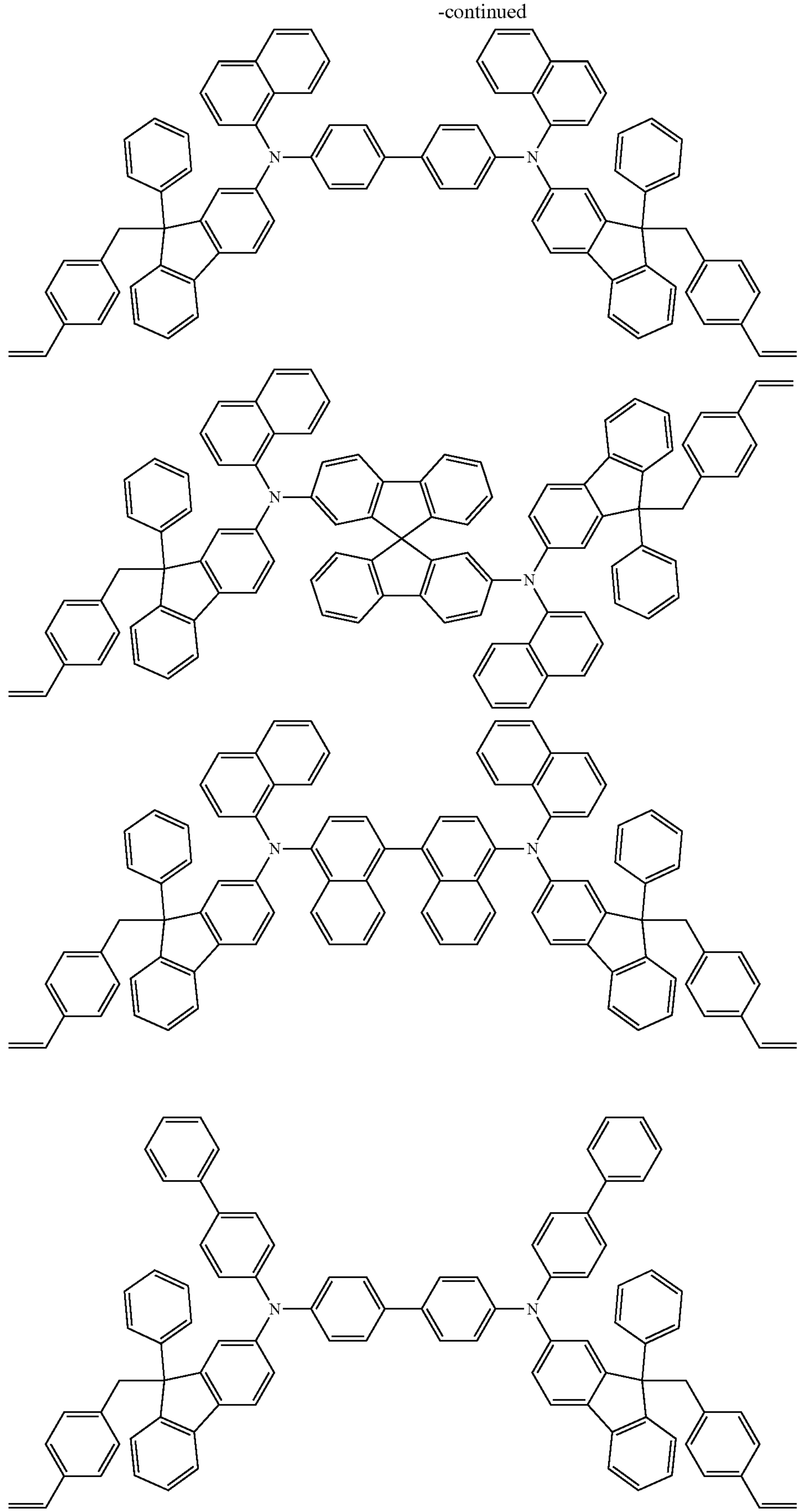

-continued
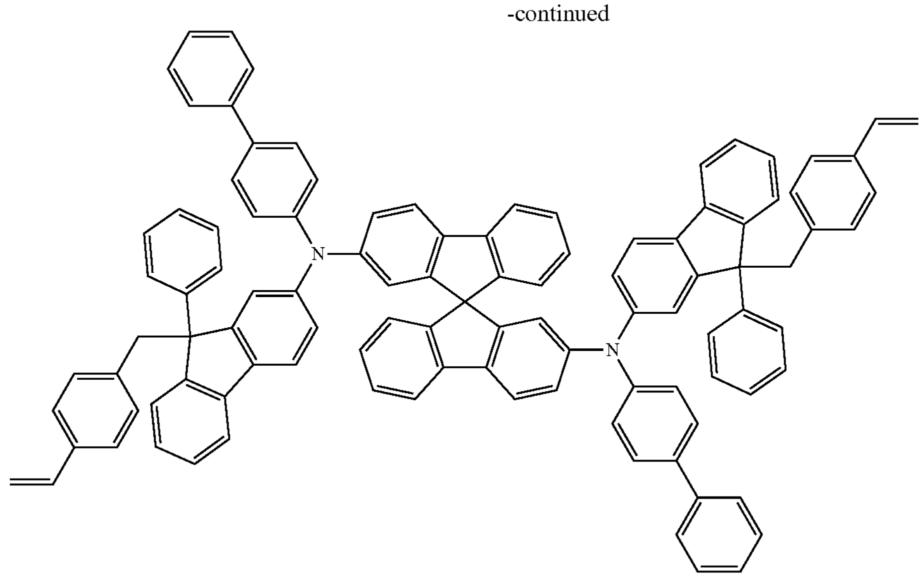
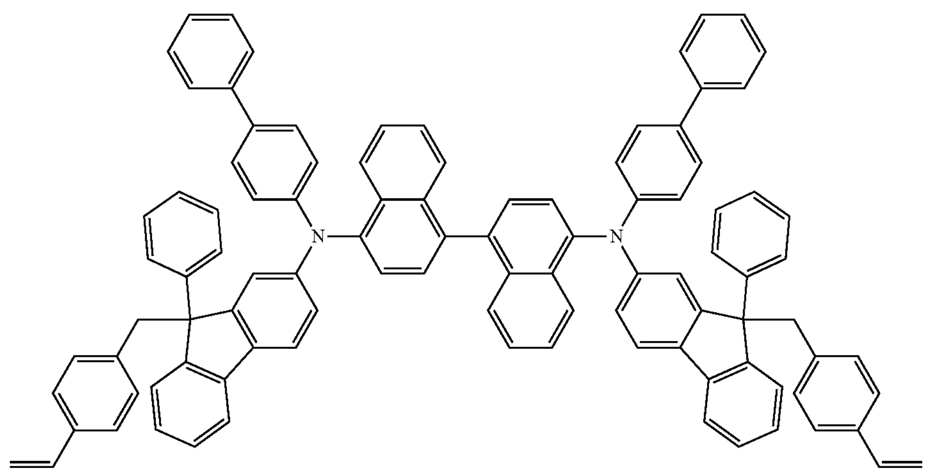
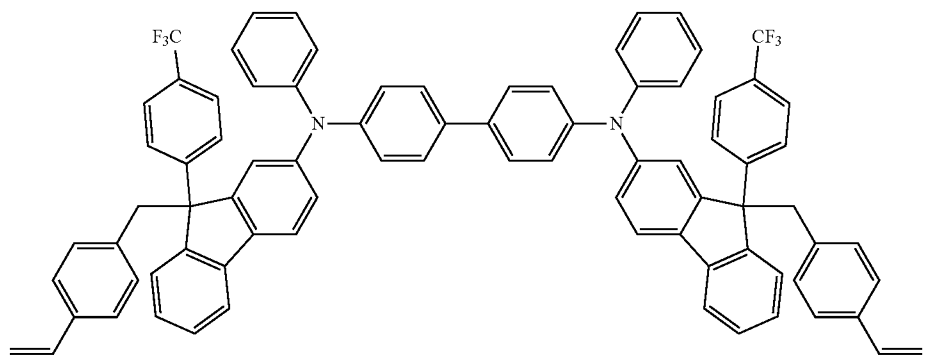

-continued
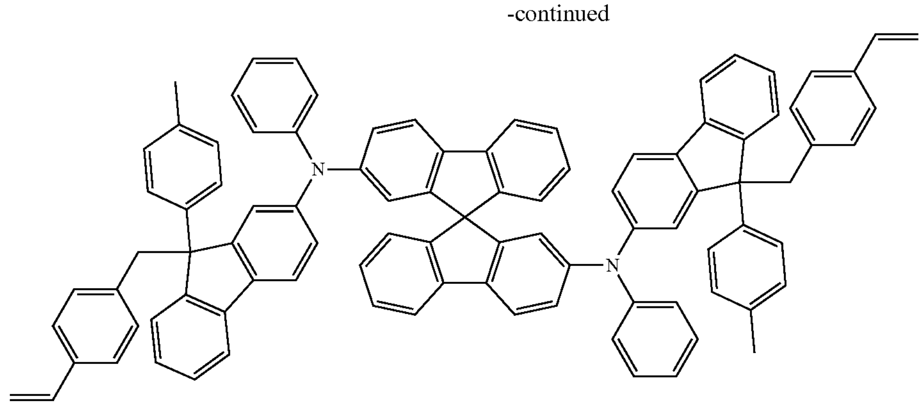
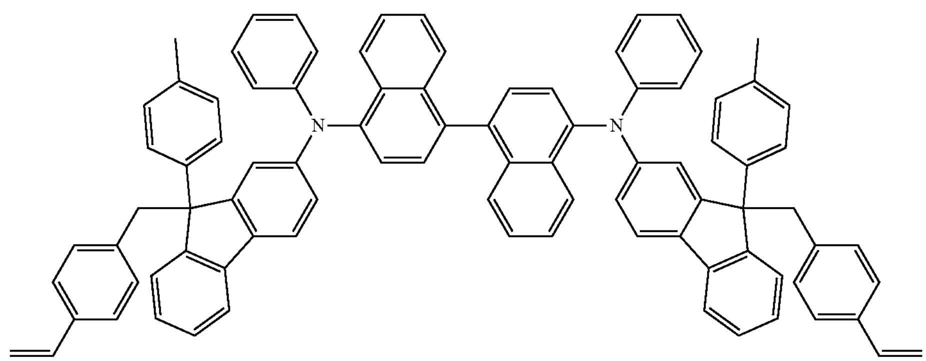
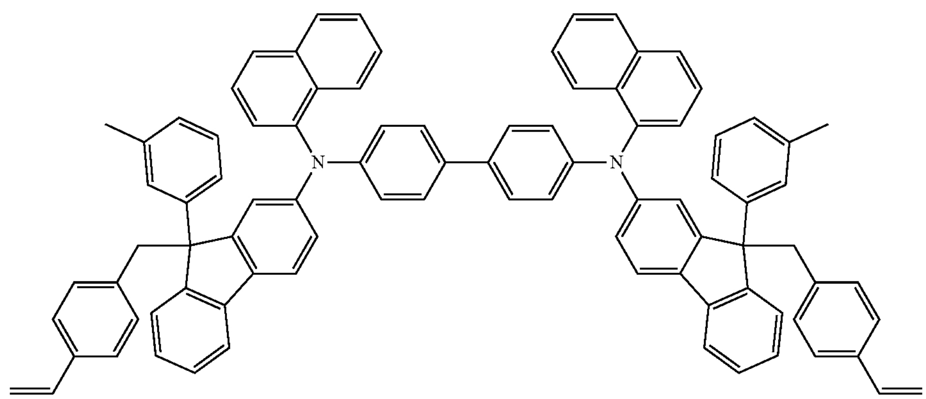
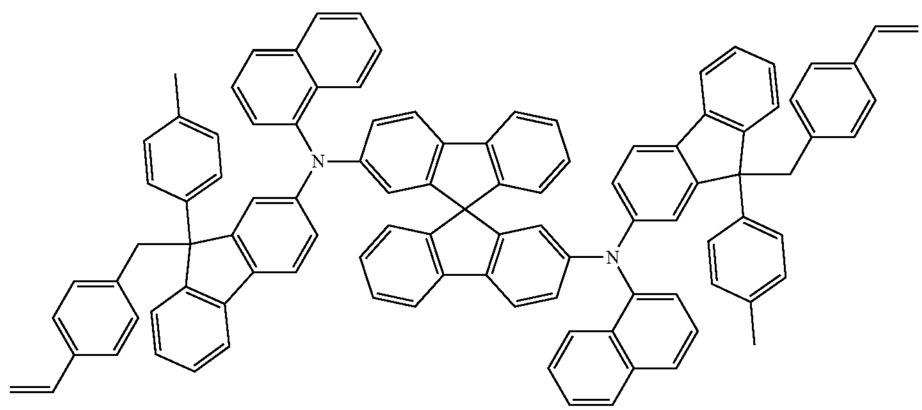

-continued
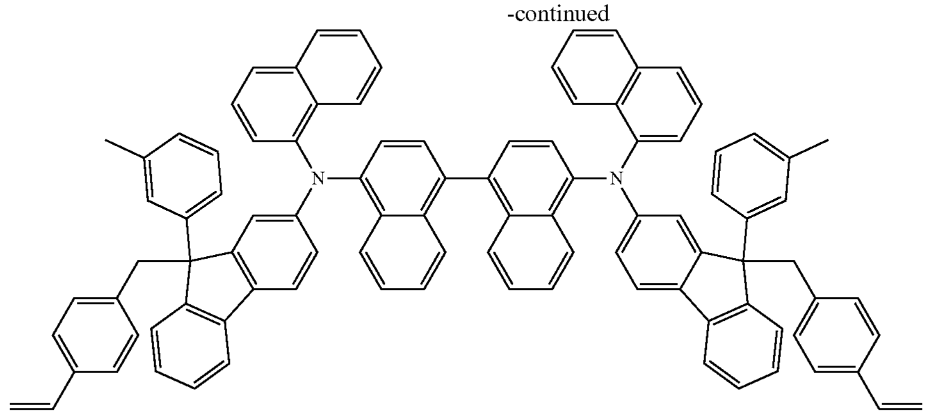
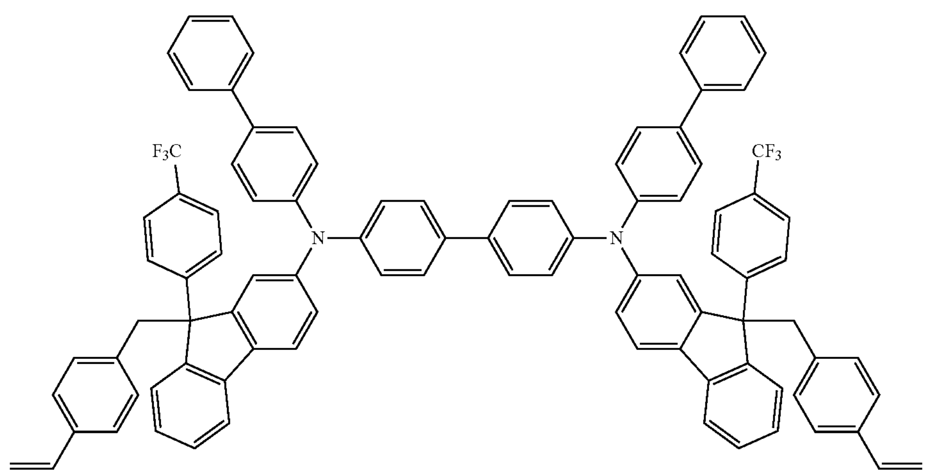
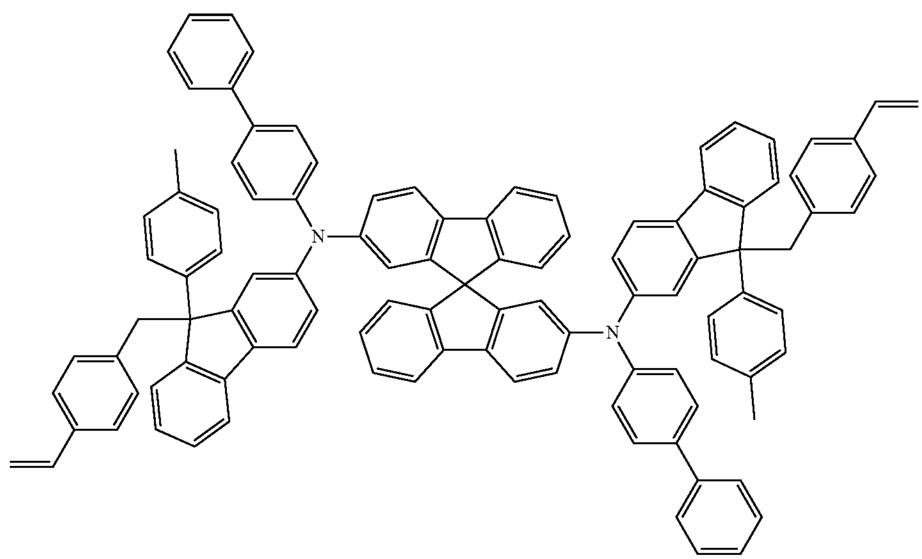

-continued
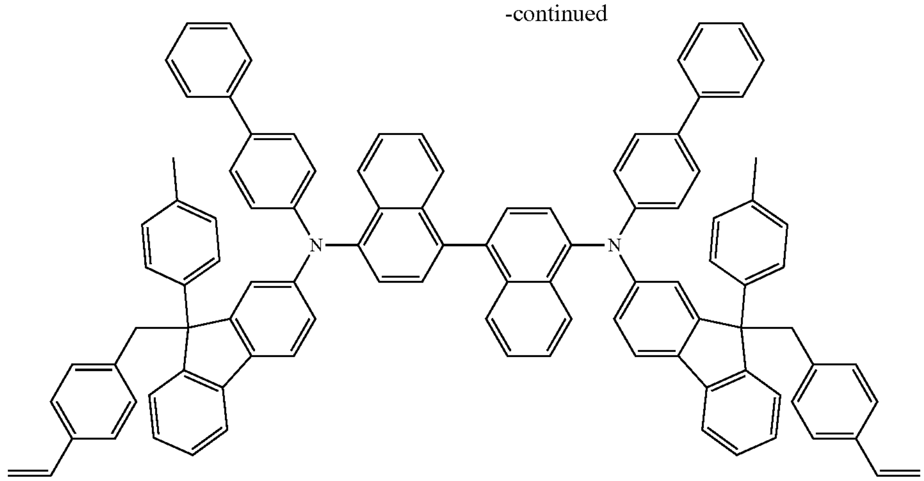
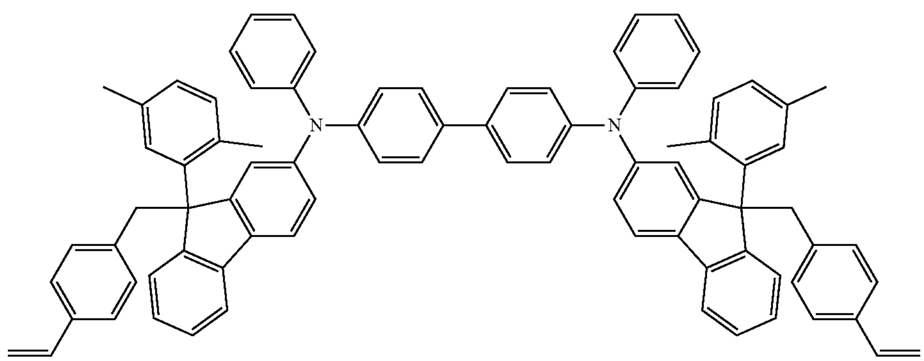
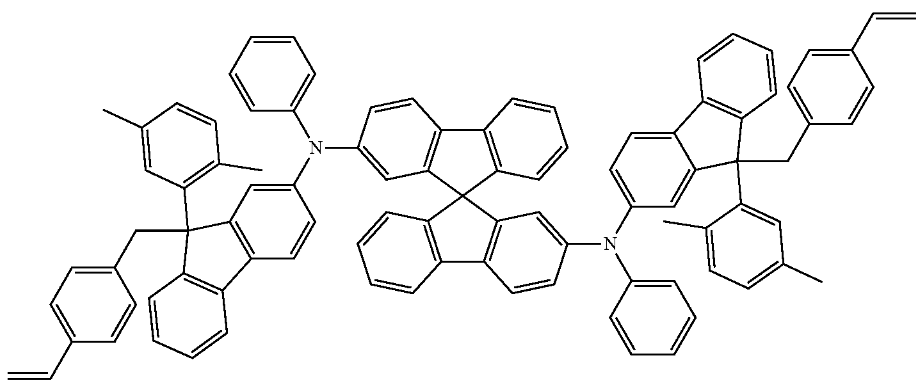
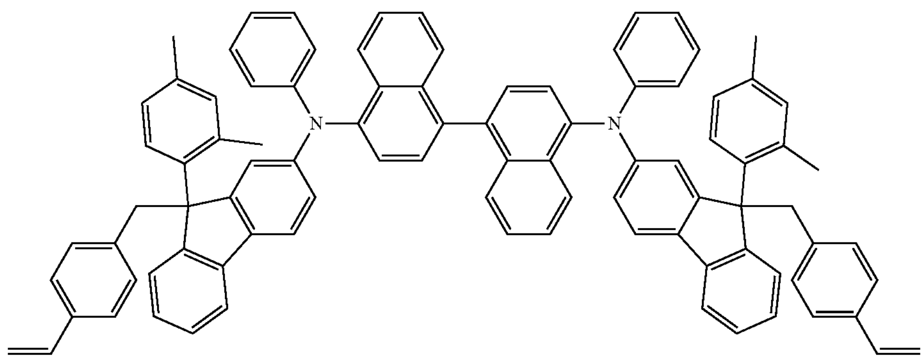

-continued
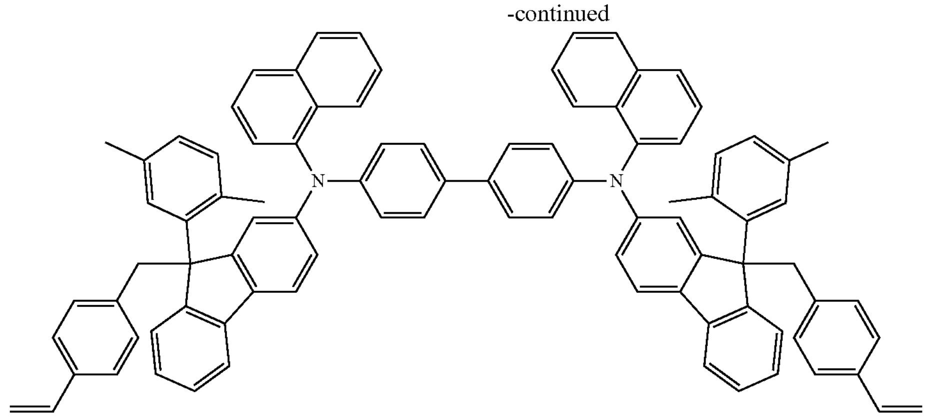
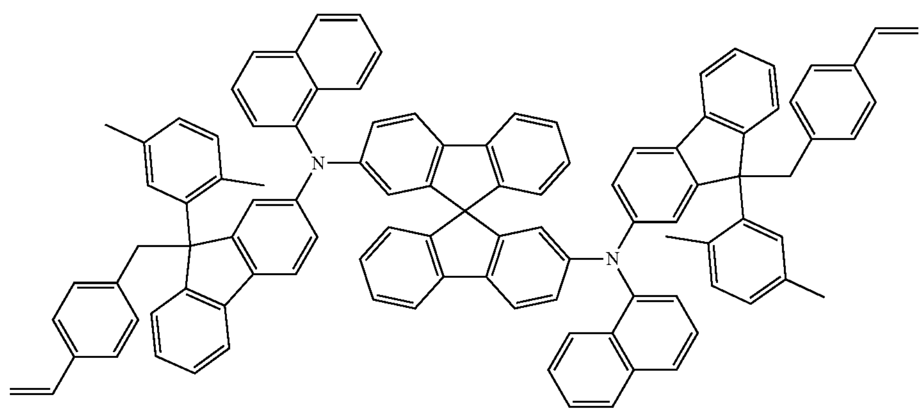
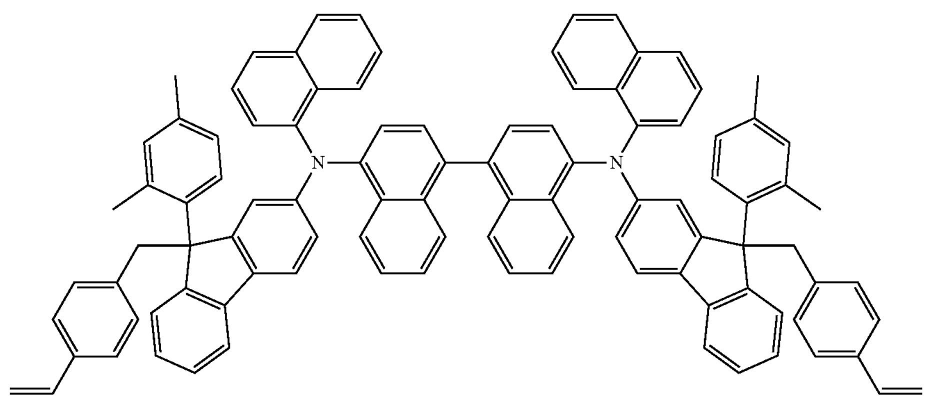
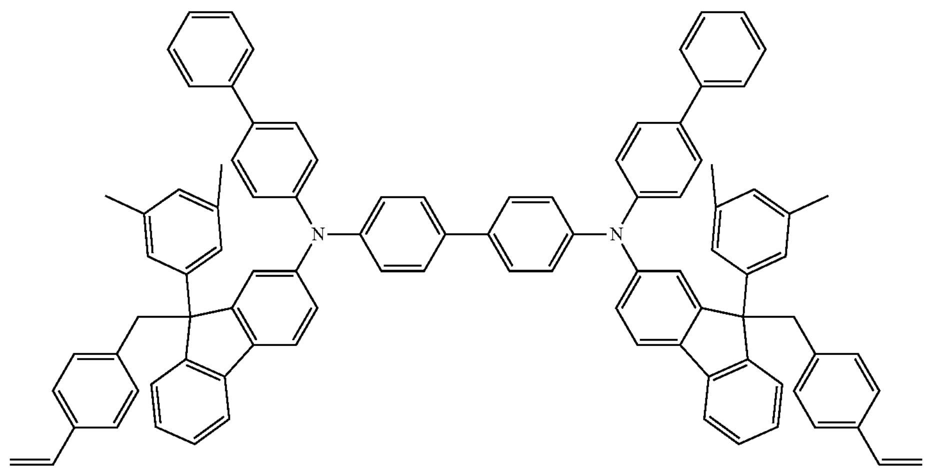

-continued
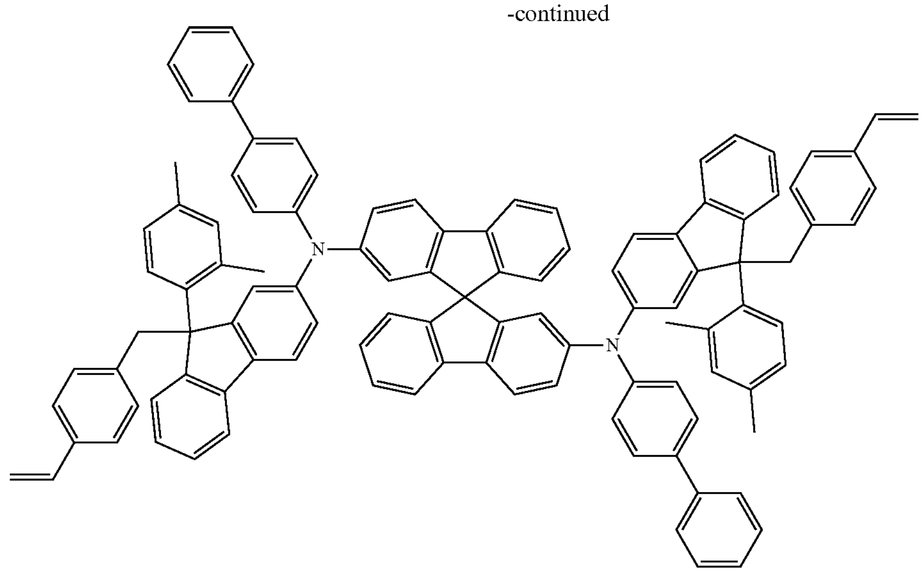
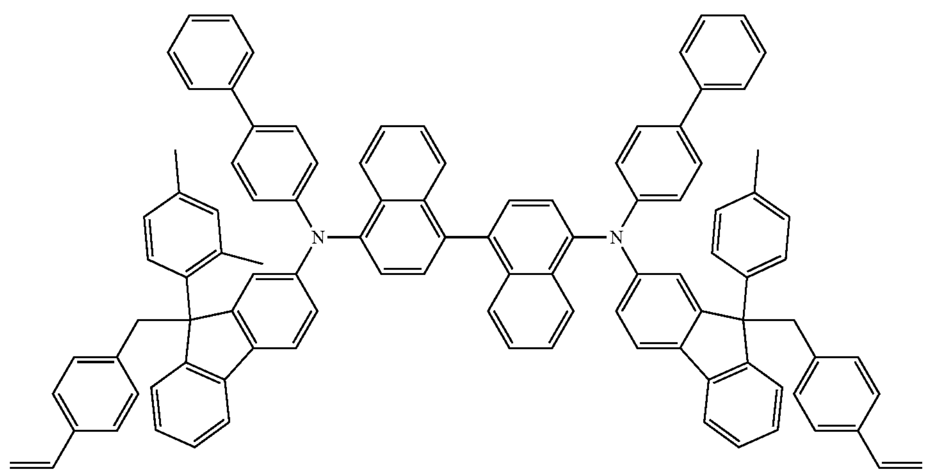
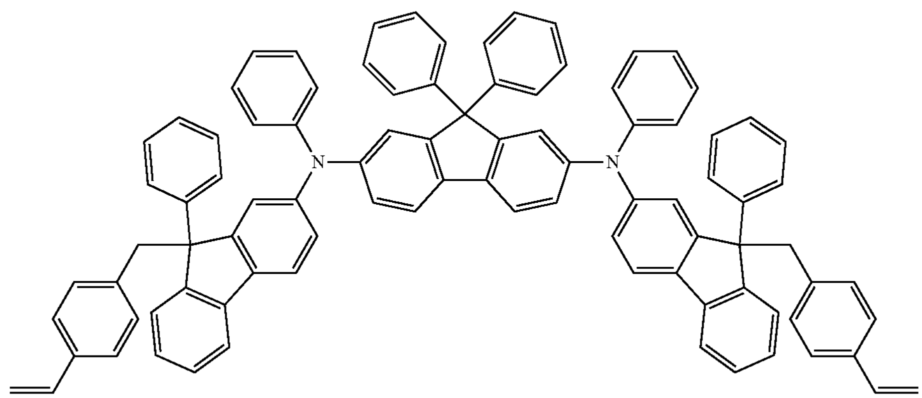

-continued
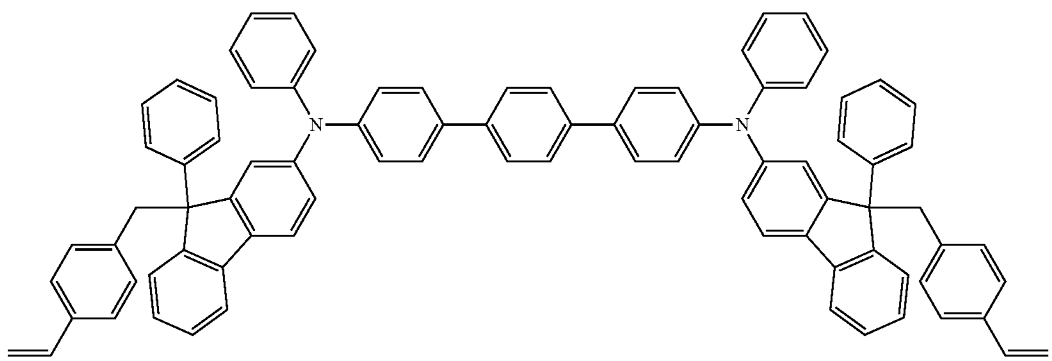
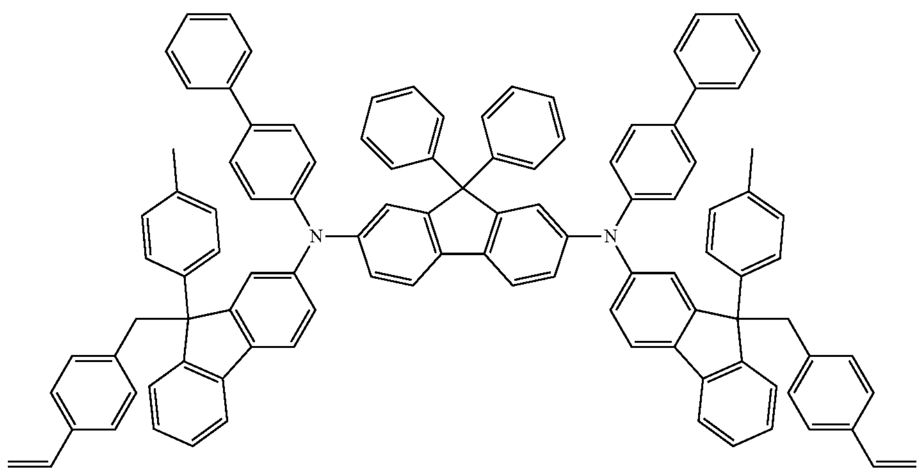
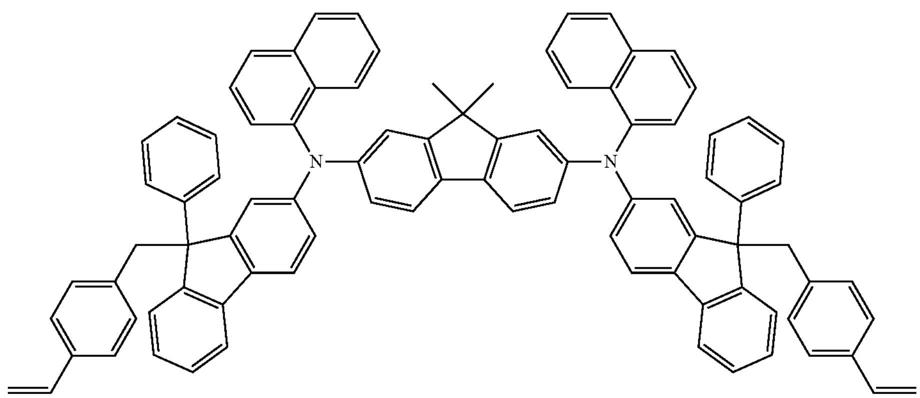
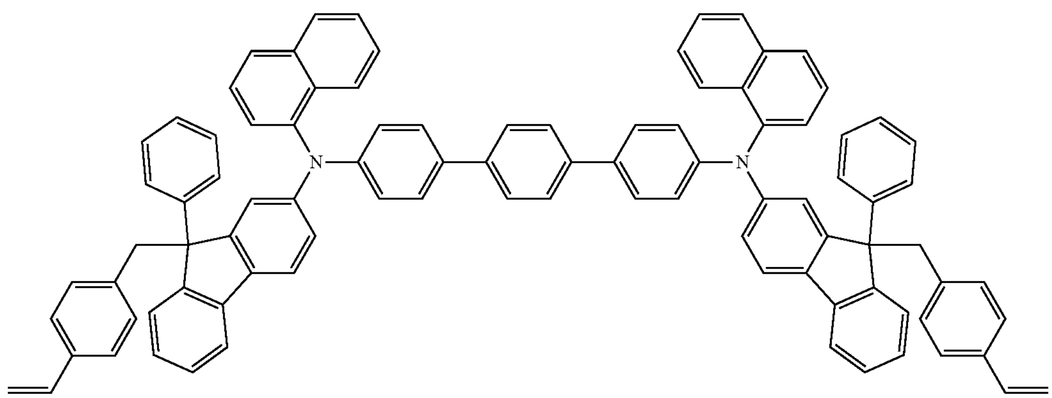

-continued
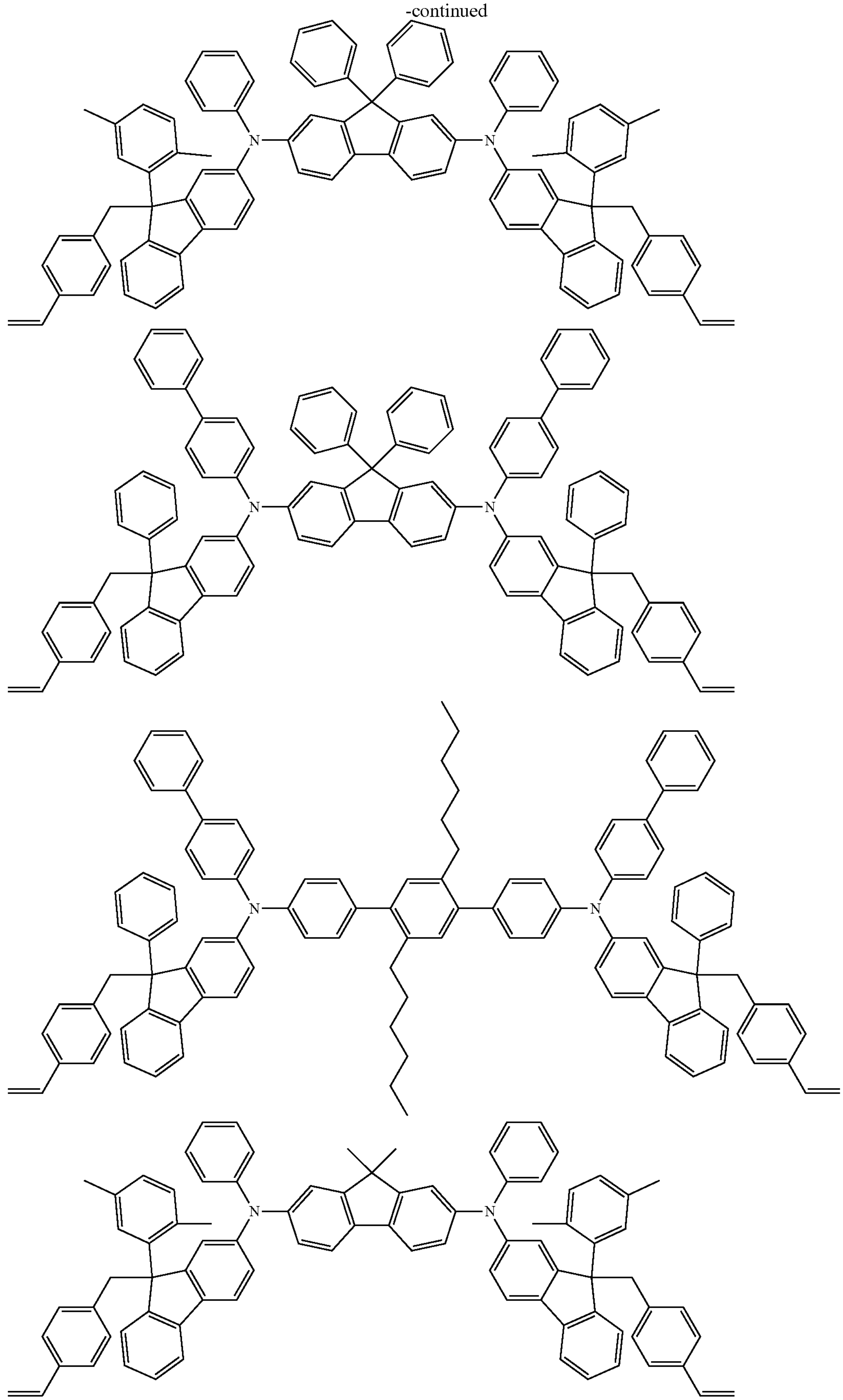

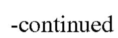
-continued
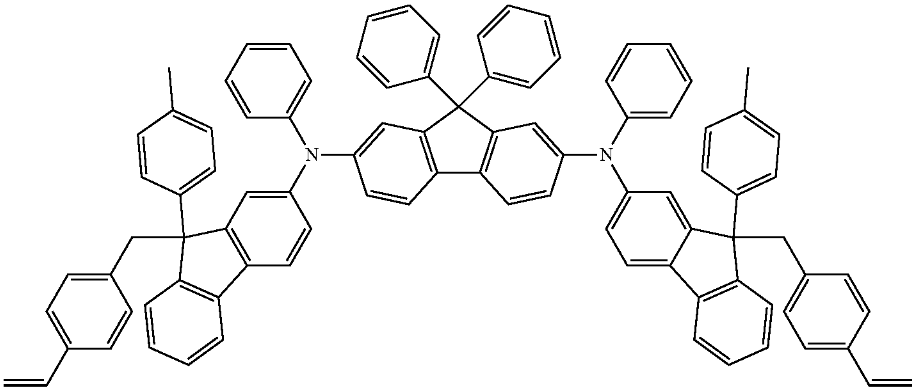
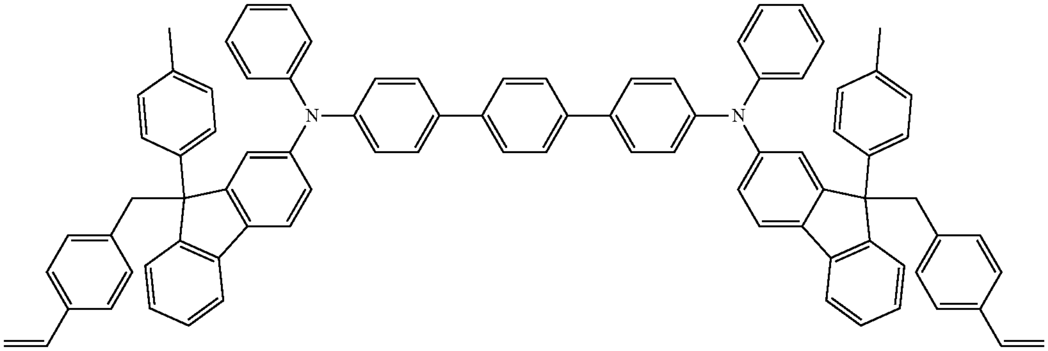
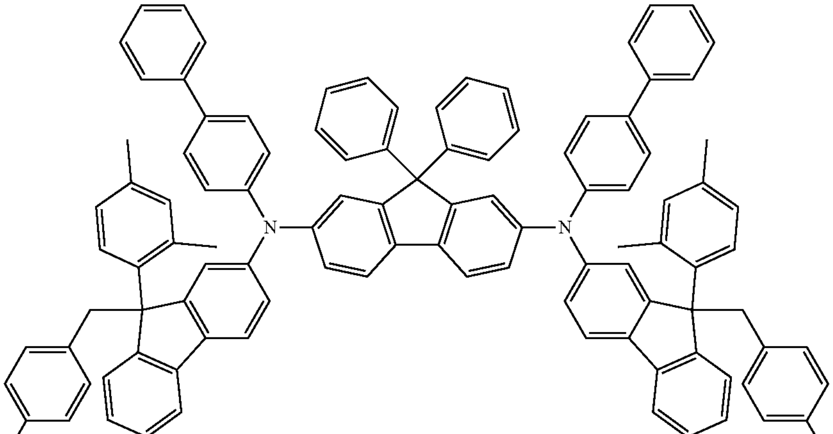
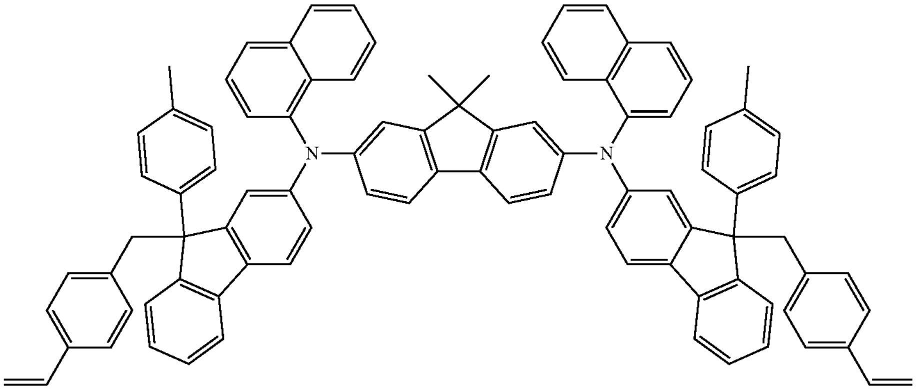

-continued
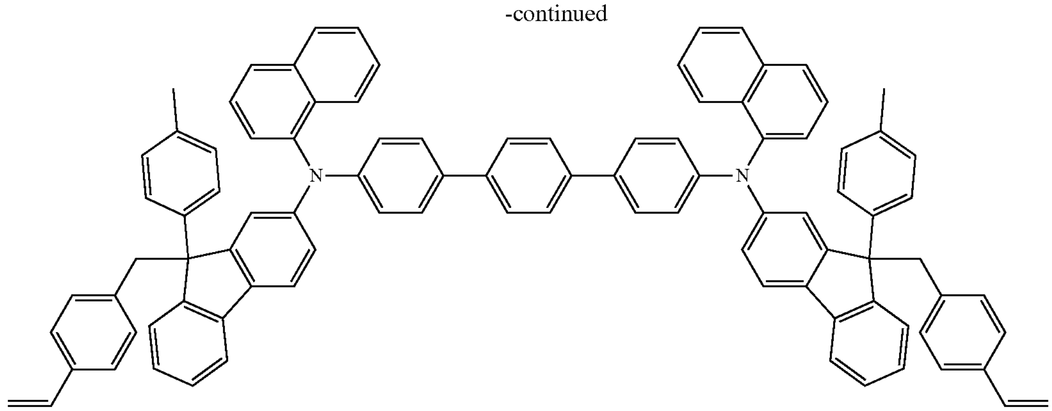
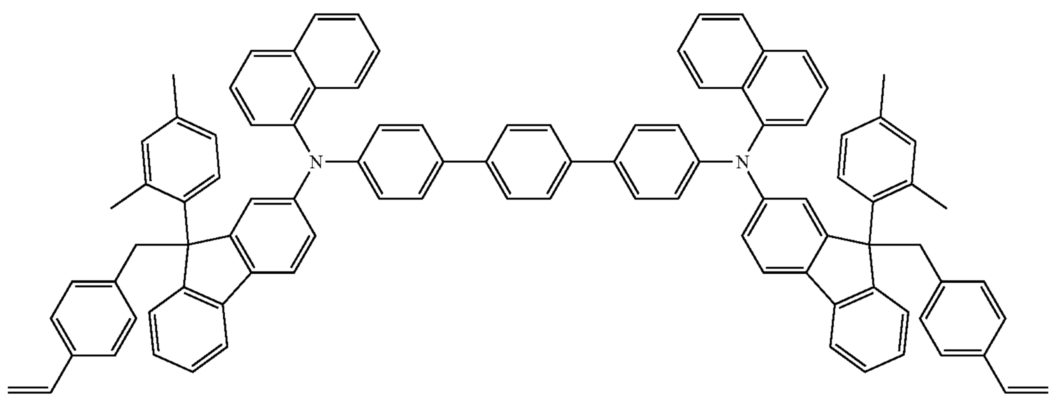
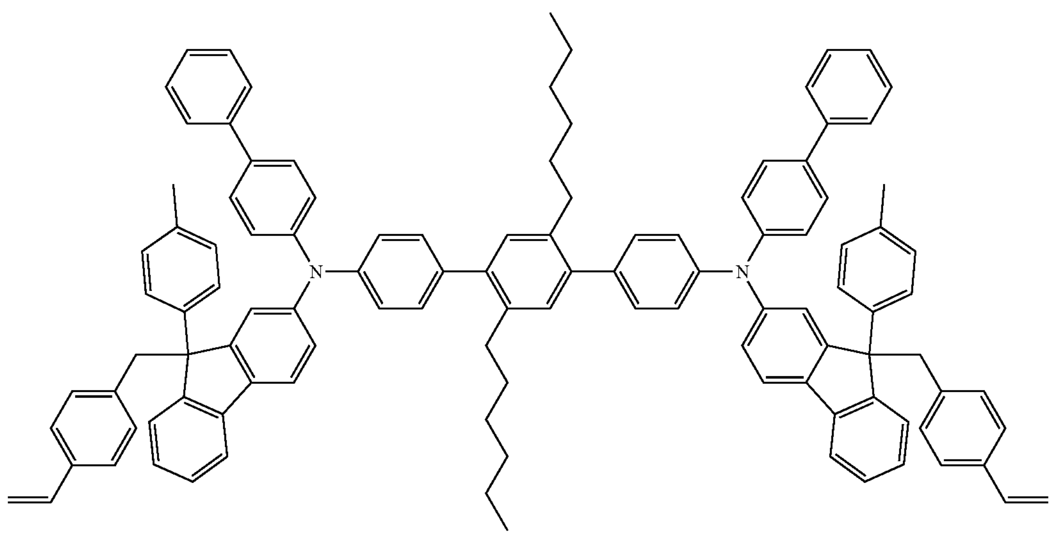
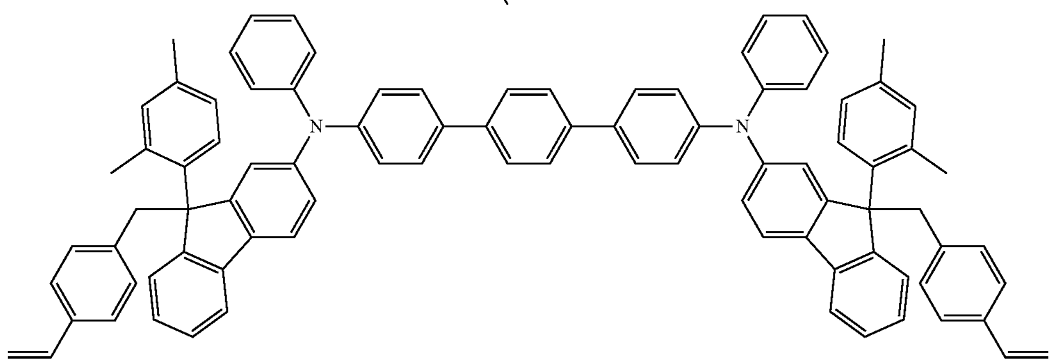

-continued
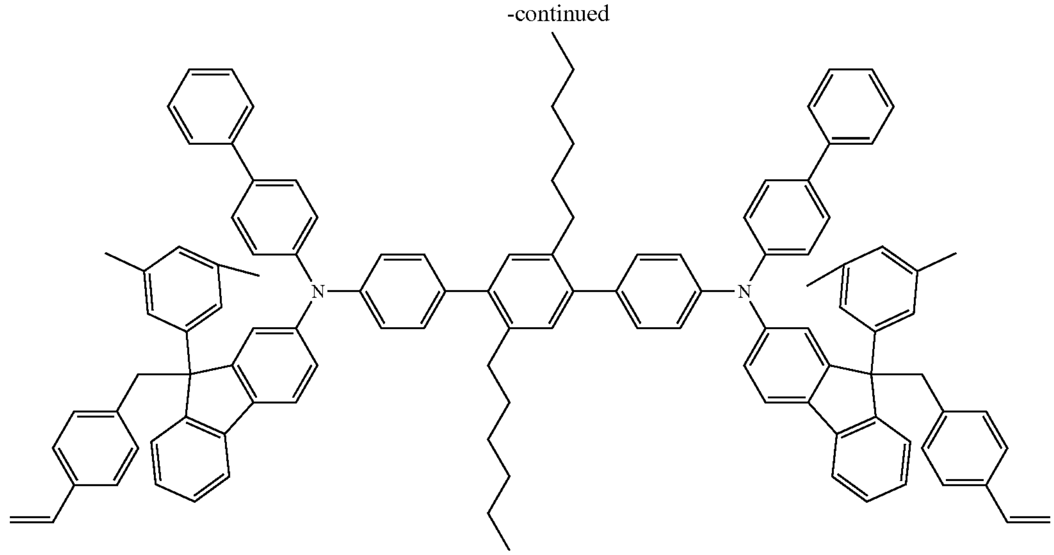
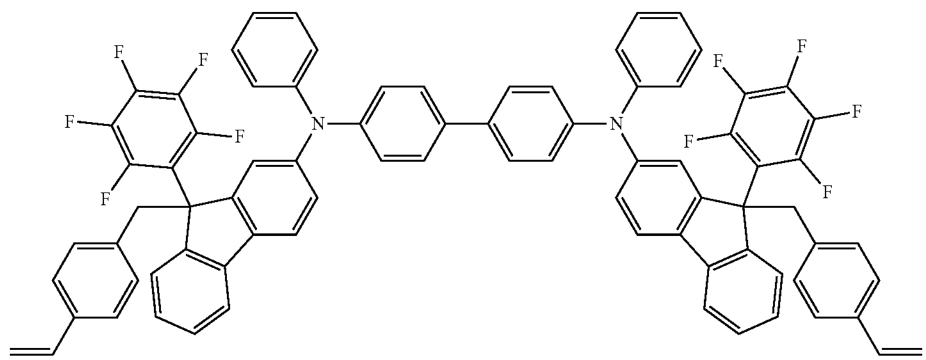
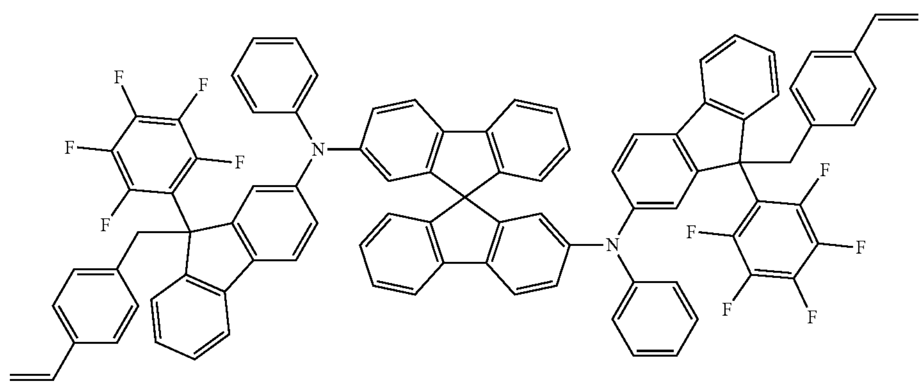
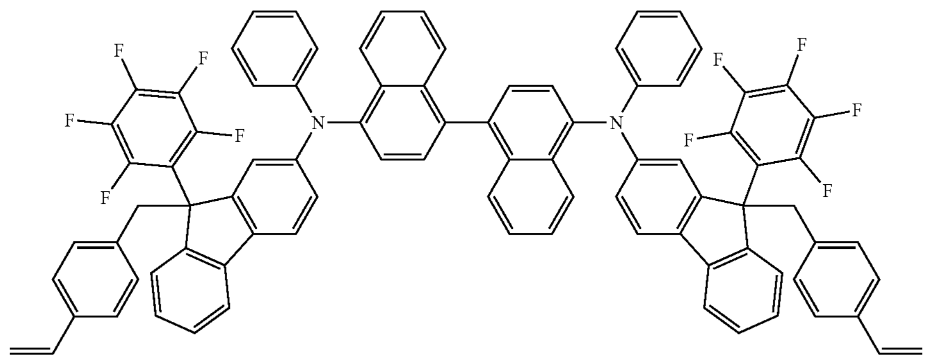

-continued
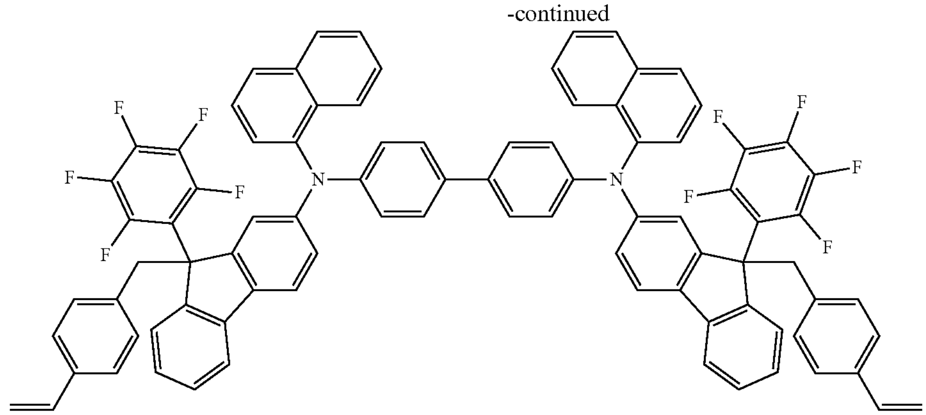
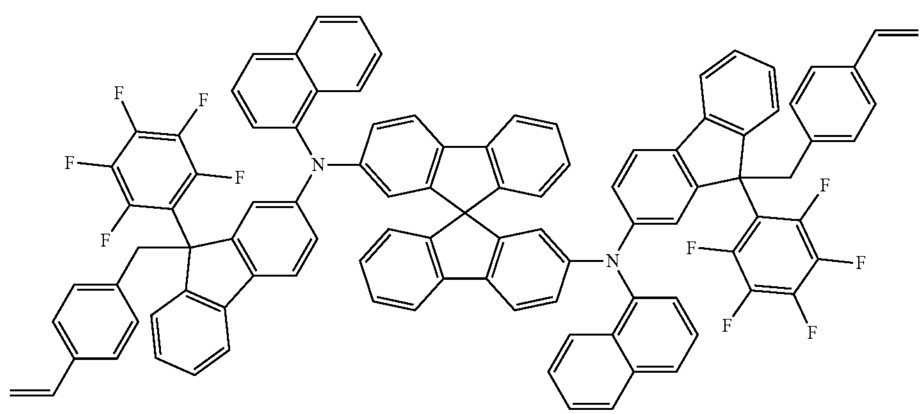
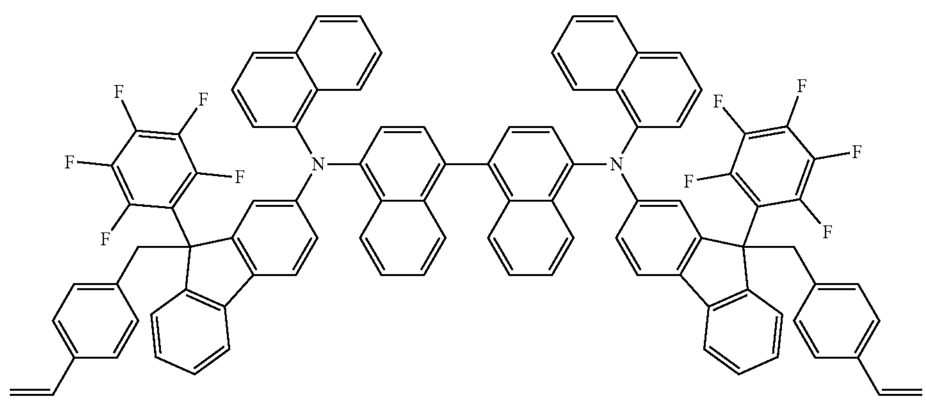
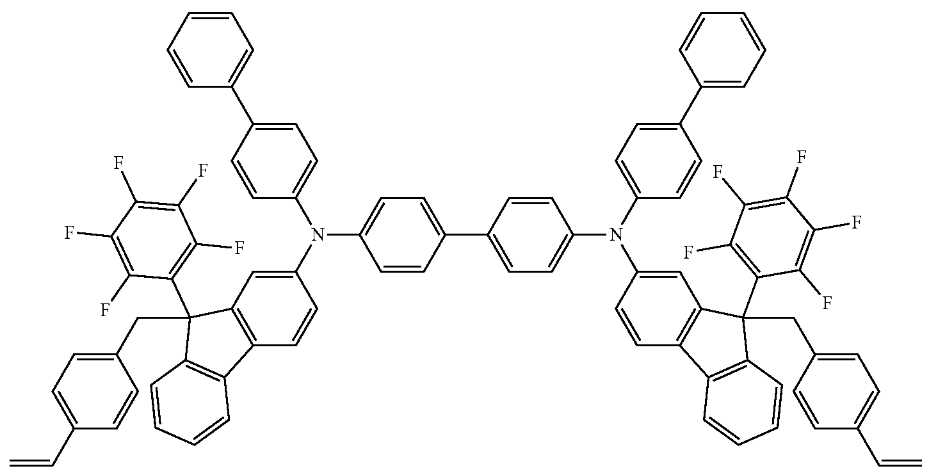

-continued
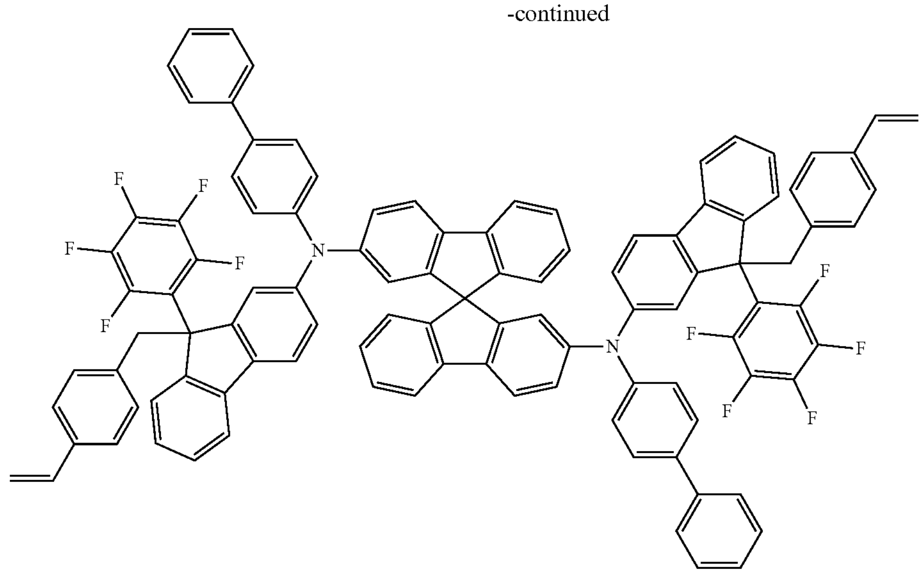
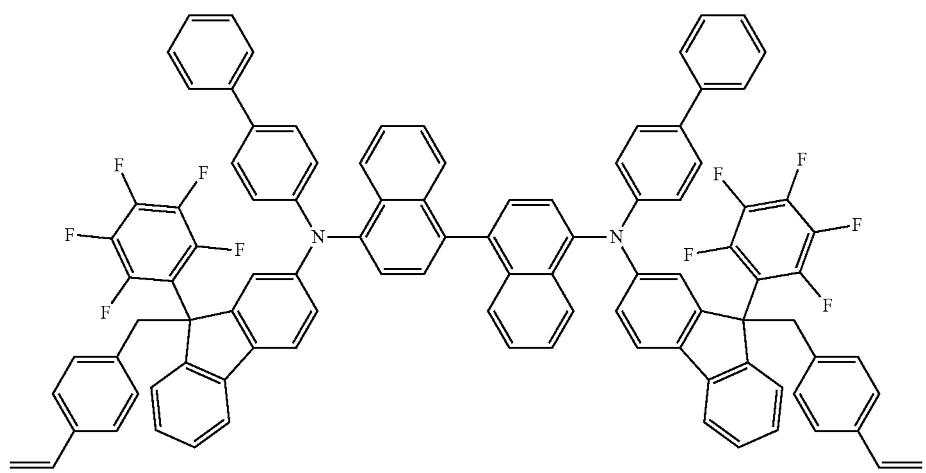
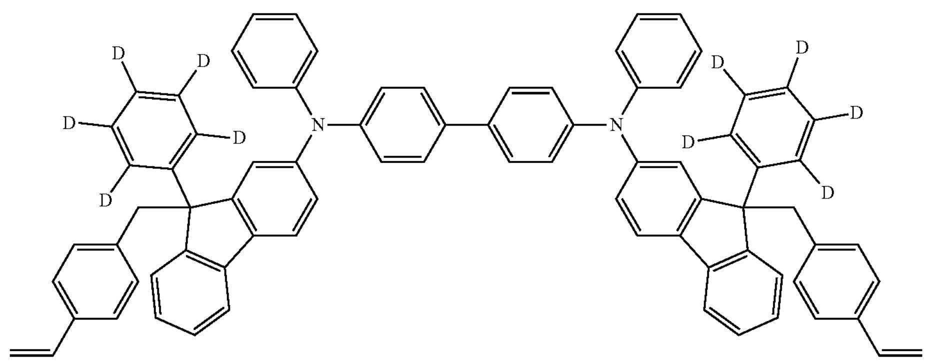

-continued
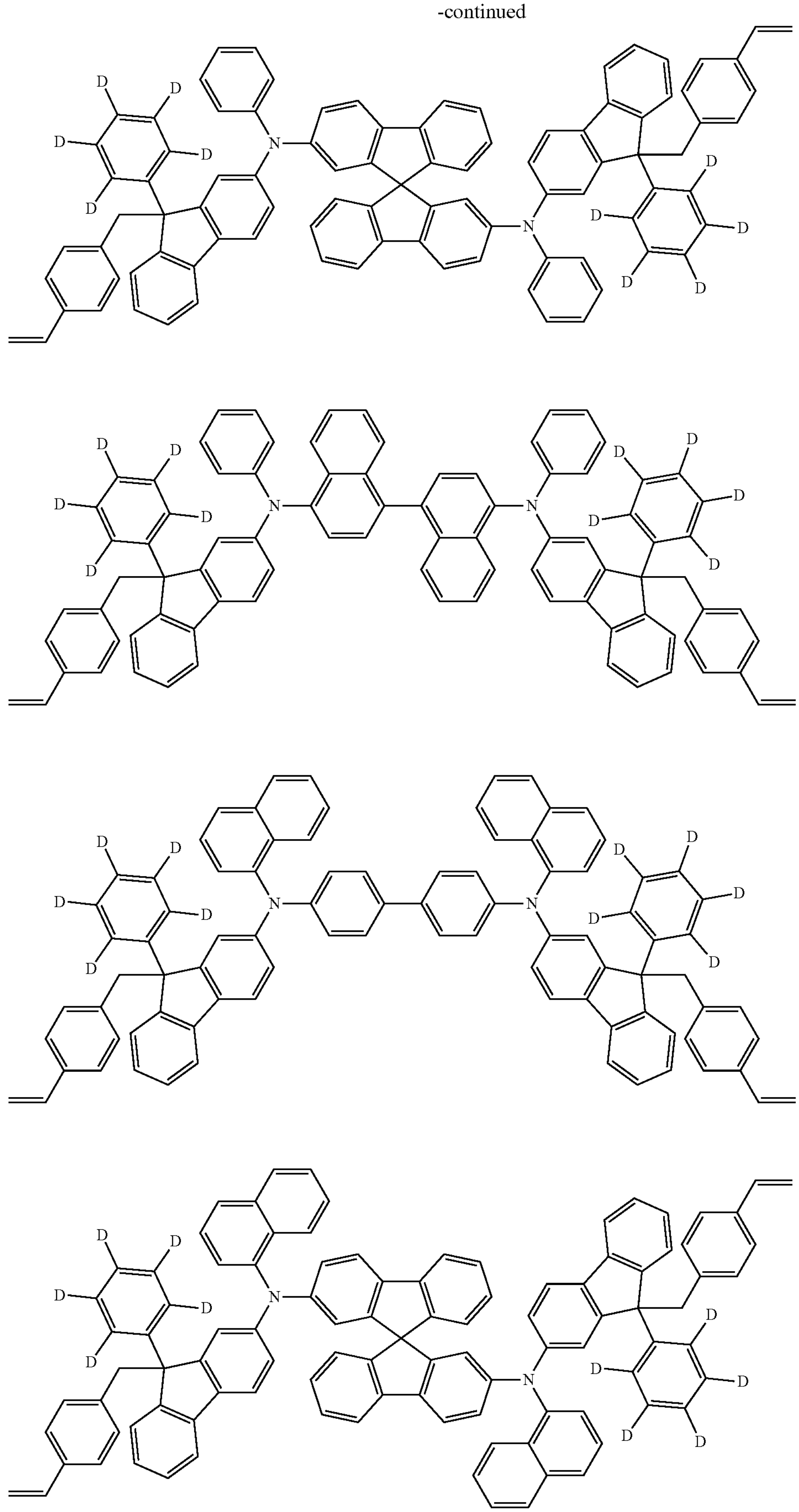

-continued
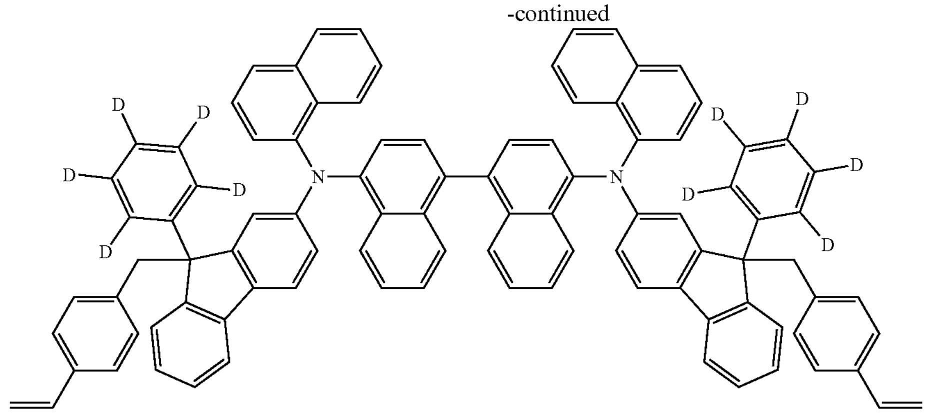
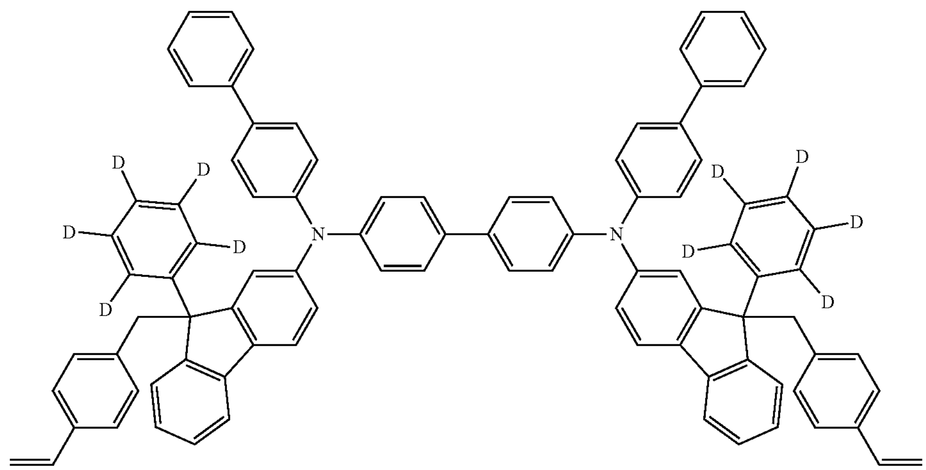
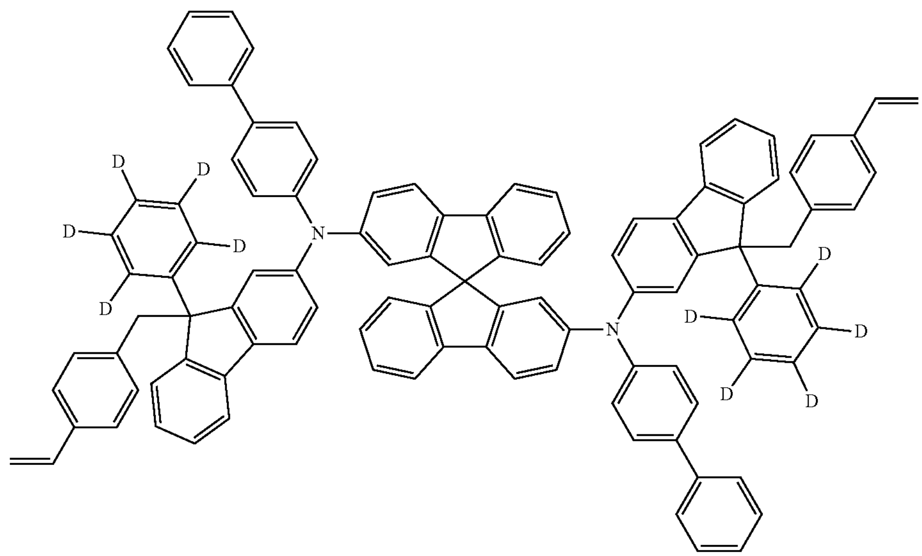

-continued
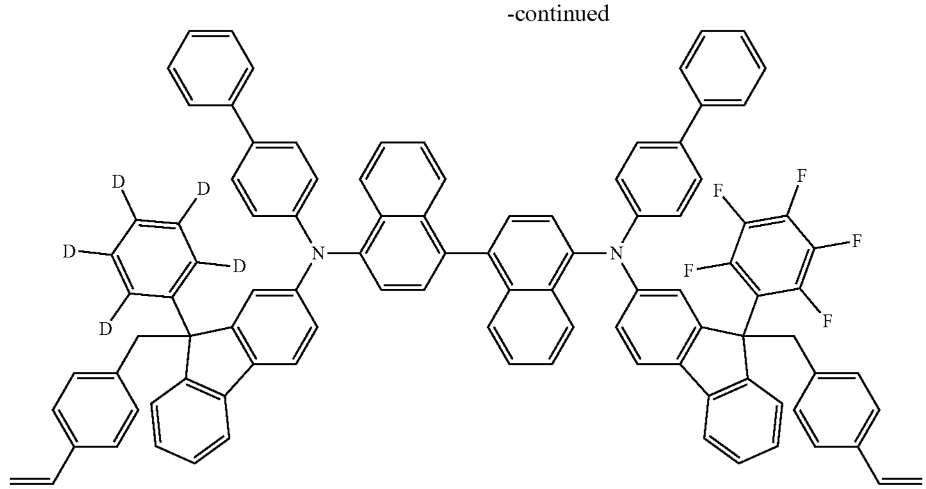
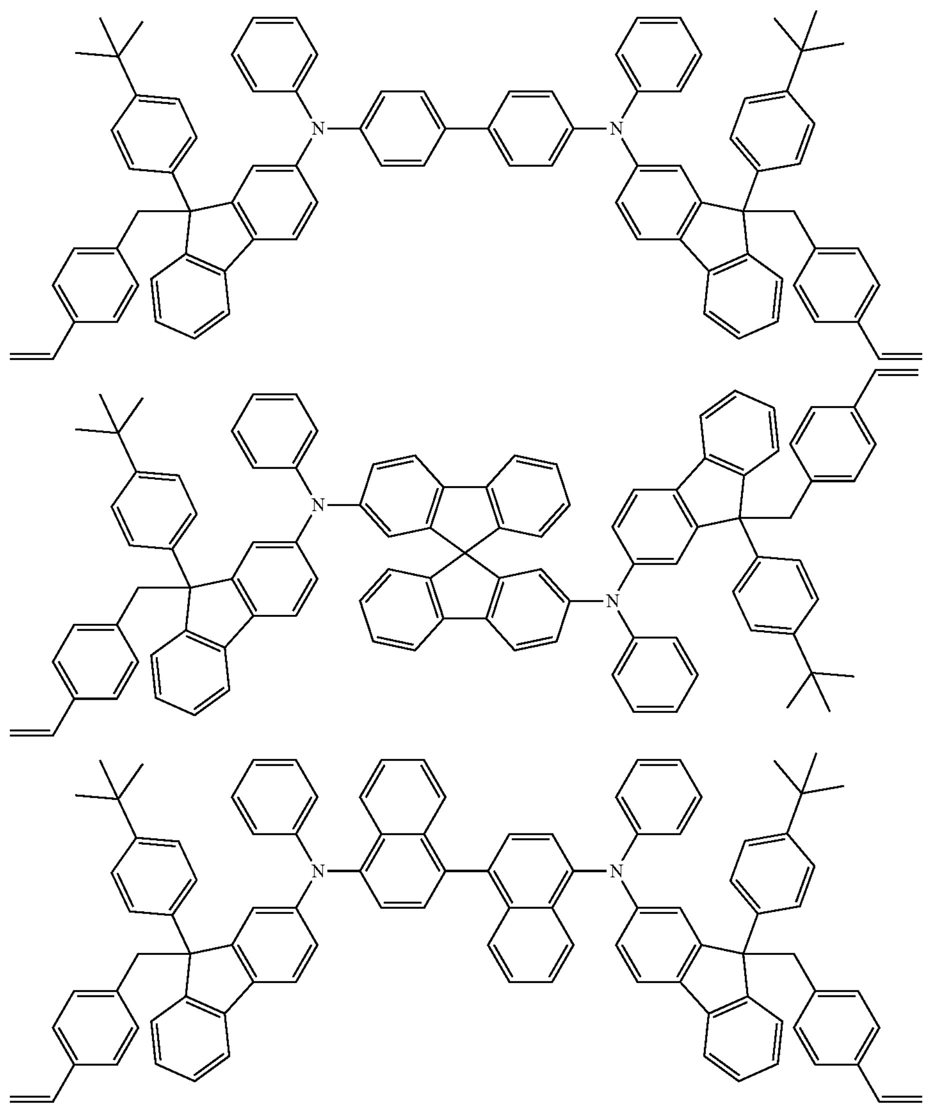

-continued
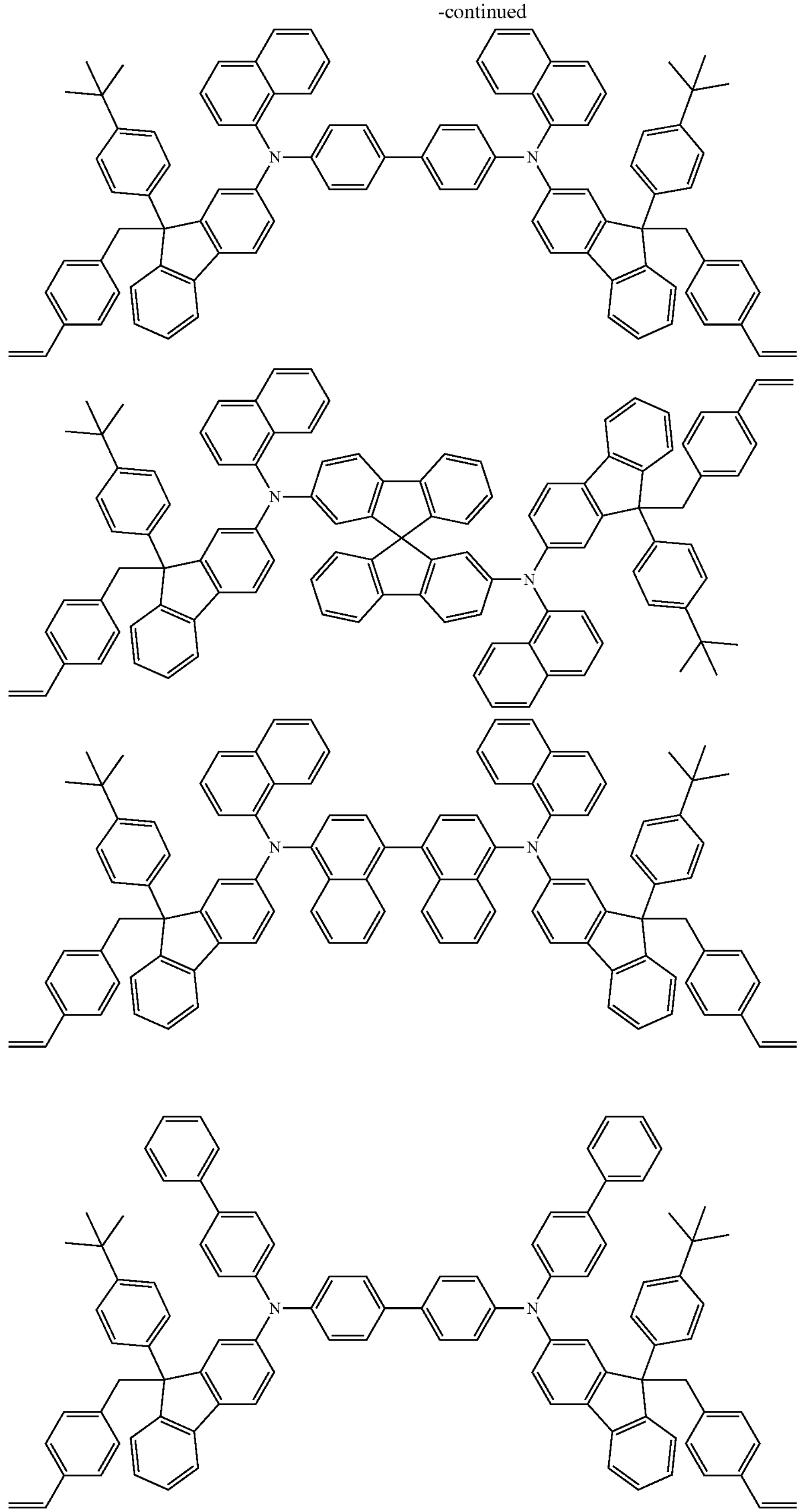

-continued
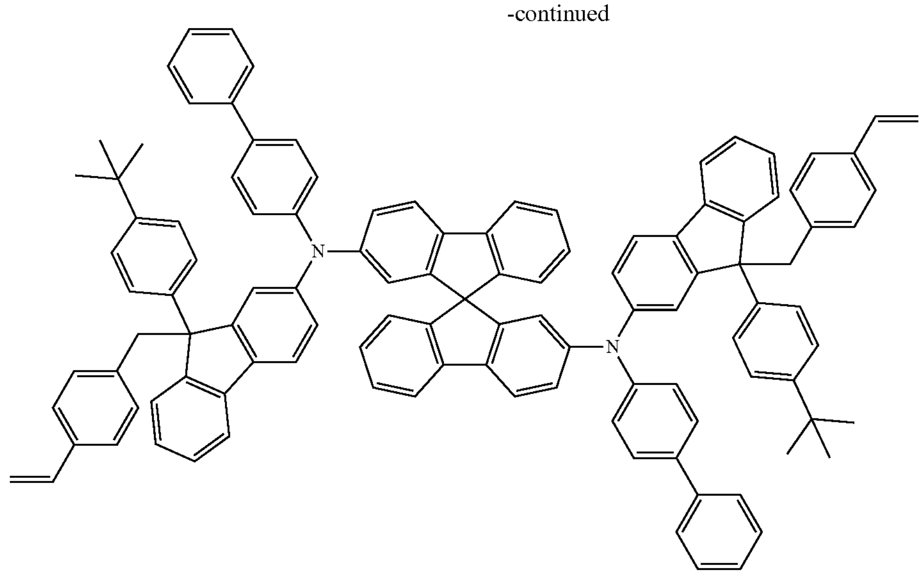
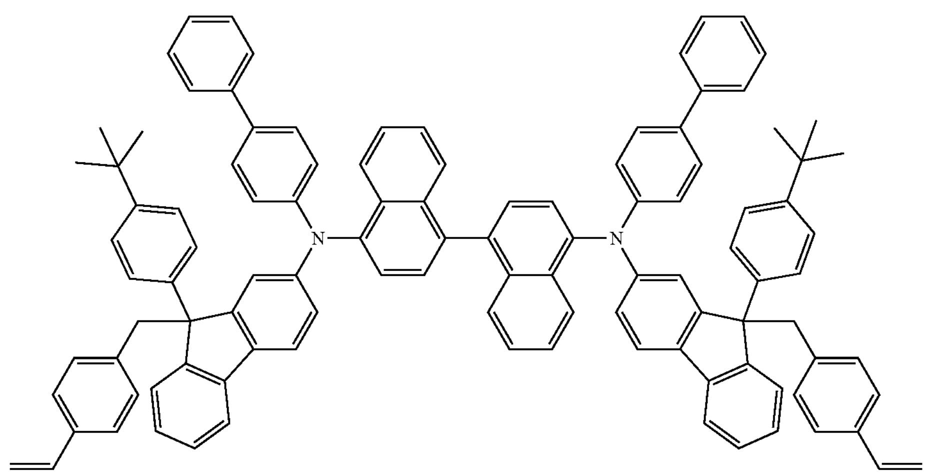
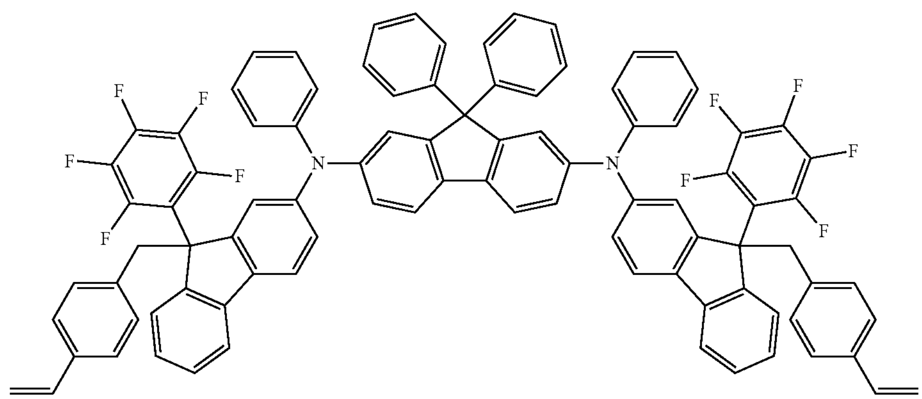

-continued
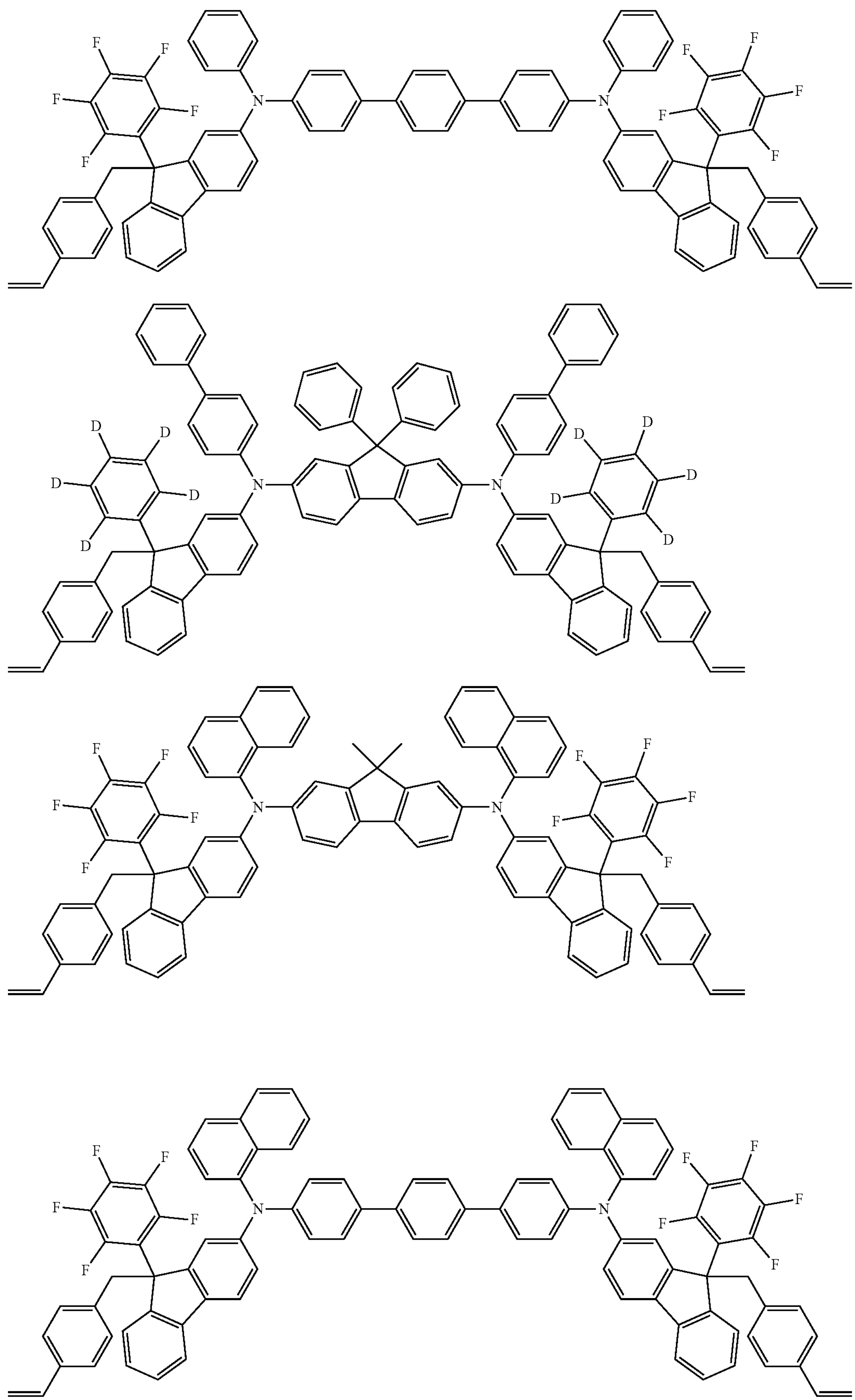

-continued
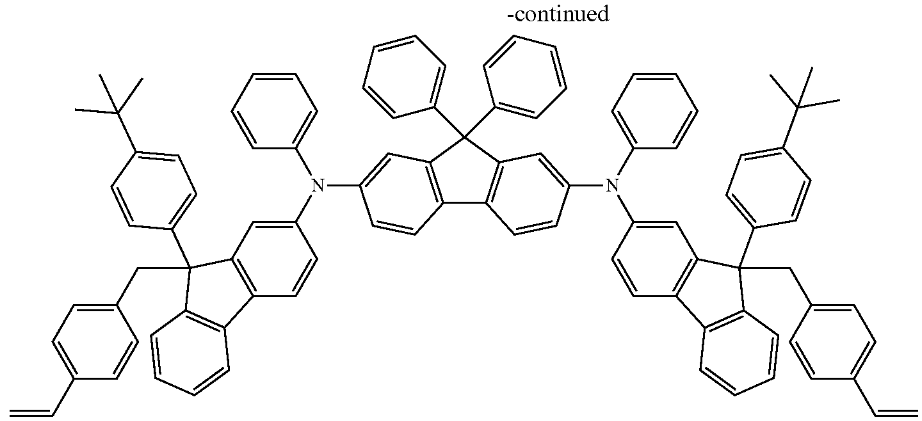
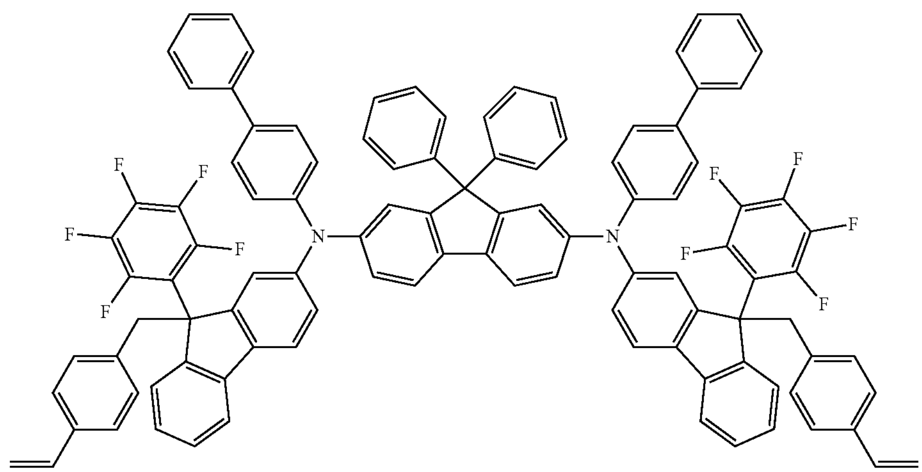
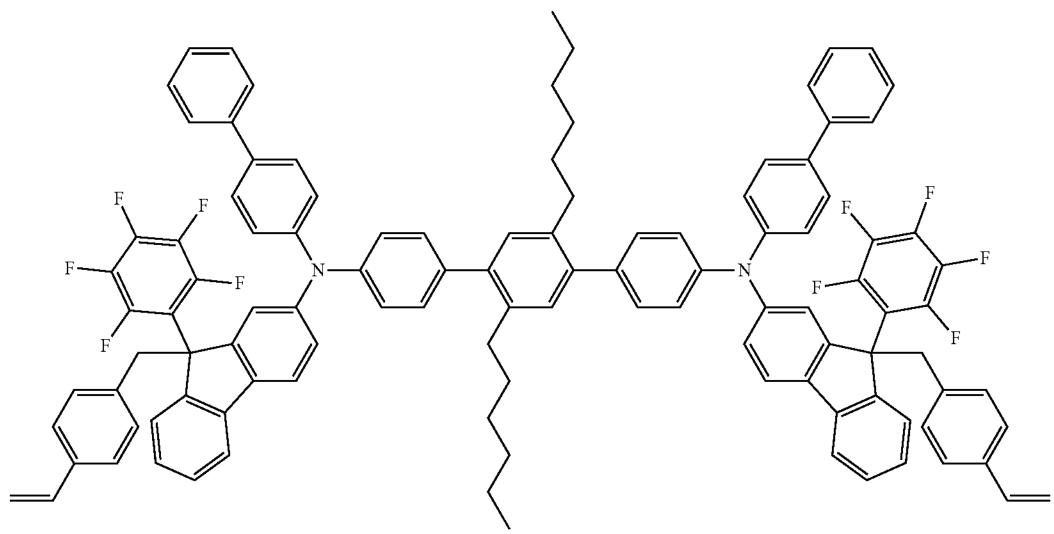

-continued
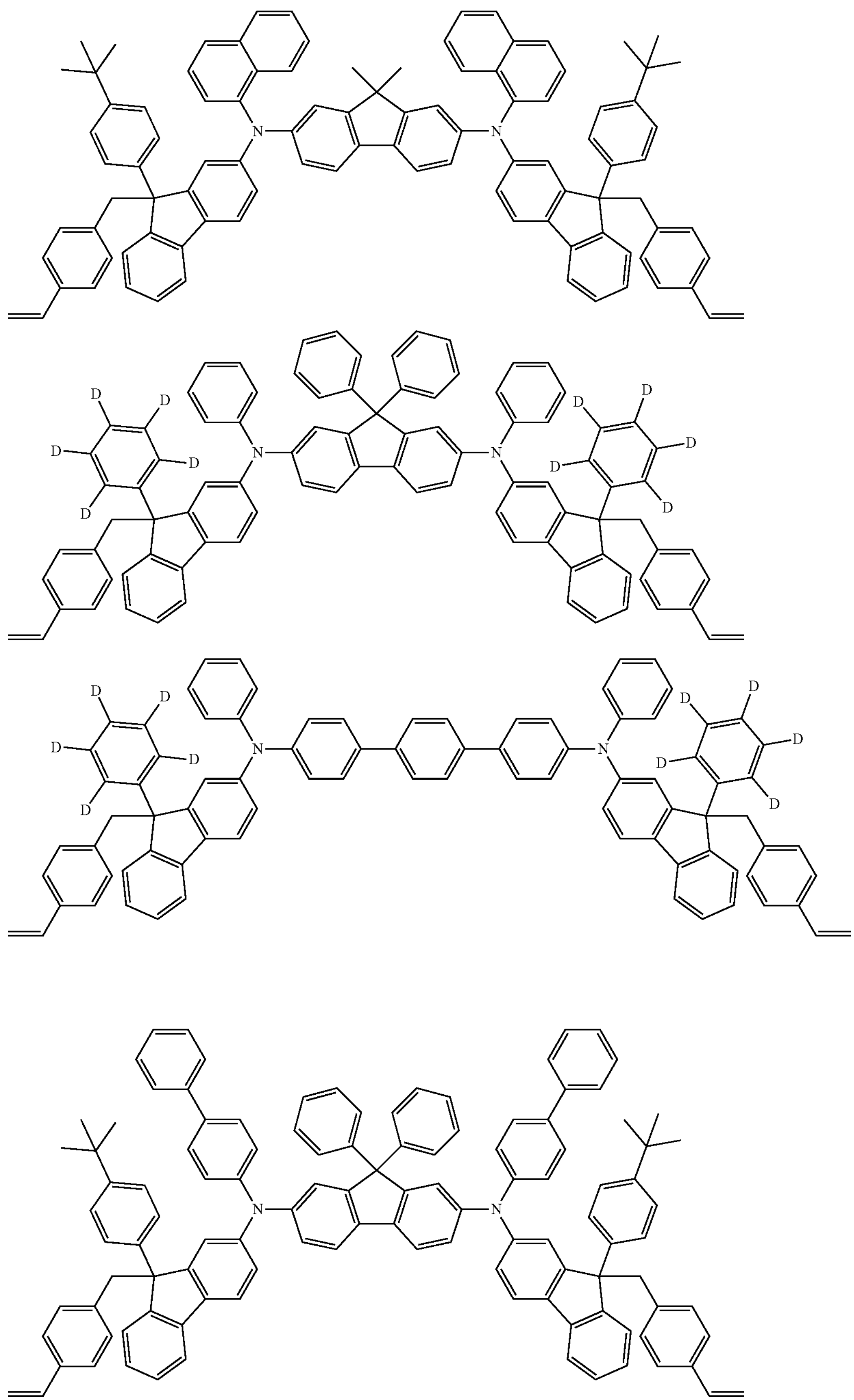

-continued
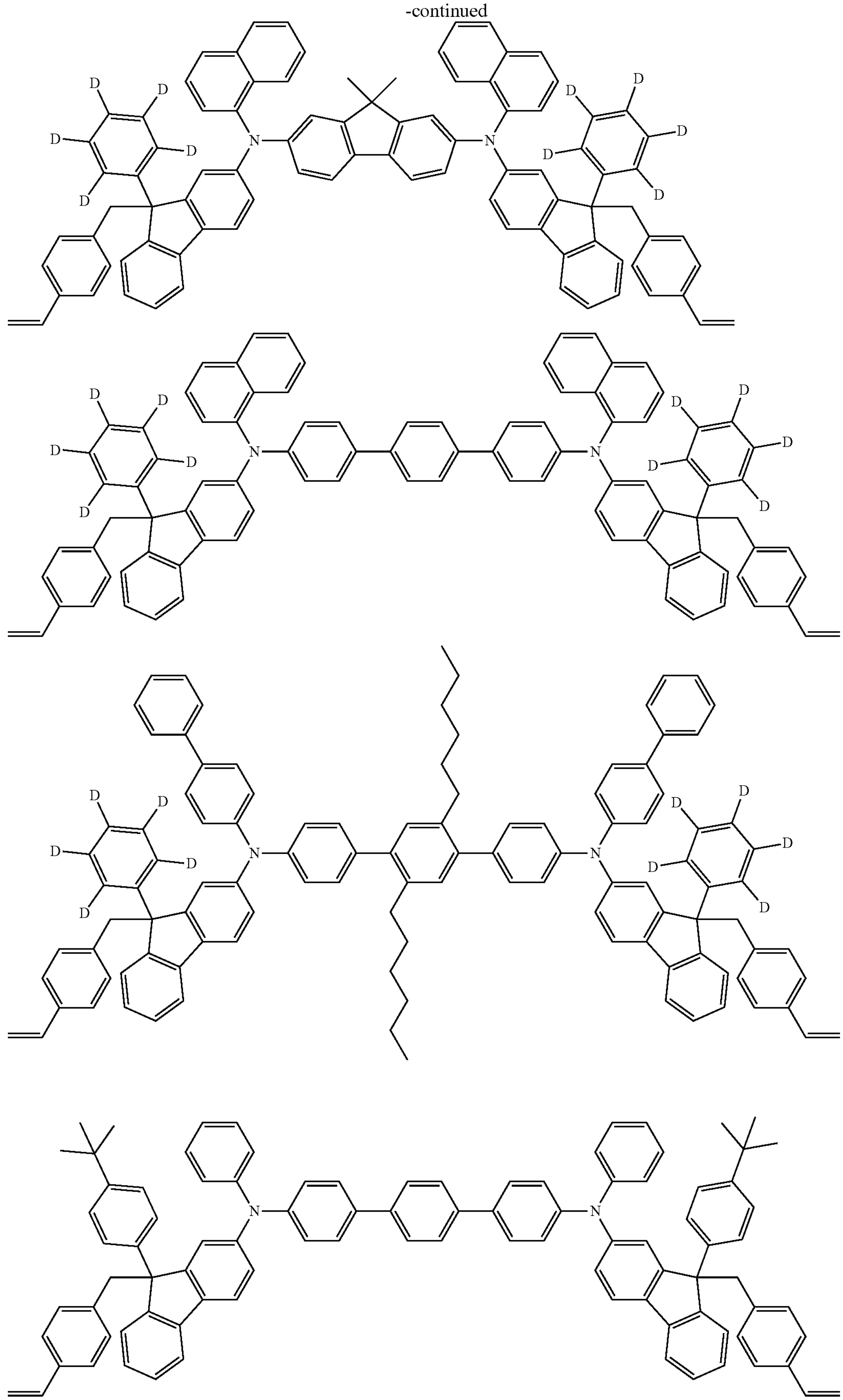

-continued
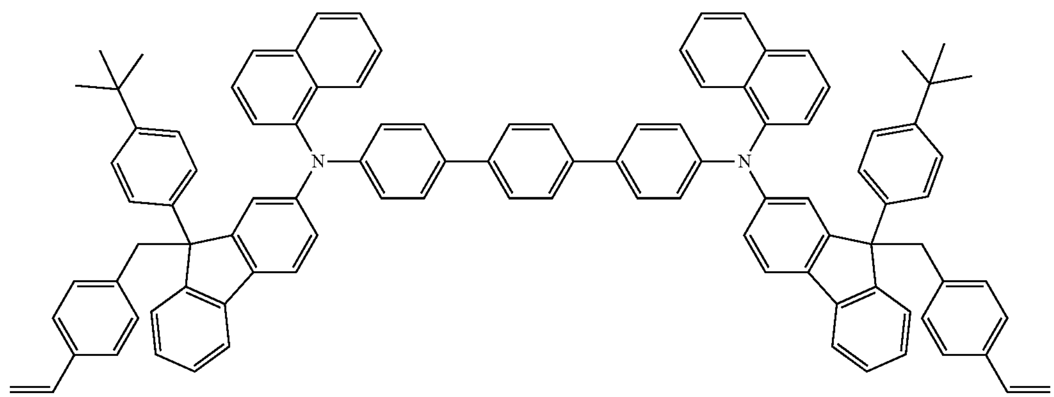
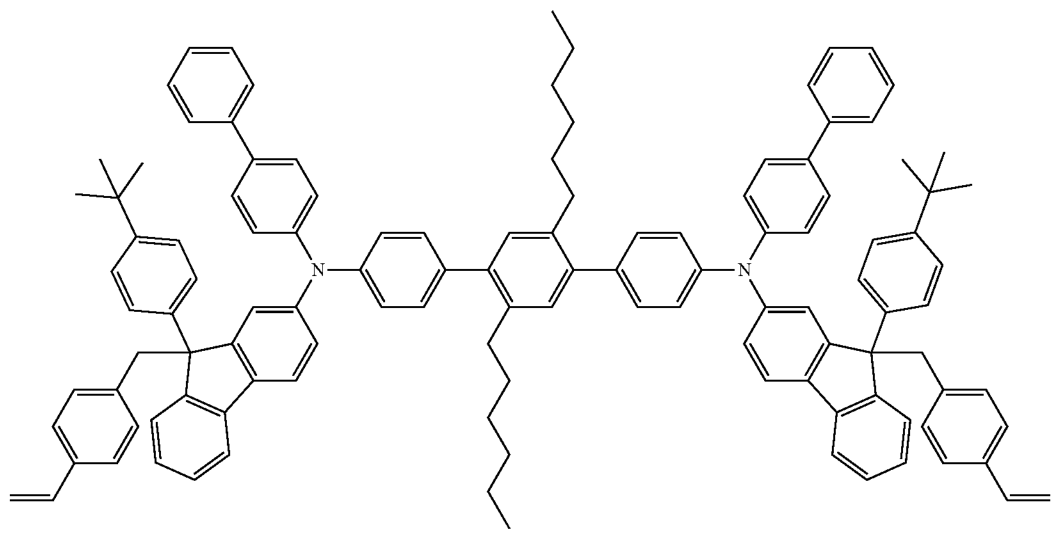
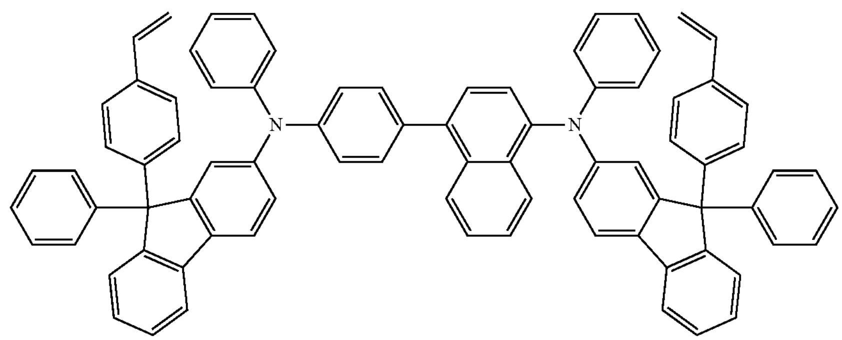
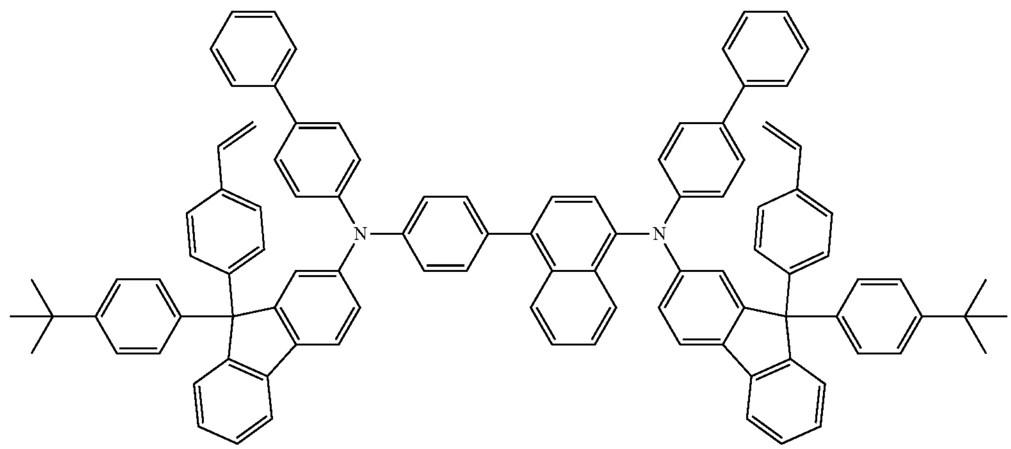

-continued
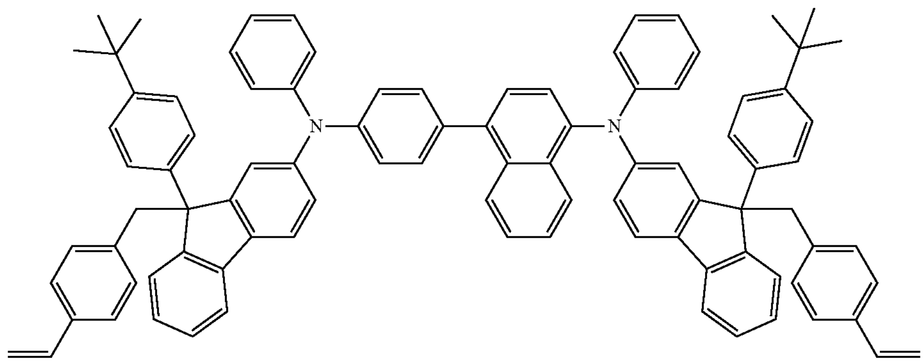
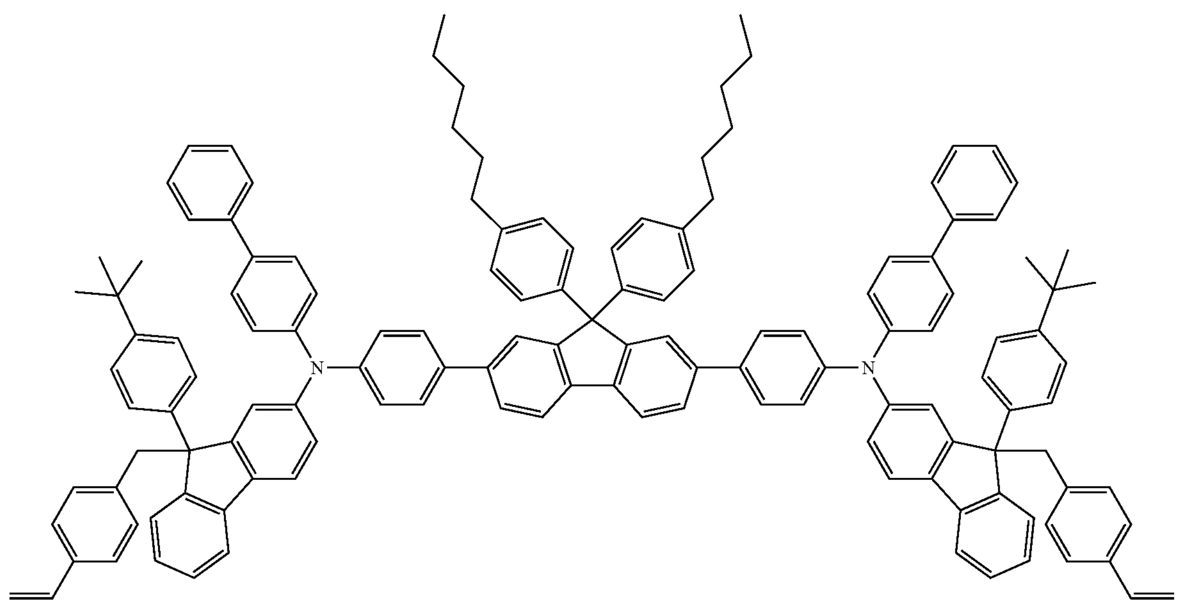
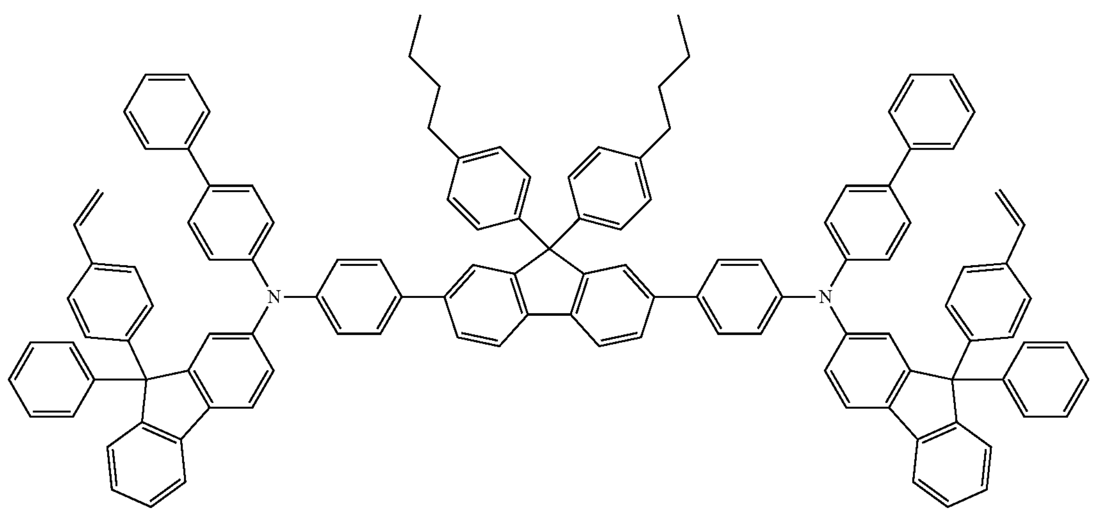

-continued
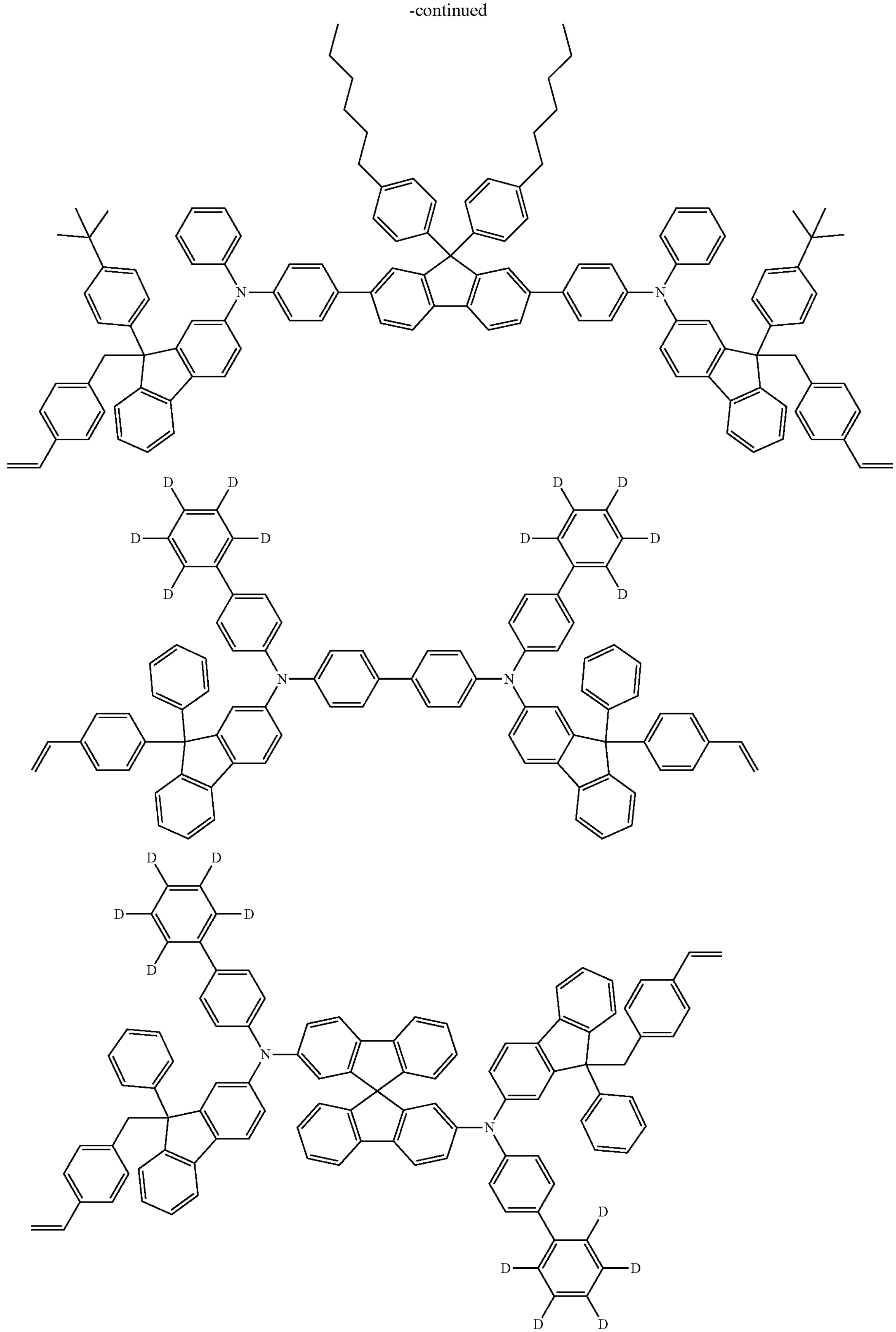

-continued
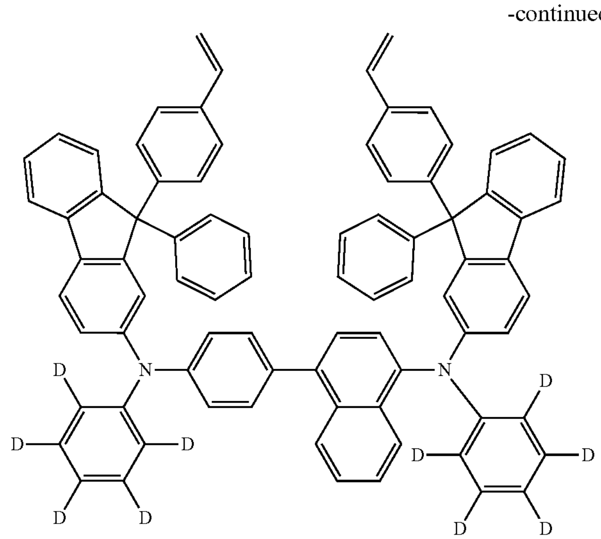
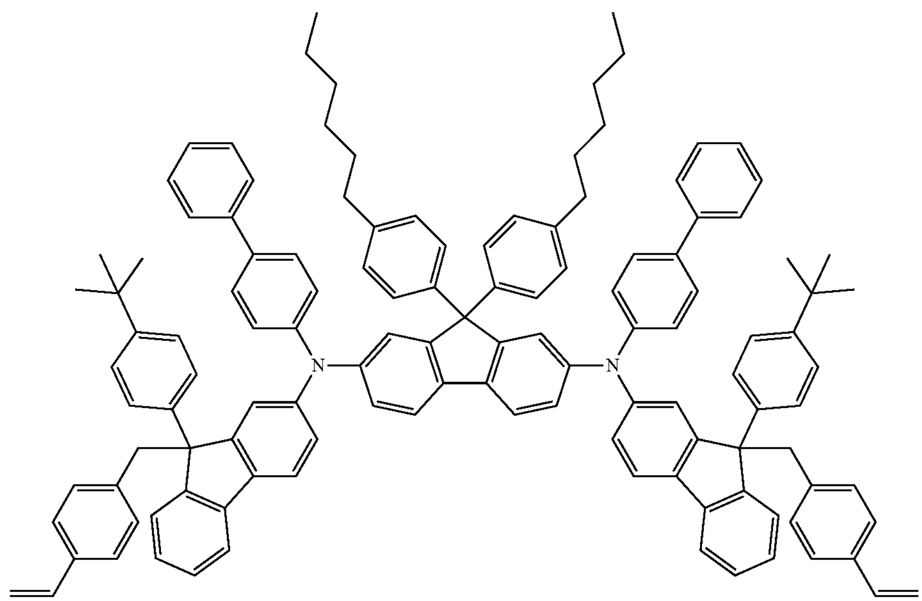
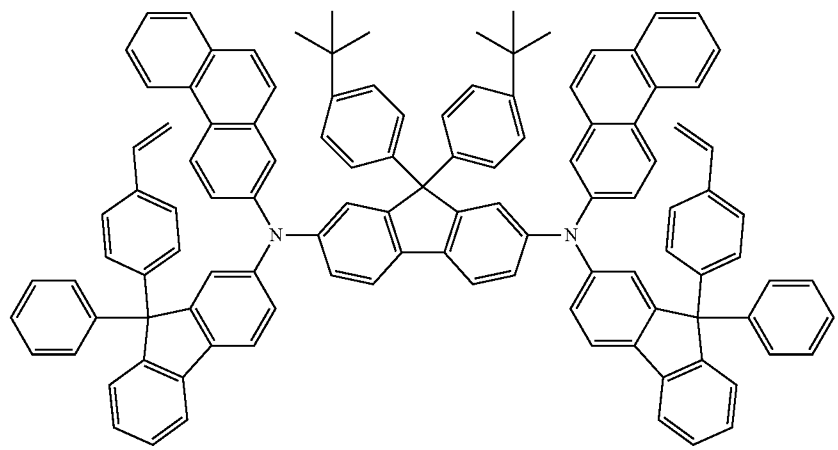

-continued
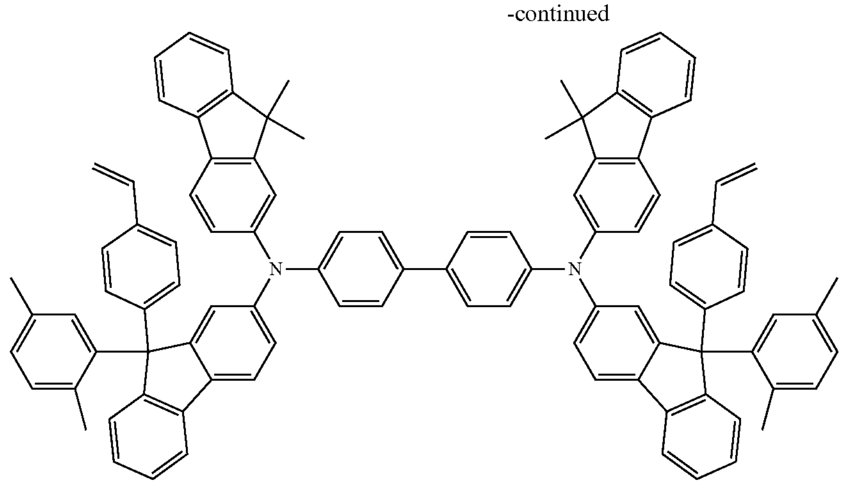
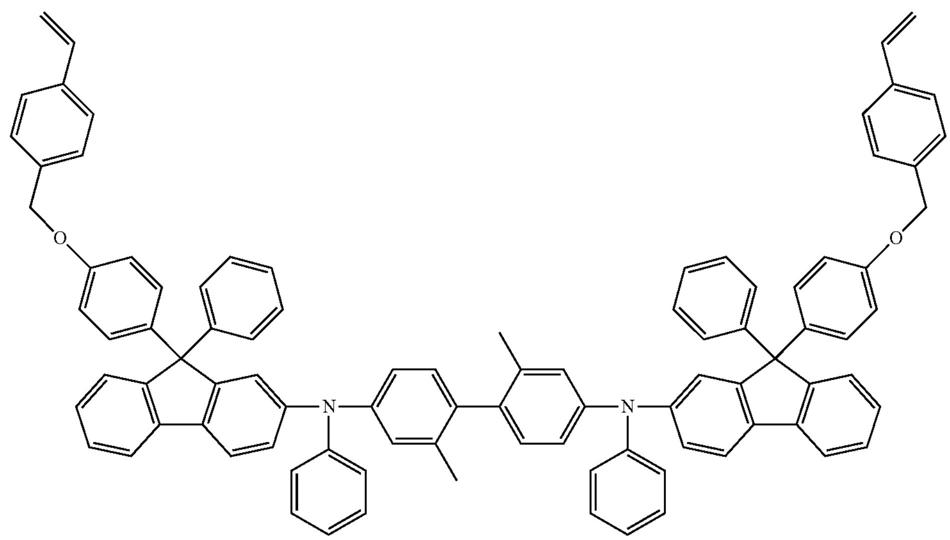
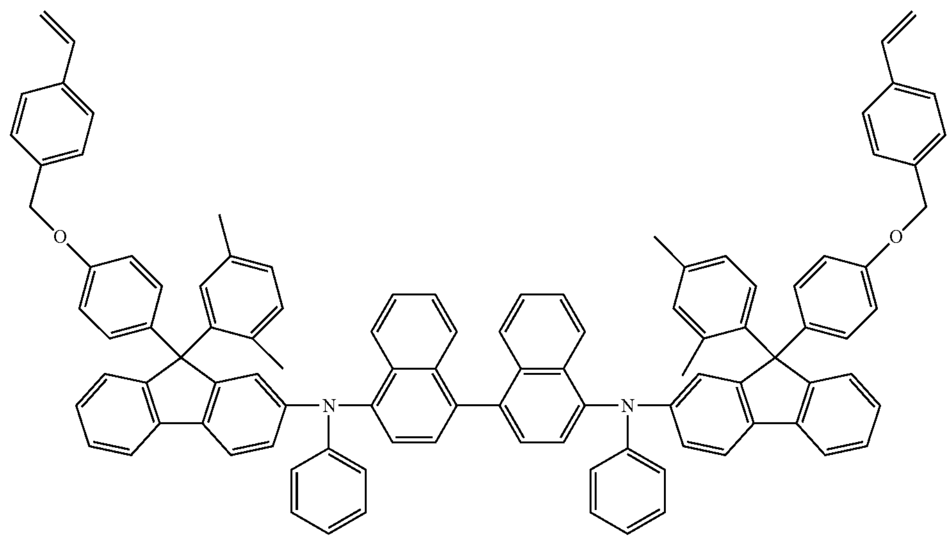

-continued
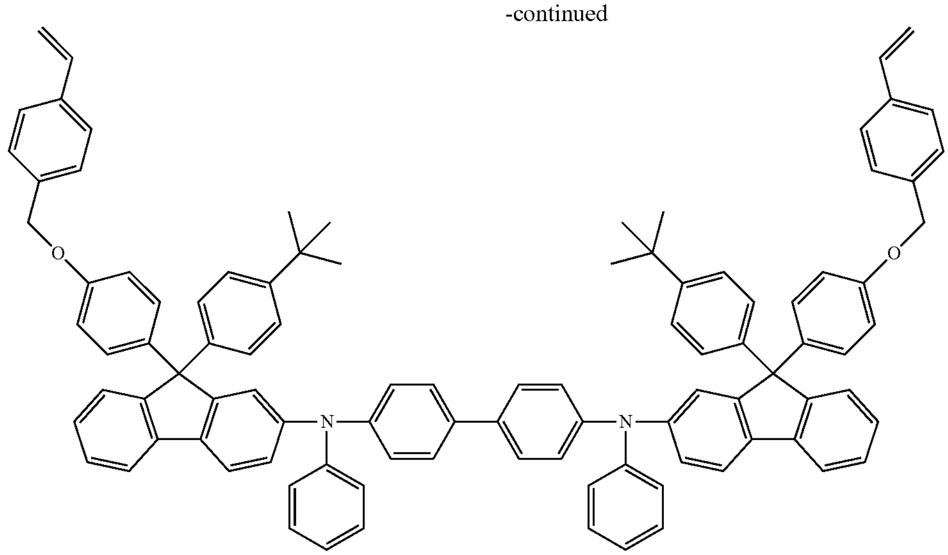
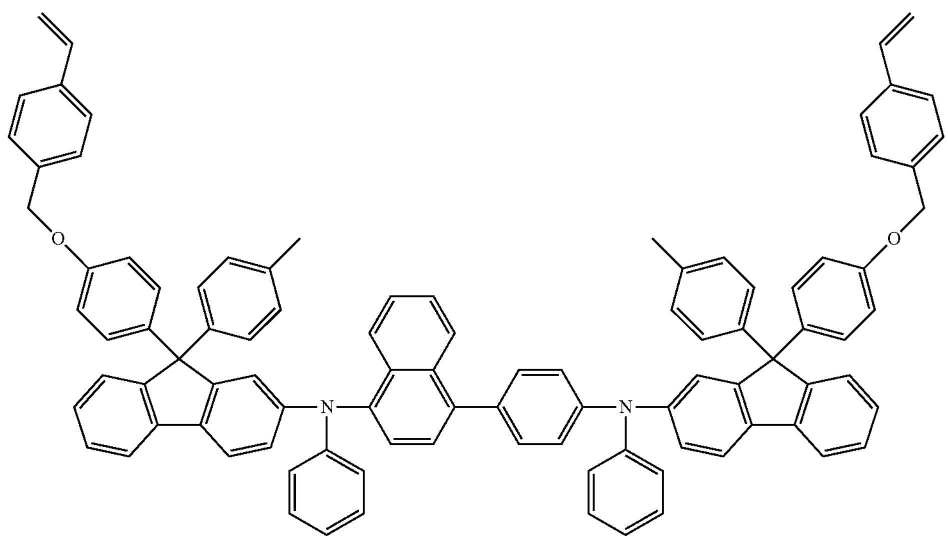
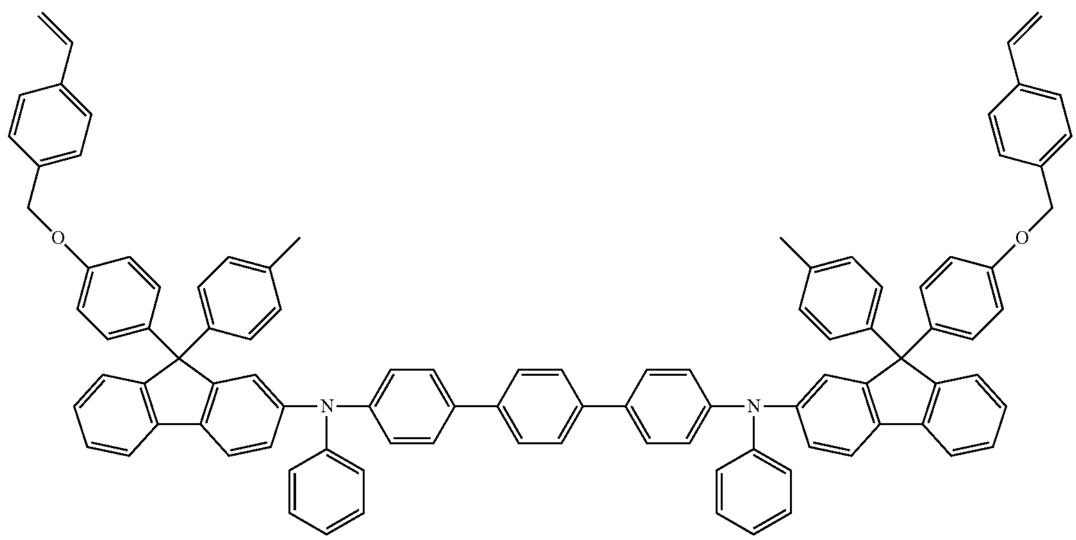

-continued
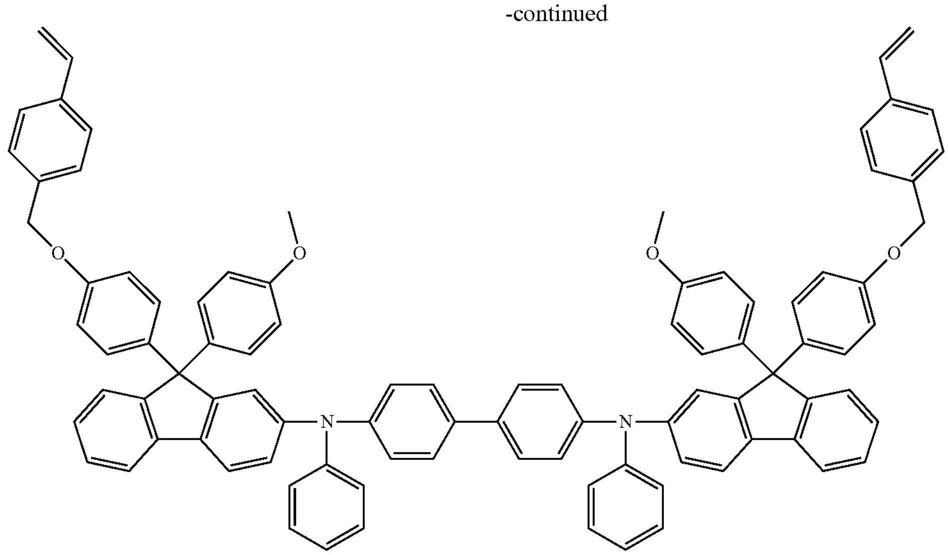
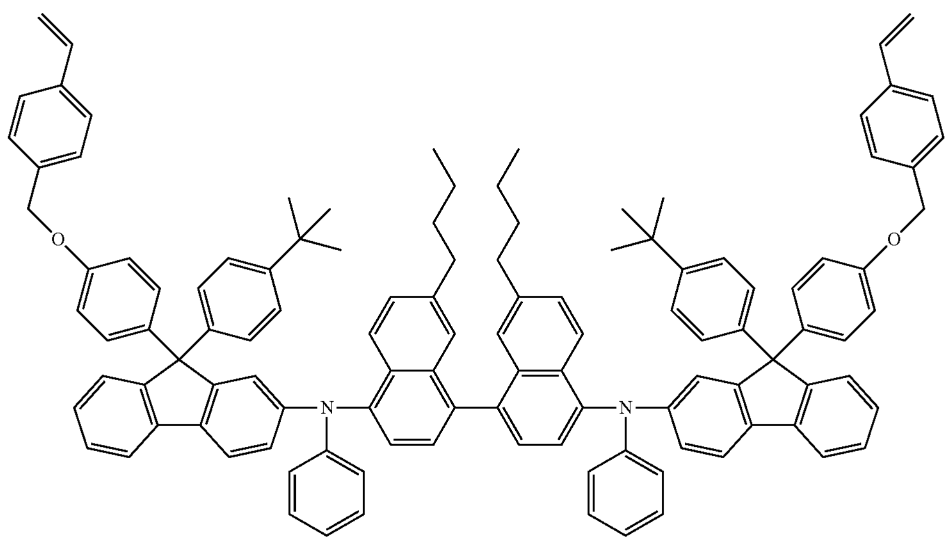
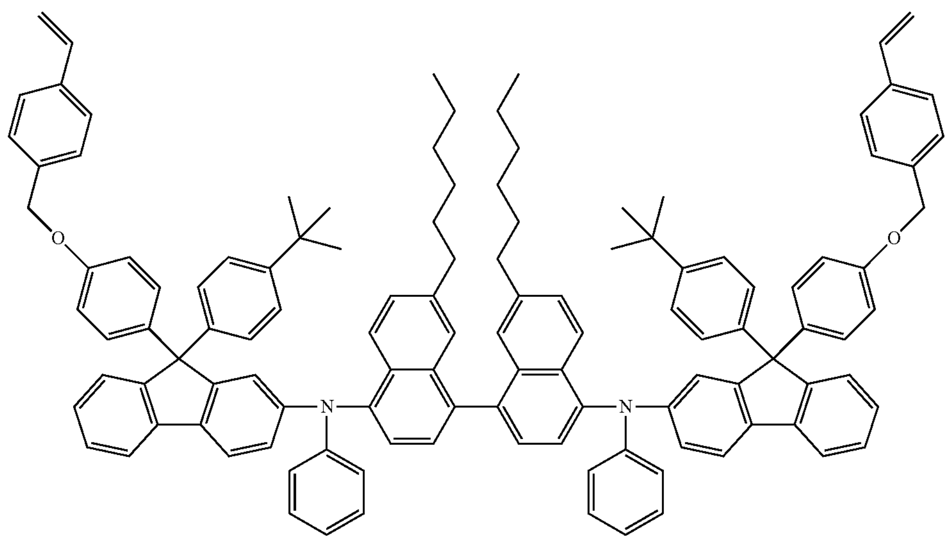

-continued

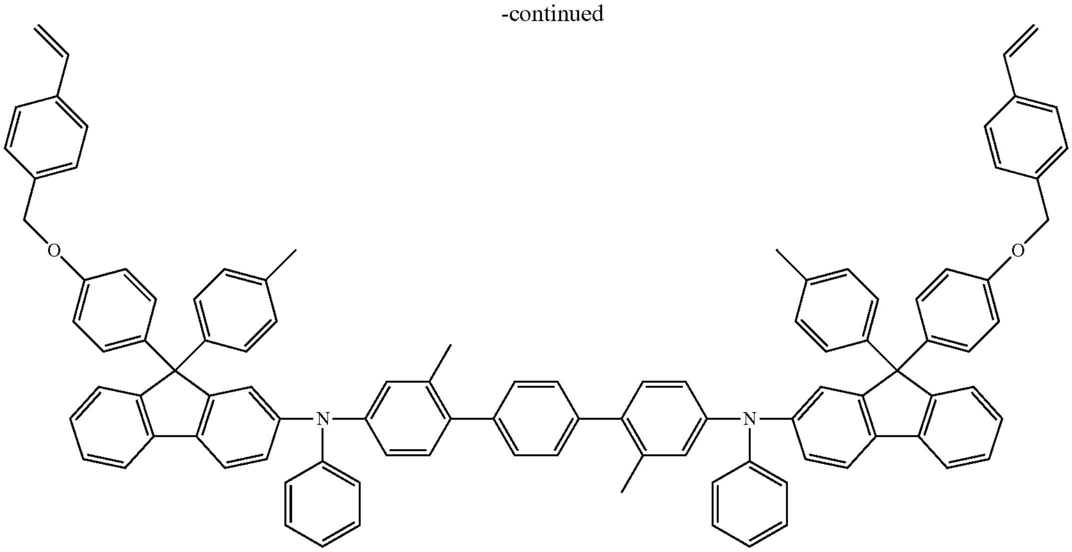

9. The organic light emitting device according to claim 1, wherein the repeating unit represented by Chemical Formula 2 is represented by the following Chemical Formula 2A:

[Chemical Formula 2A]

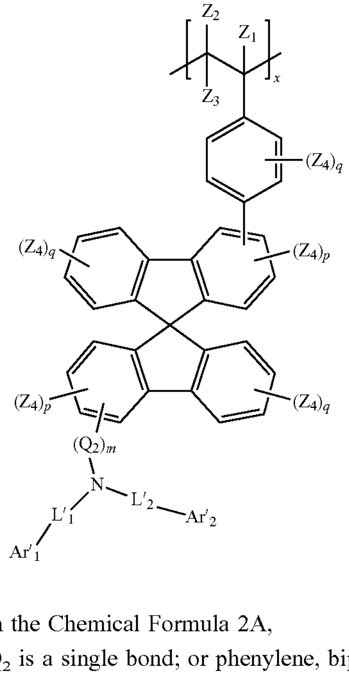

in the Chemical Formula 2A, $Q_2$ is a single bond; or phenylene, biphenyldiyl, naphthylene, fluorenediyl, or carbazolylene, each of which is unsubstituted or substituted with one or two of a $C_{1-10}$ alkyls; or a $C_{6-20}$ aryl, $L'_1$ and $L'_2$ are each independently a single bond; phenylene; or 9,9-dimethyl-9H-fluorenediyl, $Ar'_1$ and $Ar'_2$ are each independently phenyl; biphenylyl; fluorenyl; carbazolyl; or dibenzofuranyl, each of which is unsubstituted or substituted with one or two of a $C_{1-10}$ alkyls; a $C_{6-20}$ aryl; or a $C_{6-20}$ aryl substituted with a $C_{1-4}$ alkoxy group, $Z_1$ to $Z_3$ are each independently hydrogen or $C_{1-10}$ alkyl, each $Z_4$ is deuterium, m is an integer of 1 to 10, each p is independently an integer of 0 to 3, each q is independently an integer of 0 to 4, and x is an integer of 8 to 100.

10. The organic light emitting device according to claim 1, wherein the repeating unit represented by Chemical Formula 2 is represented by the following Chemical Formula 2B:

[Chemical Formula 2B]

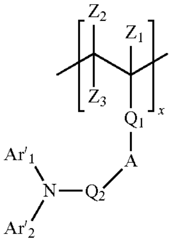

in the Chemical Formula 2B, $Z_1$ to $Z_3$ are each independently hydrogen or $C_{1-10}$ alkyl, $Q_1$ is phenylene or biphenyldiyl, $Q_2$ is a single bond, or phenylene, biphenyldiyl, naphthylene, fluorenediyl, or carbazolylene, each of which is unsubstituted or substituted with one or two of a $C_{1-10}$ alkyls, or a $C_{6-20}$ aryl, $Ar'_1$ and $Ar'_2$ are each independently phenyl, biphenylyl, fluorenyl, carbazolyl, or dibenzofuranyl, each of which is unsubstituted or substituted with one or two of a $C_{1-10}$ alkyls, a $C_{6-20}$ aryl, or a $C_{6-20}$ aryl substituted with a $C_{1-4}$ alkoxy group, A is $-L'_3-A'-$, $L'_3$ is a single bond, $—O—$, $—(CH_2)_y—$, $—O(CH_2)_y—$, or $—(CH_2)_yO—$, where y is 1, A' is any one selected from the group consisting of the following:

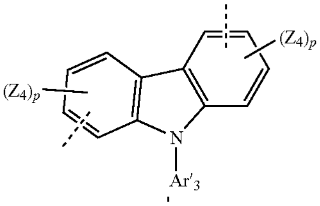

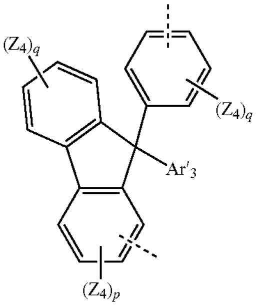

wherein, each $Z_4$ is deuterium, $Ar'_3$, p and q are as defined in Chemical Formula 2, and x is an integer of 8 to 100.

11. The organic light emitting device according to claim 1, wherein $Q_1$ is phenylene, or biphenyldiyl, and $Q_2$ is a single bond, phenylene, biphenyldiyl, naphthylene, fluorenediyl, or carbazolylene, each of which is unsubstituted, or substituted with one or two $C_{1-10}$ alkyls; or $C_{6-20}$ aryl.

12. The organic light emitting device according to claim 1, wherein $L'_1$ and $L'_2$ are each independently a single bond, phenylene, or 9,9-dimethyl-9H-fluorenediyl, each $Z_4$ is deuterium, and $Z_1$ to $Z_3$ are each independently hydrogen or methyl.

13. The organic light emitting device according to claim 1, wherein $Ar'_1$ and $Ar'_2$ are each independently phenyl, biphenylyl, fluorenyl, carbazolyl, or dibenzofuranyl, each of which is unsubstituted, or substituted with one or two $C_{1-10}$ alkyls; $C_{6-20}$ aryl; or $C_{6-20}$ aryl substituted with $C_{1-4}$ alkoxy group.

14. The organic light emitting device according to claim 1, wherein $L'_3$ is a single bond, —O—, or —$CH_2O$—, and A' is any one selected from the group consisting of the following:

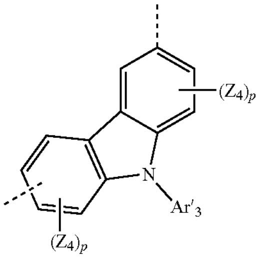

-continued

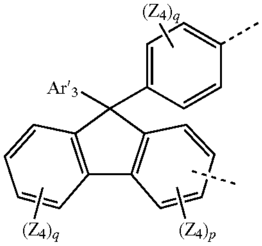

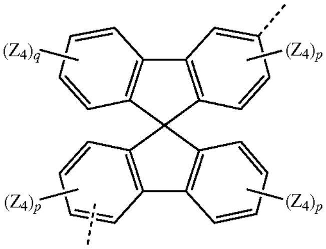

wherein, $Ar'_3$, $Z_4$, p and q are as defined Chemical Formula 2.

15. The organic light emitting device according to claim 1, wherein the repeating unit represented by Chemical Formula 2 is represented by the following Chemical Formulas 2A-1, 2B-1, or 2B-2:

[Chemical Formula 2A-1]

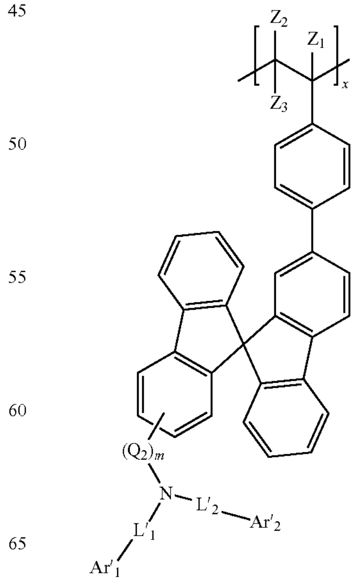

-continued

[Chemical Formula 2B-1]

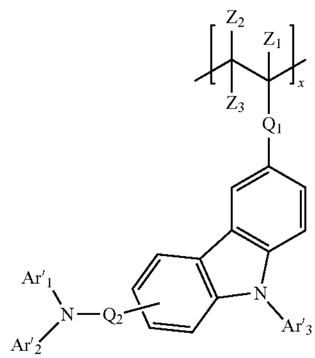

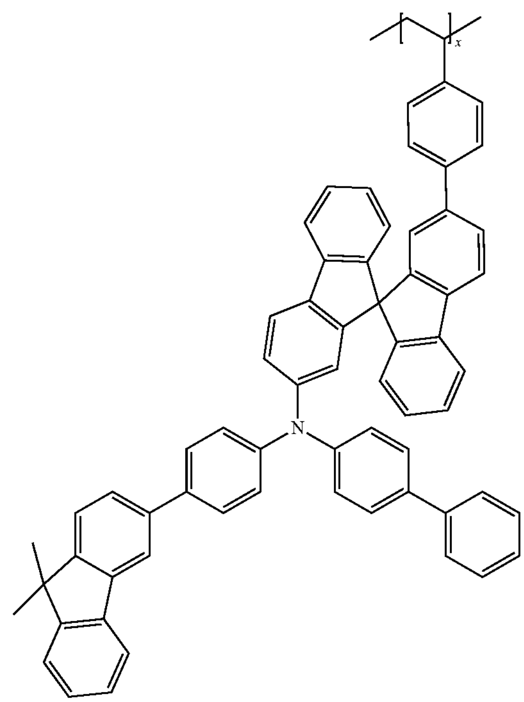

[Chemical Formula 2B-2]

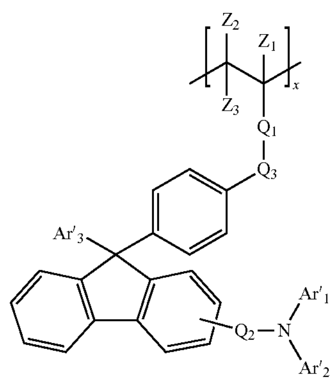

in Chemical Formulas 2A-1, 2B-1 and 2B-2, $Z_1$ to $Z_3$, $Q_1$ to $Q_2$, m, $L'_1$, $L'_2$, $Ar'_1$ to $Ar'_3$ and x are as defined in claim 1, and $Q_3$ is —O—, or —$CH_2O$—.

16. The organic light emitting device according to claim 1, wherein the repeating unit represented by Chemical Formula 2 is any one selected from the group consisting of repeating units represented by the following:

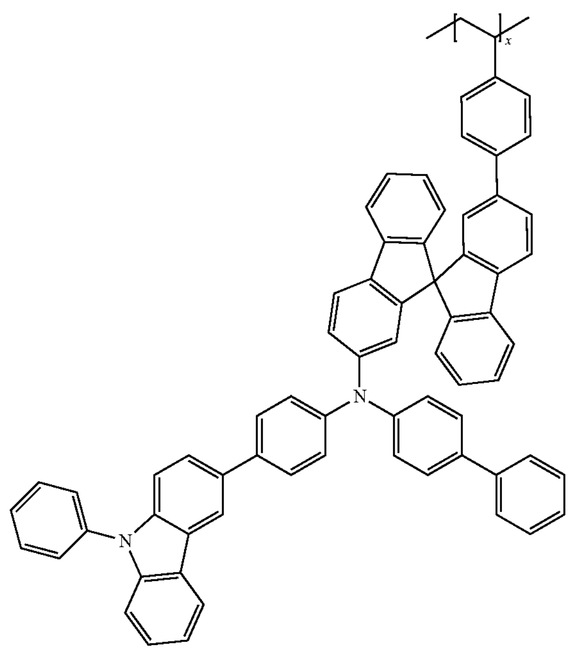

-continued
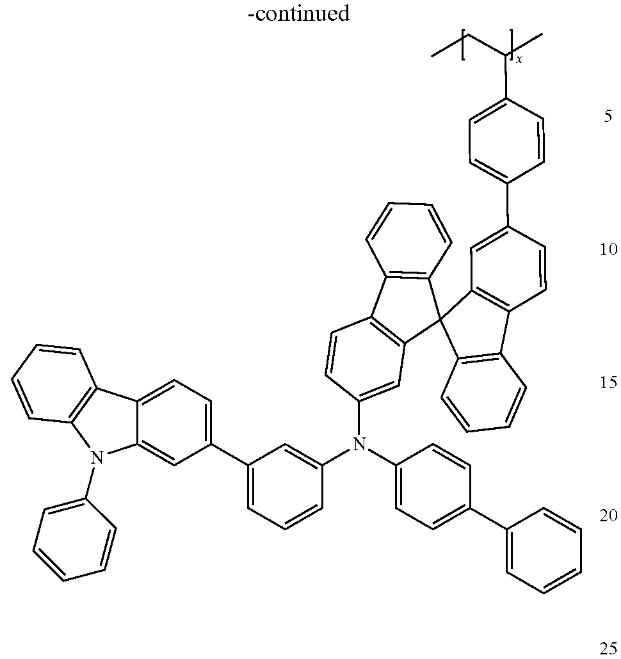
-continued
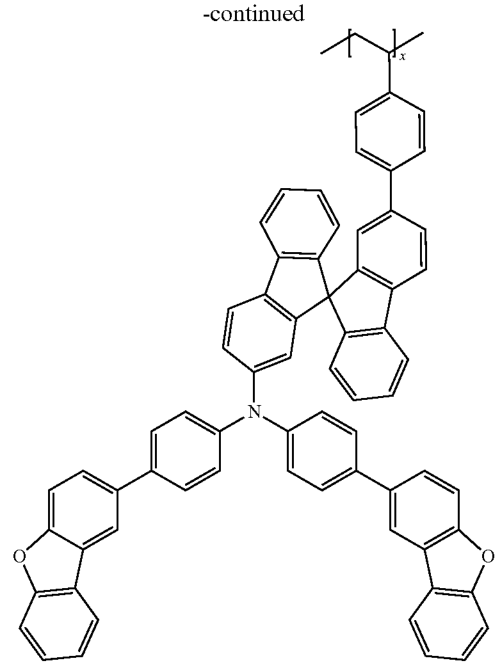
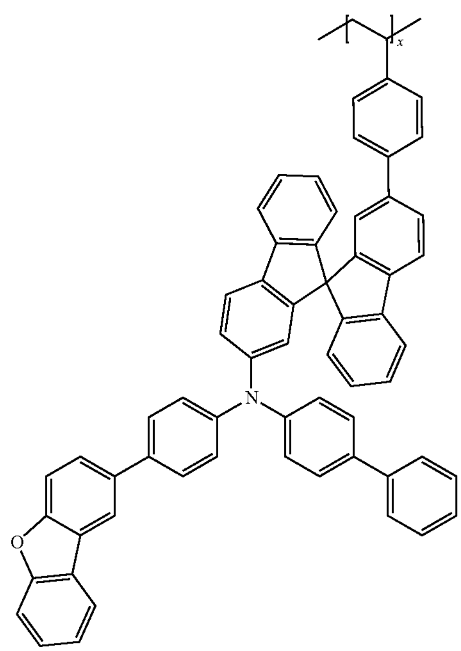
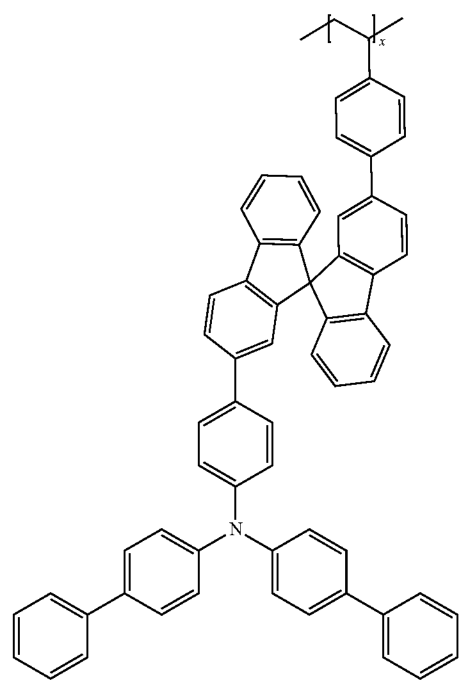

-continued
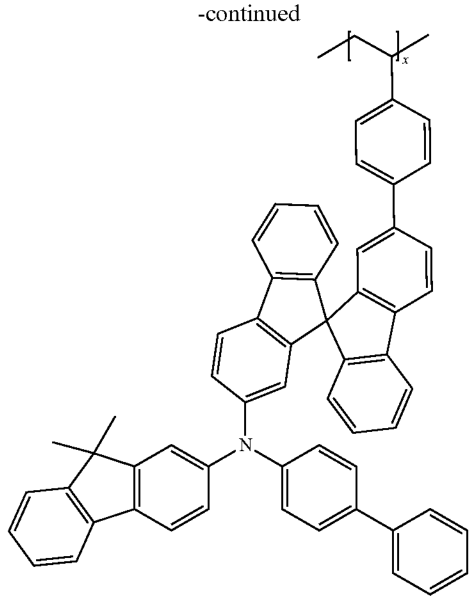
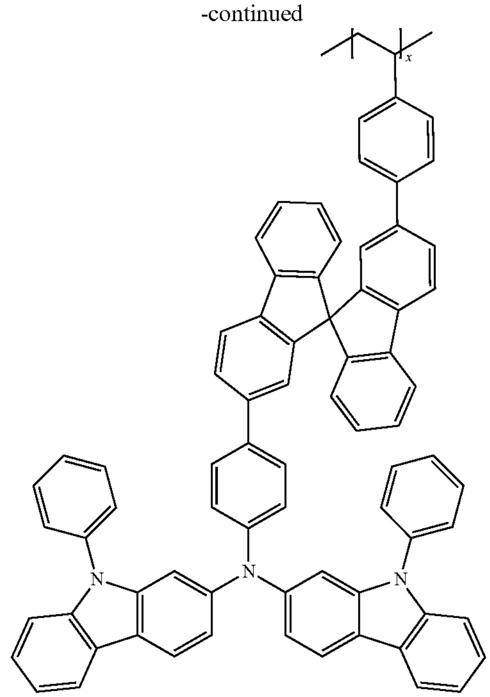
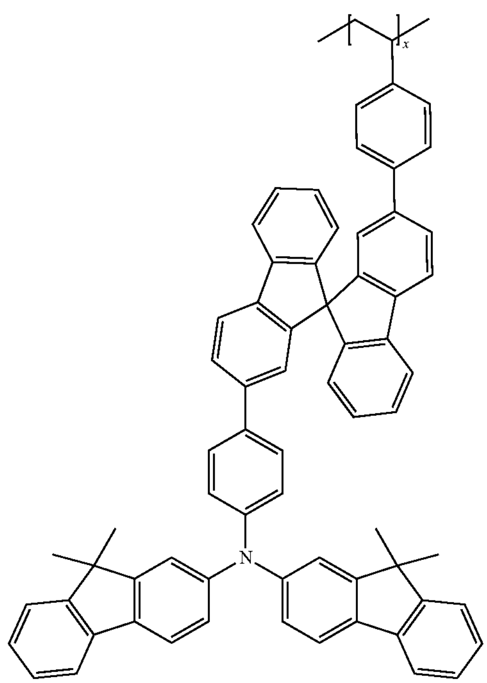
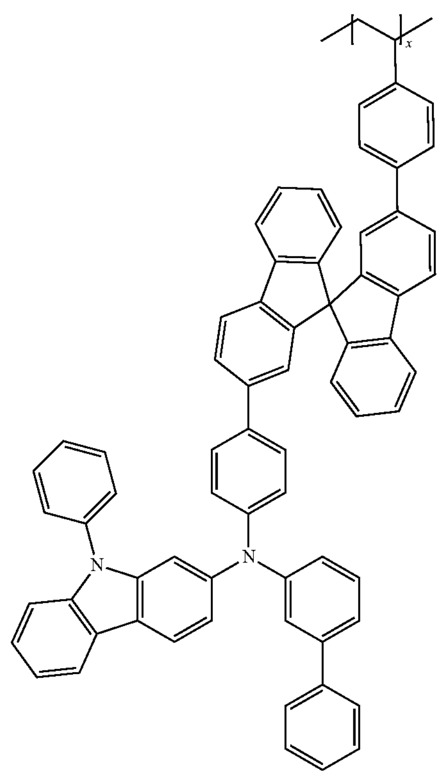
-continued

-continued
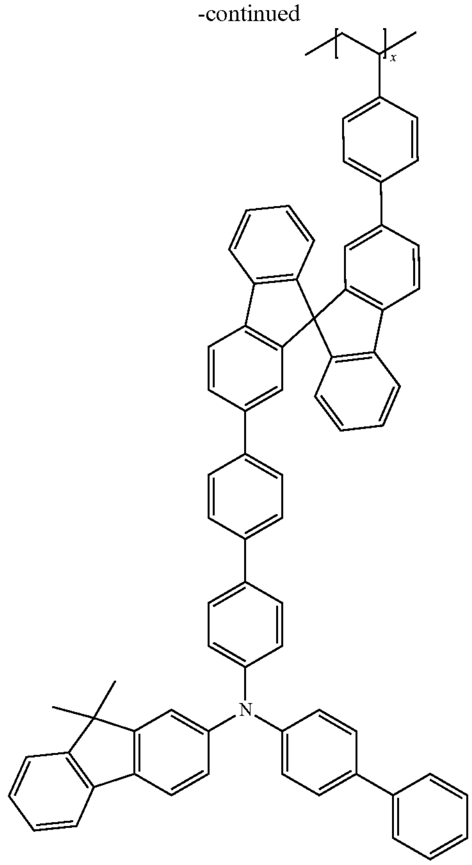
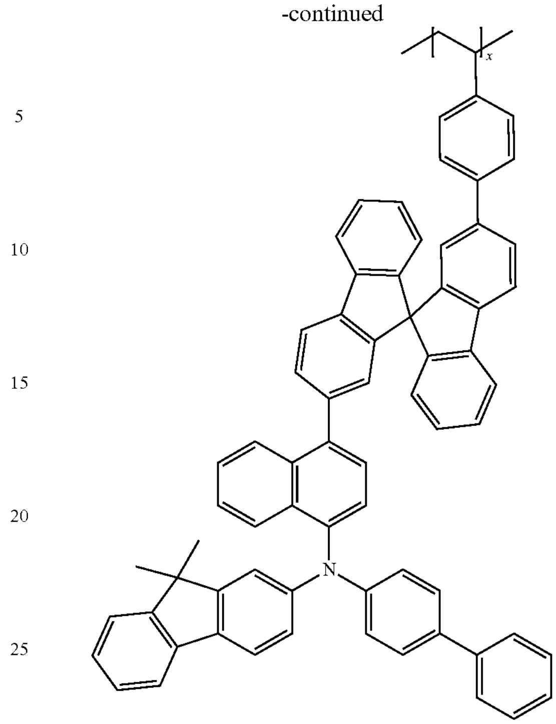
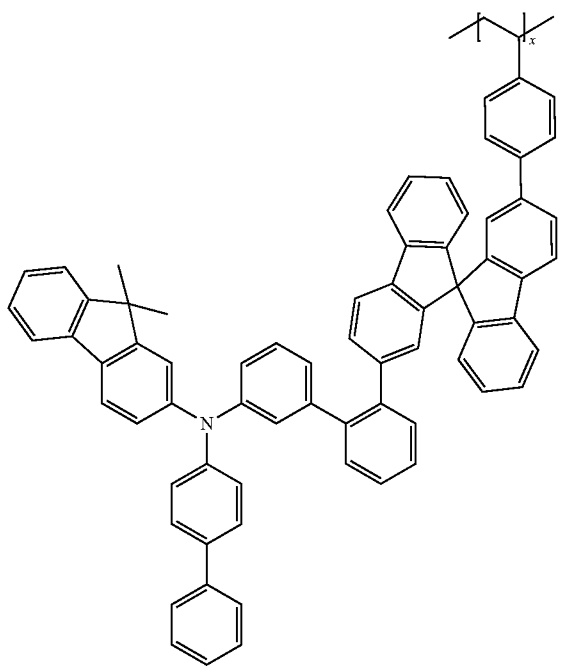
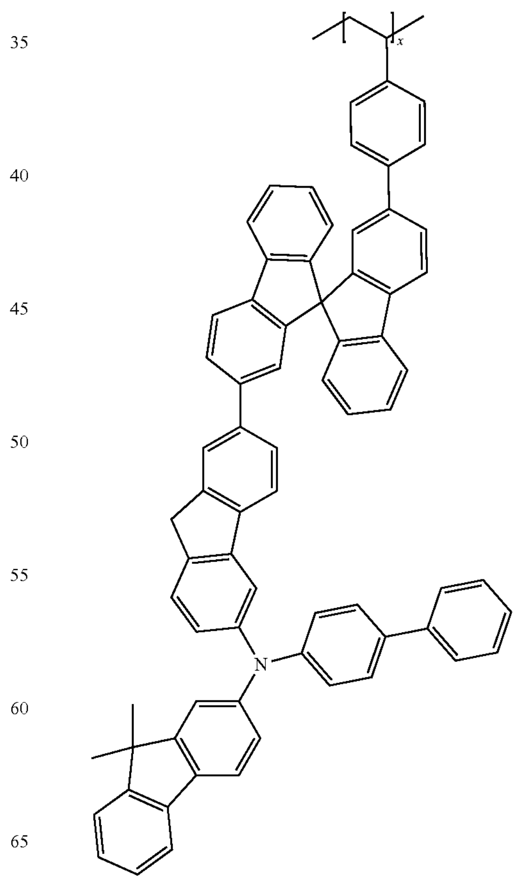

-continued
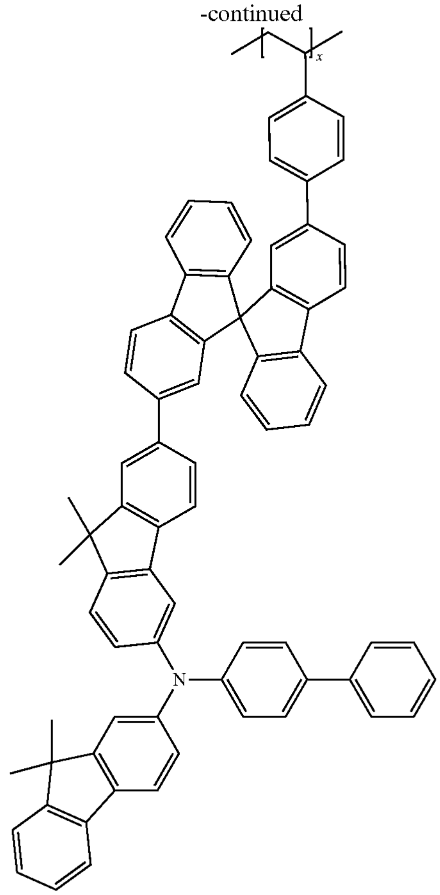
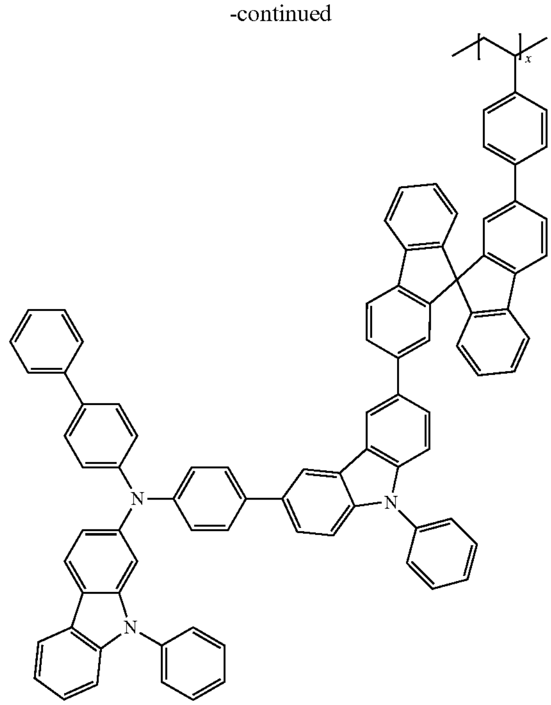
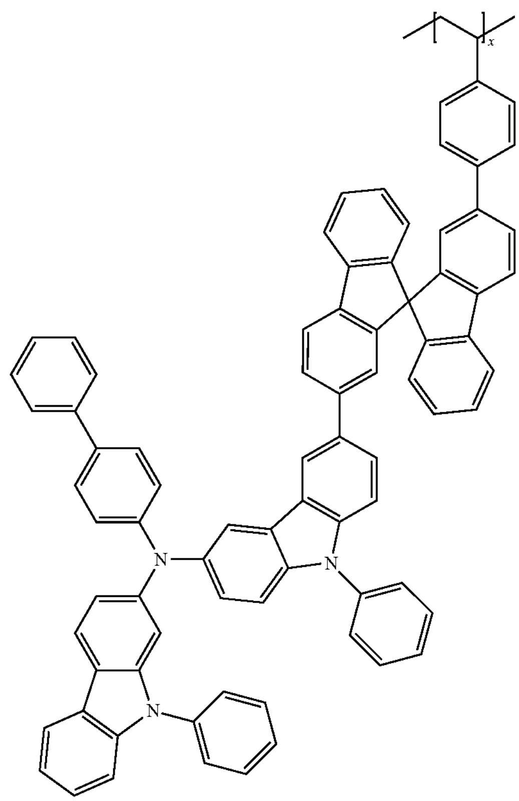
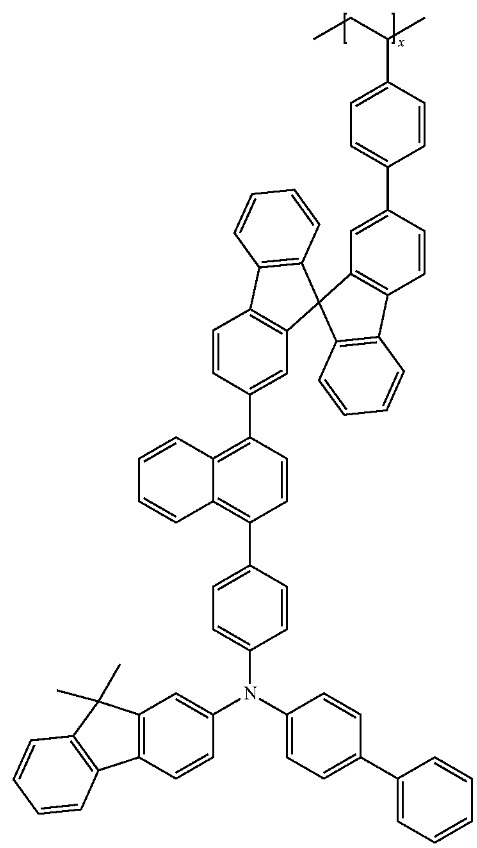

-continued
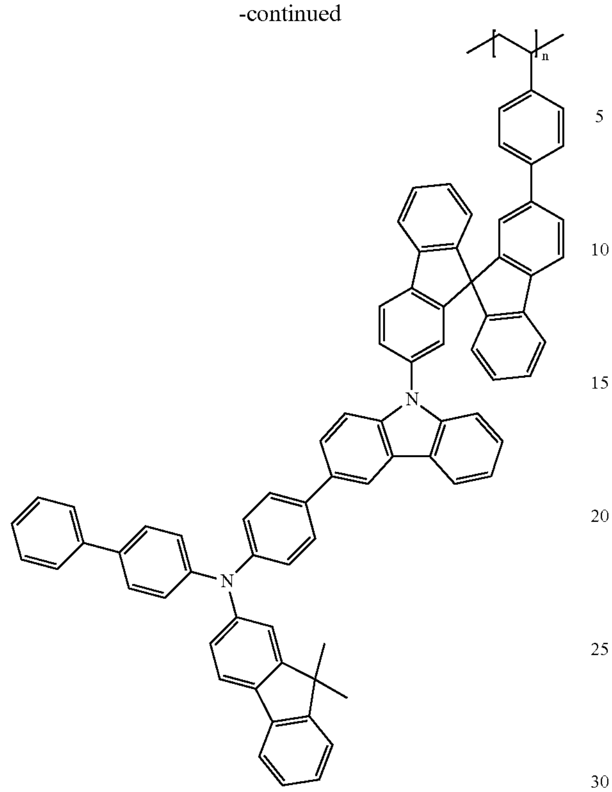
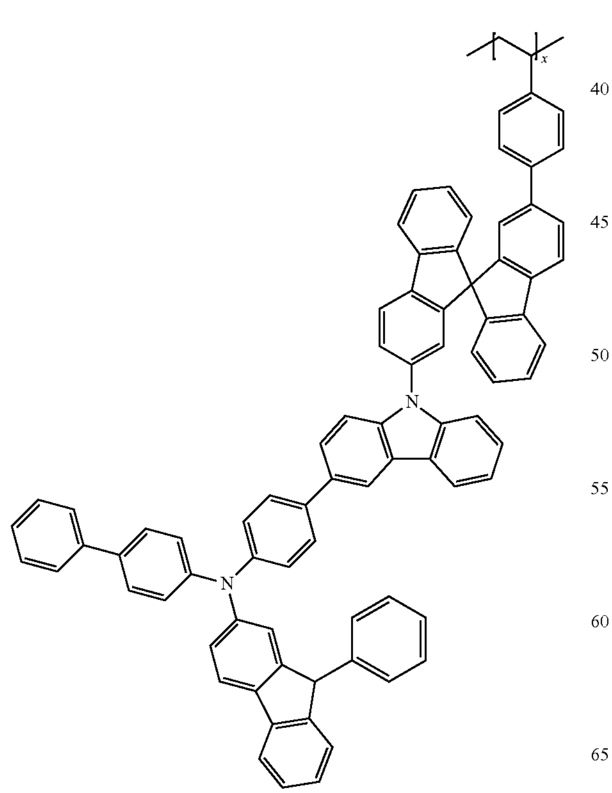
-continued
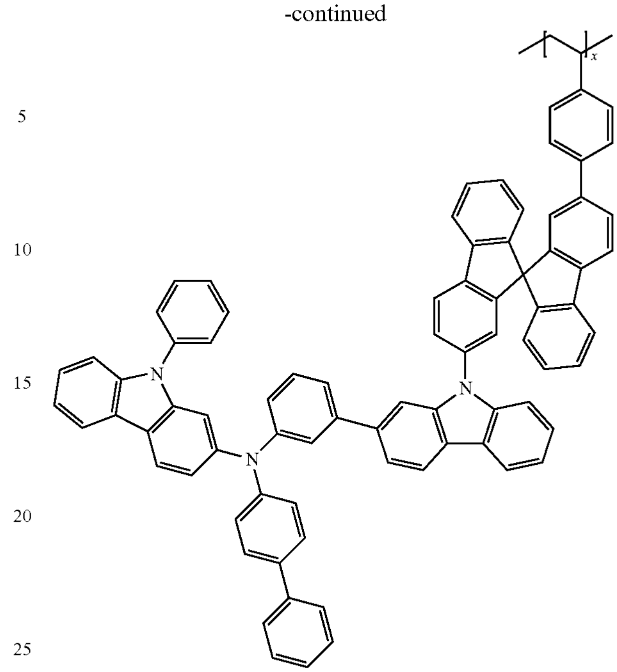
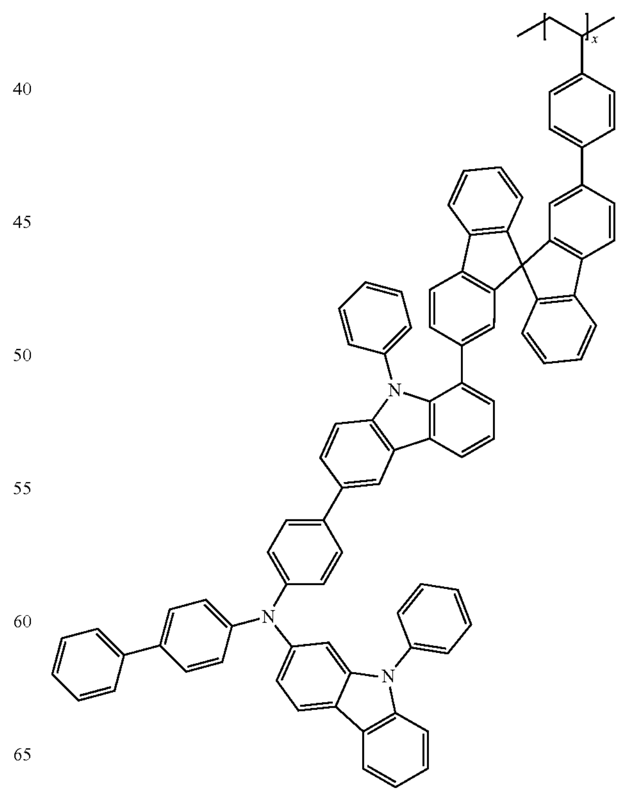

-continued
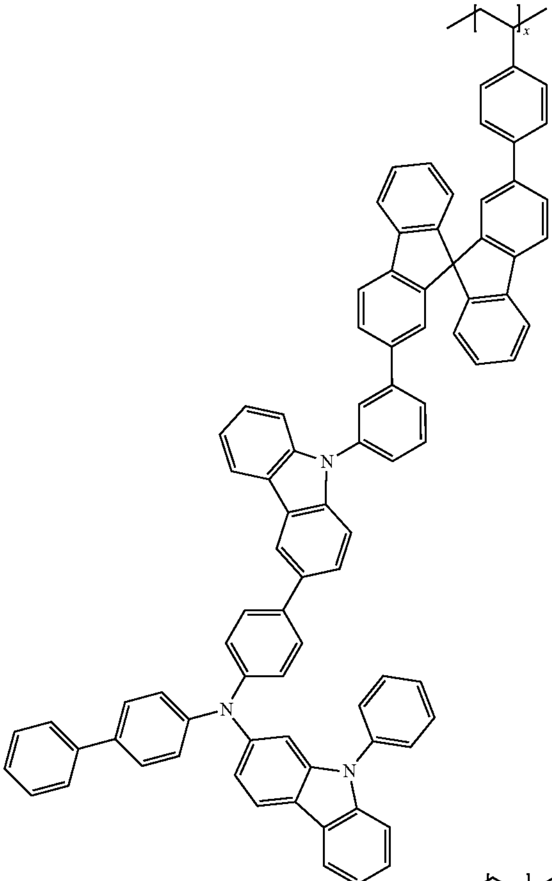
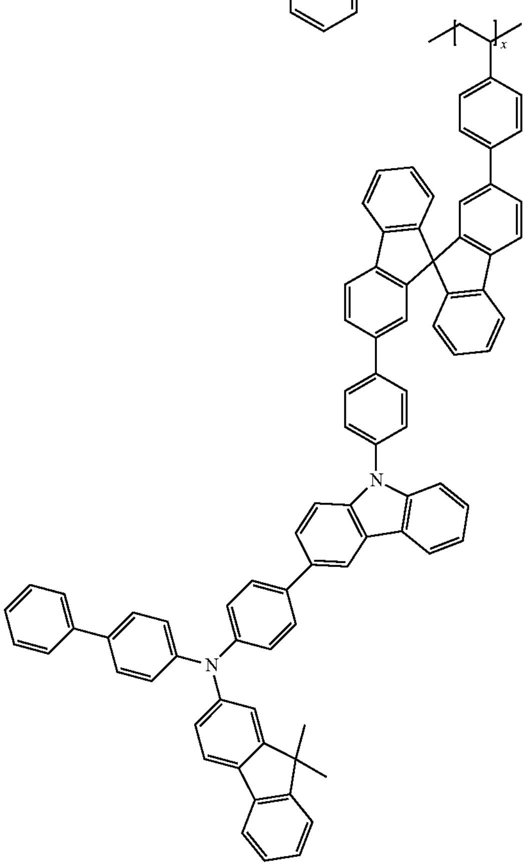
-continued
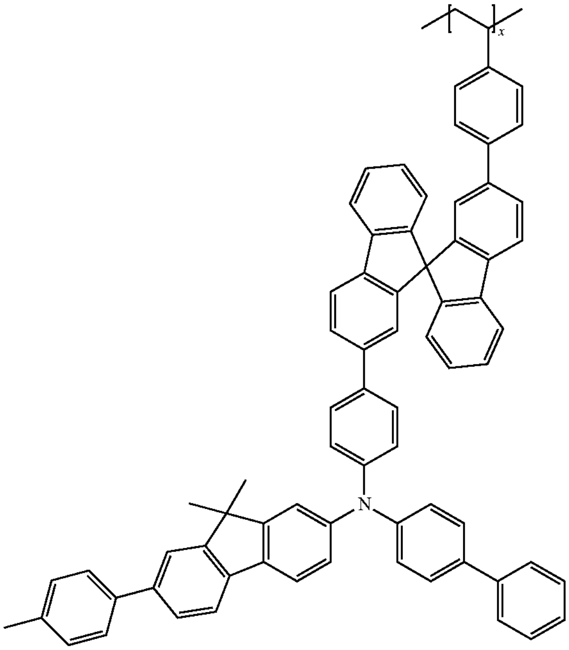
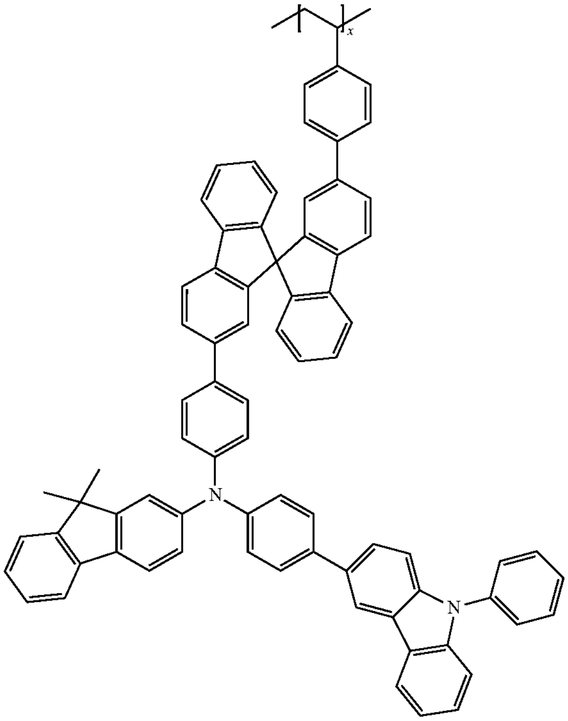

-continued
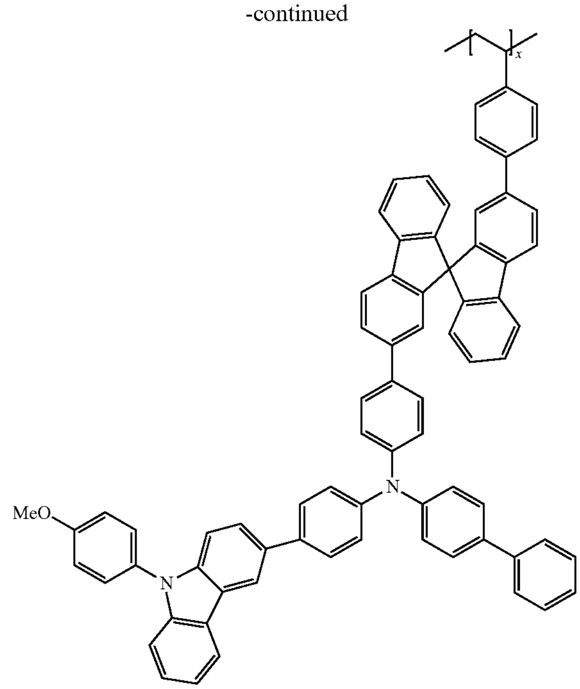
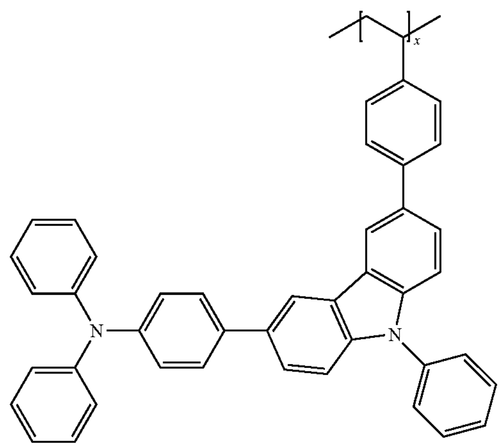
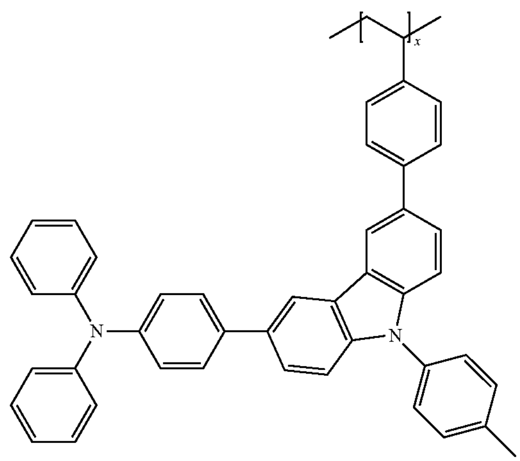
-continued
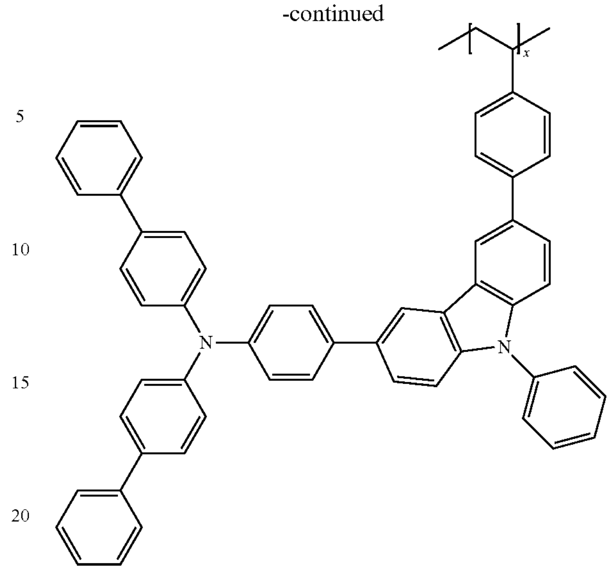
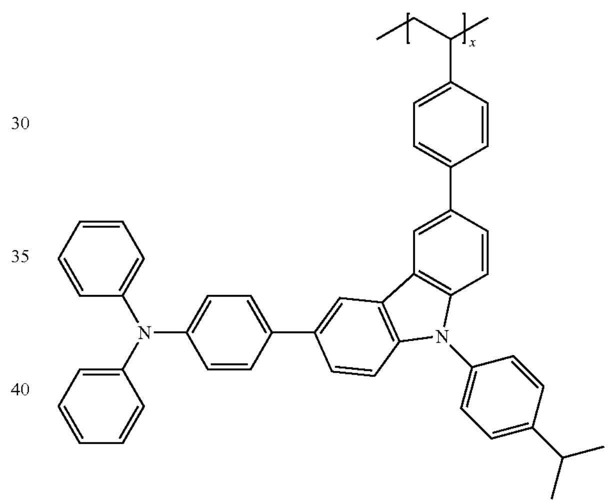
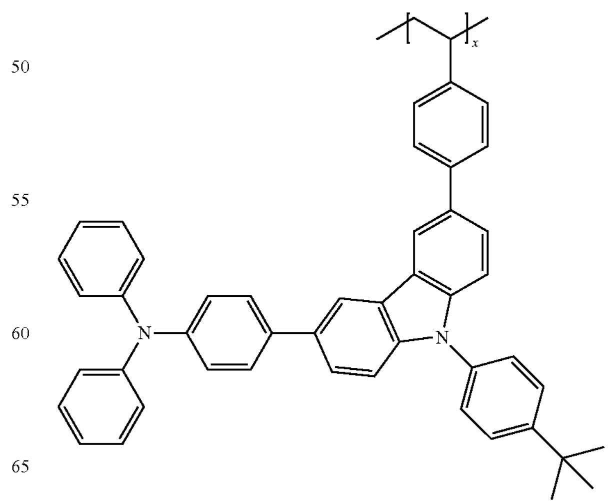

-continued
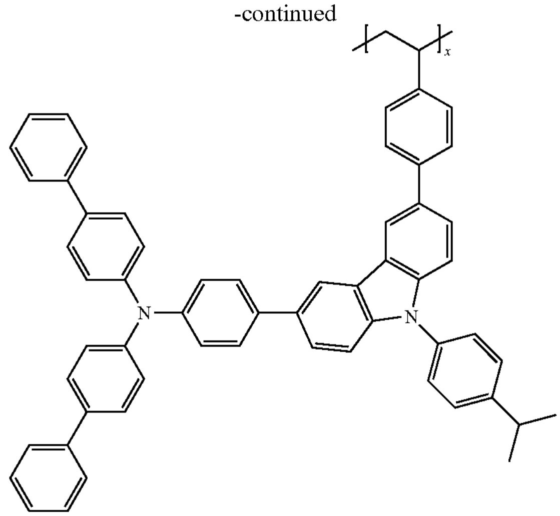
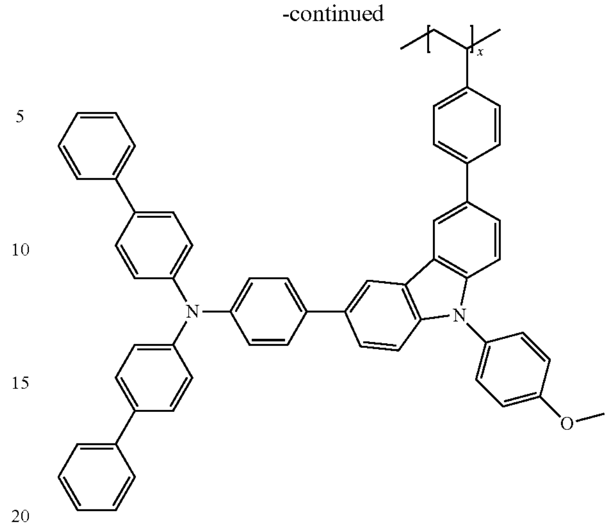
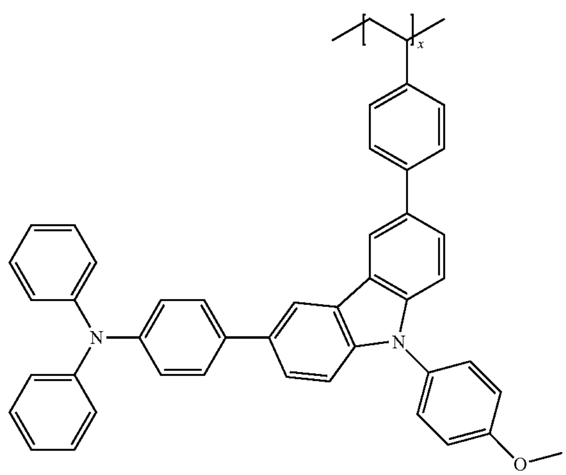
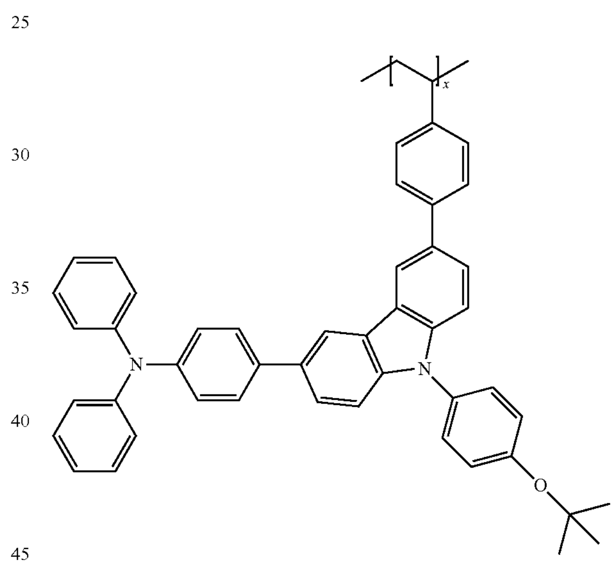
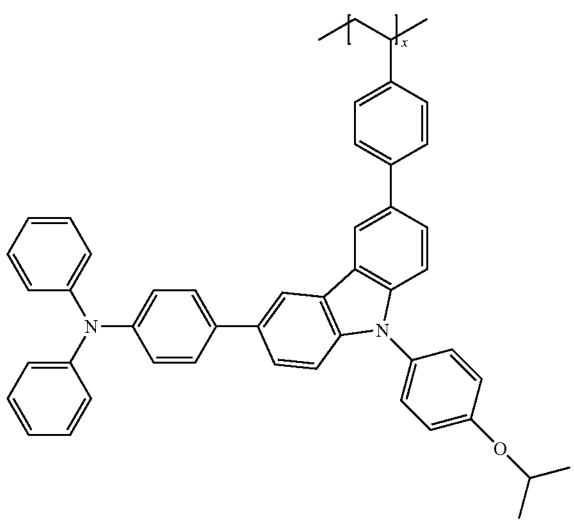
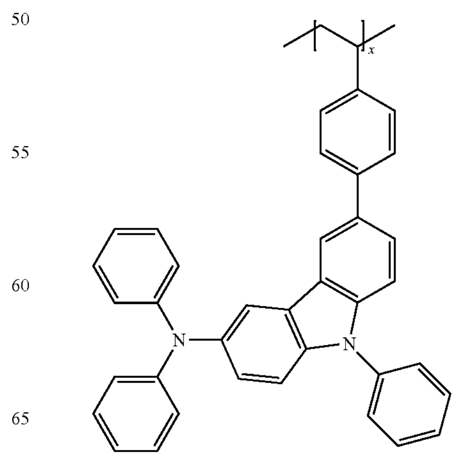

-continued
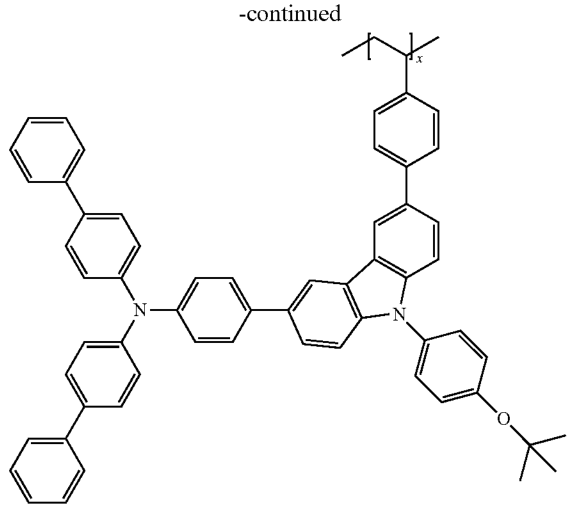
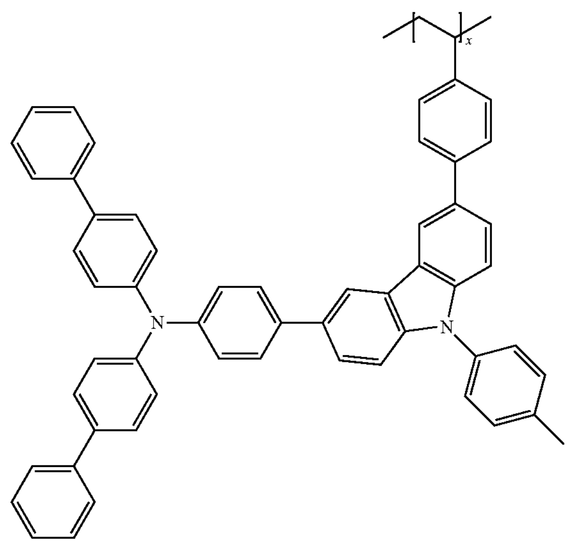
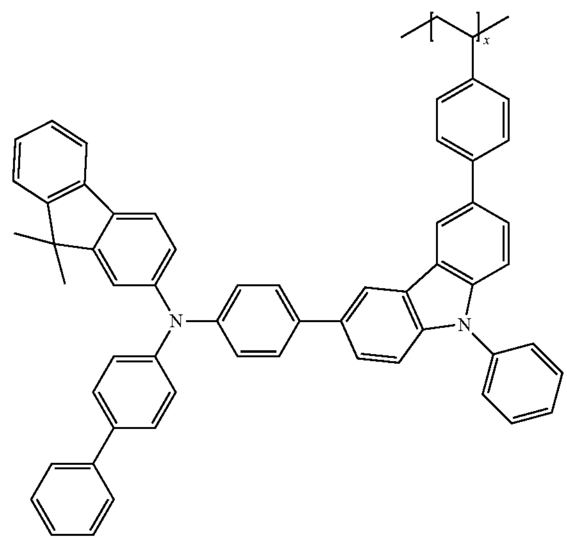
-continued
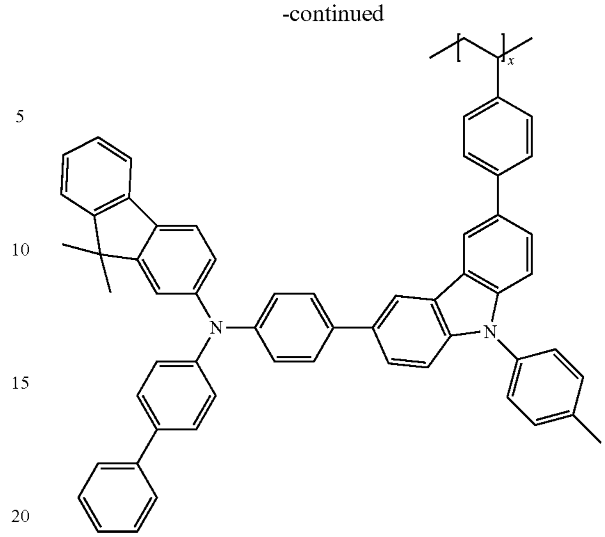
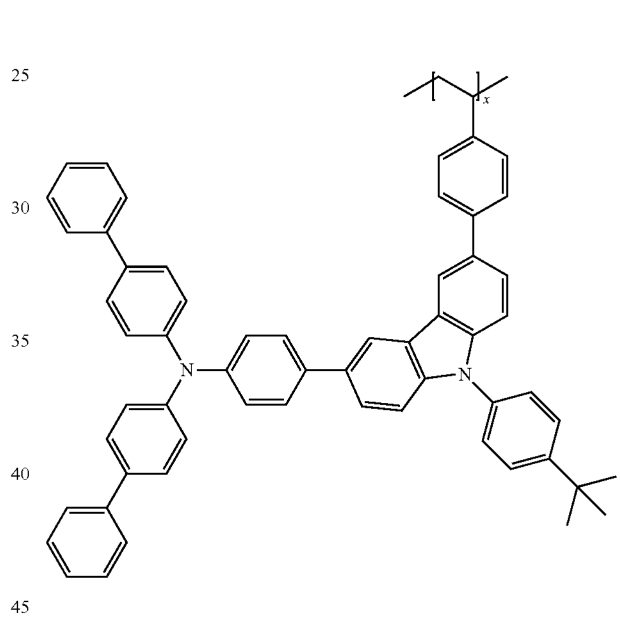
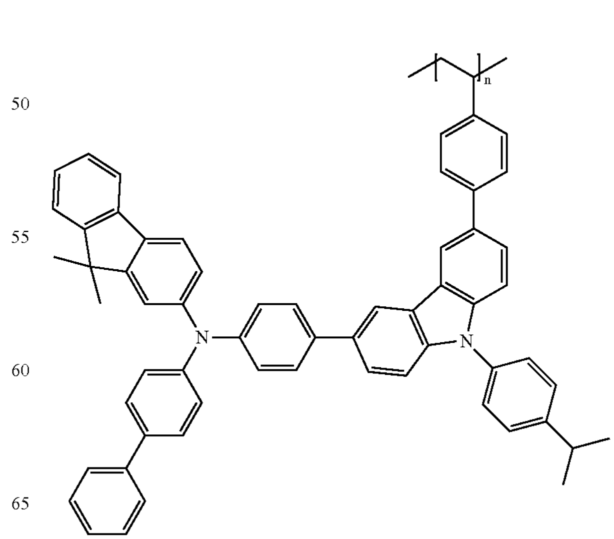

-continued
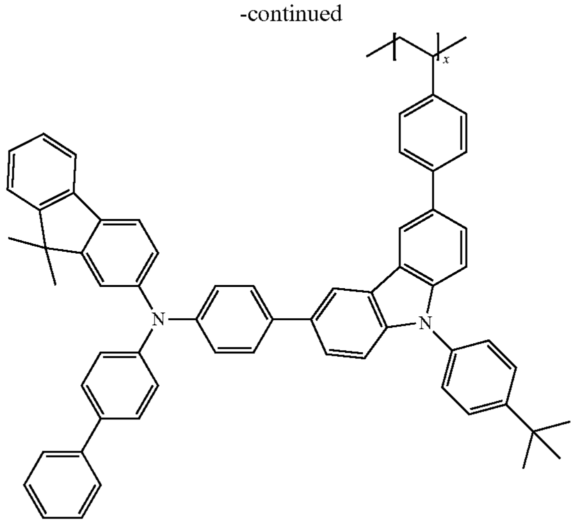
-continued
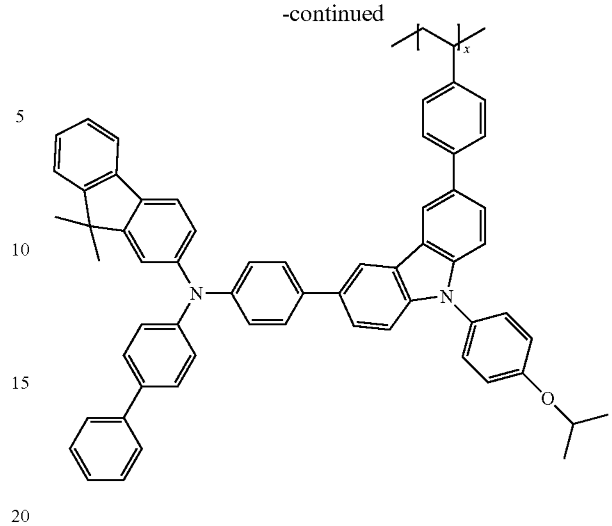
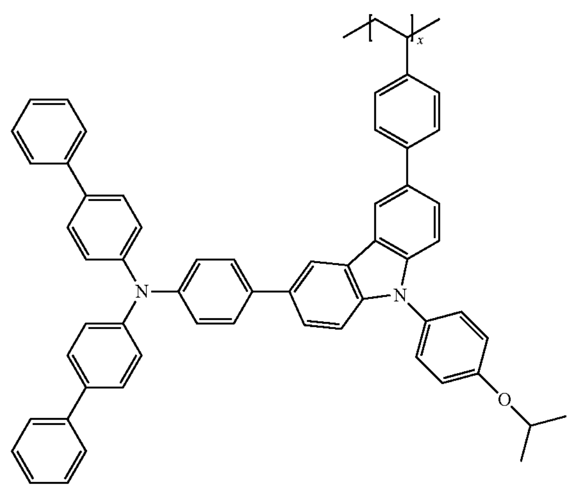
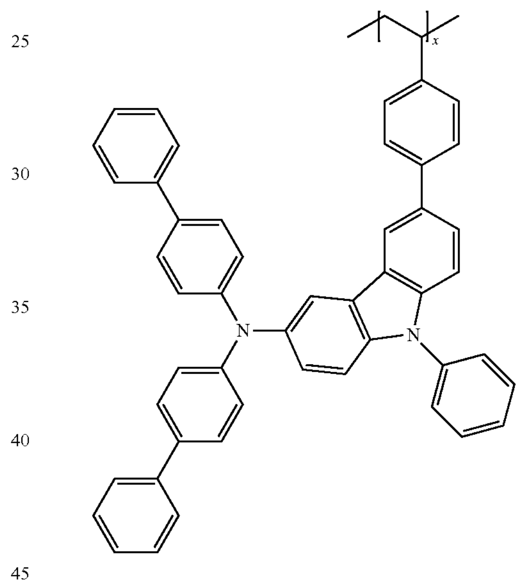
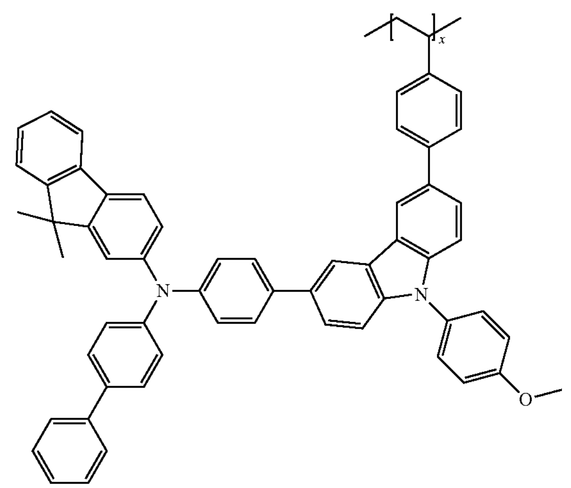
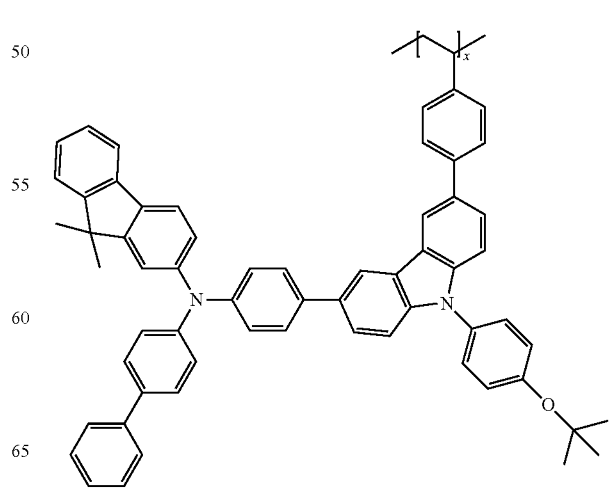

-continued
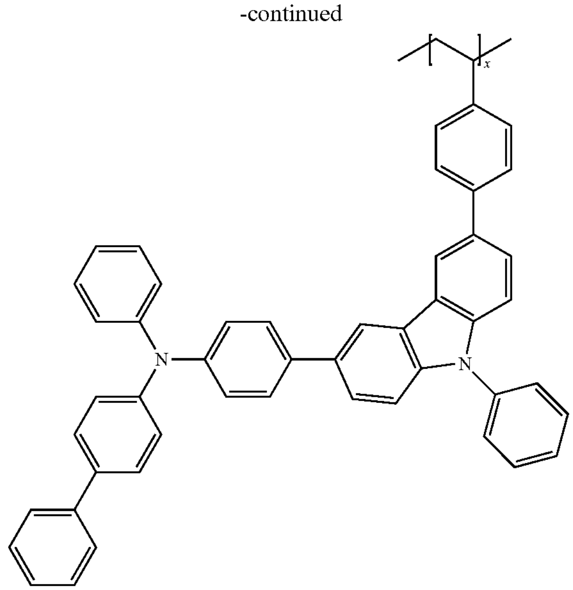
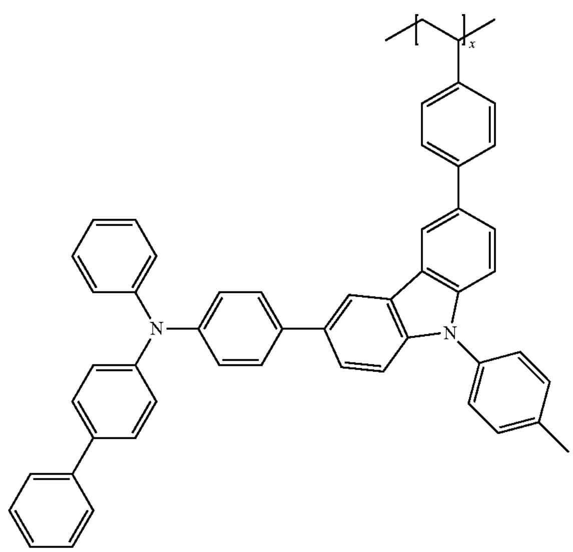
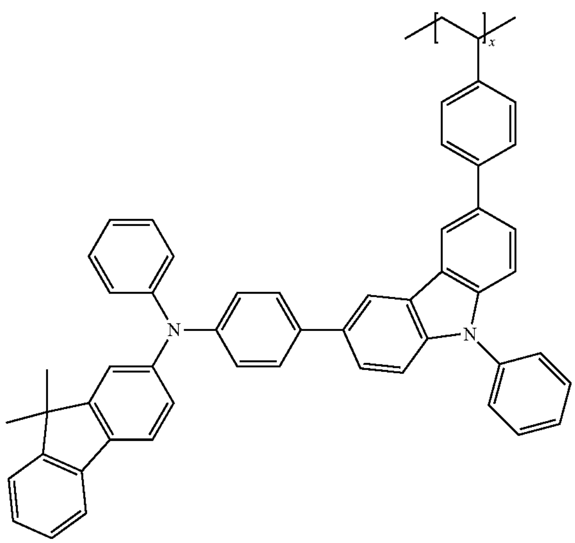
-continued
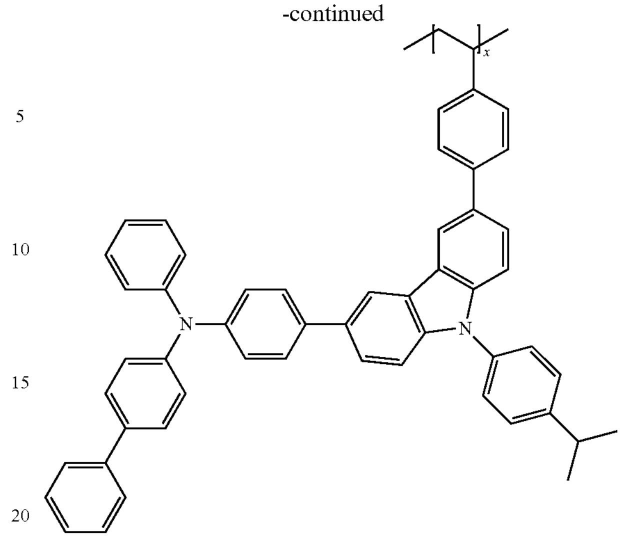
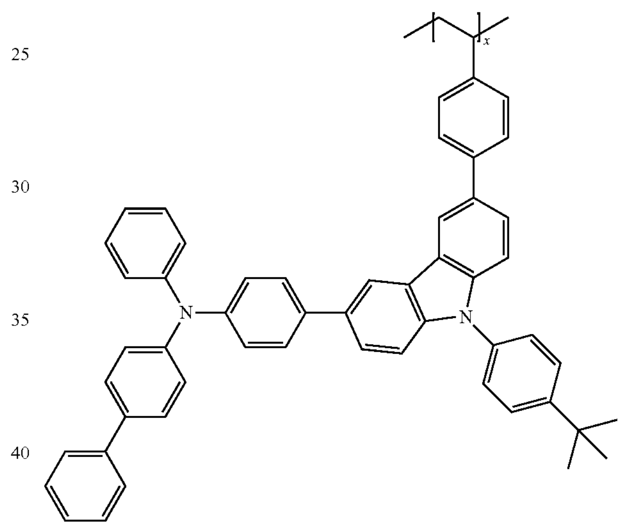
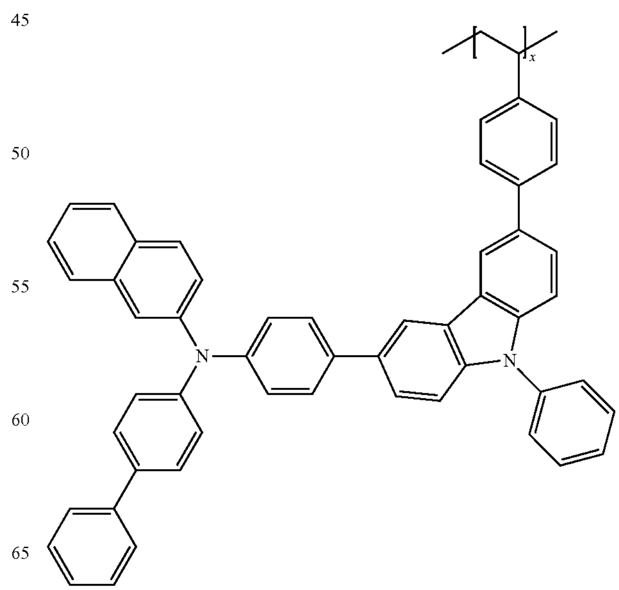

-continued
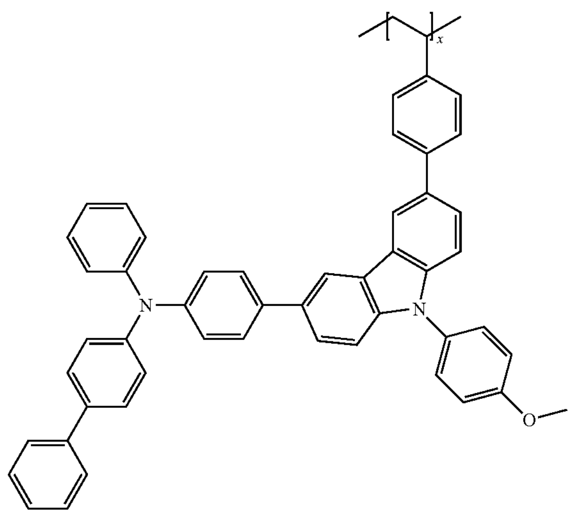
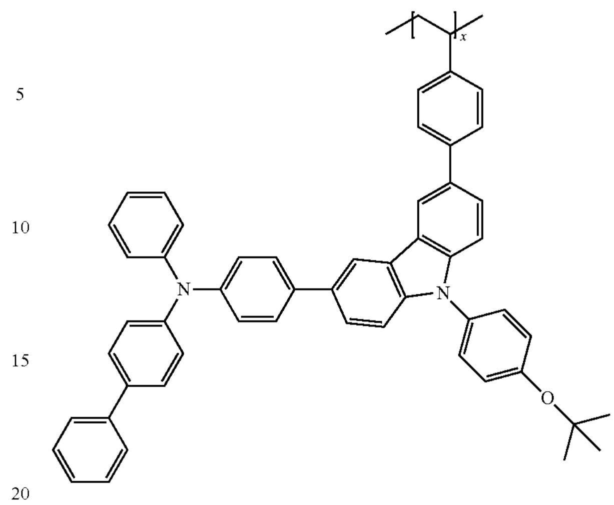
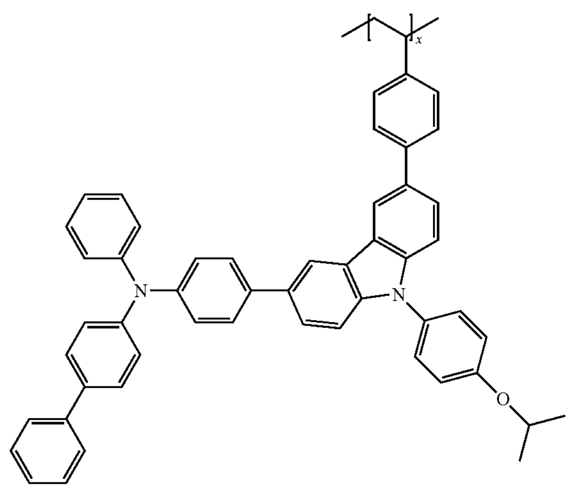
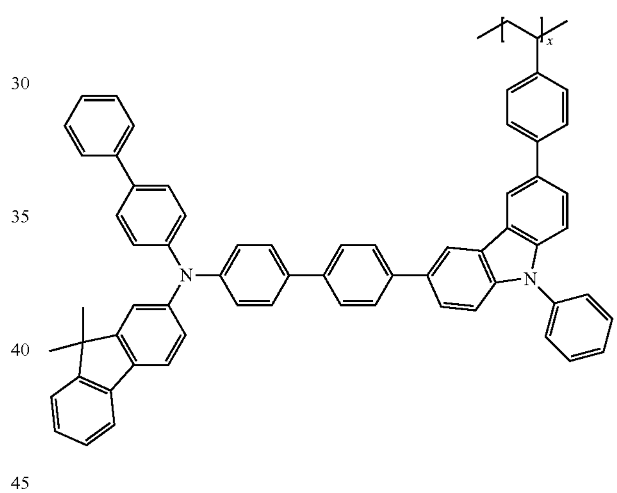
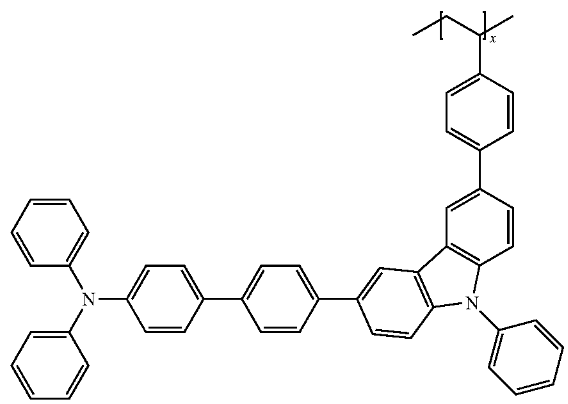
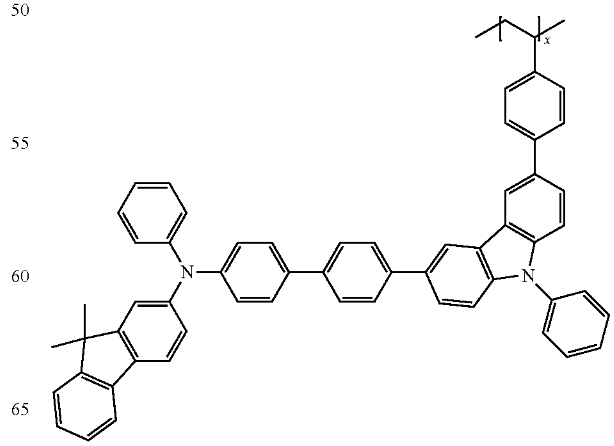

-continued
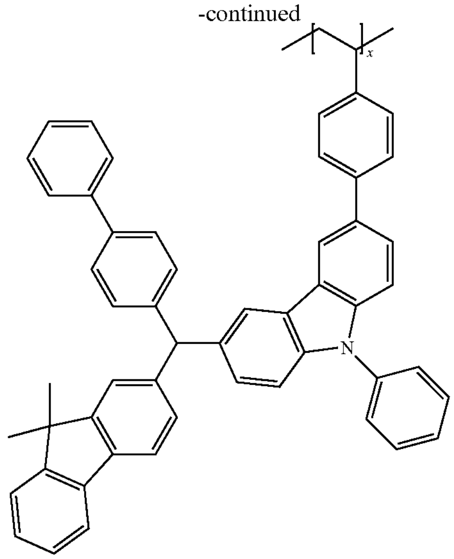
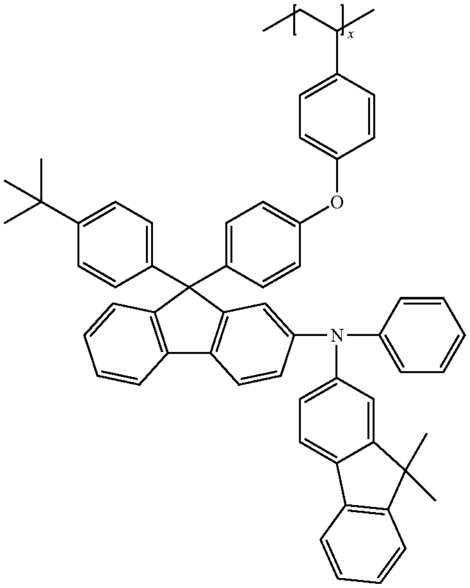
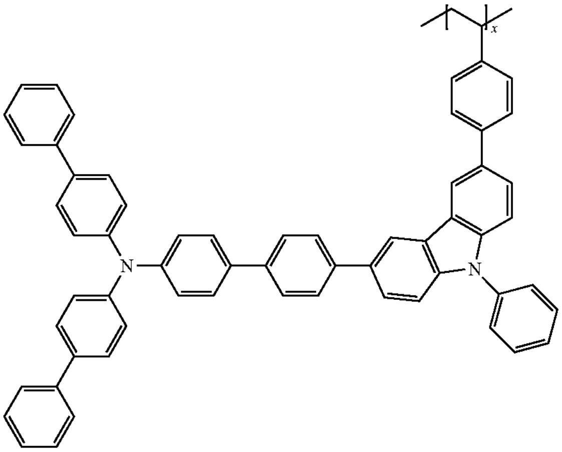
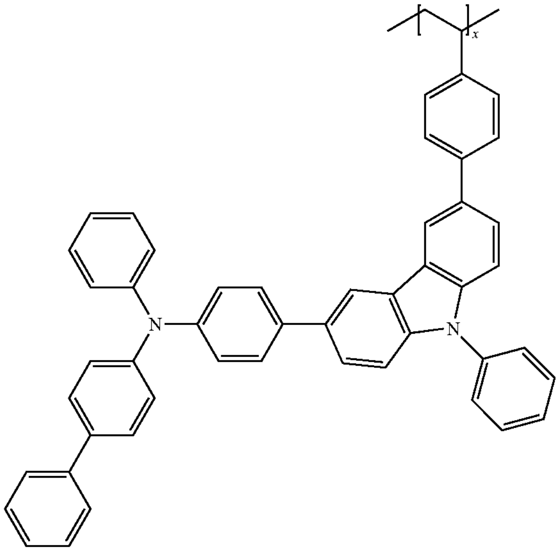
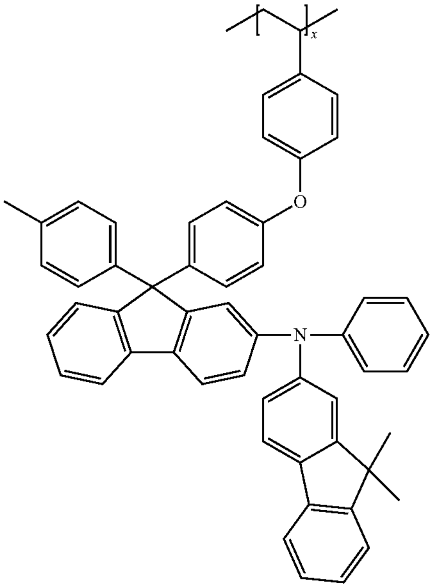

-continued
-continued

-continued
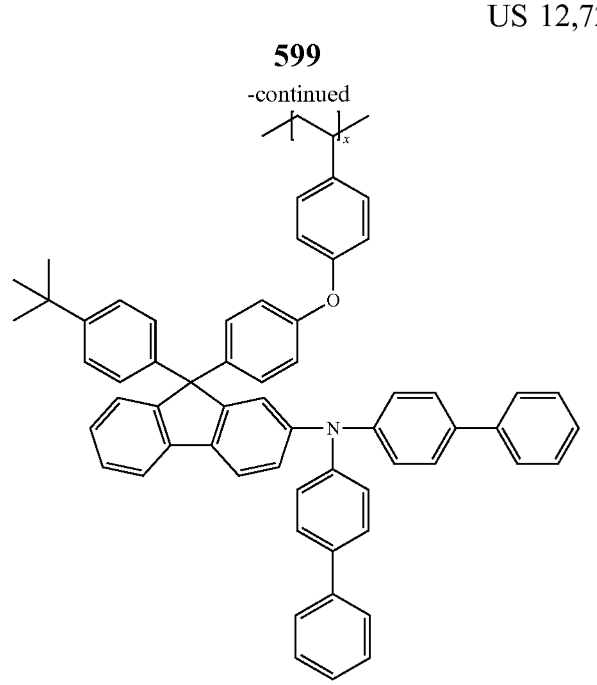
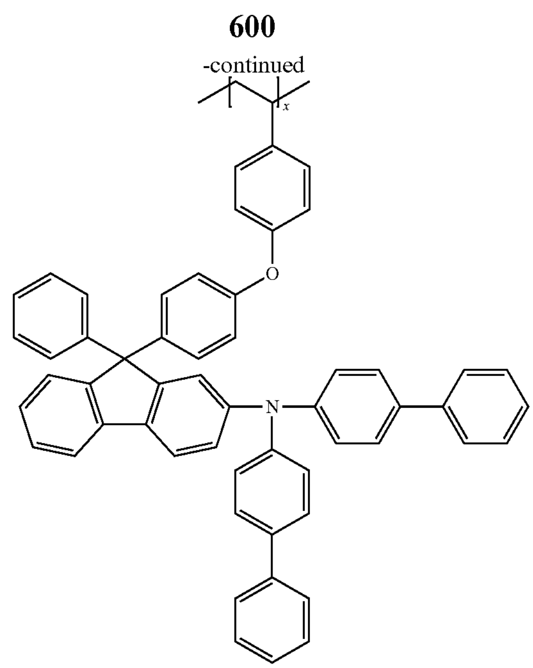
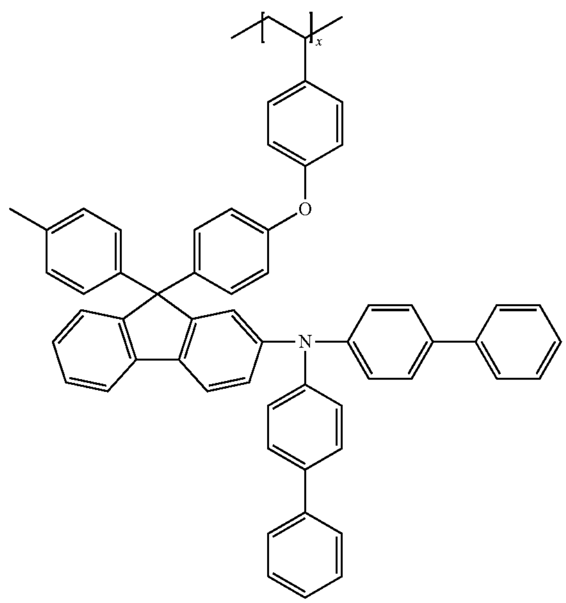
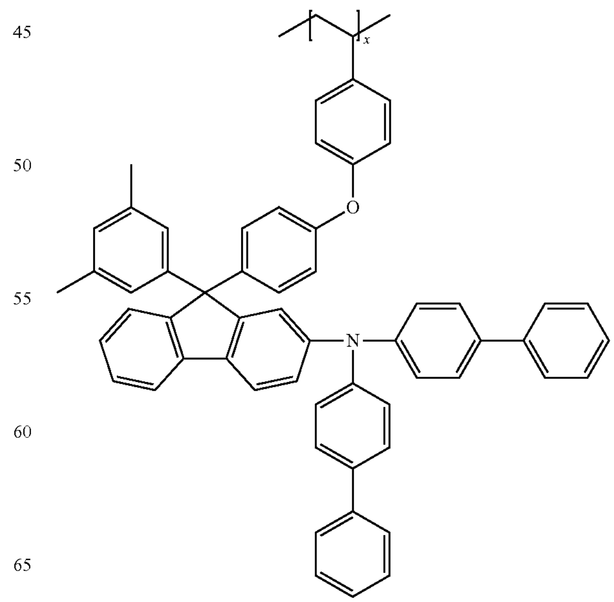

-continued
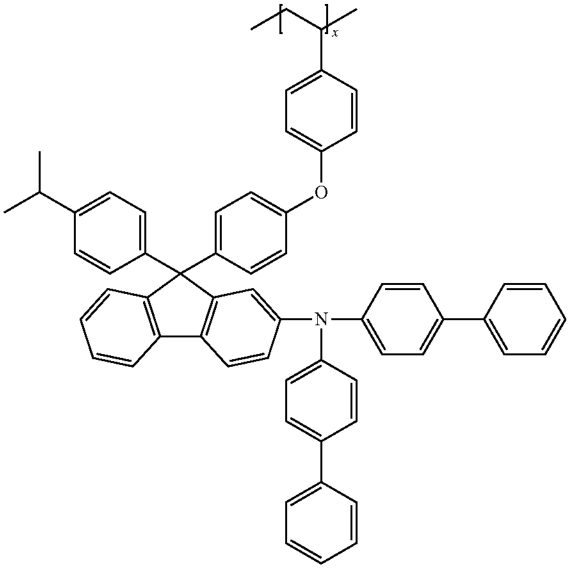
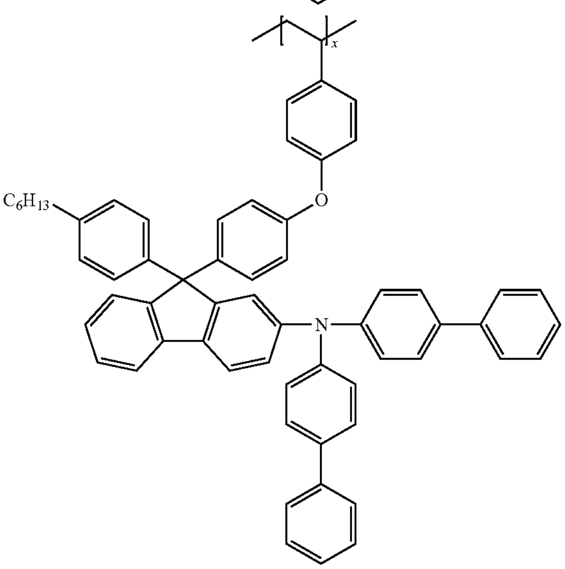
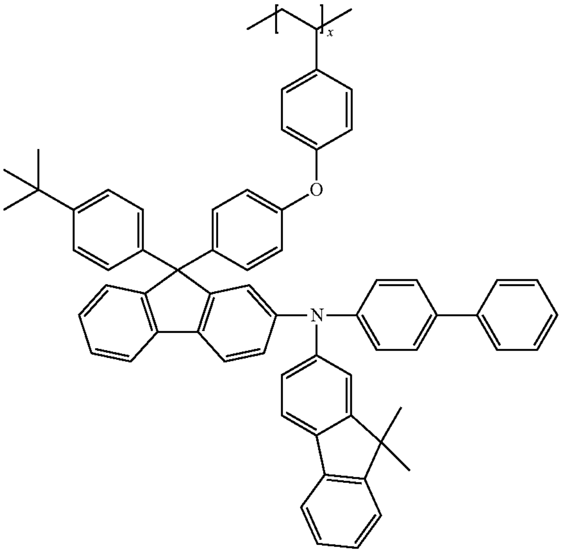
-continued
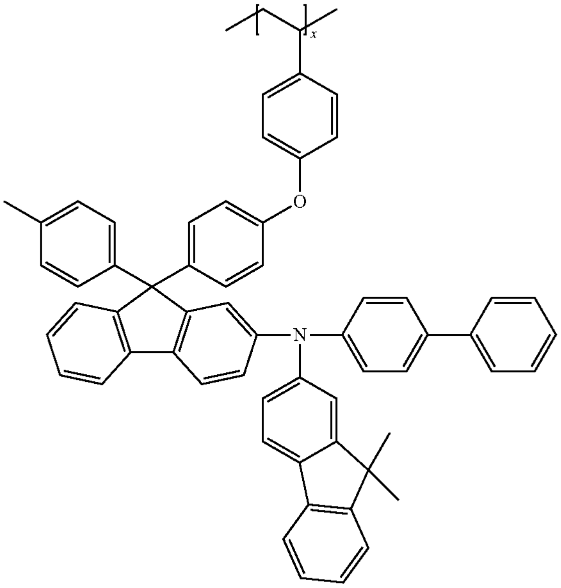
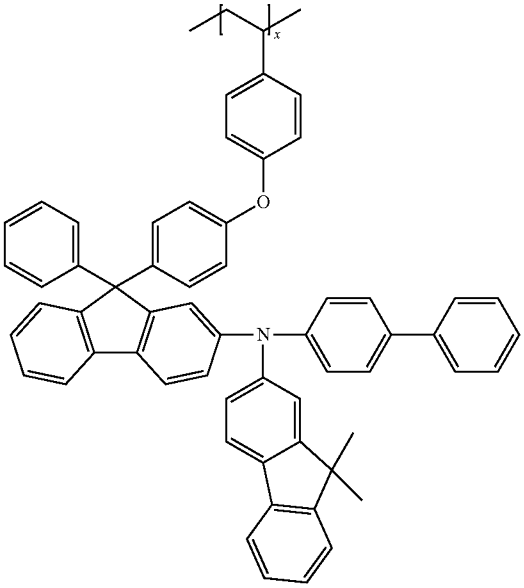

-continued
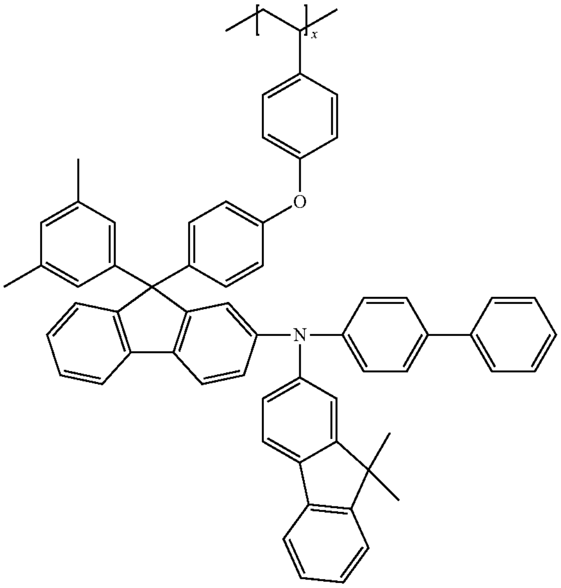
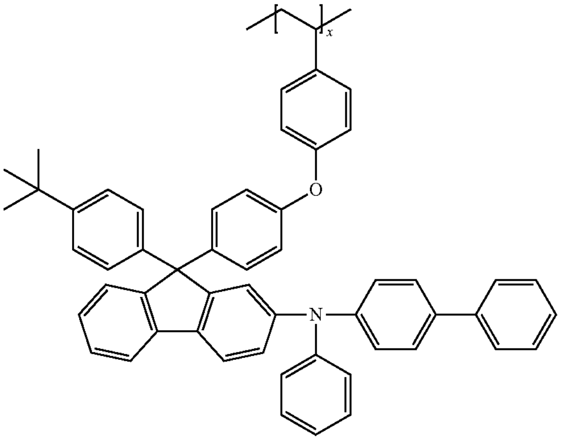
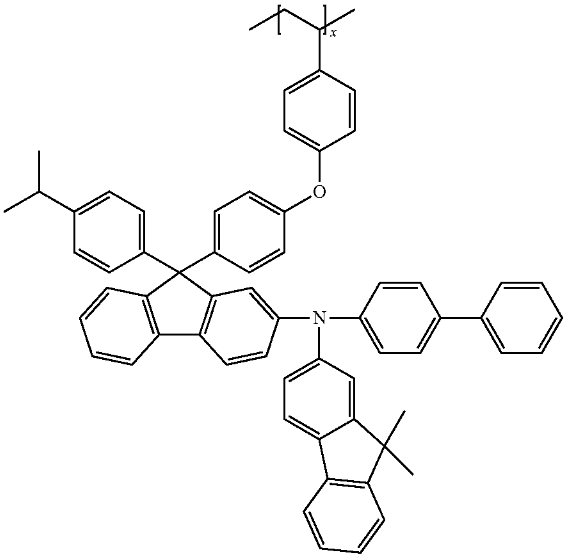
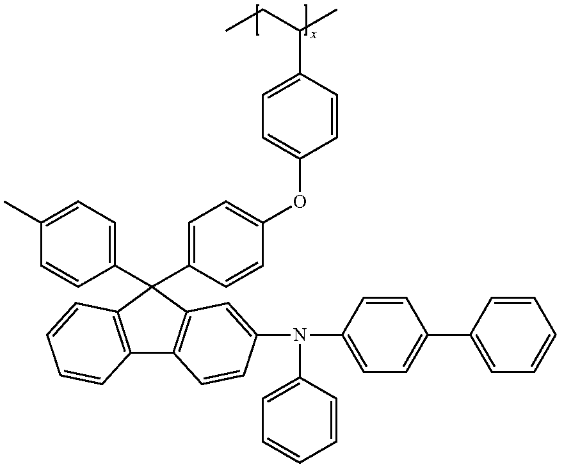
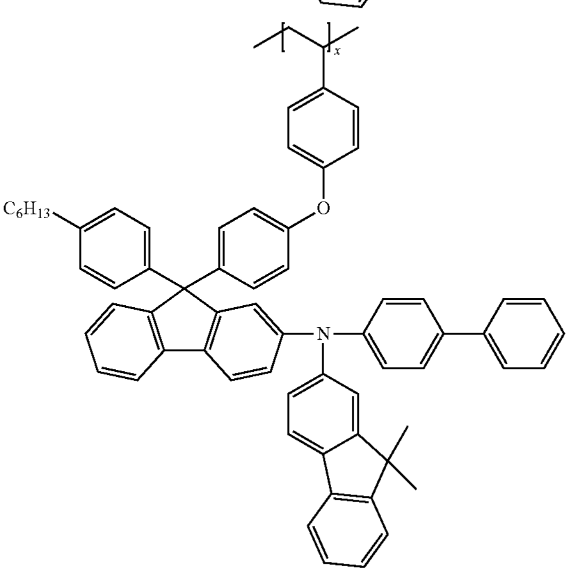
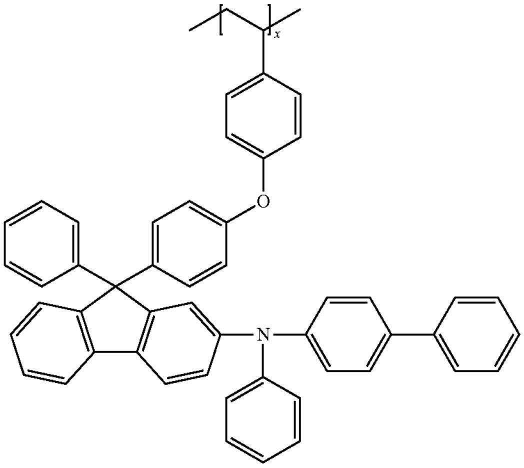

-continued
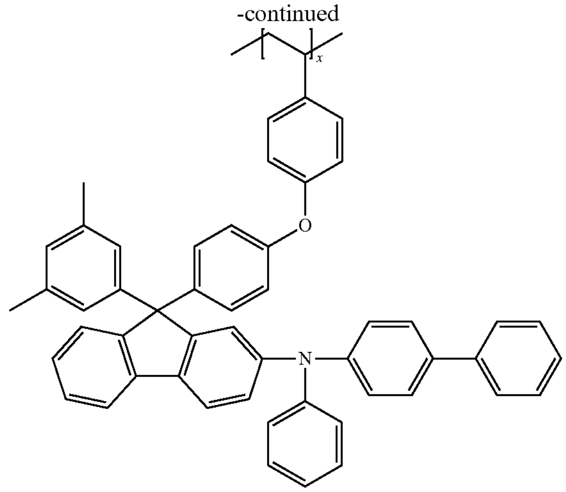
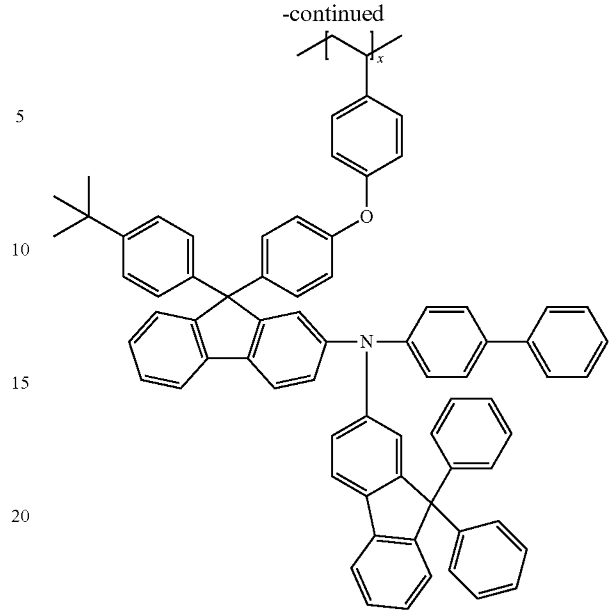
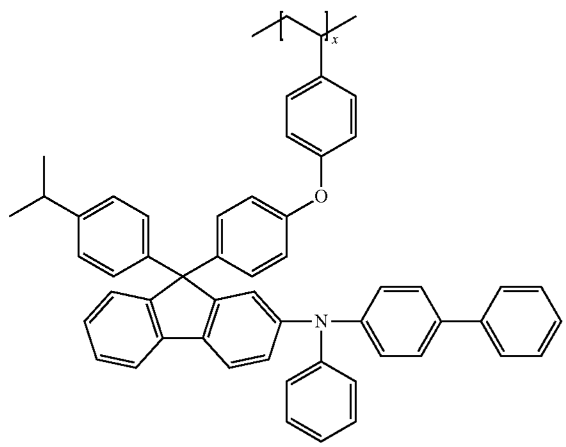
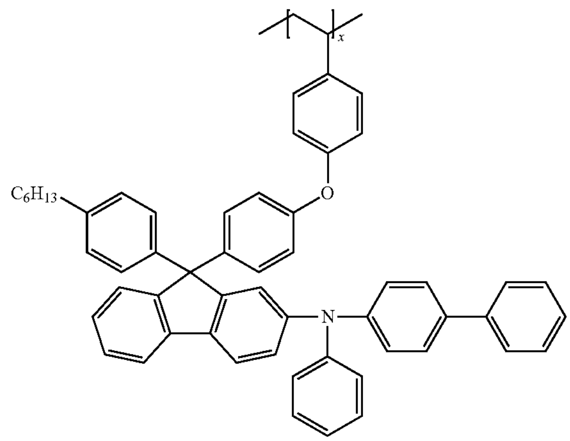
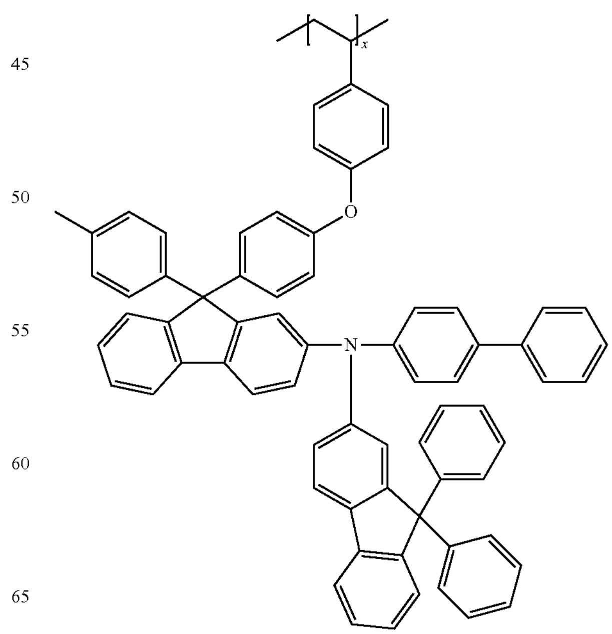
-continued -continued
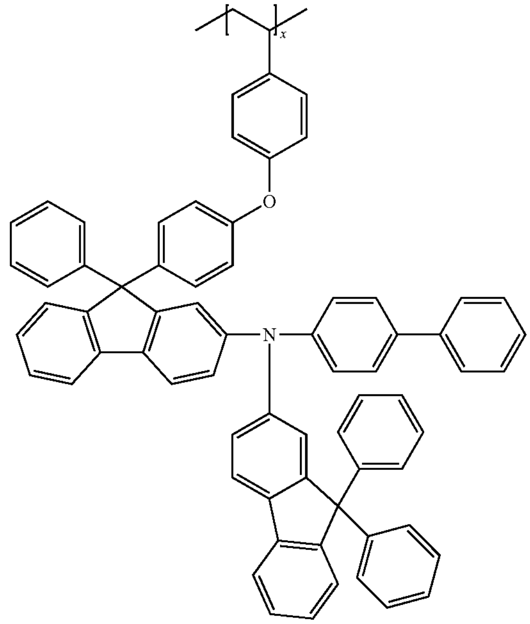
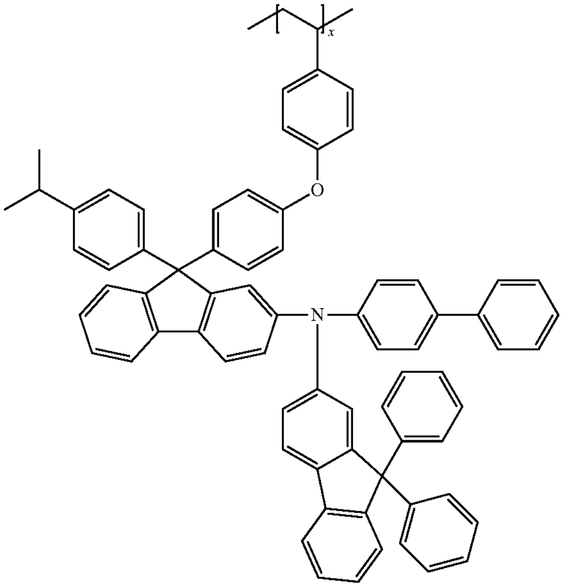
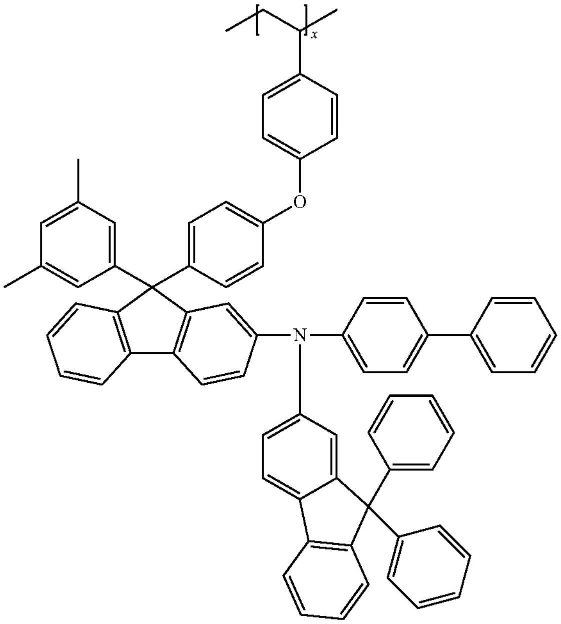
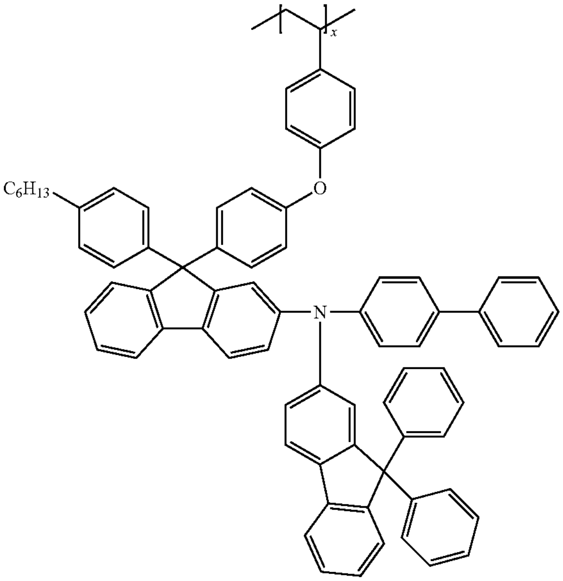

-continued
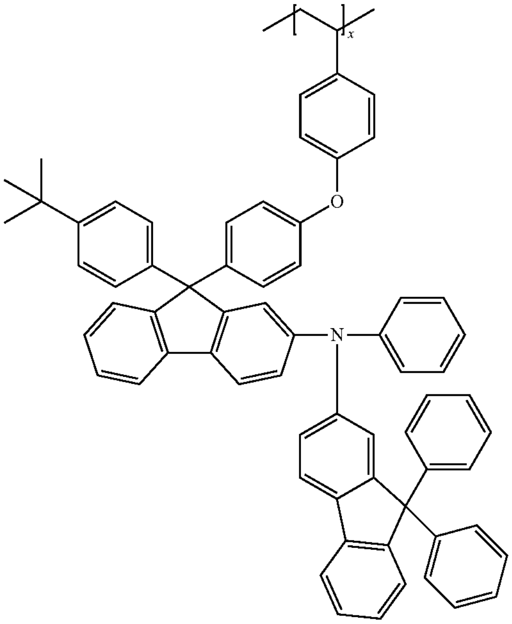
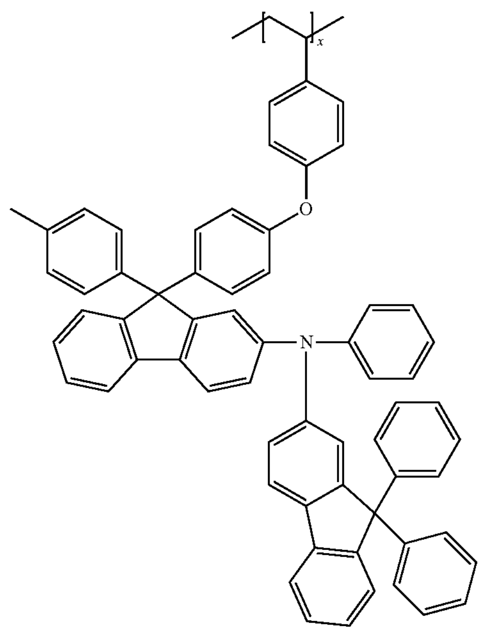
-continued
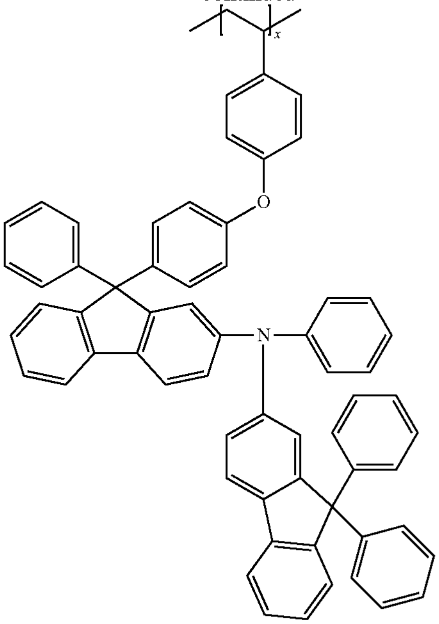
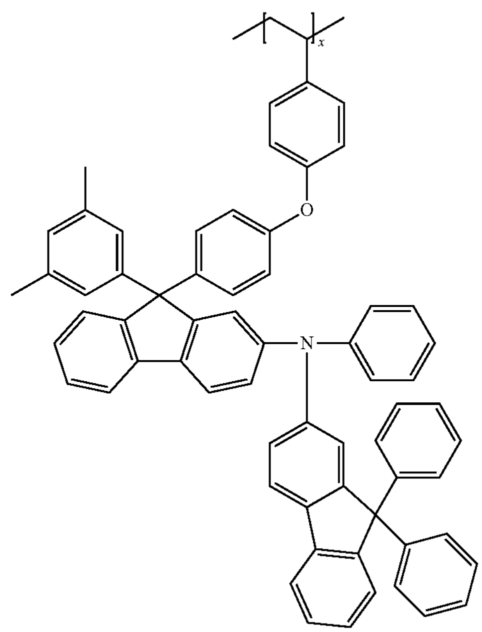

-continued
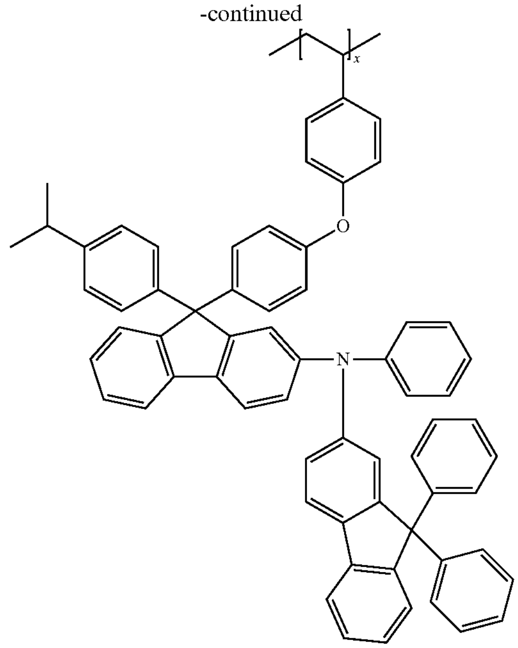
-continued
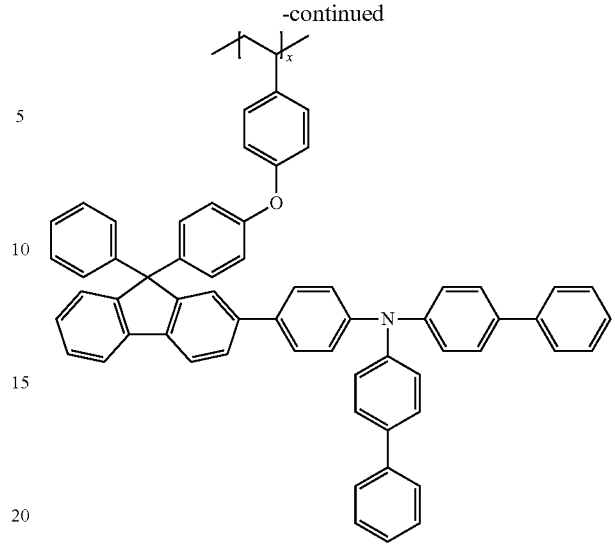
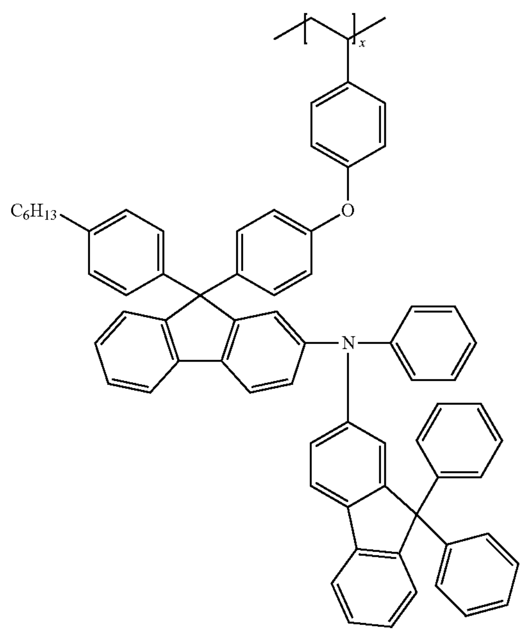
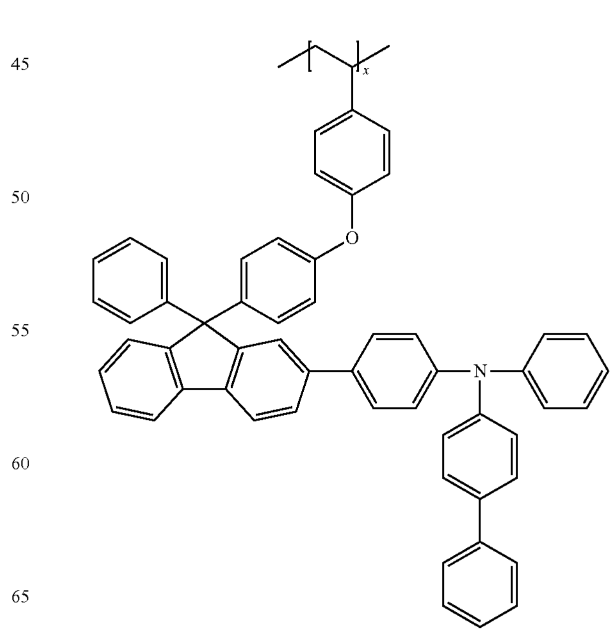

-continued
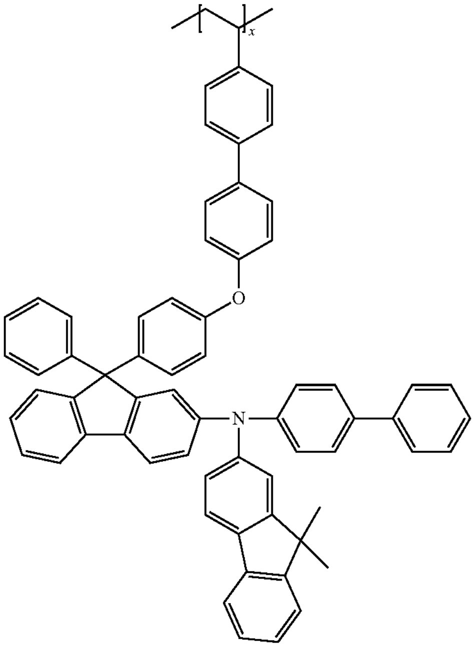
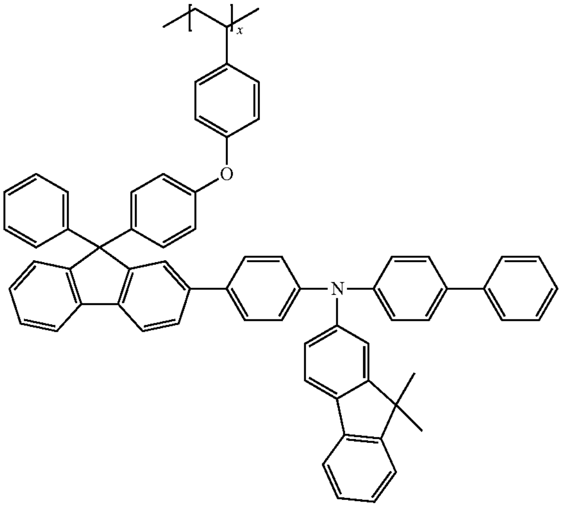
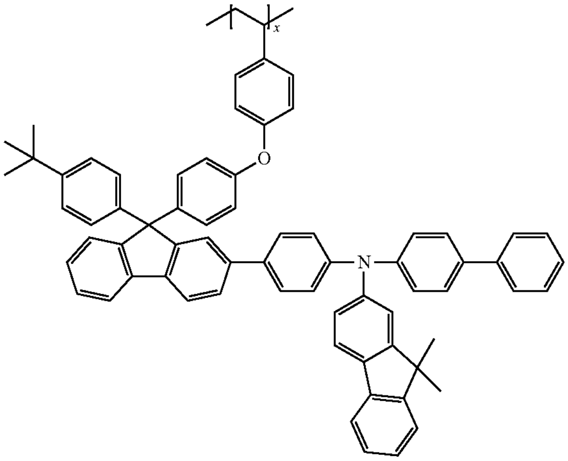
-continued
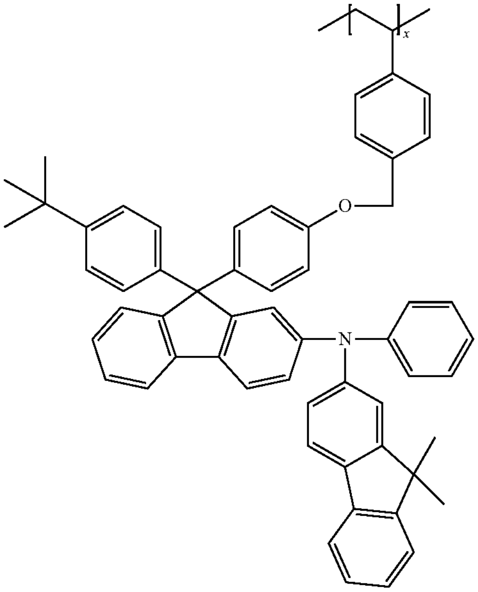
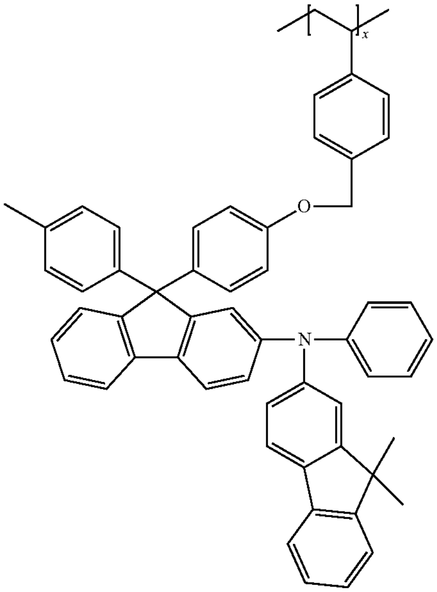

-continued
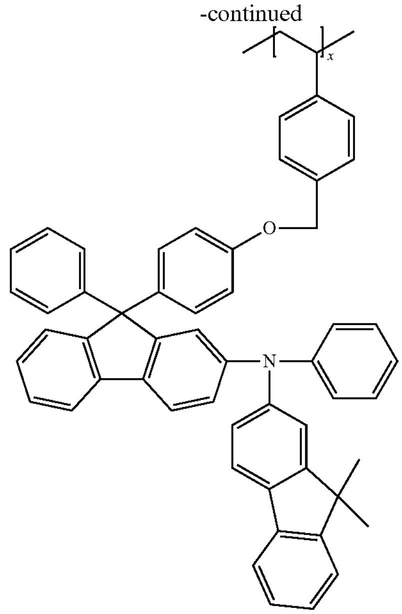
-continued
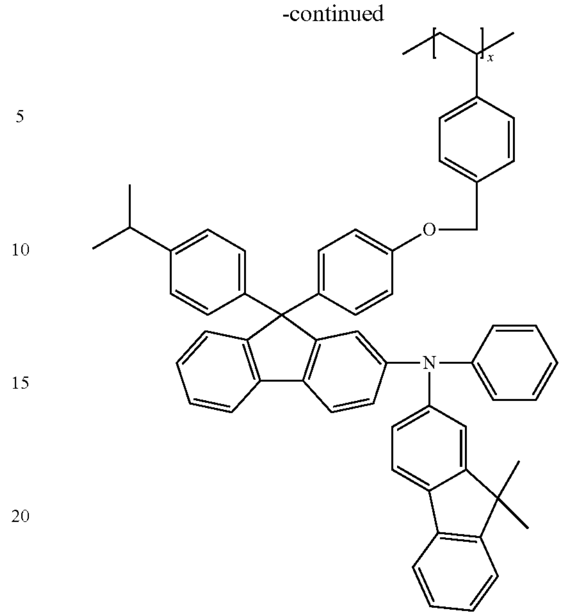
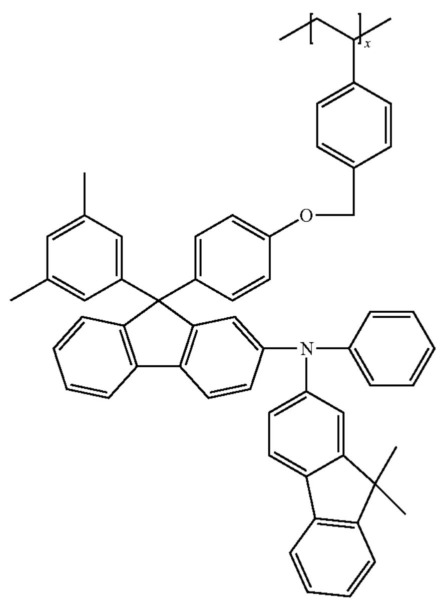
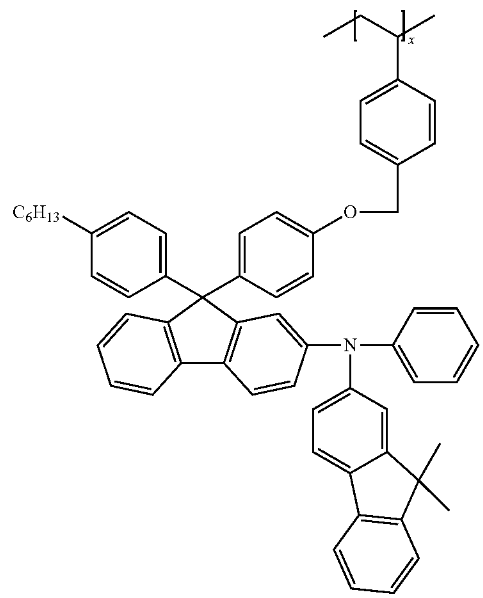

-continued
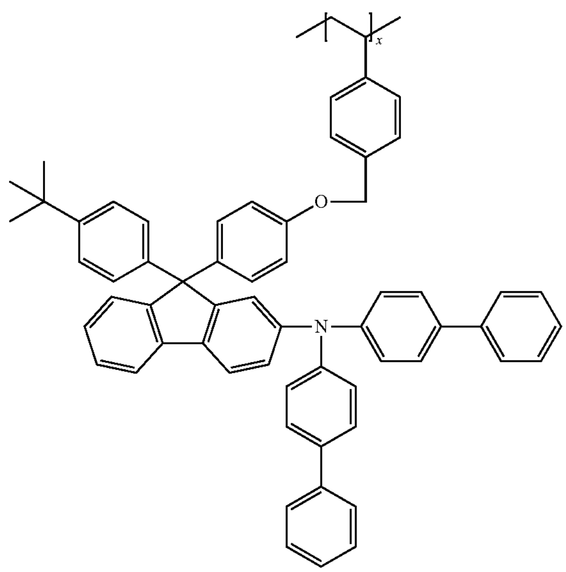
-continued
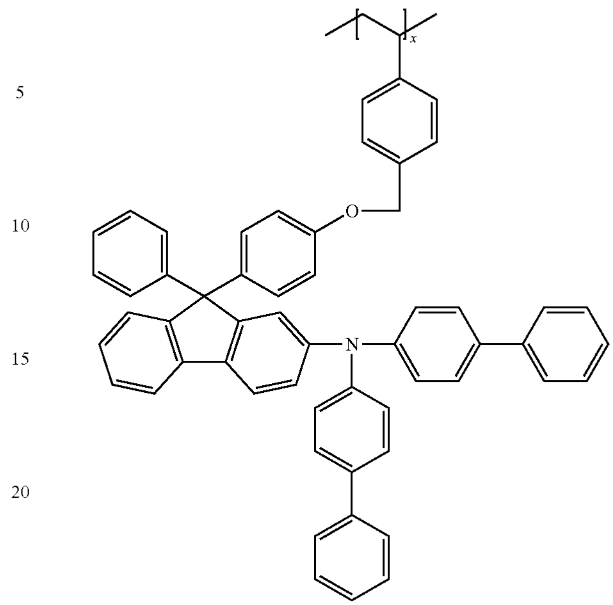
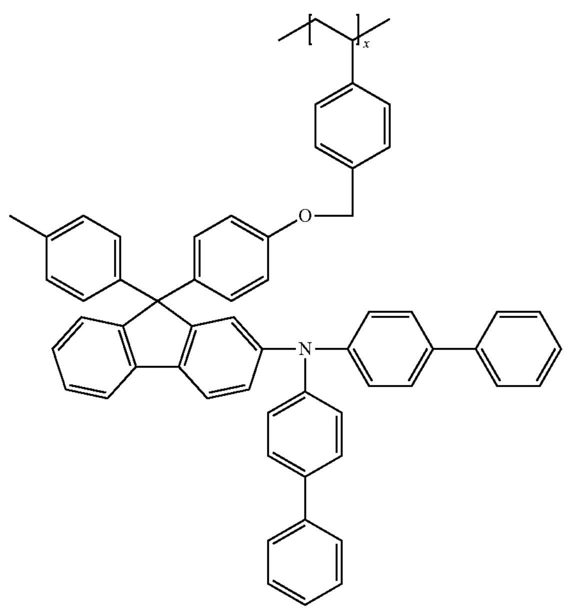
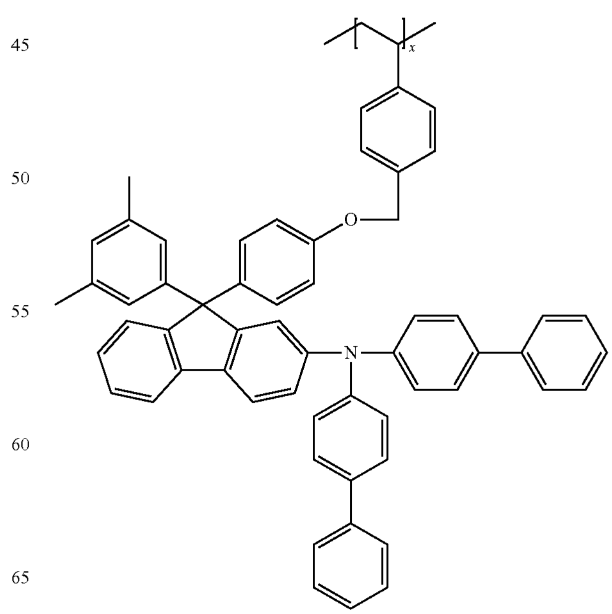

-continued
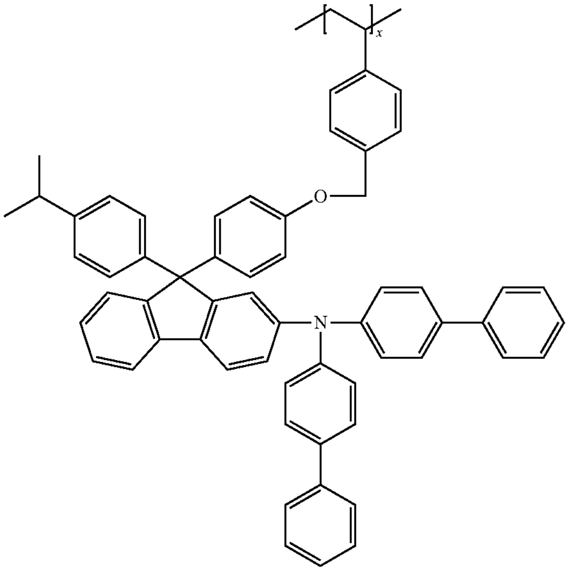
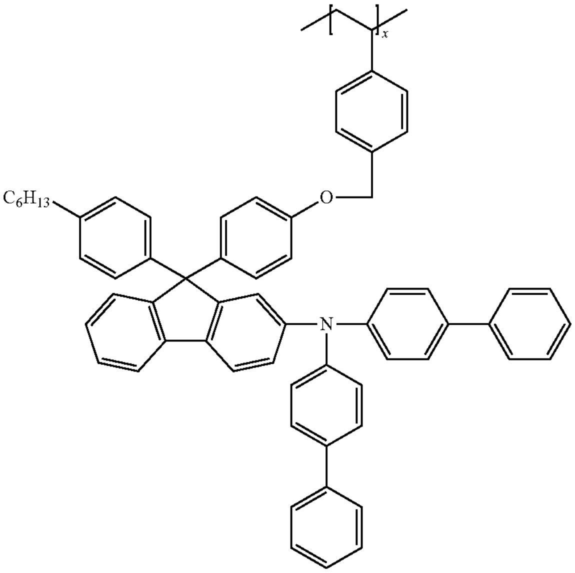
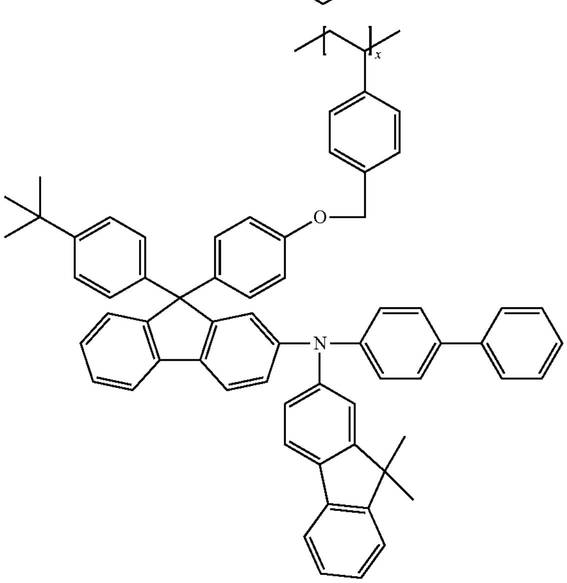
-continued
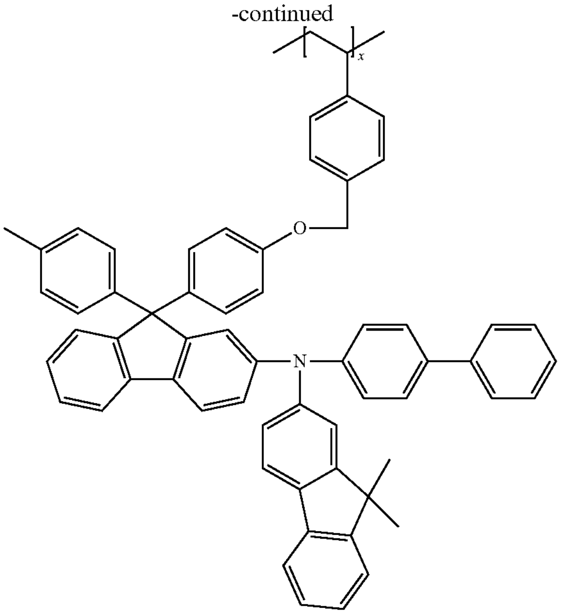
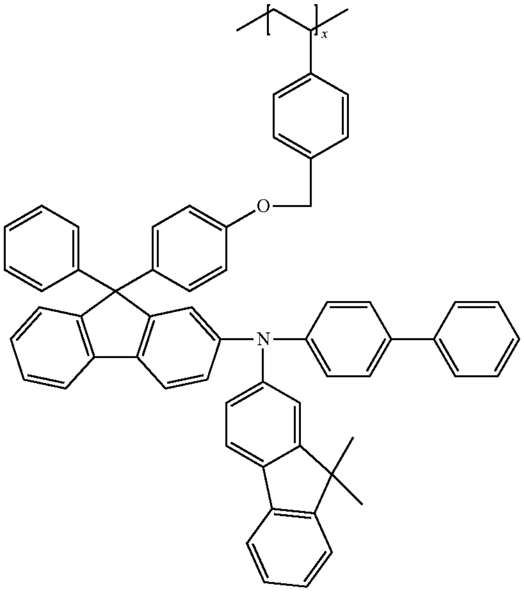

-continued
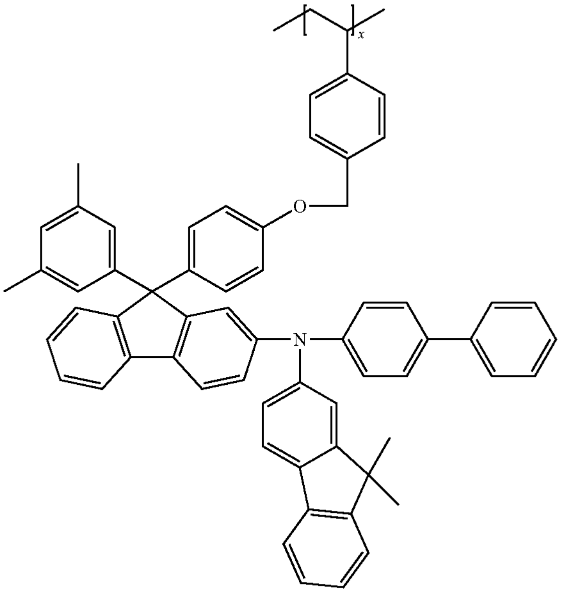
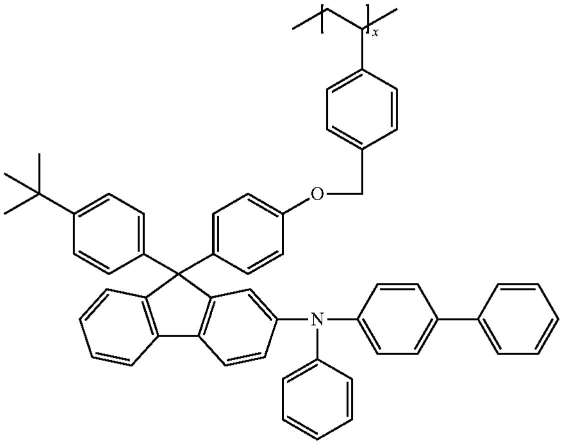
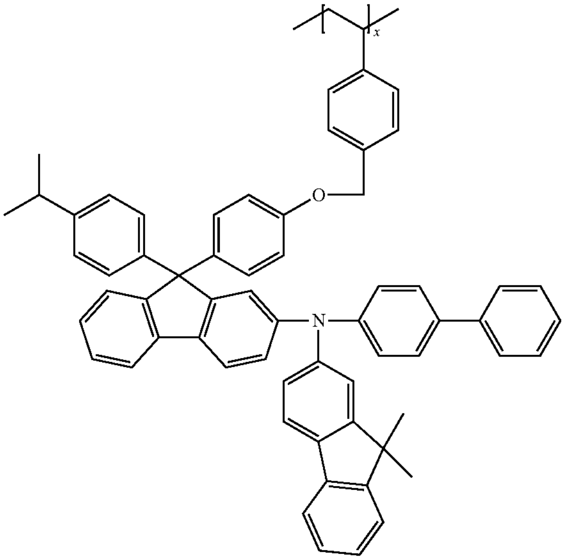
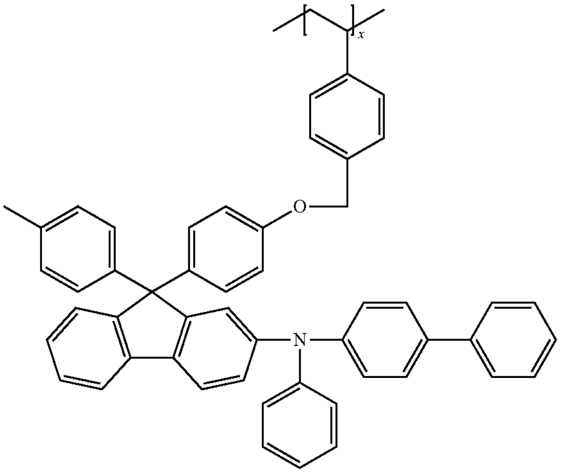
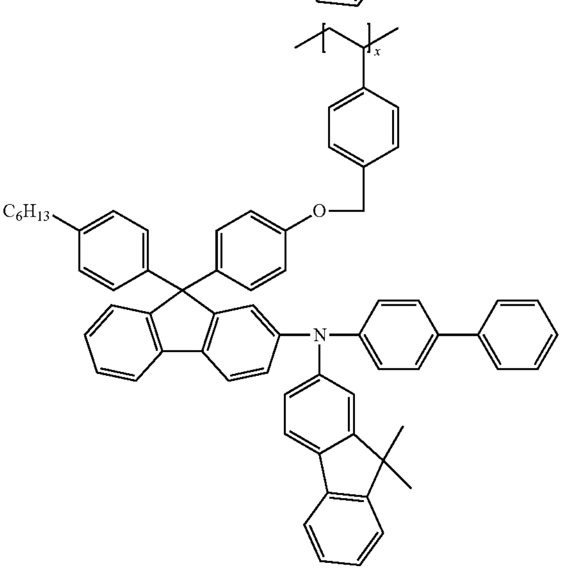
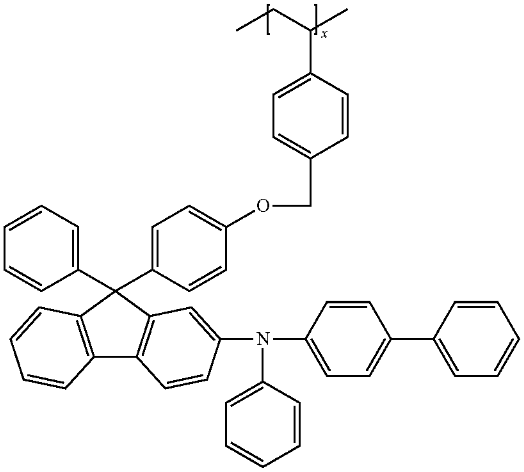
-continued

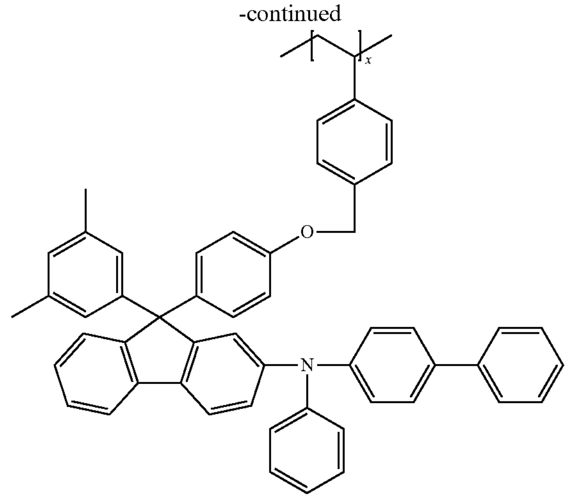
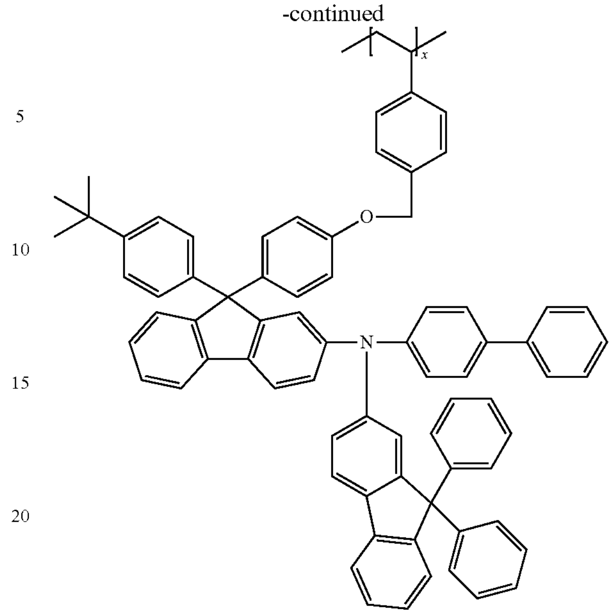
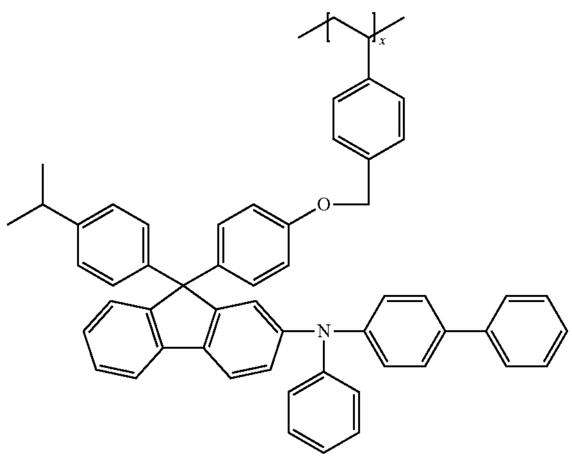
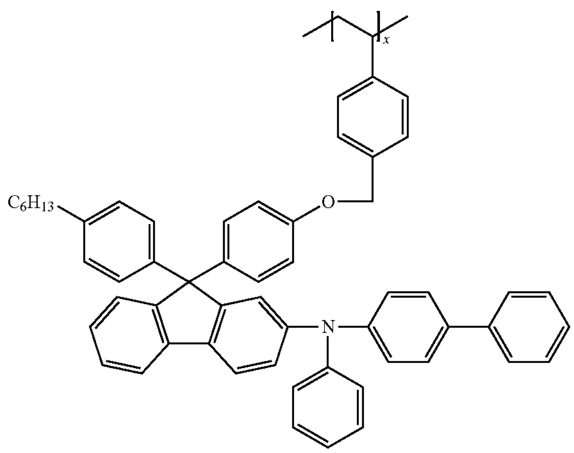
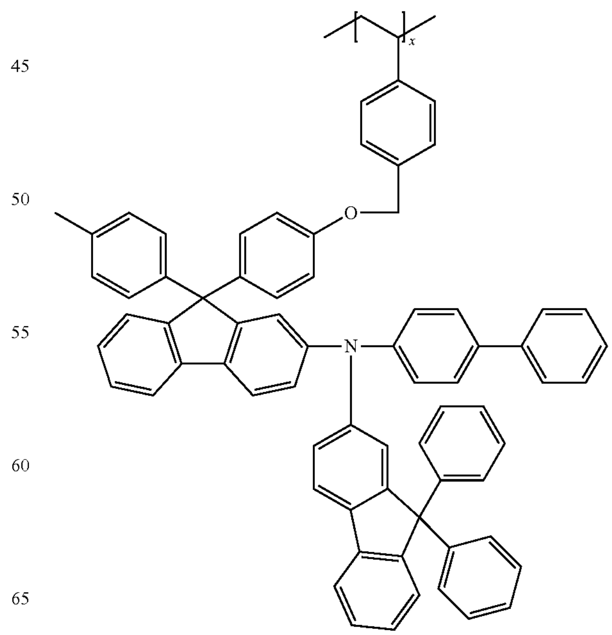

-continued
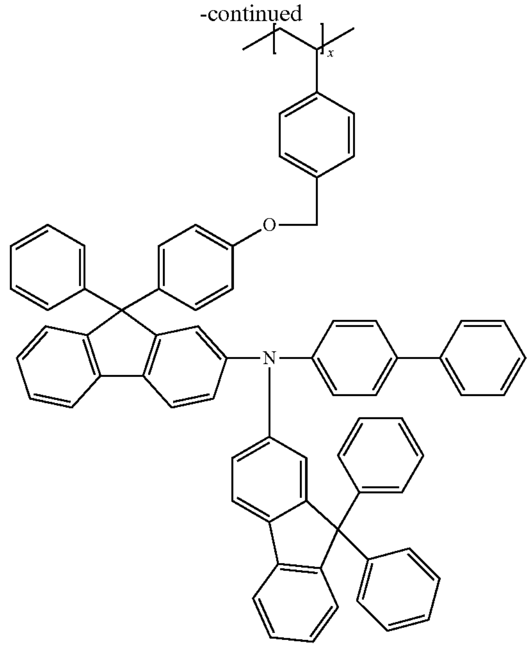
-continued
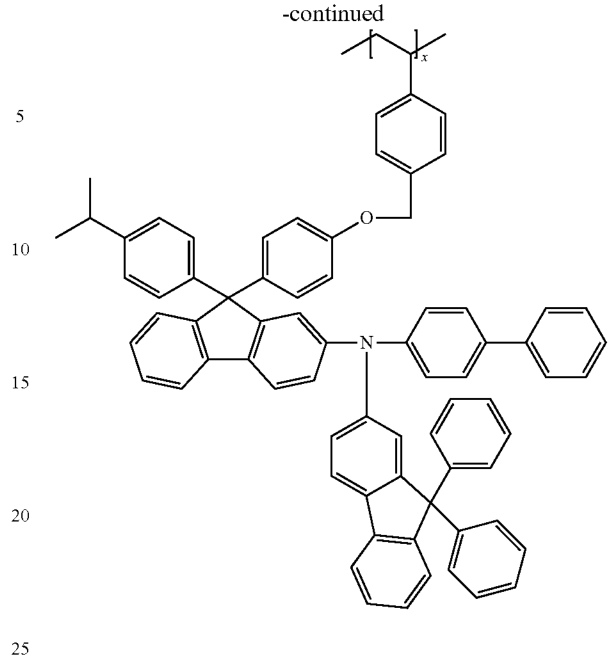
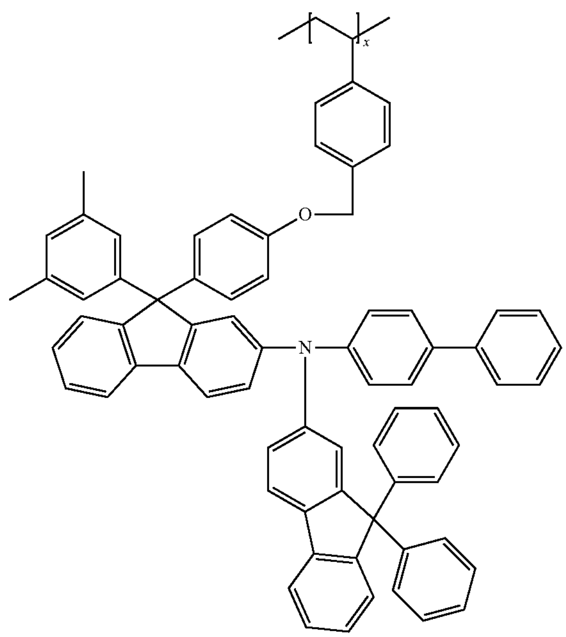
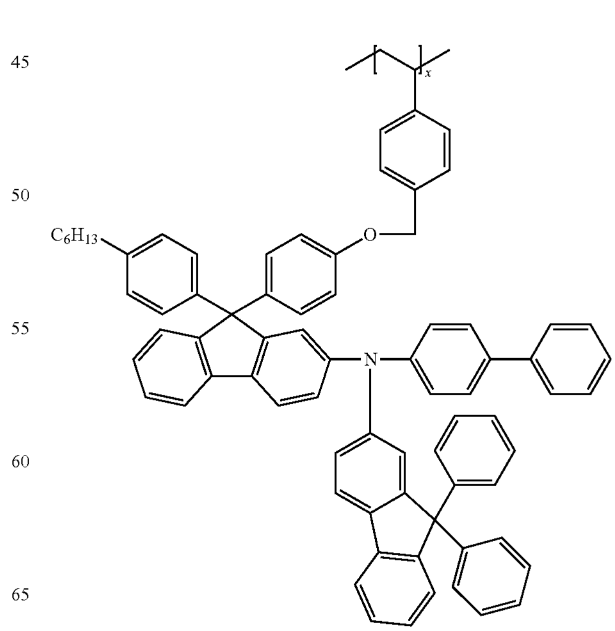

-continued
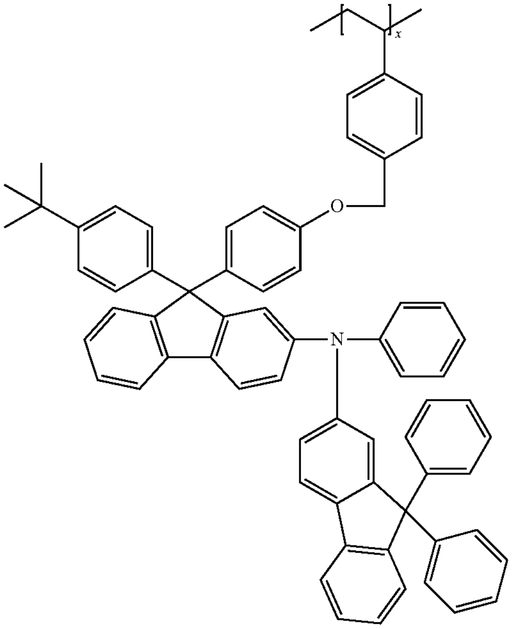
-continued
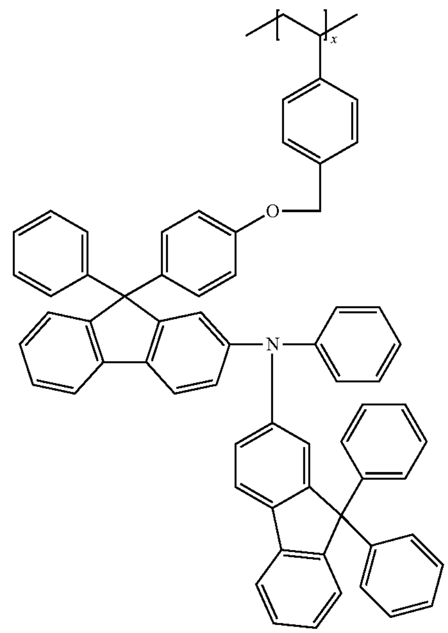
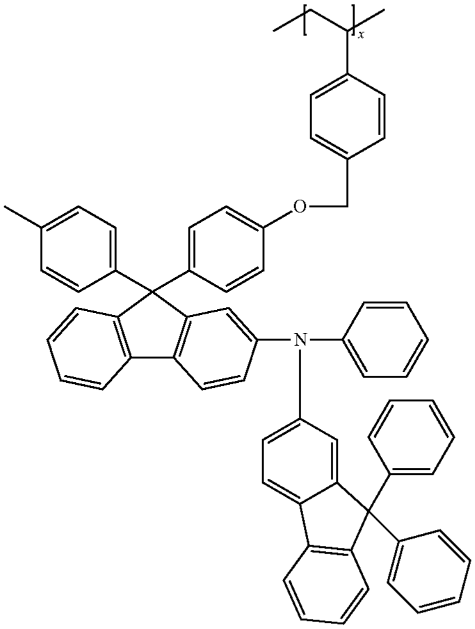
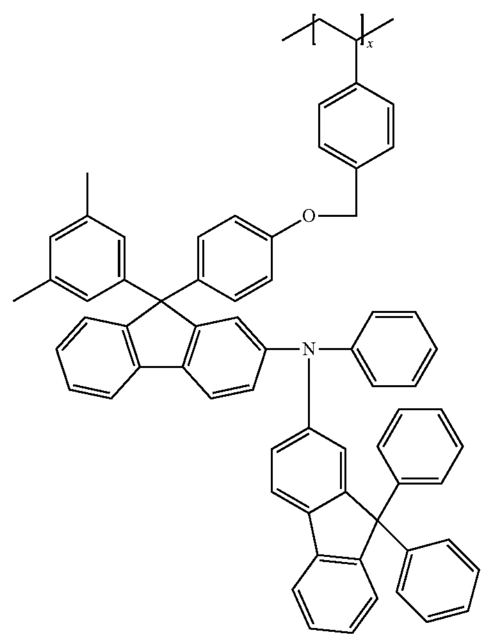

-continued

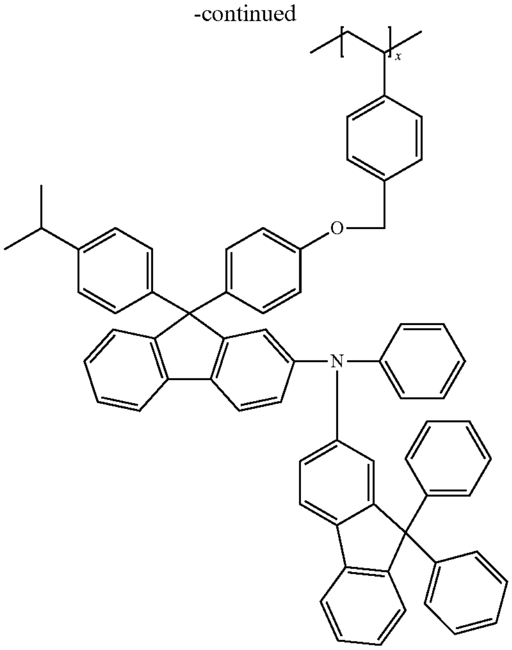

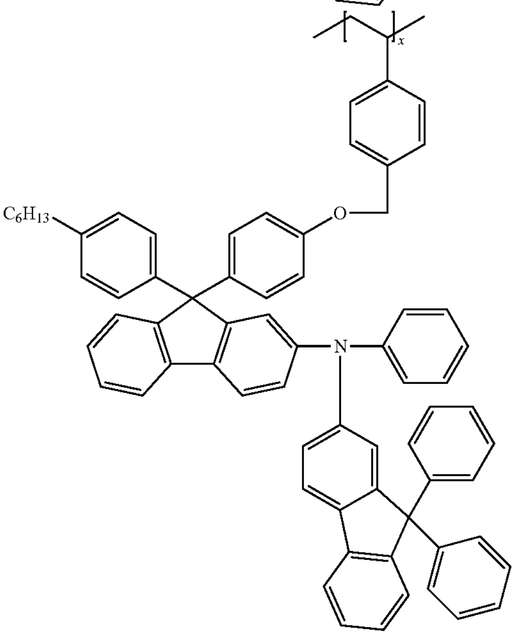

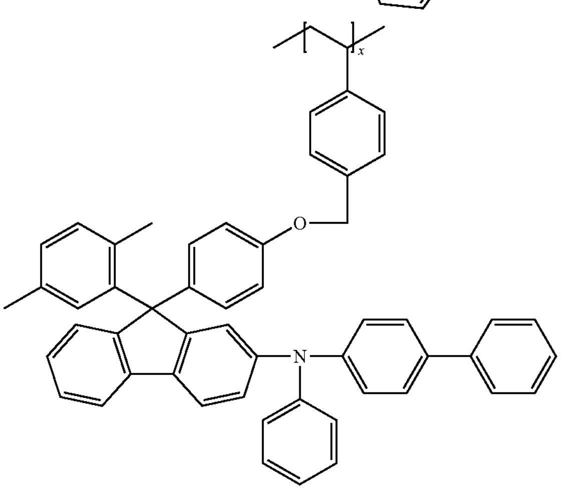

-continued

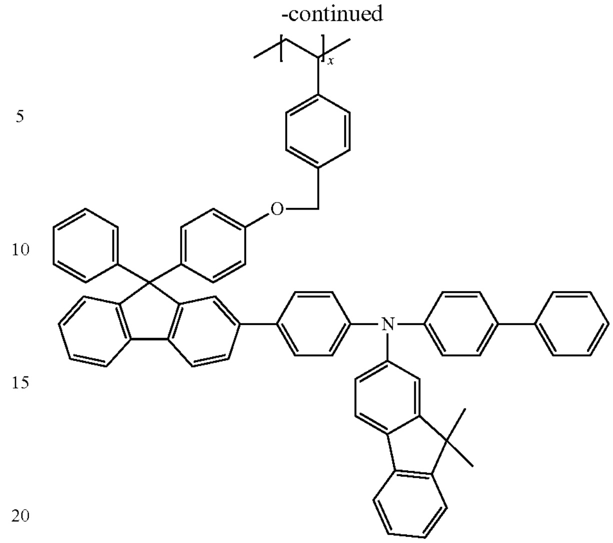

wherein, x is an integer of 8 to 100.

17. The organic light emitting device according to claim 1, wherein the polymer is a homopolymer containing only the repeating unit represented by Chemical Formula 2.

18. The organic light emitting device according to claim 1, wherein at least one of the compound represented by Chemical Formula 1 or the polymer including the repeating unit represented by Chemical Formula 2 is at least 10% deuterated.

19. The organic light emitting device according to claim 1, wherein the hole injection layer further comprises a compound represented by the following Chemical Formula 3:

[Chemical Formula 3]

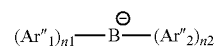

in the Chemical Formula 3, n1 and n2 are each independently an integer of 1 to 3, provided that n1+n2 is 4, $Ar''_1$ is

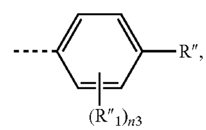

R" is a photo-curable group; or a thermo-curable group, each $R''_1$ is independently hydrogen, halogen, or $C_{1-60}$ haloalkyl, n3 is an integer from 1 to 4, Ar"$_2$ is
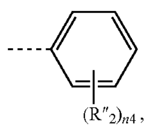
each R"$_2$ is independently hydrogen, halogen, $C_{1-60}$ haloalkyl, a photocurable group, or a thermo-curable group, and
n4 is an integer of 1 to 5.
20. The organic light emitting device according to claim 19,
wherein the compound represented by Chemical Formula 3 is any one selected from the group consisting of the following:
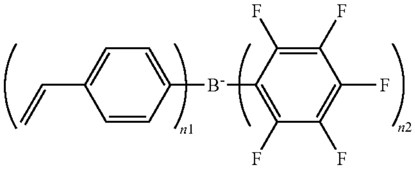
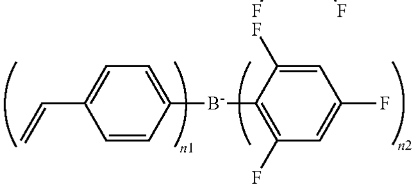
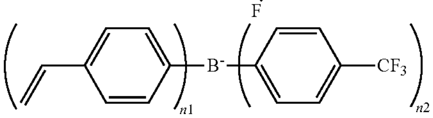
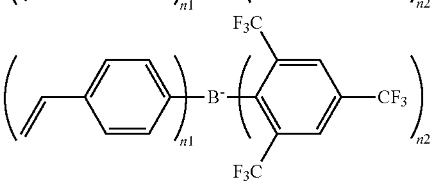
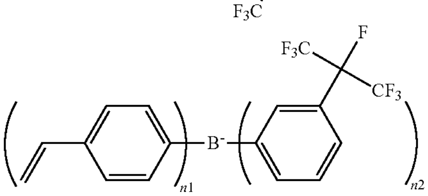
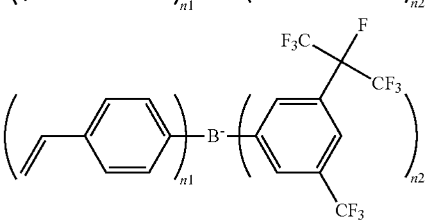
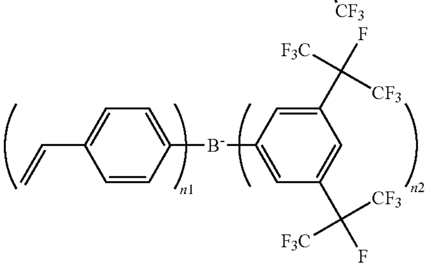
-continued
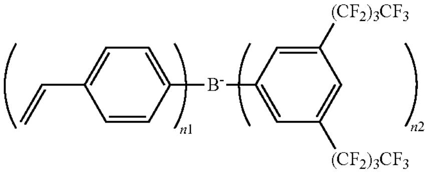
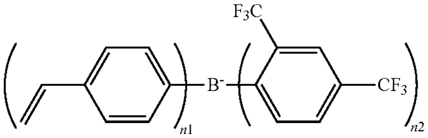
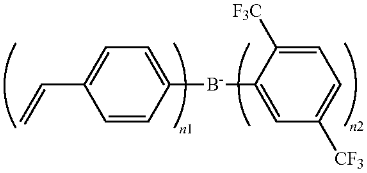
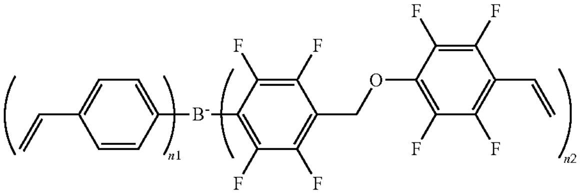
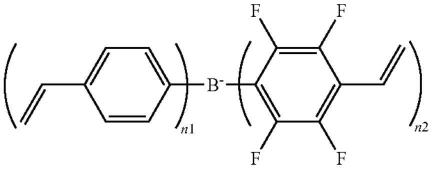
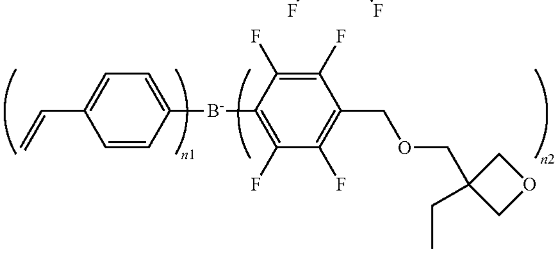
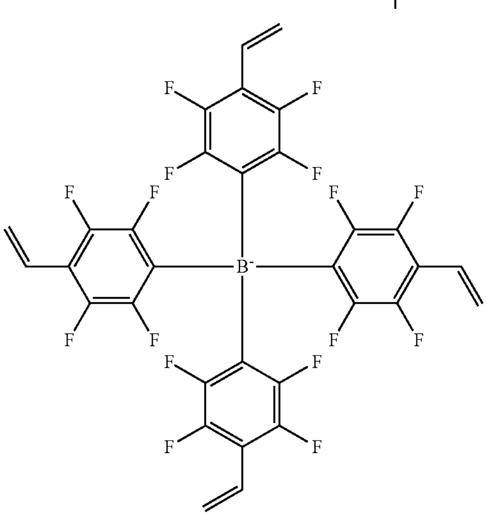

-continued
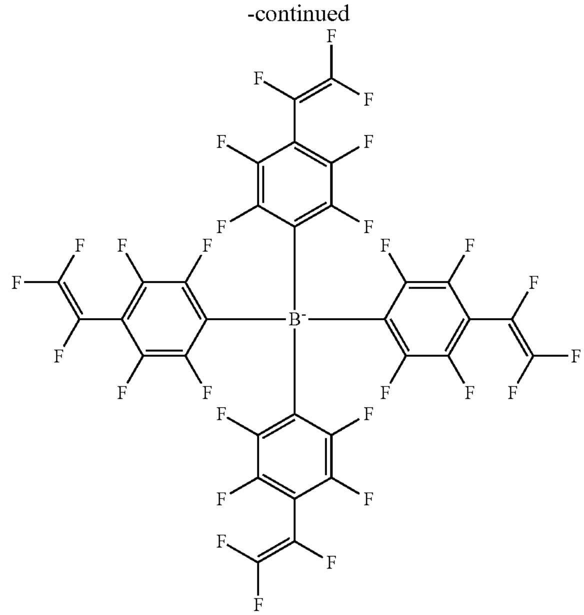
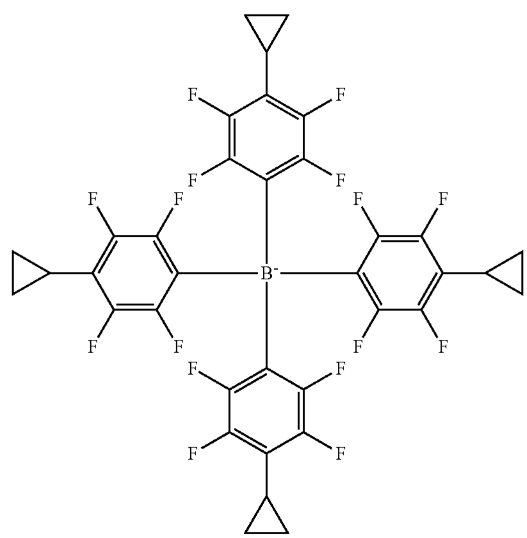
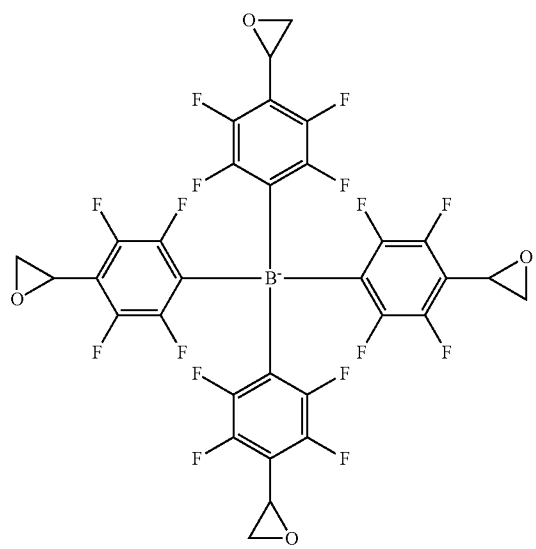
-continued
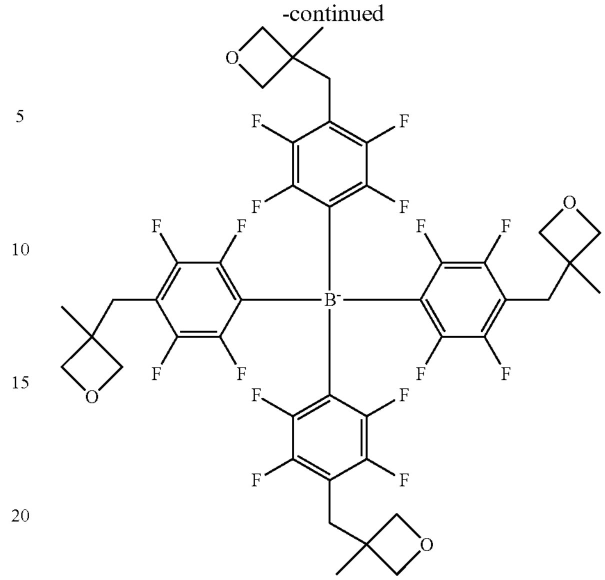
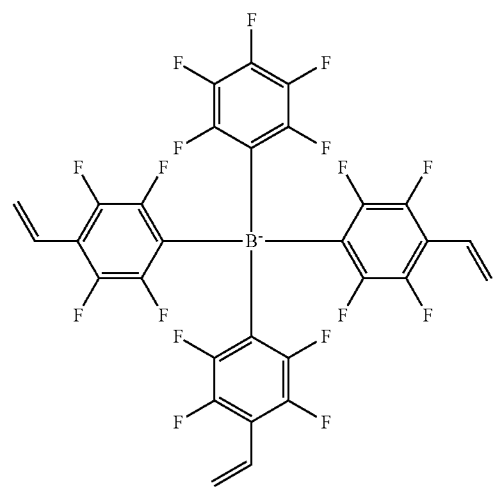
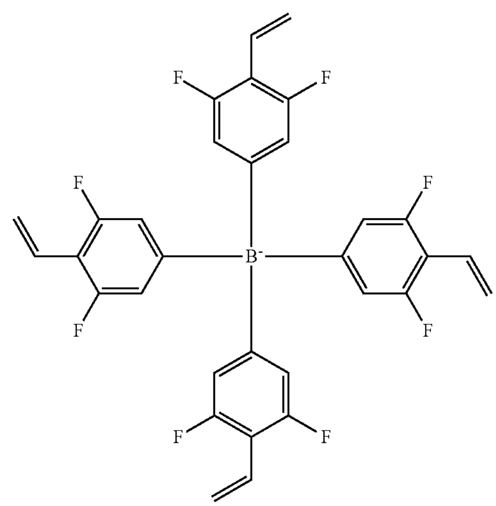

-continued
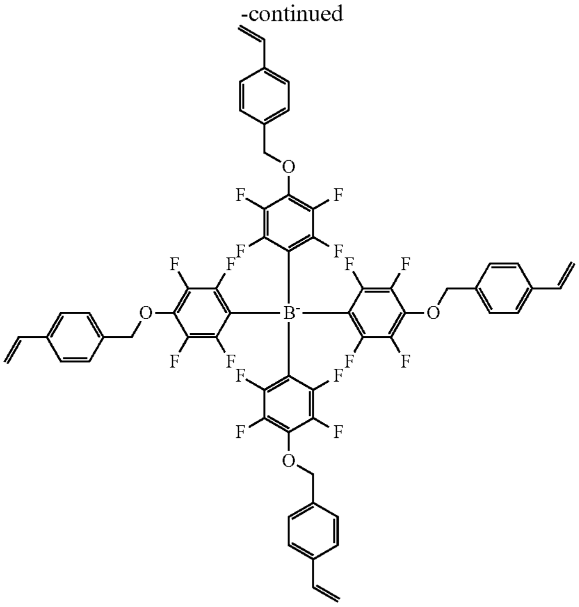
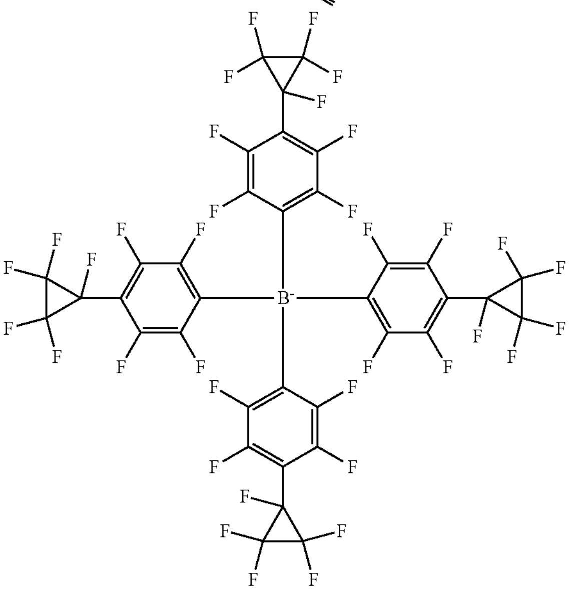
-continued
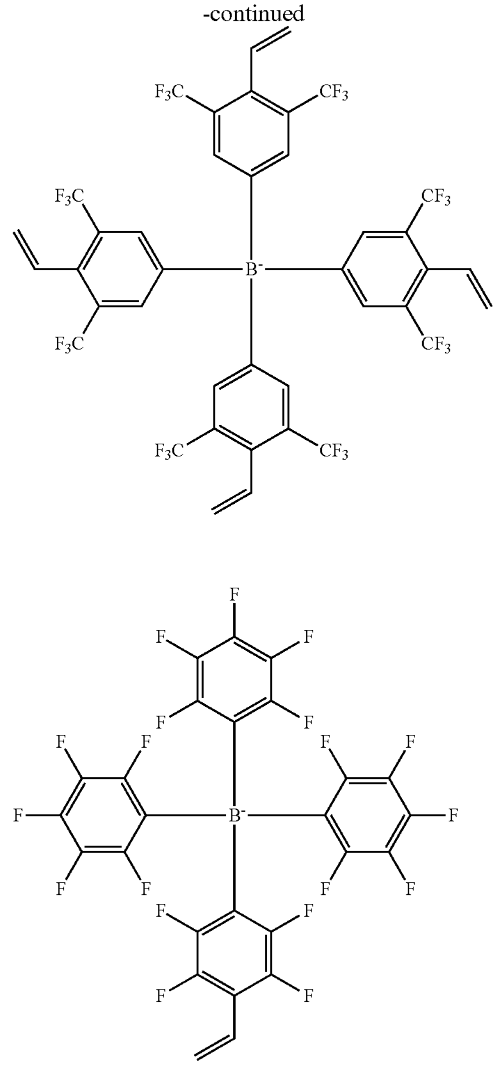
wherein,
n1 and n2 are as defined in claim 19.
* * * * *